US012733394B2

(12) United States Patent
Cho et al.

(10) Patent No.: US 12,733,394 B2
(45) Date of Patent: Sep. 8, 2026

(54) ORGANIC LIGHT-EMITTING DEVICE

(71) Applicant: SFC CO., LTD., Cheongju-si (KR)

(72) Inventors: Jin-hwi Cho, Cheongju-si (KR); Se-jin Yu, Cheongju-si (KR); So-young Shim, Cheongju-si (KR); Yong-woon Yang, Cheongju-si (KR)

(73) Assignee: SFC Co., Ltd., Cheongju-si (KR)

( * ) Notice: Subject to any disclaimer, the term of this patent is extended or adjusted under 35 U.S.C. 154(b) by 937 days.

(21) Appl. No.: 17/881,090

(22) Filed: Aug. 4, 2022

(65) Prior Publication Data

US 2023/0111485 A1 Apr. 13, 2023

(30) Foreign Application Priority Data

Aug. 5, 2021 (KR) ........................ 10-2021-0103045

(51) Int. Cl.

| | |
|---|---|
| ***H01L 51/54*** | (2006.01) |
| ***H10K 50/86*** | (2023.01) |
| ***H10K 85/60*** | (2023.01) |
| *H10K 50/11* | (2023.01) |

(52) U.S. Cl.

CPC ........... *H10K 85/615* (2023.02); *H10K 50/86* (2023.02); *H10K 85/631* (2023.02); *H10K 85/654* (2023.02); *H10K 85/656* (2023.02); *H10K 85/6572* (2023.02); *H10K 85/6574* (2023.02); *H10K 85/6576* (2023.02); *H10K 50/11* (2023.02)

(58) Field of Classification Search

None

See application file for complete search history.

(56) References Cited

U.S. PATENT DOCUMENTS

2020/0395549 A1* 12/2020 Kase ...................... C09K 11/06
2022/0102635 A1* 3/2022 Joo ...................... H10K 85/626

FOREIGN PATENT DOCUMENTS

| | | | | |
|---|---|---|---|---|
| EP | 3 656 776 A1 | 5/2020 | | |
| EP | 3 660 024 A1 | 6/2020 | | |
| KR | 10-2019-0115615 A | 10/2019 | | |
| KR | 10-2019-0139492 A | 12/2019 | | |
| KR | 10-2020-0047400 A | 5/2020 | | |
| KR | 10-2020-0066208 A | 6/2020 | | |
| KR | 10-2020-0086747 A | 7/2020 | | |
| KR | 10-2021-0009912 A | 1/2021 | | |
| WO | WO-2019124550 A1 * | 6/2019 | ........... | H10K 50/844 |
| WO | WO-2020111830 A1 * | 6/2020 | ............. | C09K 11/06 |
| WO | WO 2021/021840 A1 | 2/2021 | | |

OTHER PUBLICATIONS

Extended European Search Report Issued on Jan. 5, 2023, in Counterpart European Patent Application No. 22188964.5 (6 Pages in English).

Third Party Opinion Issued on Sep. 25, 2023, in Counterpart European Patent Application No. 22188964.5 (27 Pages in English).

Korean Office Action Issued on Oct. 21, 2024, in Counterpart Korean Patent Application No. 10-2021-0103045 (2 Pages in English, 2 Pages in Korean).

Third Party opinion issued on Oct. 5, 2023, in counterpart European Patent Application No. 22189005.6 (66 pages).

* cited by examiner

*Primary Examiner* — Andrew K Bohaty

(74) *Attorney, Agent, or Firm* — NSIP Law

(57) ABSTRACT

Disclosed is a highly efficient organic light-emitting device that uses an anthracene derivative having a characteristic structure as a host compound in a light-emitting layer of the organic light-emitting device and includes a capping layer formed using a compound having a characteristic structure in the organic light-emitting device.

20 Claims, No Drawings

ORGANIC LIGHT-EMITTING DEVICE

CROSS REFERENCE TO RELATED APPLICATIONS

This application claims the benefit under 35 U.S.C. § 119 (a) of Korean Patent Application No. 10-2021-0103045 filed on Aug. 5, 2021 in the Korean Intellectual Property Office, the entire disclosures of which is incorporated herein by reference for all purposes.

BACKGROUND OF THE INVENTION

Field of the Invention

The present invention relates to a highly efficient organic light-emitting device, and more specifically, to a highly efficient organic light-emitting device that uses an anthracene derivative having a characteristic structure as a host compound in a light-emitting layer of the organic light-emitting device and includes a capping layer formed using a compound having a characteristic structure in the organic light-emitting device.

Description of the Related Art

An organic light-emitting device is a self-luminous device that emits light when energy is released from excitons which are formed by recombination of electrons injected from an electron injection electrode (cathode) and holes injected from a hole injection electrode (anode) in a light-emitting layer. Such an organic light-emitting device attracts a great deal of attention as a next-generation light source due to applicability to full-color flat panel light-emitting displays based on advantages such as low driving voltage, high luminance, wide viewing angle, and rapid response speed thereof.

In order for the organic light-emitting device to exhibit the characteristics, the structure of the organic layer in the organic light-emitting device should be optimized, and the material constituting each organic layer, namely, a hole injection material, a hole transport material, a light-emitting material, an electron transport material, an electron injection material, or an electron blocking material should be based on stable and efficient ingredients. However, there is a continuing need to develop organic layer structures and respective materials thereof for stable and efficient organic light-emitting devices.

In particular, the energy bandgap between the host and the dopant should be properly balanced so that holes and electrons can form excitons through stable electrochemical paths in order to obtain maximum efficiency of the light-emitting layer.

In addition, in recent years, research on the improvement of the characteristics of the organic light-emitting device based on change of the performance of each organic layer material, and an approach to improve color purity and increase luminous efficacy based on the optimized optical thickness between an anode and a cathode have arisen as key factors for improving performance of the organic light-emitting device. As an example of this method, a capping layer is formed on an electrode to achieve desired luminous efficacy and excellent color purity.

As such, there is a continuing need for the development of the structure of an organic light-emitting device capable of improving the luminous characteristics thereof and the development of novel materials supporting the structure.

SUMMARY OF THE INVENTION

Therefore, the present invention has been made in view of the above problems, and it is one object of the present invention to provide a highly efficient organic light-emitting device that uses an anthracene derivative having a characteristic structure as a material for a light-emitting layer and includes a capping layer.

In accordance with the present invention, the above and other objects can be accomplished by the provision of an organic light-emitting device characterized in that:

(i) the organic light-emitting device includes a first electrode, a second electrode facing the first electrode, and a light-emitting layer interposed between the first electrode and the second electrode;

(ii) the organic light-emitting device includes a capping layer disposed on one surface of the first electrode or the second electrode, which is opposite to a remaining surface of the first electrode or the second electrode that faces the light-emitting layer;

(iii) the light-emitting layer includes at least one selected from compounds represented by the following [Formula A-1] to [Formula A-6]; and

[Formula A-1]

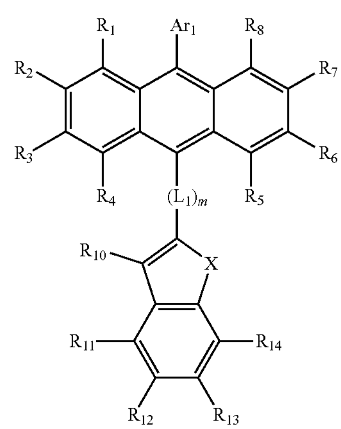

[Formula A-2]

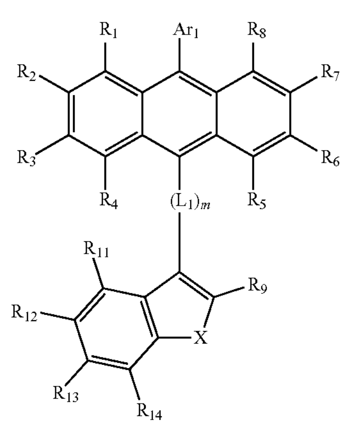

-continued

[Formula A-3]

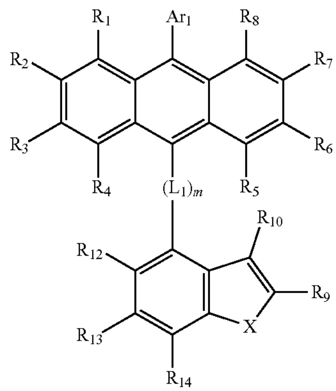

[Formula A-4]

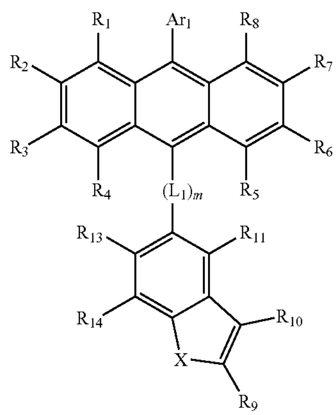

[Formula A-5]

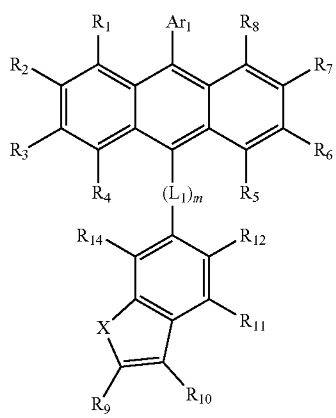

[Formula A-6]

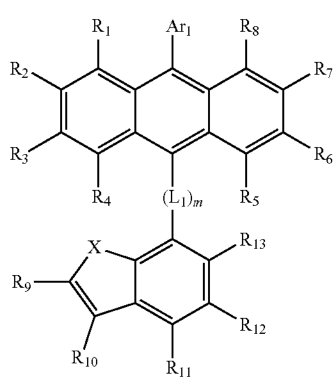

(iv) the capping layer includes at least one of compounds represented by the following [Formula B] or [Formula C].

[Formula B]

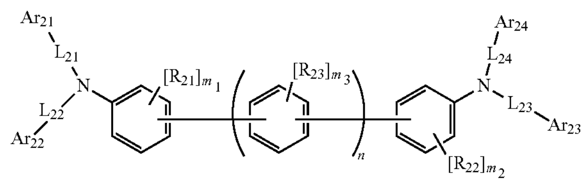

[Formula C]

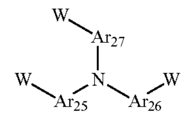

The structures and substituents of [Formula A-1] to [Formula A-6], [Formula B] and [Formula C], specific compounds thereof, and organic light-emitting devices including the same will be described later.

DETAILED DESCRIPTION OF THE INVENTION

Hereinafter, the present invention will be described in detail with reference to the annexed drawings.

The organic light-emitting device according to the present invention includes a first electrode, a second electrode facing the first electrode, a light-emitting layer interposed between the first electrode and the second electrode, and a capping layer disposed on one surface of the first electrode or the second electrode which is opposite to a remaining surface of the first electrode or the second electrode that faces the light-emitting layer.

In the organic light-emitting device according to the present invention, the light-emitting layer includes at least one selected from compounds represented by the following [Formula A-1] to [Formula A-6]:

[Formula A-1]

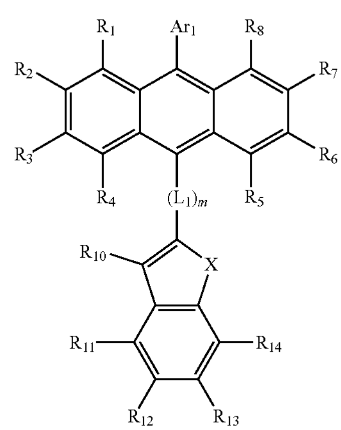

-continued

[Formula A-2]

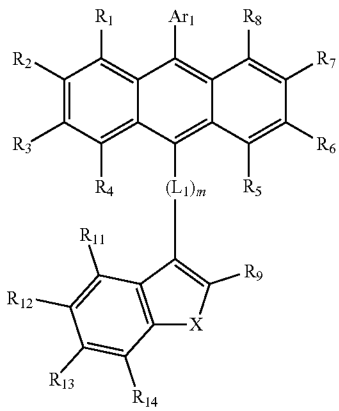

[Formula A-3]

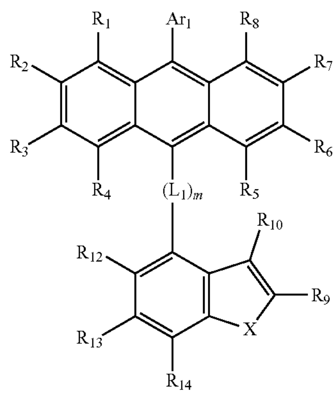

[Formula A-4]

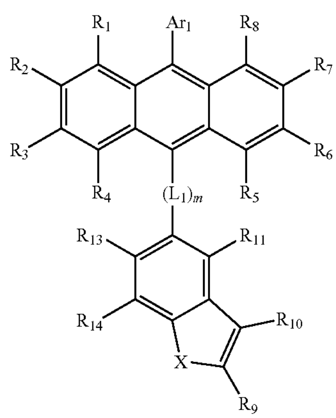

[Formula A-5]

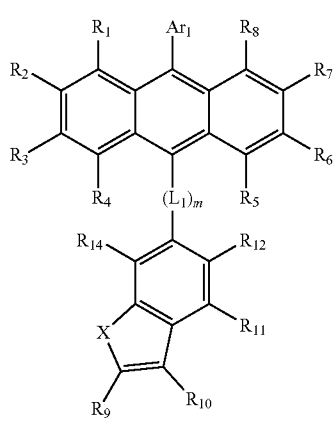

-continued

[Formula A-6]

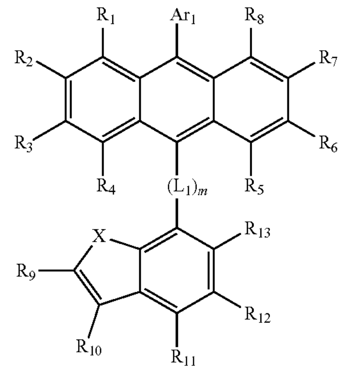

wherein $Ar_1$ is selected from a substituted or unsubstituted C6-C50 aryl group, a substituted or unsubstituted C2-C50 heteroaryl group, and a substituted or unsubstituted C3-C50 mixed aliphatic-aromatic ring group;

$R_1$ to $R_{14}$ are identical to or different from each other, and are each independently hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group;

X is an oxygen atom (0) or a sulfur atom(S);

$L_1$ is a divalent linker and is a single bond or is selected from a substituted or unsubstituted C6-C50 arylene group, a substituted or unsubstituted C2-C50 heteroarylene group, and a substituted or unsubstituted C3-C50 mixed aliphatic-aromatic ring group; and m is an integer from 1 to 3, provided that when m is 2 or more, a plurality of $L_1$ are identical to or different from each other.

The compound represented by [Formula A] according to the present invention has a structure including at least one benzofuran or benzothiophene, and is used as a host compound for a light-emitting layer of an organic light-emitting device based thereon. Therefore, it is possible to realize an organic light-emitting device having a long lifespan and low operating voltage.

According to an embodiment of the present invention, each of the compounds represented by [Formula A-1] to [Formula A-6] includes at least one deuterium atom (D). That is, at least one of $Ar_1$, $R_1$ to $R_{14}$ and $L_1$ or substituents thereof in each of [Formula A-1] to [Formula A-6] is a deuterium atom (D).

According to one embodiment of the present invention, the degree of deuteration of each of the compounds represented by [Formula A-1] to [Formula A-6] is 10% or more, which means that 10% or more of the substituents introduced into the respective skeletons are deuterium.

In addition, according to an embodiment of the present invention, each of the compounds represented by [Formula A-1] to [Formula A-6] has a degree of deuteration of 30% or more.

In addition, according to an embodiment of the present invention, each of the compounds represented by [Formula A-1] to [Formula A-6] has a degree of deuteration of 50% or more.

At least one of $R_{11}$ to $R_{14}$ in each of the compounds represented by [Formula A-1] to [Formula A-6] of the present invention may be selected from a substituted or unsubstituted C6-C20 aryl group, a substituted or unsubstituted C3-C20 cycloalkyl group, and a substituted or unsubstituted C3-C20 heteroaryl group.

In addition, according to an embodiment of the present invention, at least one of $R_{11}$ to $R_{14}$ may be a deuterium-substituted or unsubstituted C6-C20 aryl group.

The organic light-emitting device according to the present invention further includes a capping layer on the outside of one surface of an electrode which is opposite to the other surface of the electrode that faces the light-emitting layer and the capping layer contains at least one of compounds represented by the following [Formula B] and [Formula C]:

[Formula B]

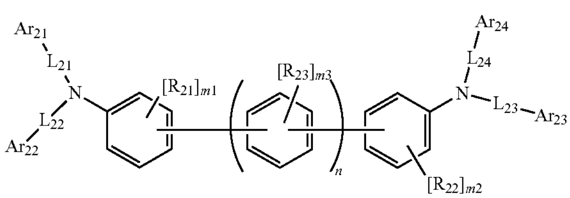

wherein $R_{21}$ to $R_{23}$ are identical to or different from each other, and are each independently selected from hydrogen, deuterium, a substituted or unsubstituted C1-C20 alkyl group, a substituted or unsubstituted C6-C50 aryl group, a substituted or unsubstituted C2-C30 heteroaryl group, a substituted or unsubstituted C7-C50 arylalkyl group, a substituted or unsubstituted C3-C30 cycloalkyl group, a substituted or unsubstituted silyl group, and a halogen group, $L_{21}$ to $L_{24}$ are identical to or different from each other, and are each independently a single bond or are selected from a substituted or unsubstituted C6-C50 arylene group and a substituted or unsubstituted C2-C50 heteroarylene group, $Ar_{21}$ to $Ar_{24}$ are identical to or different from each other, and are each independently selected from a substituted or unsubstituted C6-C50 aryl group, and a substituted or unsubstituted C2-C50 heteroaryl group, n is an integer from 0 to 4, provided that when n is 2 or more, a plurality of aromatic ring structures in ( ) including $R_{23}$ are identical to or different from each other, $m_1$ to $m_3$ are integers from 0 to 4, provided that when each of $m_1$ to $m_3$ is 2 or more, a plurality of each of $R_{21}$, $R_{22}$, and $R_{23}$ are identical to or different from each other, and a carbon atom of the aromatic ring, to which $R_{21}$ to $R_{23}$ are not bonded, is bonded to hydrogen or deuterium.

According to one embodiment of the present invention, at least one of $Ar_{21}$ to $Ar_{24}$ in [Formula B] is represented by the following [Formula E]:

[Formula E]

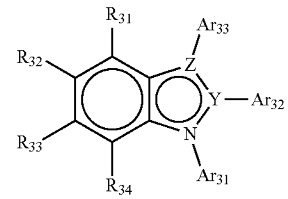

wherein $R_{31}$ to $R_{34}$ are identical to or different from each other, and are each independently selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C20 alkynyl group, a substituted or unsubstituted C3-C30 cycloalkyl group, a substituted or unsubstituted C5-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted amine group, a substituted or unsubstituted silyl group, a nitro group, a cyano group, and a halogen group, with the proviso that $R_{31}$ to $R_{34}$ are bonded to each other to form a ring, Y is a carbon atom (C) or a nitrogen atom (N), and Z is a carbon atom (C), an oxygen atom (O), a sulfur atom(S), or a nitrogen atom (N), and $Ar_{31}$ to $Ar_{33}$ are identical to or different from each other, and are each independently selected from a substituted or unsubstituted C5-C50 aryl group and a substituted unsubstituted C3-C50 heteroaryl group, provided that when Z is an oxygen atom (0) or a sulfur atom(S), $Ar_{33}$ is nothing, provided that when Y and Z are nitrogen atoms (N), only one of $Ar_{31}$, $Ar_{32}$, and $Ar_{33}$ is present, provided that when Y is a nitrogen atom (N) and Z is a carbon atom (C), $Ar_{32}$ is nothing, with the proviso that one of $R_{31}$ to $R_{34}$ and $Ar_{31}$ to $Ar_{33}$ is a single bond linked to one of the linkers $L_{21}$ to $L_{24}$ in [Formula B].

[Formula C]

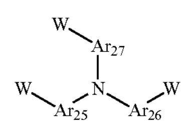

wherein $Ar_{25}$ to $Ar_{27}$ are divalent linkers, are identical to or different from each other, and are each independently a single bond or are selected from a substituted or unsubstituted C6-C50 arylene group, a substituted or unsubstituted C2-C50 heteroarylene group, a substituted or unsubstituted C3-C30 cycloalkylene group, and a substituted or unsubstituted C3-C50 mixed aliphatic-aromatic ring group, and W's are each independently selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a nitro group and a halogen group, wherein W's are identical to or different from each other, with the proviso that at least one of W's is represented by the following [Formula C-1]:

[Formula C-1]

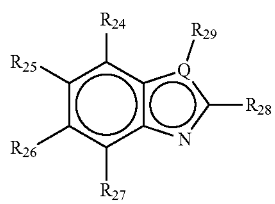

wherein $R_{24}$ to $R_{29}$ are identical to or different from each other, and are each independently linkers as binding sites to Arms to $Ar_{27}$, or are selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, with the proviso that $R_{24}$ to $R_{27}$ are bonded to each other or each of $R_{24}$ to $R_{27}$ is bonded to an adjacent substituent to further form an alicyclic or aromatic monocyclic or polycyclic ring, at least one carbon atom of which is substituted with at least one heteroatom selected from nitrogen, oxygen, and sulfur, and Q is N, O or S, provided that when Q is O or S, Q does not include $R_{29}$.

In addition, in the organic light-emitting device according to the present invention, the light-emitting layer includes a host and a dopant, each of the compounds represented by [Formula A-1] to [Formula A-6] is used as the host, and the dopant compound used for the light-emitting layer in the organic light-emitting device according to an embodiment is represented by the following [Formula D]:

[Formula D]

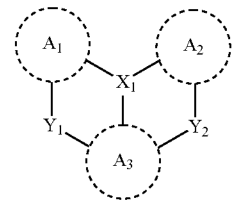

wherein $X_1$ is selected from B, P═O and P═S, $Y_1$ and $Y_2$ are each independently selected from $NR_{41}$, $CR_{42}R_{43}$, O, S, Se and $SiR_{44}R_{45}$, $A_1$ to $A_3$ are each independently selected from a substituted or unsubstituted C6-C50 aromatic hydrocarbon ring, a substituted or unsubstituted C2-C50 heteroaromatic ring, a substituted or unsubstituted C3-C30 aliphatic ring, and a substituted or unsubstituted C3-C30 mixed aliphatic-aromatic ring, and $R_{41}$ to $R_{45}$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C3-C30 heterocycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C6-C30 arylthioxy group, a substituted or unsubstituted amine group, a substituted or unsubstituted silyl group, a substituted or unsubstituted C3-C20 mixed aliphatic-aromatic ring group, a nitro group, a cyano group, and a halogen group, with the proviso that each of $R_{41}$ to $R_{45}$ is bonded to each of the rings $A_1$ to $A_3$ to form an alicyclic or aromatic monocyclic or polycyclic ring, the substituents of the rings $A_1$ to $A_3$ are bonded to each other to form an alicyclic or aromatic monocyclic or polycyclic ring, and $R_{42}$ and $R_{43}$, and $R_{44}$ and $R_{45}$ are bonded to each other to further form an alicyclic or aromatic monocyclic or polycyclic ring, at least one carbon atom of which is substituted with at least one heteroatom selected from nitrogen, oxygen, and sulfur.

More specifically, the dopant compound represented by [Formula D] is represented by the following [Formula D-1] to [Formula D-8]:

[Formula D-1]

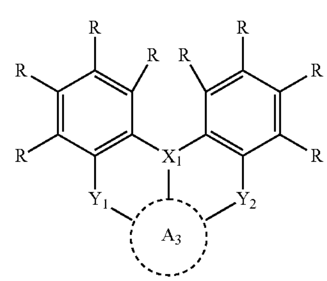

wherein

R's are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted a C3-C30 heterocycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C6-C30 arylthioxy group, a substituted or unsubstituted amine group, a substituted or unsubstituted silyl group, a substituted or unsubstituted C3-C20 mixed aliphatic-aromatic ring group, a nitro group, a cyano group, and a halogen group, with the proviso that R's are bonded to each other to further form an alicyclic or aromatic monocyclic or polycyclic ring, and the carbon atom of the formed alicyclic or aromatic ring may be substituted with at least one heteroatom selected from nitrogen, oxygen, and sulfur, and $X_1$, $Y_1$, $Y_2$ and $A_3$ are as defined in [Formula D] above,

[Formula D-2]

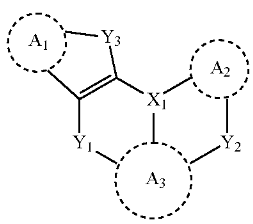

[Formula D-3]

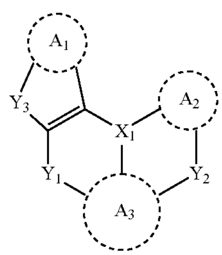

wherein $Y_3$ is each independently selected from $NR_{41}$, $CR_{42}R_{43}$, O, S, Se, and $SiR_{44}R_{45}$, and $X_1$, $Y_1$, $Y_2$, $A_1$ to $A_3$, and $R_{41}$ to $R_{45}$ are as defined in [Formula D] above,

[Formula D-4]

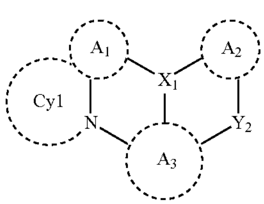

wherein $X_1$, $Y_2$ and $A_1$ to $A_3$ are as defined in [Formula D] above, and Cy1 is bonded to the adjacent nitrogen atom (N) and the aromatic carbon atom in the ring $A_1$ to be bonded to Cy1, to form a condensed ring including the nitrogen atom (N), the aromatic carbon atom in the ring $A_1$ to which the nitrogen atom (N) is bonded, and the aromatic carbon atom in the $A_1$ ring to be bonded to Cy1, wherein a moiety of the ring formed by Cy1, excluding the nitrogen atom (N), the aromatic carbon atom in the ring $A_1$ to which the nitrogen atom (N) is bonded, and the aromatic carbon atom in the $A_1$ ring to be bonded to Cy1, is a substituted or unsubstituted C2-C5 alkylene group,

[Formula D-5]

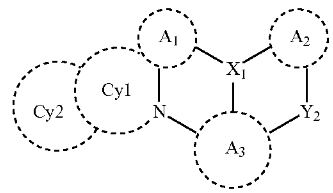

wherein $X_1$, $Y_2$ and $A_1$ to $A_3$ are as defined in [Formula D] above,

Cy2 may be added to Cy1 to form a saturated hydrocarbon ring and a moiety of the ring formed by Cy2, excluding the carbon atom included in Cy1, is a substituted or unsubstituted C2-C5 alkylene group,

[Formula D-6]

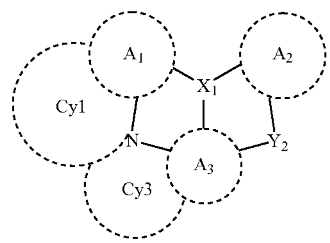

wherein $X_1$, $Y_2$ and $A_1$ to $A_3$ are as defined in [Formula D] above, and Cy3 is bonded to the carbon atom bonded to the nitrogen atom (N) in Cy1 and to the aromatic carbon atom in the ring $A_3$ to be bonded to Cy3, to form a condensed ring including the aromatic carbon atom in the $A_3$ ring to be bonded to Cy3, the nitrogen atom (N), and the carbon atom in Cy1 to which the nitrogen atom (N) is bonded, wherein a moiety of the ring formed by Cy3, excluding the aromatic carbon atom in the $A_3$ ring to be bonded to Cy3, the nitrogen atom (N), and the carbon atom in Cy1 to which the nitrogen atom (N) is bonded, is a substituted or unsubstituted C1-C4 alkylene group,

[Formula D-7]

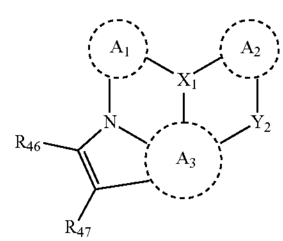

-continued

[Formula D-8]

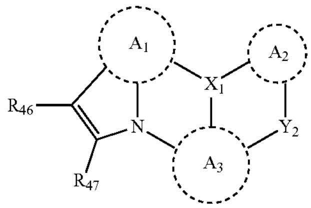

wherein $R_{46}$ and $R_{47}$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C3-C30 heterocycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C6-C30 arylthioxy group, a substituted or unsubstituted amine group, a substituted or unsubstituted silyl group, a substituted or unsubstituted C3-C20 mixed aliphatic-aromatic ring group, a nitro group, a cyano group, and a halogen group, with the proviso that $R_{46}$ and $R_{47}$ are bonded to each other to further form an alicyclic or aromatic monocyclic or polycyclic ring and a mixed aliphatic-aromatic ring, at least one carbon atom of which is substituted with at least one heteroatom selected from nitrogen, oxygen, and sulfur, and $X_1$, $Y_2$ and $A_1$ to $A_3$ are as defined in [Formula D] above.

In addition, the light-emitting layer may include a combination or stack of one of the host compounds represented by [Formula A-1] to [Formula A-6] and at least one additional host compound, and the dopant in the light-emitting layer may include a combination or stack of two or more dopants.

In addition, as used in [Formula A-1] to [Formula A-6], [Formula B], [Formula C], [Formula C-1], [Formula D], [Formula D-1] to [Formula D-8] and [Formula E] according to the present invention, the term "substituted" indicates substitution of various substituents defined in each of the formulas with one or more substituents selected from deuterium, a cyano group, a halogen group, a hydroxyl group, a nitro group, an alkyl group, a halogenated alkyl group, a cycloalkyl group, an alkenyl group, an alkynyl group, a heteroalkyl group, an aryl group, an arylalkyl group, an alkylaryl group, a heteroaryl group, a heteroarylalkyl group, an alkoxy group, an amine group, a silyl group, an aryloxy group and a mixed aliphatic-aromatic ring group, or substitution with a substituent including two or more of the substituents linked to each other. The term "unsubstituted" in the same definition indicates having no substituent.

In addition, the range of the number of the carbon atoms of the alkyl group or aryl group in the term "substituted or unsubstituted C1-C30 alkyl group", "substituted or unsubstituted C6-C50 aryl group" or the like refers to the total number of carbon atoms constituting the alkyl or aryl moiety when the corresponding group is not substituted without considering the number of carbon atoms in the substituent (s). For example, a phenyl group substituted at the para position with a butyl group corresponds to an aryl group having 6 carbon atoms substituted with a butyl group having 4 carbon atoms.

In addition, as used herein, the expression "a substituent is bonded to an adjacent substituent to form a ring" means that the corresponding substituent is bonded to the adjacent substituent to form a substituted or unsubstituted alicyclic or aromatic ring, and the term "adjacent substituent" may mean a substituent substituted for an atom which is directly attached to an atom substituted with the corresponding substituent, a substituent sterically disposed at the nearest position to the corresponding substituent, or another substituent substituted for an atom which is substituted with the corresponding substituent. For example, two substituents substituted at the ortho position in a benzene ring and two substituents substituted at the same carbon in the aliphatic ring may be considered "adjacent" to each other.

As used herein, the alkyl group may be a linear or branched alkyl group. Examples of the alkyl group include, but are not limited to, a methyl group, an ethyl group, a propyl group, an n-propyl group, an isopropyl group, a butyl group, an n-butyl group, an isobutyl group, a tert-butyl group, a sec-butyl group, a 1-methylbutyl group, a 1-ethylbutyl group, a pentyl group, an n-pentyl group, an isopentyl group, a neopentyl group, a tert-pentyl group, a hexyl group, an n-hexyl group, a 1-methylpentyl group, a 2-methylpentyl group, a 4-methyl-2-pentyl group, a 3,3-dimethylbutyl group, a 2-ethylbutyl group, a heptyl group, an n-heptyl group, a 1-methylhexyl group, a cyclopentylmethyl group, a cyclohexylmethyl group, an octyl group, an n-octyl group, a tert-octyl group, a 1-methylheptyl group, a 2-ethylhexyl group, a 2-propylpentyl group, an n-nonyl group, a 2,2-dimethylheptyl group, a 1-ethyl-propyl group, a 1,1-dimethyl-propyl group, an isohexyl group, a 2-methylpentyl group, a 4-methylhexyl group, a 5-methylhexyl group, and the like.

As used herein, the alkenyl group may include a linear or branched alkenyl group and may be further substituted with another substituent. Specifically, examples of the alkenyl group include, but are not limited to, a vinyl group, a 1-propenyl group, an isopropenyl group, a 1-butenyl group, a 2-butenyl group, a 3-butenyl group, a 1-pentenyl group, a 2-pentenyl group, a 3-pentenyl group, a 3-methyl-1-butenyl group, a 1,3-butadienyl group, an allyl group, a 1-phenylvinyl-1-yl group, a 2-phenylvinyl-1-yl group, a 2,2-diphenylvinyl-1-yl group, a 2-phenyl-2-(naphthyl-1-yl) vinyl-1-1 group, a 2,2-bis(diphenyl-1-yl) vinyl-1-yl group, a stilbenyl group, a styrenyl group, and the like.

As used herein, the alkynyl group may also include a linear or branched alkynyl group, and may be further substituted with another substituent, and examples of the substituent may include, but are not limited to, ethynyl, 2-propynyl, and the like.

As used herein, the aromatic hydrocarbon ring or the aryl group may be monocyclic or polycyclic, examples of the monocyclic aryl group include a phenyl group, a biphenyl group, a terphenyl group, a stilbene group, and the like, and examples of the polycyclic aryl group include, but are not limited to, a naphthyl group, an anthracenyl group, a phenanthrenyl group, a pyrenyl group, a perylenyl group, a tetracenyl group, a chrysenyl group, a fluorenyl group, an acenaphthcenyl group, a triphenylene group, a fluoranthene group, and the like, but the scope of the present invention is not limited thereto.

As used herein, the aromatic heterocyclic or heteroaryl group is an aromatic ring containing at least one heteroatom and examples thereof include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups and the like.

As used herein, the aliphatic hydrocarbon ring refers to a non-aromatic ring that contains only carbon and hydrogen atoms, for example, includes a monocyclic or polycyclic ring, and may be further substituted with another substituent. The term "polycyclic" means that the polycyclic group may be directly attached to or fused with at least one other cyclic group, the other cyclic group may be an aliphatic hydrocarbon ring, or a different type of ring group, for example, an aliphatic heterocyclic group, an aryl group, a heteroaryl group, and the like. Specifically, examples thereof include, but are not limited to, cycloalkyls such as a cyclopropyl group, a cyclobutyl group, a cyclopentyl group, an adamantyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, and a cyclooctyl group, cycloalkanes such as cyclohexane and cyclopentane, and cycloalkenes such as cyclohexene and cyclobutene.

As used herein, the aliphatic heterocyclic ring refers to an aliphatic ring that contains at least one of heteroatoms such as O, S, Se, N and Si, also includes a monocyclic or polycyclic ring, and may be further substituted with another substituent. The term "polycyclic" means that the polycyclic group may be directly attached to or fused with at least one other cyclic group, and the other cyclic group may be an aliphatic hydrocarbon ring, or a different type of ring group, for example, an aliphatic heterocyclic group, an aryl group, a heteroaryl group, or the like.

As used herein, the mixed aliphatic-aromatic ring group refers to a ring in which two or more rings are attached to and fused with each other, and aliphatic and aromatic rings are fused together to be overall non-aromatic, and a polycyclic mixed aliphatic-aromatic ring may contain a heteroatom selected from N, O, P and S, in addition to C.

As used herein, specifically, the alkoxy group may be methoxy, ethoxy, propoxy, isobutyloxy, sec-butyloxy, pentyloxy, iso-amyloxy, hexyloxy, or the like, but is not limited thereto.

As used herein, the silyl group is represented by —SiH3, and may be an alkylsilyl group, an arylsilyl group, an alkylarylsilyl group, an arylheteroarylsilyl group, or the like, and specific examples of the silyl group include trimethylsilyl, triethylsilyl, triphenylsilyl, trimethoxysilyl, dimethoxyphenylsilyl, diphenylmethylsilyl, diphenylvinylsilyl, methylcyclobutylsilyl, dimethylfurylsilyl, and the like.

As used herein, the amine group is represented by —$NH_2$, or may be an alkylamine group, an arylamine group, an arylheteroarylamine group, or the like. The arylamine group refers to amine substituted with aryl, the alkylamine group substituted with alkyl, and the refers to amine arylheteroarylamine group refers to an amine substituted with aryl and heteroaryl. For example, the arylamine group includes a substituted or unsubstituted monoarylamine group, a substituted or unsubstituted diarylamine group, or a substituted or unsubstituted triarylamine group. The aryl group and the heteroaryl group in the arylamine group and the arylheteroarylamine group may be a monocyclic aryl group or a monocyclic heteroaryl group, or a polycyclic aryl group or a polycyclic heteroaryl group. The arylamine group and the arylheteroarylamine group that contain two or more aryl groups and two or more heteroaryl groups, respectively, include a monocyclic aryl group (heteroaryl group), a polycyclic aryl group (heteroaryl group), or both of the monocyclic aryl group (heteroaryl group) and the polycyclic aryl group (heteroaryl group). In addition, the aryl group and the heteroaryl group in the arylamine group and the arylheteroarylamine group may be selected from examples of aryl groups and heteroaryl groups described above.

As used herein, examples of the aryl group in the aryloxy group and the arylthioxy group are the same as examples of the aryl group described above and specifically, examples of the aryloxy group include a phenoxy group, a p-tolyloxy group, an m-tolyloxy group, a 3,5-dimethylphenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, and examples of the arylthioxy group include, but are not limited to, a phenylthioxy group, a 2-methylphenylthioxy group, a 4-tert-butylphenylthioxy group, and the like.

In the present invention, examples of the halogen group include fluorine, chlorine, bromine, and iodine.

The compounds represented by [Formula A-1] to [Formula A-6] contained in the light-emitting layer in the organic light-emitting device according to the present invention are selected from compounds represented by the following [A-1] to [A-218], but are not limited thereto.

A-1

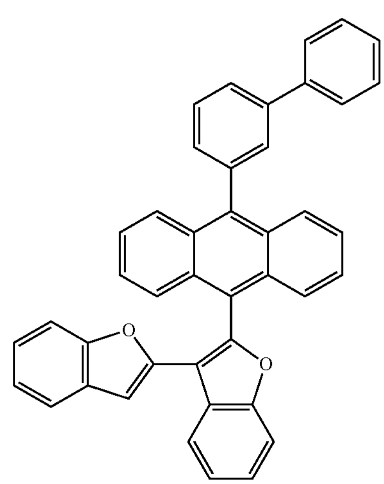

-continued
A-2
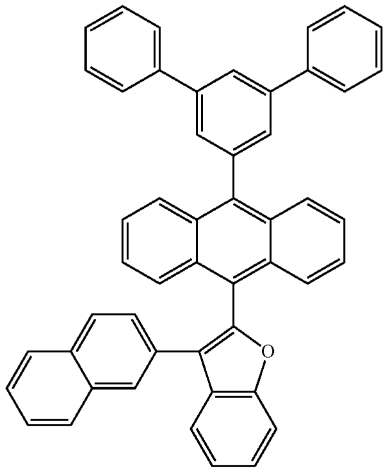
A-3
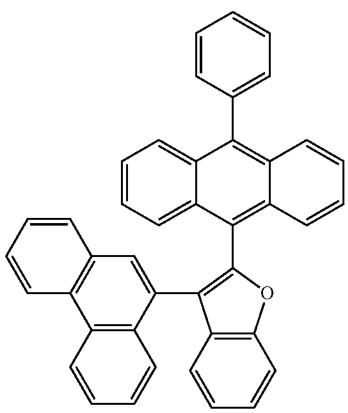
A-4
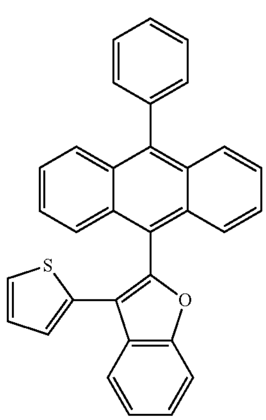
-continued
A-5
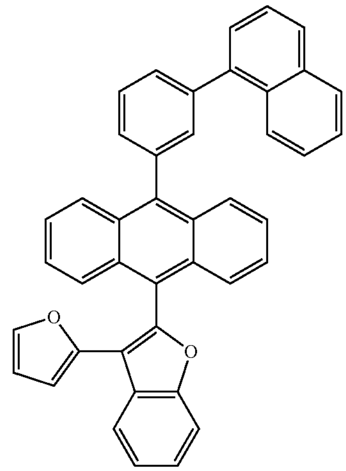
A-6
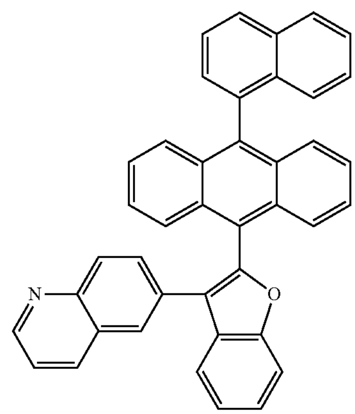
A-7
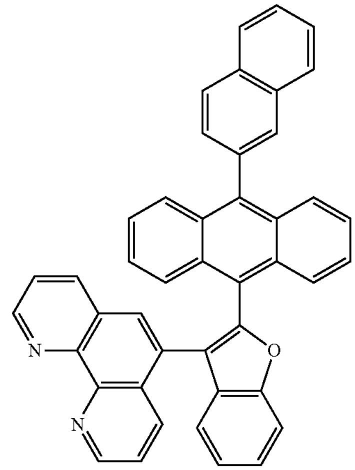

A-8
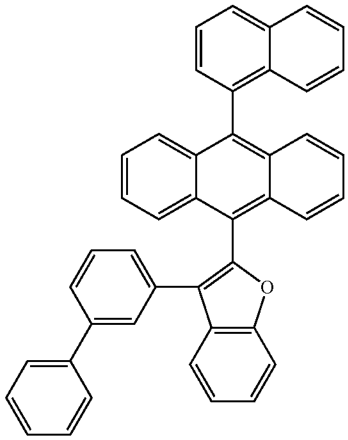
A-9
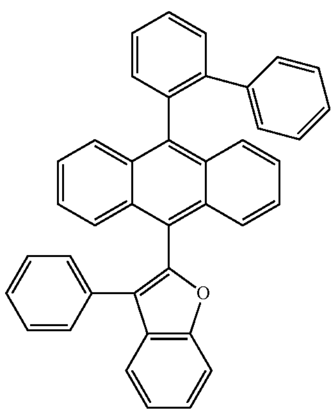
A-10
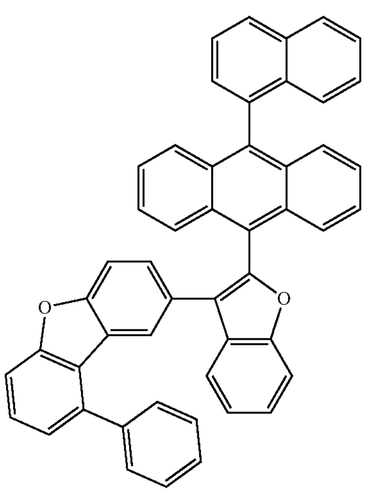
A-11
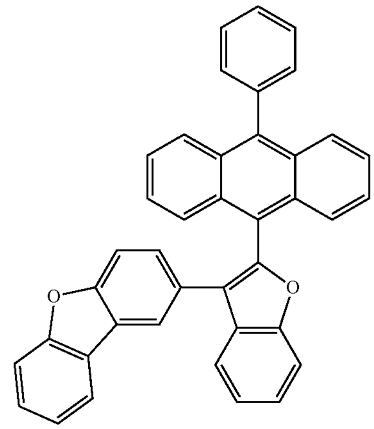
A-12
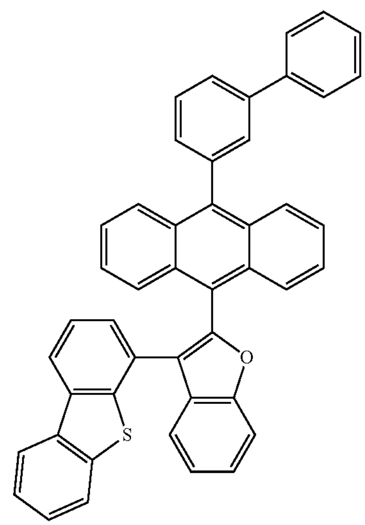
A-13
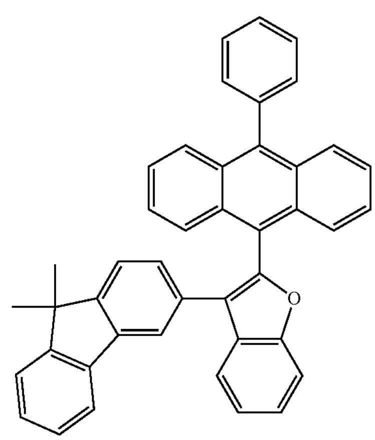

-continued
A-14
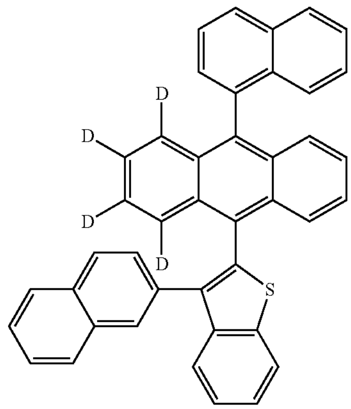
A-15
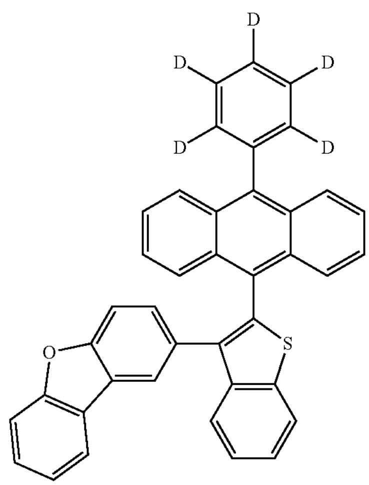
A-16
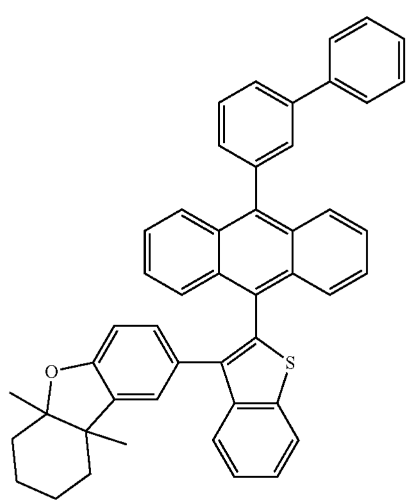
-continued
A-17
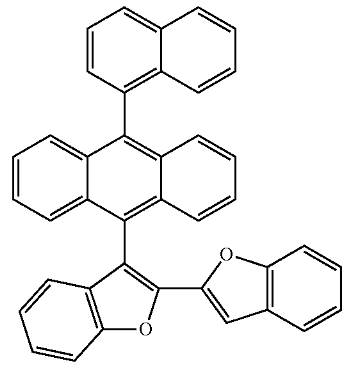
A-18
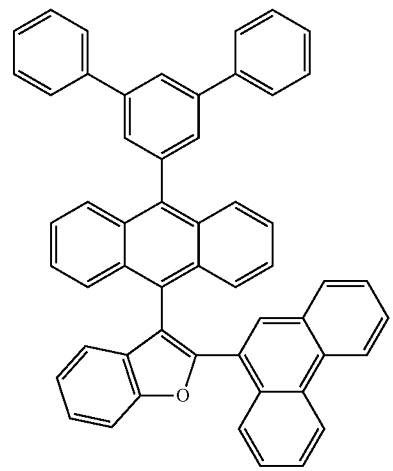
A-19
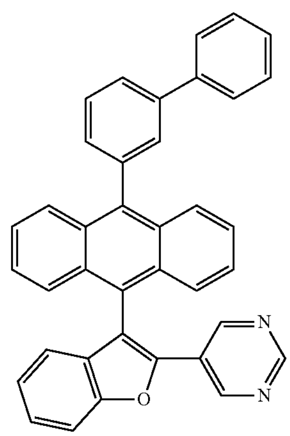
A-20
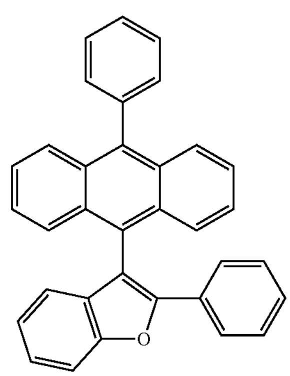

A-21
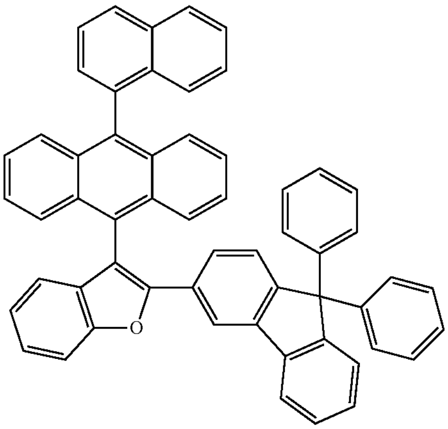
A-22
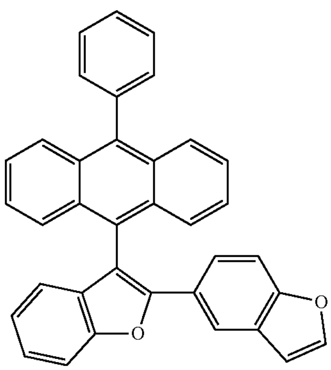
A-23
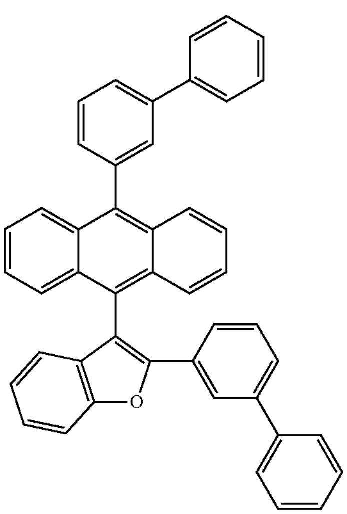
A-24
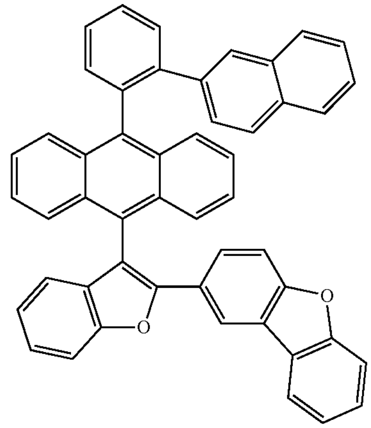
A-25
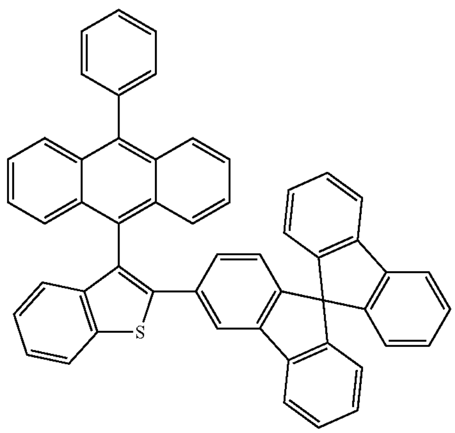
A-26
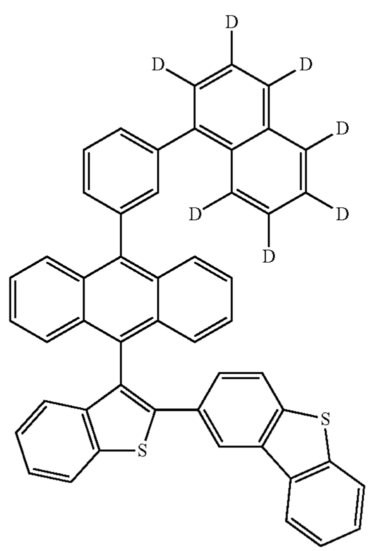

-continued
A-27
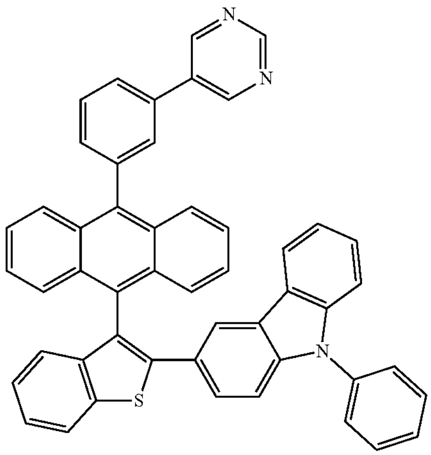
A-28
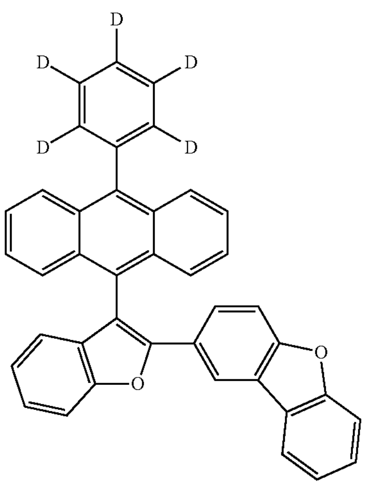
A-29
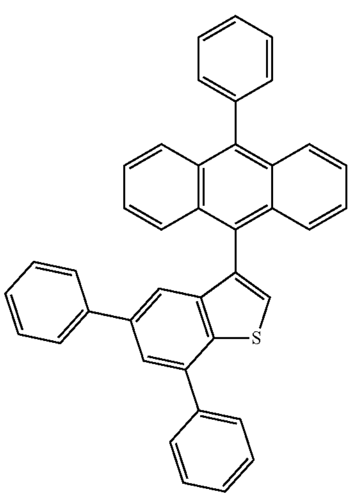
-continued
A-30
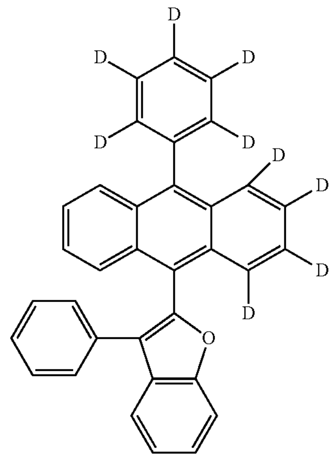
A-31
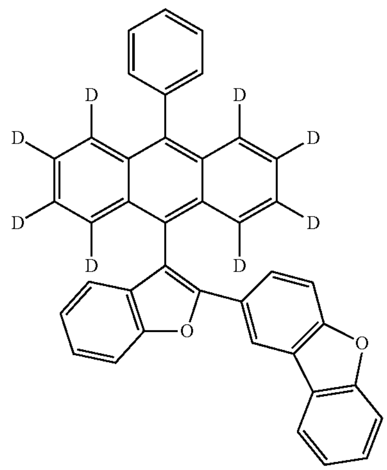
A-32
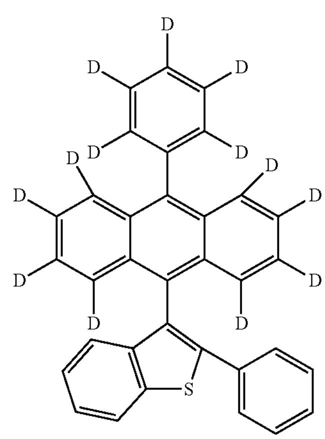

-continued
A-33
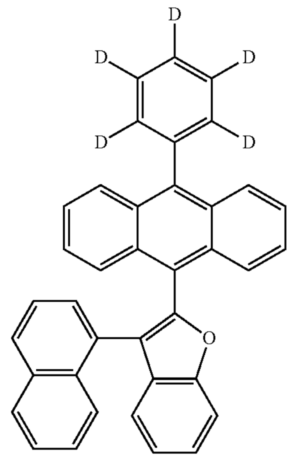
A-34
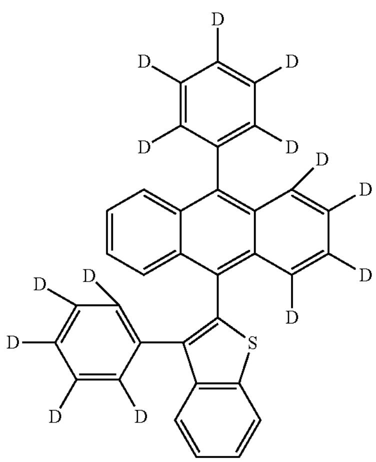
A-35
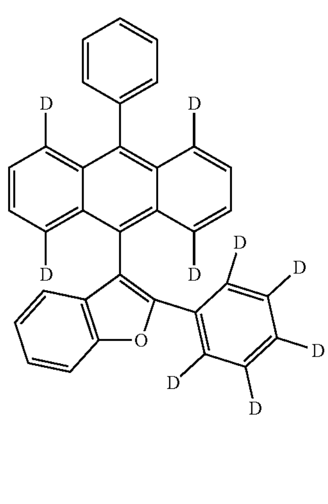
-continued
A-36
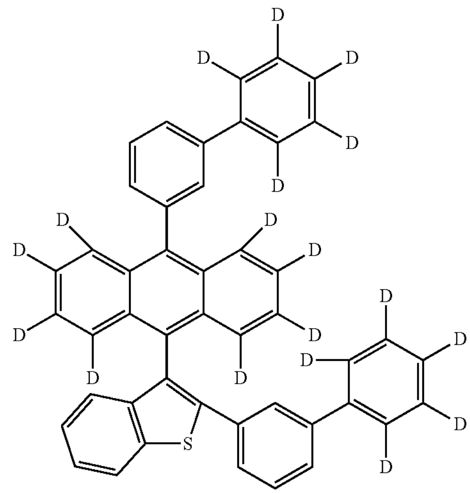
A-37
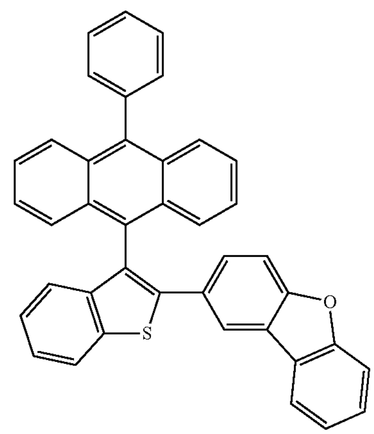
A-38
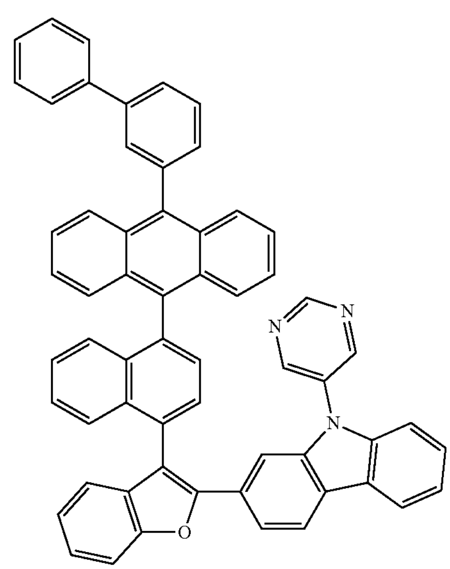

A-39
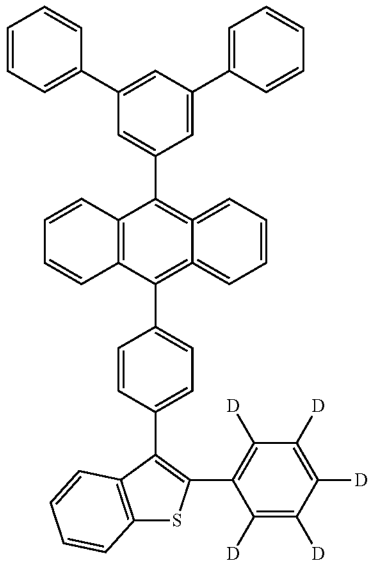
A-40
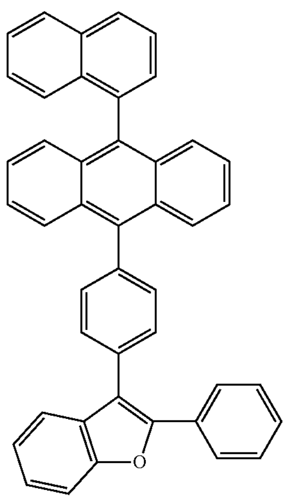
A-41
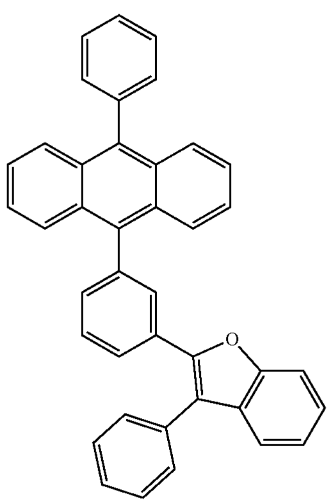
A-42
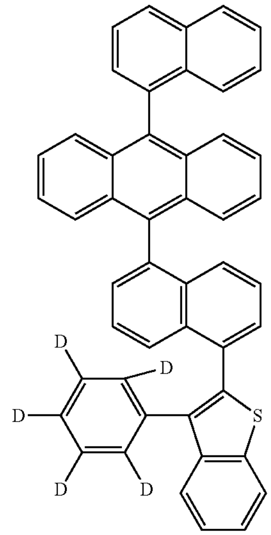
A-43
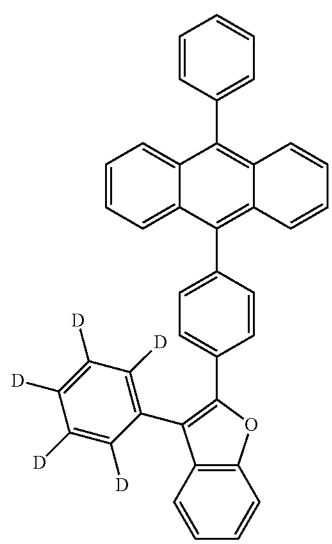

-continued
A-44
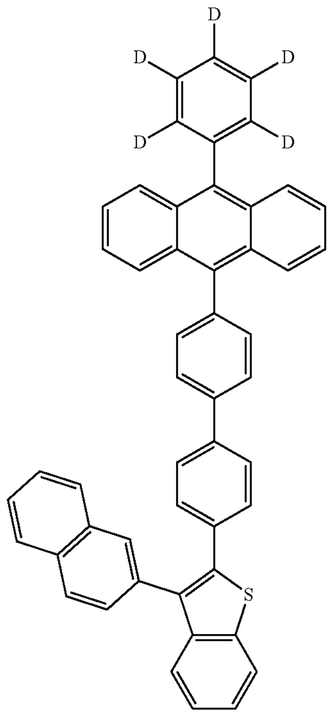
A-45
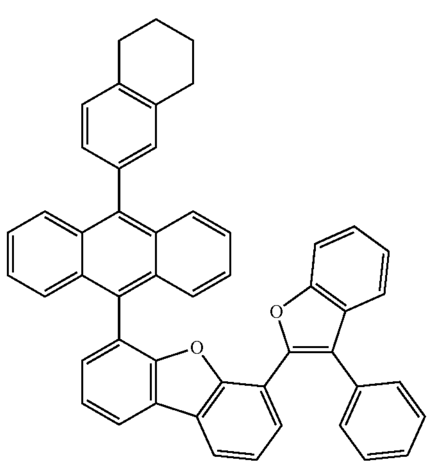
-continued
A-46
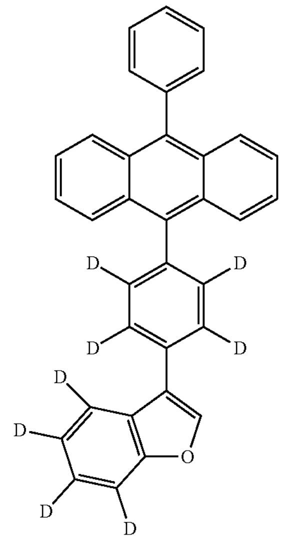
A-47
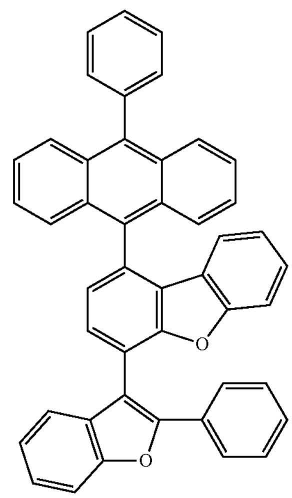
A-48
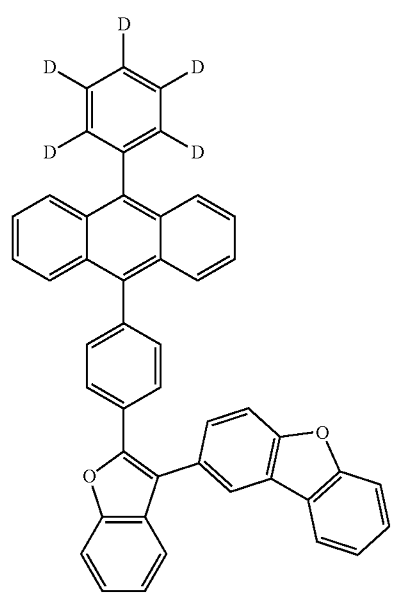

A-49
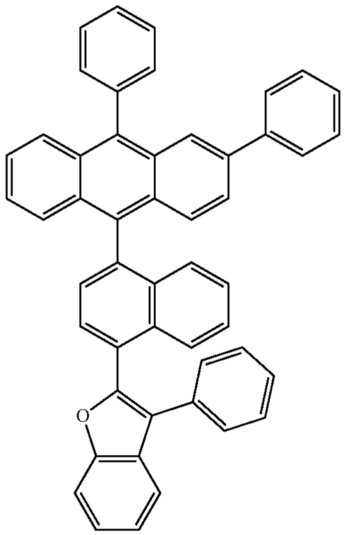
A-50
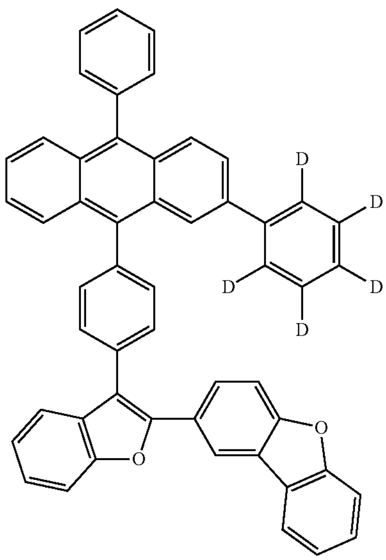
A-51
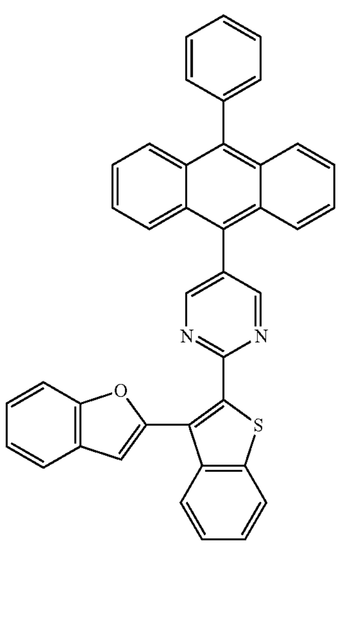
A-52
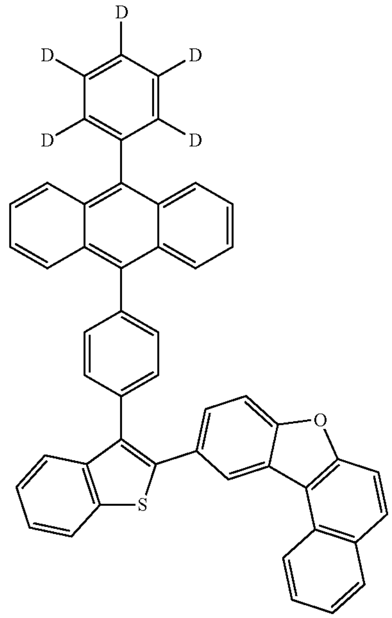
A-53
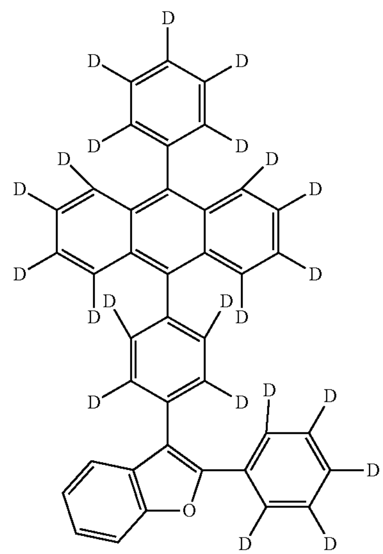
A-54
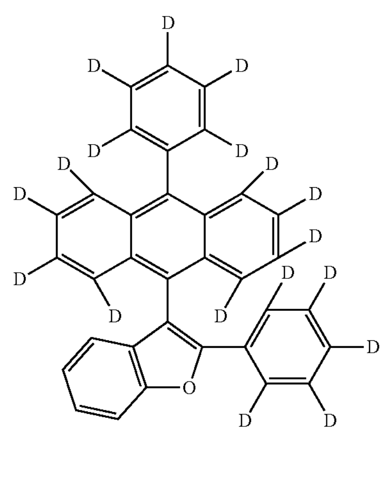

A-55
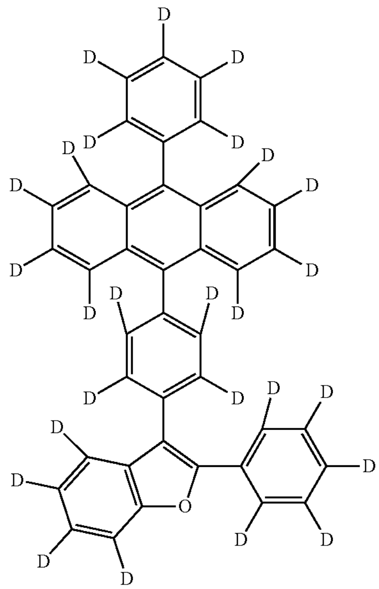
A-56
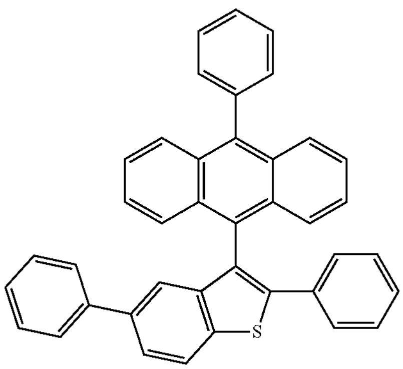
A-57
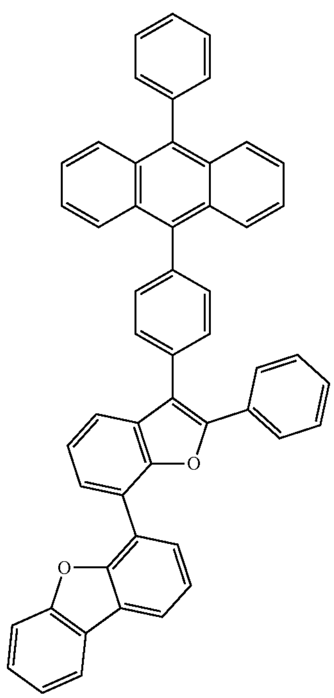
A-58
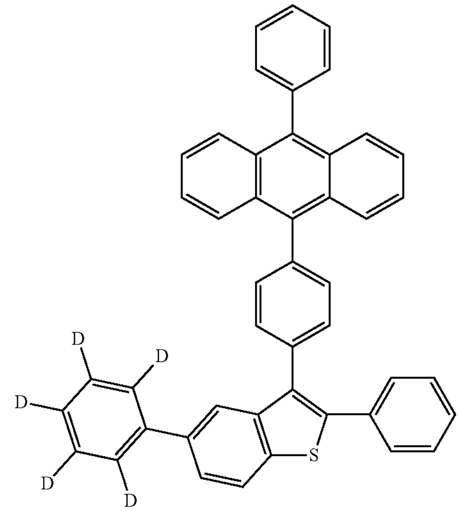
A-59
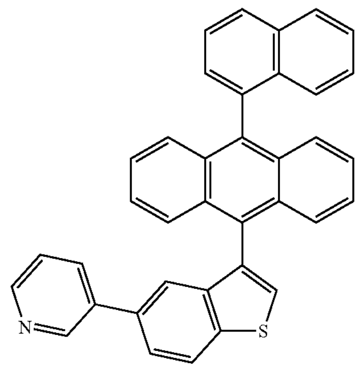
A-60
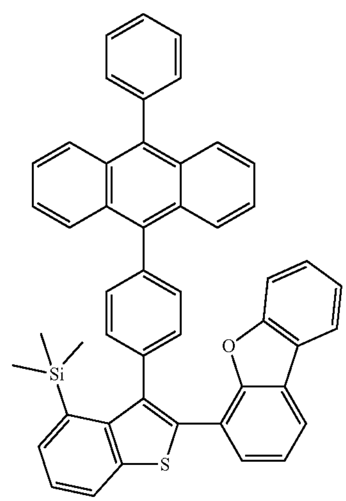

-continued
A-61
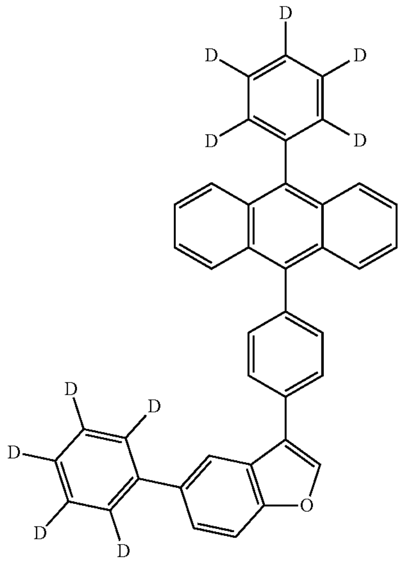
A-62
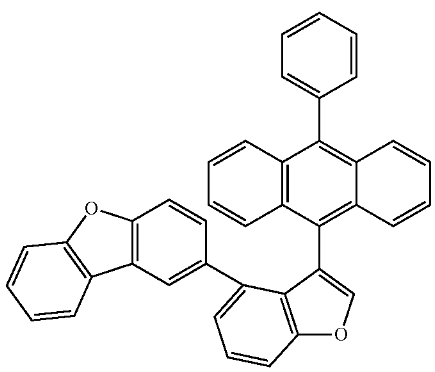
A-63
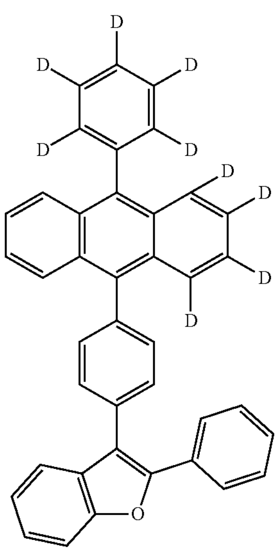
-continued
A-64
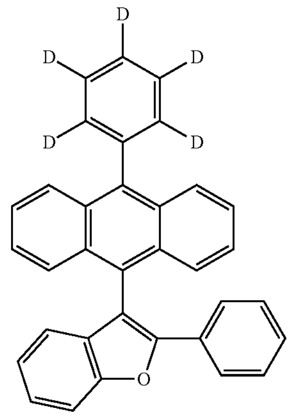
A-65
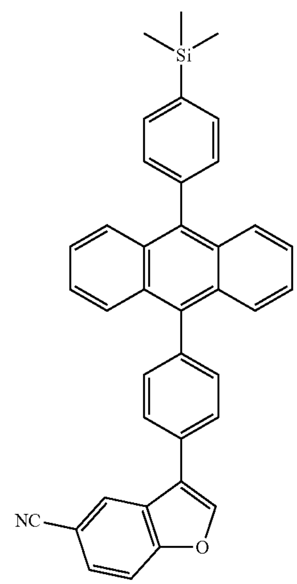
A-66
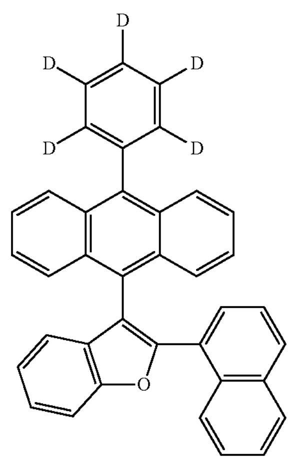

A-67
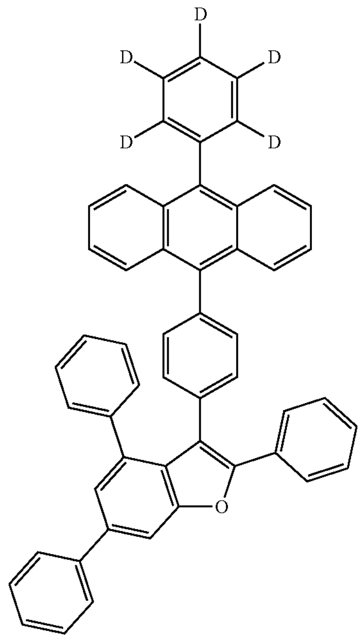
A-68
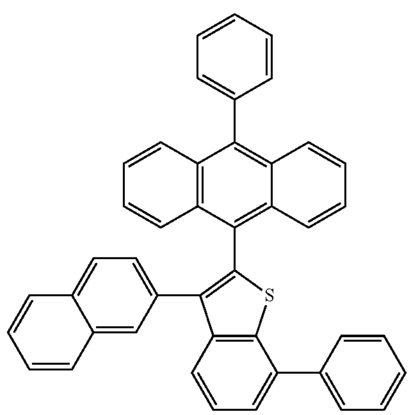
A-69
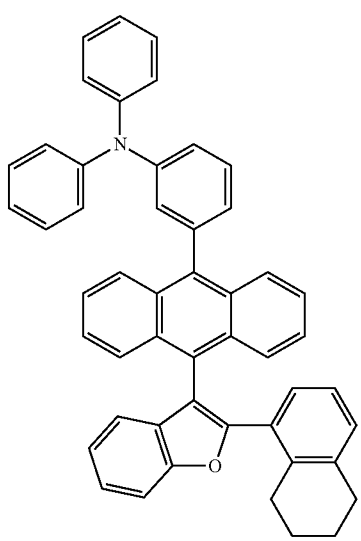
A-70
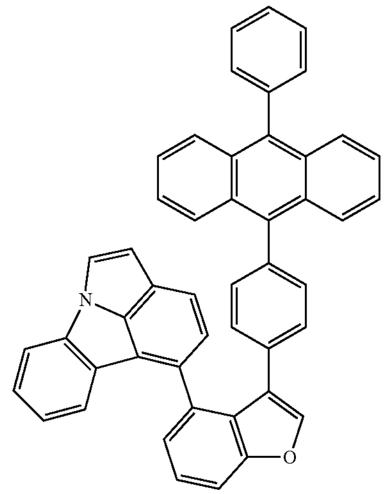
A-71
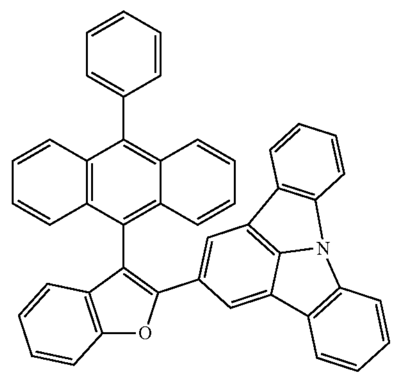
A-72
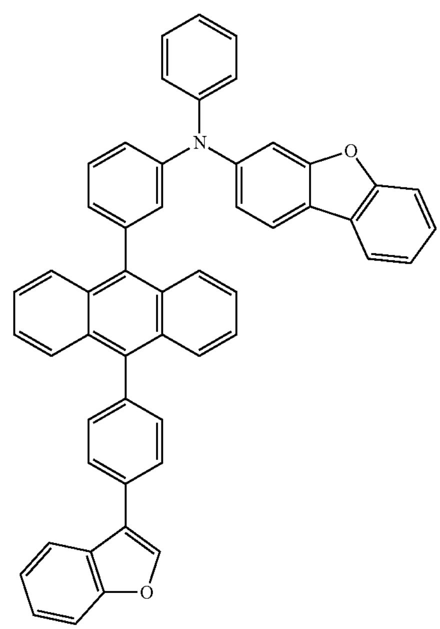

A-73
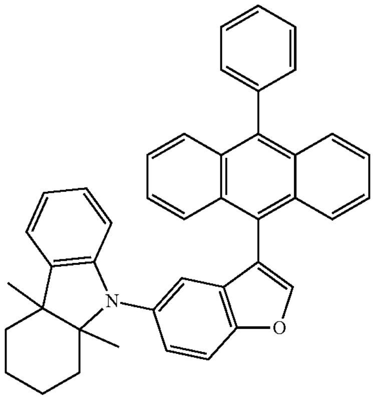
A-74
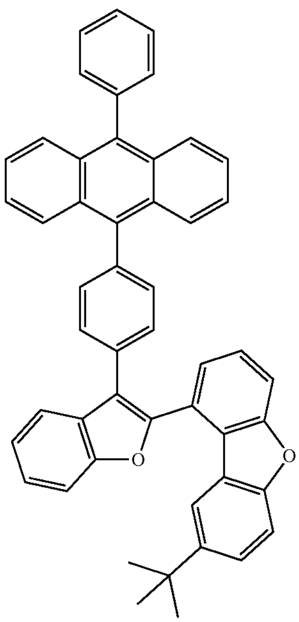
A-75
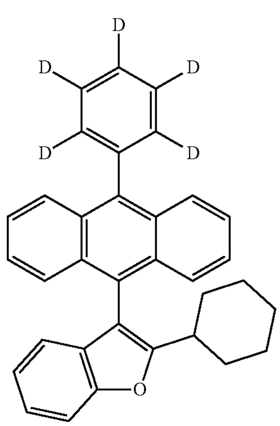
A-76
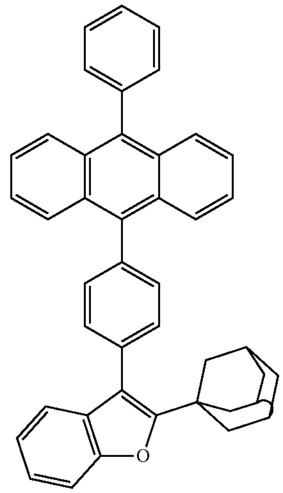
A-77
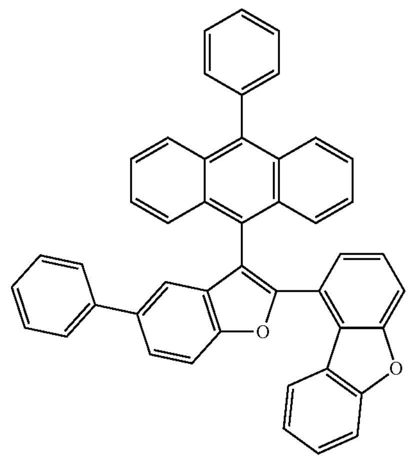
A-78
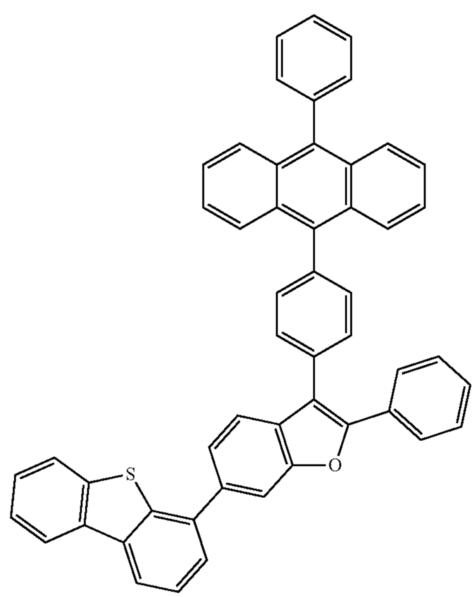

-continued
A-79
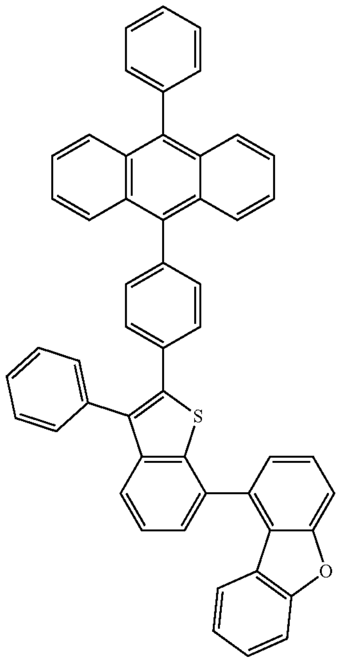
A-80
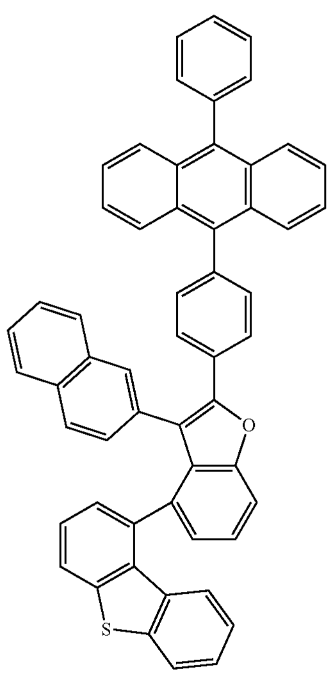
-continued
A-81
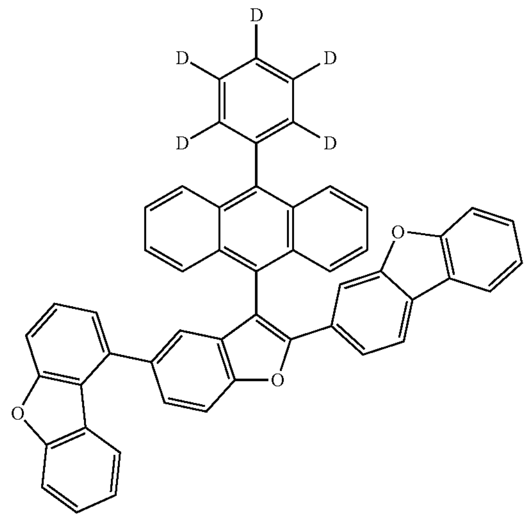
A-82
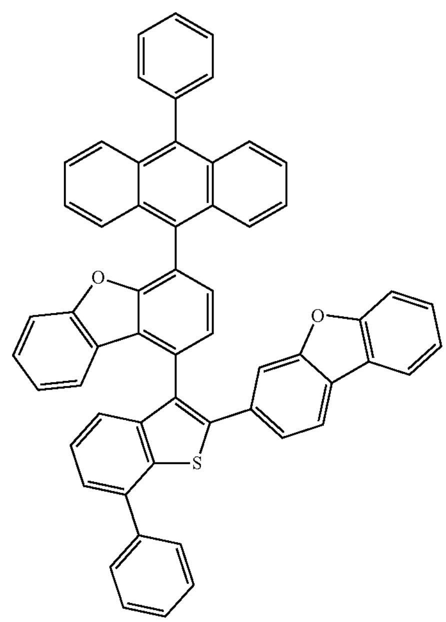
A-83
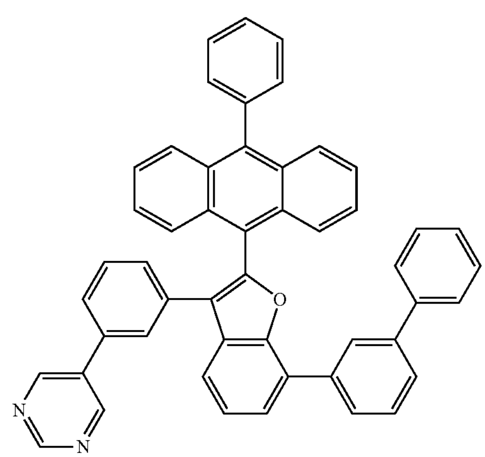

-continued
A-84
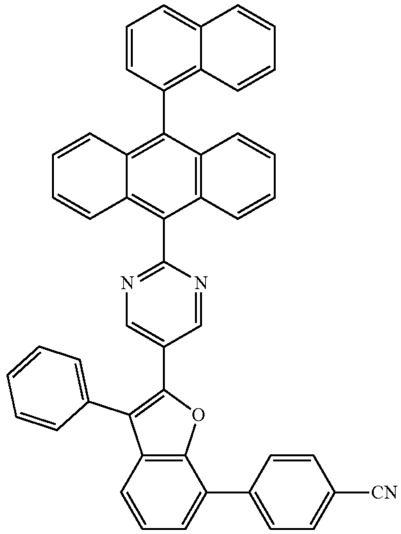
A-85
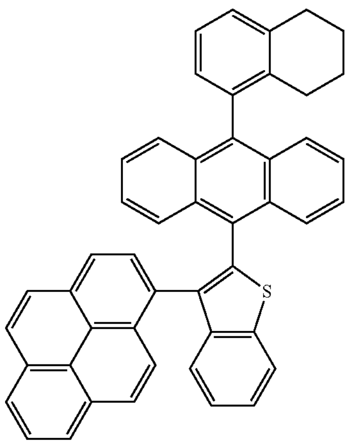
A-86
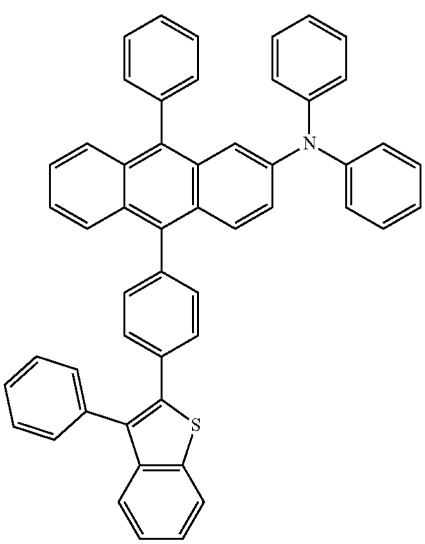
-continued
A-87
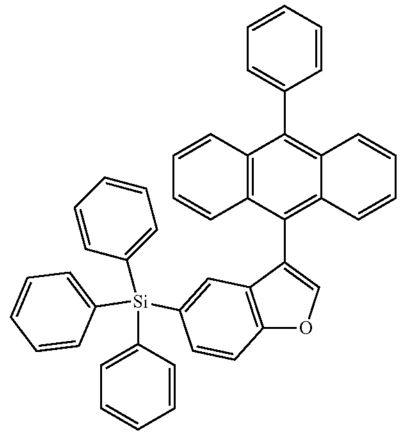
A-88
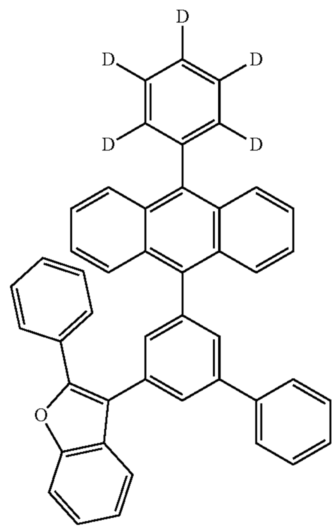
A-89
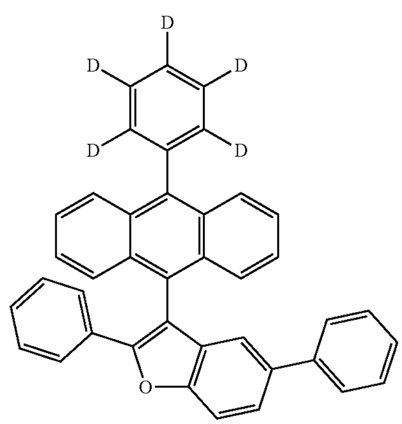

-continued
A-90
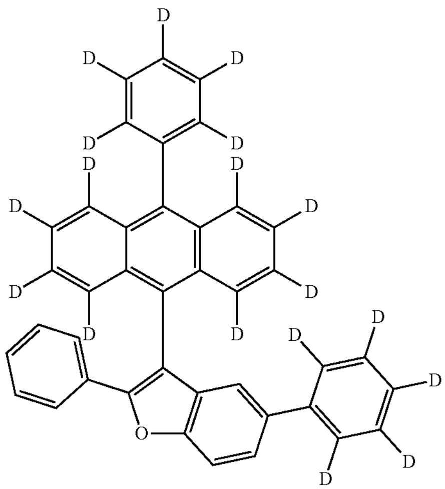
A-91
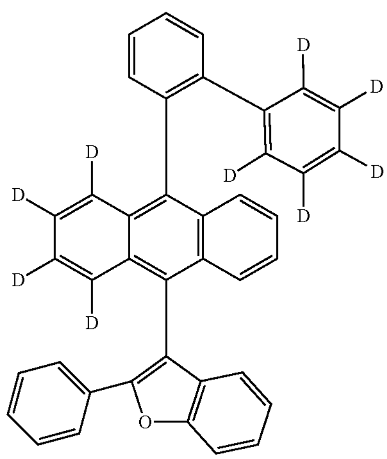
A-92
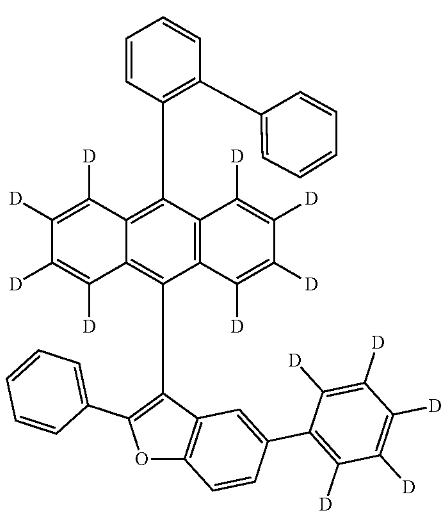
A-93
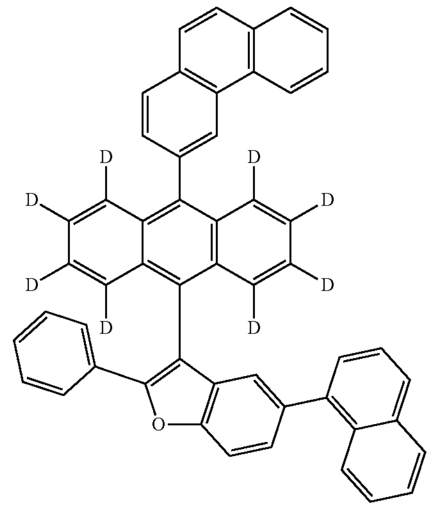
A-94
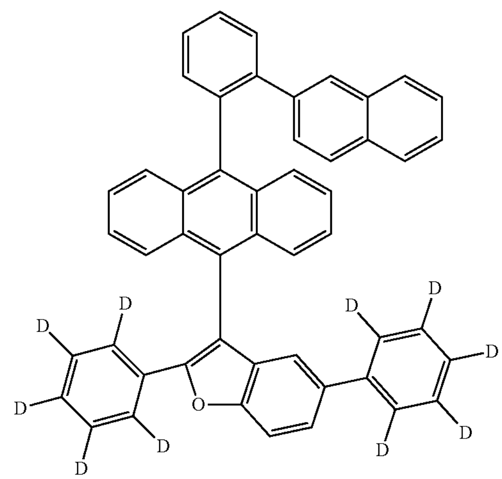
A-95
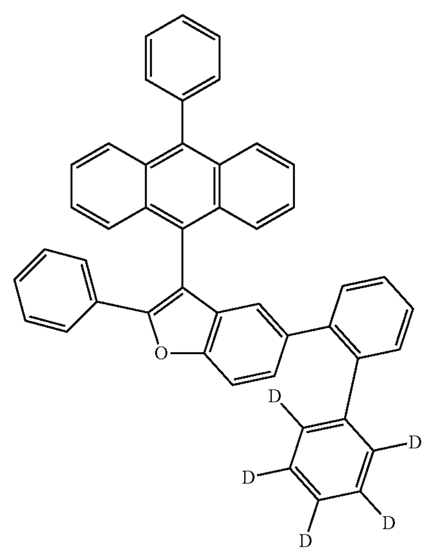

-continued
A-96
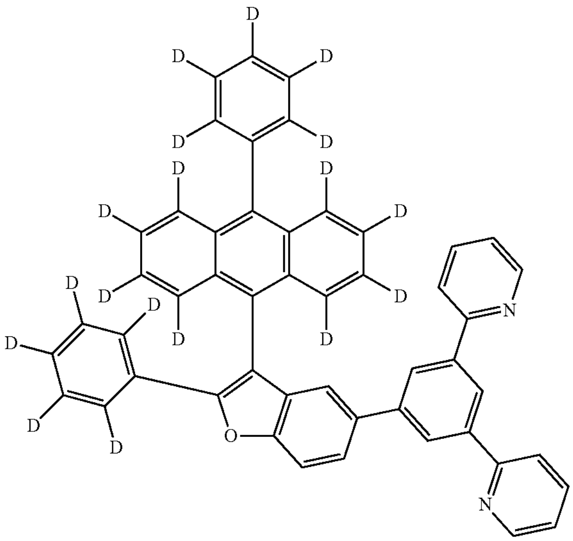
A-97
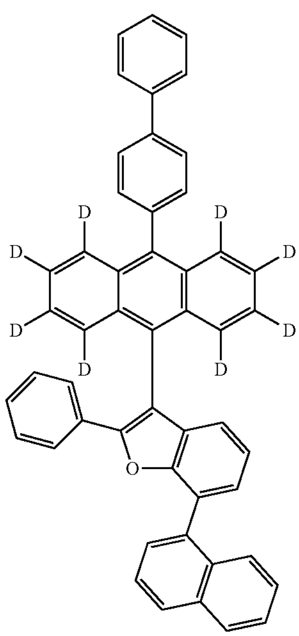
-continued
A-98
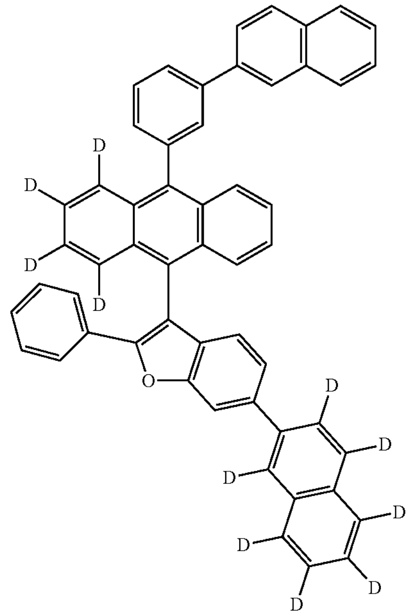
A-99
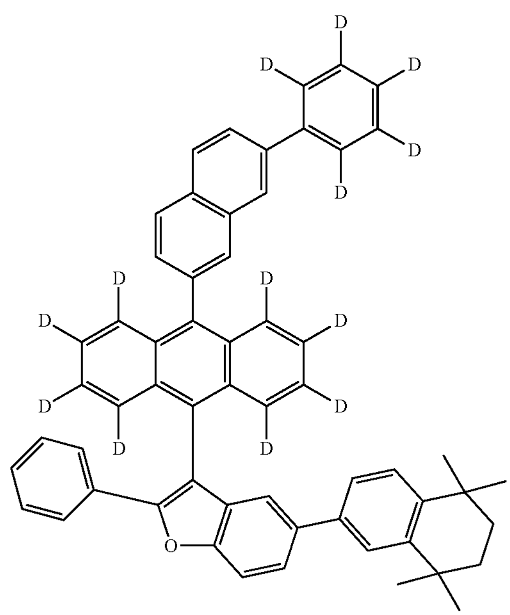

-continued
A-100
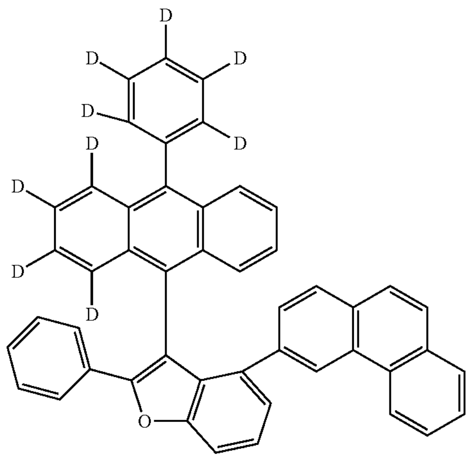
A-101
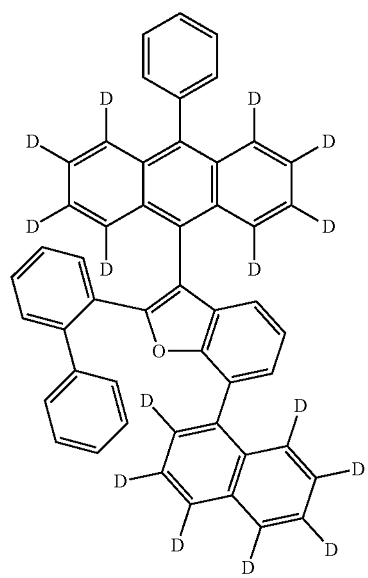
A-102
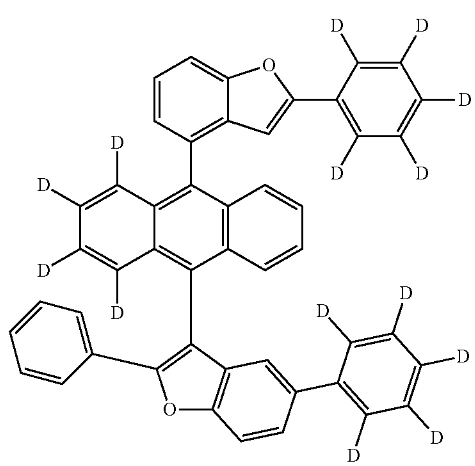
-continued
A-103
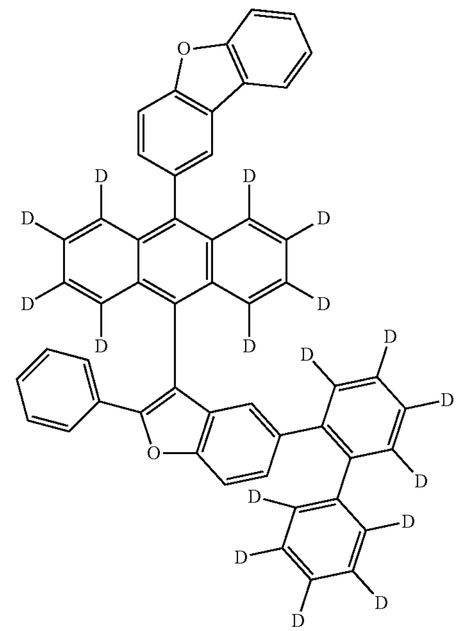
A-104
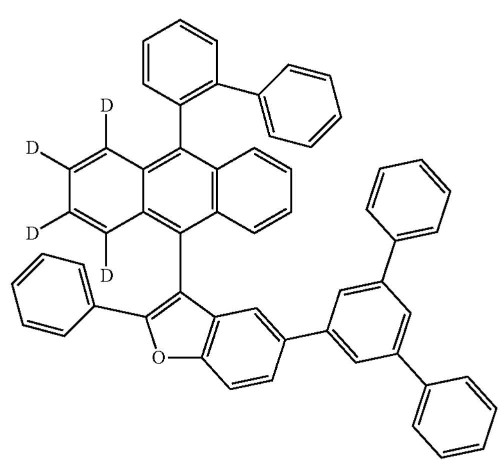

A-105
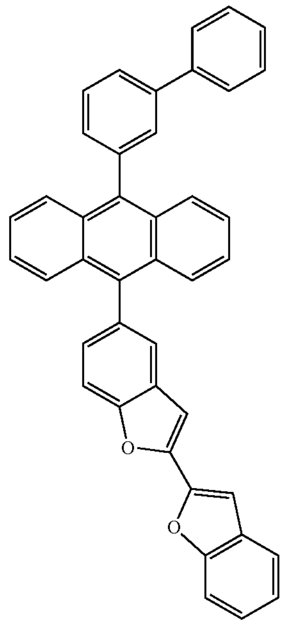
A-106
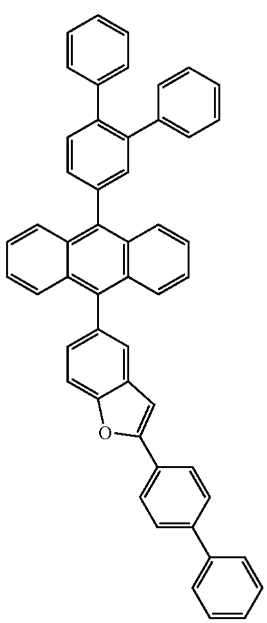
A-107
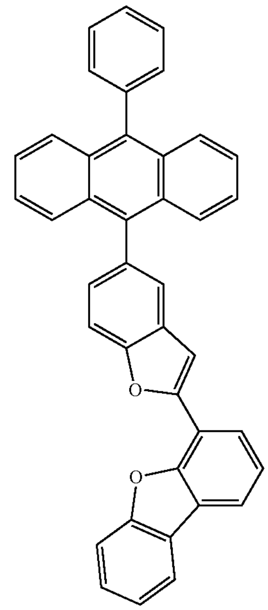
A-108
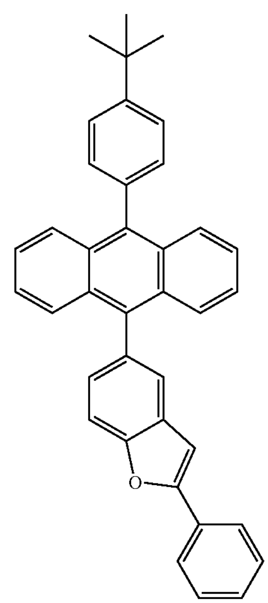

-continued
A-109
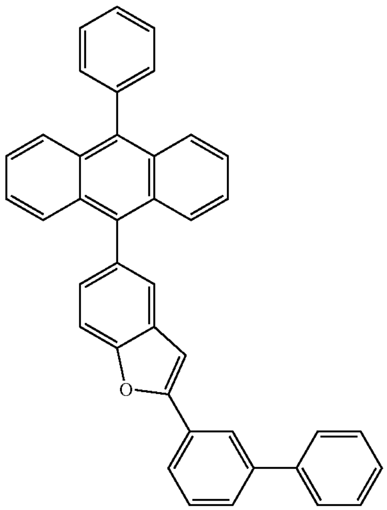
A-110
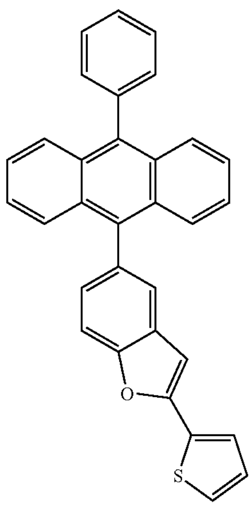
A-111
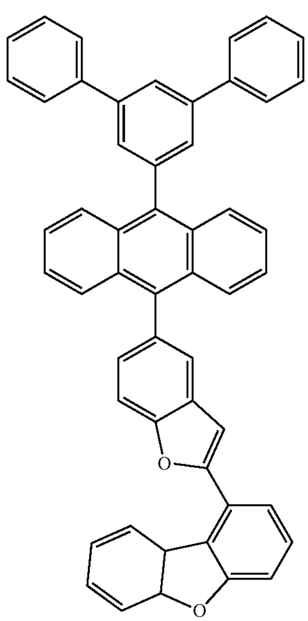
-continued
A-112
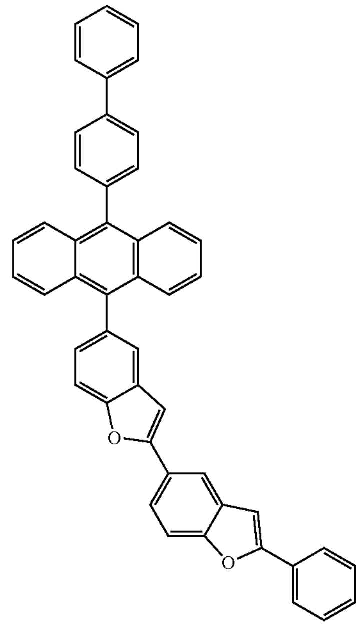
A-113
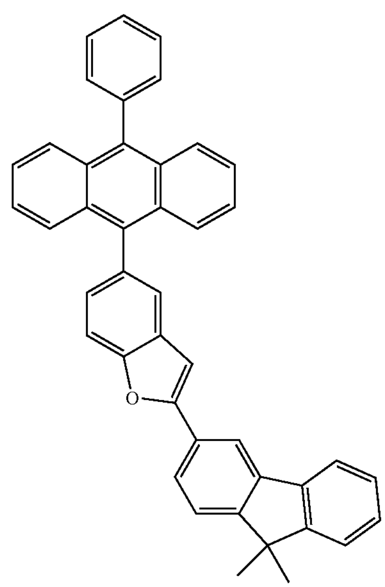

-continued
A-114
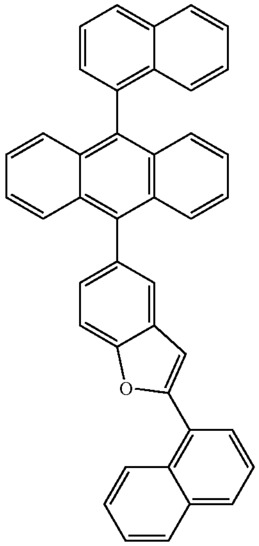
A-115
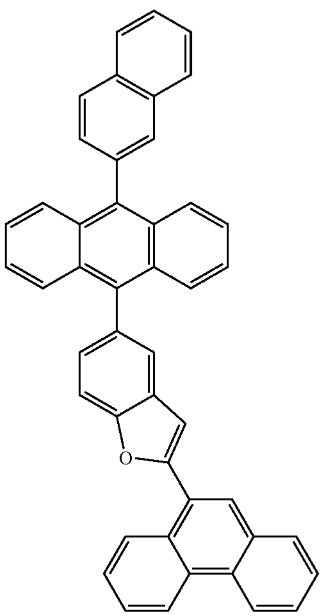
A-116
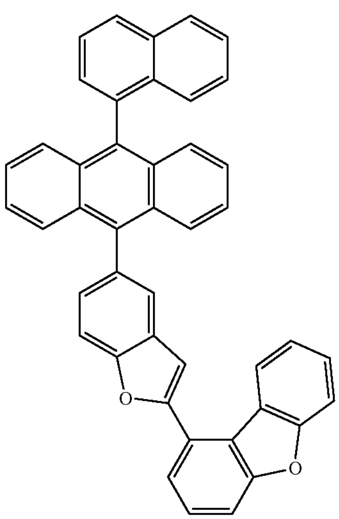
-continued
A-117
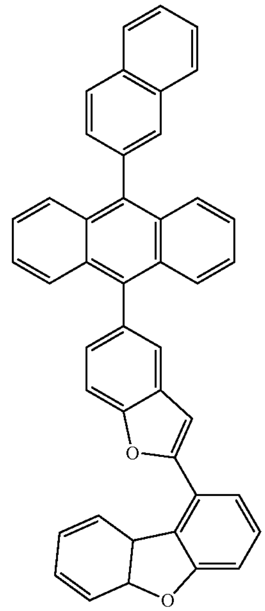
A-118
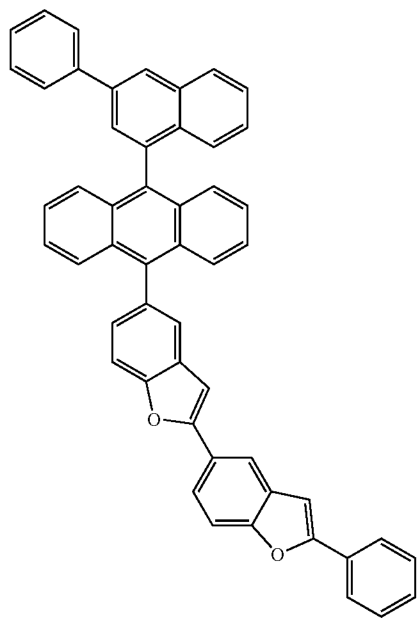
A-119
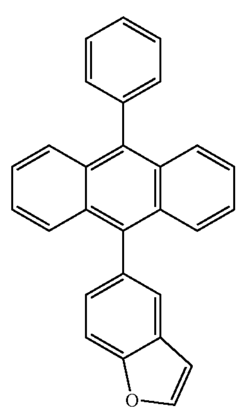

-continued
A-120
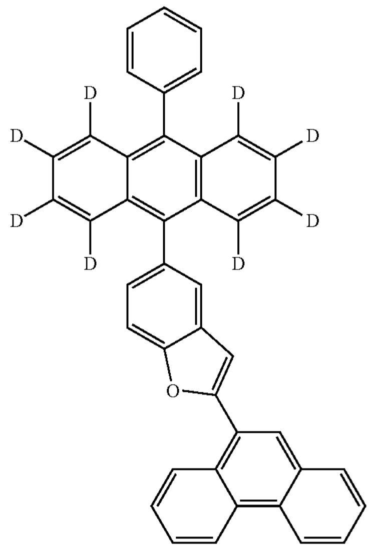
A-121
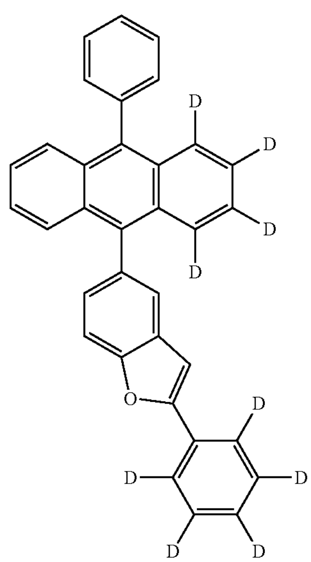
-continued
A-122
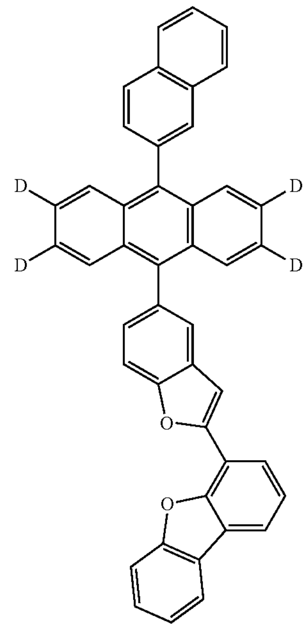
A-123
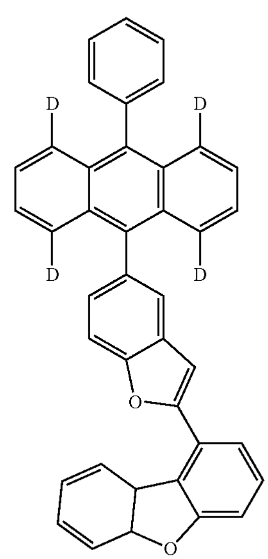

A-124
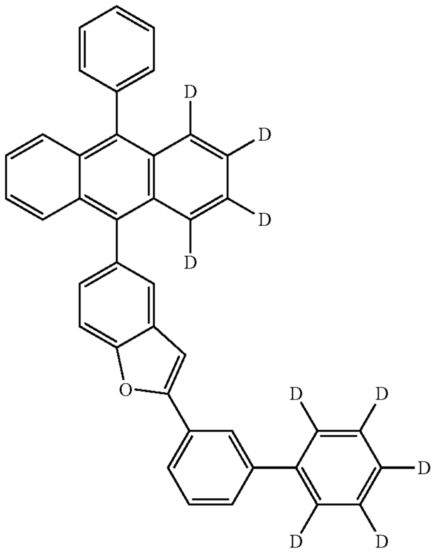
A-125
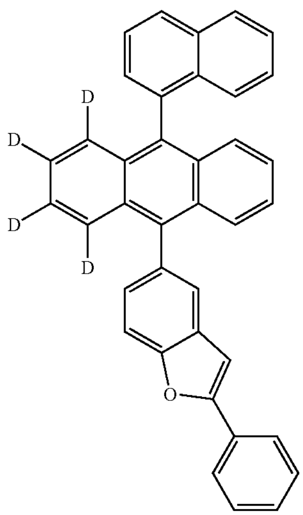
A-126
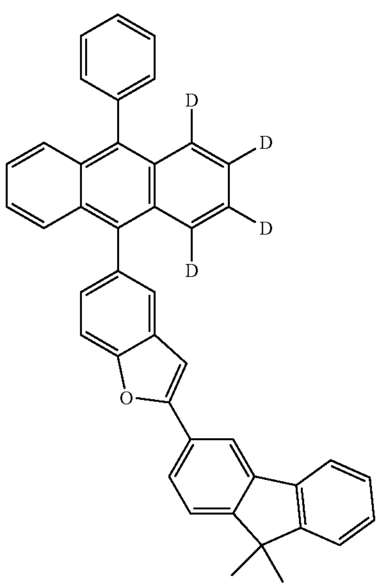
A-127
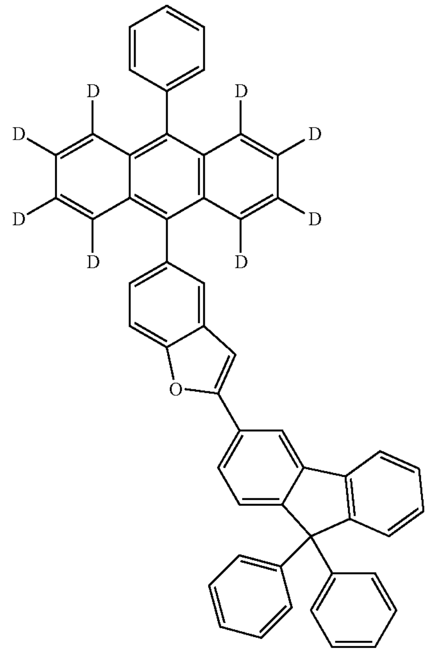
A-128
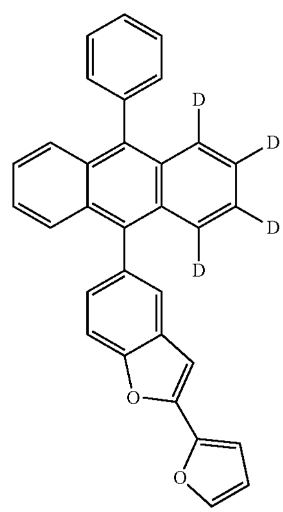

-continued
A-129
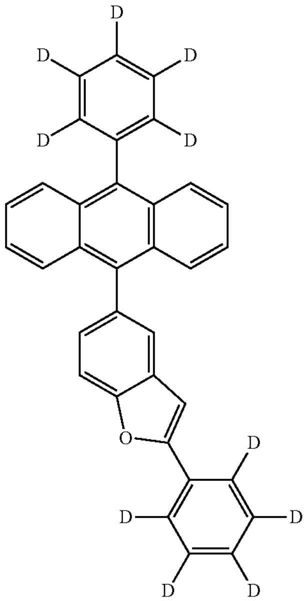
A-130
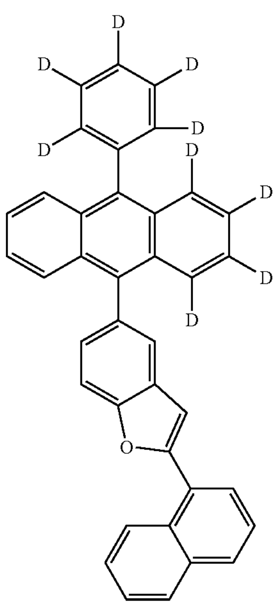
-continued
A-131
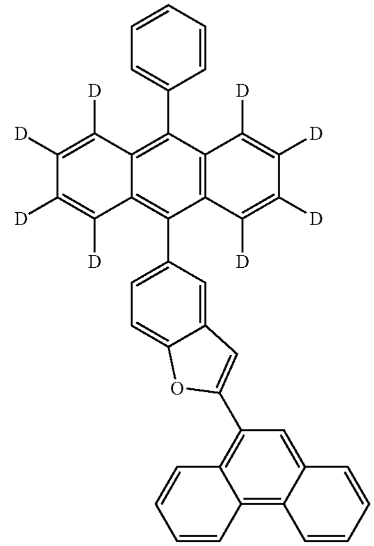
A-132
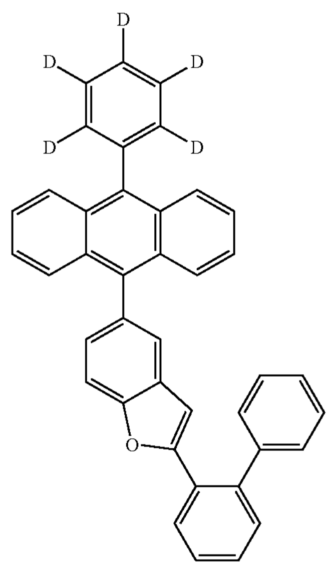

A-133
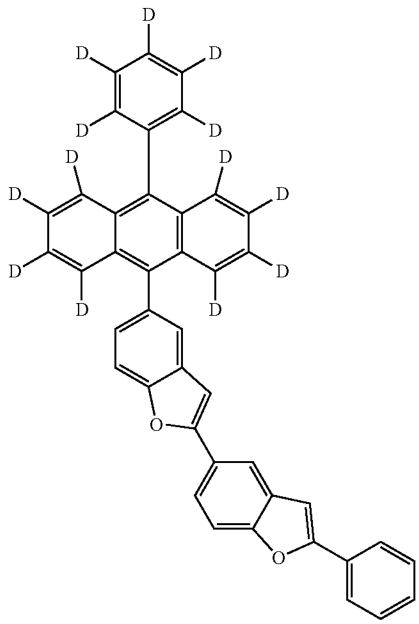
A-134
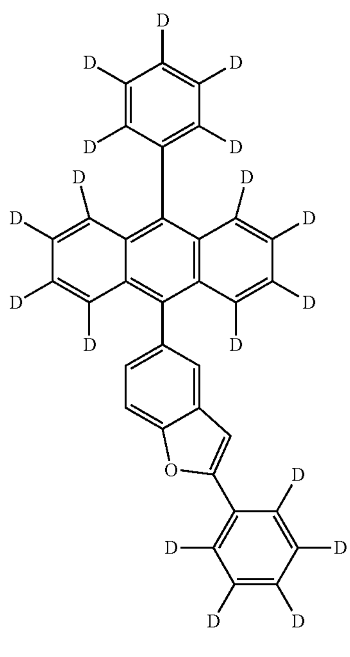
A-135
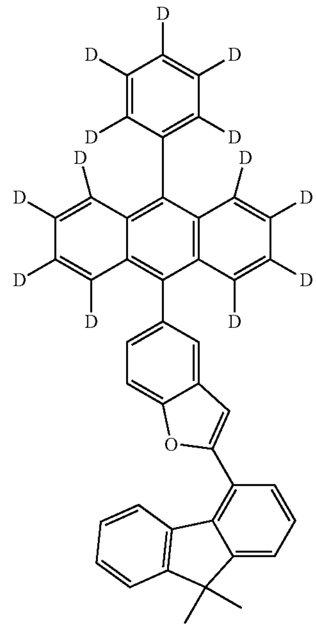
A-136
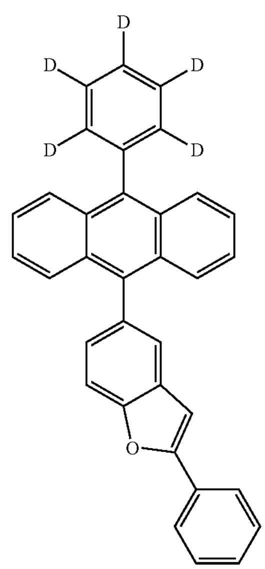

-continued
A-137
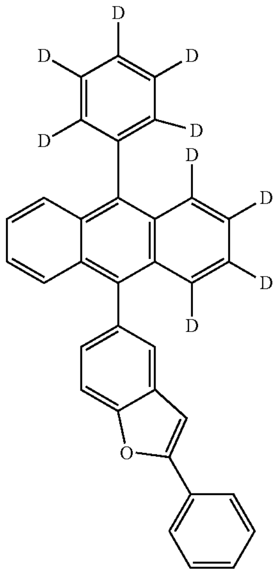
A-138
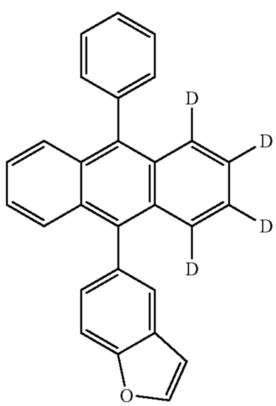
A-139
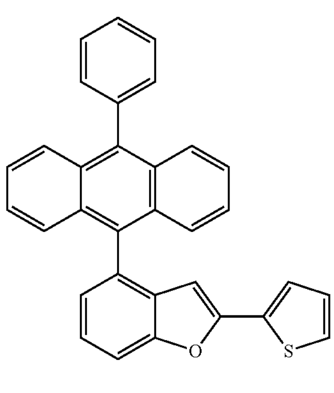
-continued
A-140
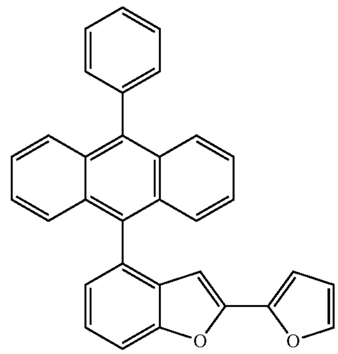
A-141
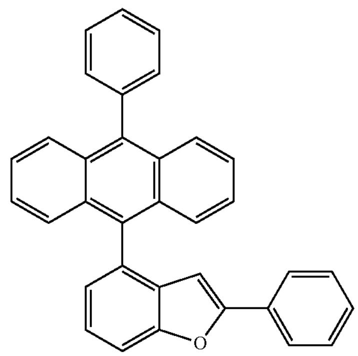
A-142
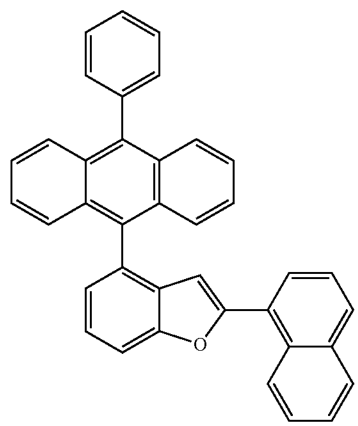
A-143
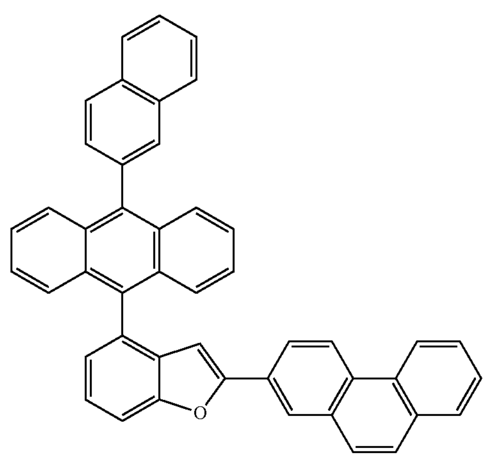

-continued
A-144
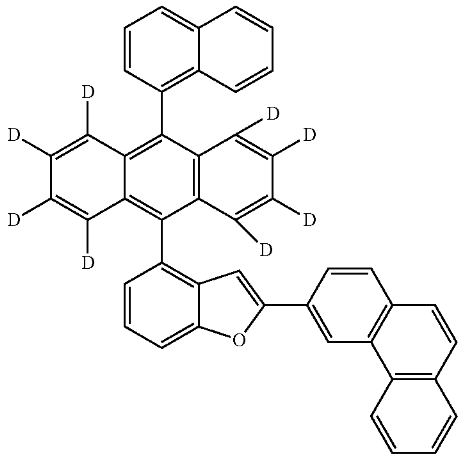
A-145
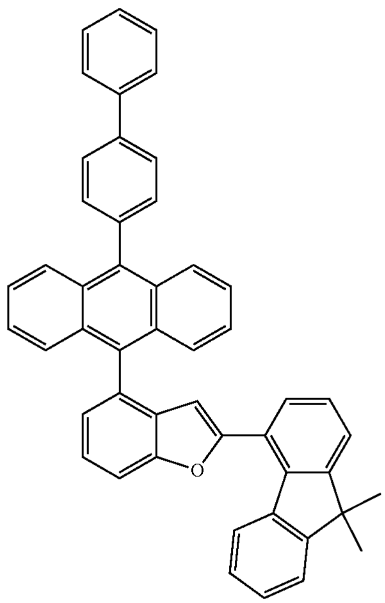
A-146
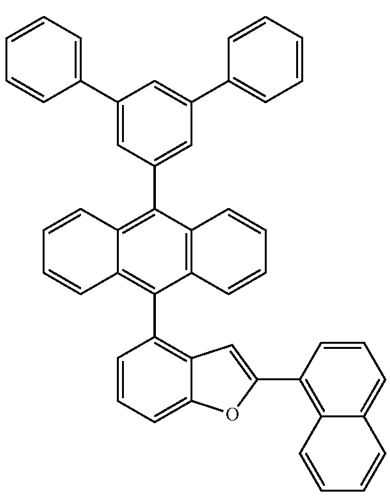
-continued
A-147
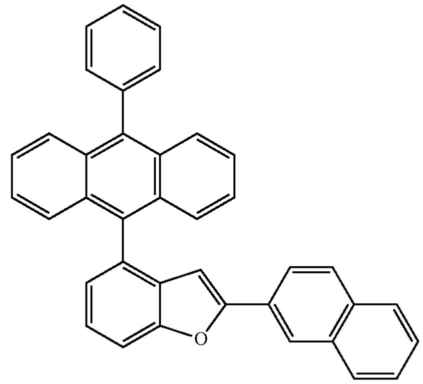
A-148
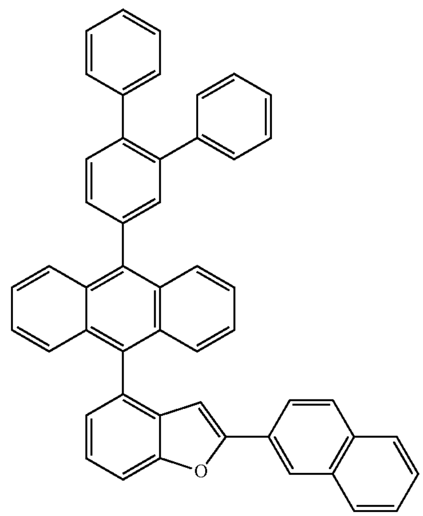
A-149
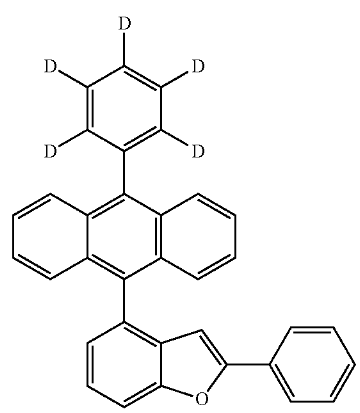

-continued
A-150
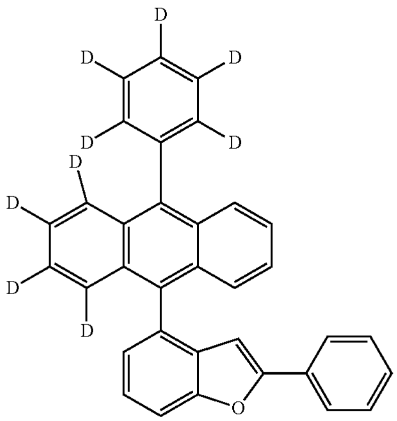
A-151
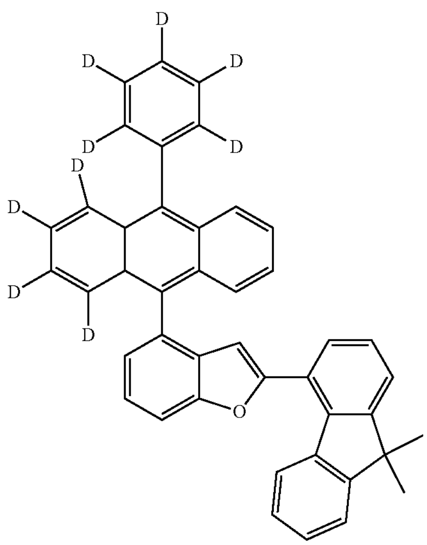
A-152
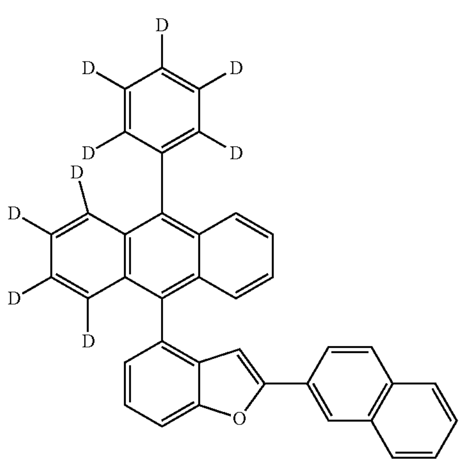
-continued
A-153
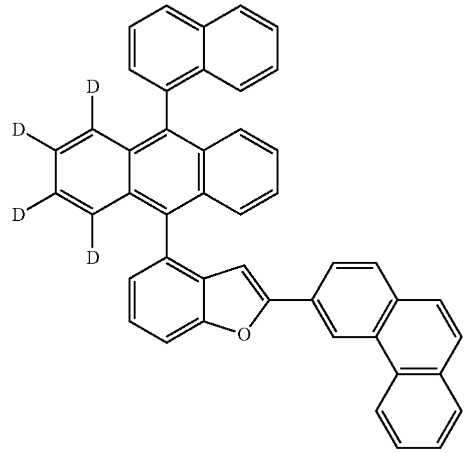
A-154
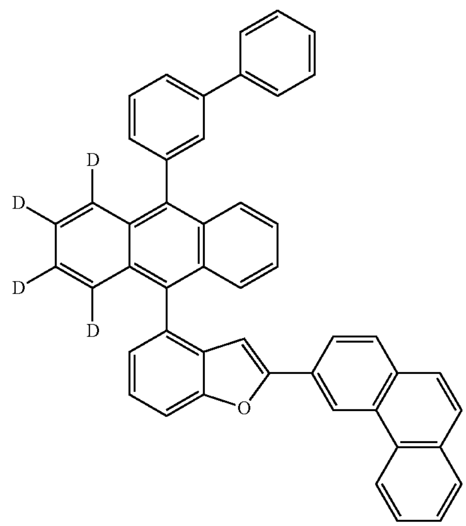
A-155
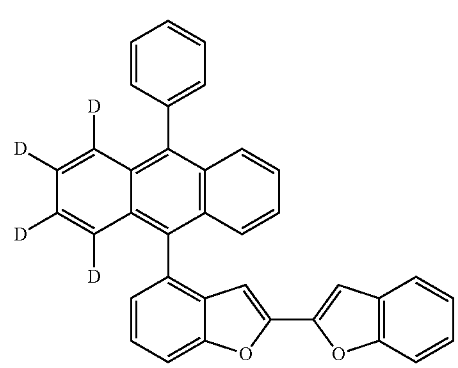

A-156
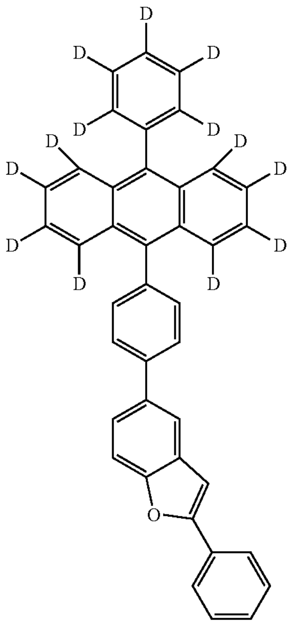
A-157
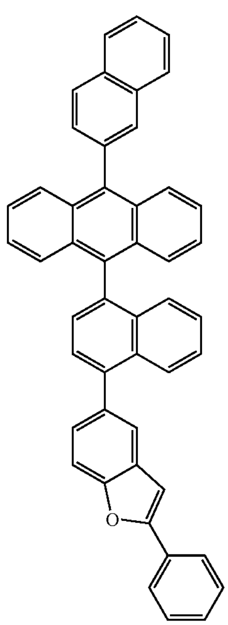
A-158
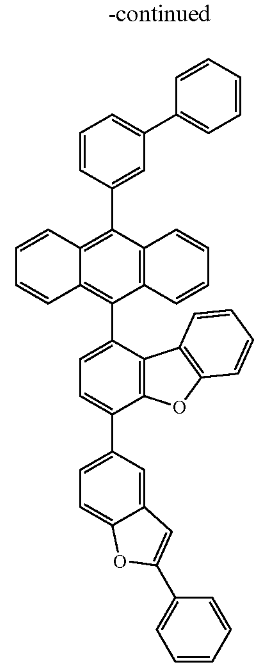
A-159
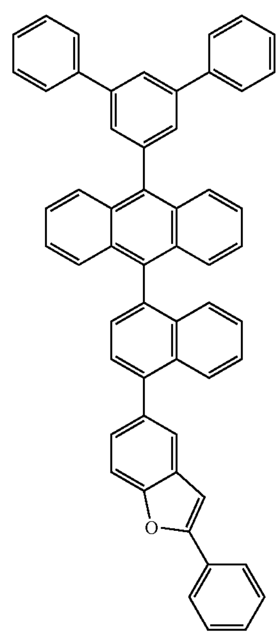

-continued
A-160
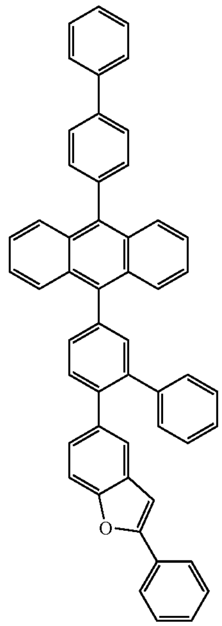
A-161
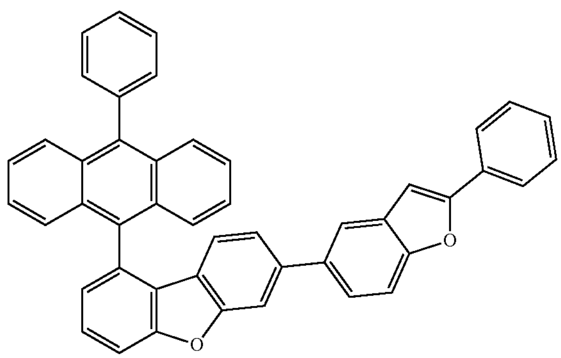
A-162
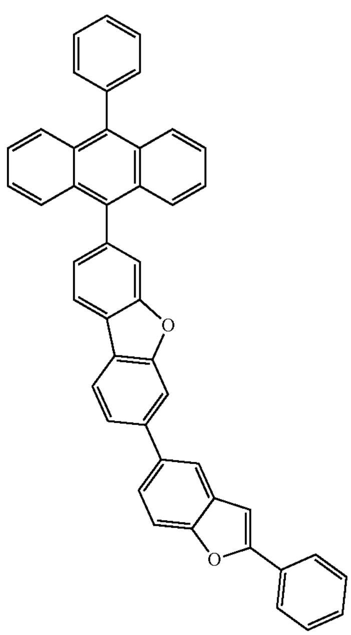
-continued
A-163
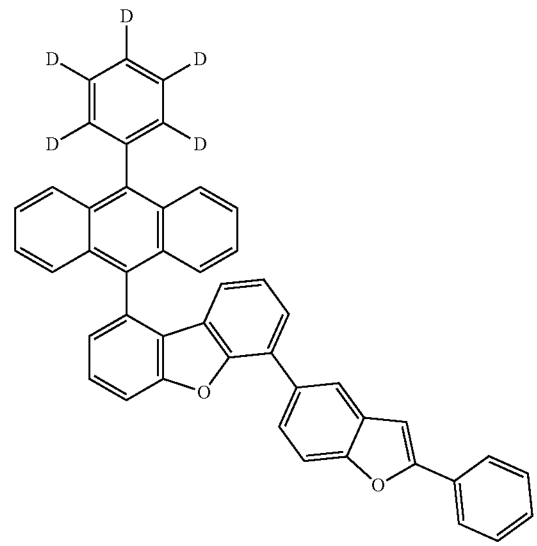
A-164
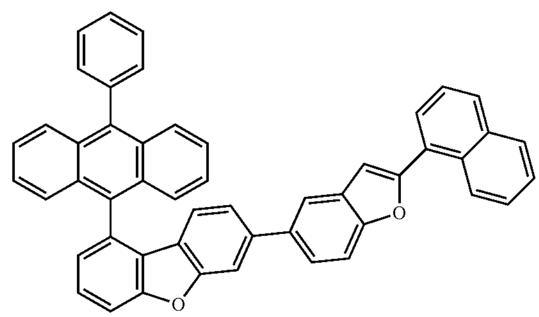
A-165
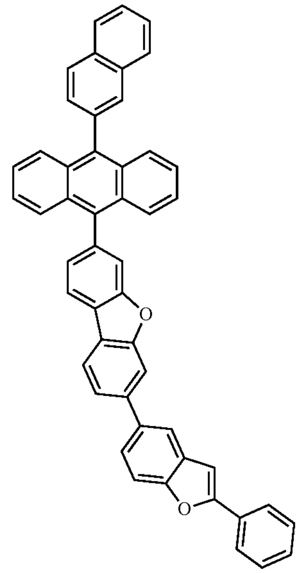

A-166
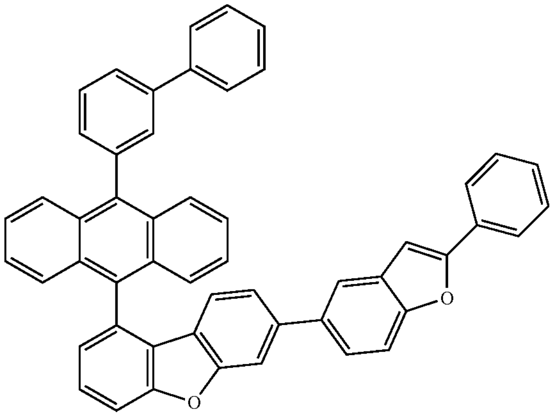
A-167
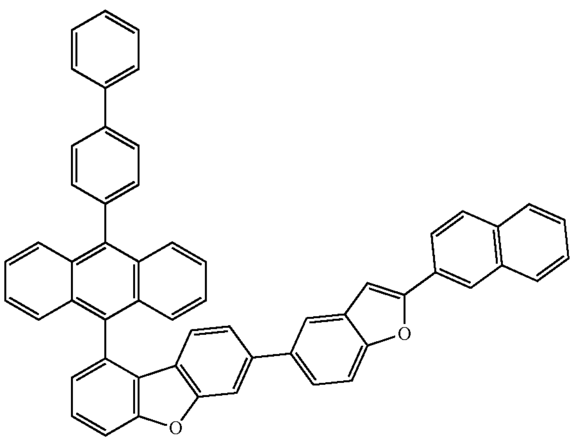
A-168
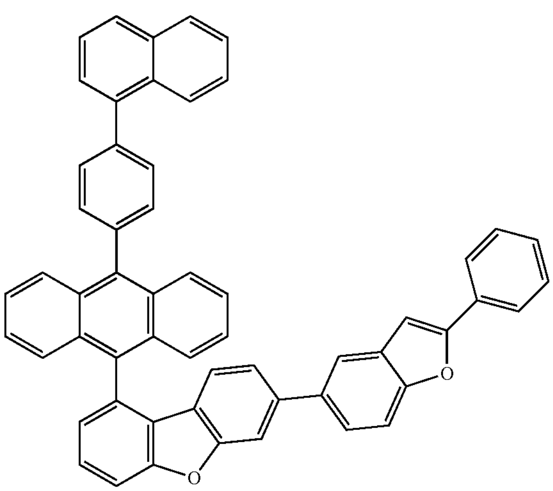
A-169
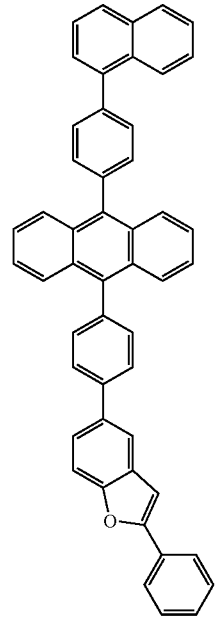
A-170
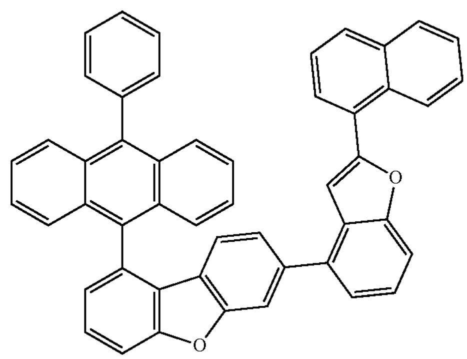
A-171
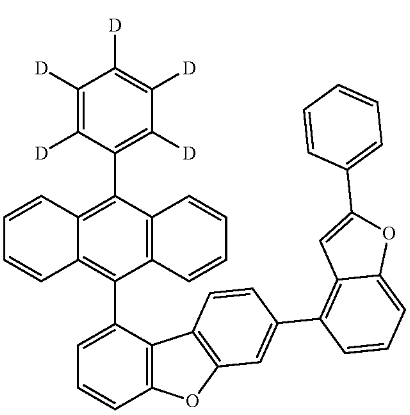

A-172
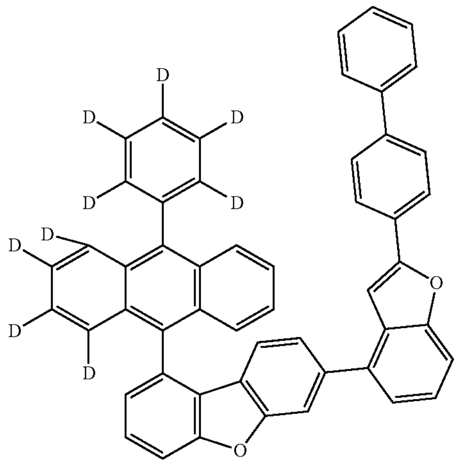
A-173
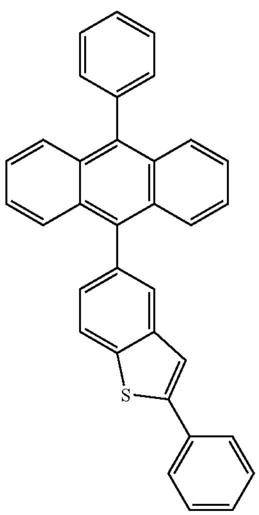
A-174
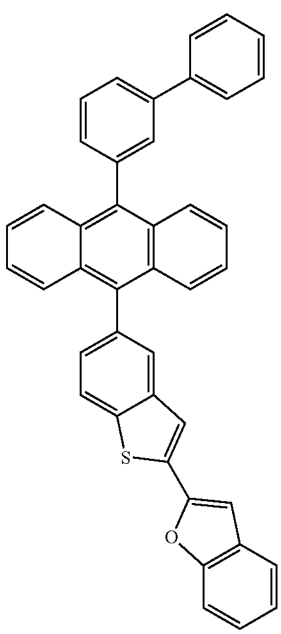
A-175
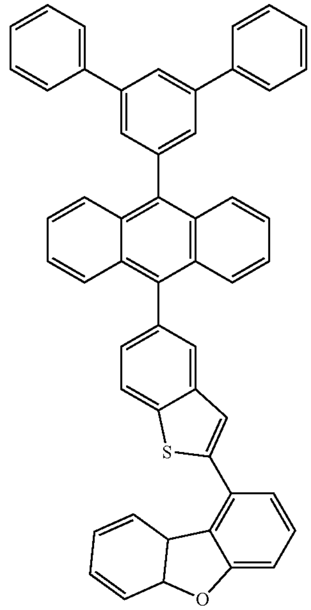
A-176
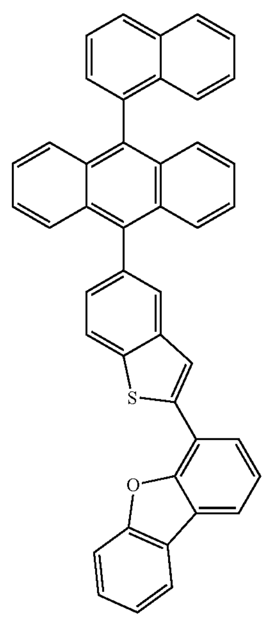

-continued
A-177
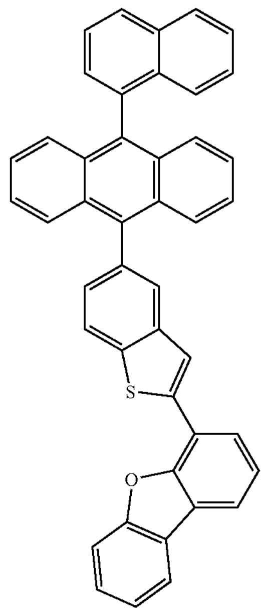
A-178
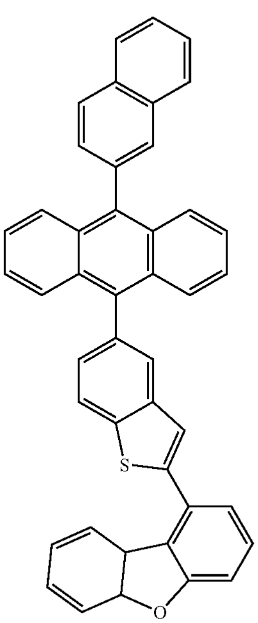
-continued
A-179
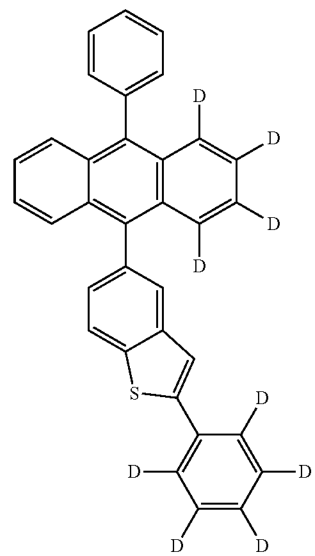
A-180
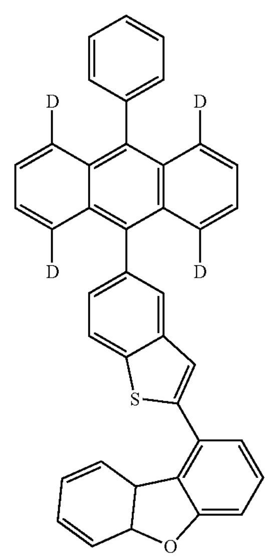
A-181
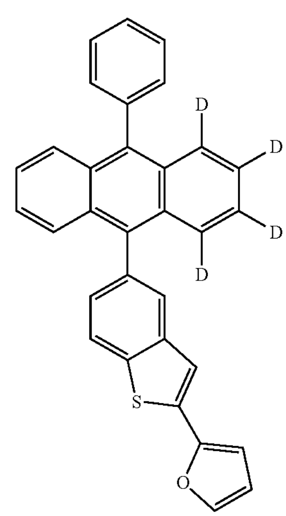

A-182
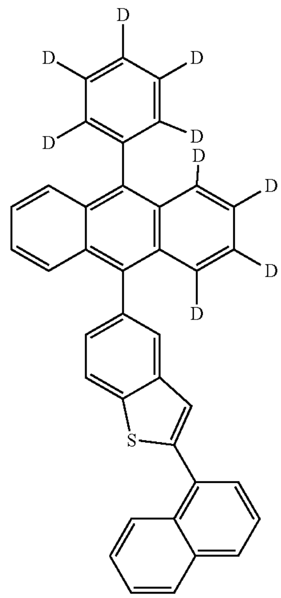
A-183
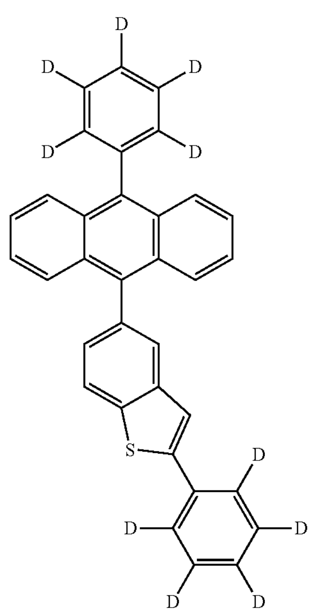
A-184
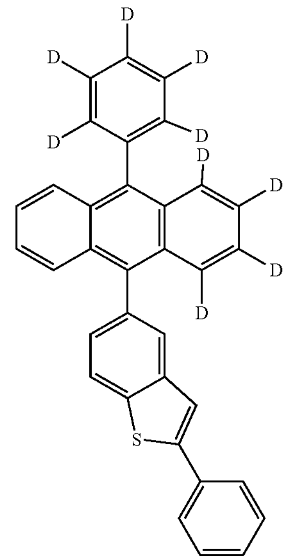
A-185
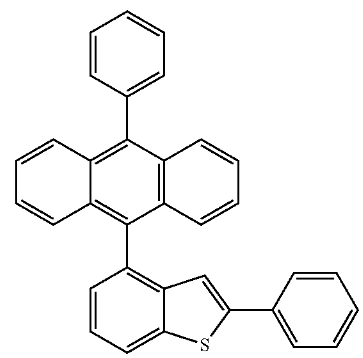
A-186
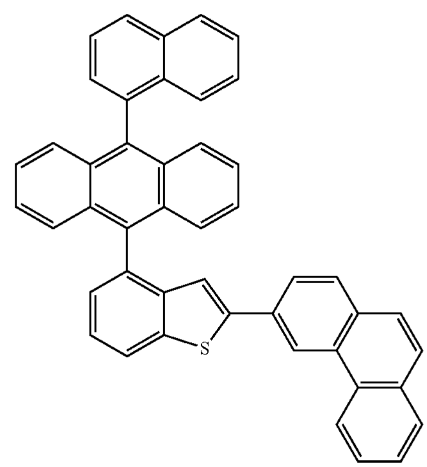

-continued
A-187
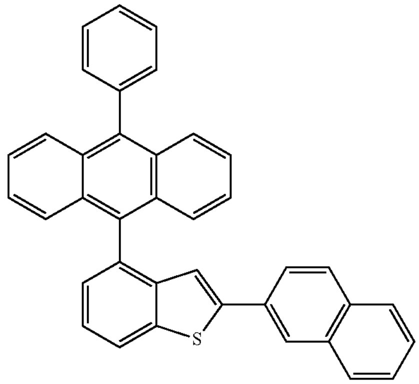
A-188
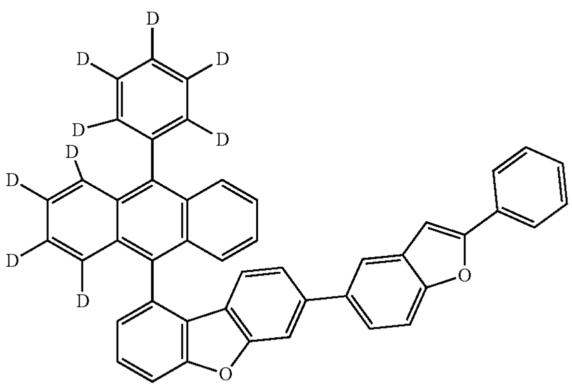
A-189
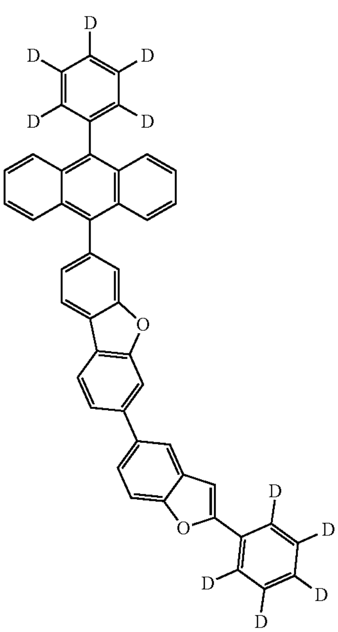
-continued
A-190
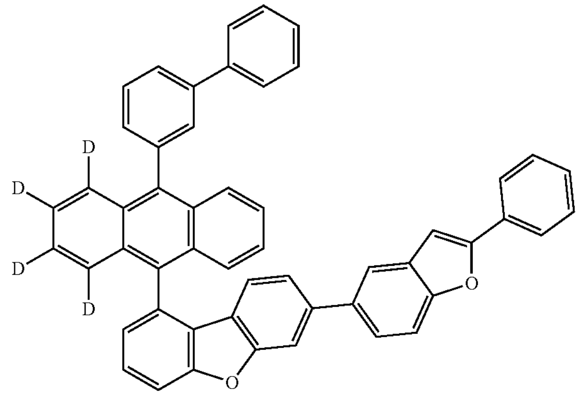
A-191
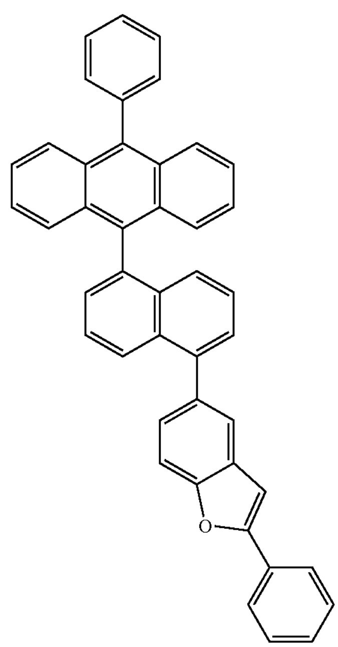

-continued
A-192
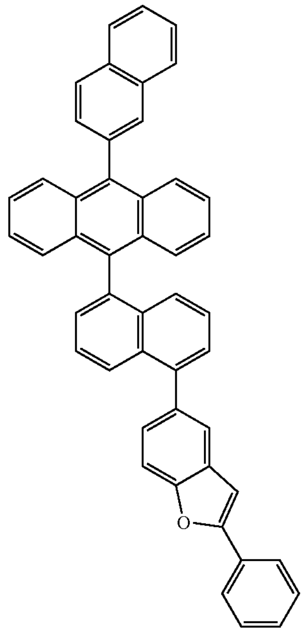
A-193
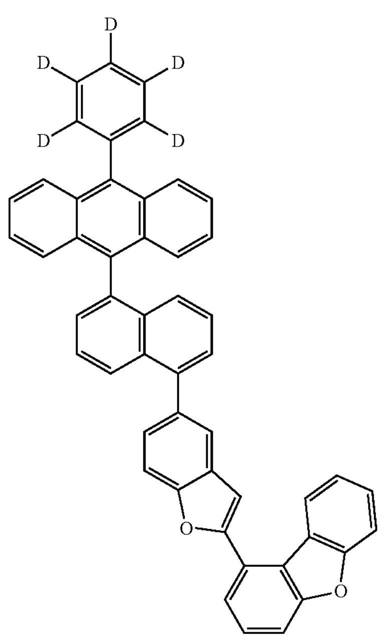
-continued
A-194
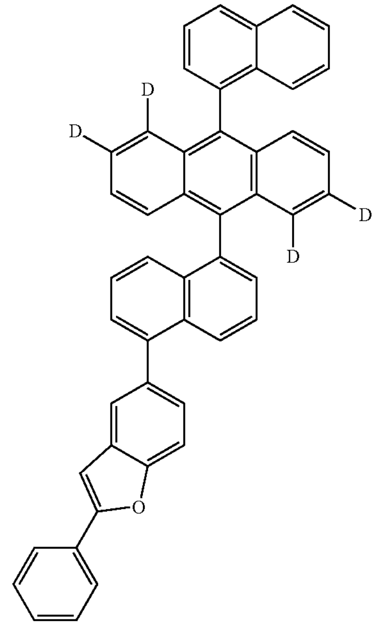
A-195
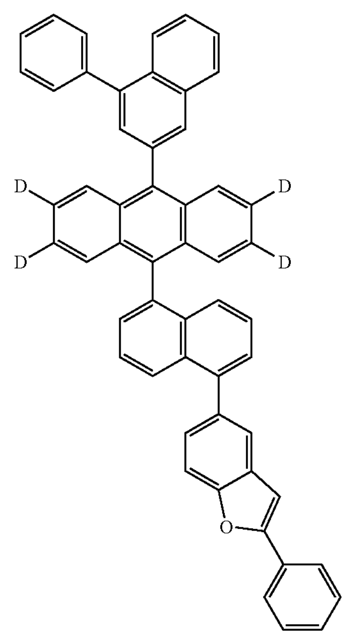

-continued
A-196
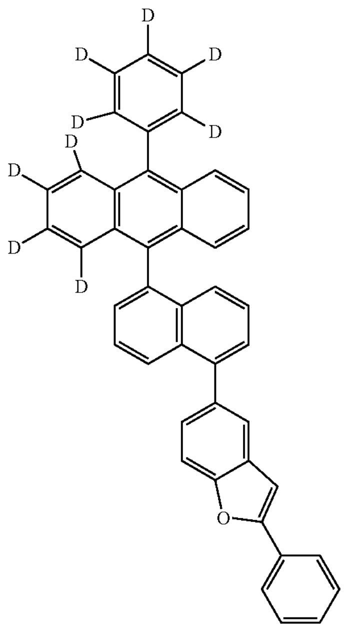
A-197
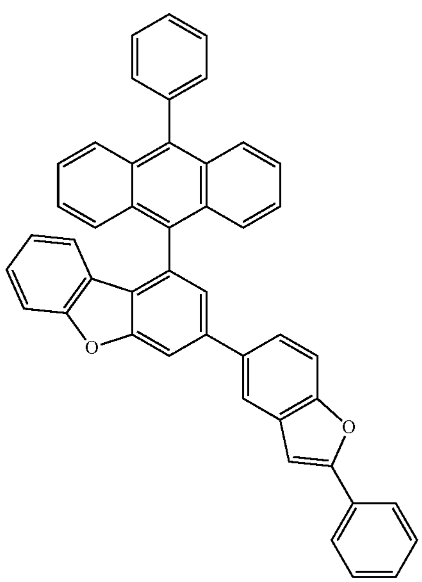
-continued
A-198
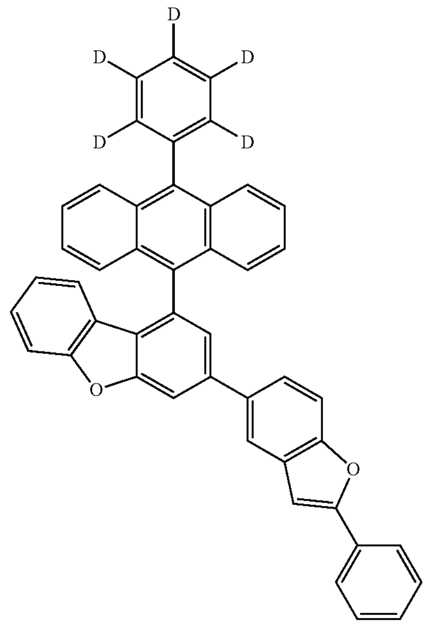
A-199
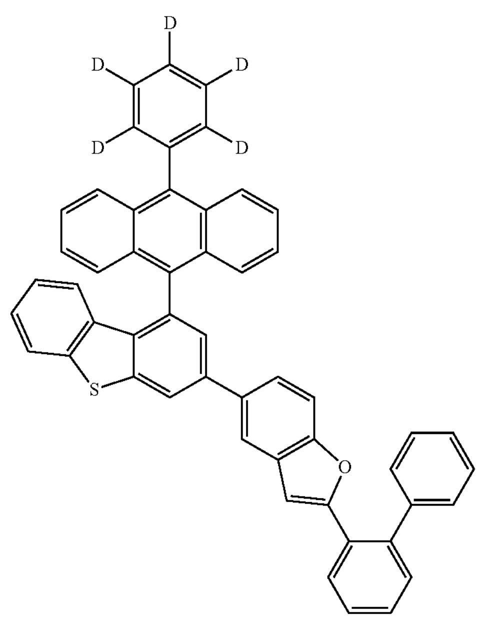

-continued
A-200
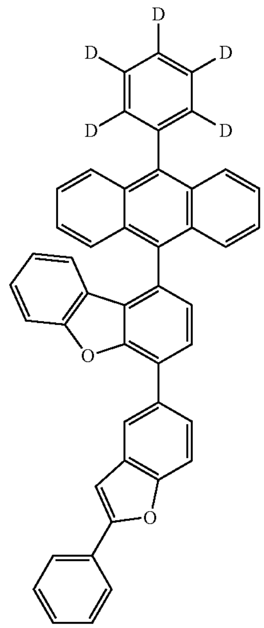
A-201
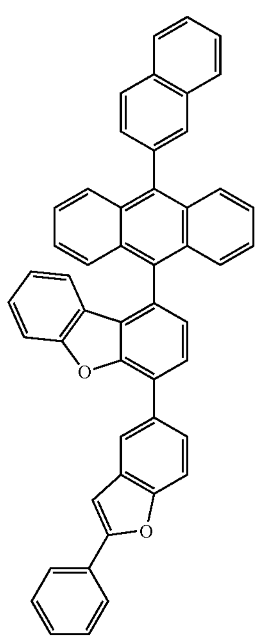
-continued
A-202
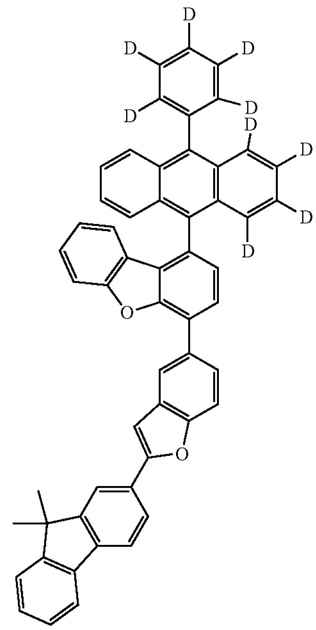
A-203
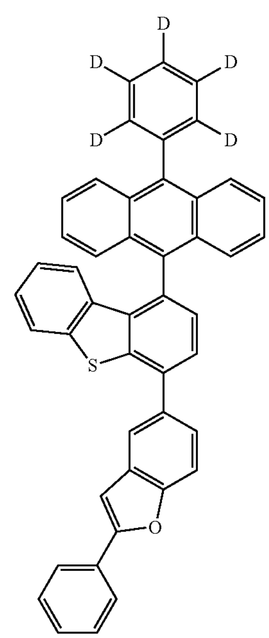

A-204
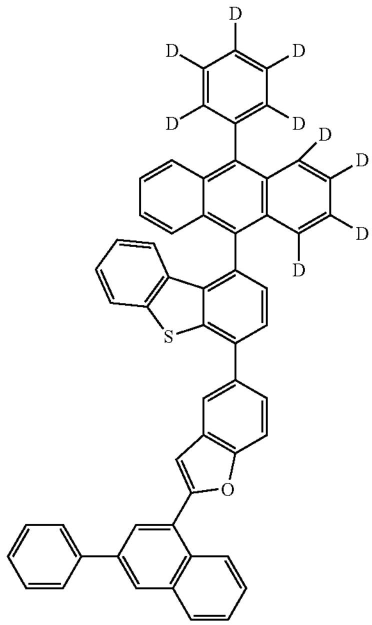
A-205
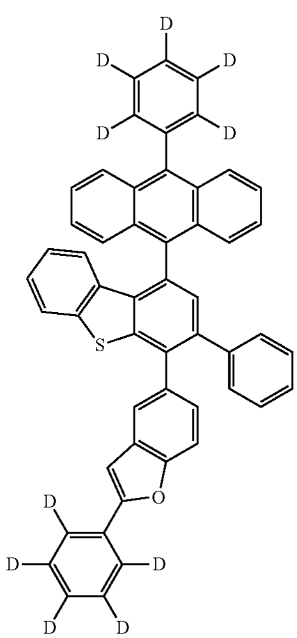
A-206
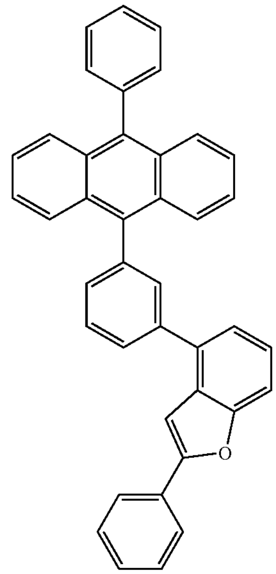
A-207
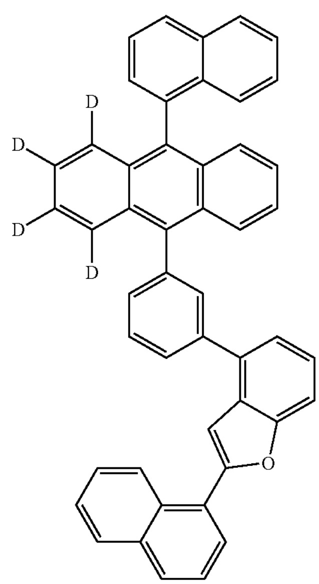

-continued
A-208
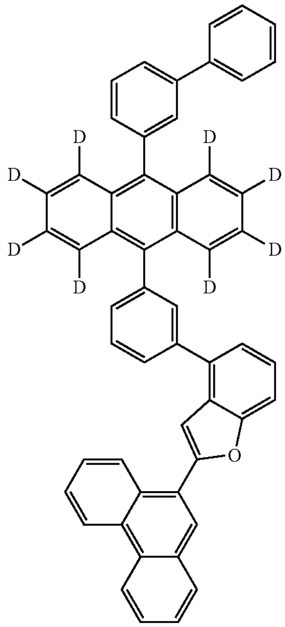
A-209
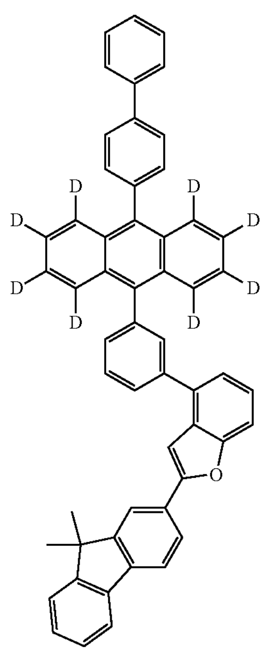
-continued
A-210
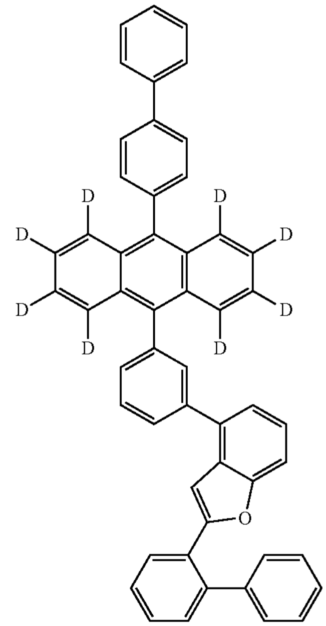
A-211
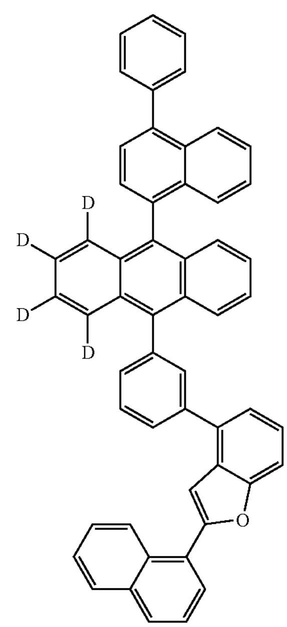

-continued
A-212
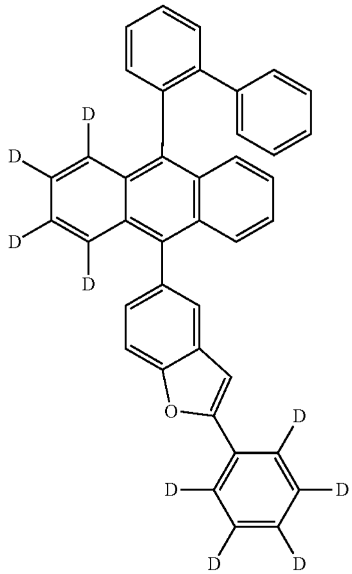
A-213
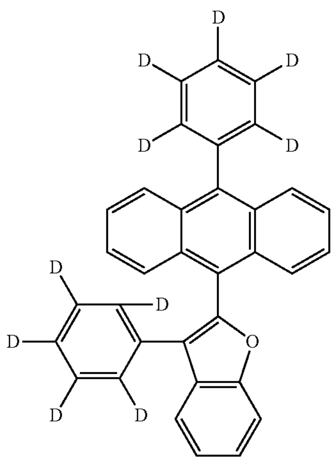
A-214
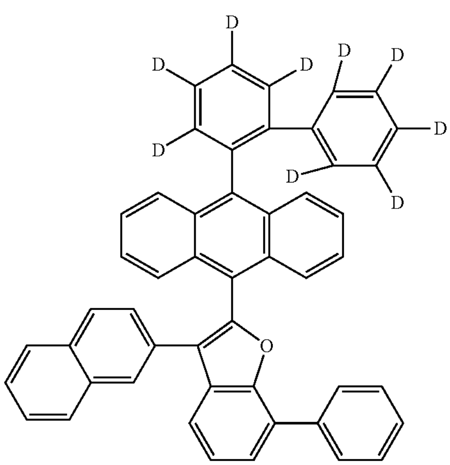
-continued
A-215
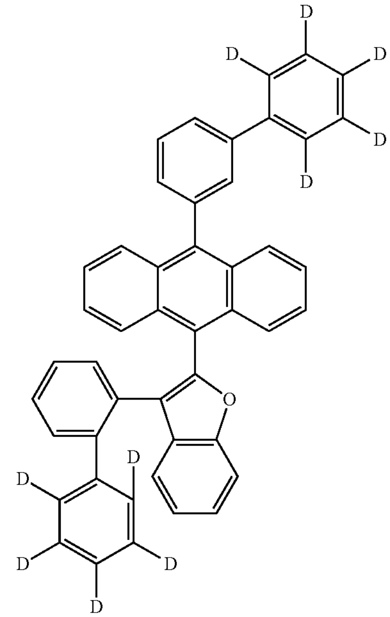
A-216
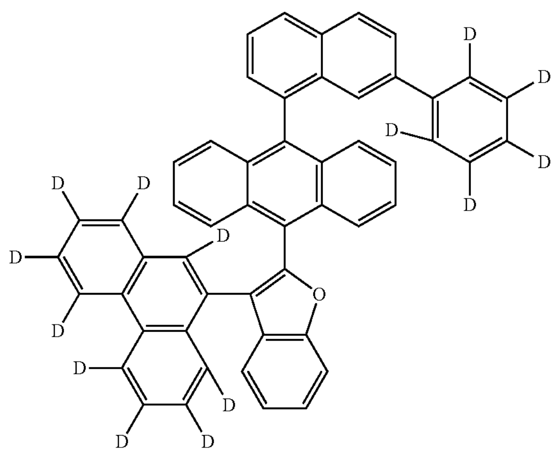
A-217
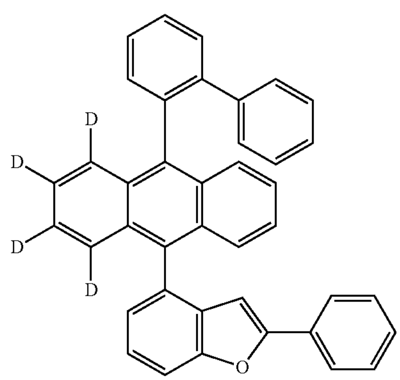

-continued

A-218

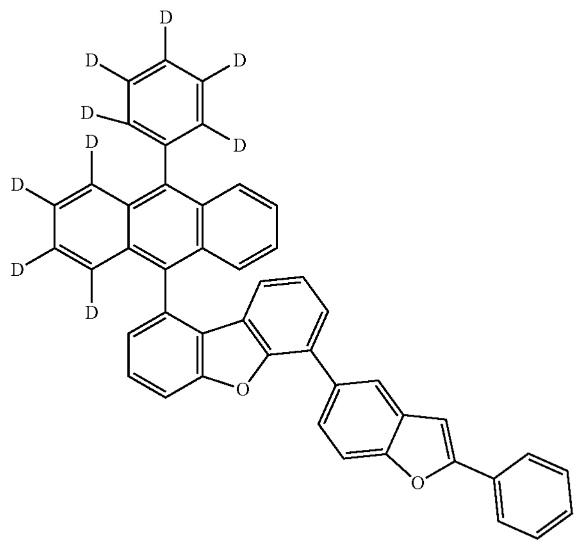

The organic light-emitting device according to the present invention further includes a capping layer, and the compound represented by [Formula B] contained in the capping layer is selected from compounds represented by the following [B-1] to [B-79], or is selected from compounds represented by the following [B-101] to [B-148]. In addition, the compound represented by [Formula C] may be selected from compounds represented by the following [C-1] to [C-99], but is not limited thereto.

B-1

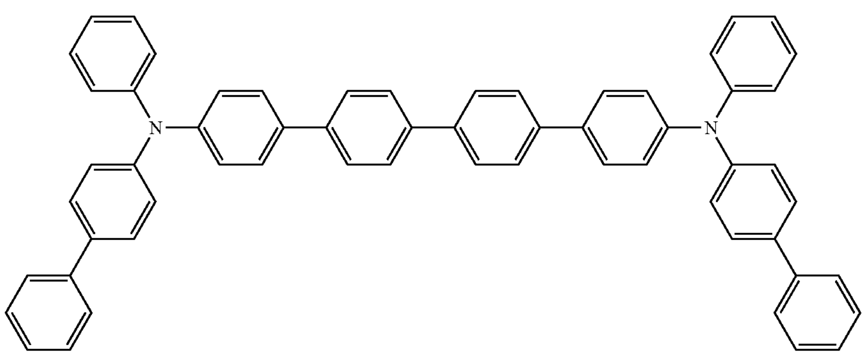

B-2

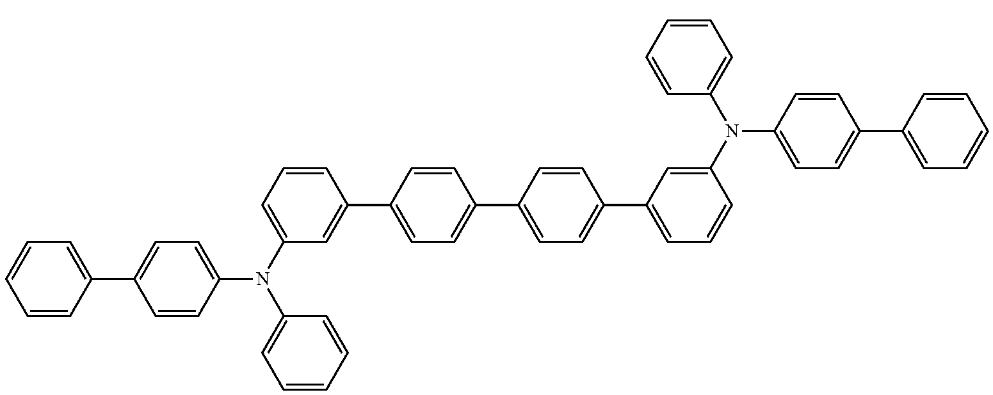

-continued
B-3
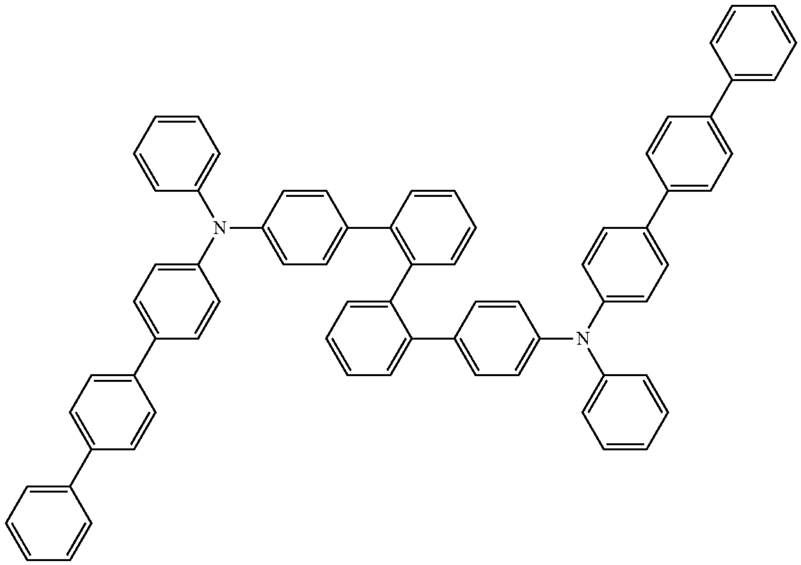
B-4
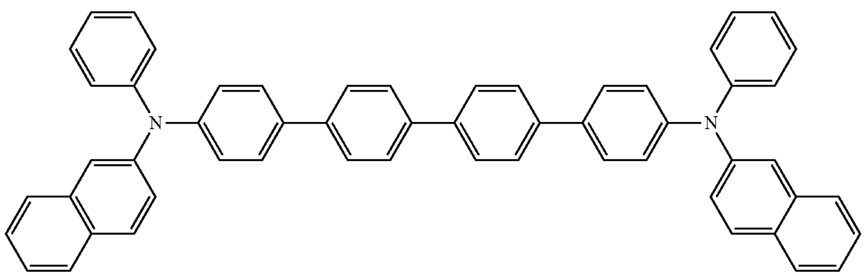
B-5
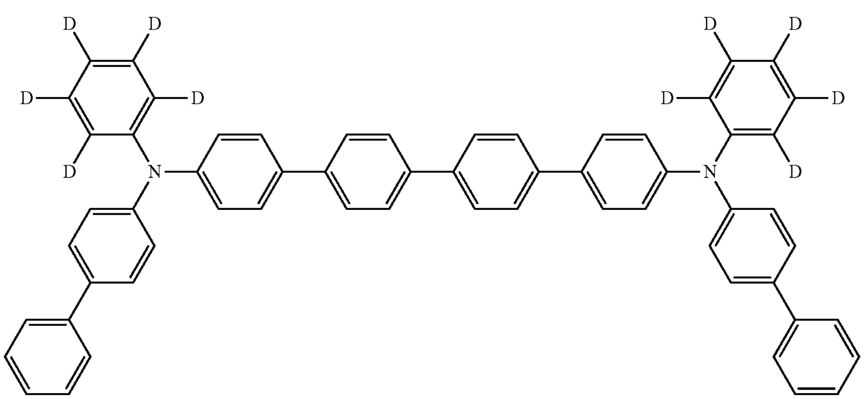
B-6
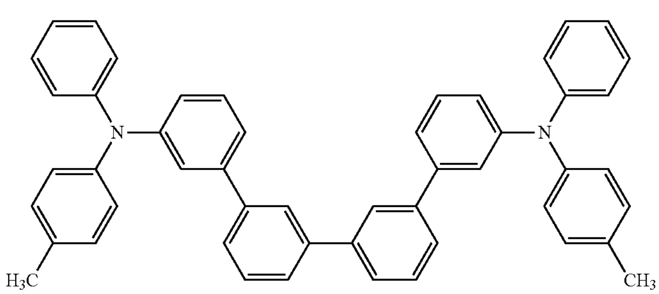

-continued
B-7
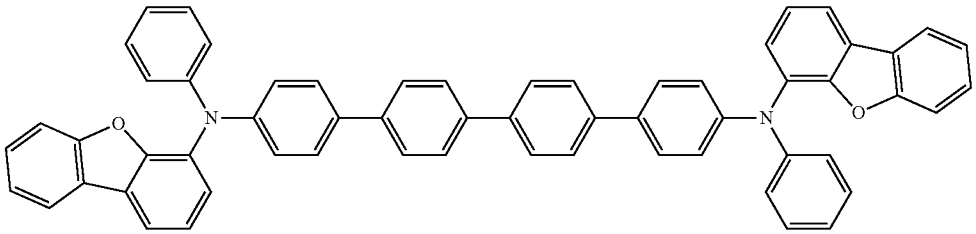
B-8
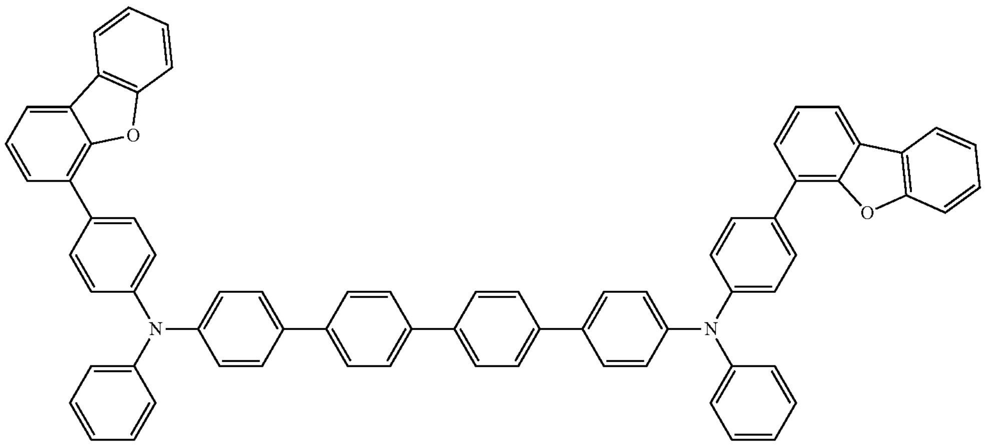
B-9
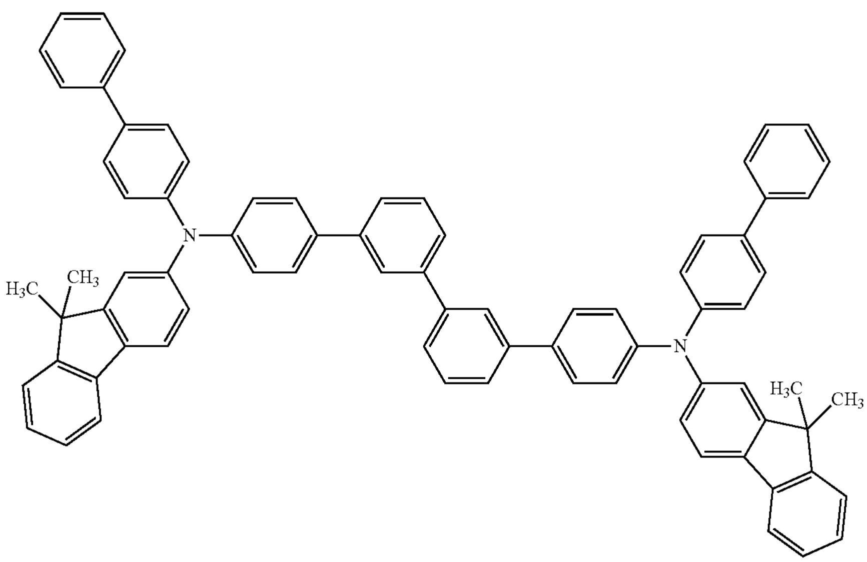
B-10
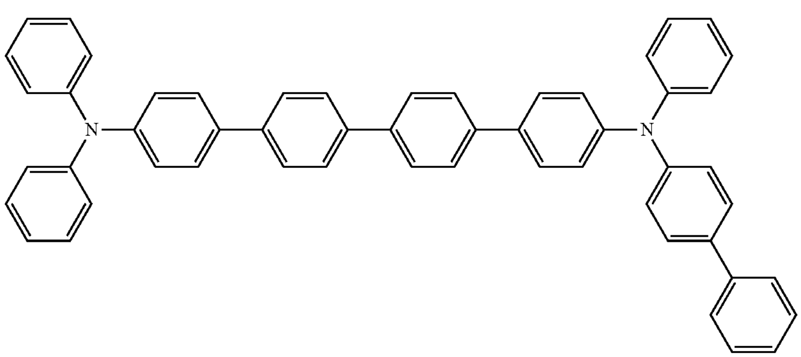

-continued
B-11
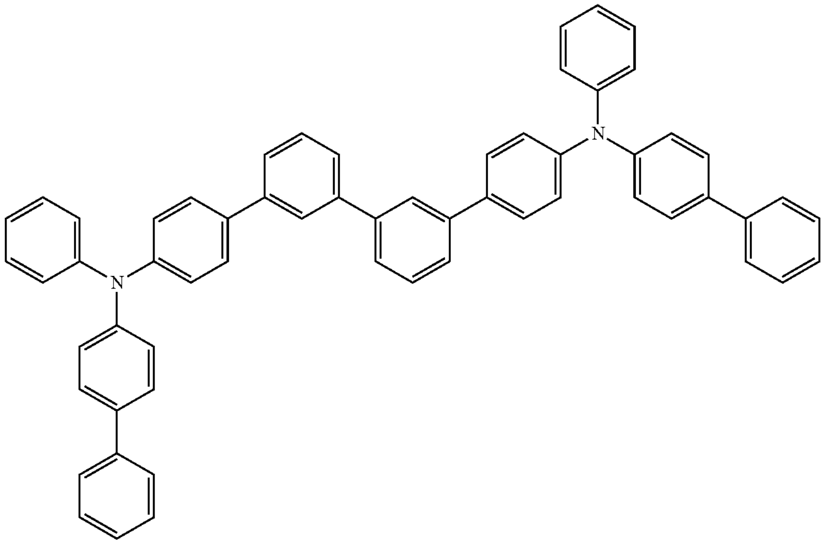
B-12
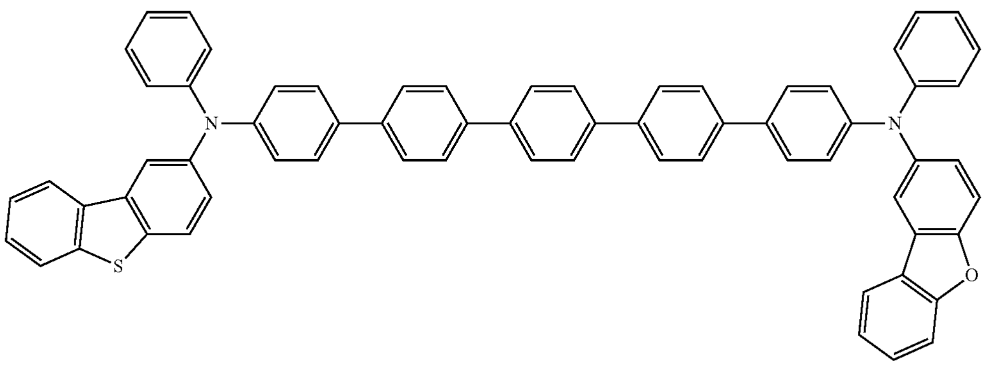
B-13
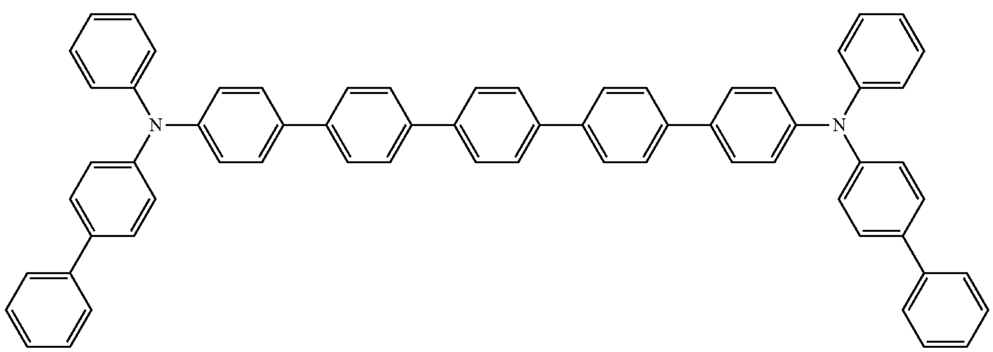
B-14
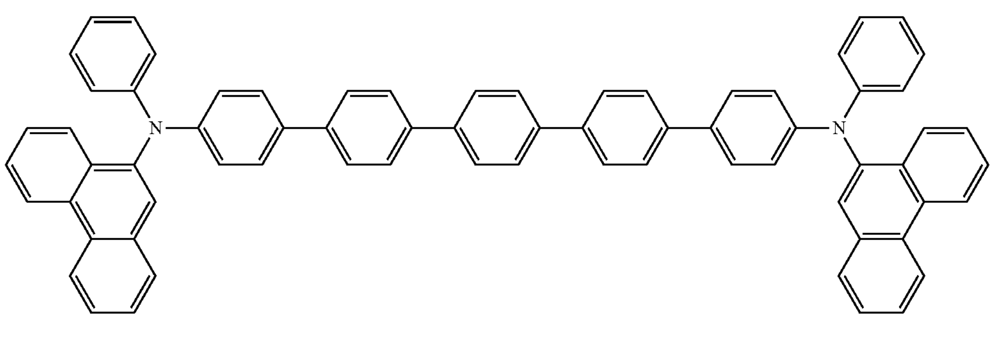

-continued
B-15
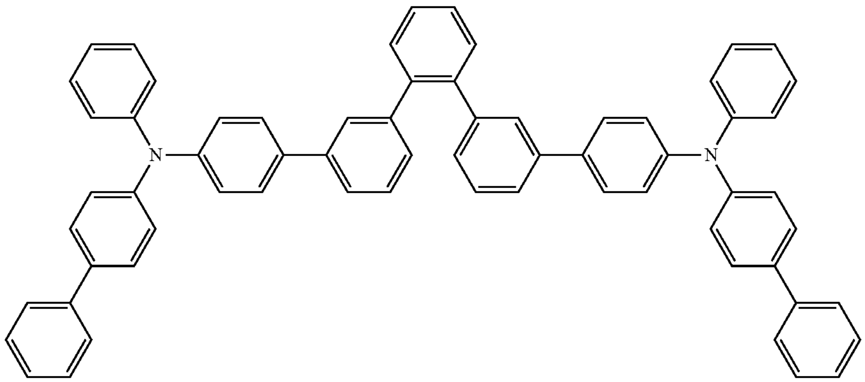
B-16
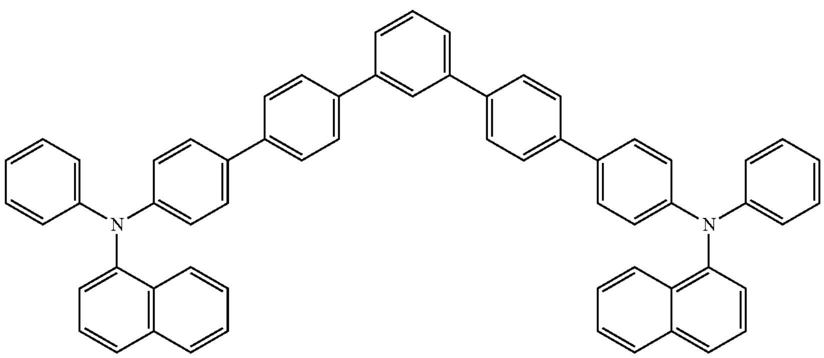
B-17
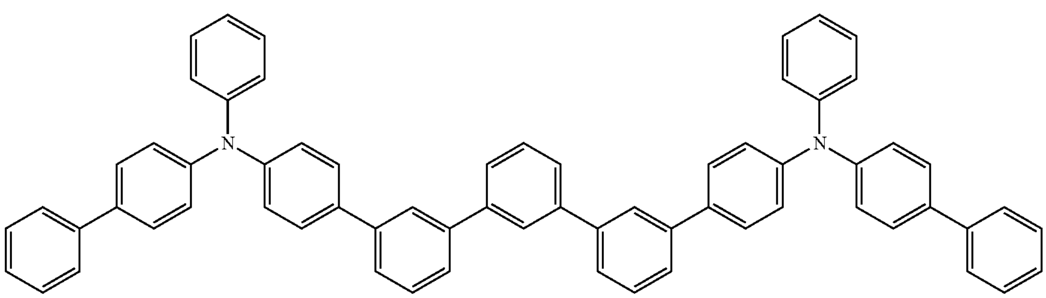
B-18
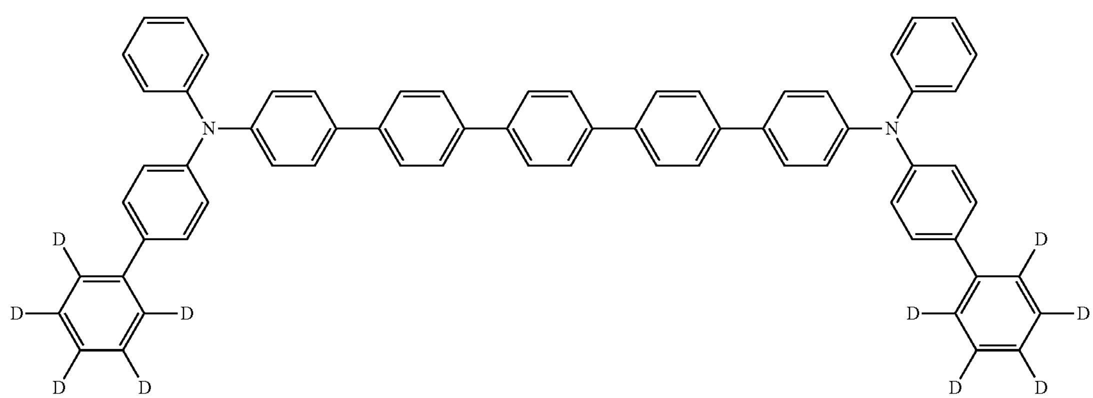

-continued
B-19
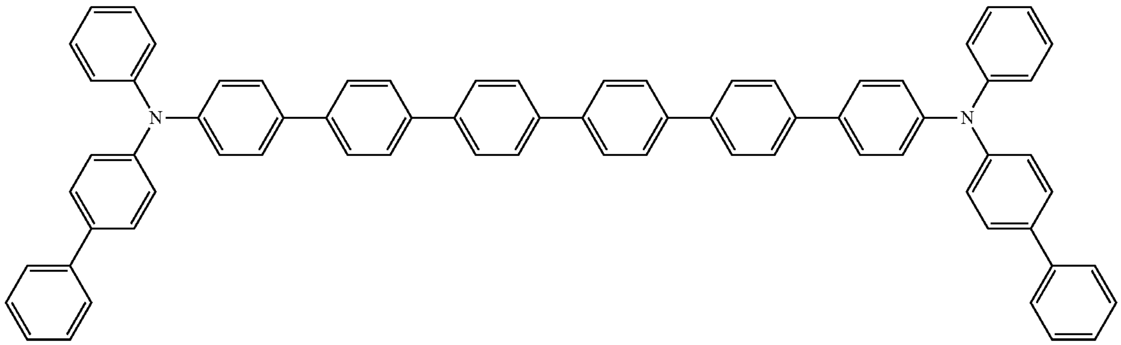
B-20
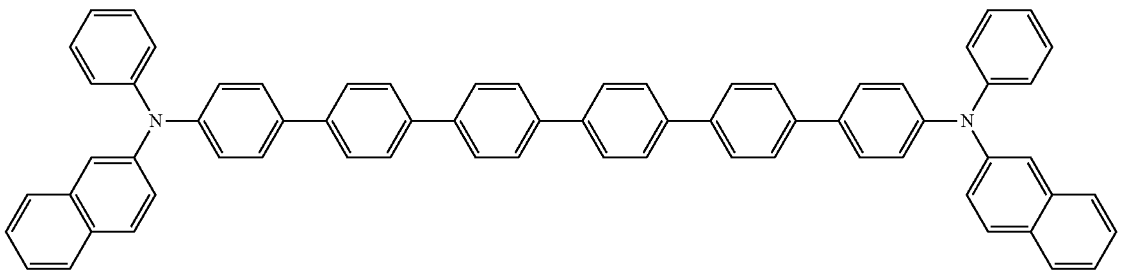
B-21
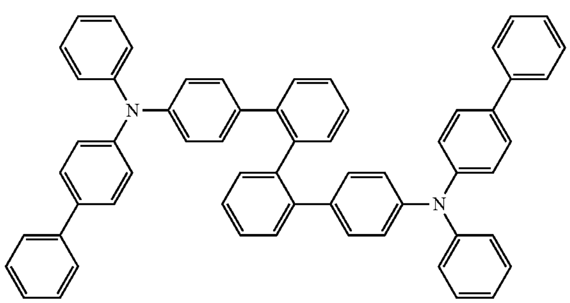
B-22
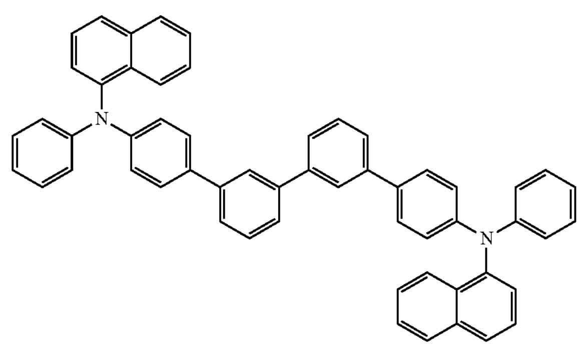
B-23
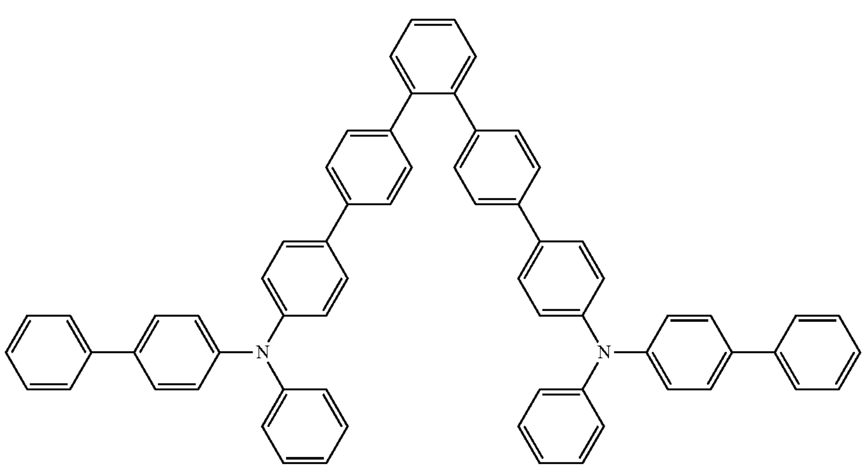

-continued
B-24
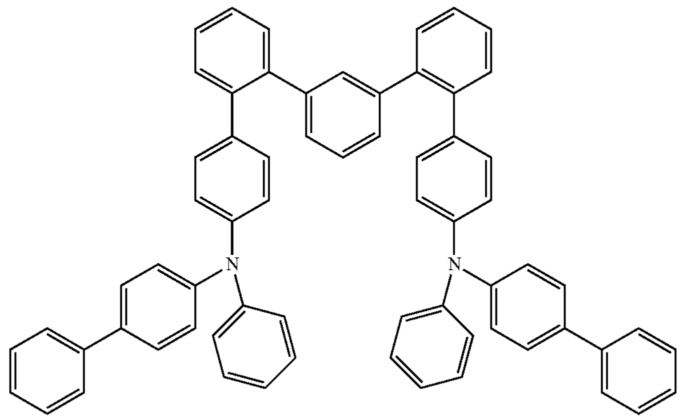
B-25
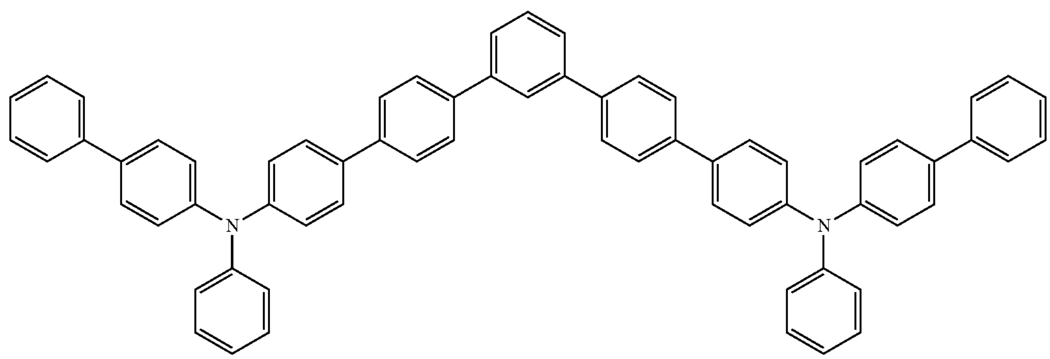
B-26
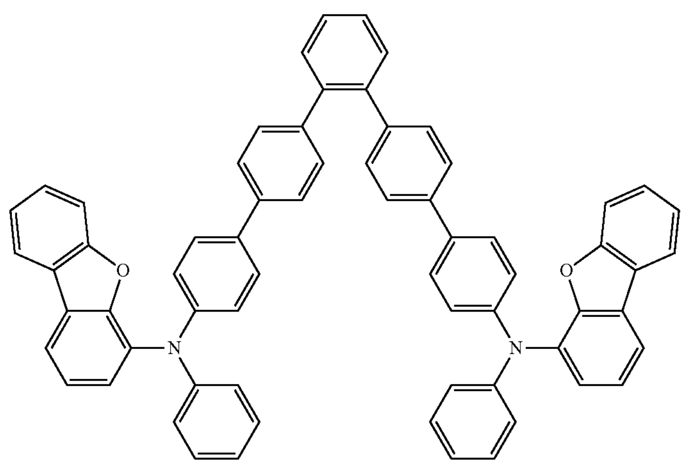
B-27
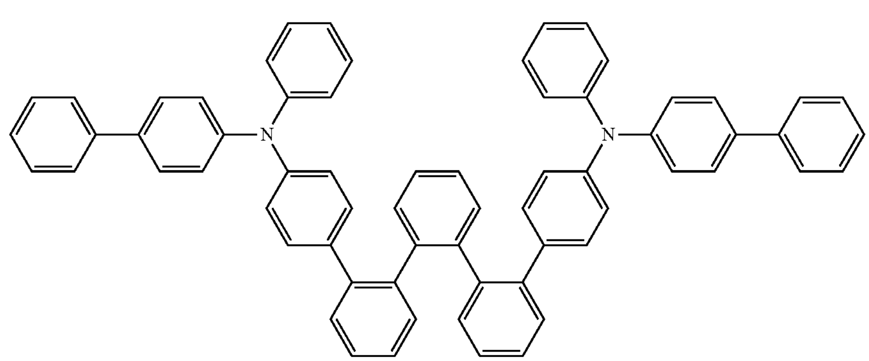

-continued
B-28
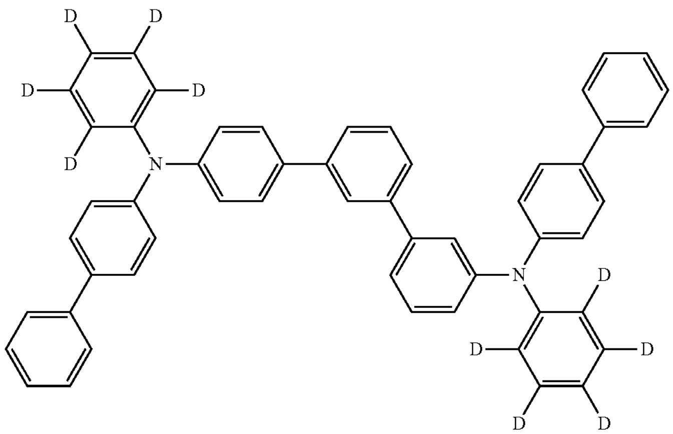
B-29
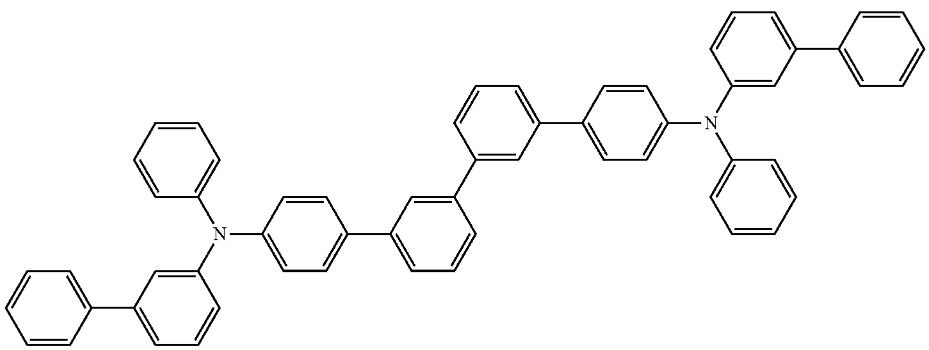
B-30
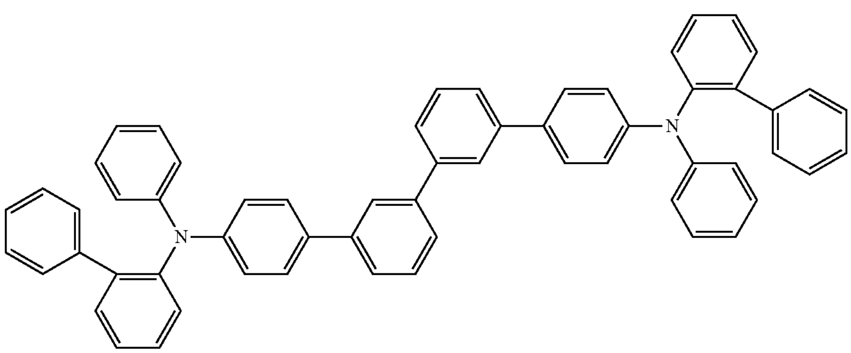
B-31
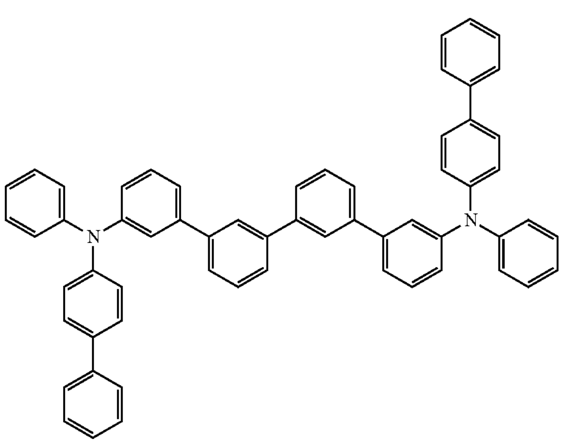
B-32
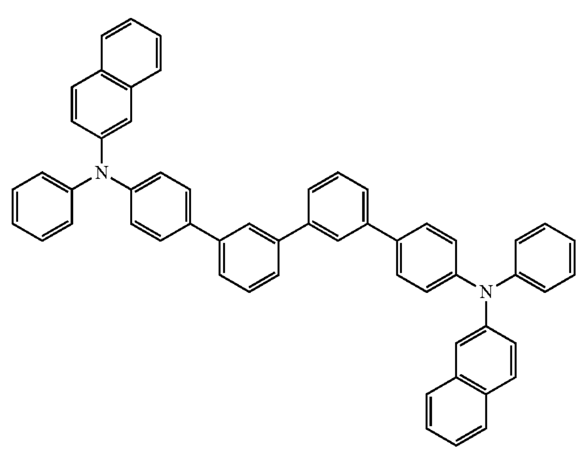

-continued
B-33
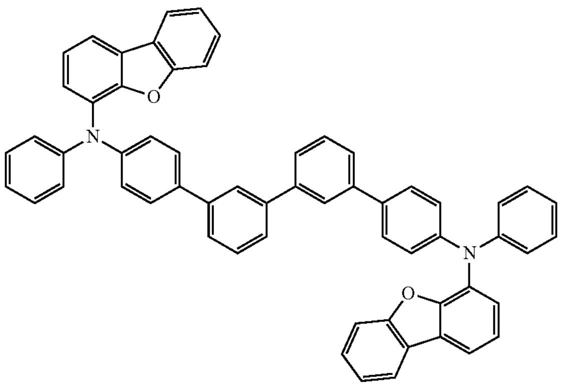
B-34
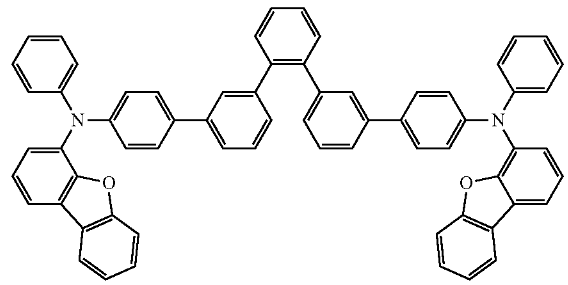
B-35
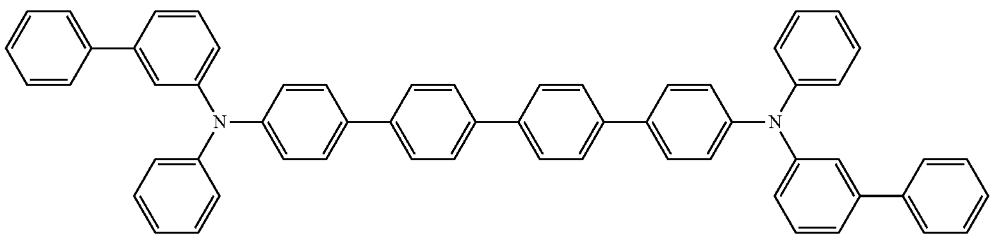
B-36
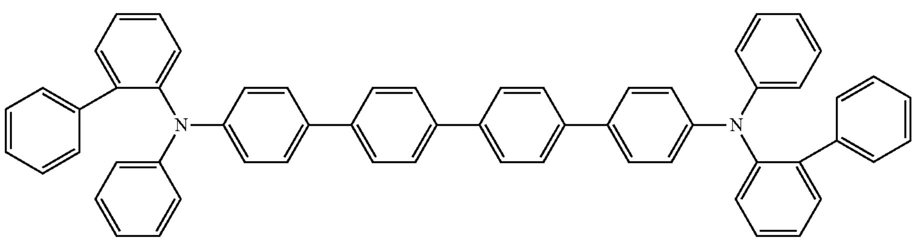
B-37
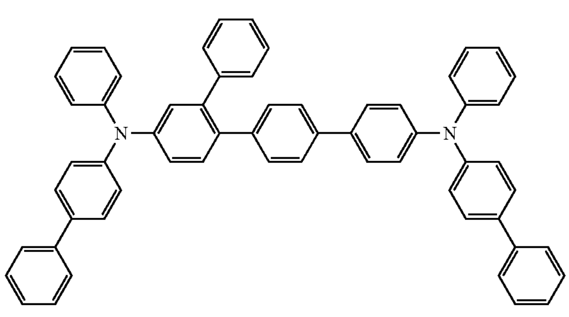
B-38
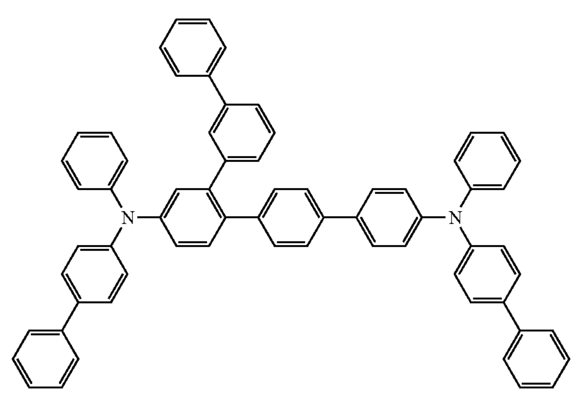

-continued
B-39
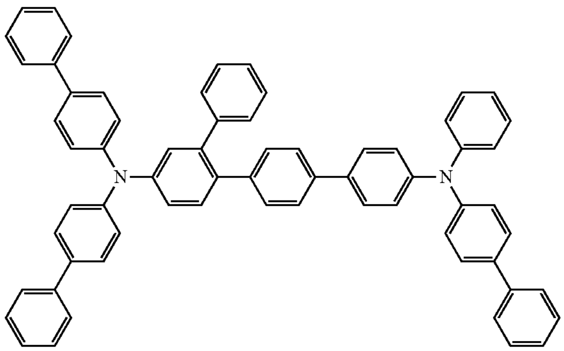
B-40
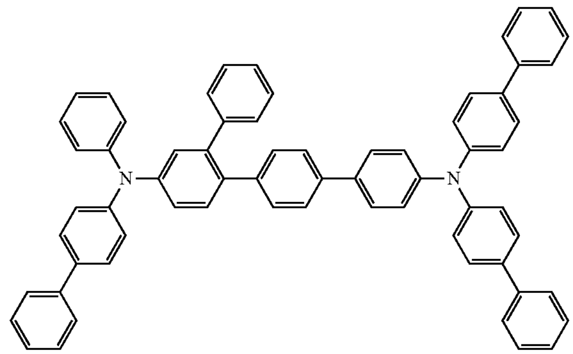
B-41
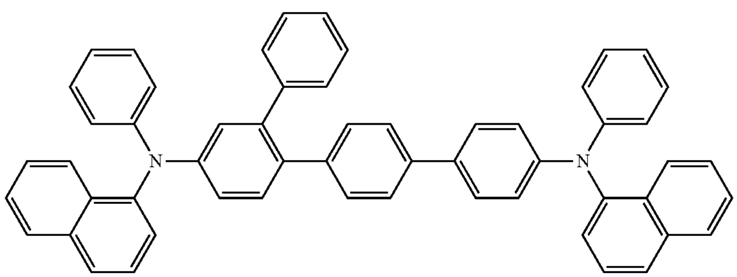
B-42
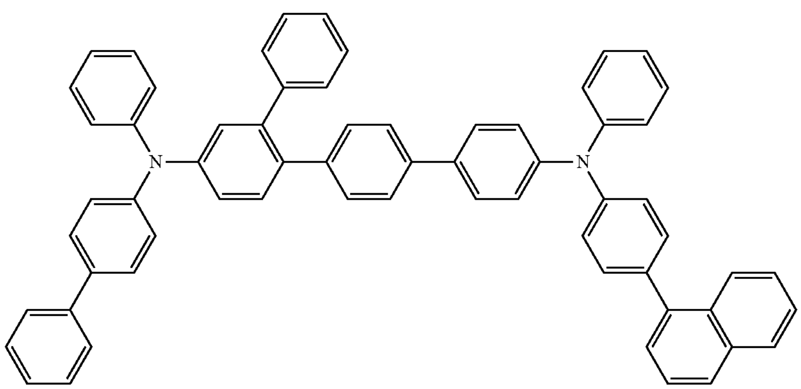
B-43
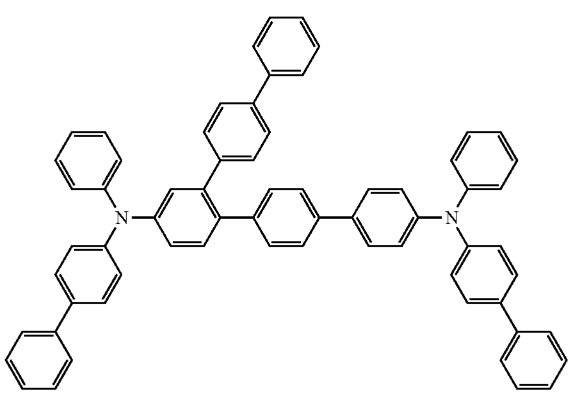
B-44
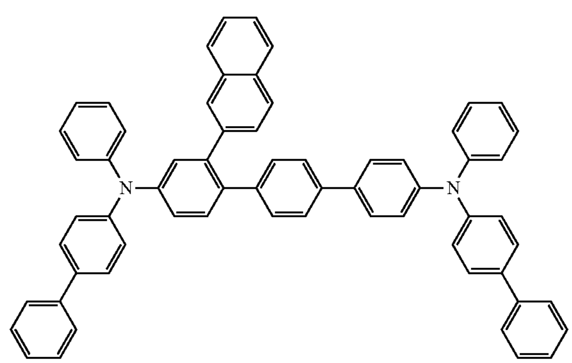

-continued
B-45
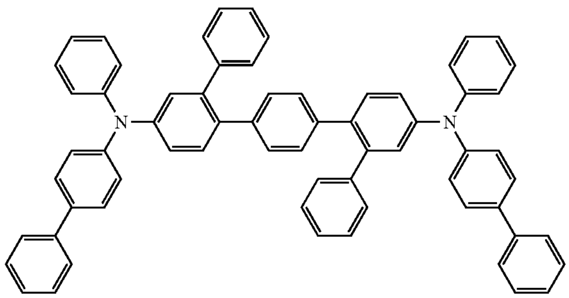
B-46
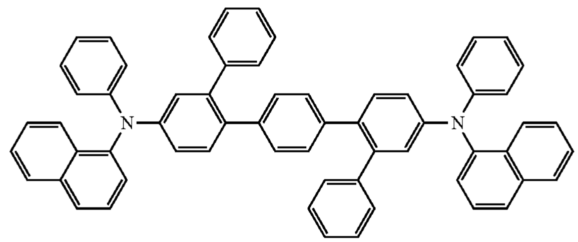
B-47
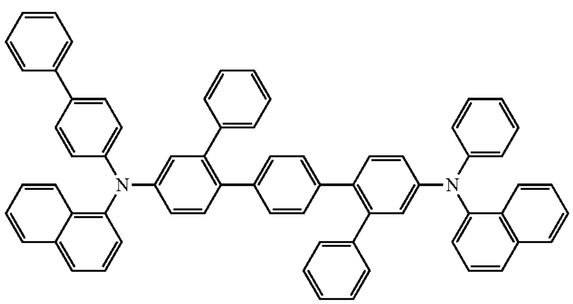
B-48
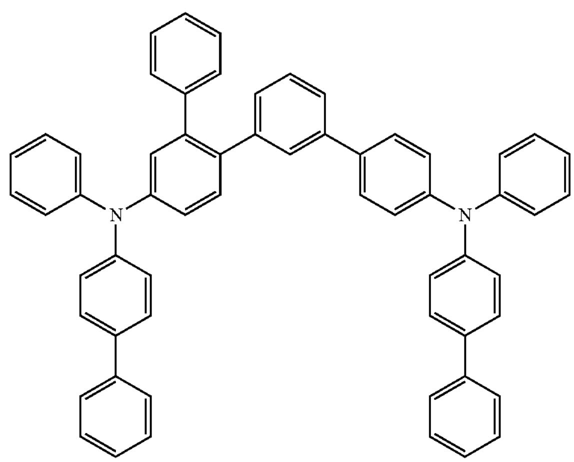
B-49
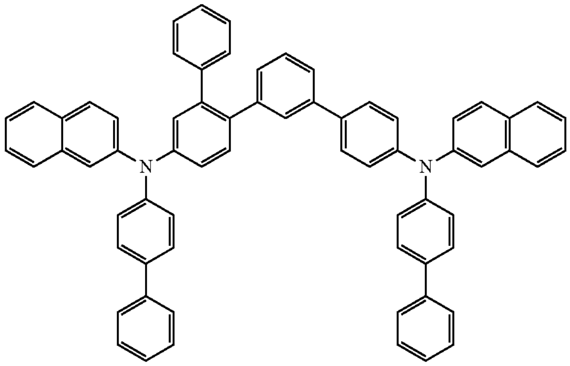
B-50
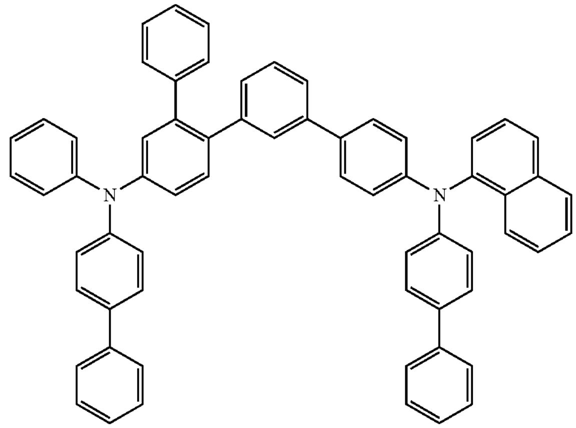

-continued
B-51
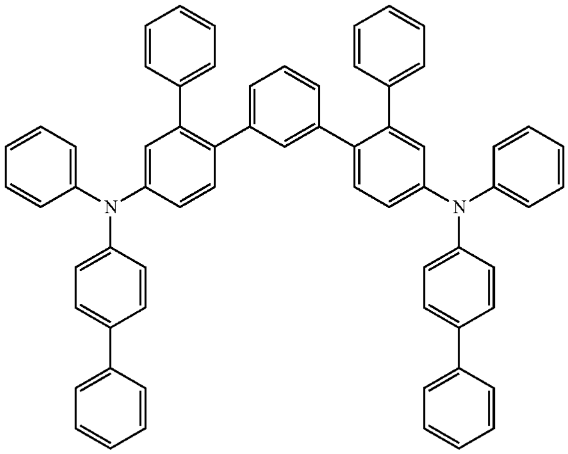
B-52
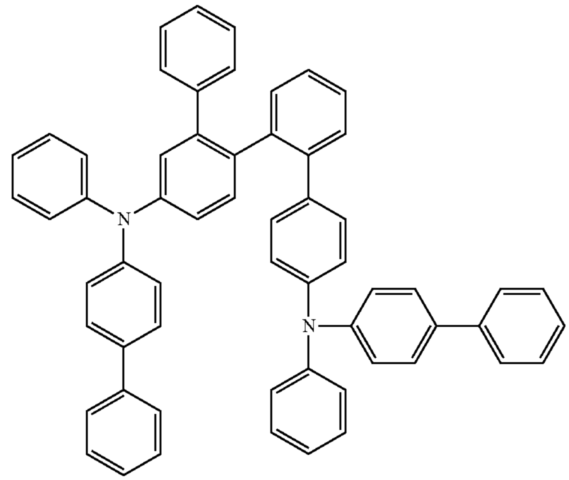
B-53
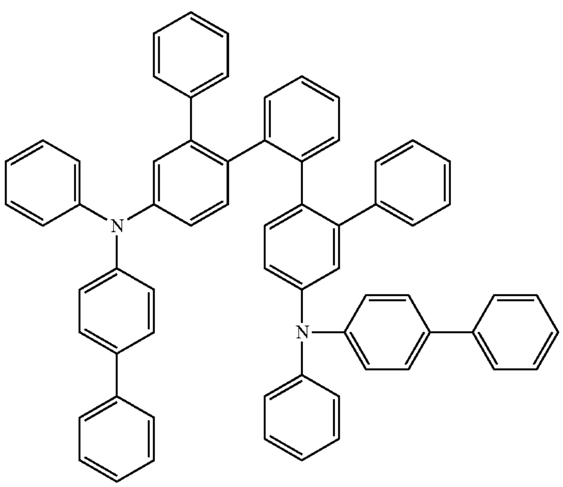
B-54
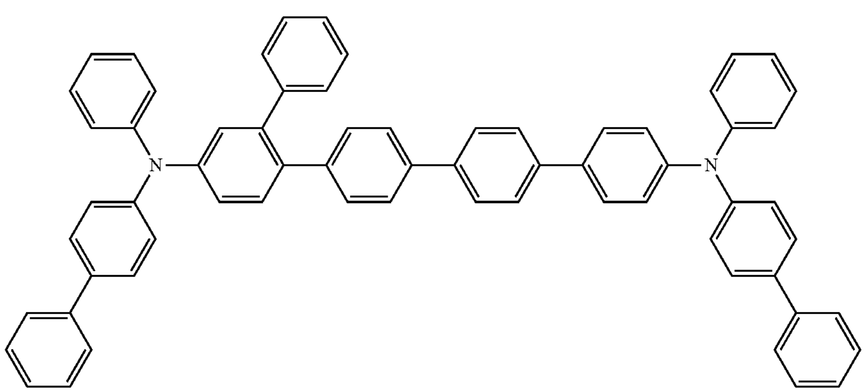

-continued
B-55
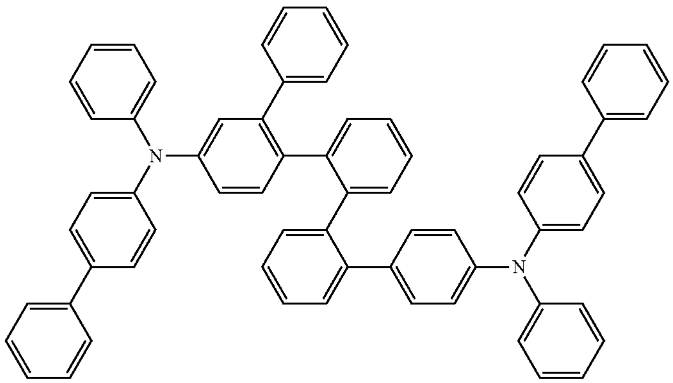
B-56
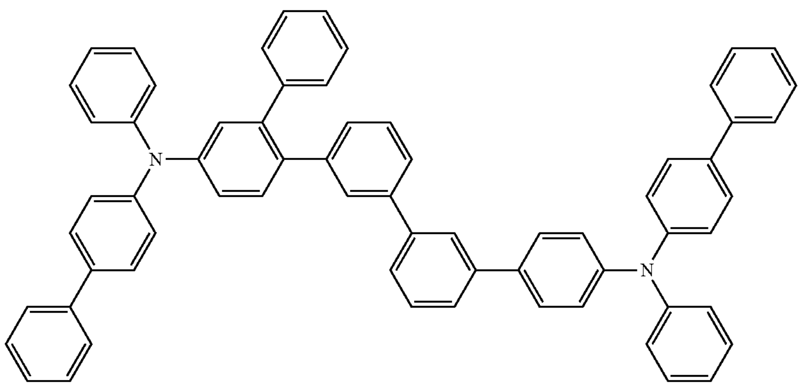
B-57
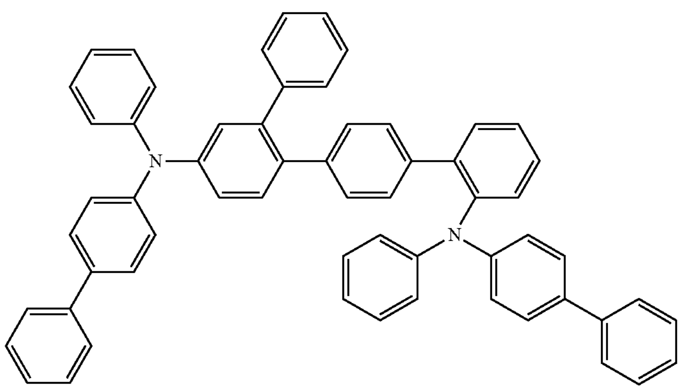
B-58
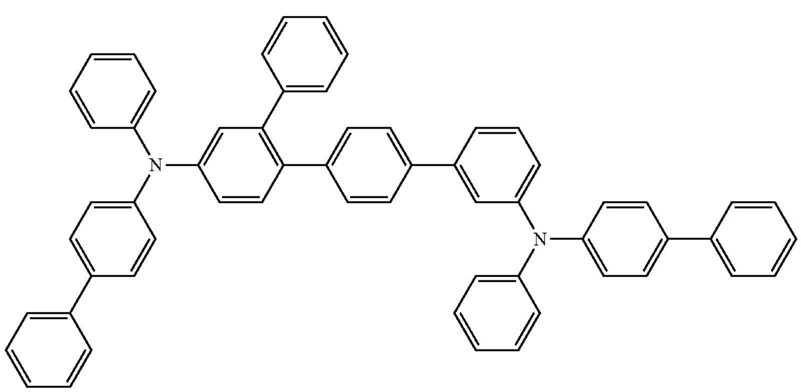

-continued
B-59
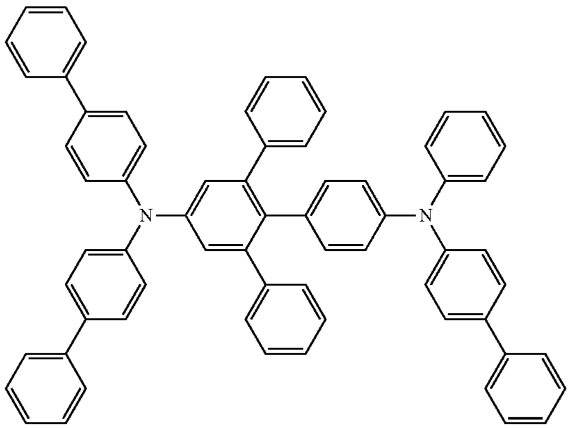
B-60
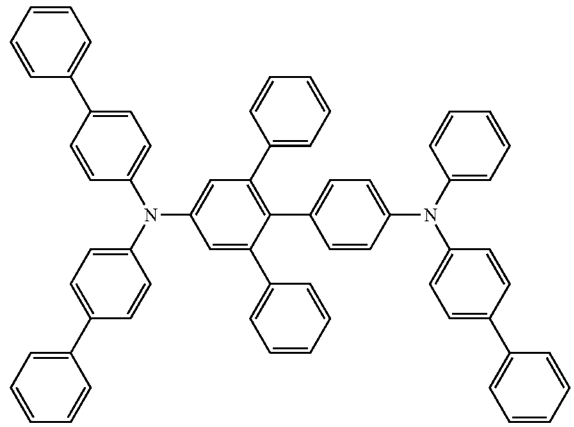
B-61
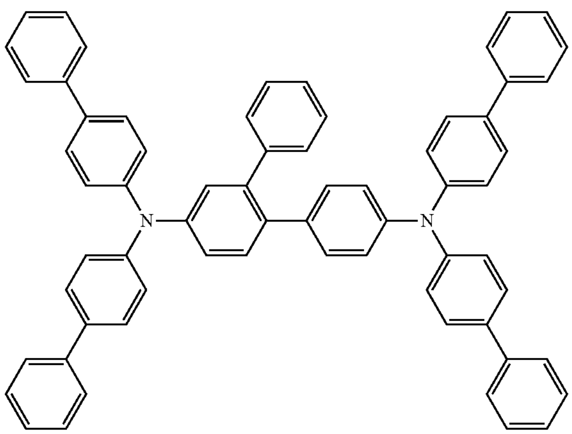
B-62
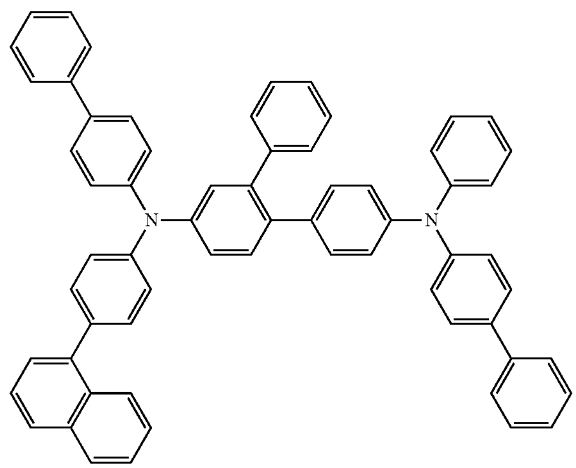
B-63
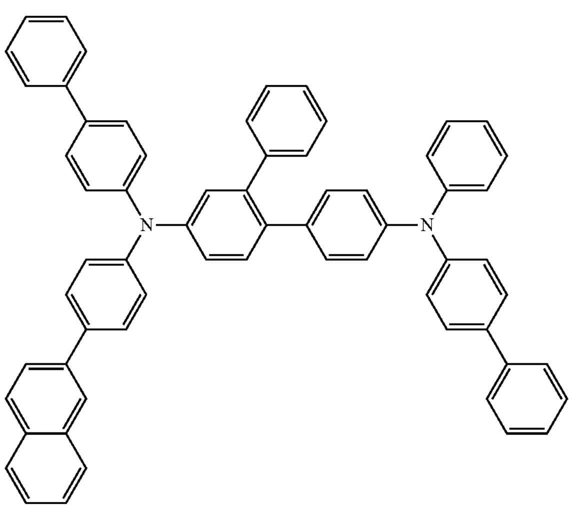
B-64
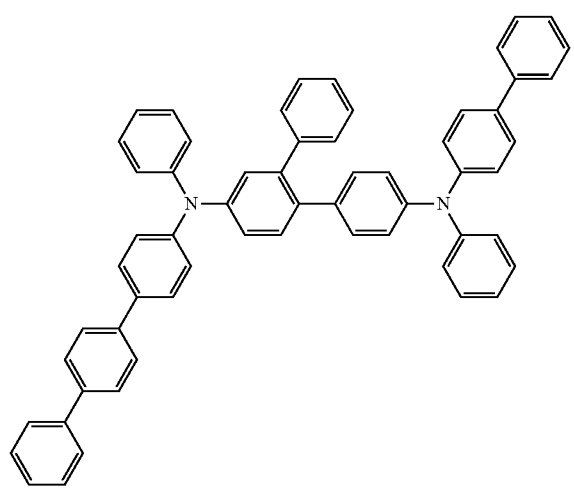

-continued
B-65
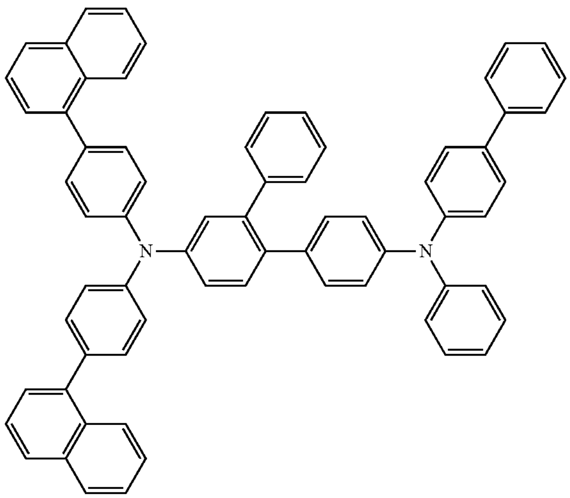
B-66
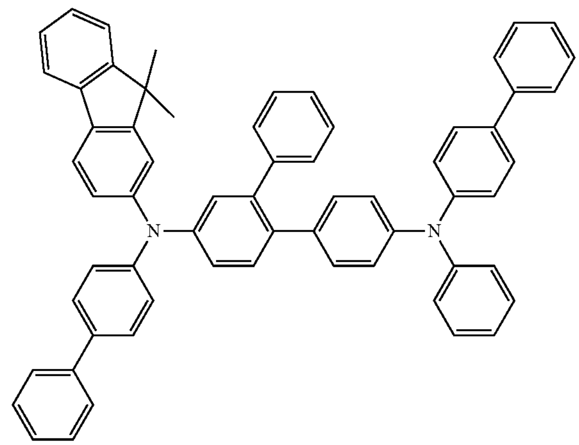
B-67
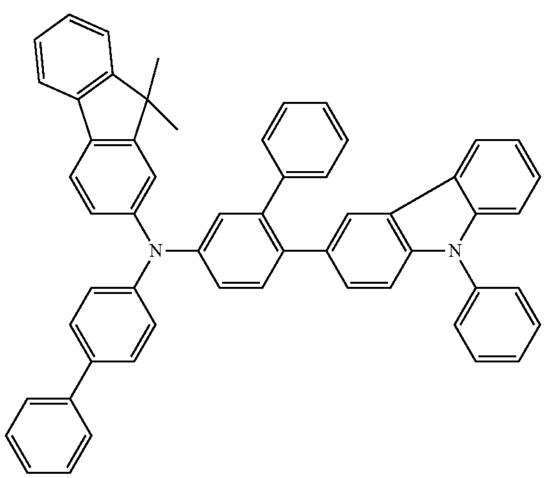
B-68
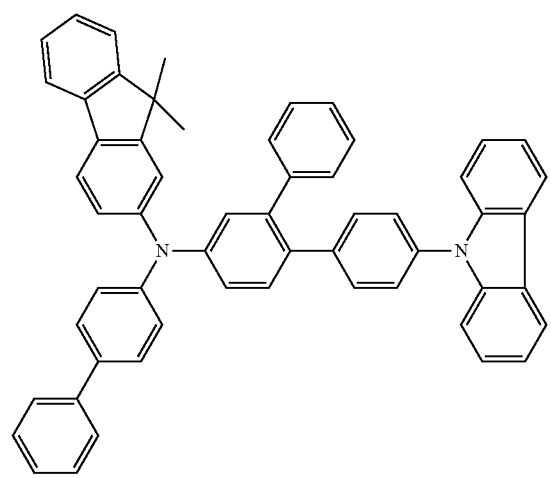
B-69
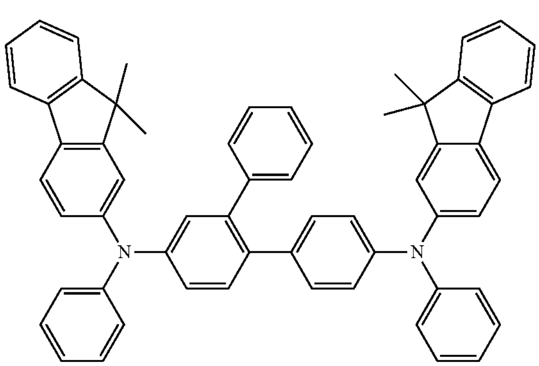
B-70
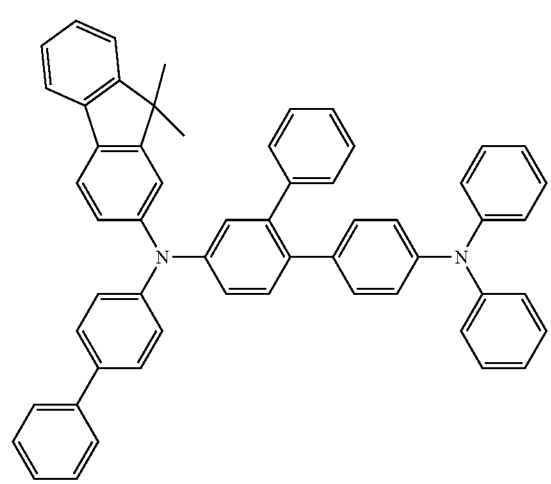

-continued
B-71
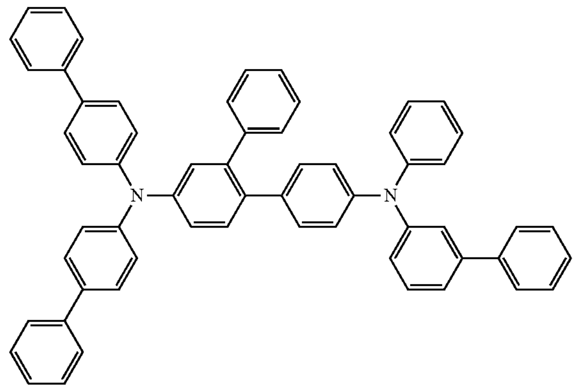
B-72
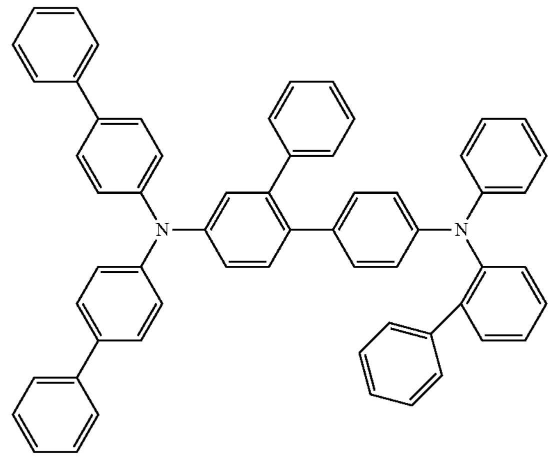
B-73
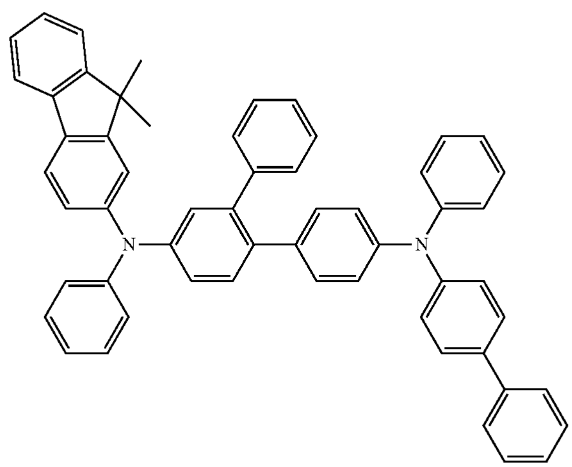
B-74
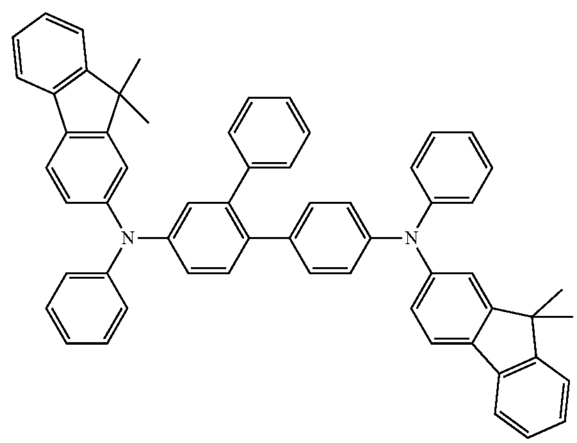
B-75
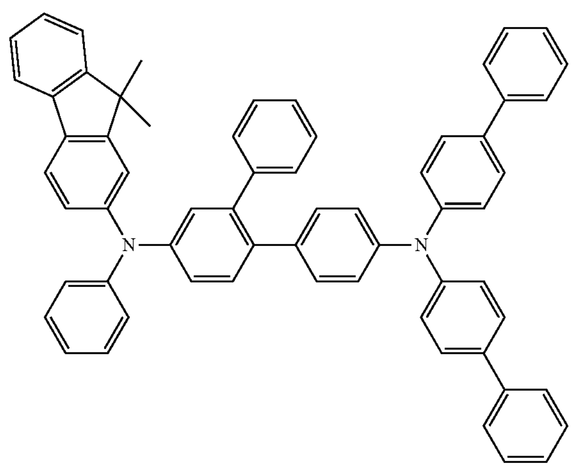
B-76
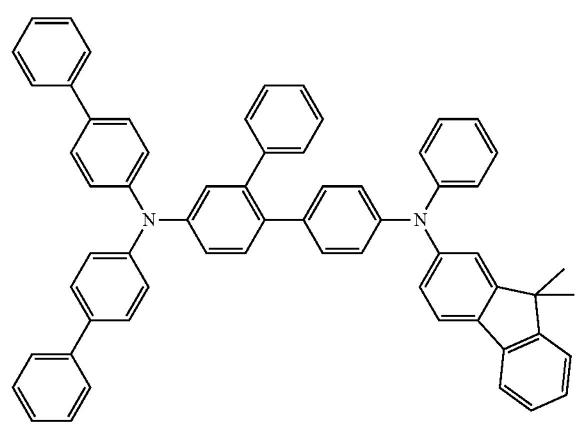

-continued
B-77
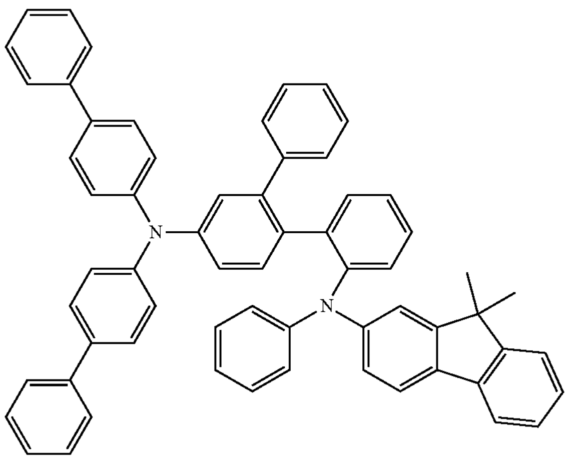
B-78
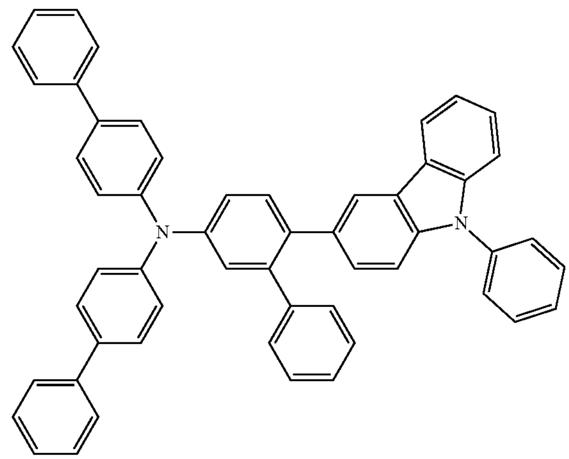
B-79
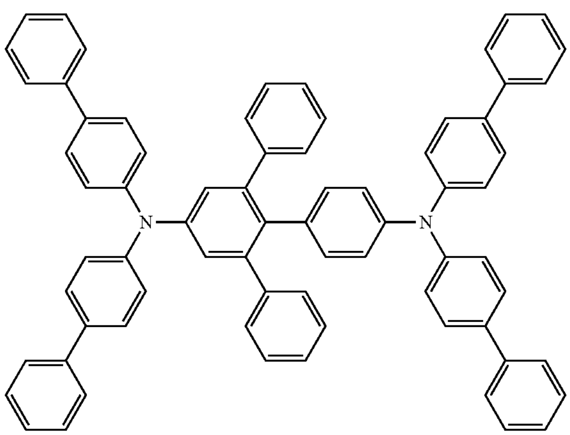
B-101
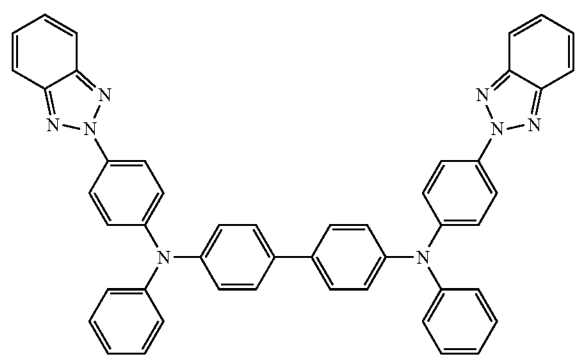
B-102
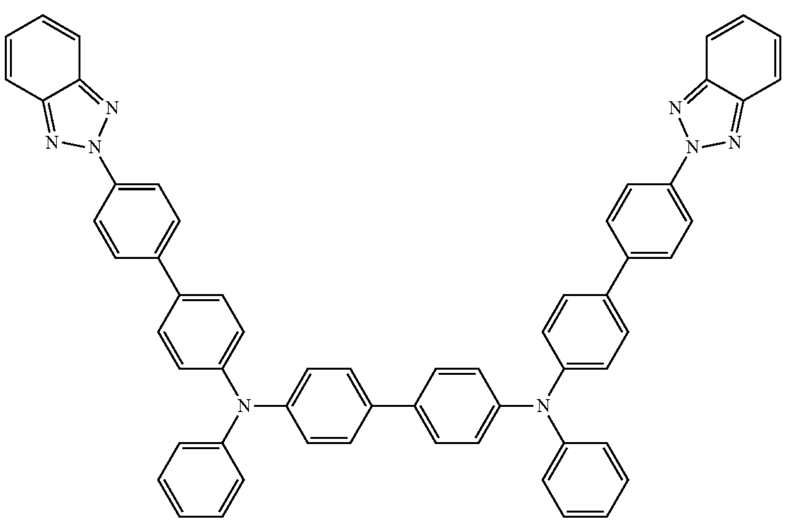

-continued
B-103
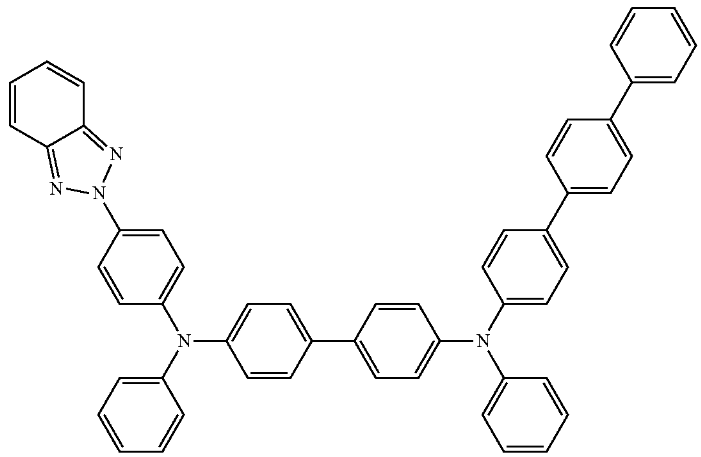
B-104
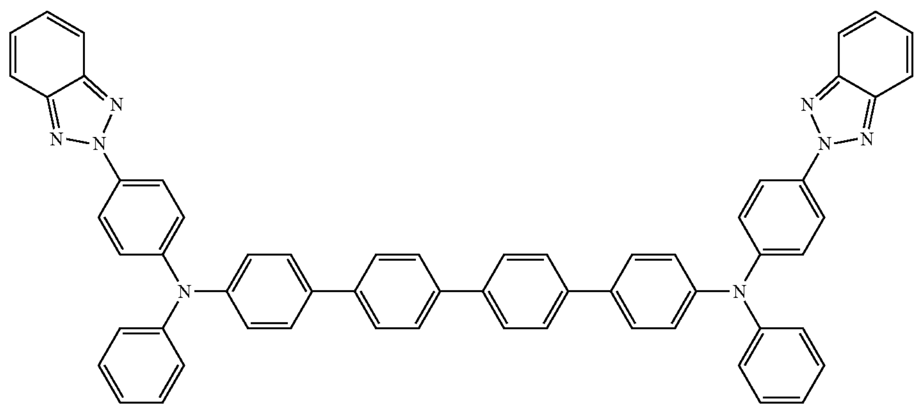
B-105
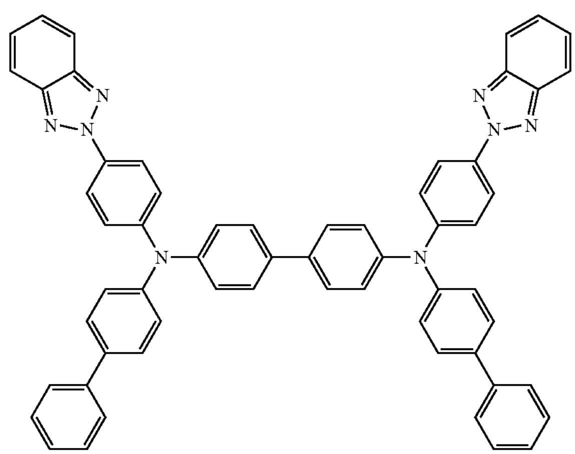

-continued
B-106
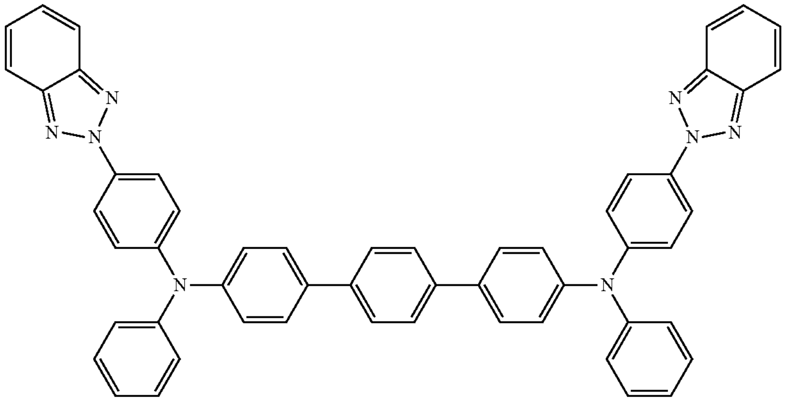
B-107
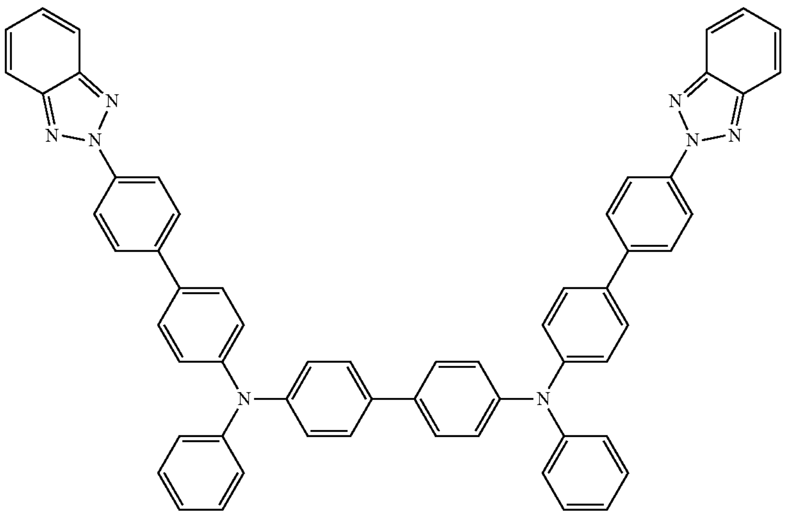
B-108
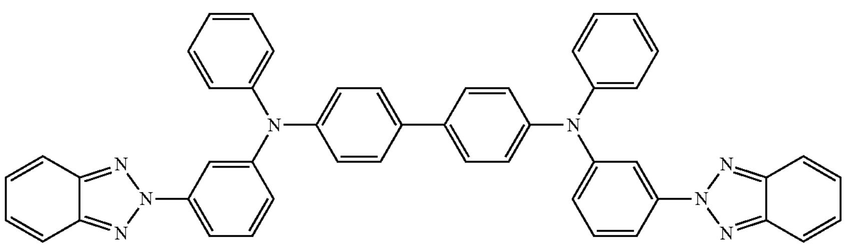
B-109
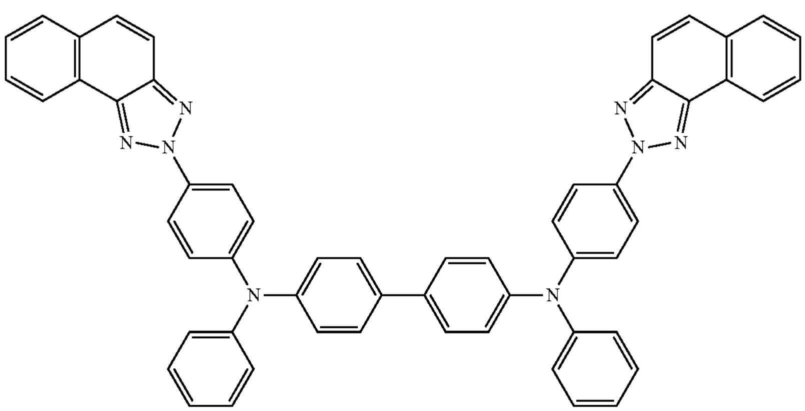

-continued
B-110
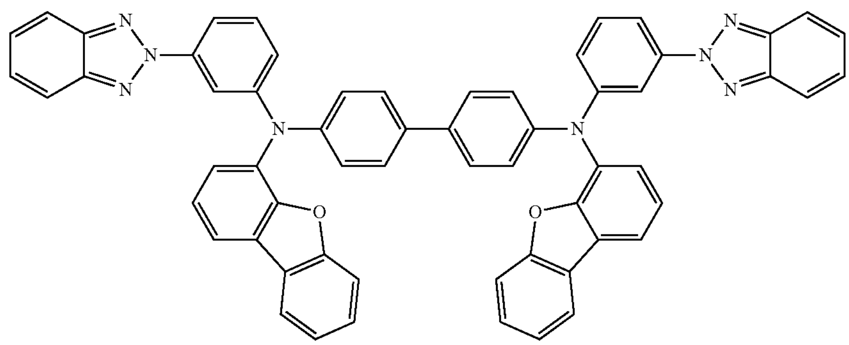
B-111
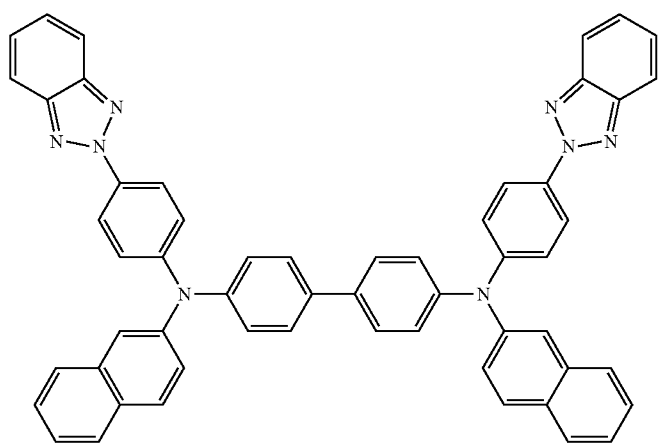
B-112
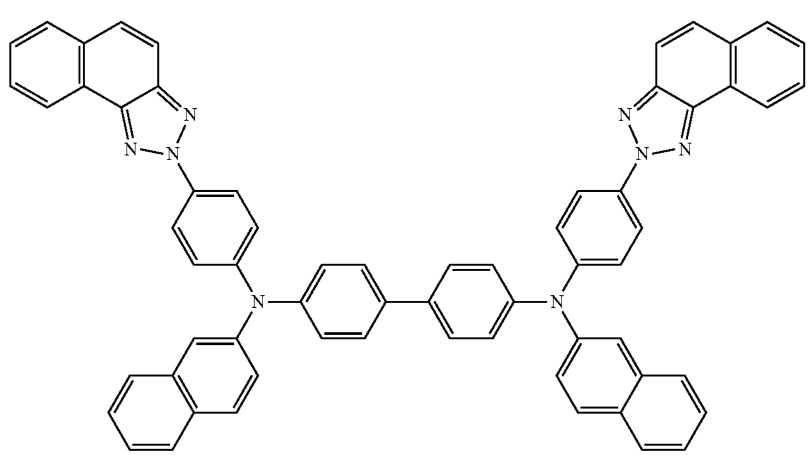

-continued
B-113
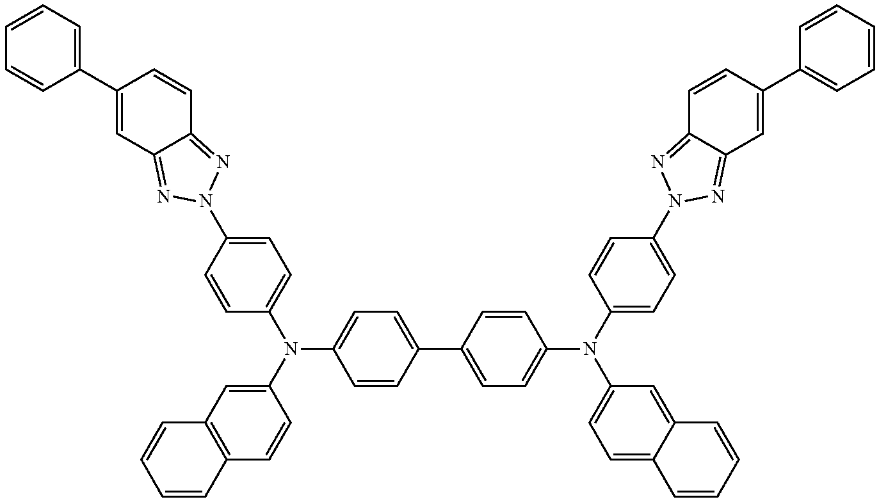
B-114
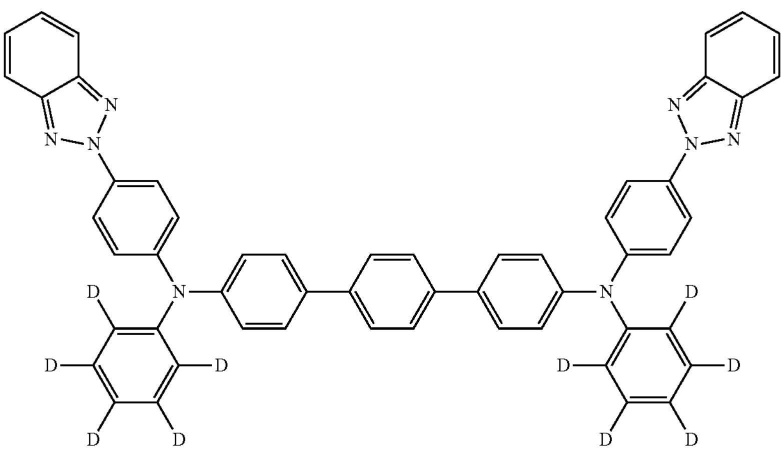
B-115
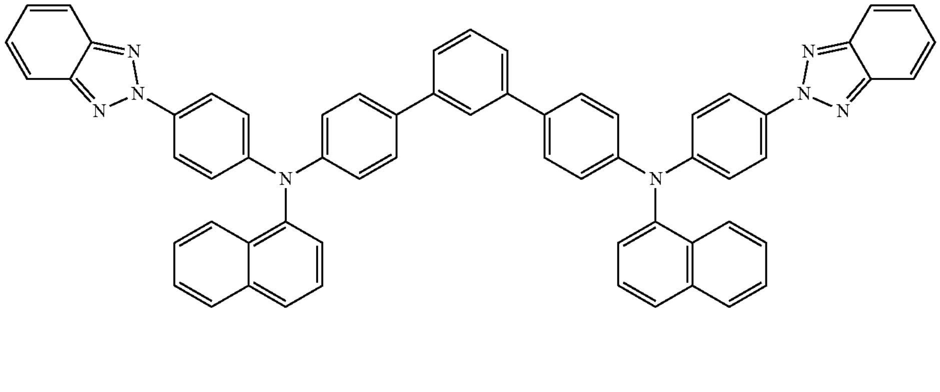

B-116
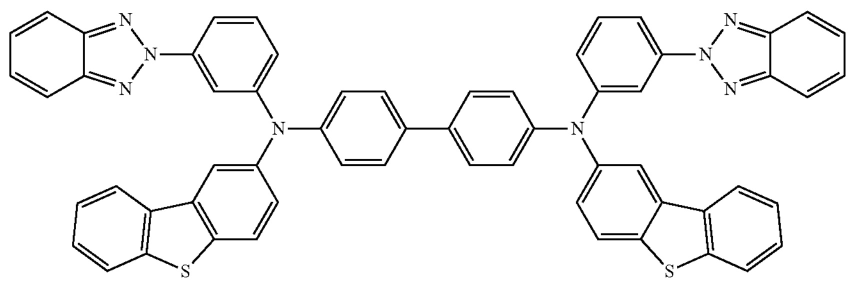
B-117
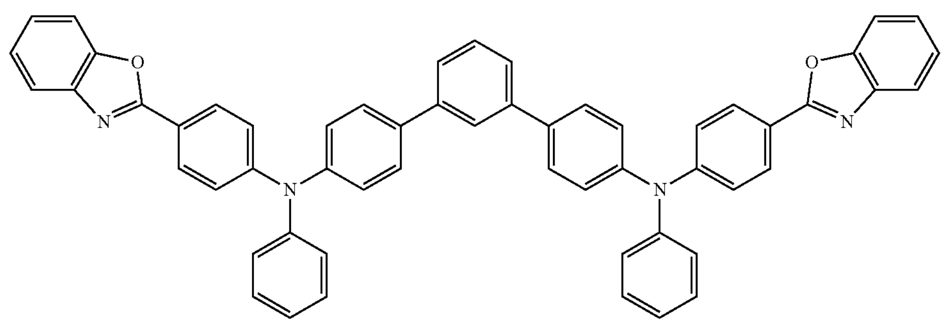
B-118
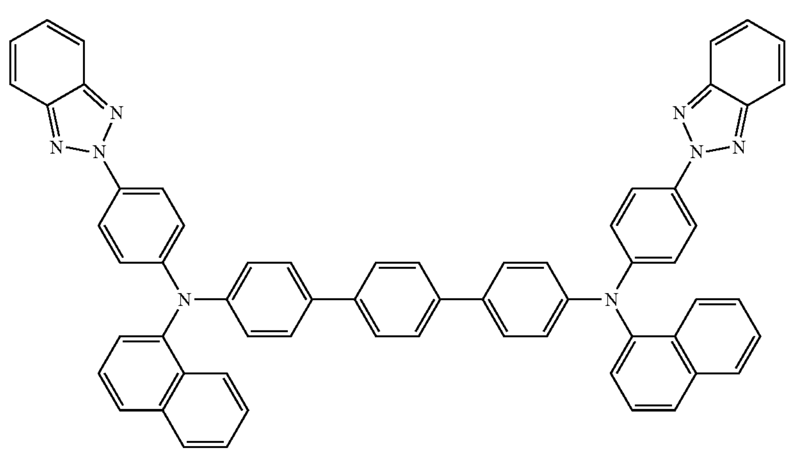
B-119
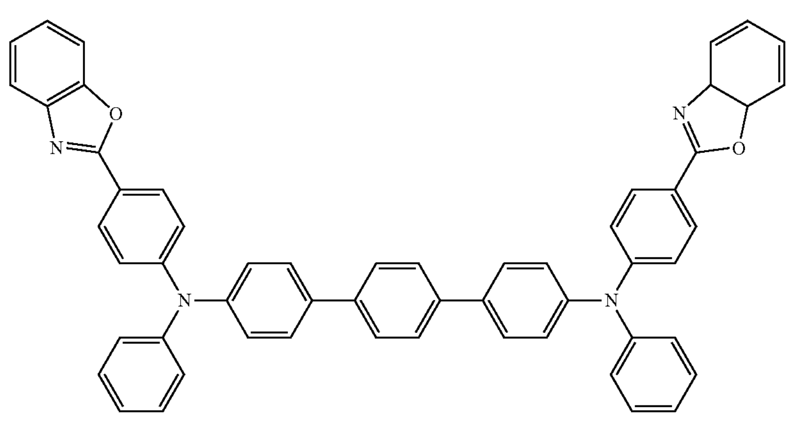

-continued
B-120
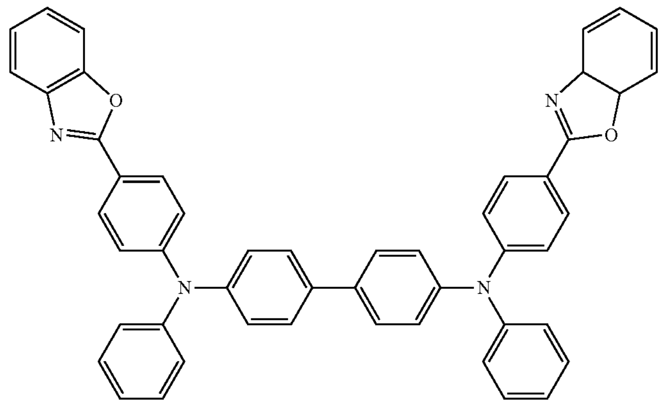
B-121
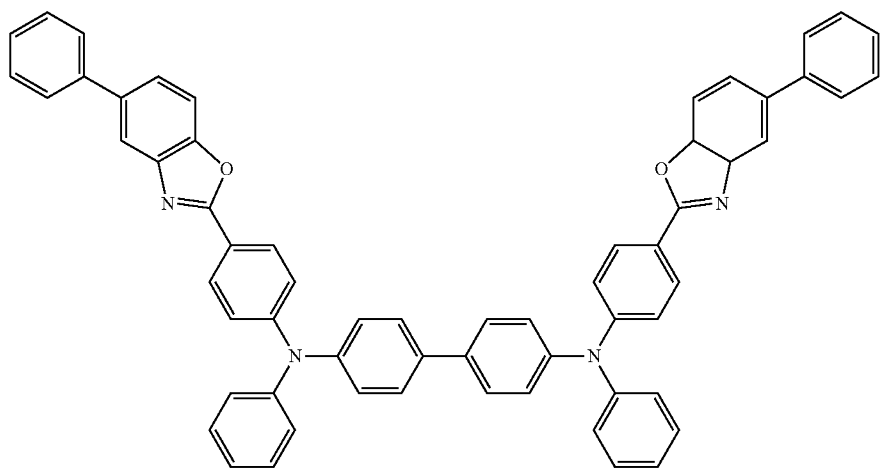
B-122
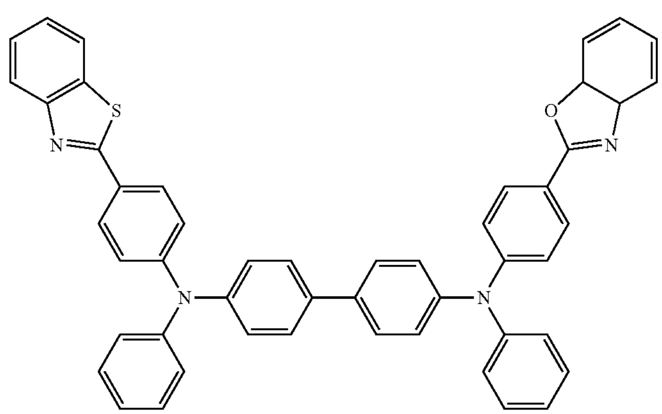

-continued
B-123
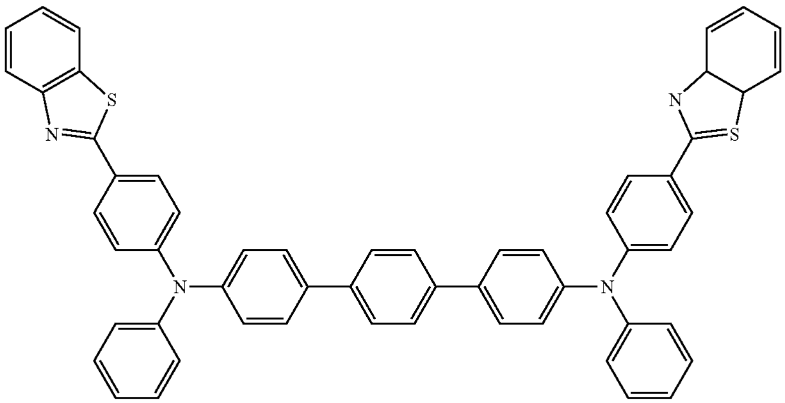
B-124
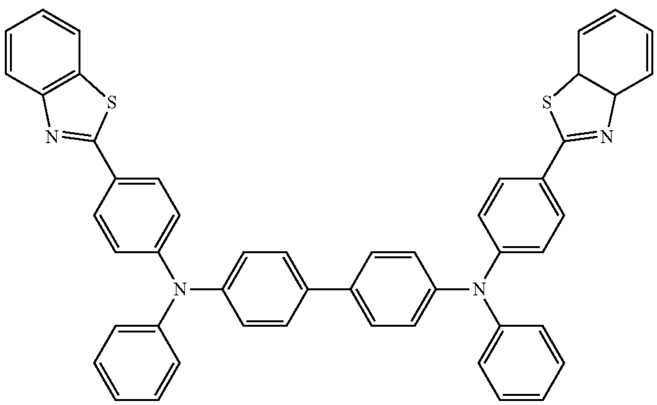
B-125
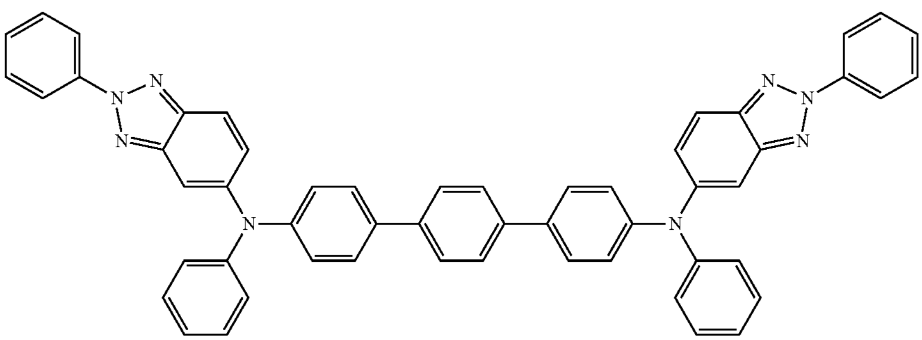
B-126
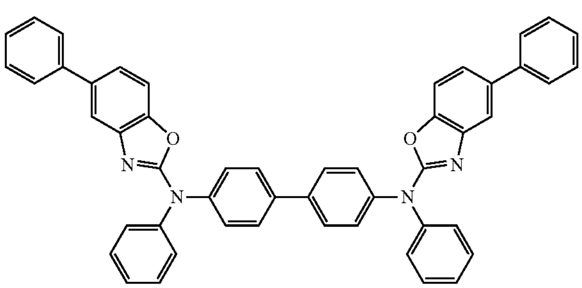
B-127
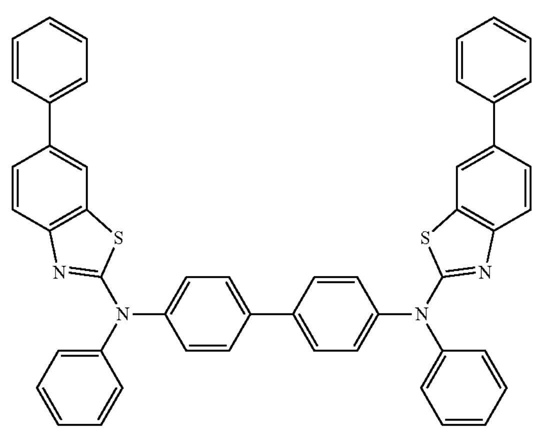

-continued
B-128
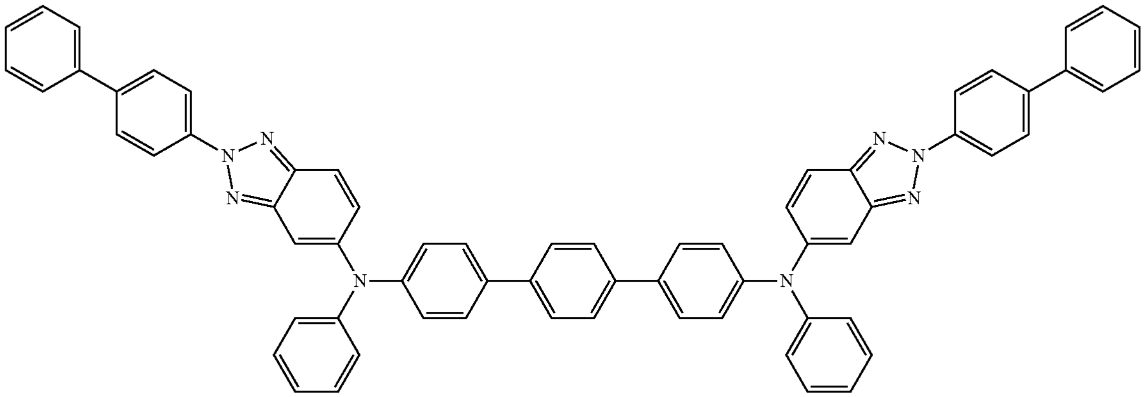
B-129
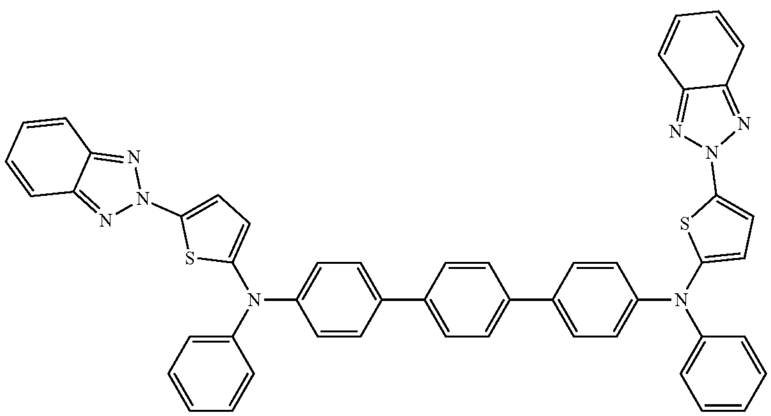
B-130
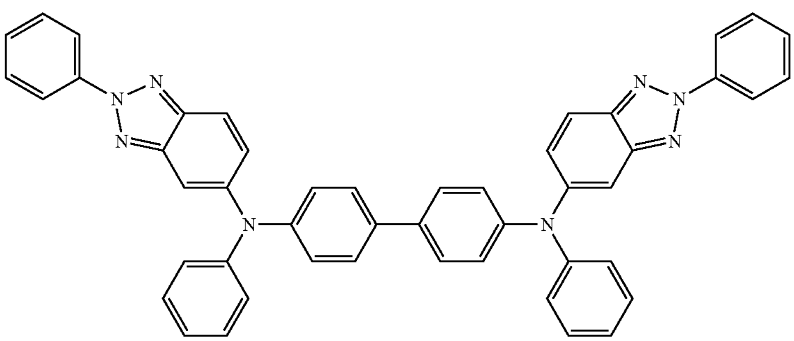
B-131
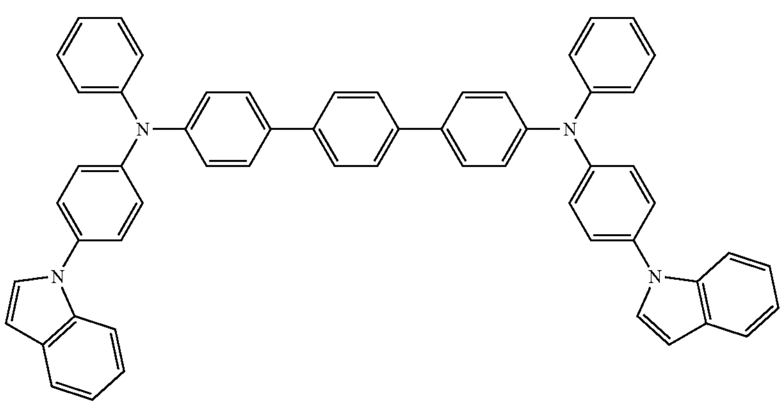

-continued
B-132
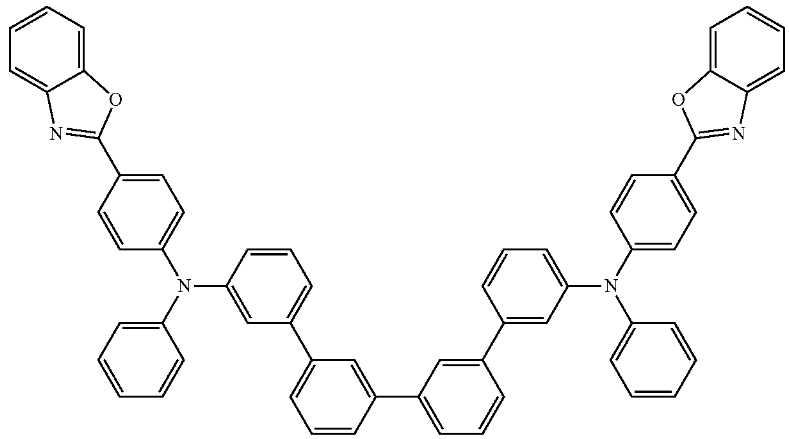
B-133
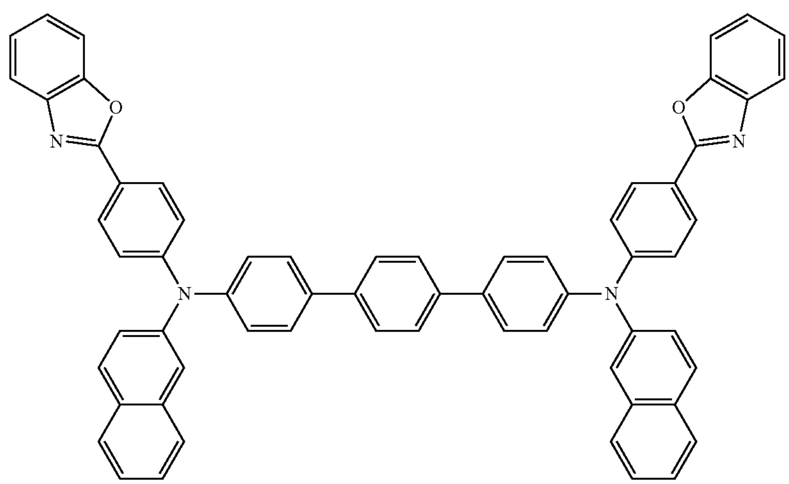
B-134
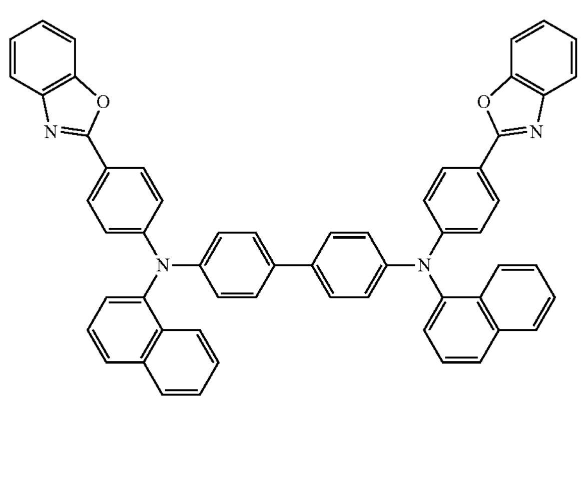
B-135
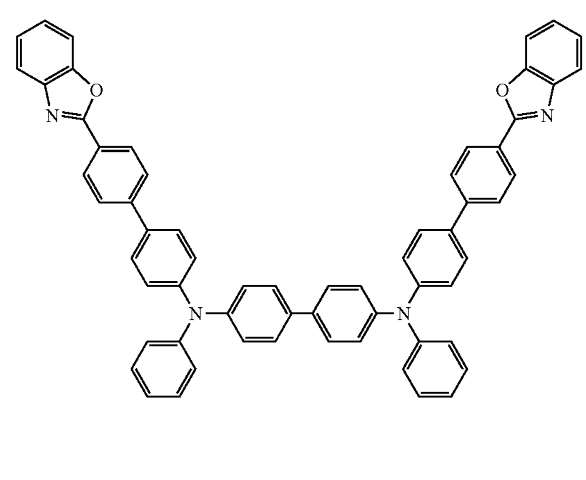

-continued
B-136
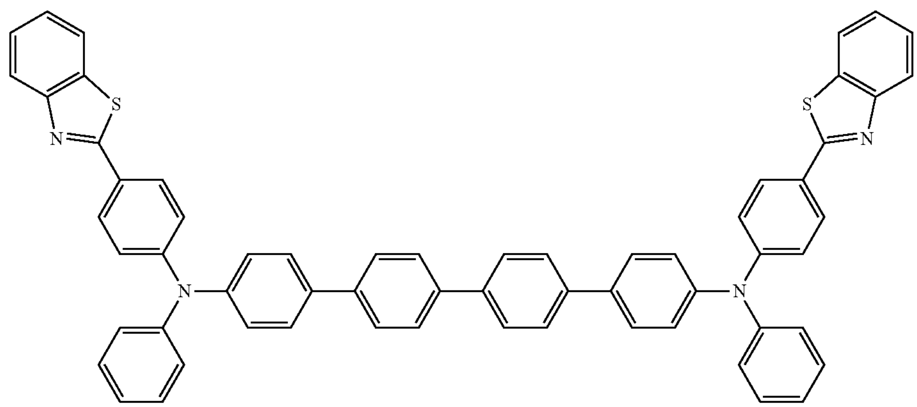
B-137
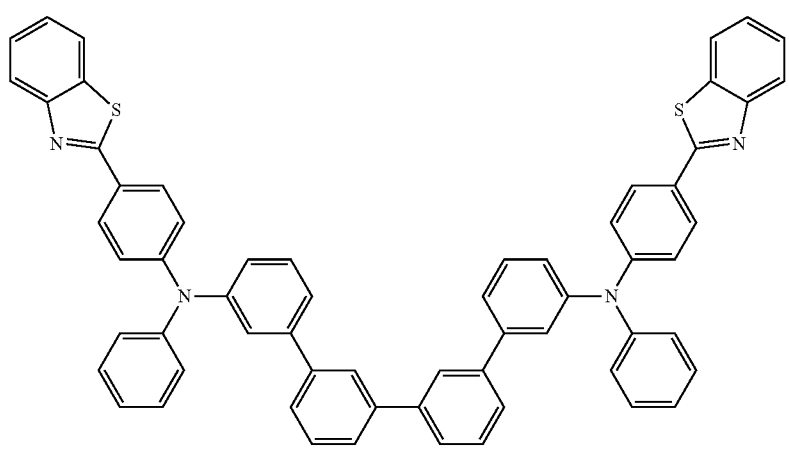
B-138
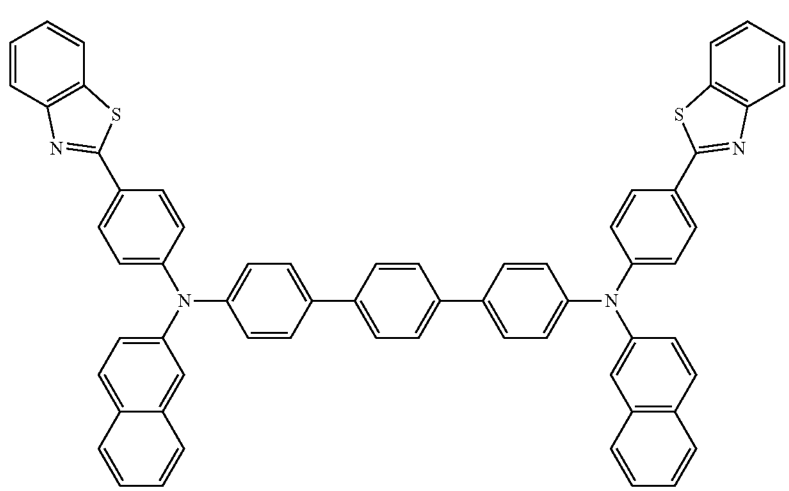

-continued
B-139
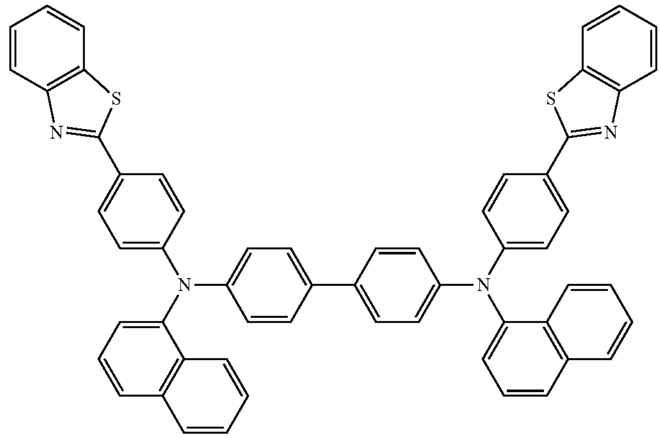
B-140
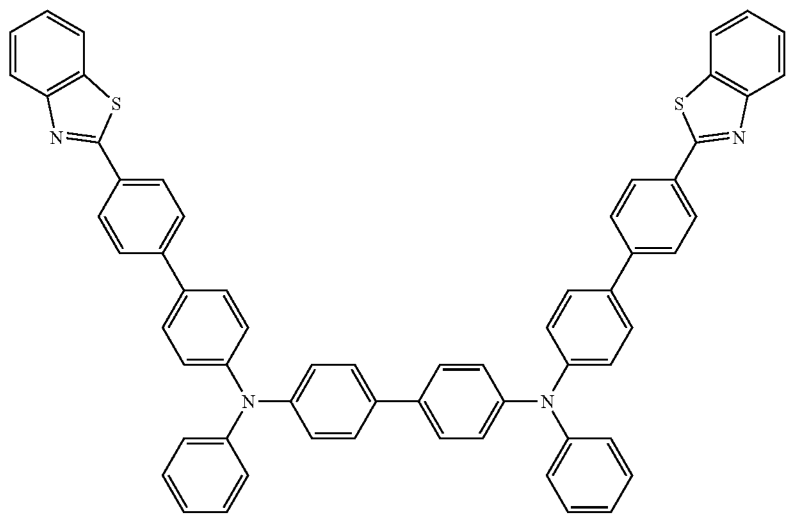
B-141
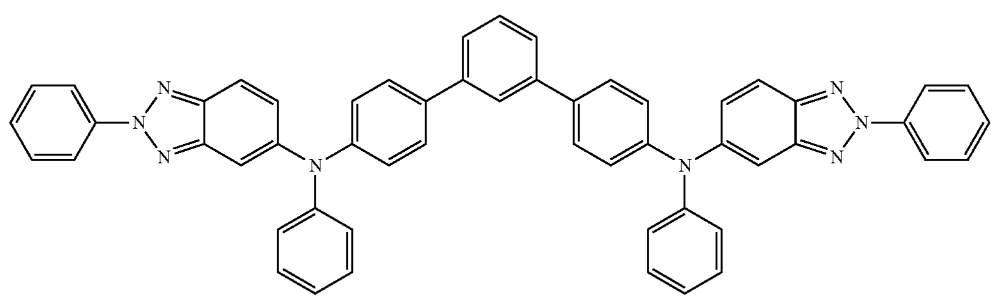
B-142
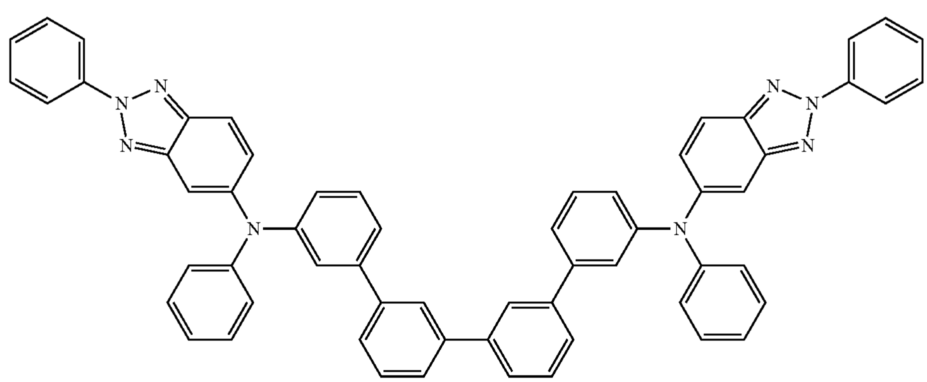

-continued
B-143
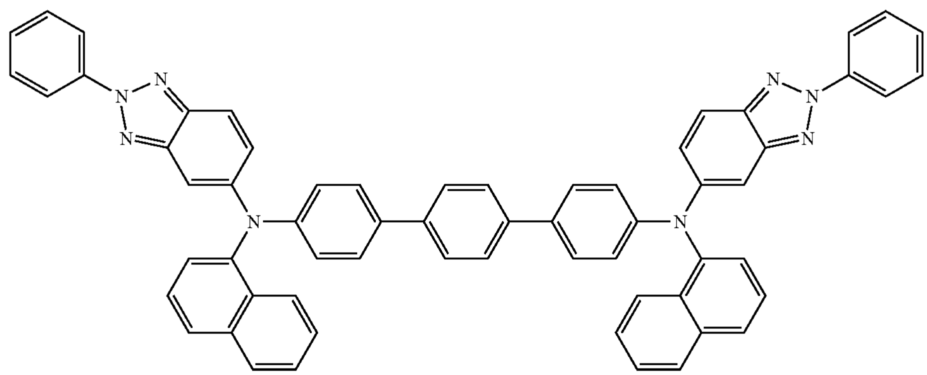
B-144
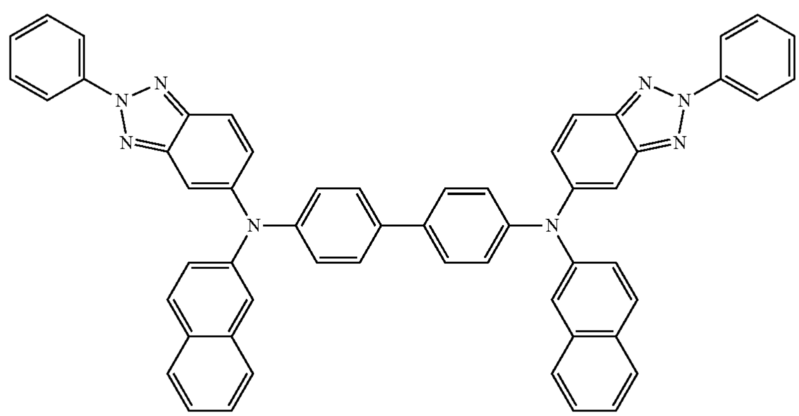
B-145
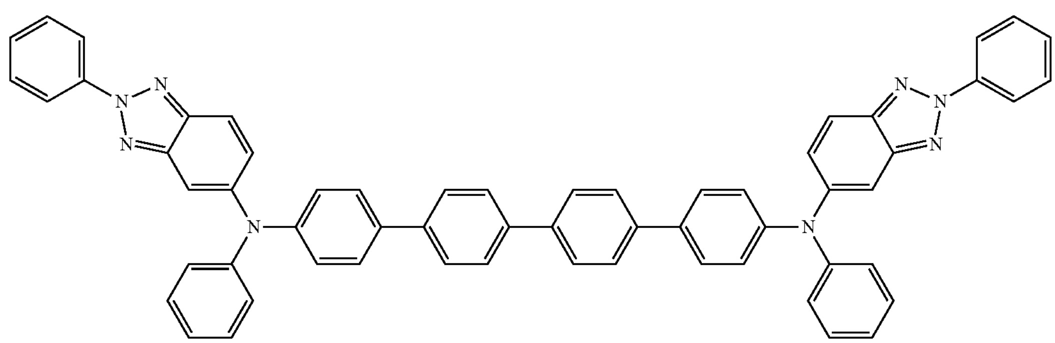

-continued
B-146
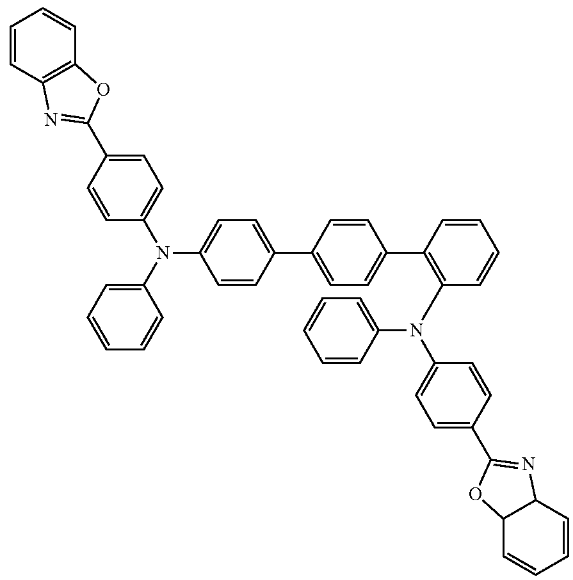
B-147
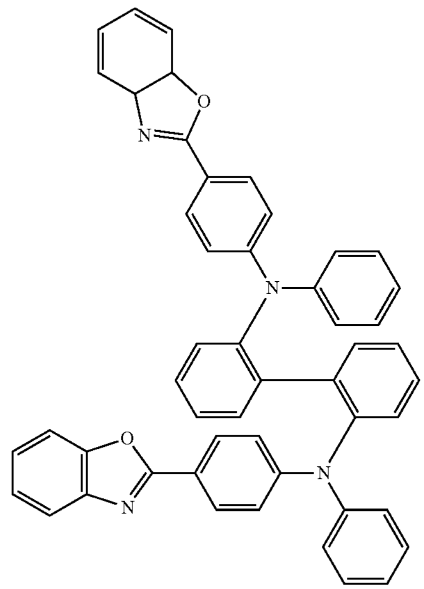
B-148
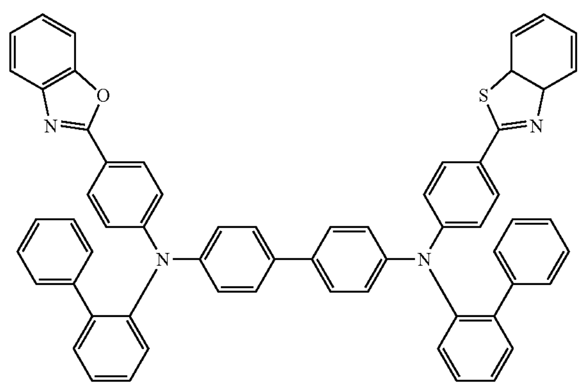
C-1
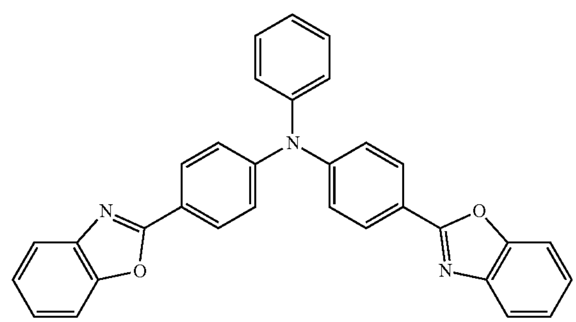
C-2
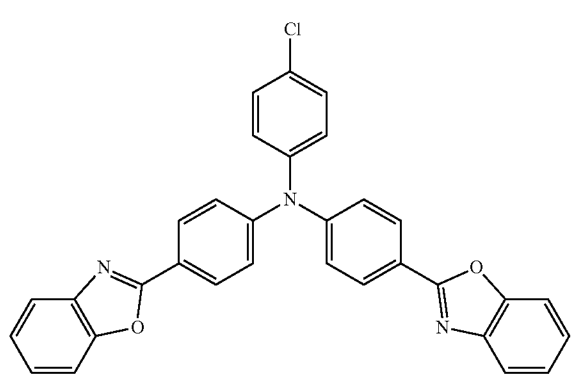
C-3
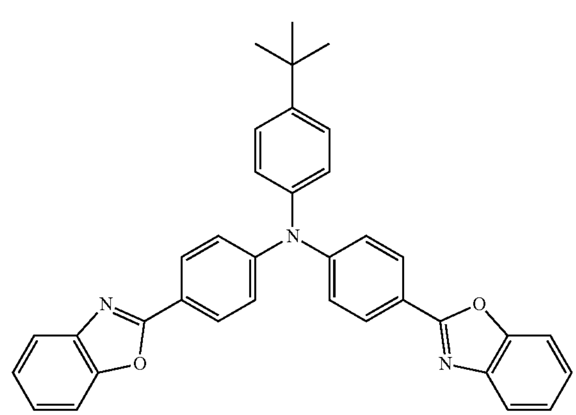

-continued
C-4
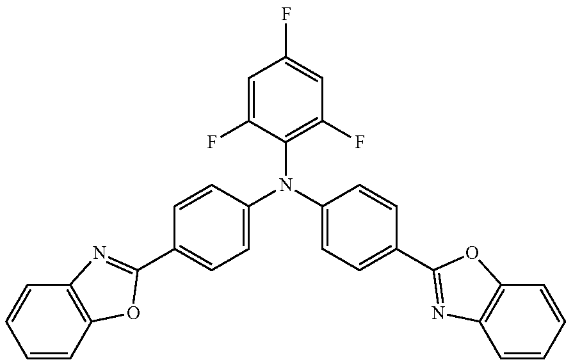
C-5
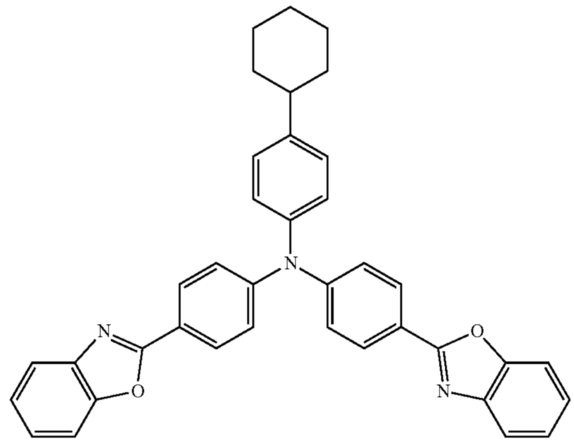
C-6
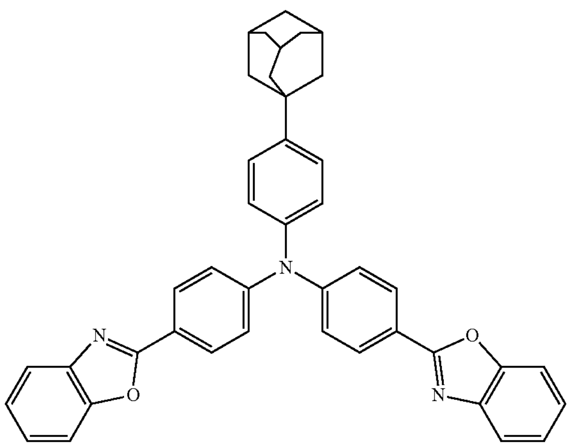
C-7
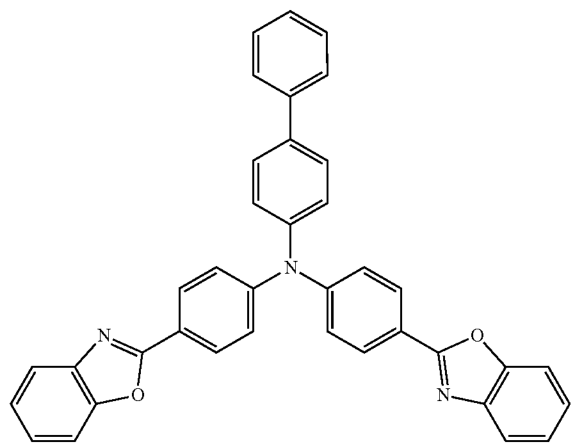
C-8
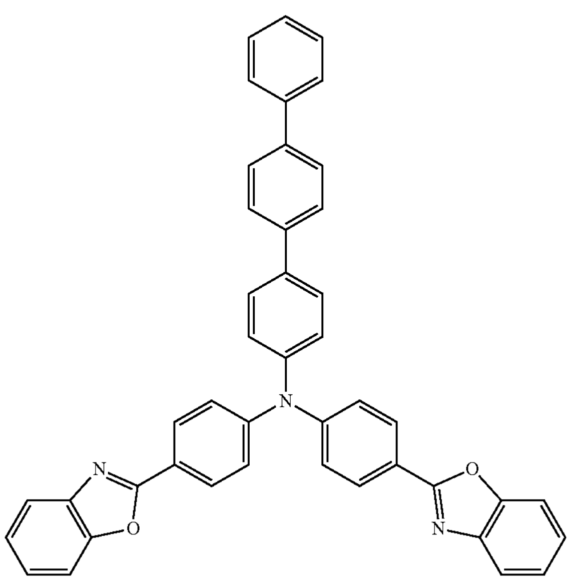
C-9
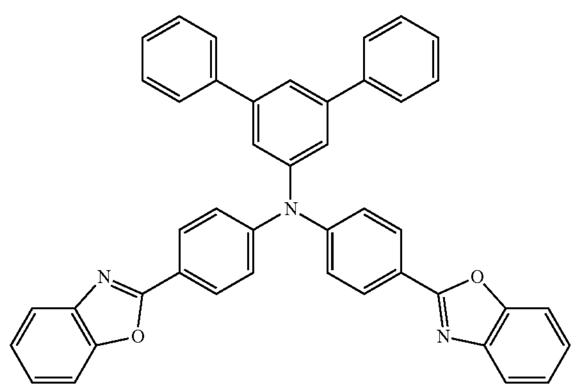

-continued
C-10
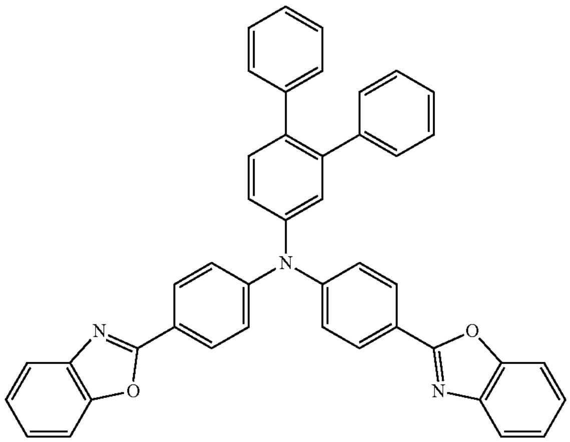
C-11
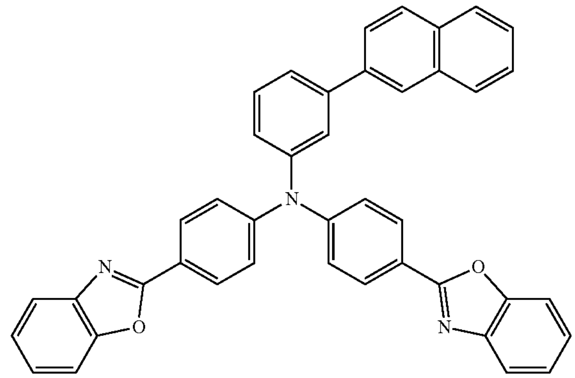
C-12
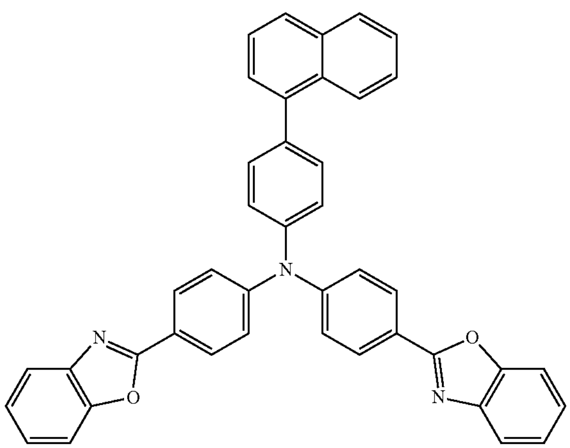
C-13
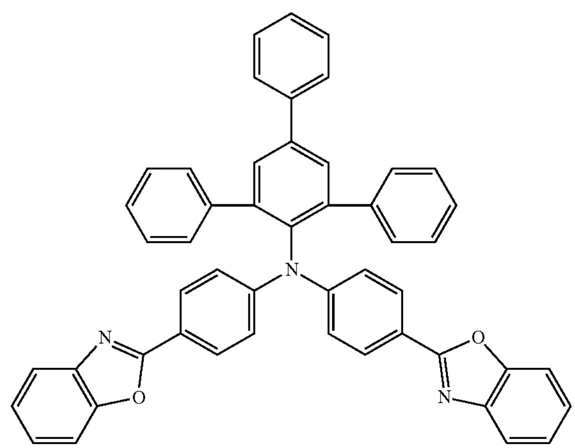
C-14
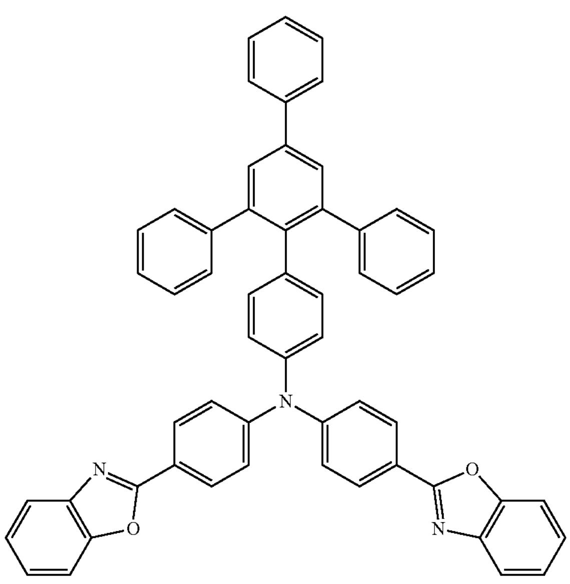
C-15
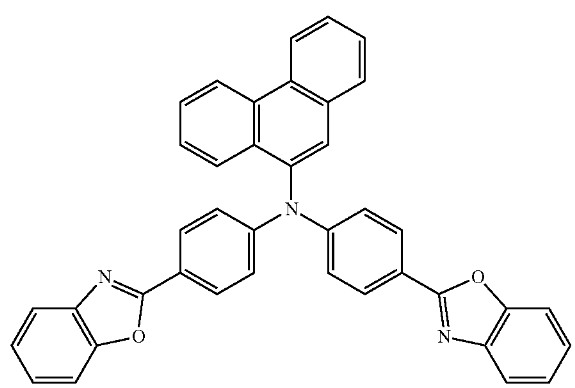

-continued
C-16
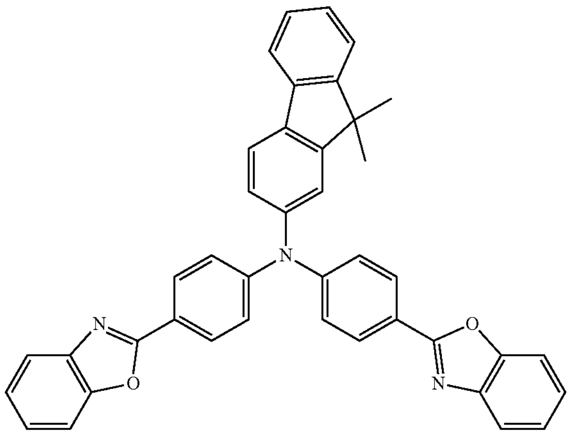
C-17
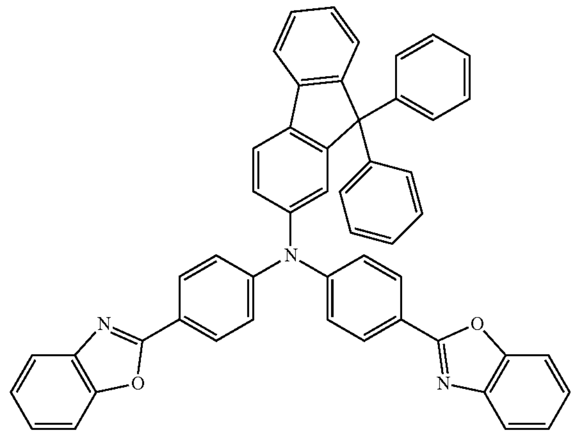
C-18
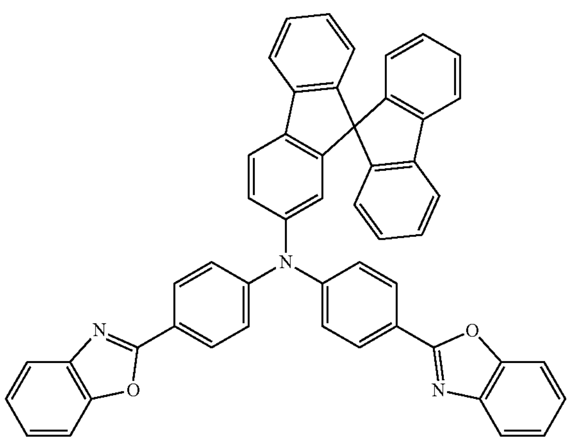
C-19
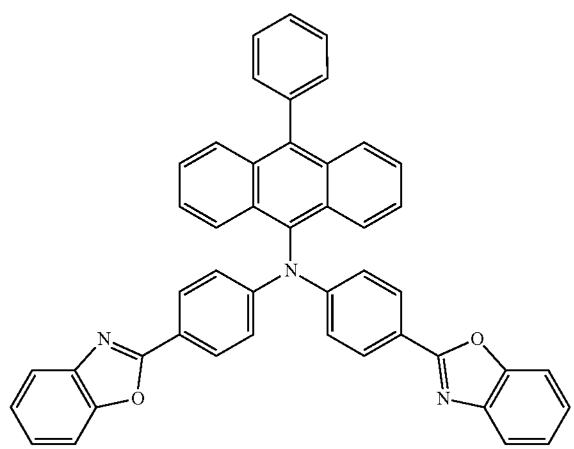
C-20
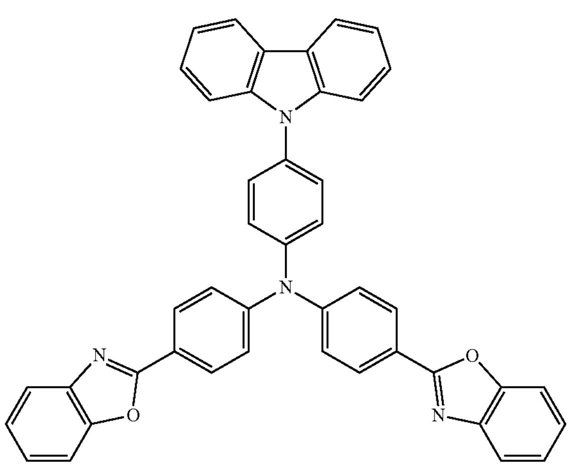
C-21
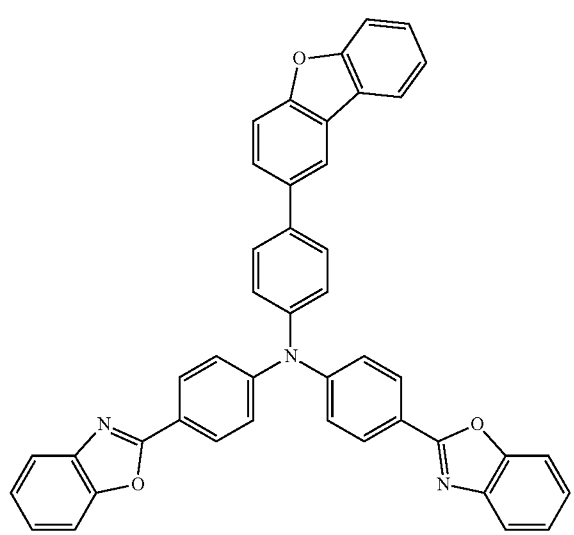

-continued
C-22
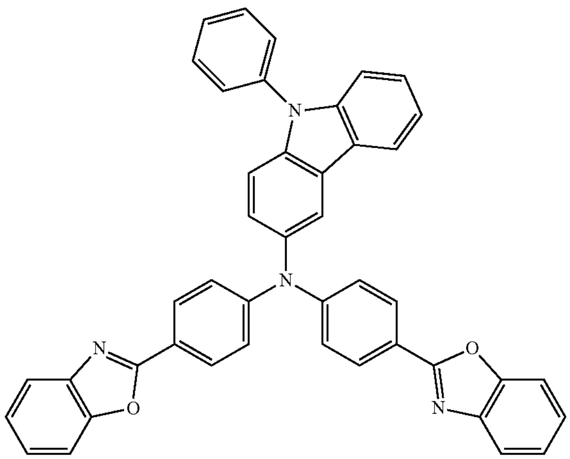
C-23
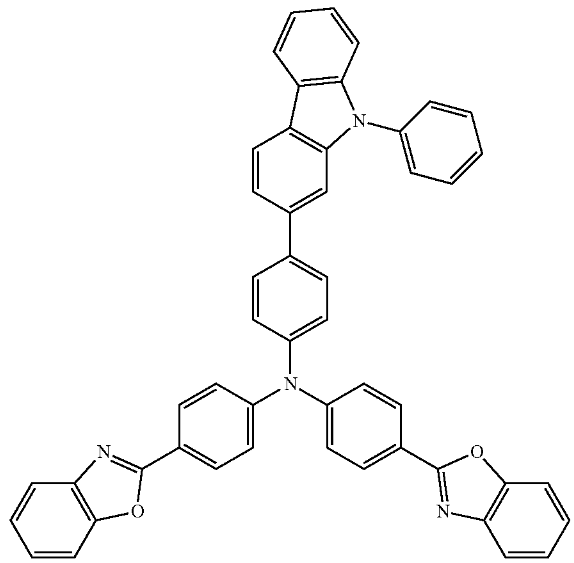
C-24
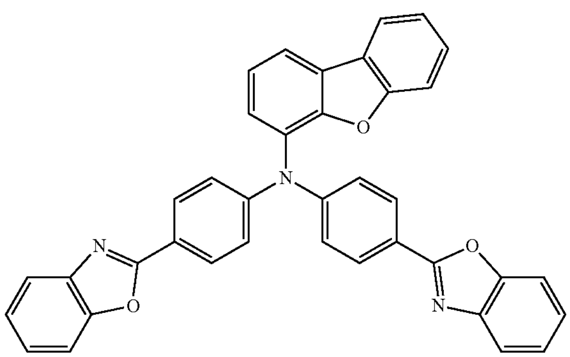
C-25
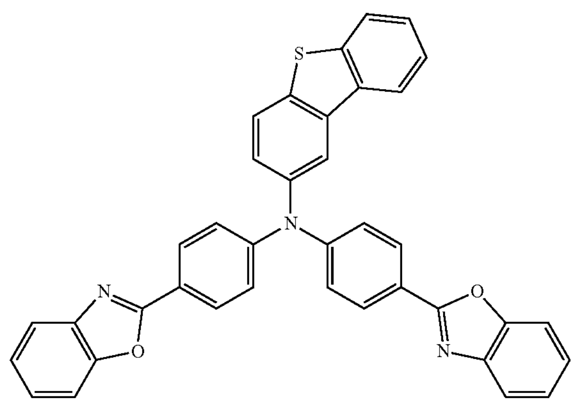
C-26
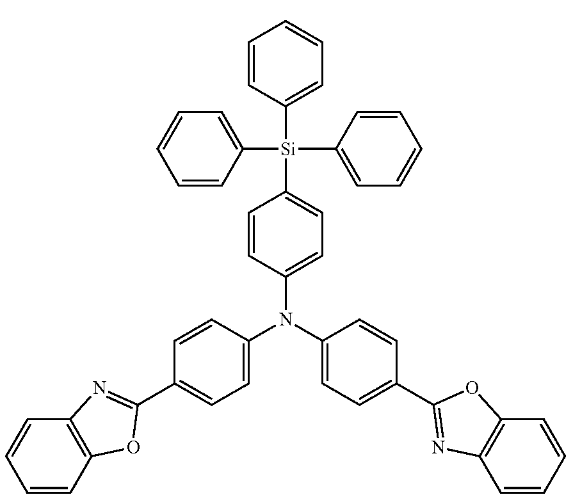
C-27
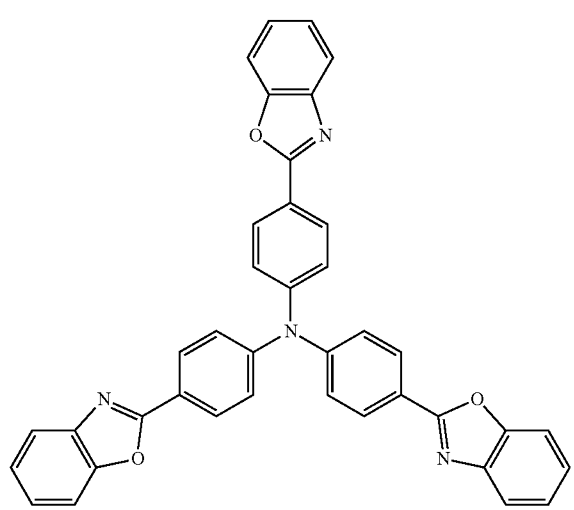

-continued
C-28
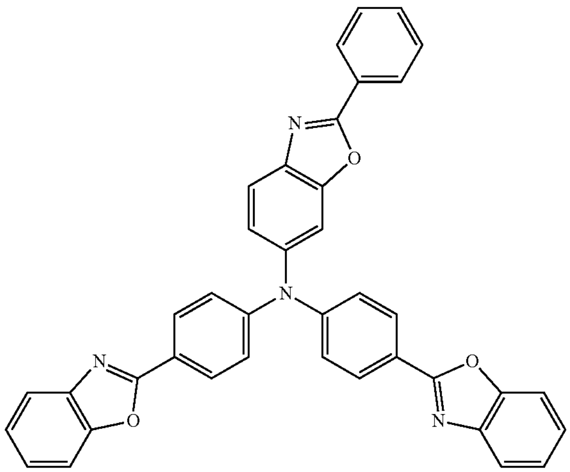
C-29
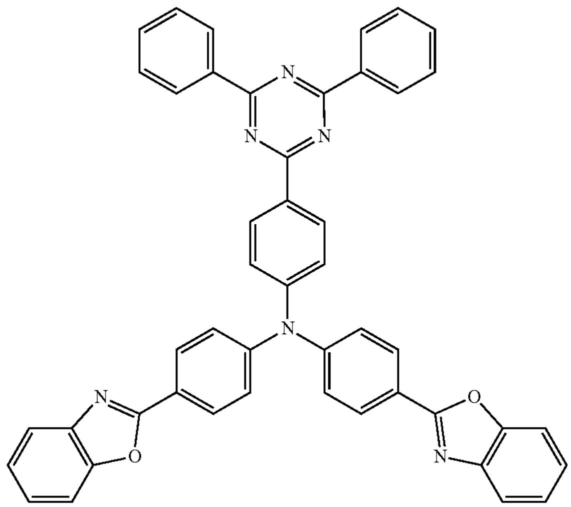
C-30
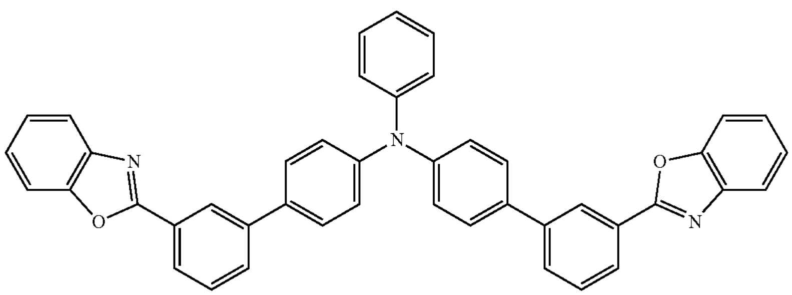
C-31
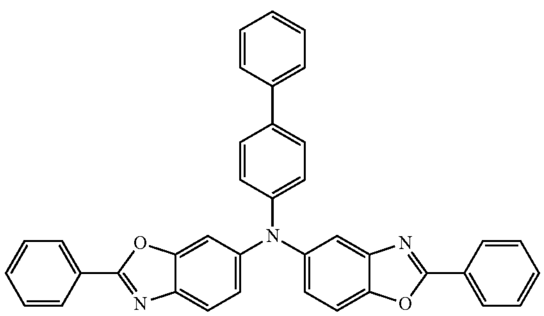
C-32
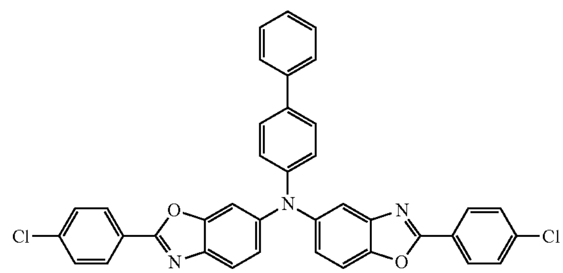
C-33
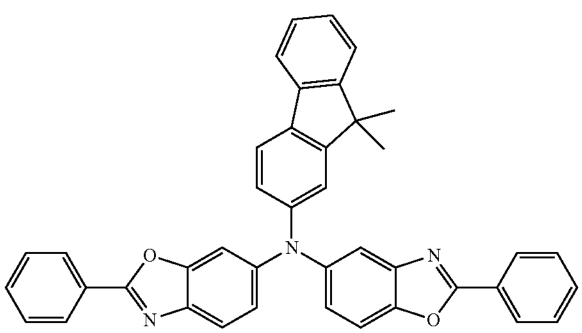
C-34
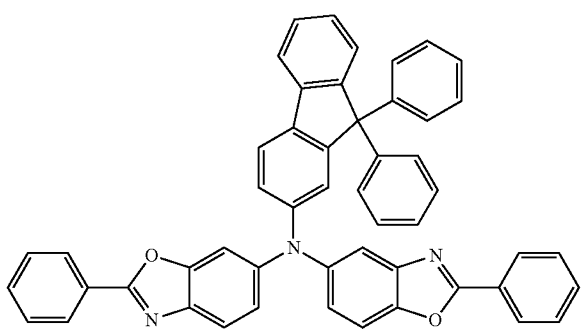

-continued
C-35
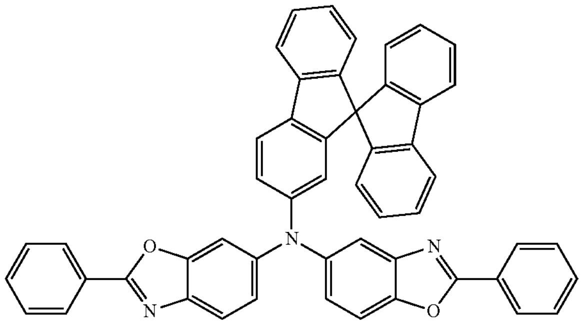
C-36
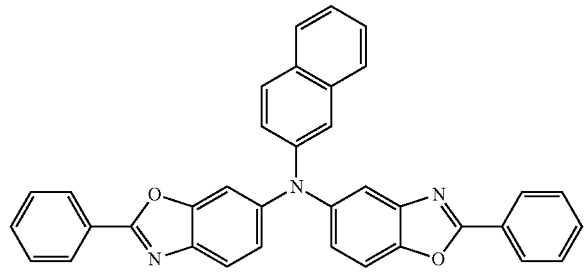
C-37
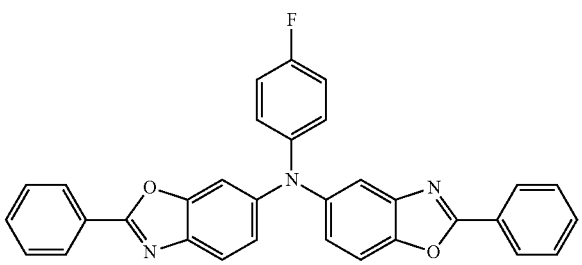
C-38
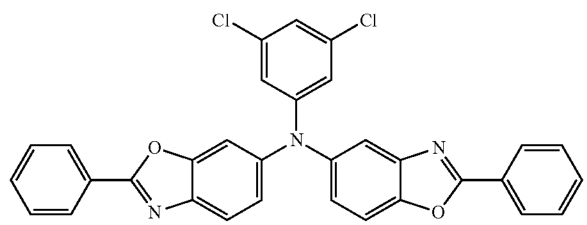
C-39
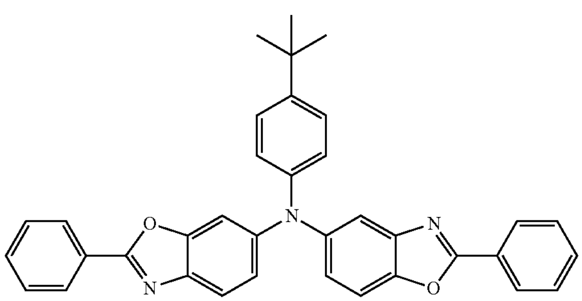
C-40
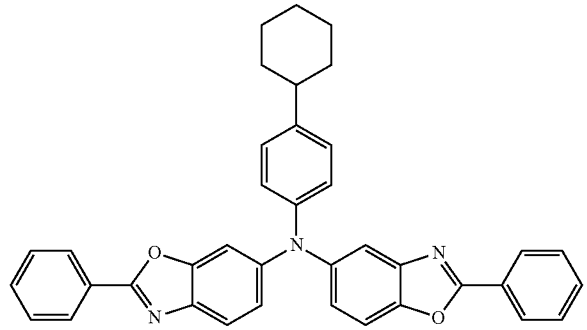
C-41
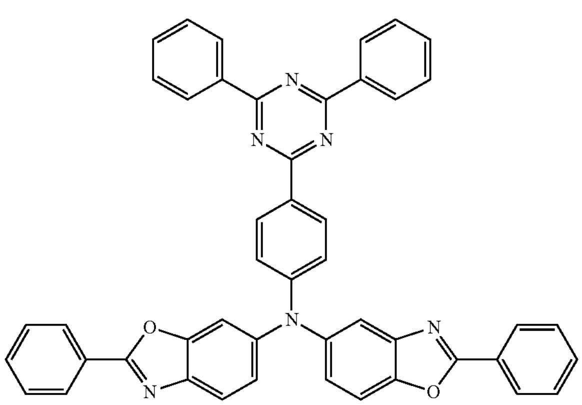
C-42
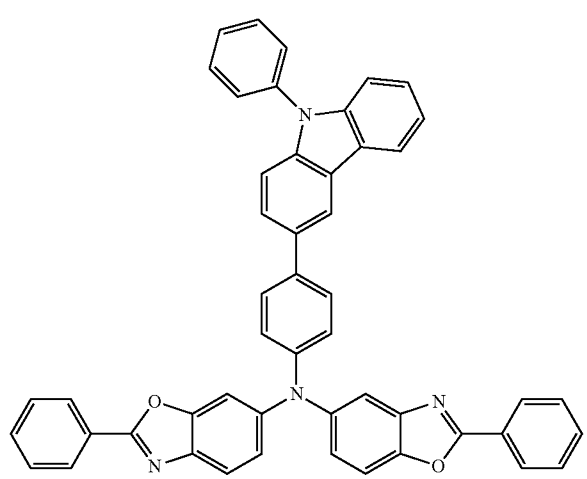

-continued
C-43
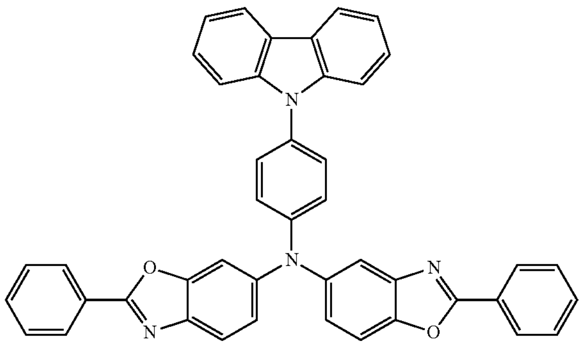
C-44
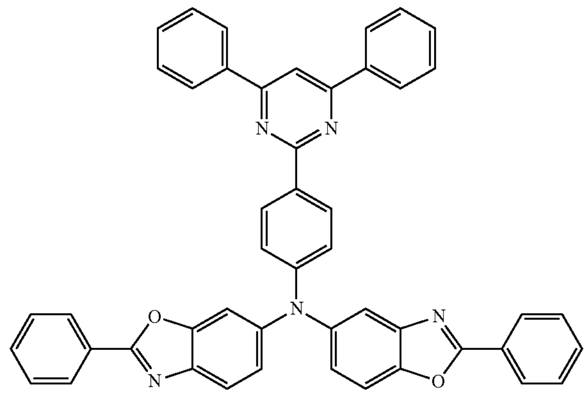
C-45
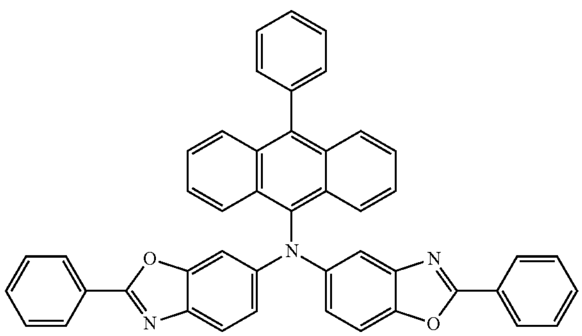
C-46
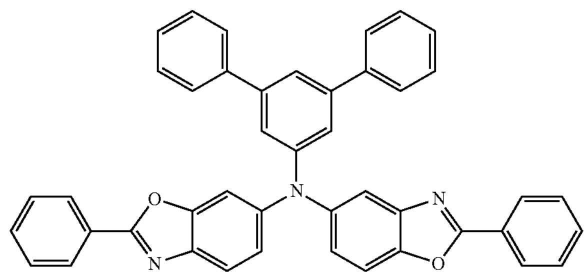
C-47
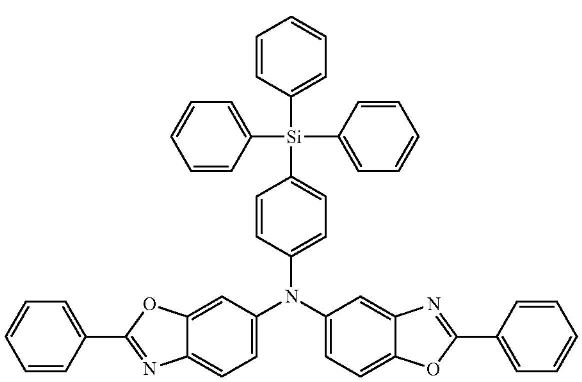
C-48
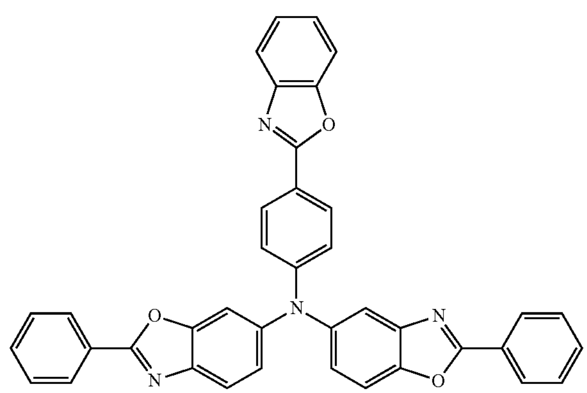

-continued
C-49
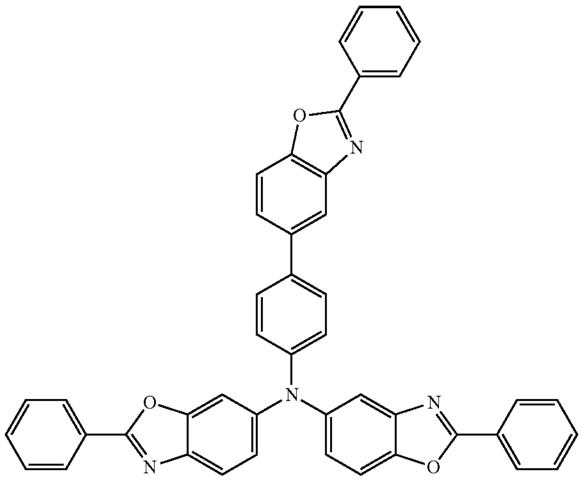
C-50
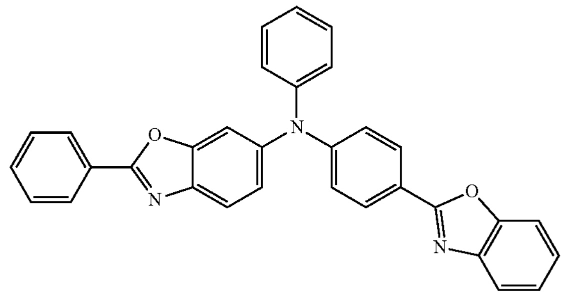
C-51
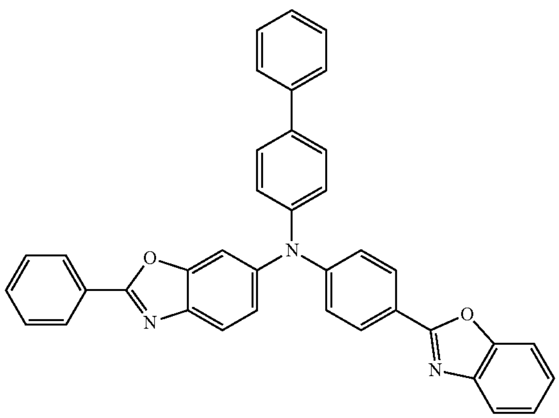
C-52
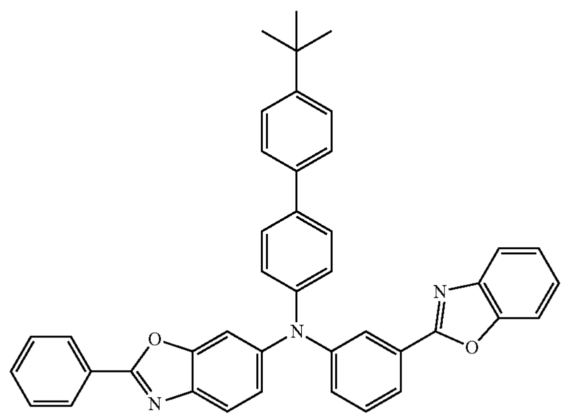
C-53
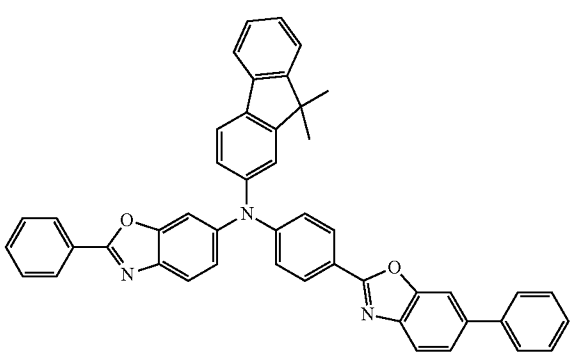
C-54
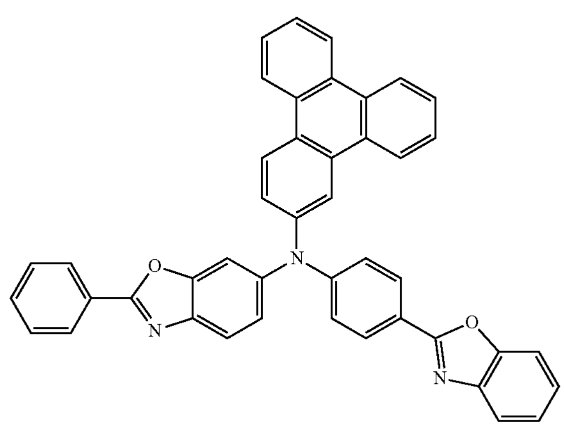

-continued
C-55
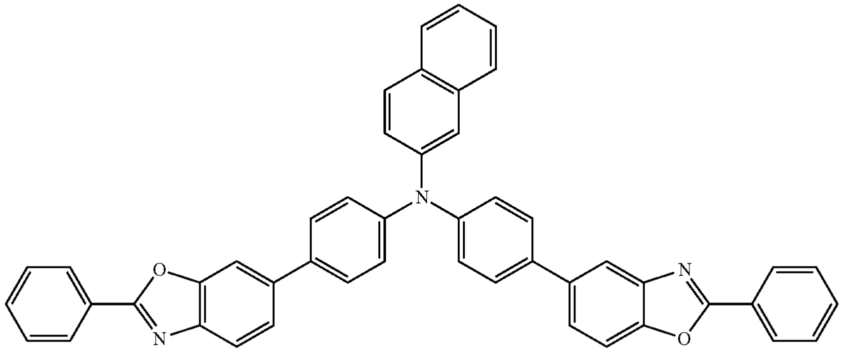
C-56
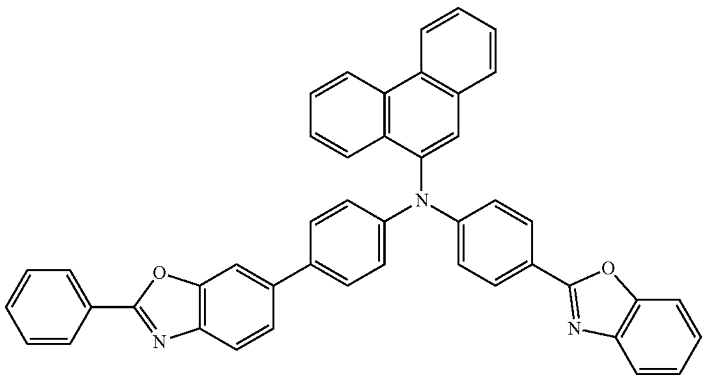
C-57
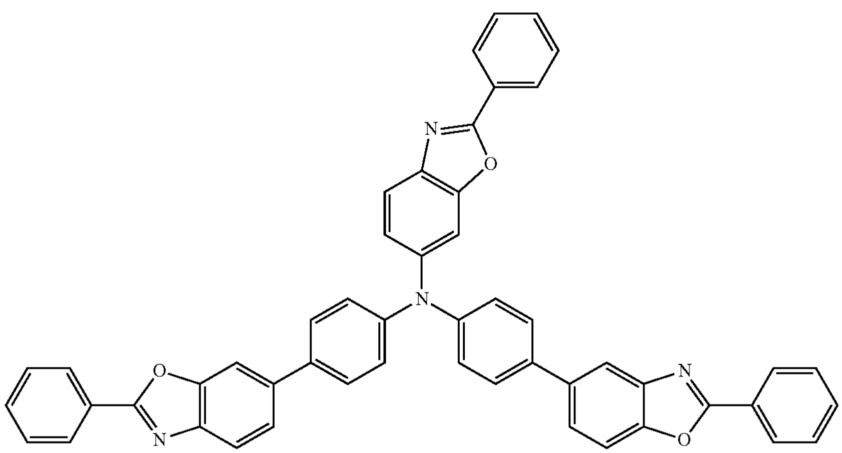
C-58
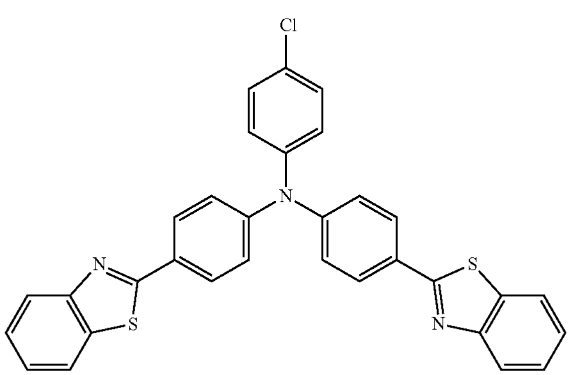
C-59
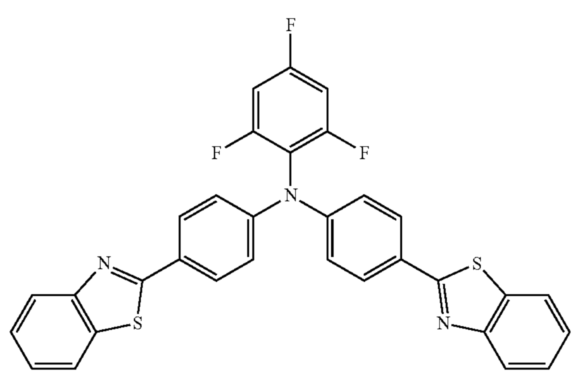

-continued
C-60
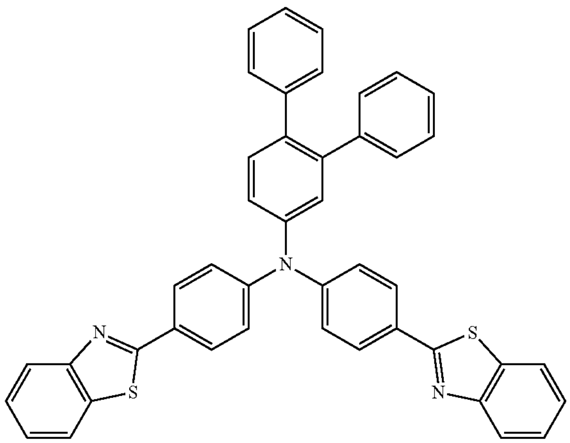
C-61
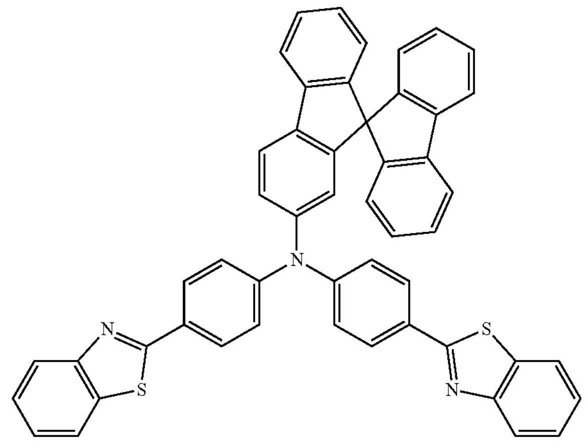
C-62
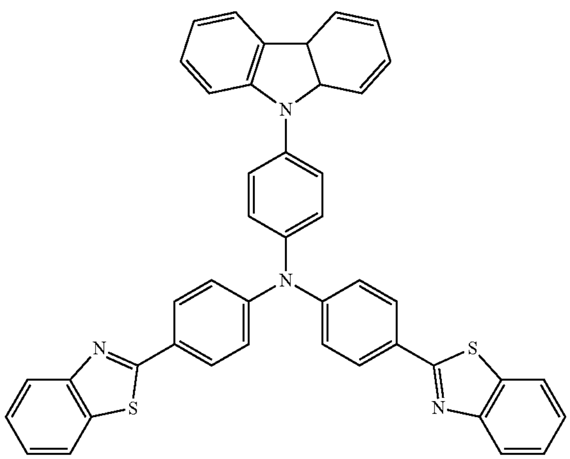
C-63
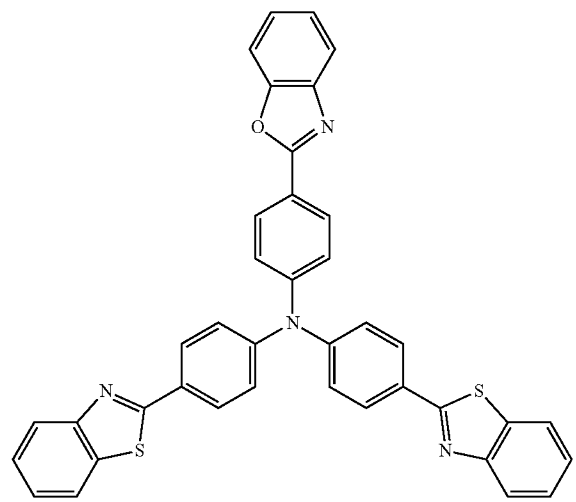
C-64
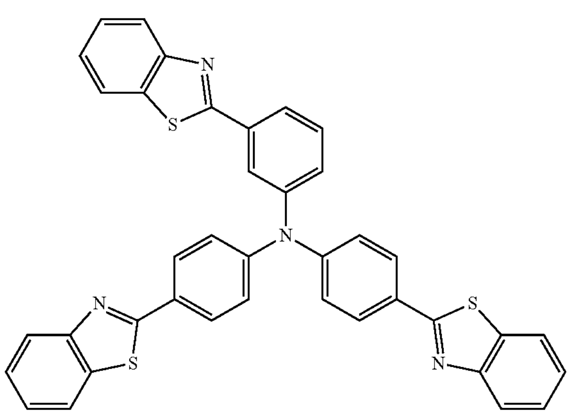
C-65
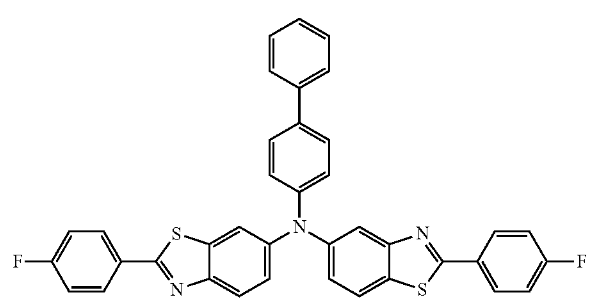

-continued
C-66
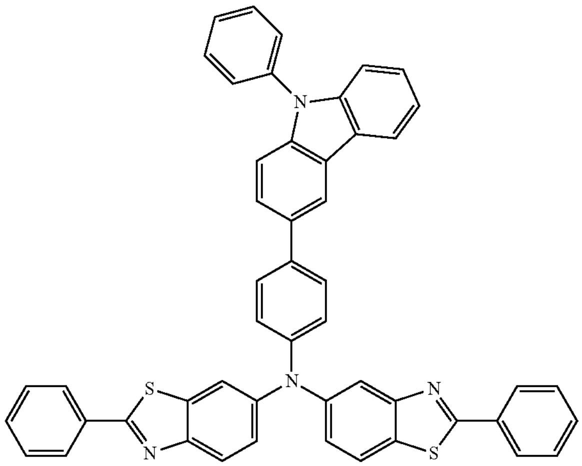
C-67
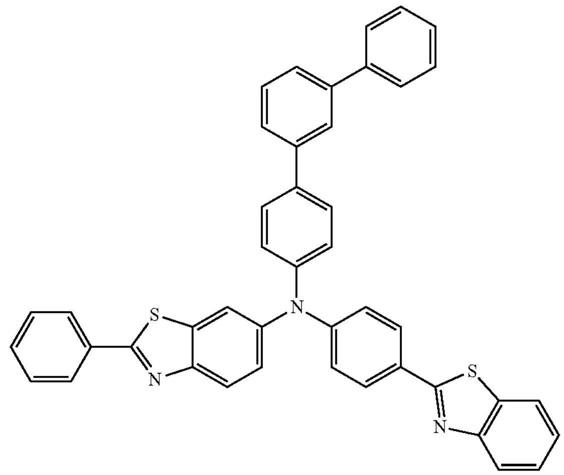
C-68
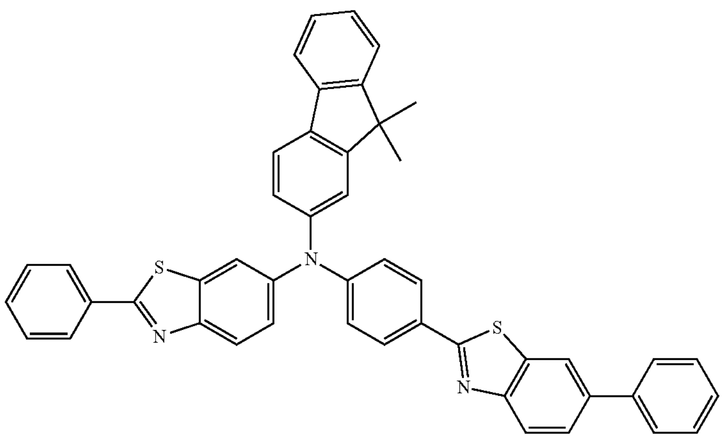
C-69
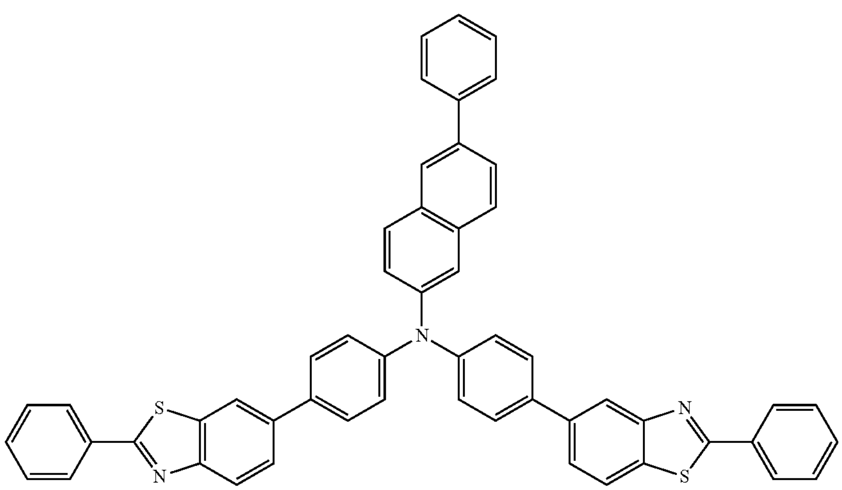

-continued
C-70
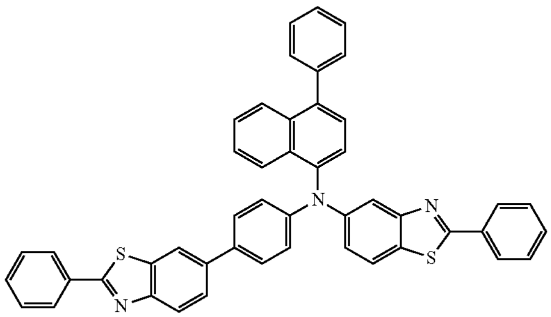
C-71
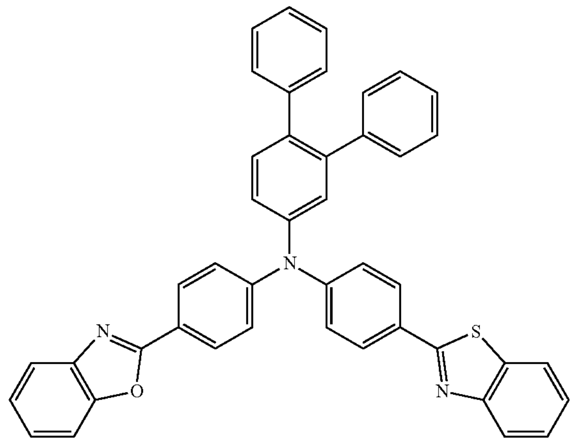
C-72
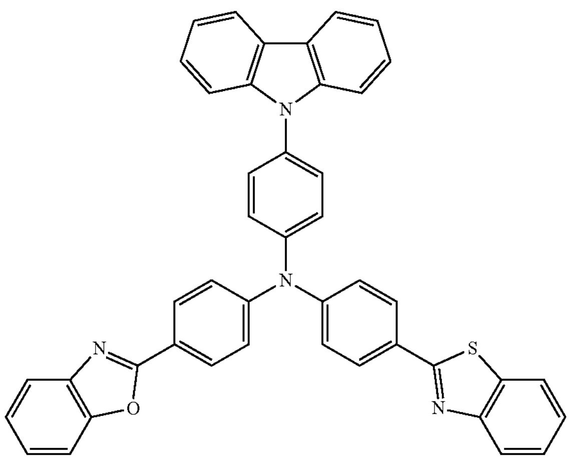
-continued
C-73
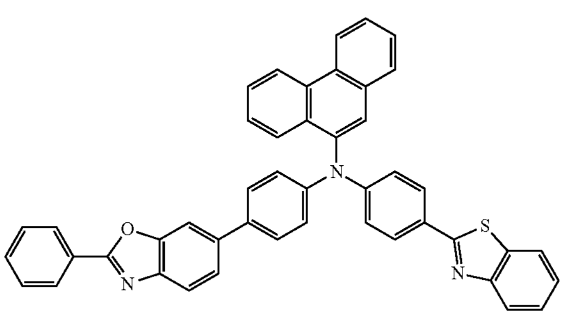
C-74
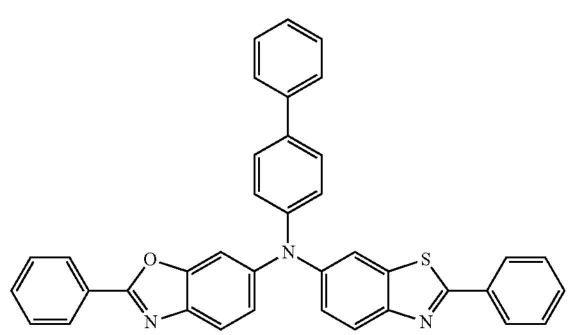

-continued
C-75
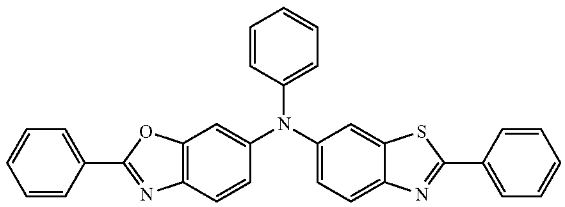
C-76
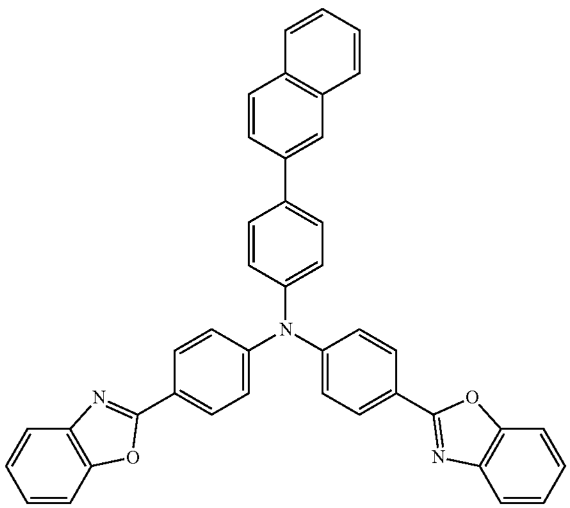
C-77
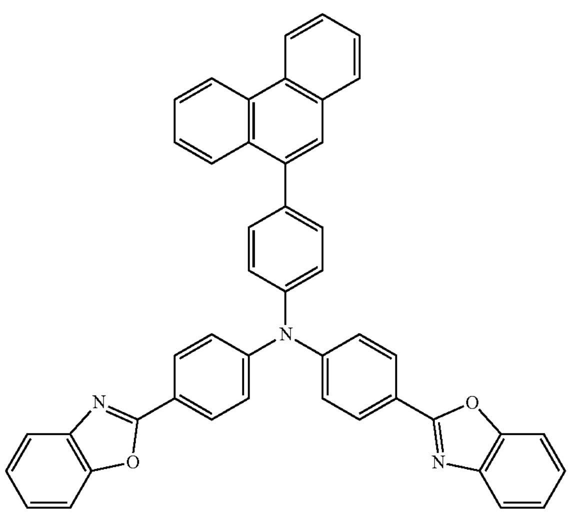
C-78
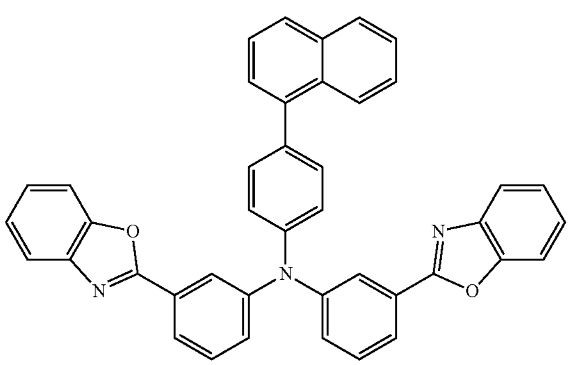
-continued
C-79
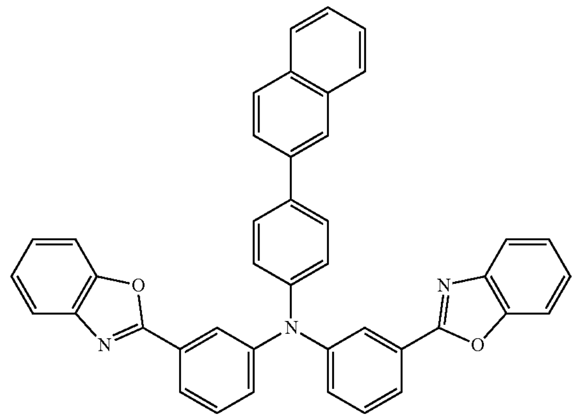
C-80
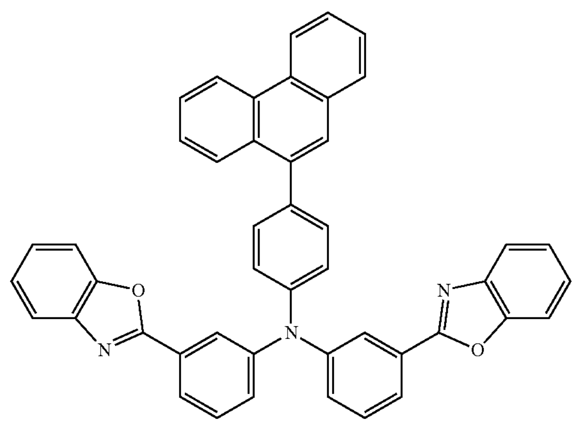
C-81
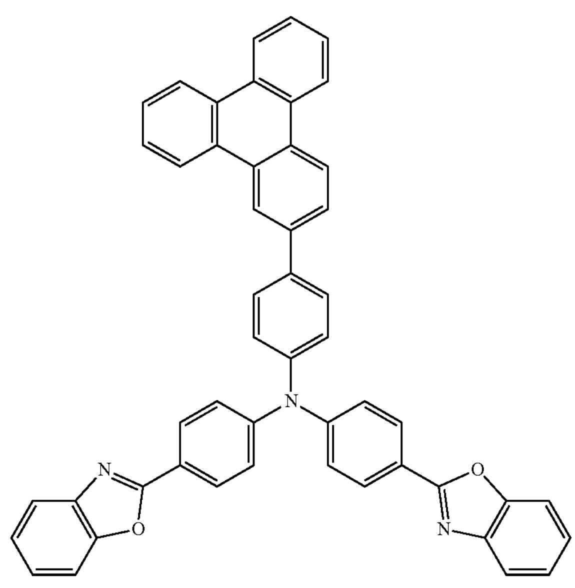

-continued
C-82
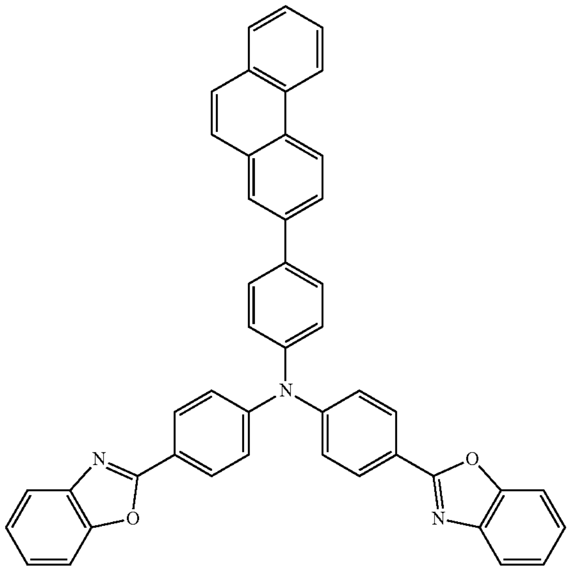
C-83
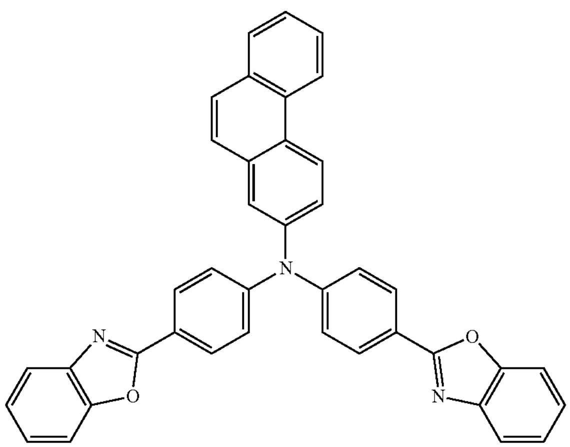
C-84
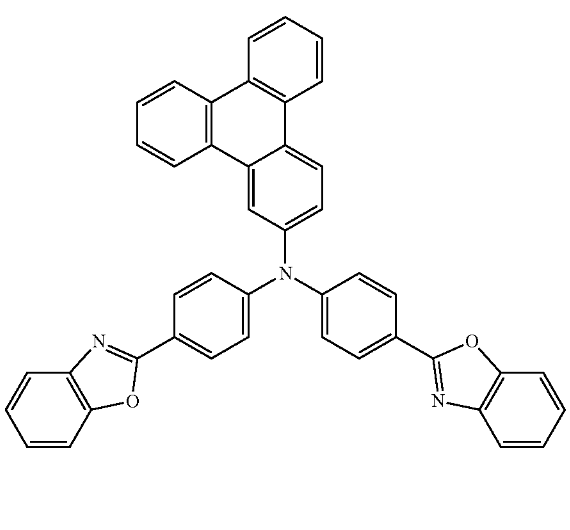
-continued
C-85
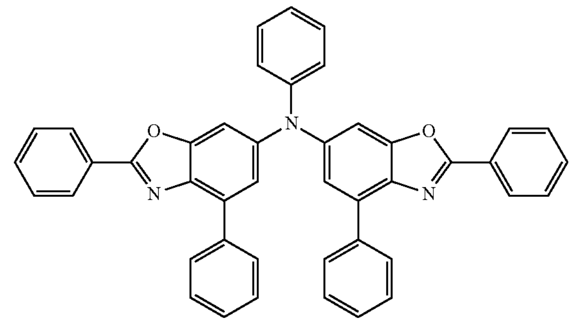
C-86
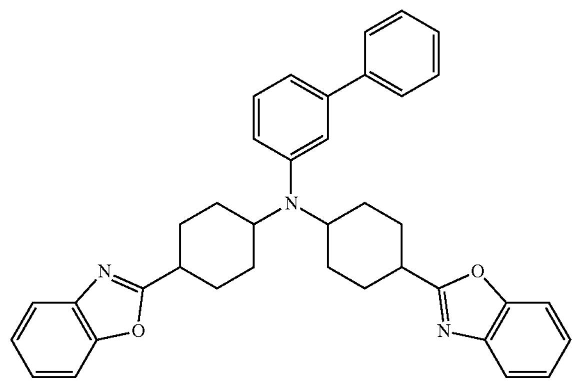
C-87
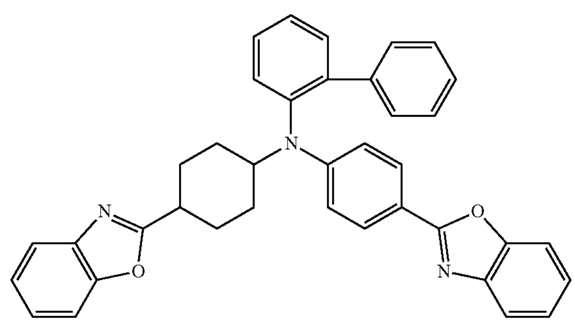
C-88
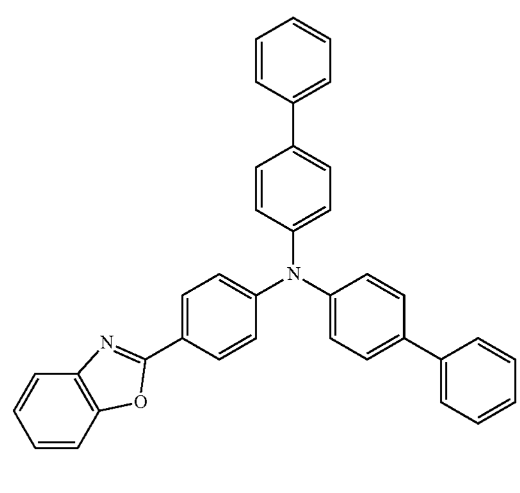

-continued
C-89
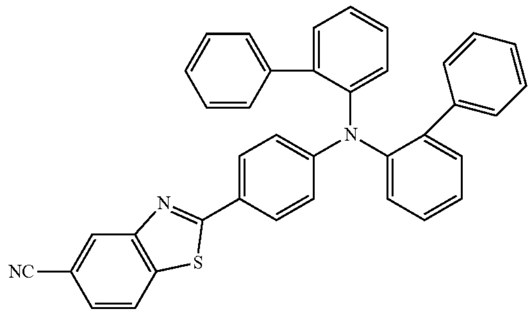
C-90
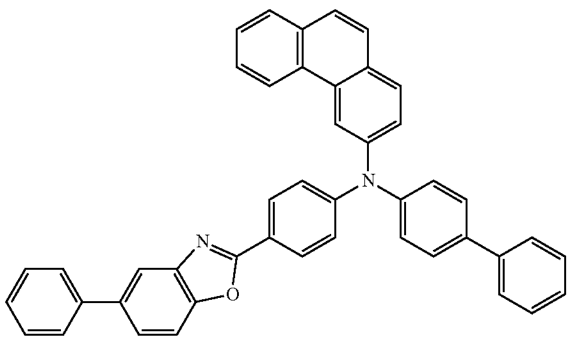
C-91
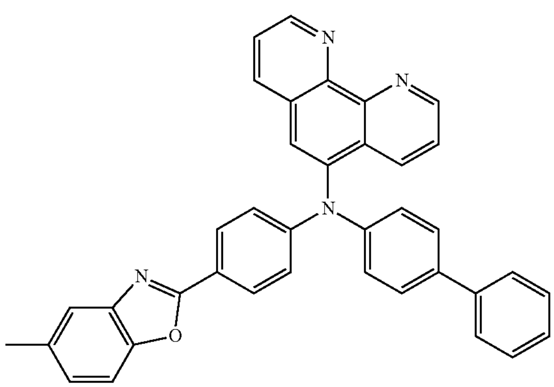
C-92
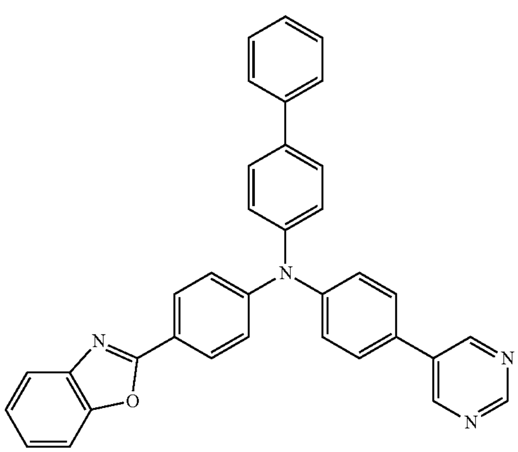
-continued
C-93
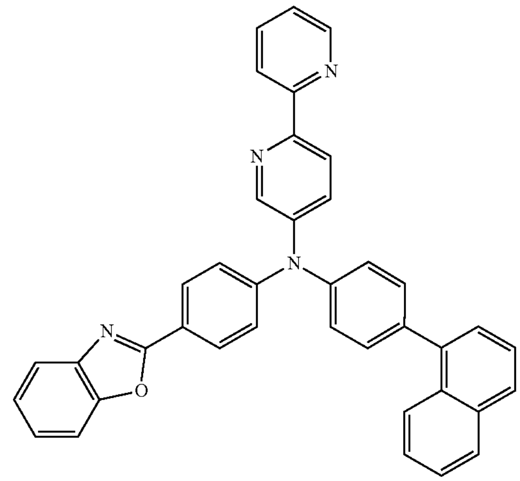
C-94
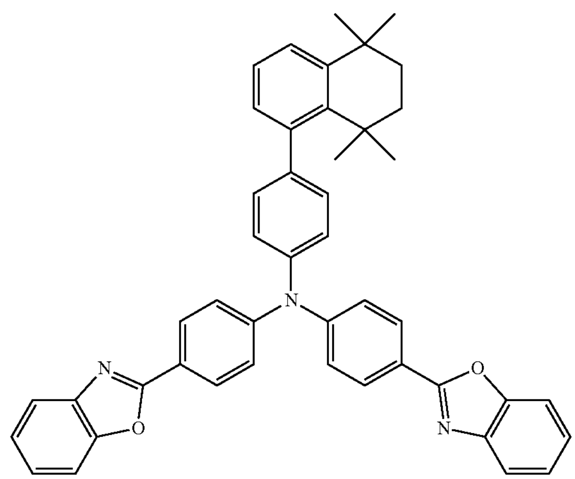
C-95
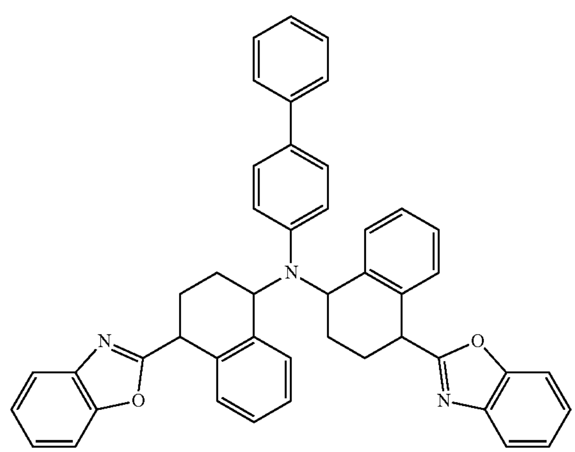

-continued
C-96
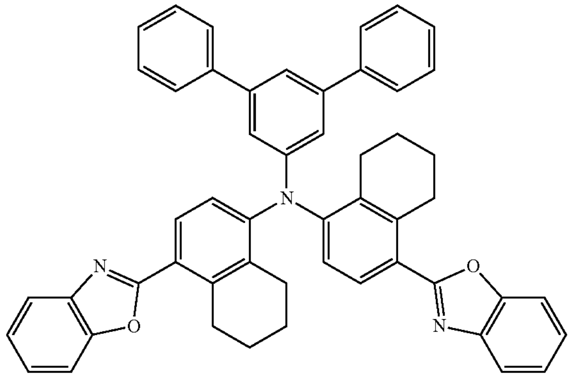
C-97
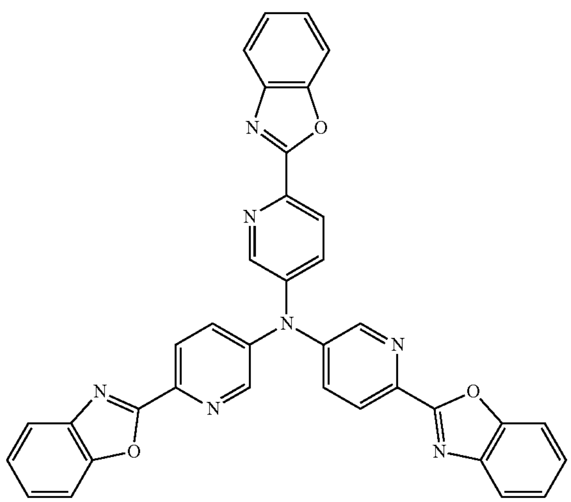
C98
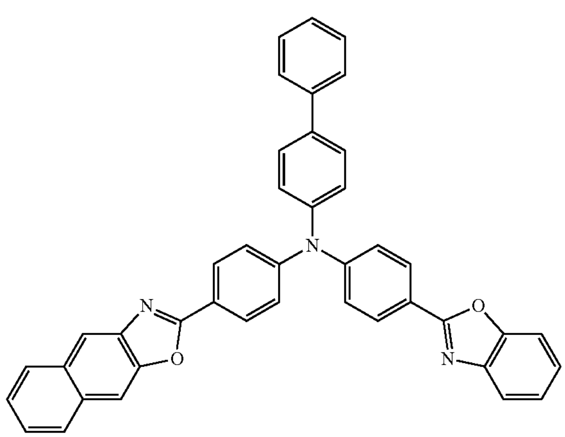
-continued
C-99
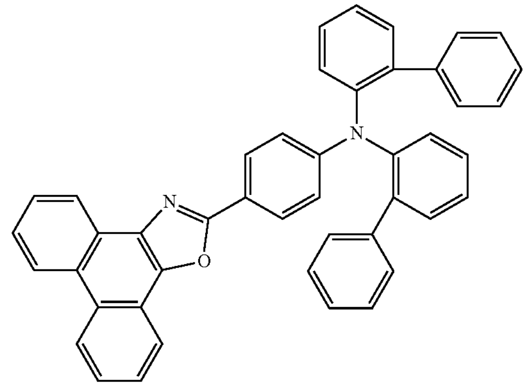
In addition, the light-emitting layer in the organic light-emitting device according to the present invention includes a host and a dopant, and the dopant compound may be represented by [Formula D-1] to [Formula D-8], and specific compounds thereof are as follows, but are not limited thereto.
<Formula D-1>
D-101
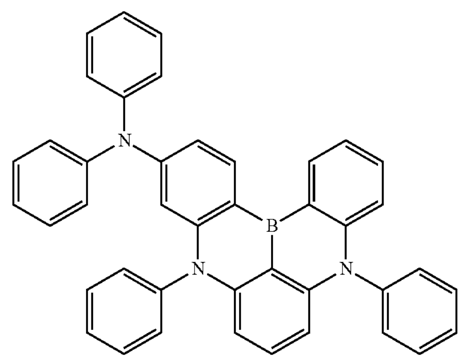
D-102
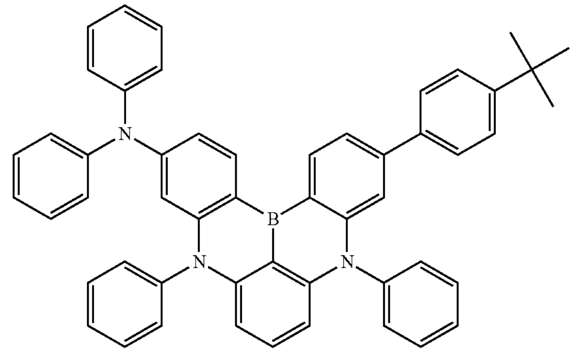

-continued
D-103
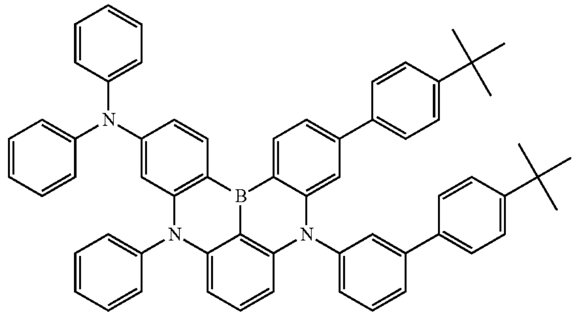
D-104
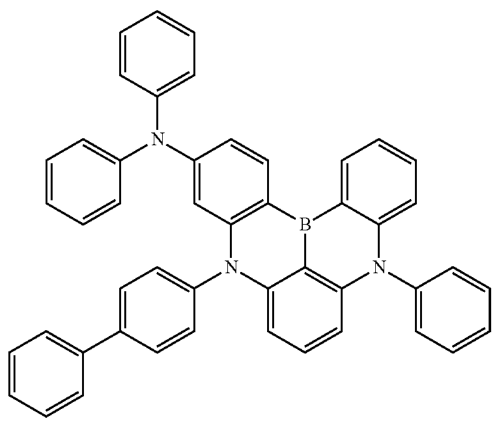
D-105
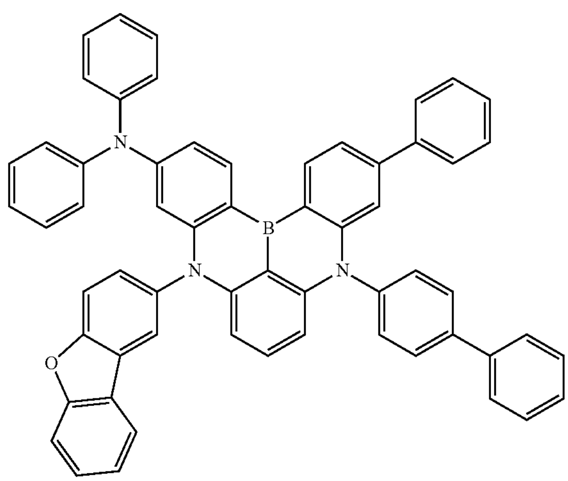
D-106
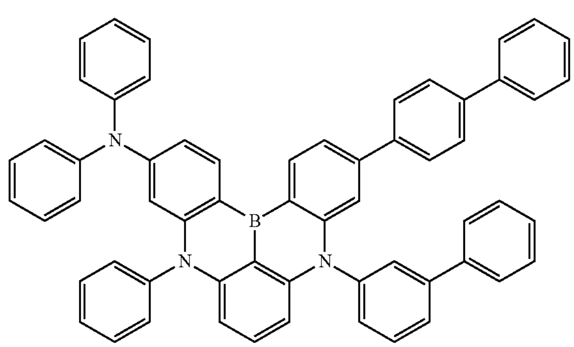
-continued
D-107
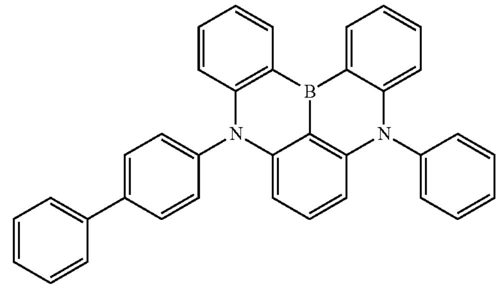
D-108
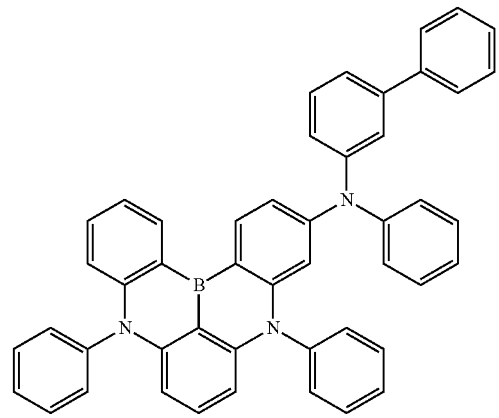
D-109
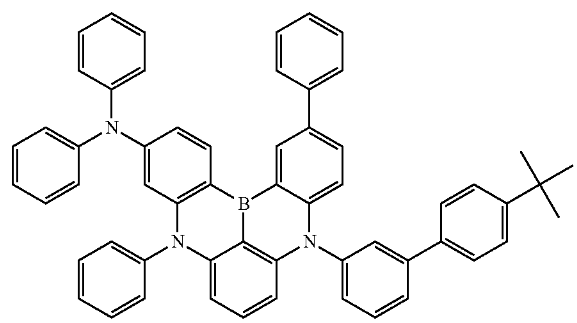
D-110
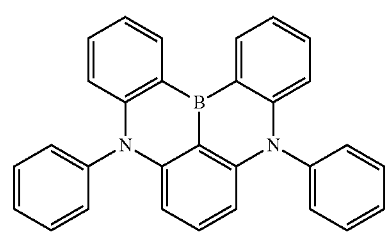
D-111
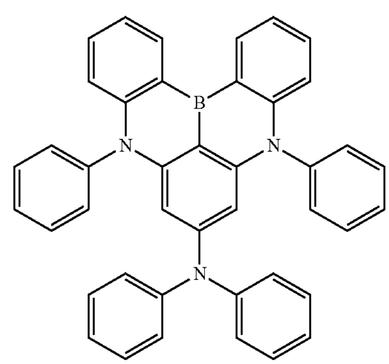

-continued
D-112
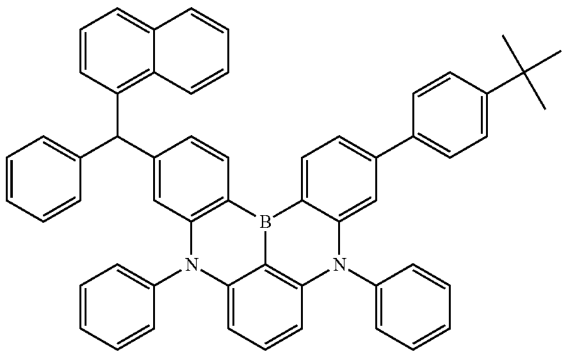
D-113
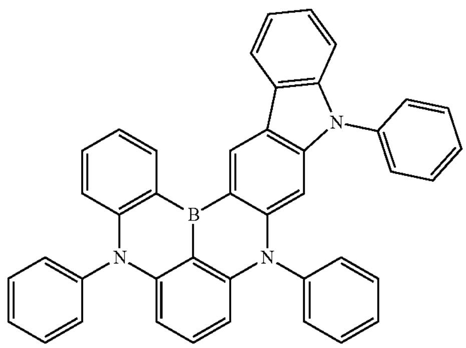
D-114
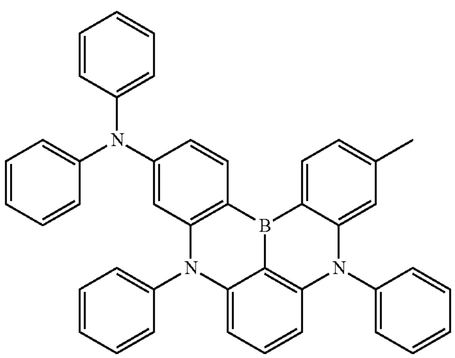
D-115
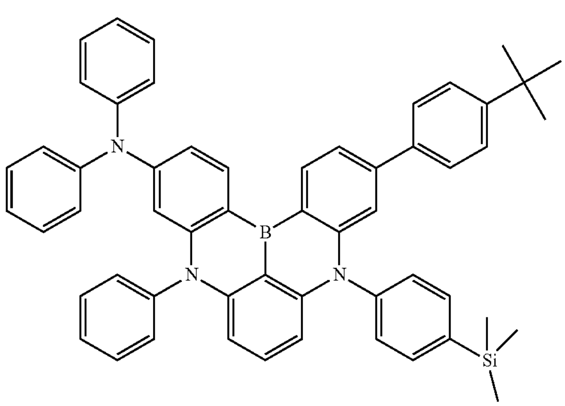
-continued
D-116
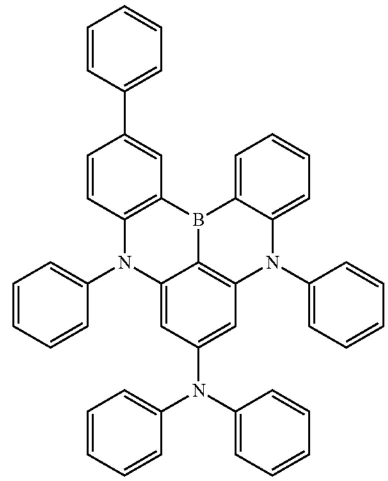
D-117
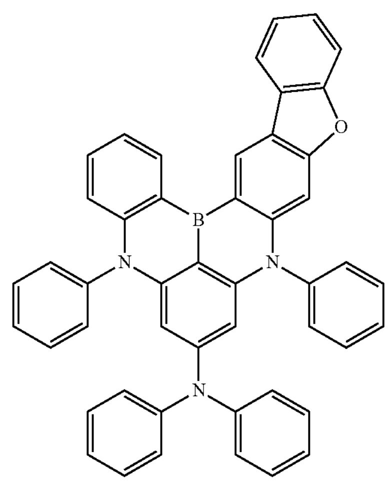
D-118
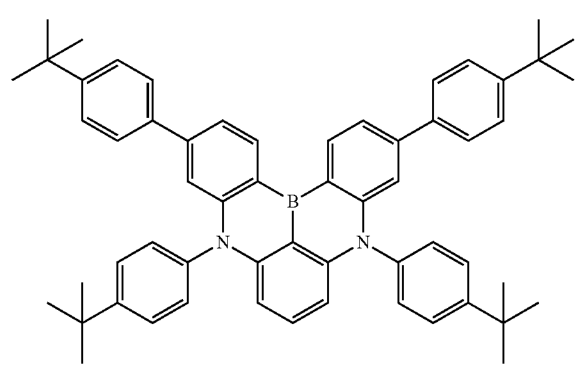

-continued
D-119
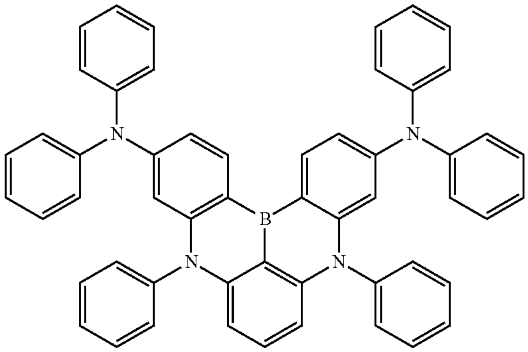
D-120
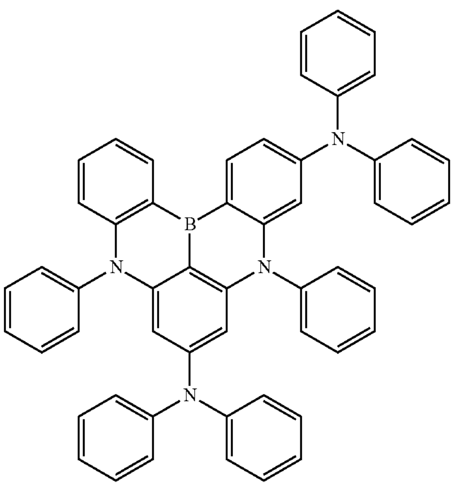
D-121
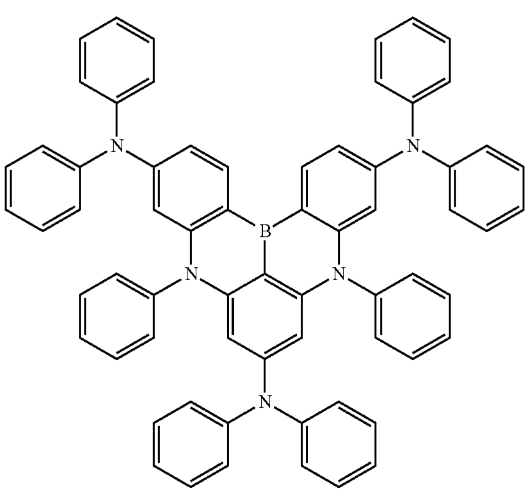
-continued
D-122
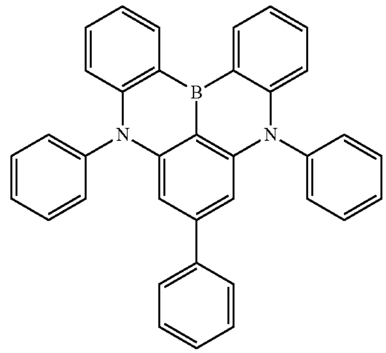
D-123
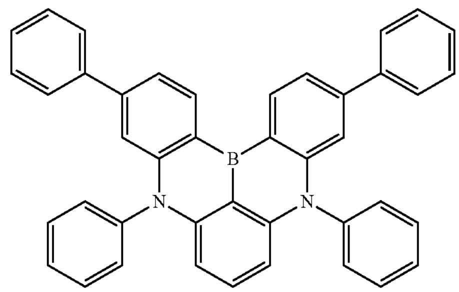
D-124
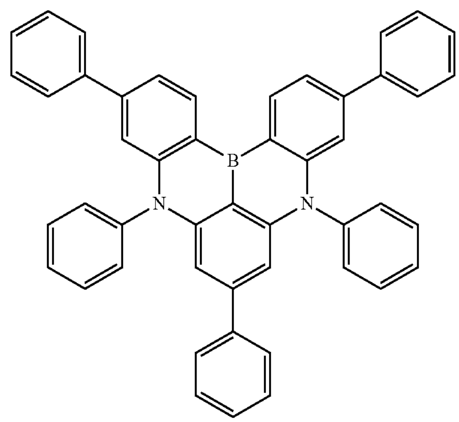
D-125
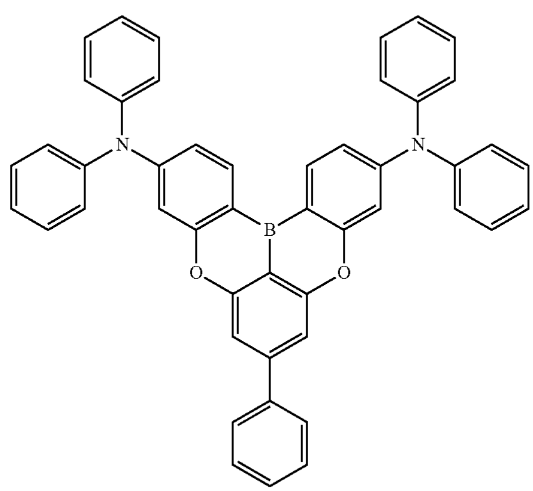

-continued
D-126
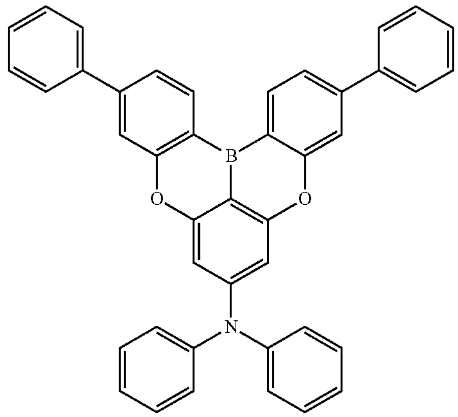
D-127
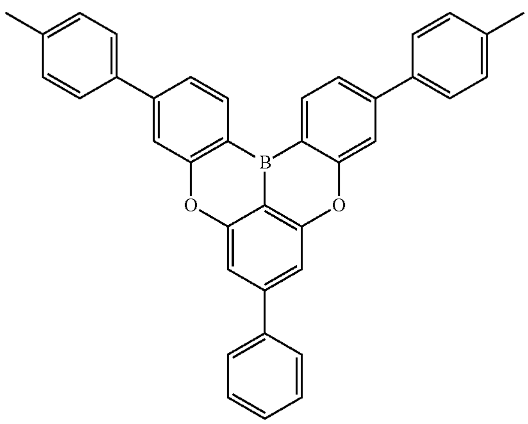
D-128
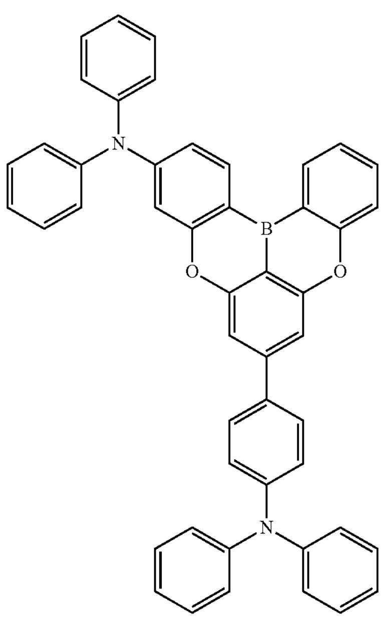
-continued
D-129
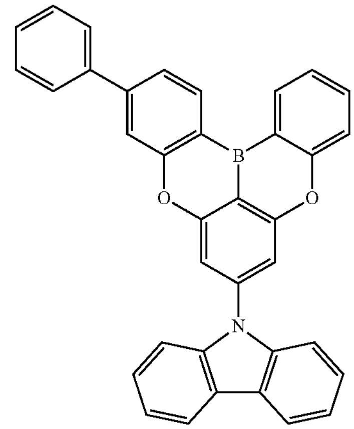
D-130
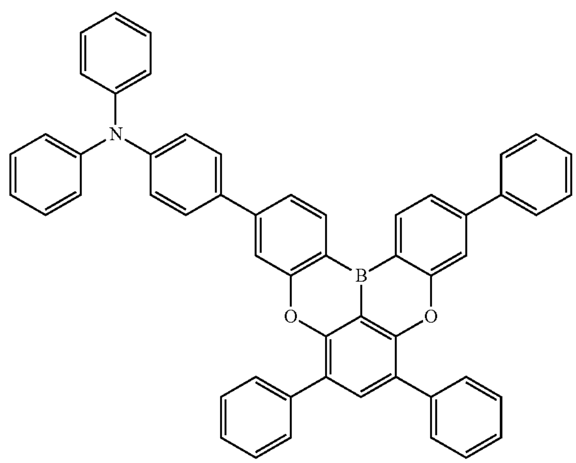
<Formula D-2 and Formula D-3>
D-201
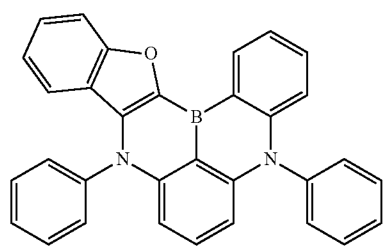
D-202
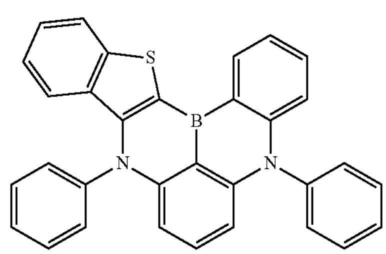

-continued
D-203
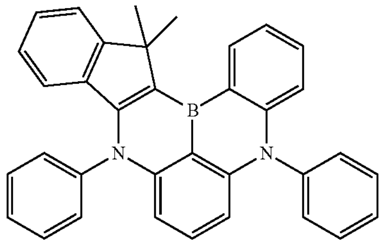
D-204
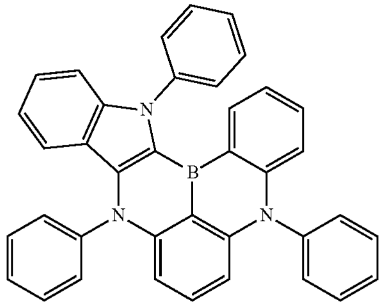
D-205
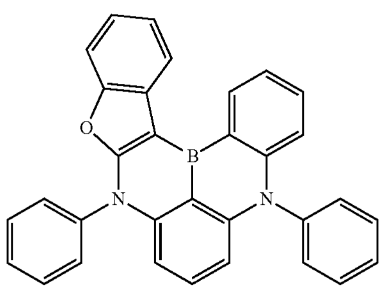
D-206
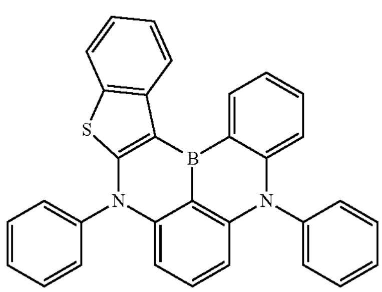
D-207
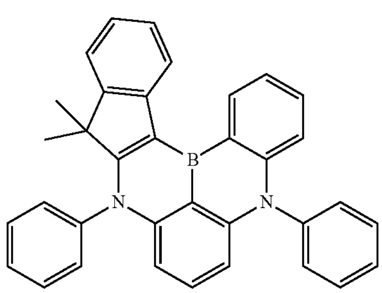
-continued
D-208
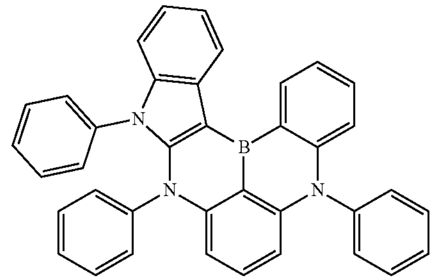
D-209
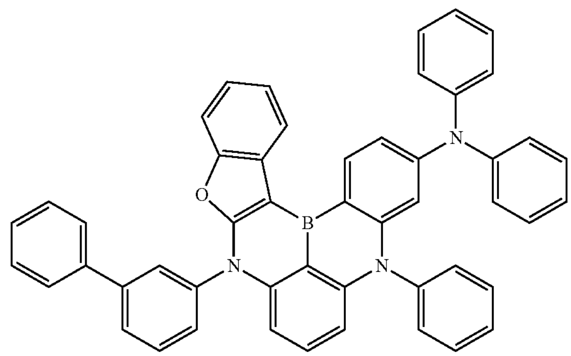
D-210
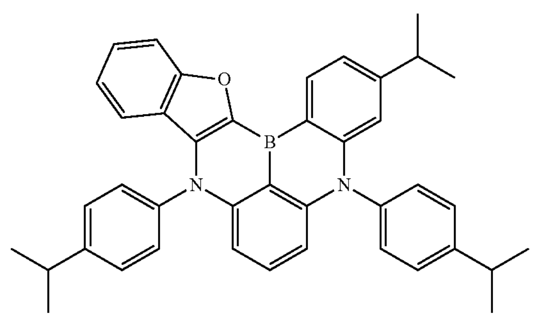
D-211
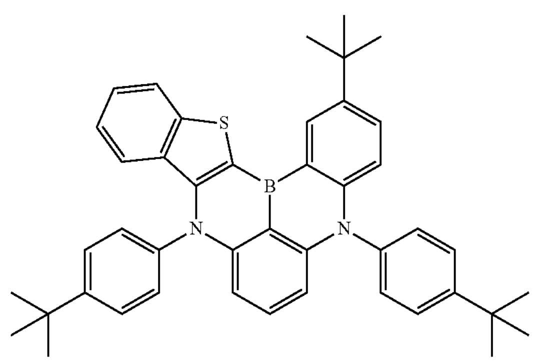

-continued
D-212
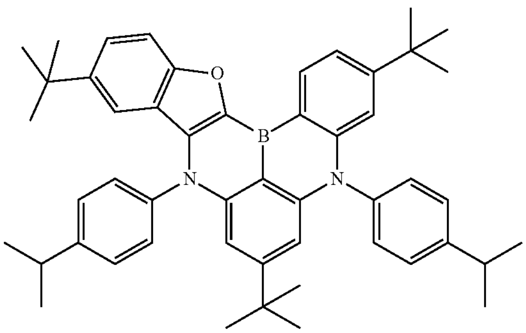
D-213
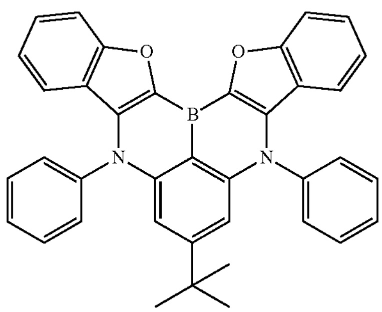
D-214
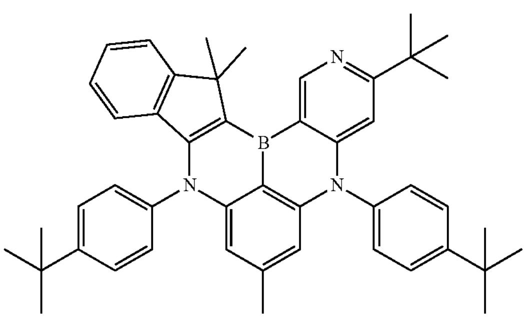
D-215
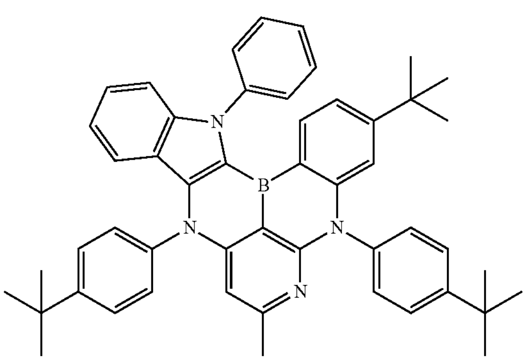
-continued
D-216
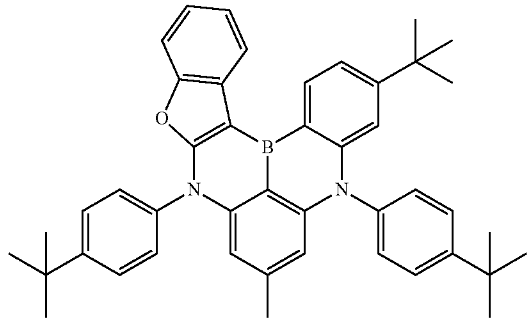
D-217
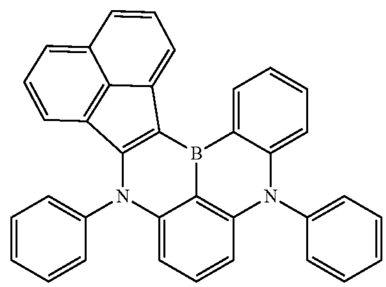
D-218
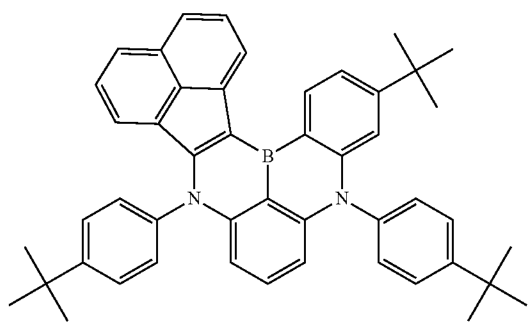
D-219
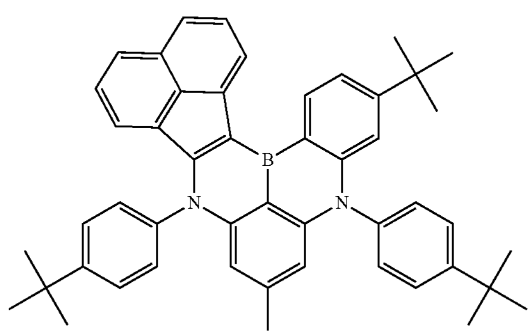

-continued
D-220
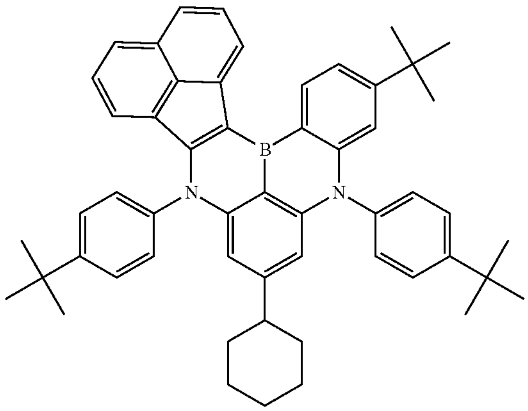
D-221
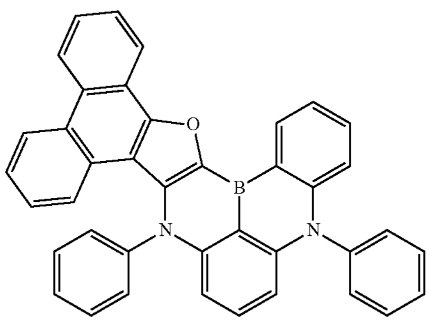
D-222
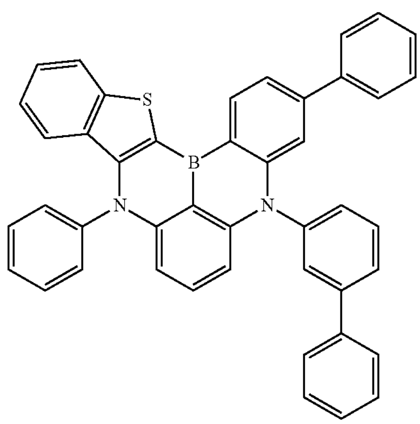
D-223
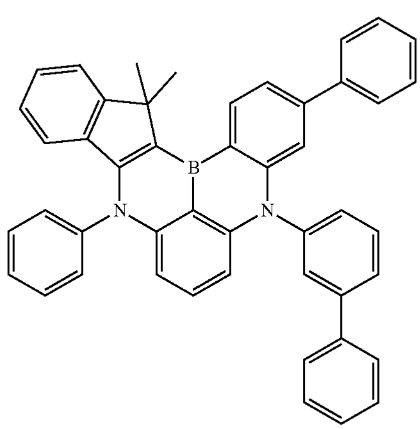
-continued
D-224
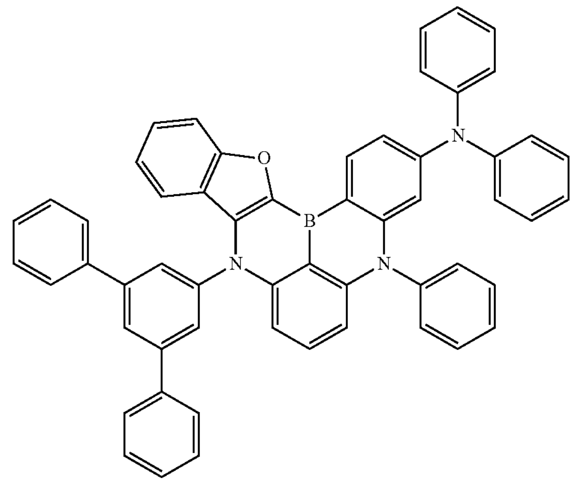
D-225
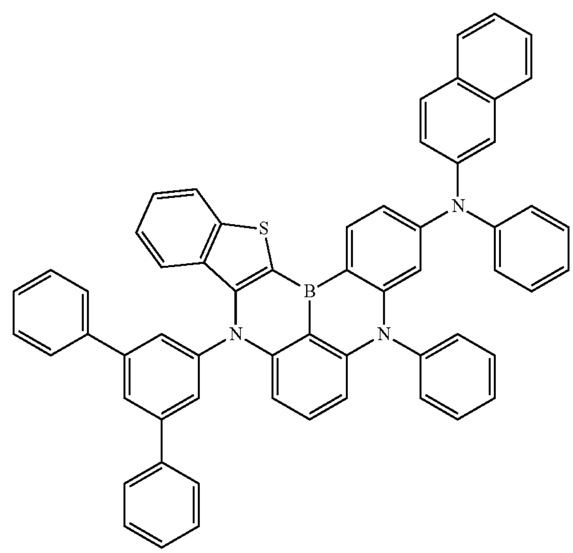
D-226
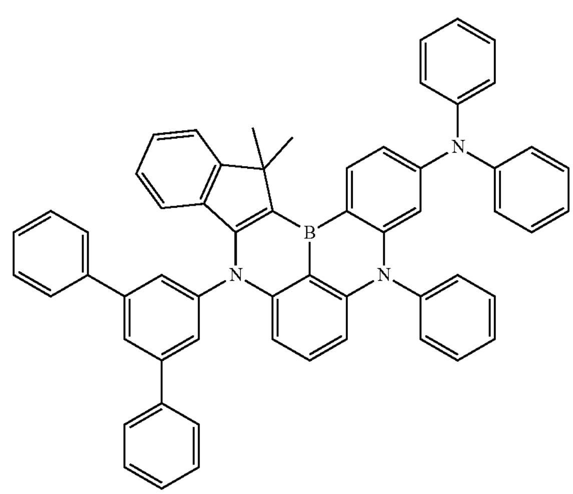

-continued
D-227
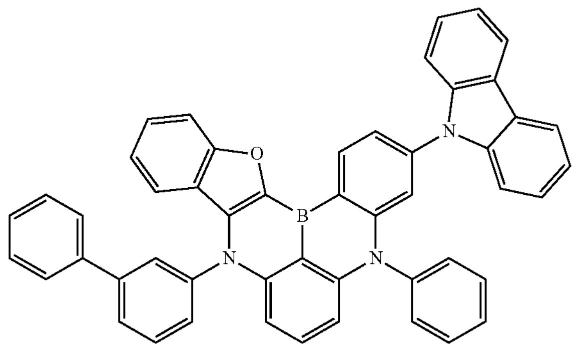
D-228
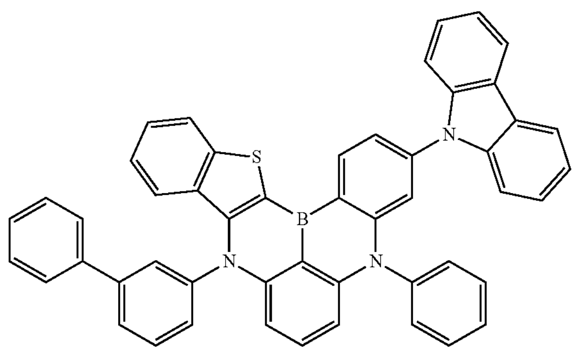
D-229
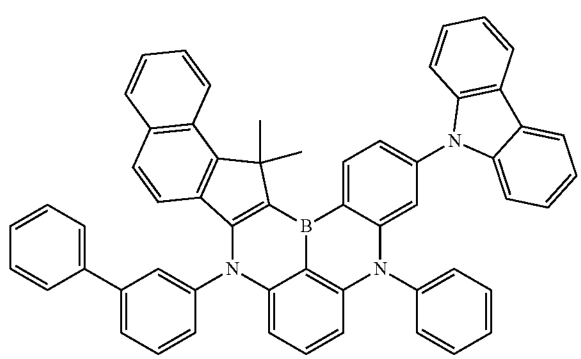
D-230
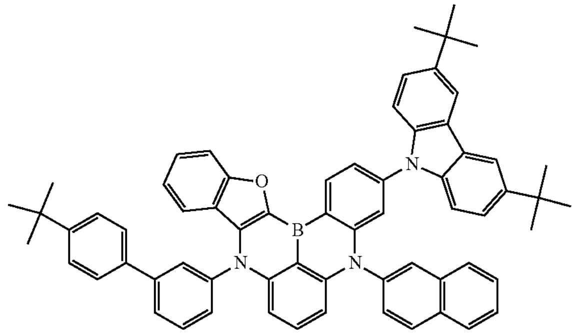
-continued
D-231
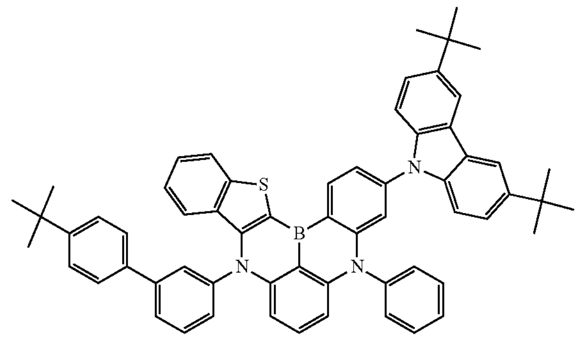
D-232
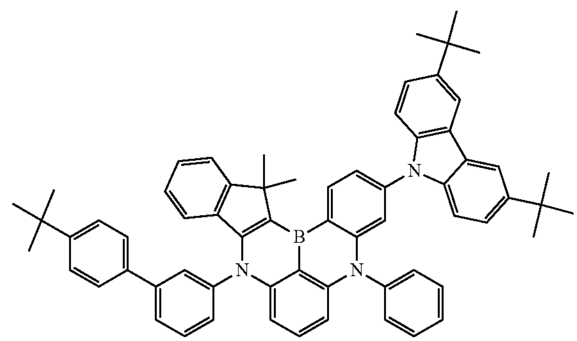
D-233
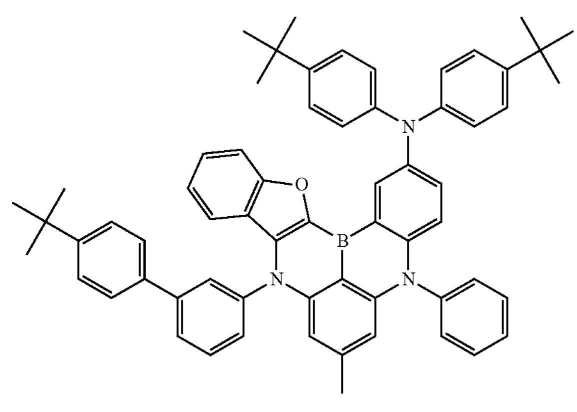
D-234
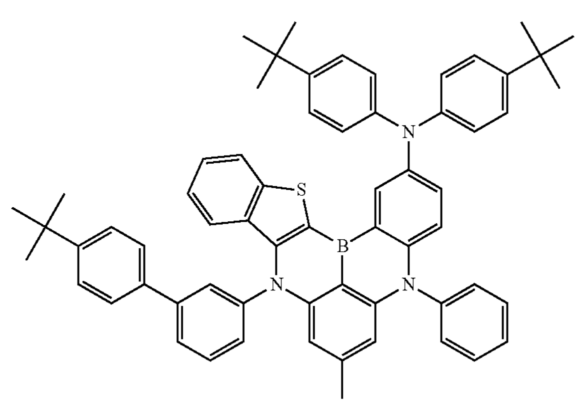

-continued
D-235
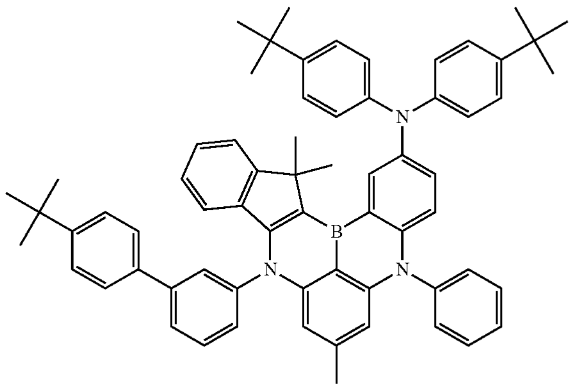
D-236
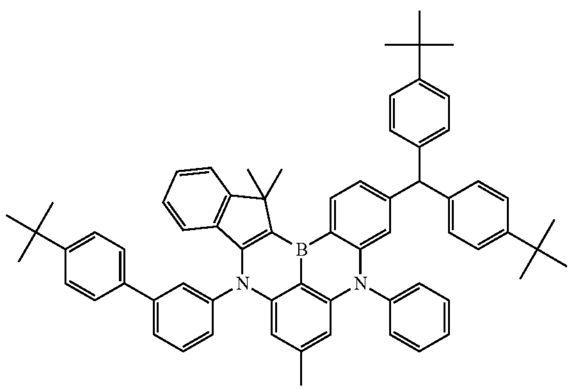
D-237
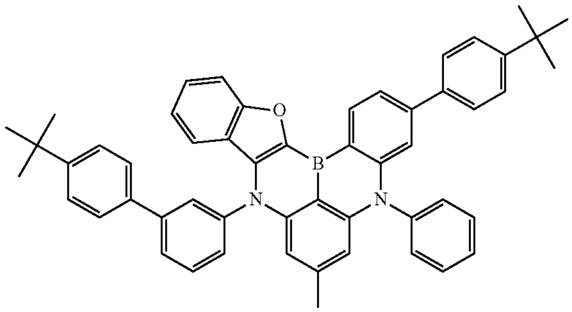
D-238
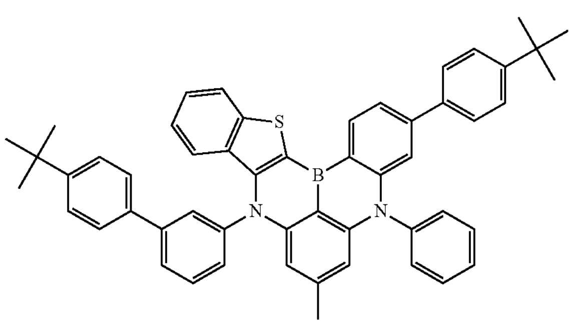
-continued
D-239
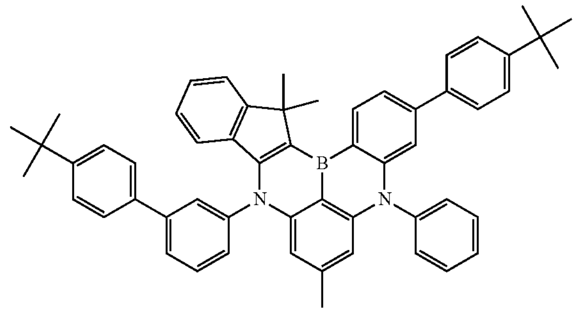
D-240
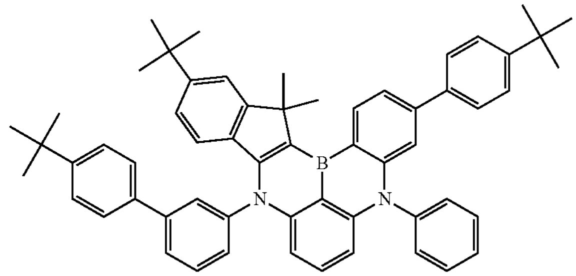
D-241
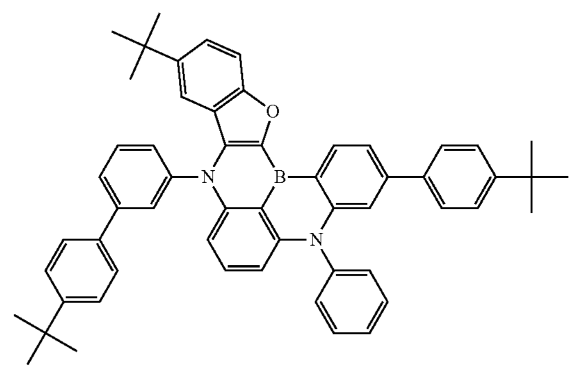
D-242
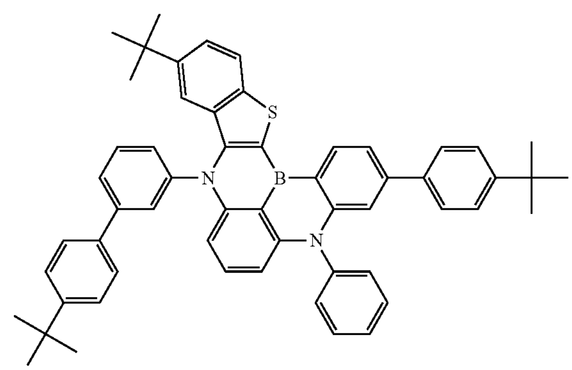

-continued
D-243
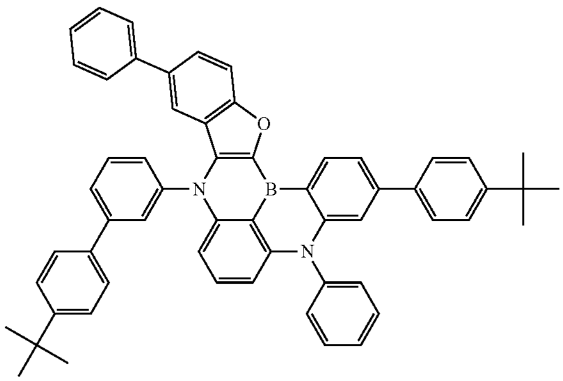
D-244
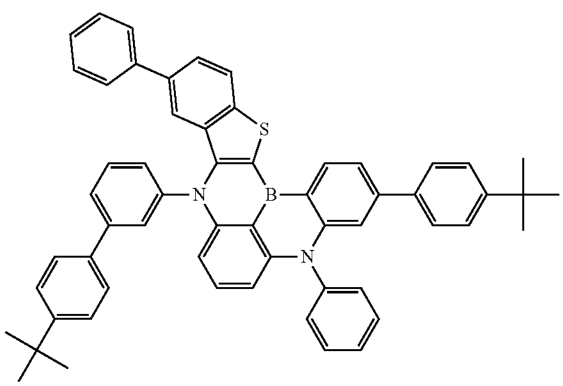
D-245
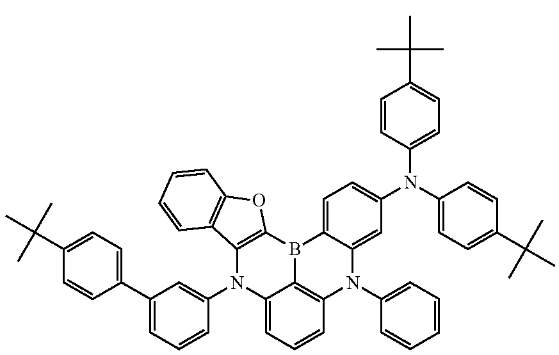
D-246
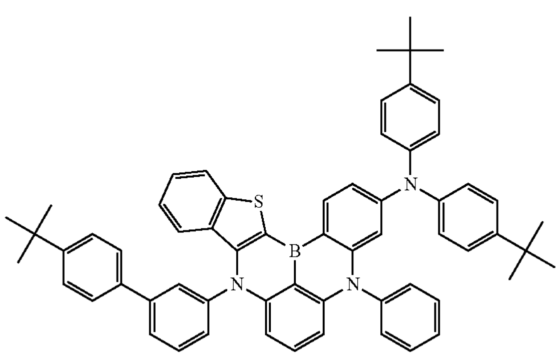
-continued
D-247
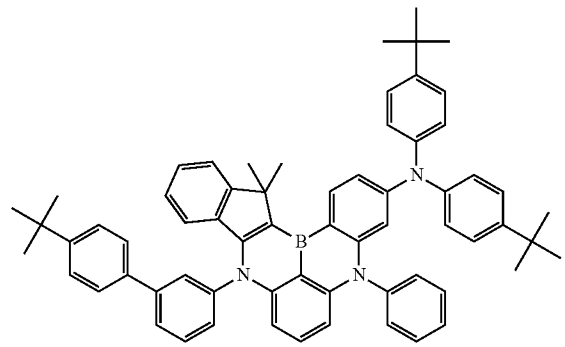
D-248
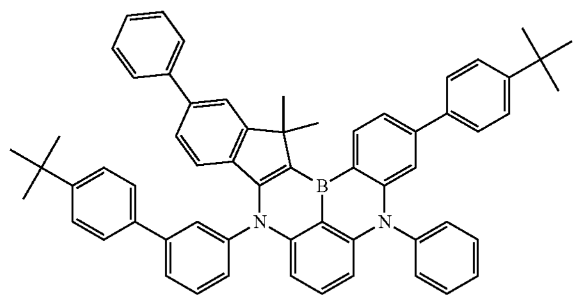
D-249
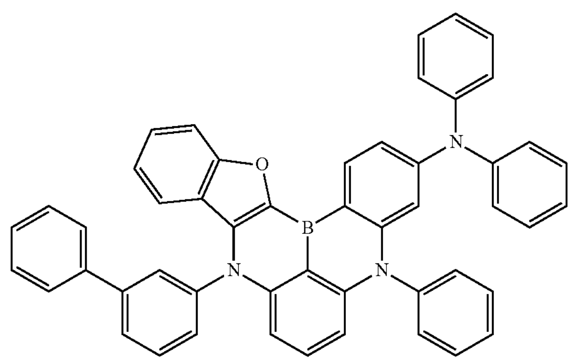
D-250
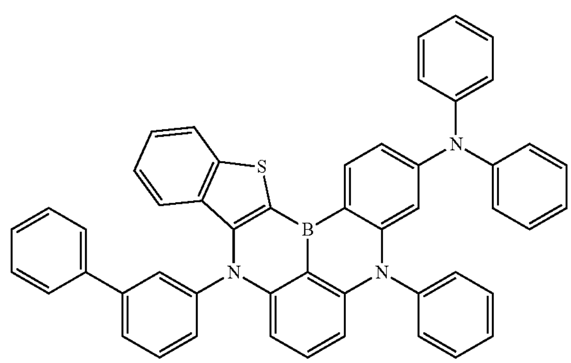

-continued
D-251
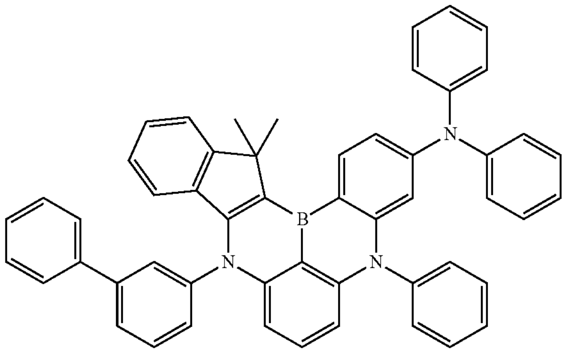
D-252
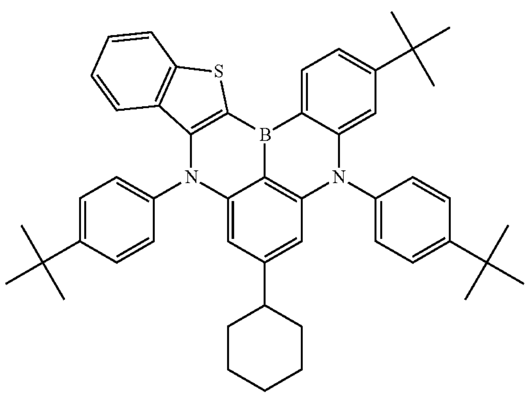
D-253
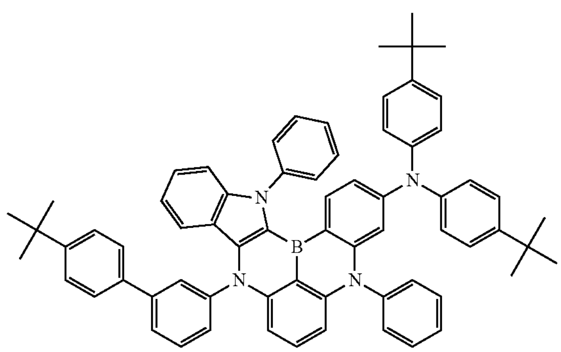
D-254
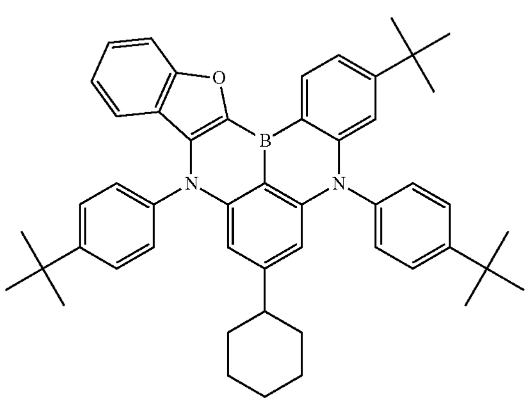
-continued
D-255
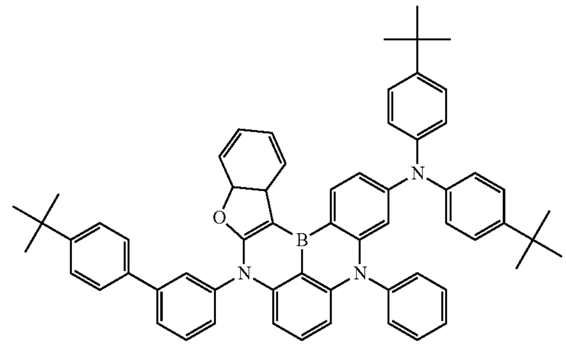
D-256
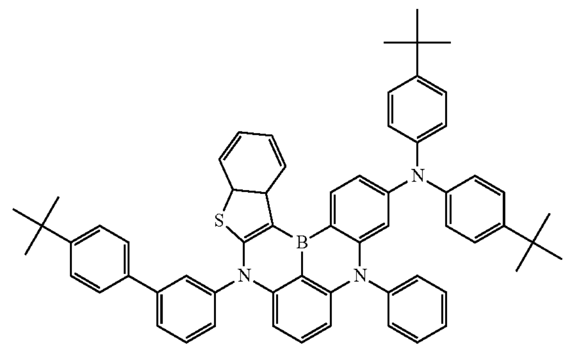
D-257
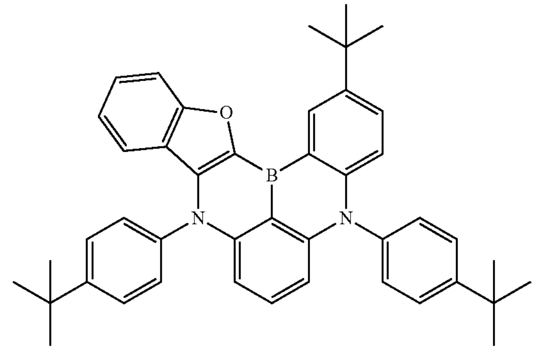
D-258
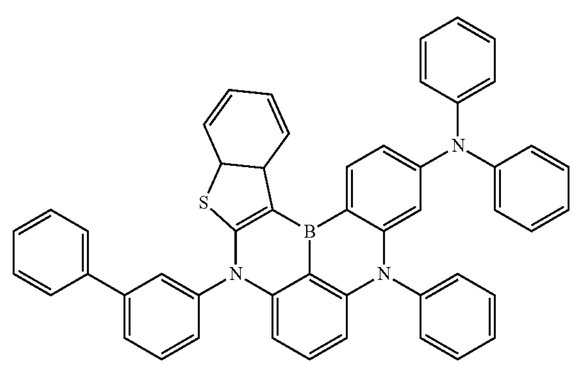

D-259
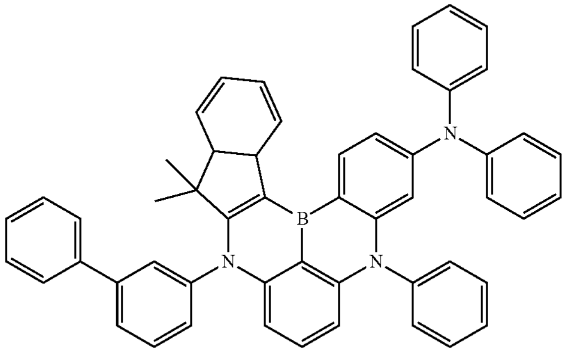
D-260
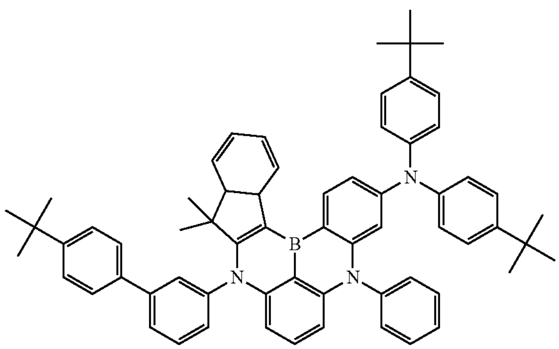
D-261
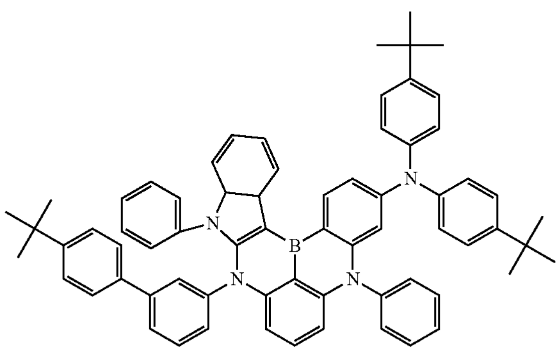
D-262
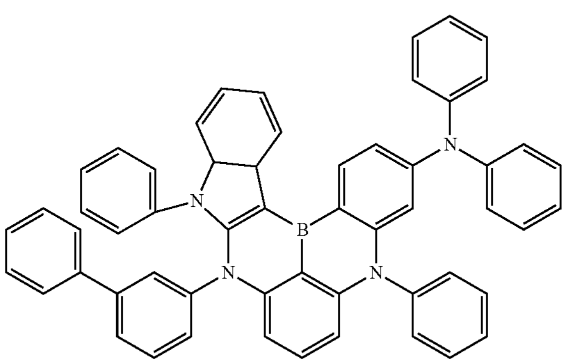
D-263
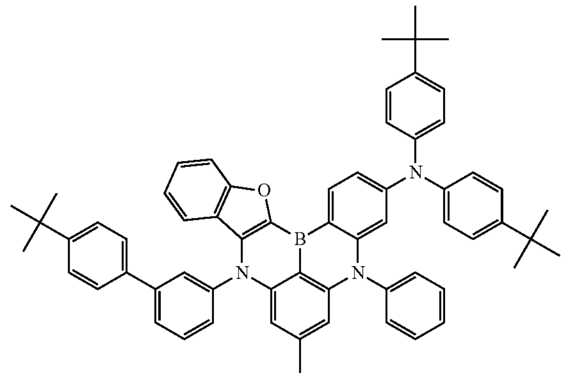
D-264
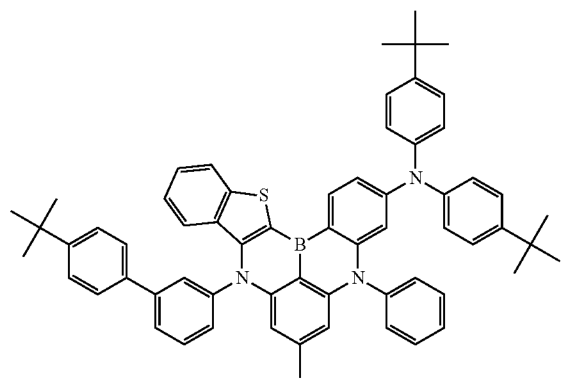
D-265
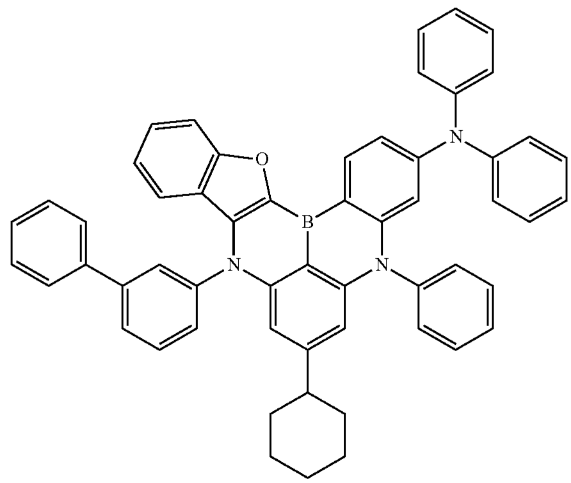

-continued
D-266
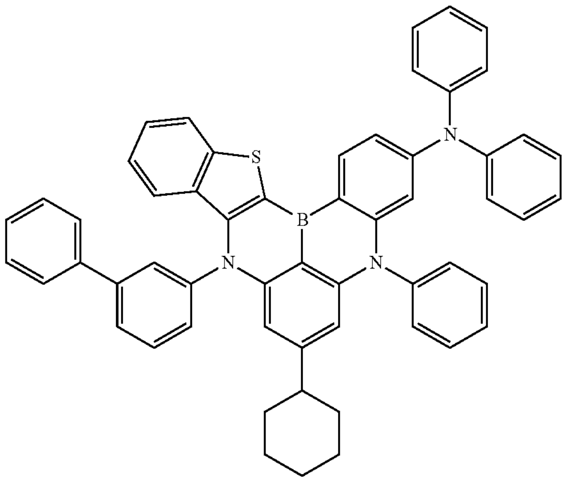
D-267
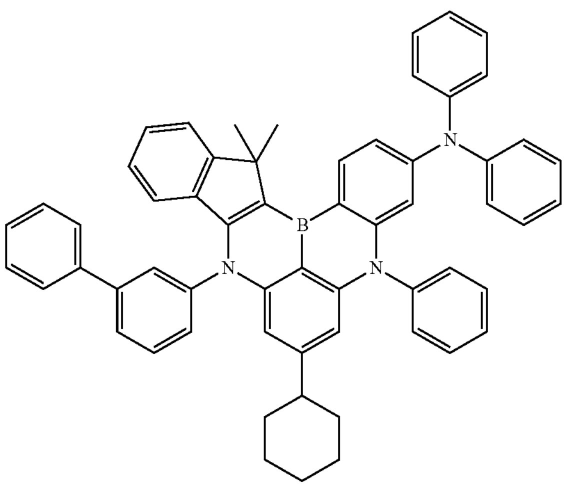
D-268
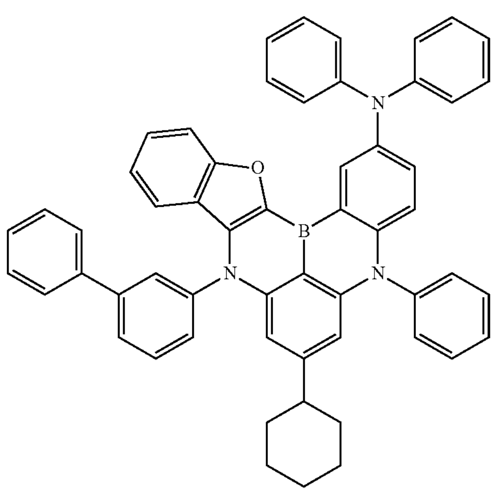
-continued
D-269
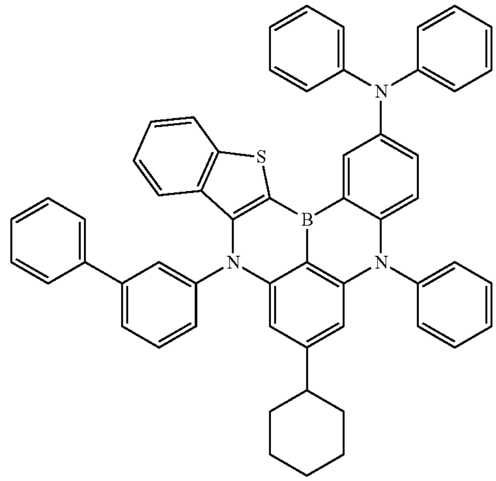
D-270
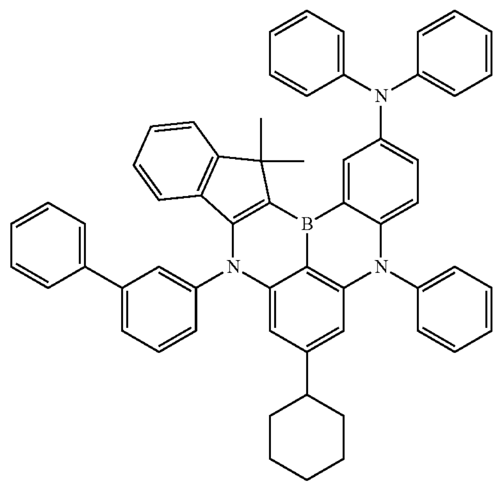
D-271
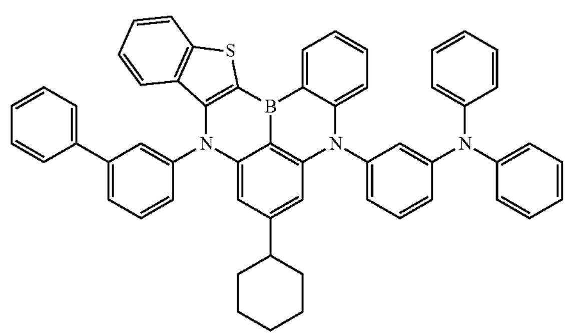

D-272
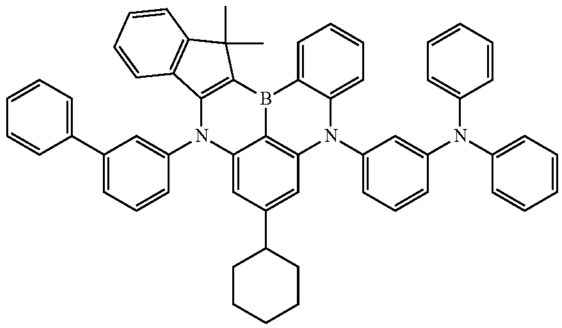
D-273
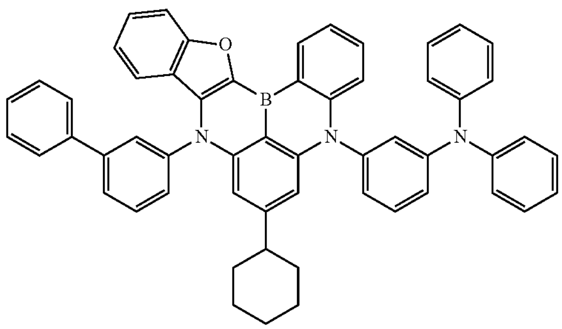
D-274
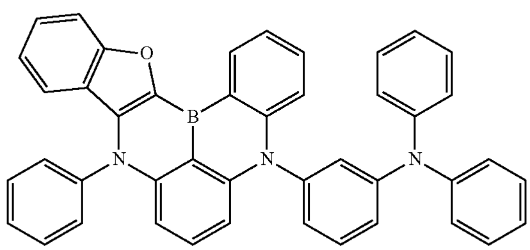
D-275
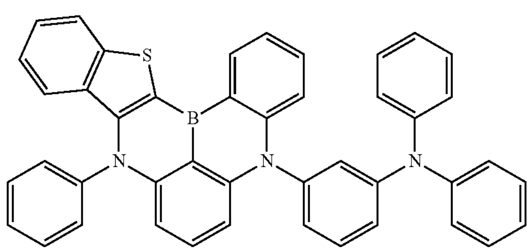
D-276
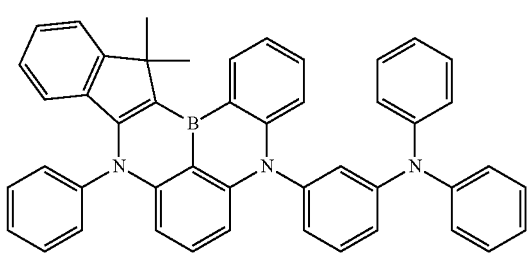
D-277
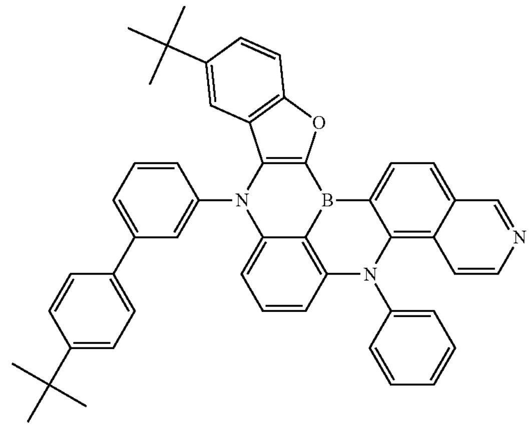
D-278
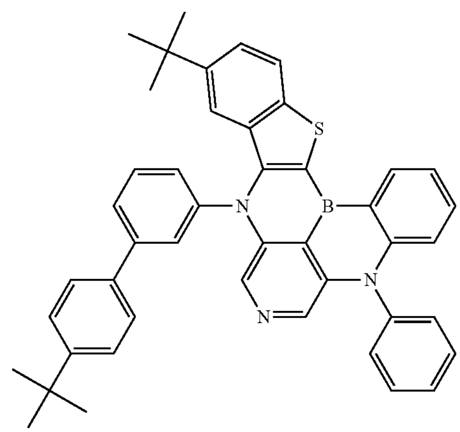
D-279
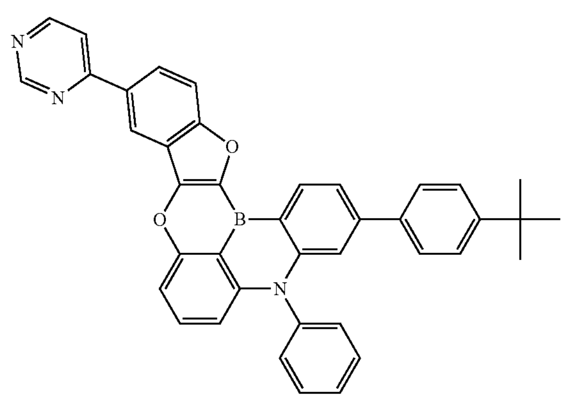

D-280
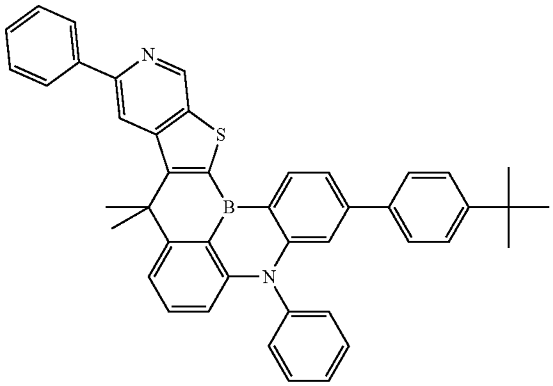
D-281
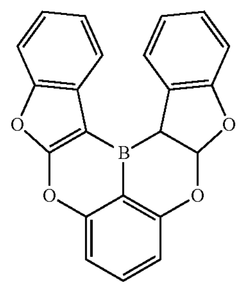
D-282
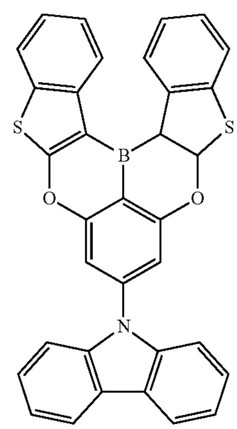
D-283
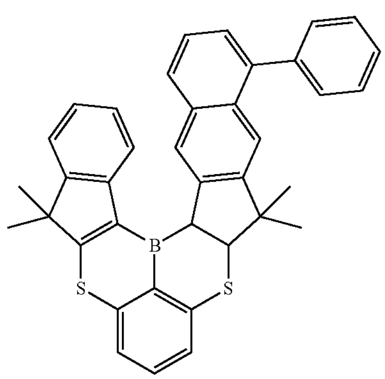
D-284
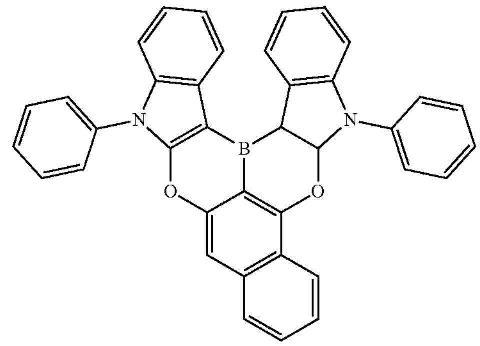
D-285
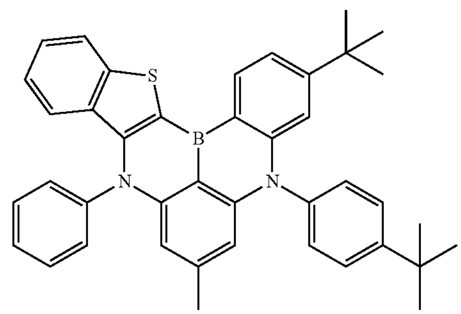
D-286
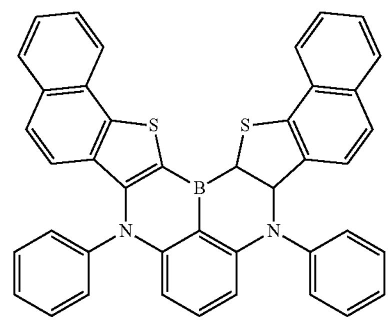
D-287
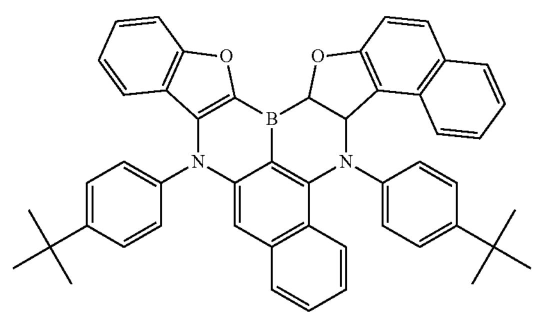
D-288
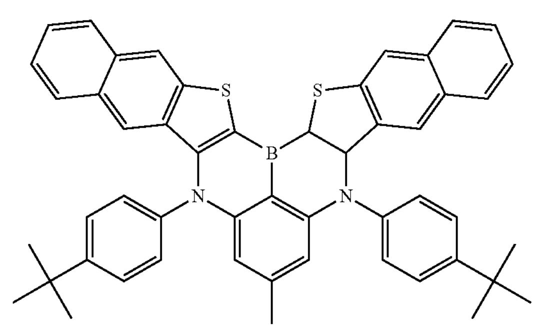

-continued
D-289
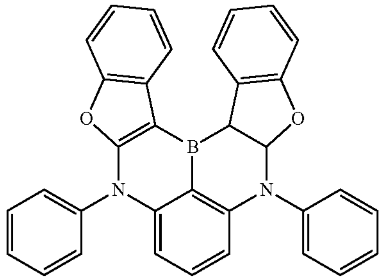
D-290
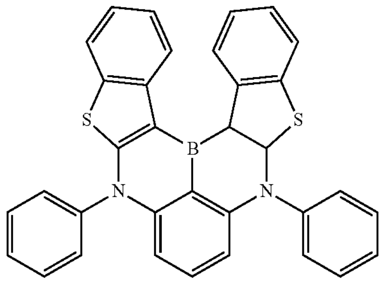
D-291
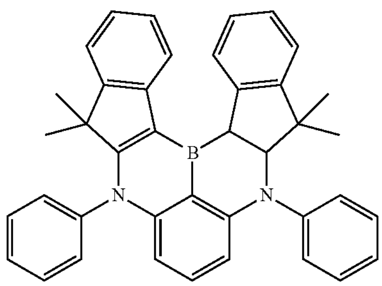
D-292
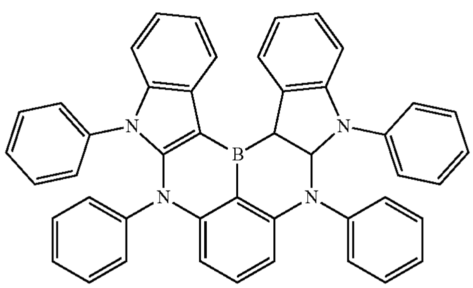
D-293
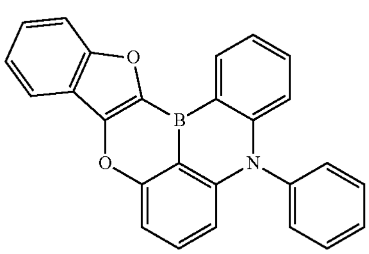
D-294
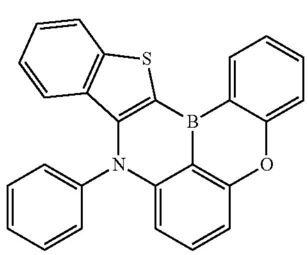
-continued
D-295
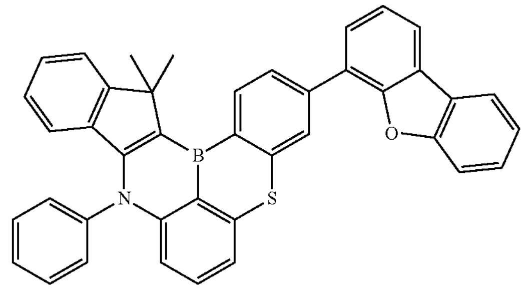
D-296
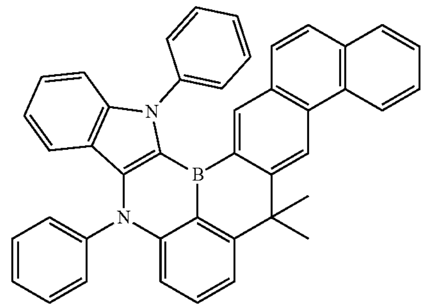
D-297
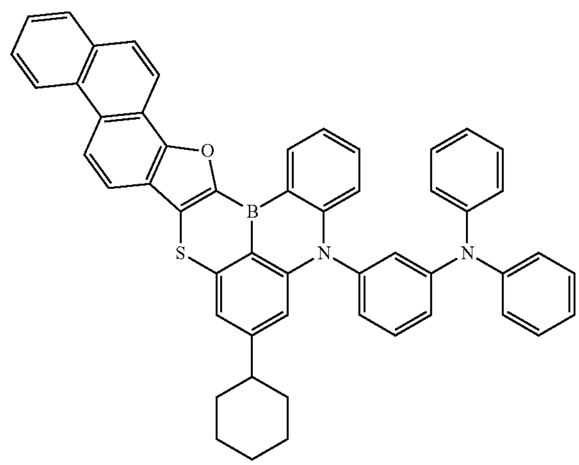
D-298
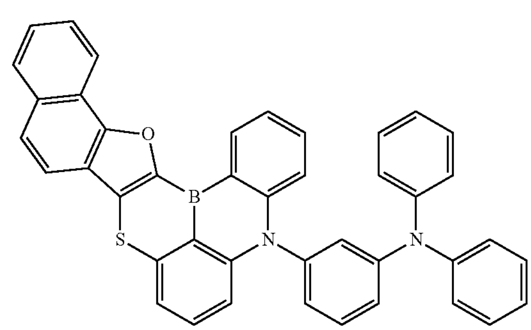

-continued
D-299
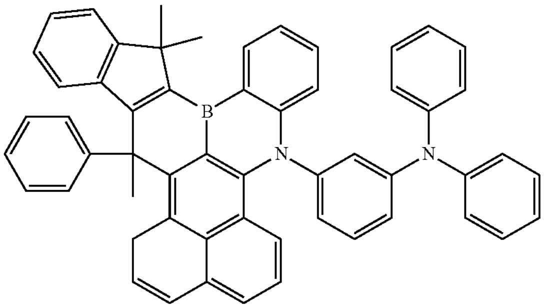
D-300
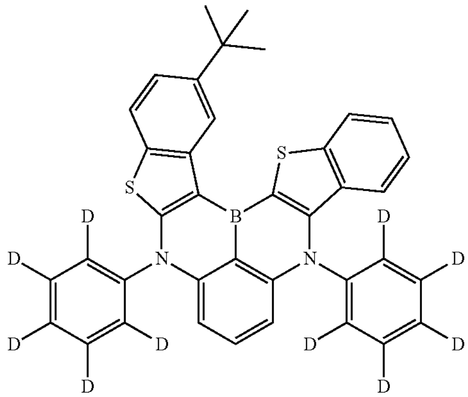
D-301
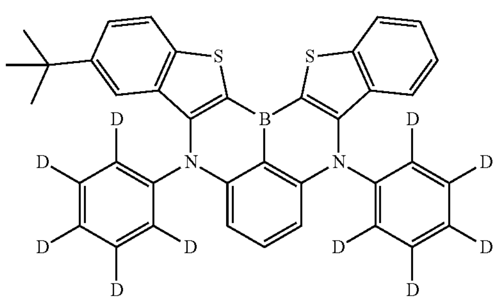
D-302
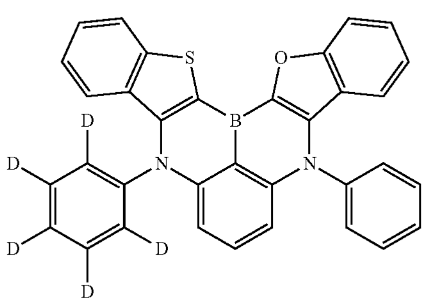
D-303
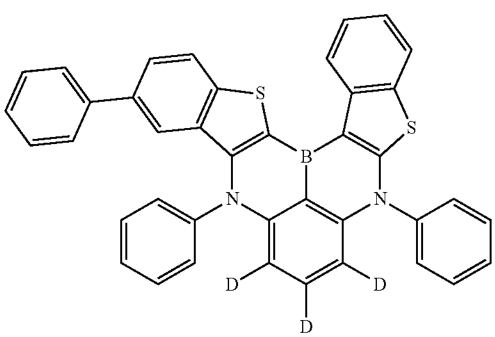
-continued
D-304
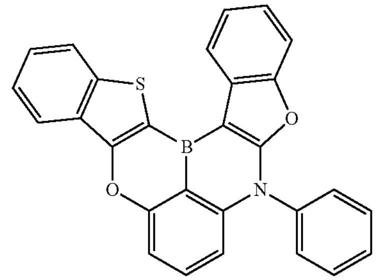
D-305
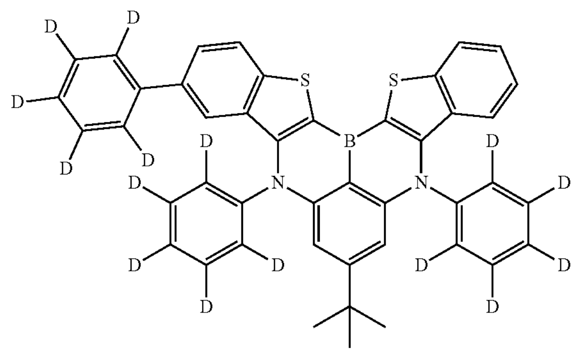
D-306
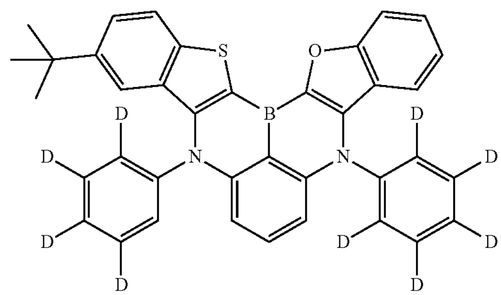
D-307
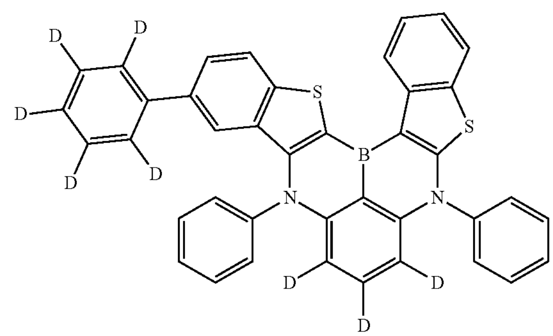
D-308
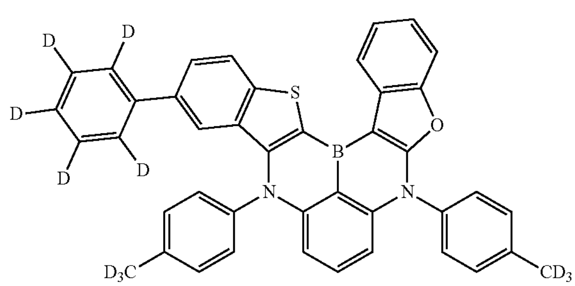

D-309
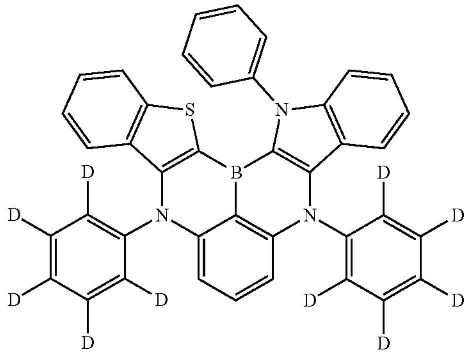
D-310
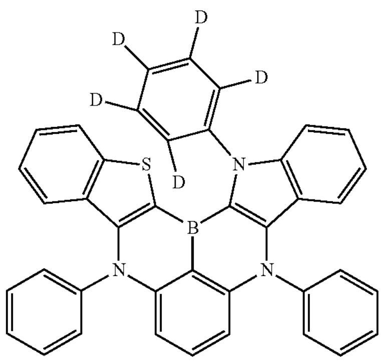
D-311
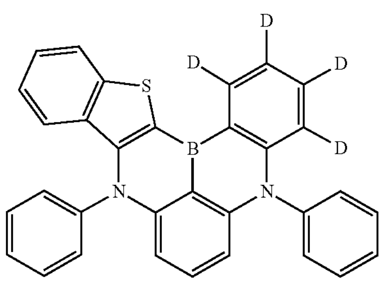
D-312
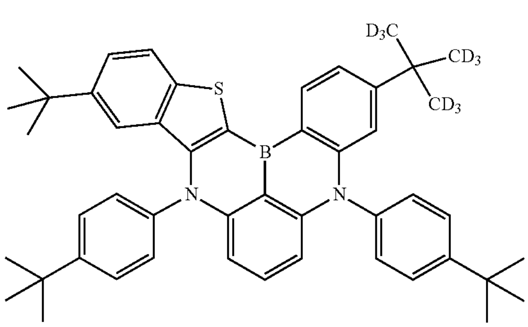
D-313
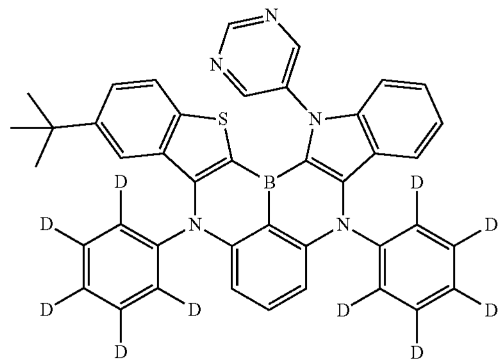
D-314
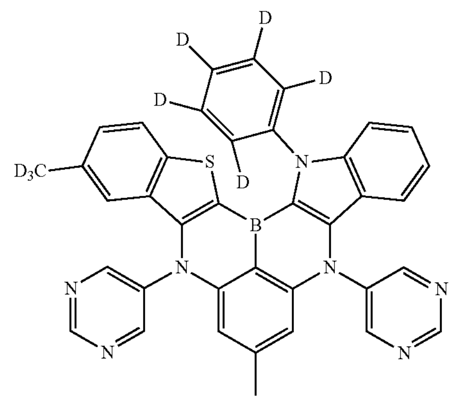
D-315
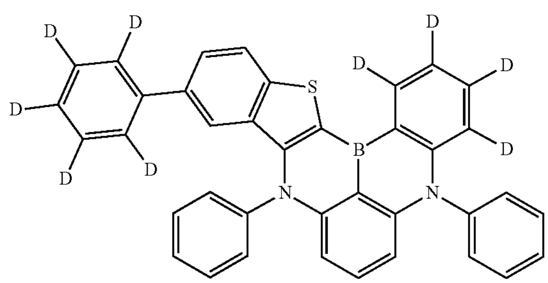
D-316
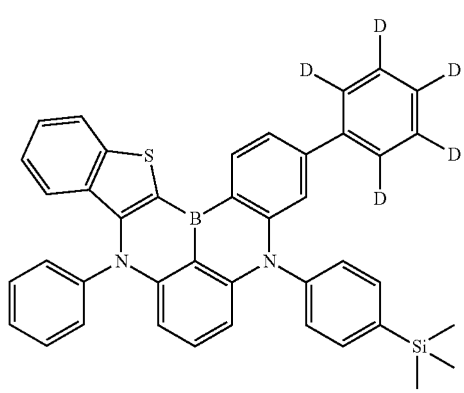

-continued
D-317
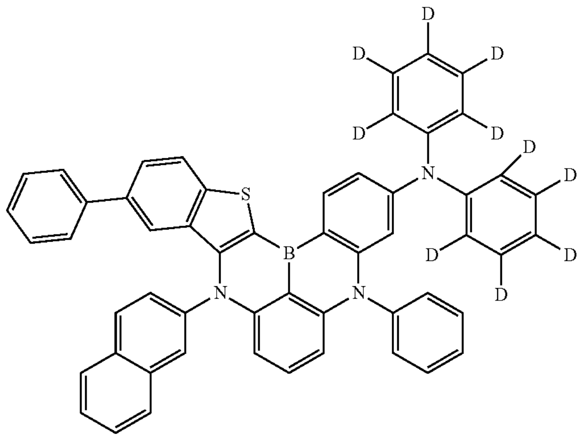
D-318
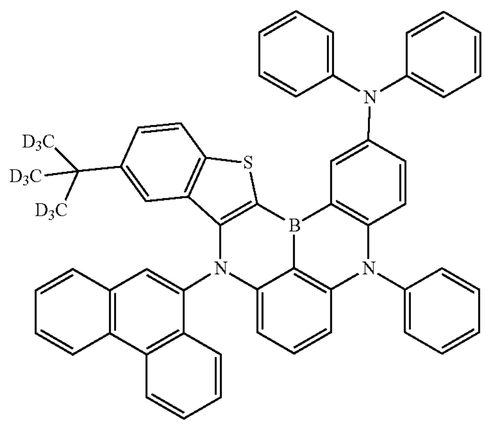
D-319
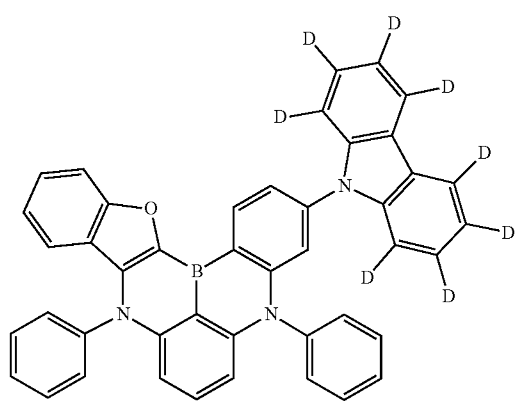
D-320
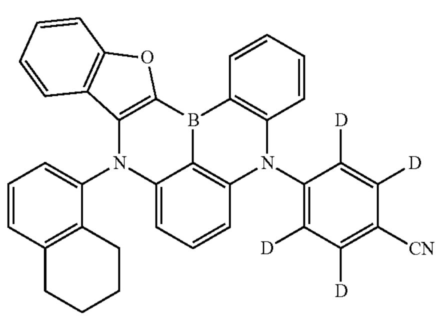
-continued
D-321
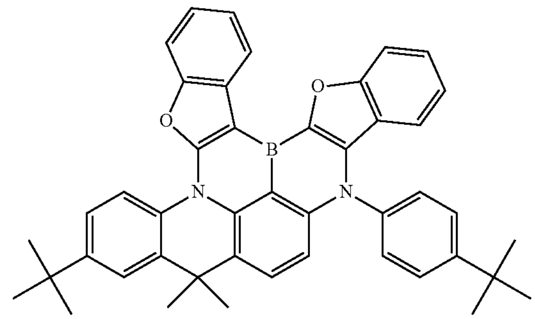
D-322
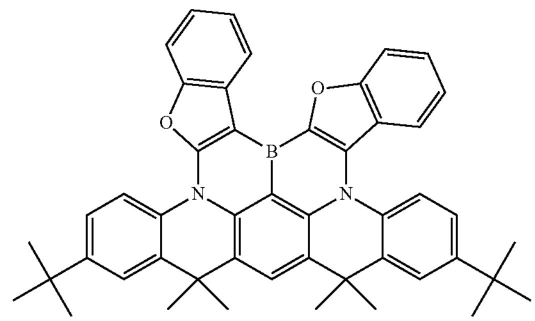
D-323
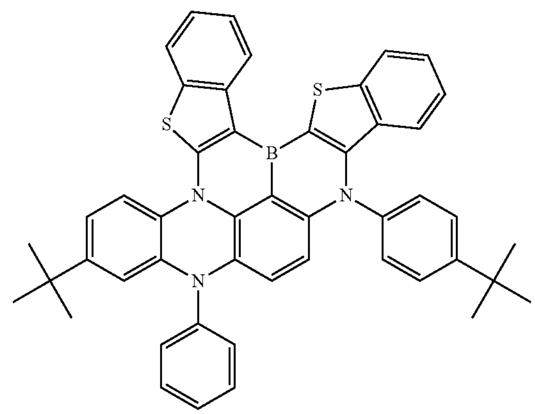
D-324
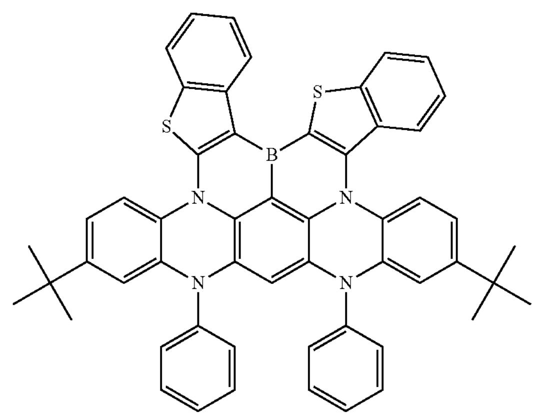

-continued
D-325
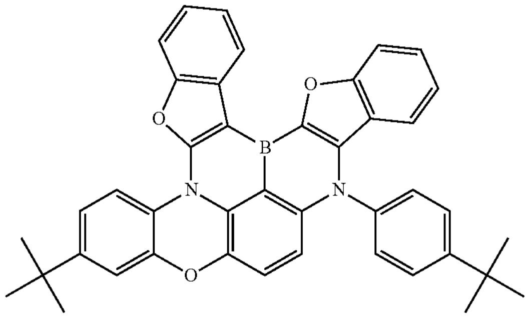
D-326
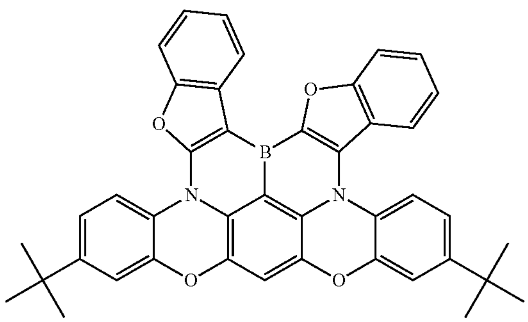
D-327
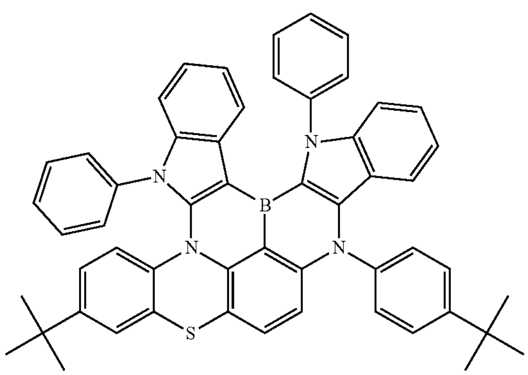
D-328
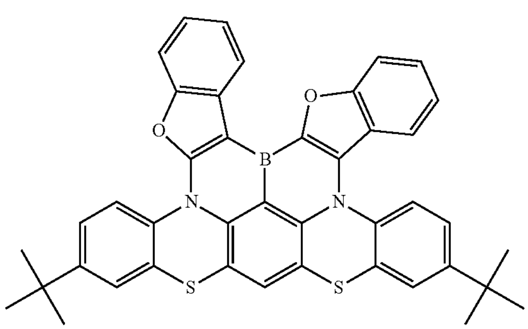
-continued
D-329
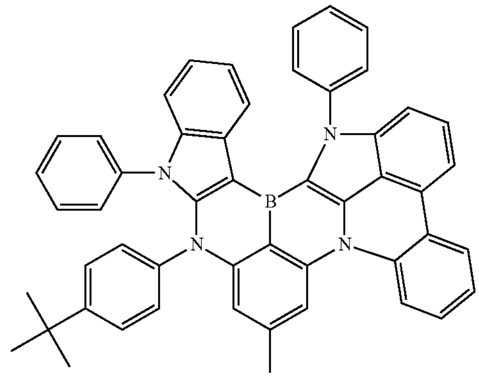
D-330
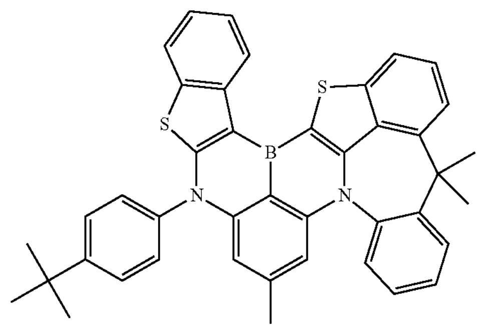
D-331
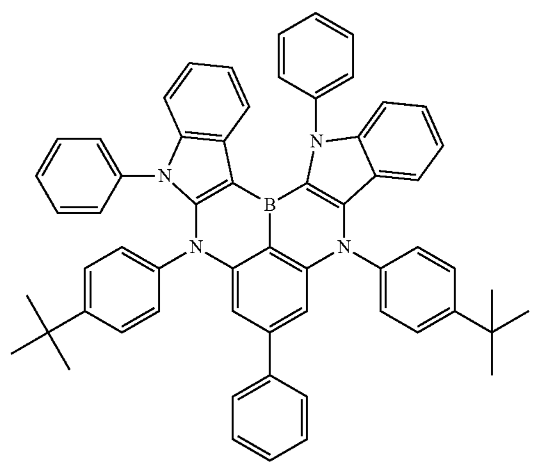
D-332
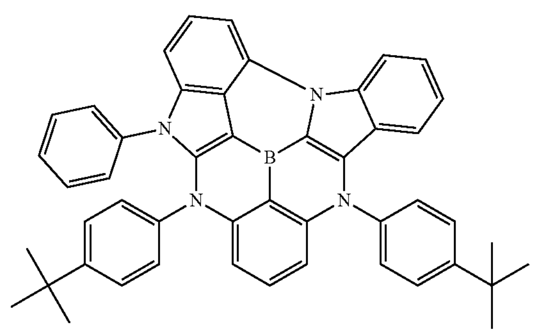

-continued
<Formula D-4 to Formula D-6>
D-401
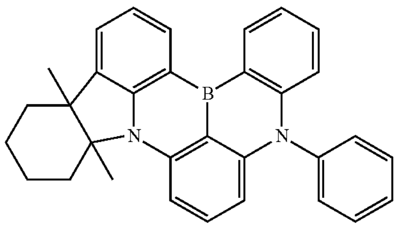
D-402
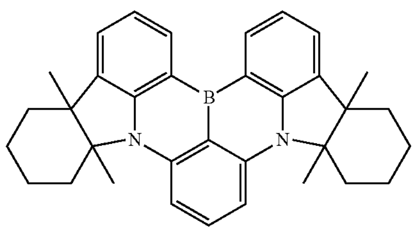
D-403
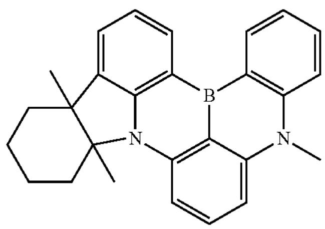
D-404
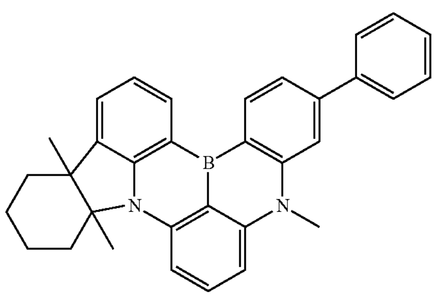
D-405
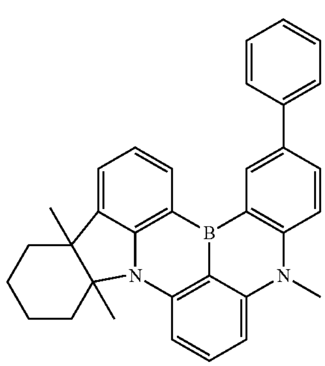
D-406
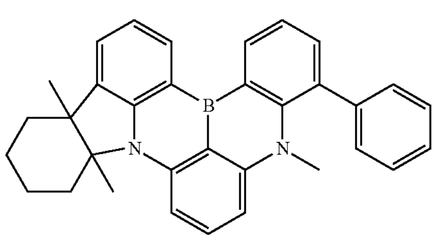
-continued
D-407
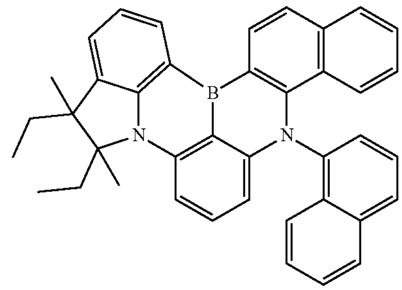
D-408
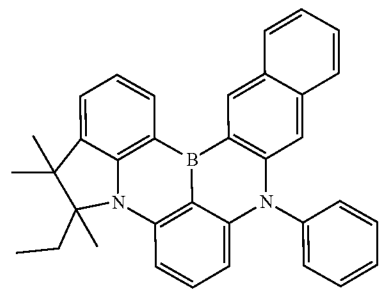
D-409
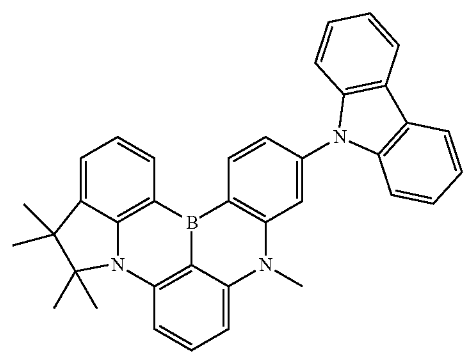
D-410
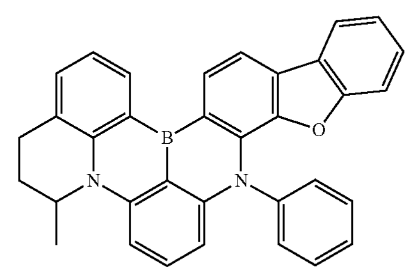
D-411
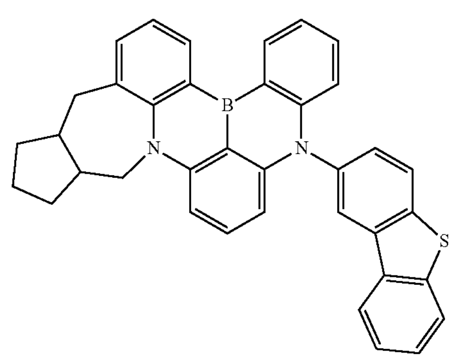

-continued
D-412
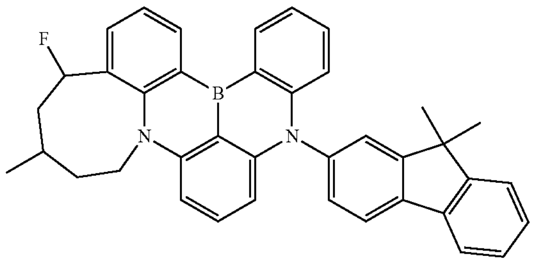
D-413
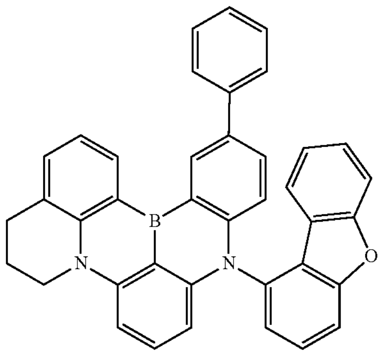
D-414
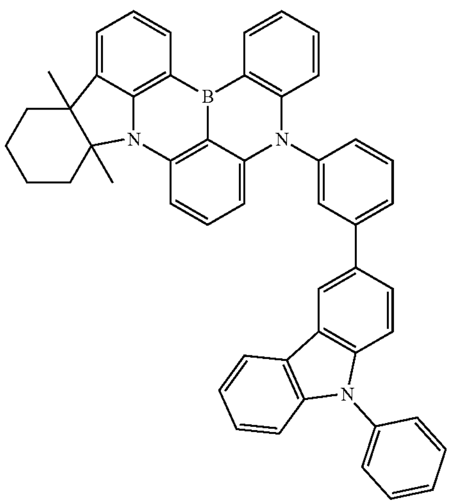
D-415
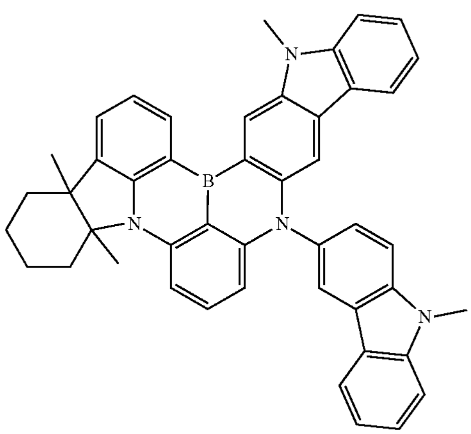
-continued
D-416
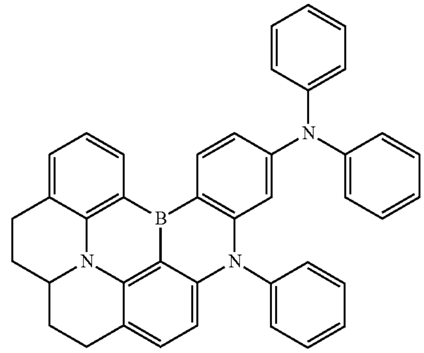
D-417
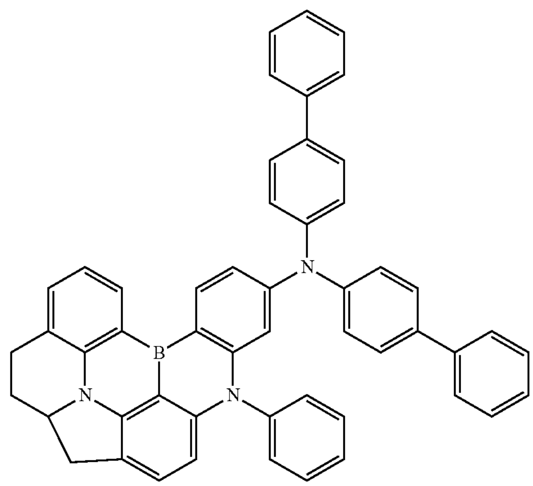
D-418
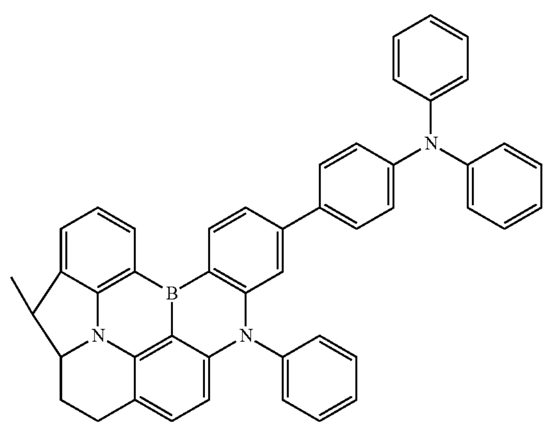

-continued
D-419
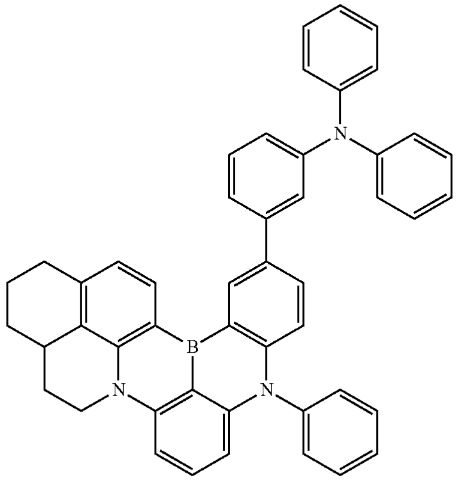
D-420
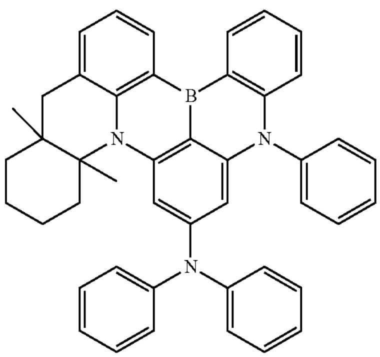
D-421
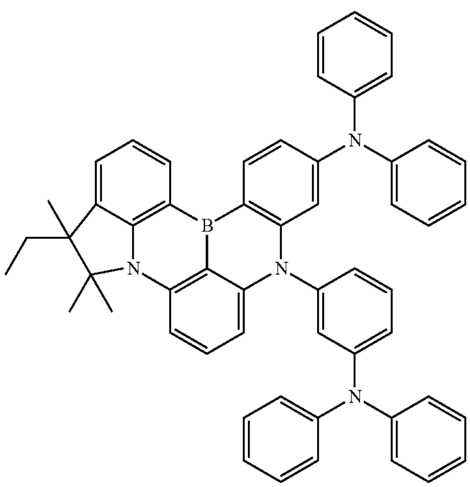
D-422
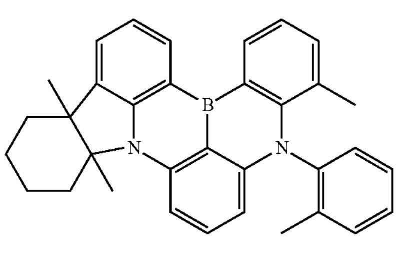
-continued
D-423
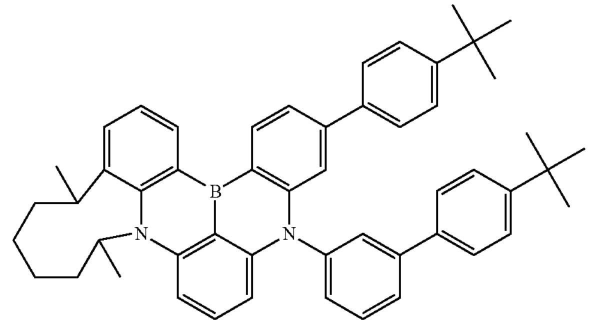
D-424
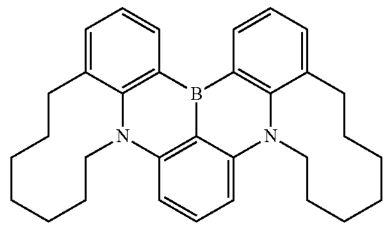
D-425
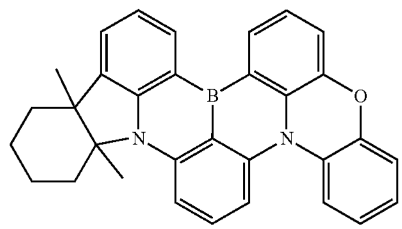
D-426
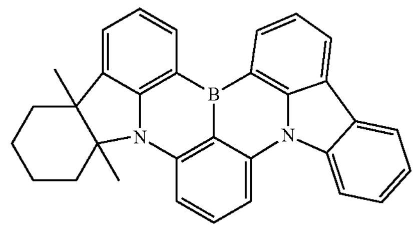
D-427
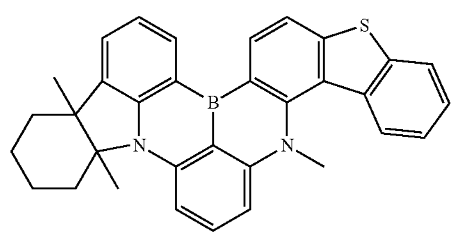
D-428
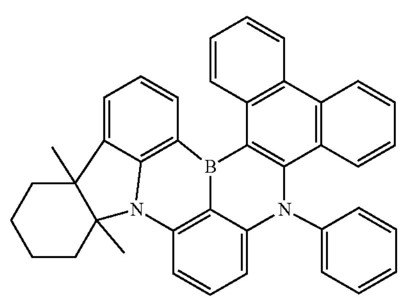

-continued
D-429
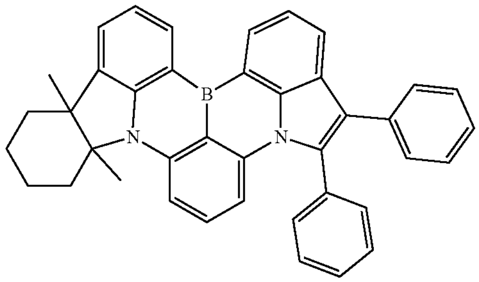
D-430
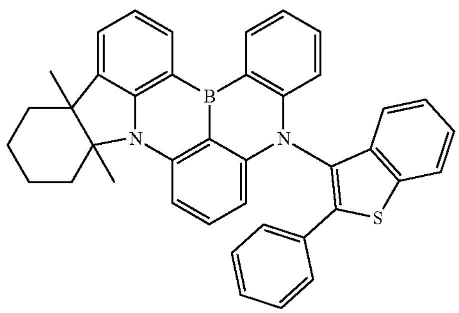
D-431
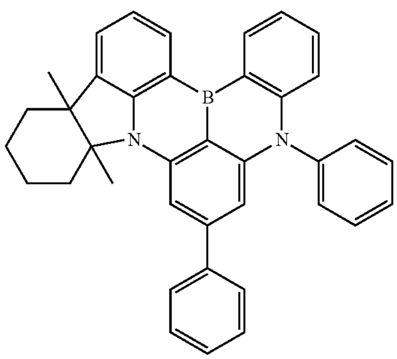
D-432
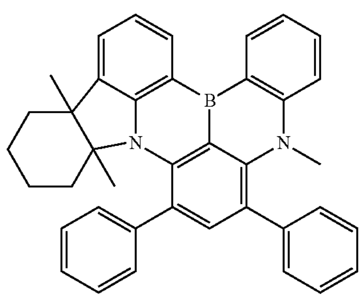
D-433
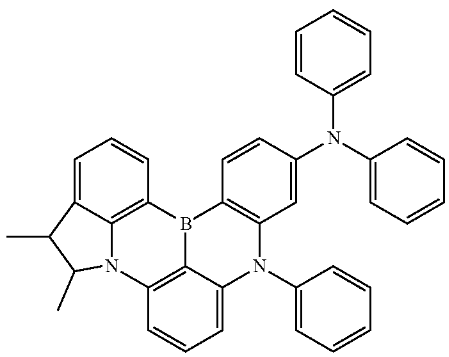
-continued
D-434
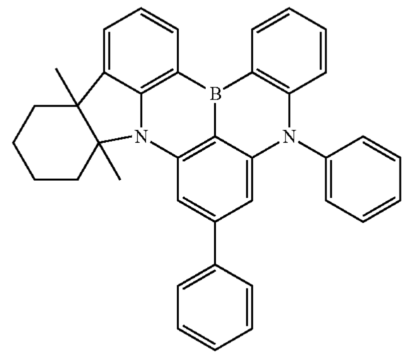
D-435
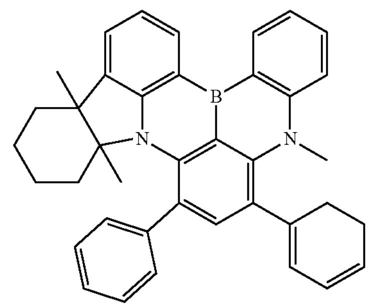
D-436
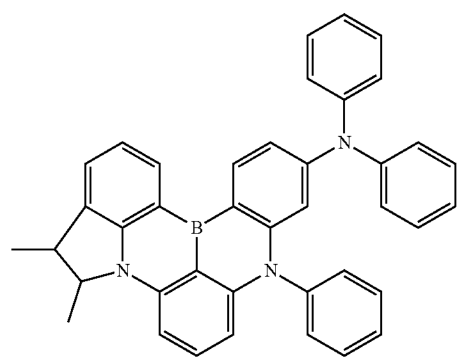
D-437
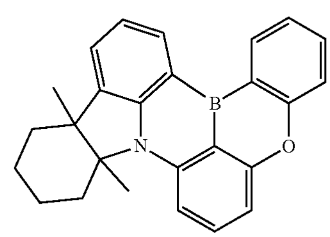
D-438
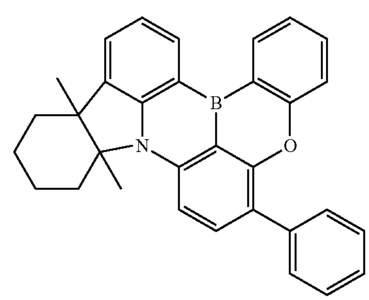

-continued
D-439
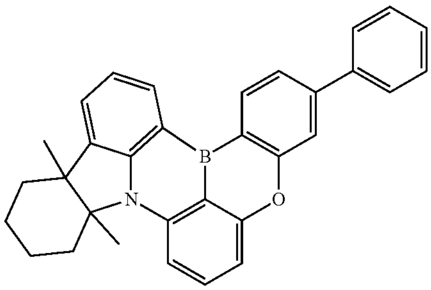
D-440
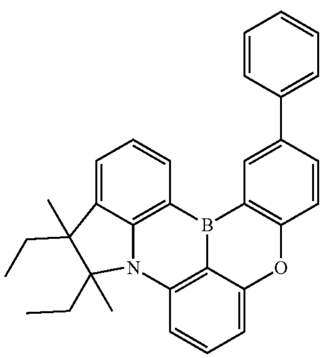
D-441
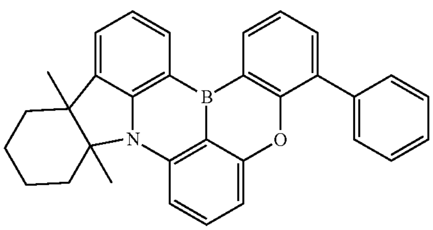
D-442
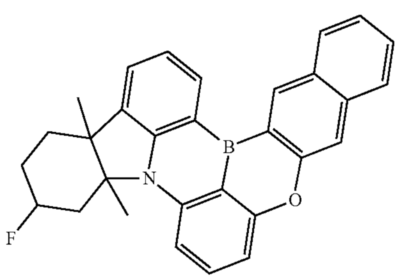
D-443
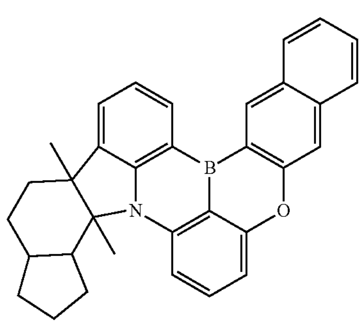
-continued
D-444
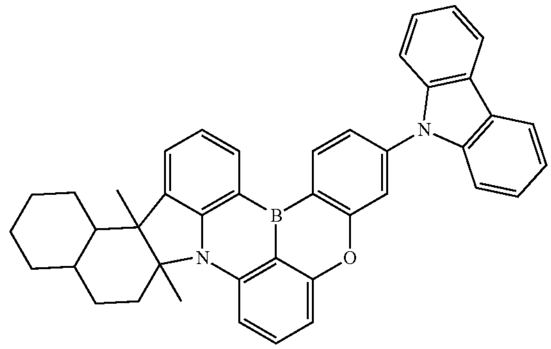
D-445
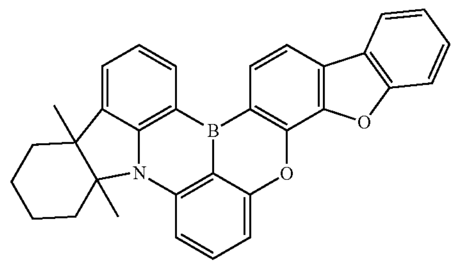
D-446
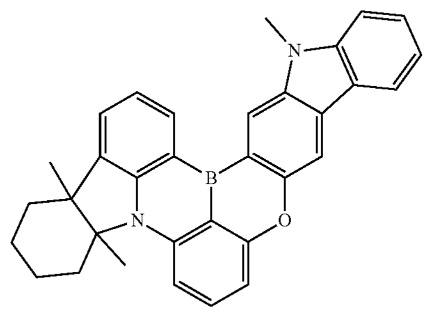
D-447
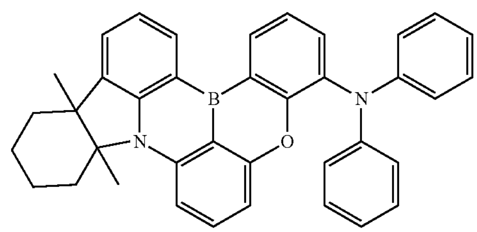
D-448
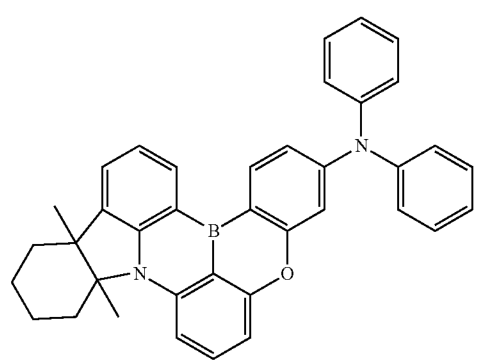

-continued
D-449
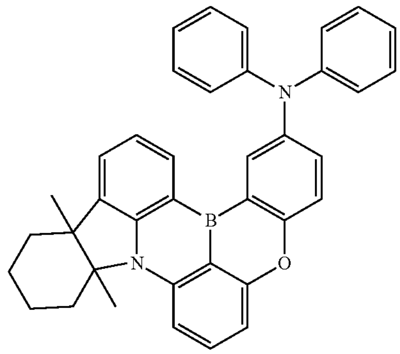
D-450
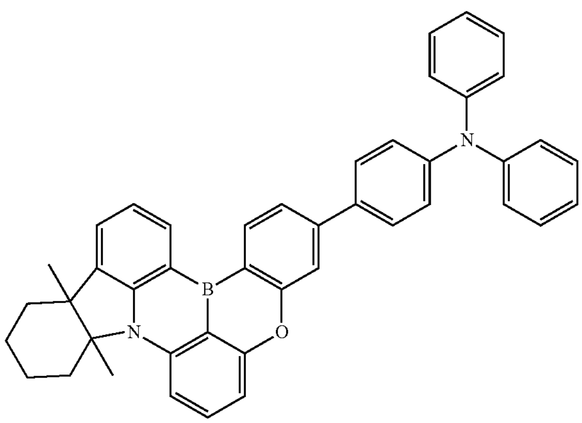
D-451
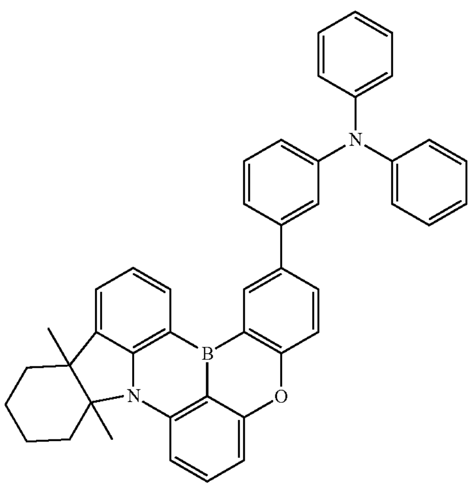
D-452
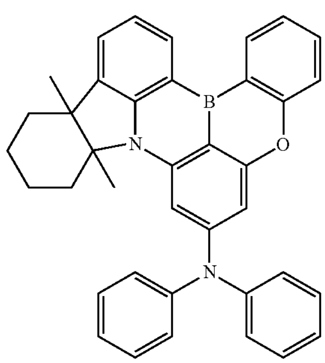
-continued
D-453
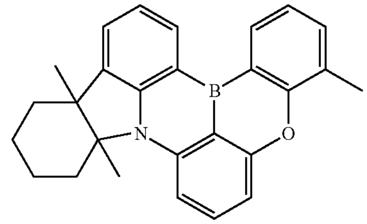
D-454
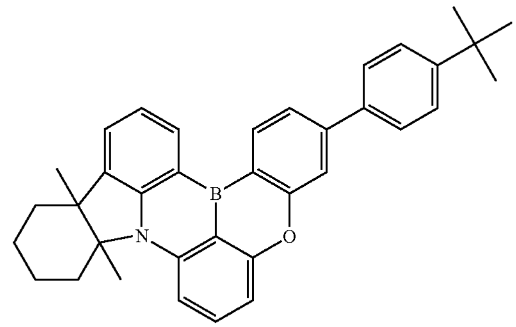
D-455
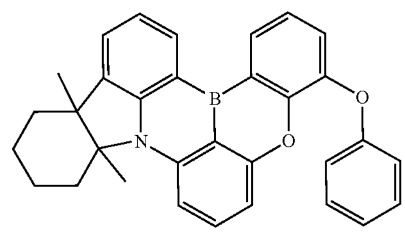
D-456
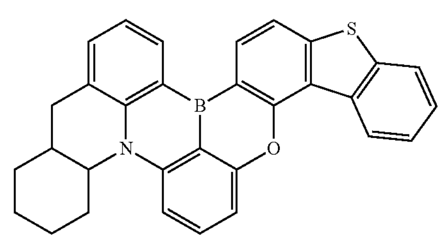
D-457
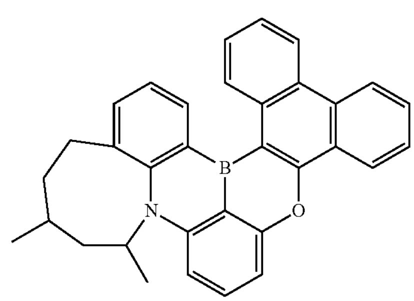

-continued
D-458
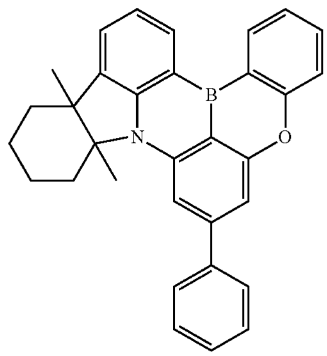
D-459
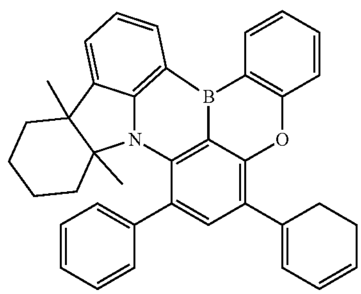
D-460
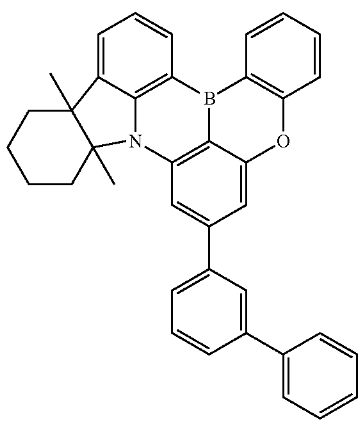
D-461
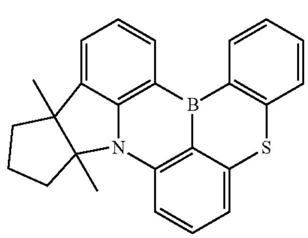
D-462
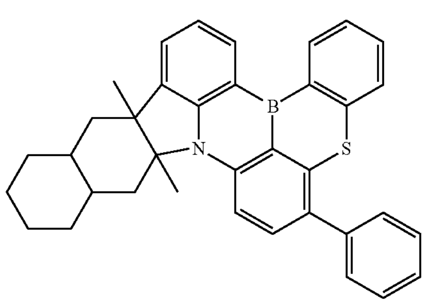
-continued
D-463
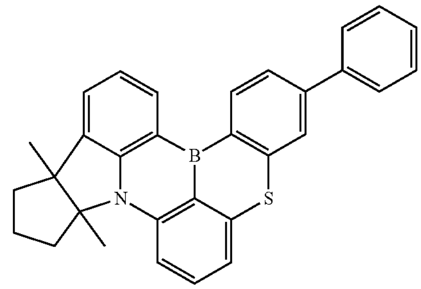
D-464
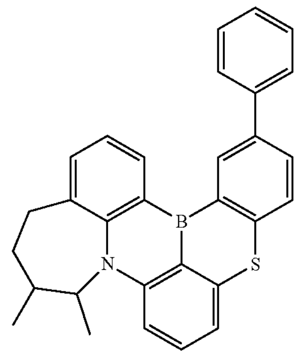
D-465
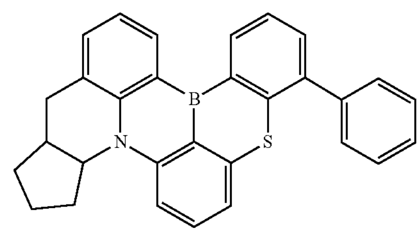
D-466
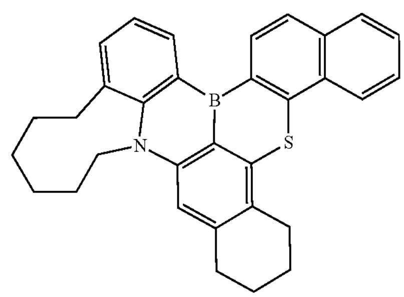
D-467
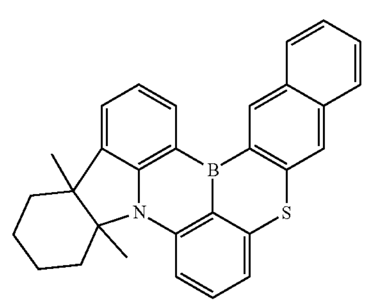

-continued
D-468
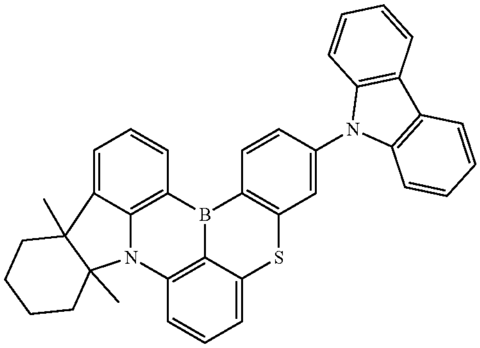
D-469
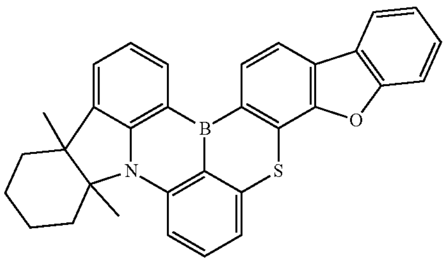
D-470
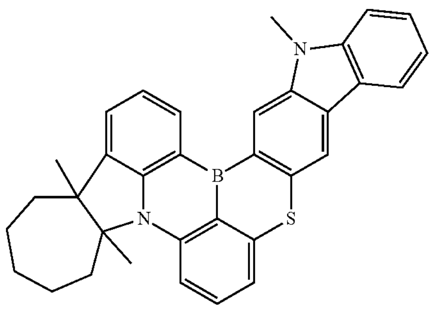
D-471
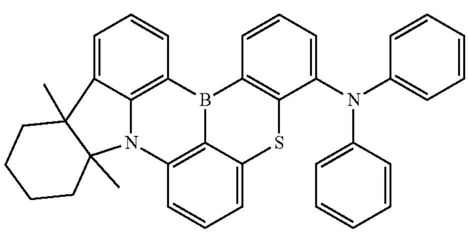
D-472
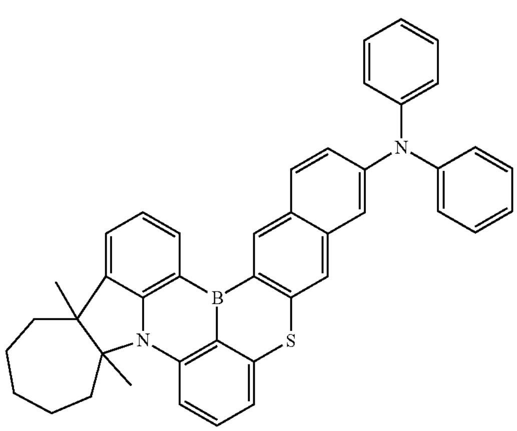
-continued
D-473
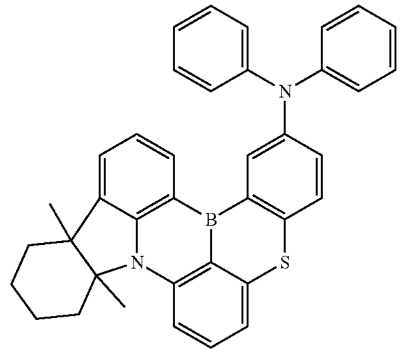
D-474
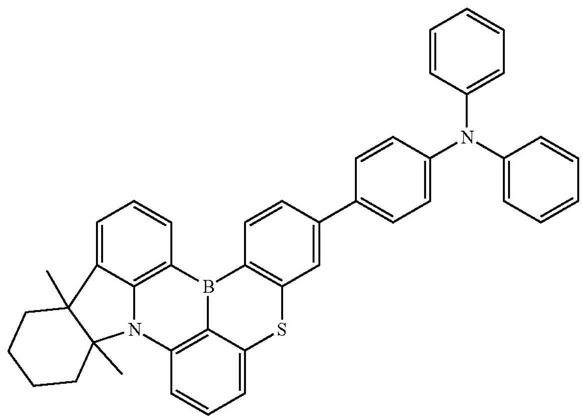
D-475
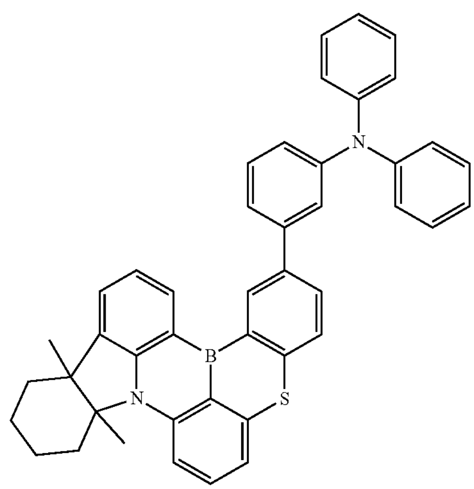
D-476
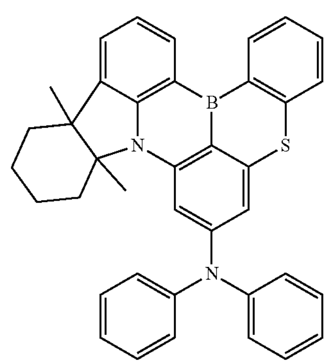

-continued
D-477
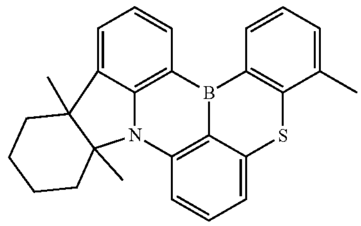
D-478
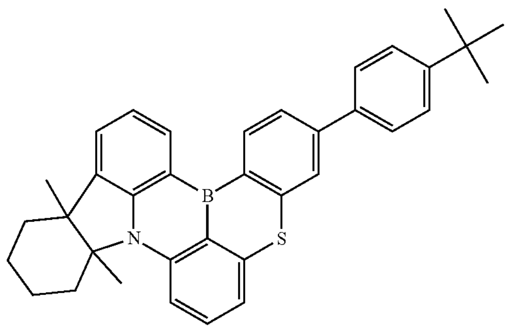
D-479
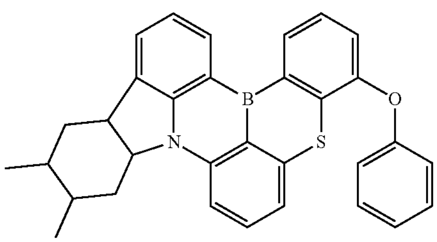
D-480
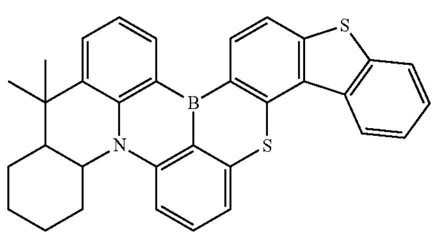
D-481
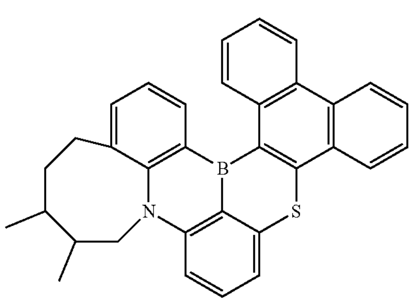
-continued
D-482
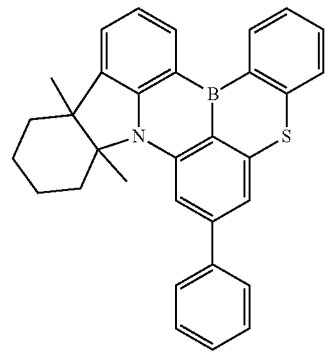
D-483
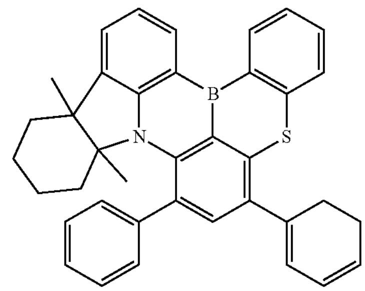
D-484
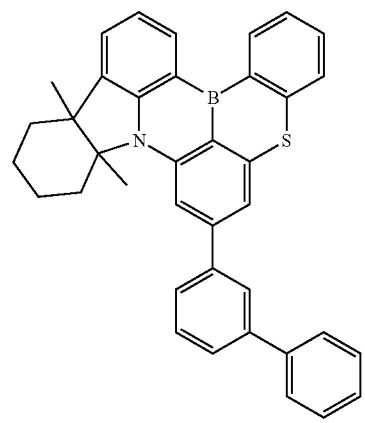
D-485
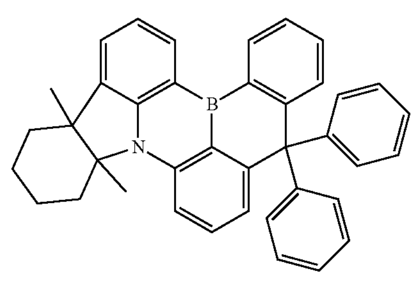
D-486
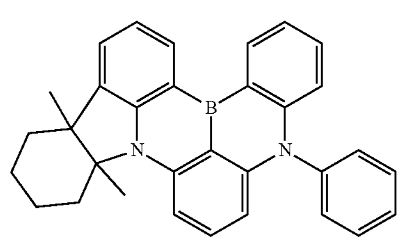

-continued
D-487
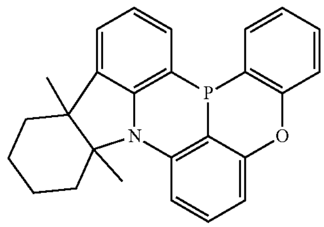
D-488
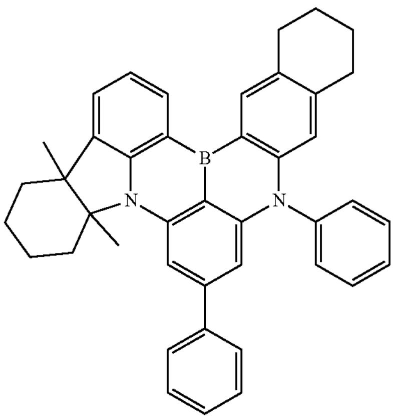
D-489
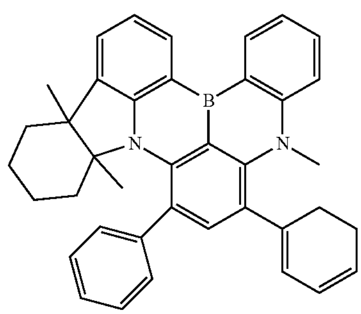
D-490
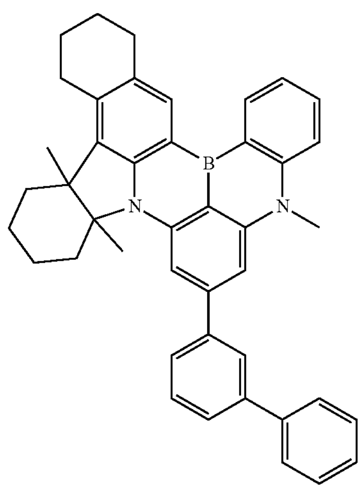
-continued
D-491
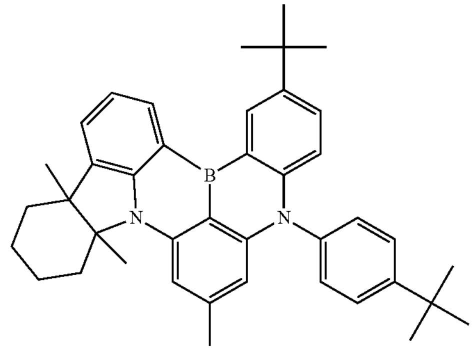
D-492
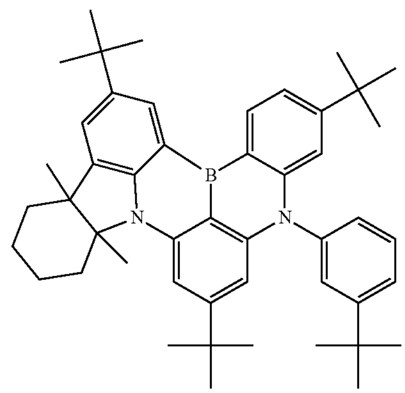
D-493
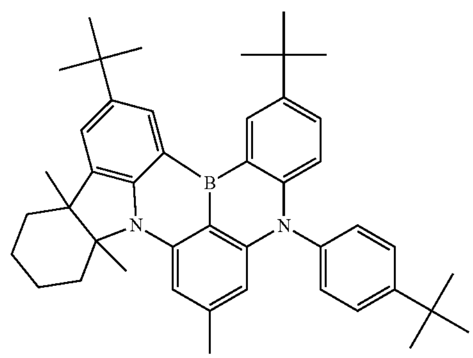
D-494
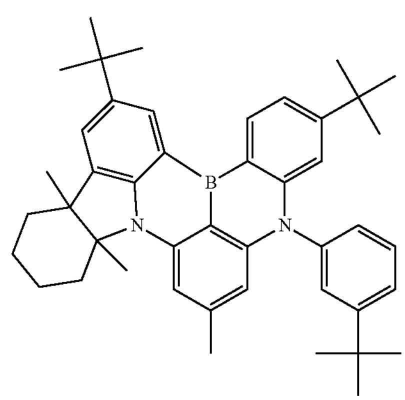

-continued
D-495
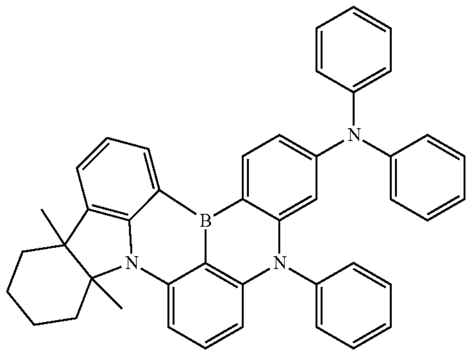
D-496
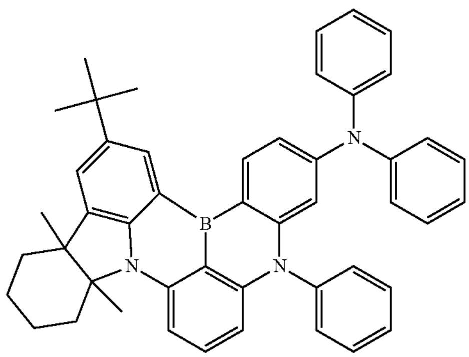
D-497
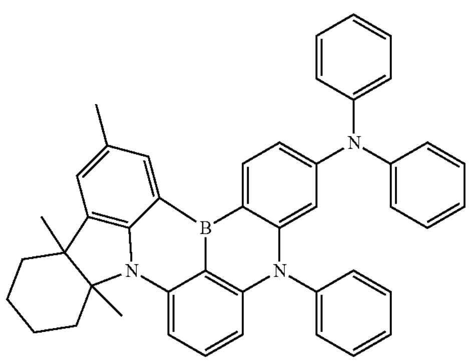
D-498
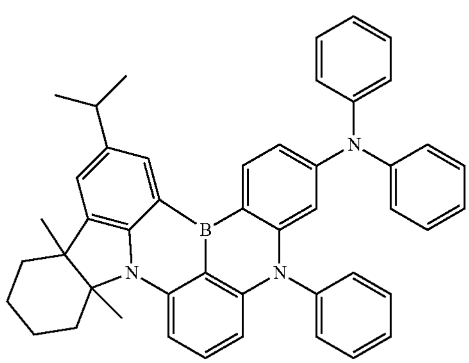
-continued
D-499
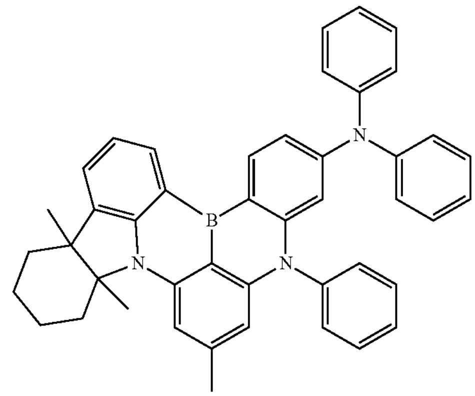
D-500
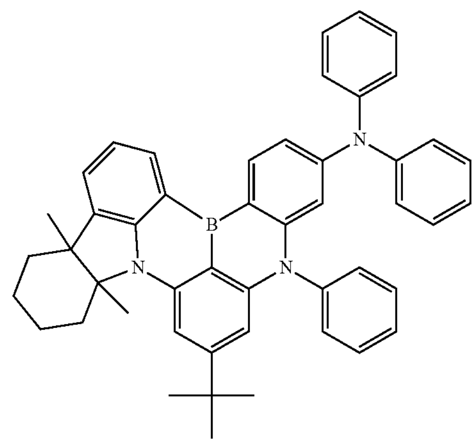
D-501
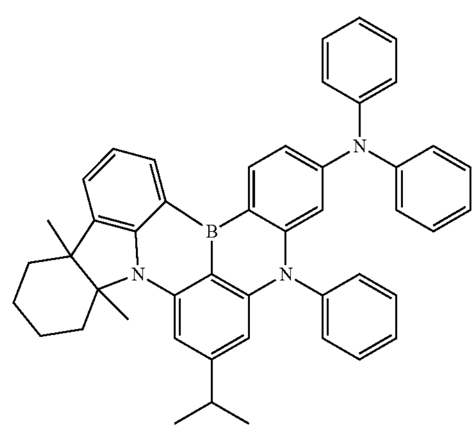

-continued
D-502
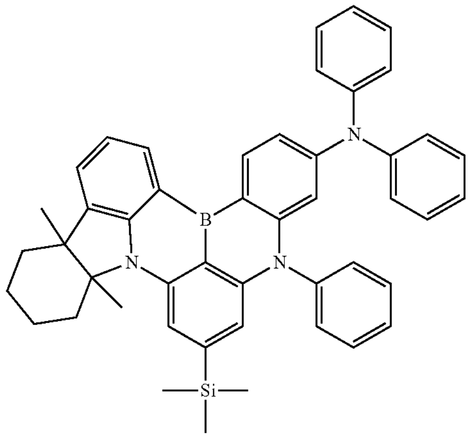
D-503
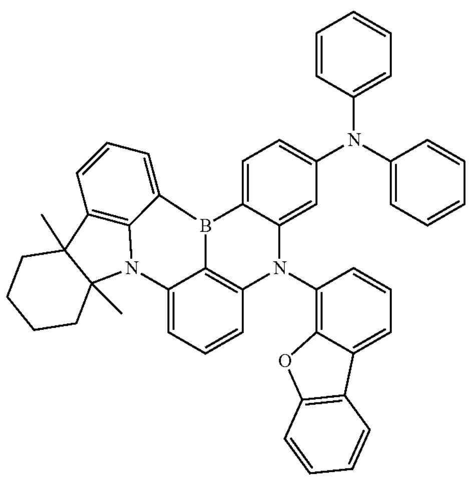
D-504
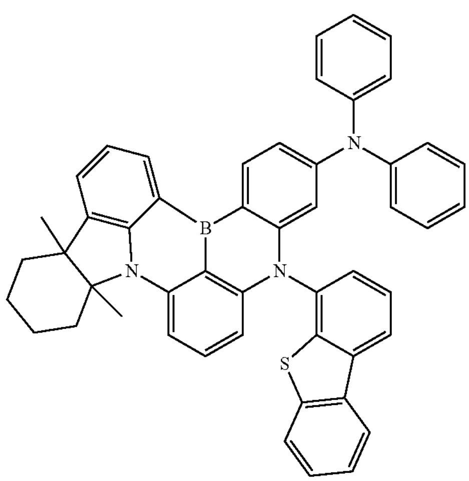
-continued
D-505
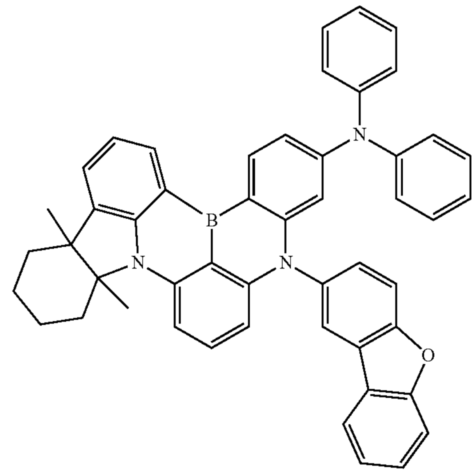
D-506
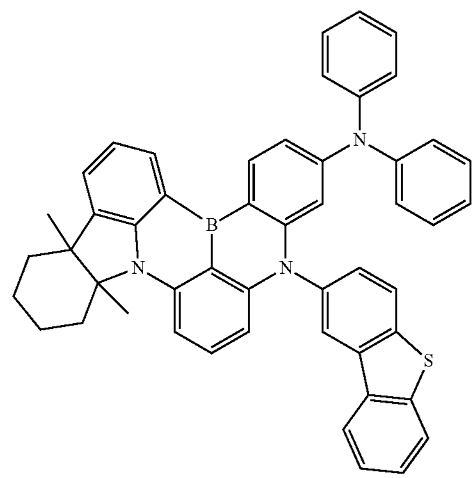
D-507
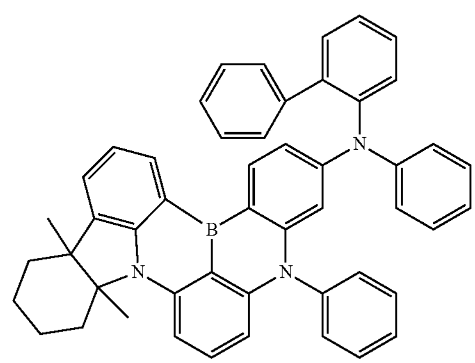

-continued
D-508
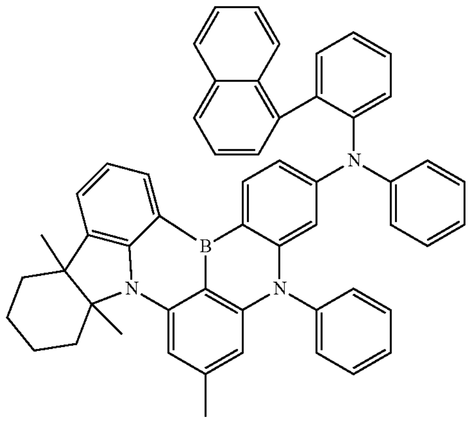
D-509
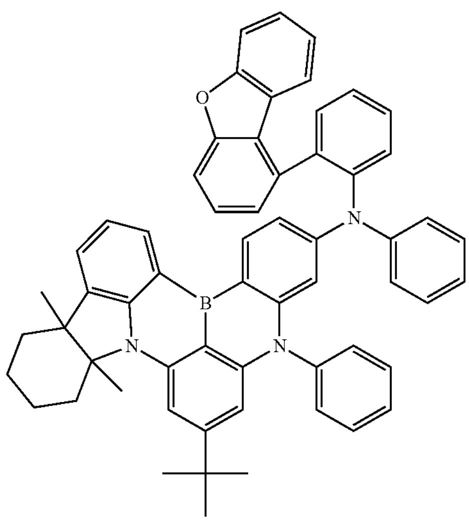
D-510
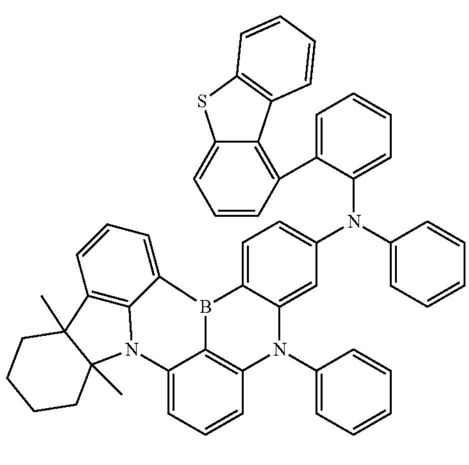
-continued
D-511
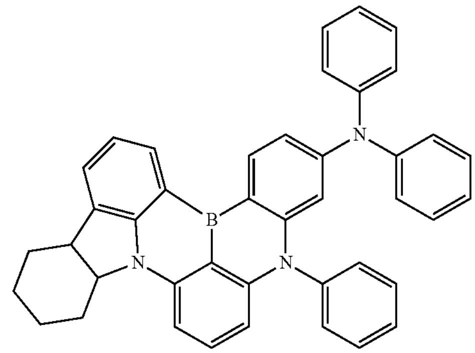
D-512
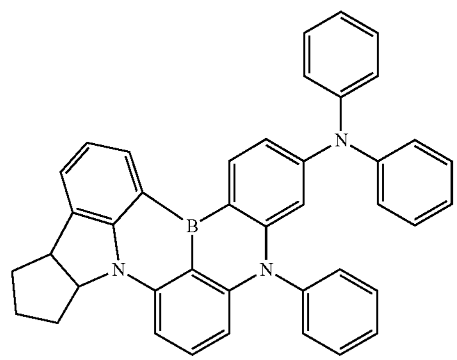
D-513
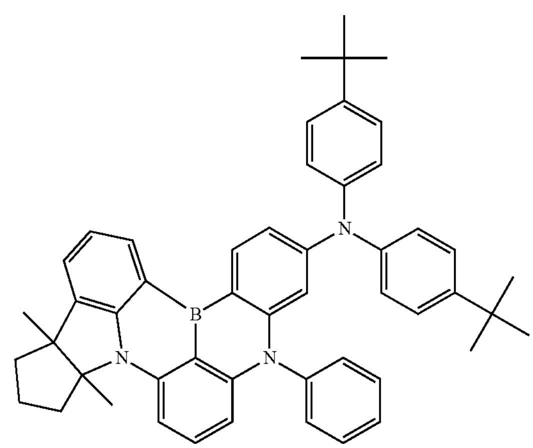

-continued
D-514
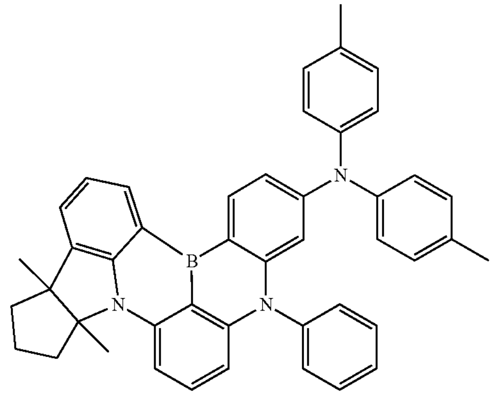
D-515
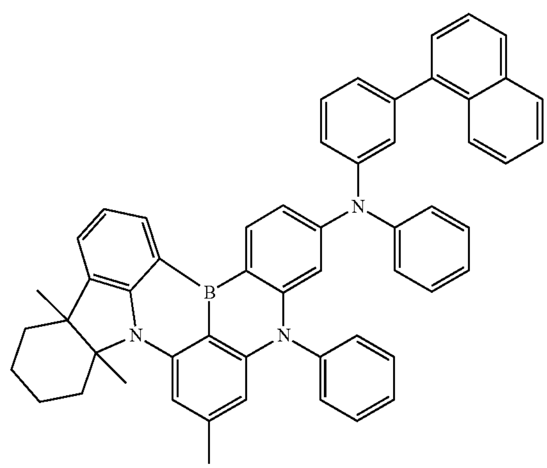
D-516
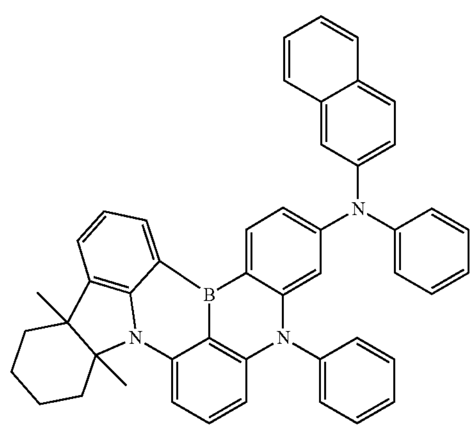
-continued
D-517
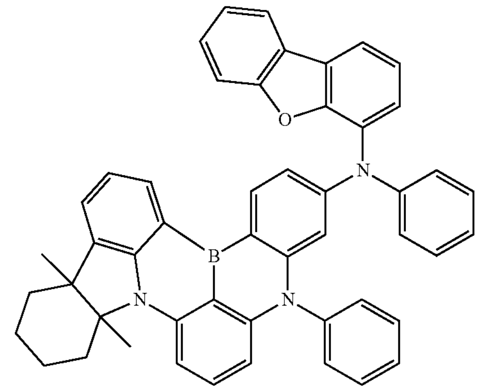
D-518
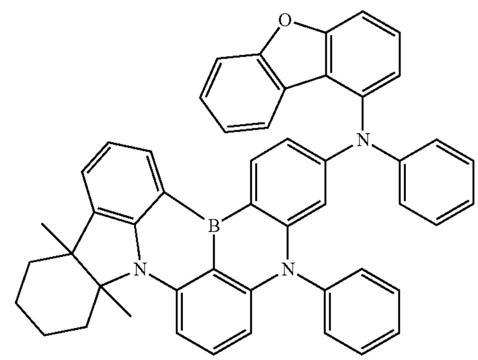
D-519
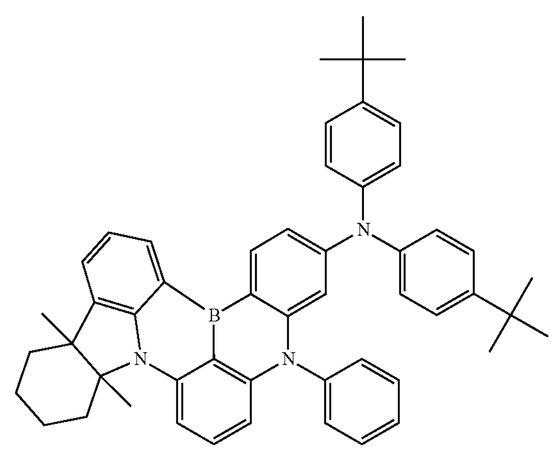

-continued
D-520
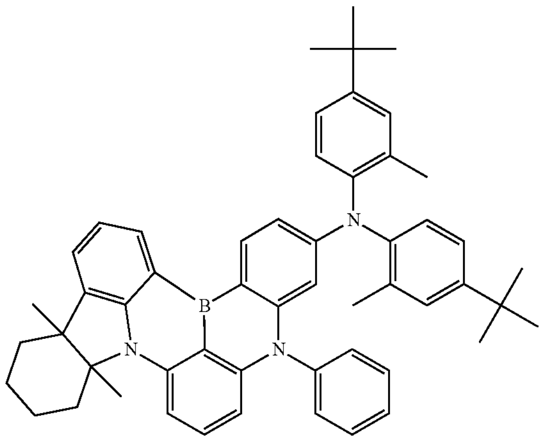
D-521
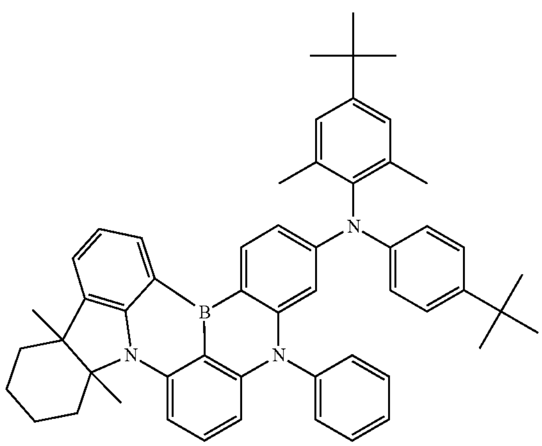
D-522
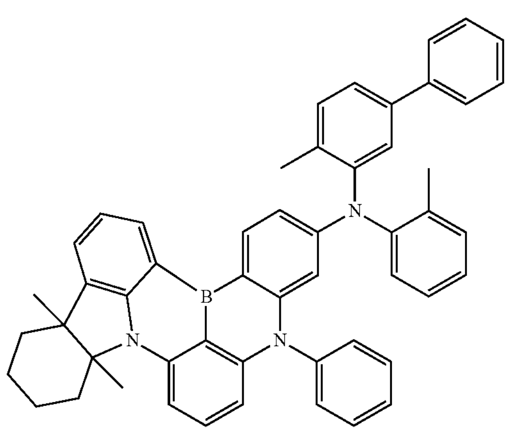
-continued
D-523
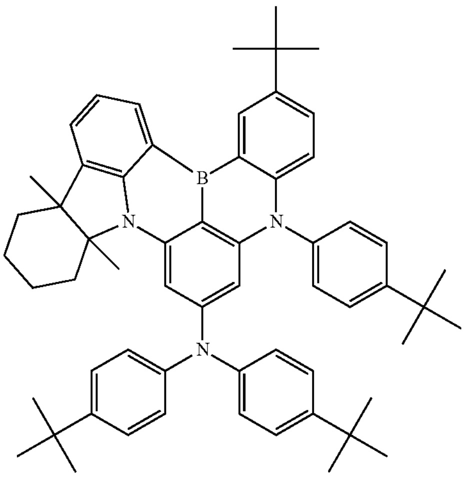
D-524
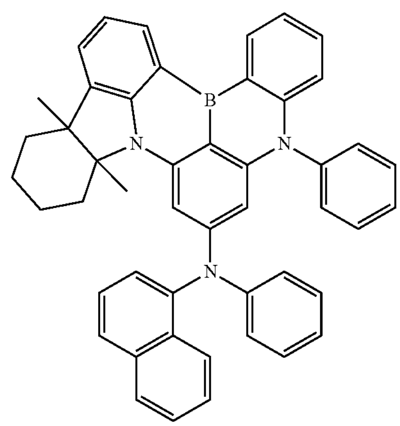
D-525
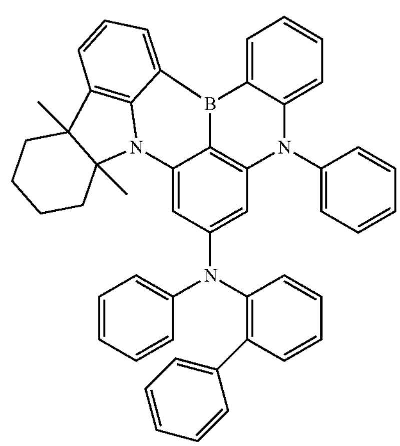

-continued
D-526
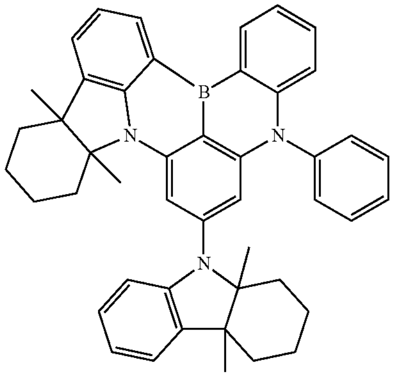
D-527
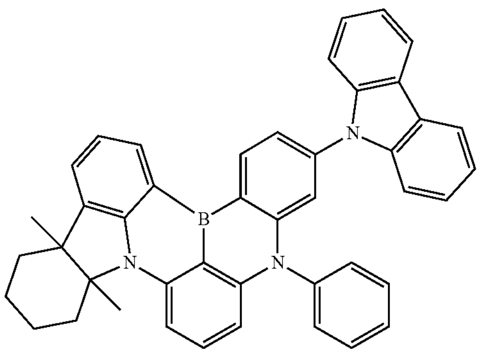
D-528
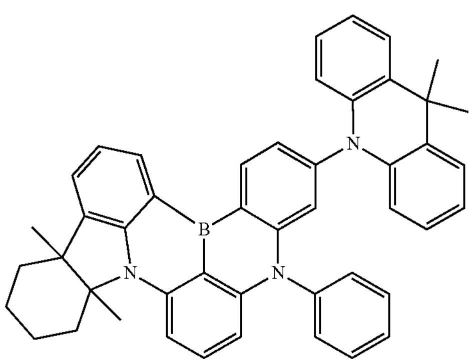
D-529
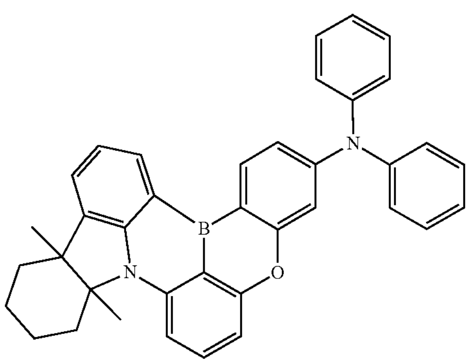
-continued
D-530
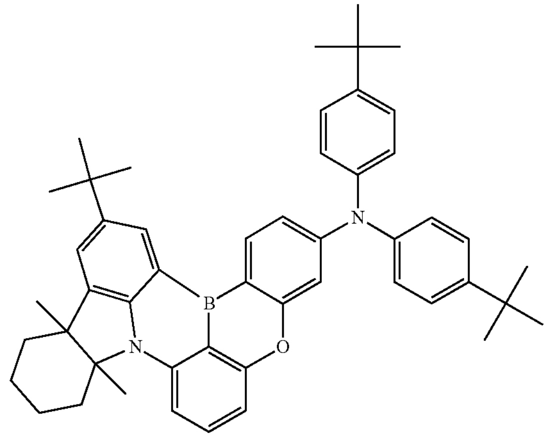
D-531
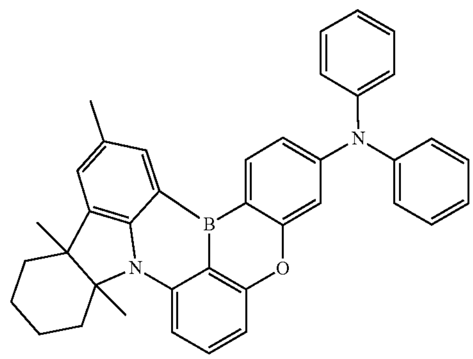
D-532
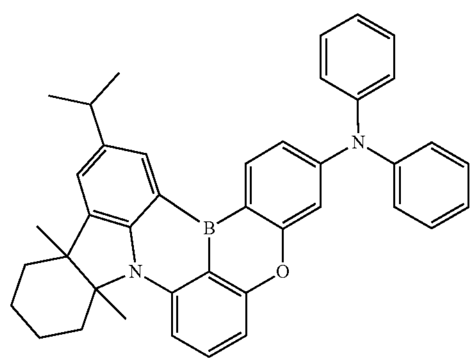
D-533
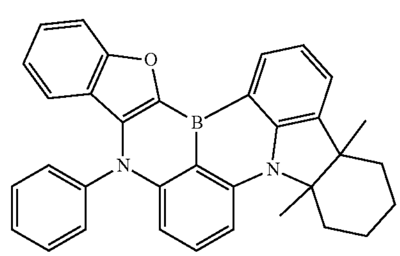

-continued
D-534
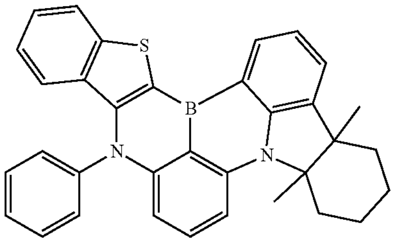
D-535
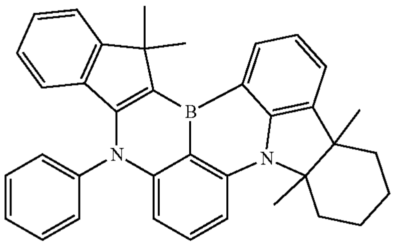
D-536
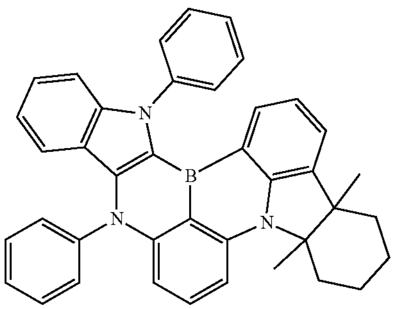
<Formula D-7 to Formula D-8>
D-601
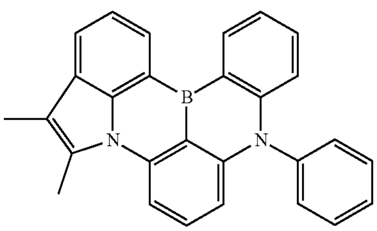
D-602
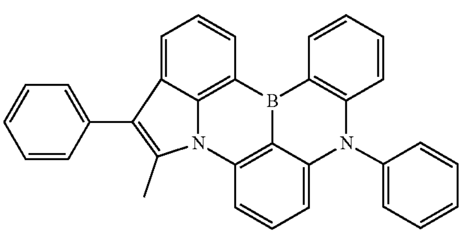
D-603
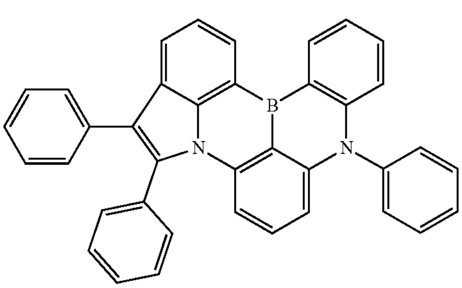
-continued
D-604
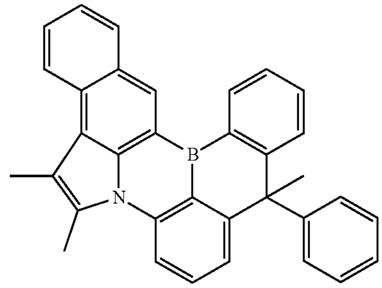
D-605
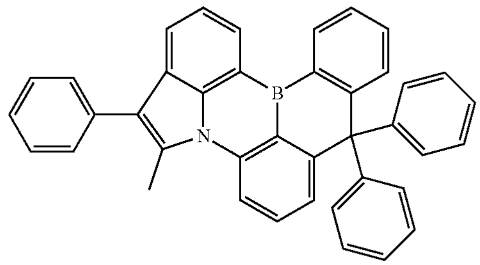
D-606
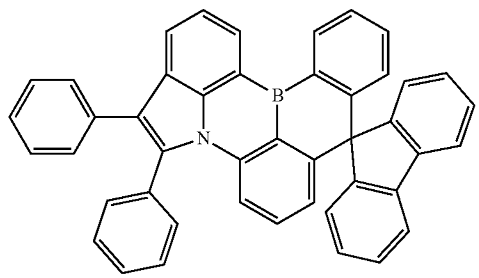
D-607
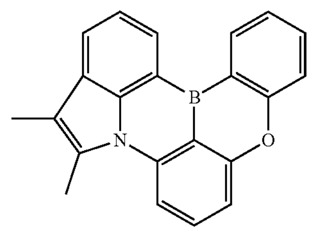
D-608
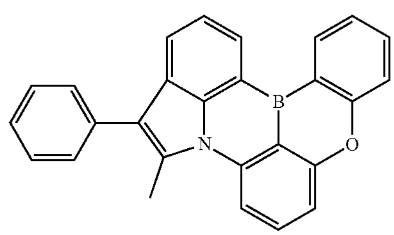
D-609
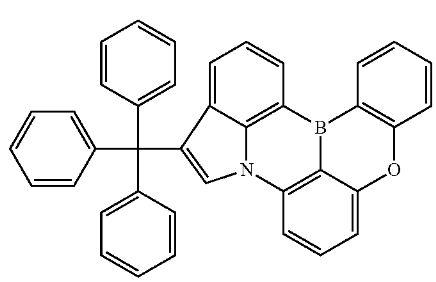

D-610
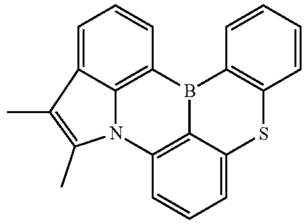
D-611
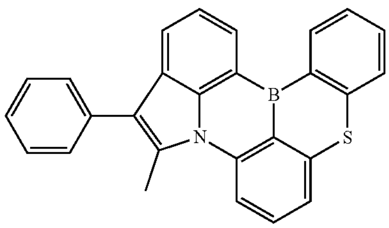
D-612
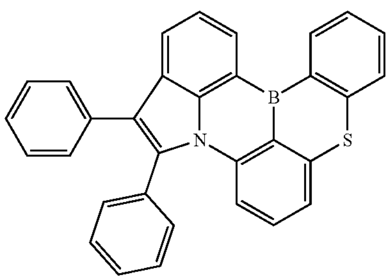
D-613
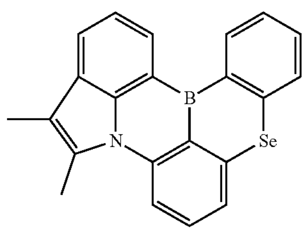
D-614
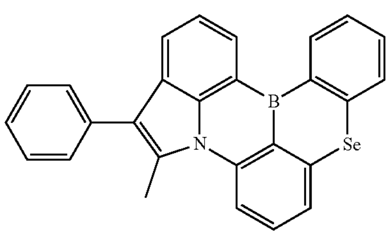
D-615
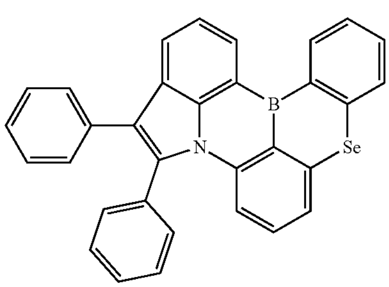
D-616
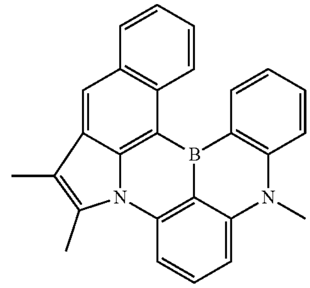
D-617
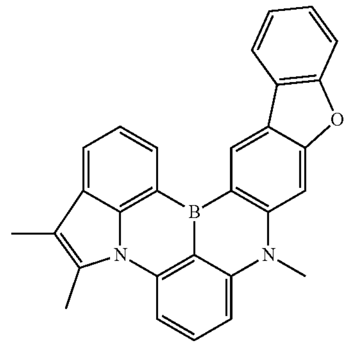
D-618
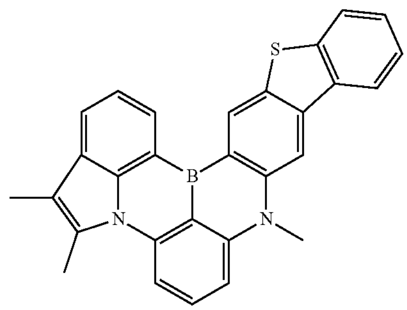
D-619
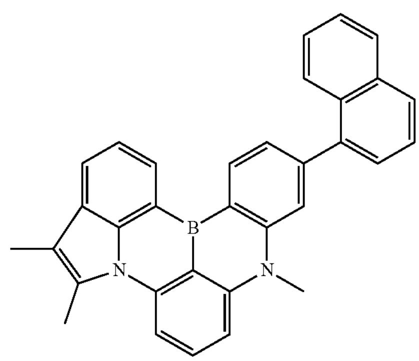
D-620
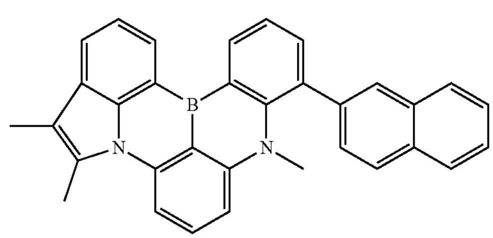

-continued
D-621
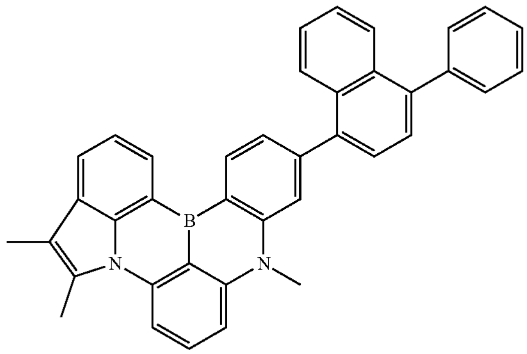
D-622
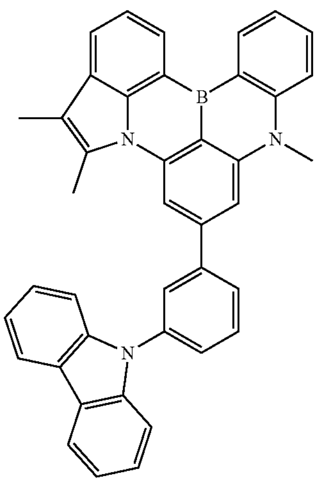
D-623
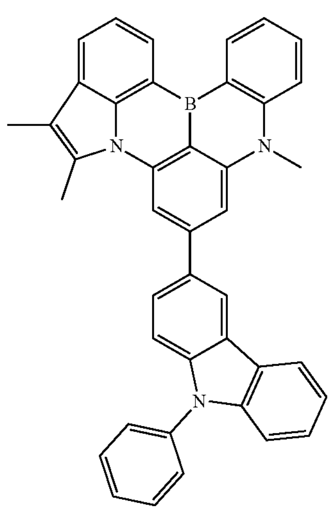
-continued
D-624
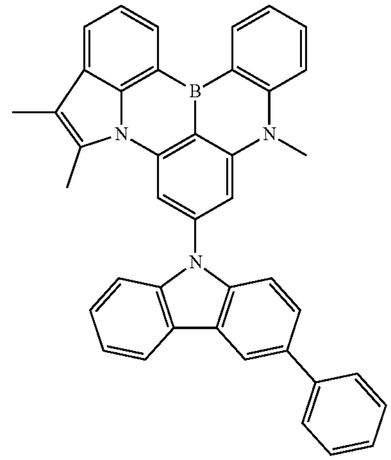
D-625
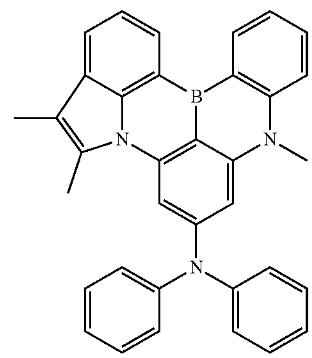
D-626
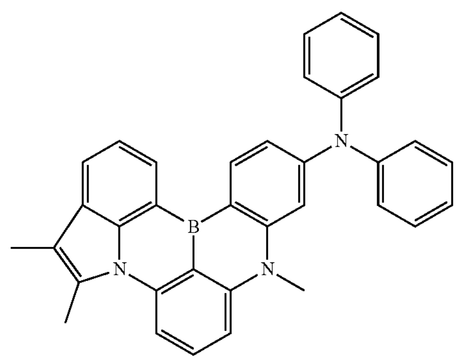
D-627
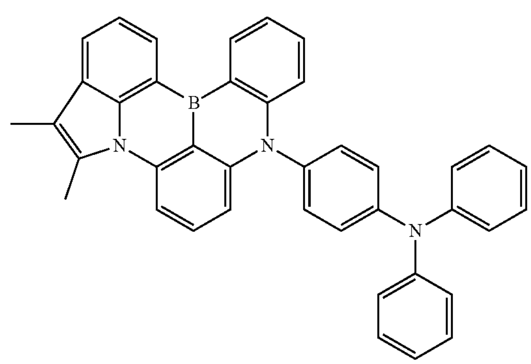

-continued
D-628
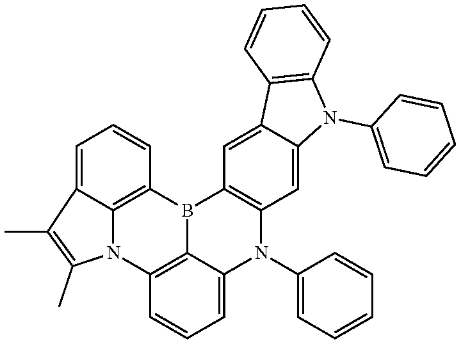
D-629
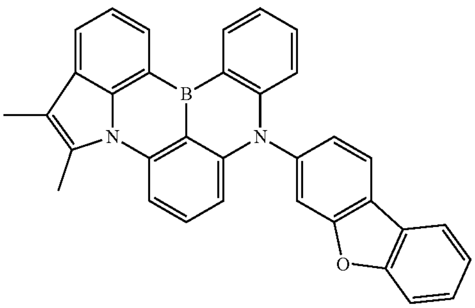
D-630
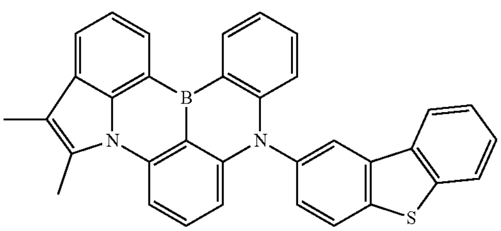
D-631
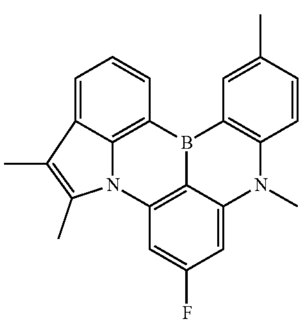
D-632
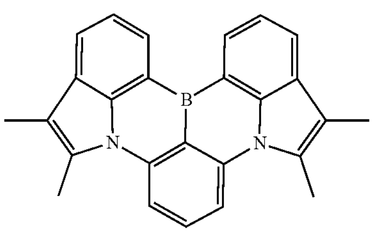
-continued
D-633
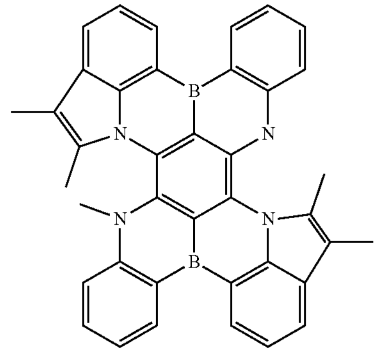
D-634
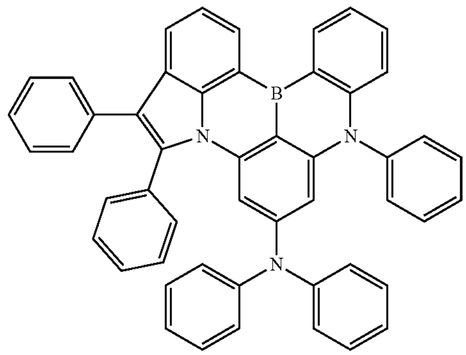
D-635
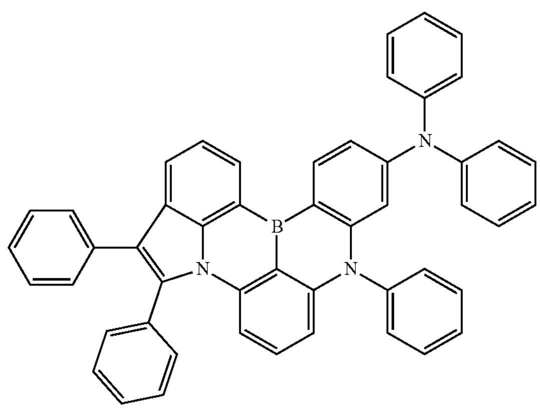
D-636
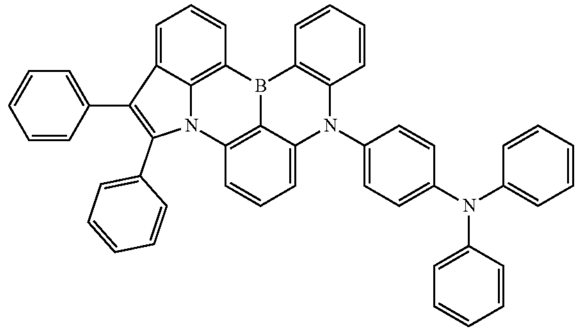

D-637
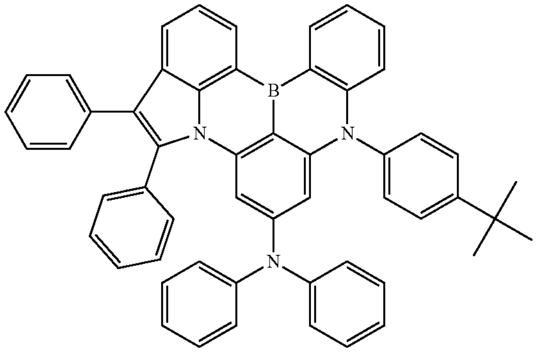
D-638
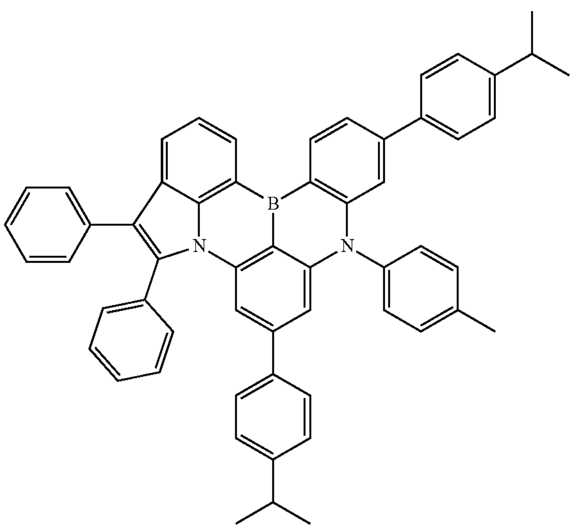
D-639
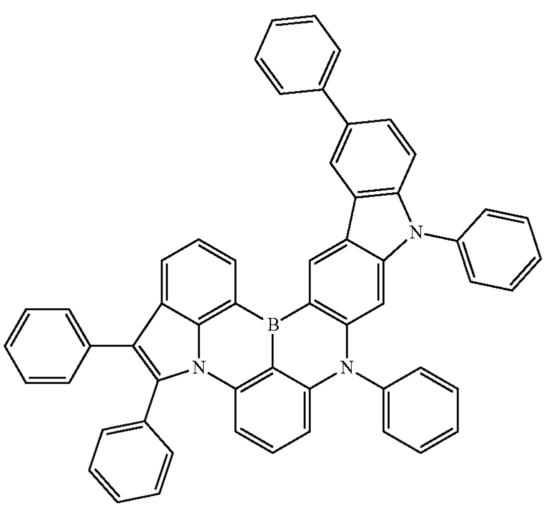
D-640
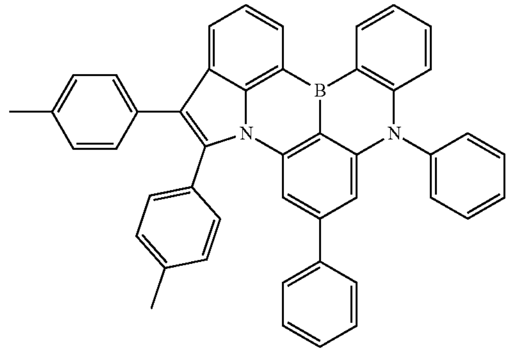
D-641
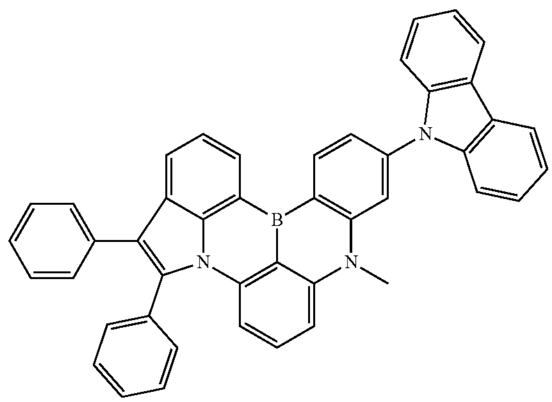
D-642
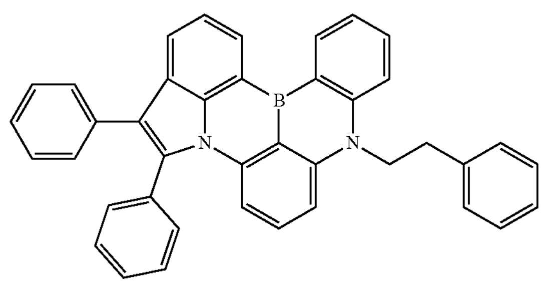
D-643
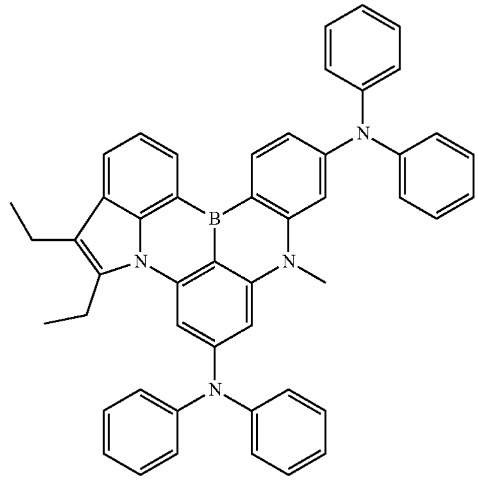

-continued
D-644
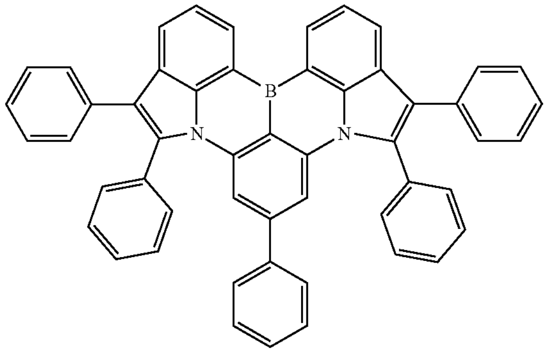
D-645
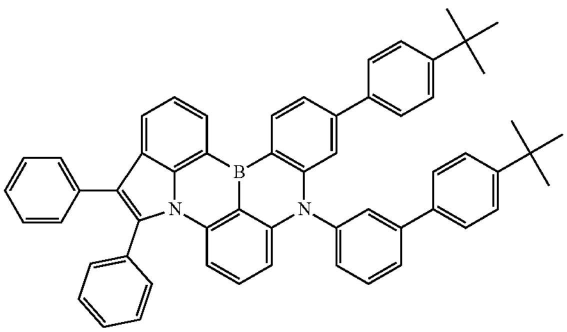
D-646
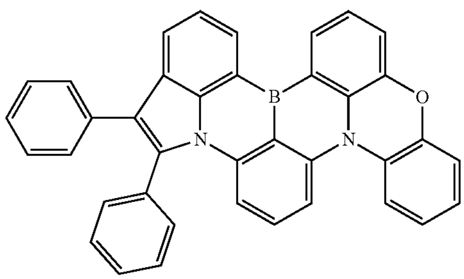
D-647
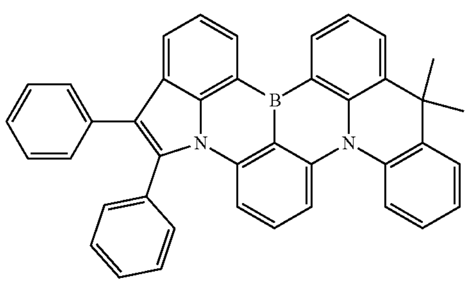
D-648
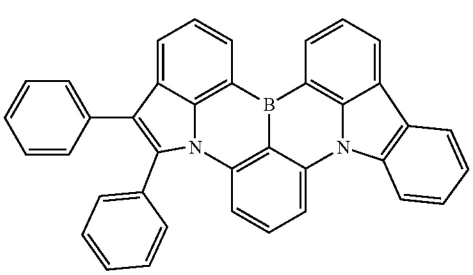
-continued
D-649
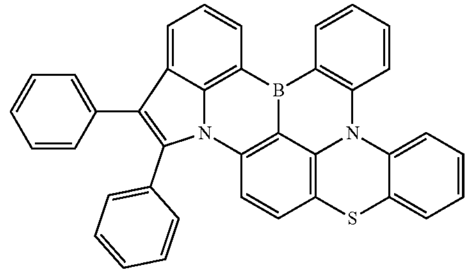
D-650
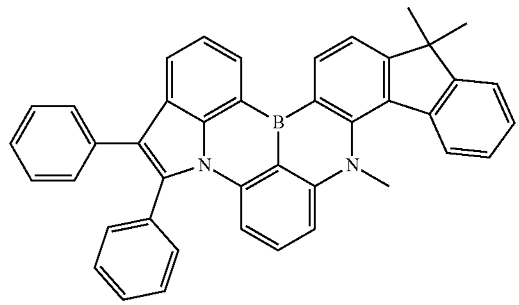
D-651
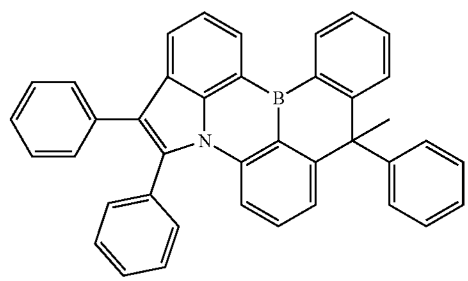
D-652
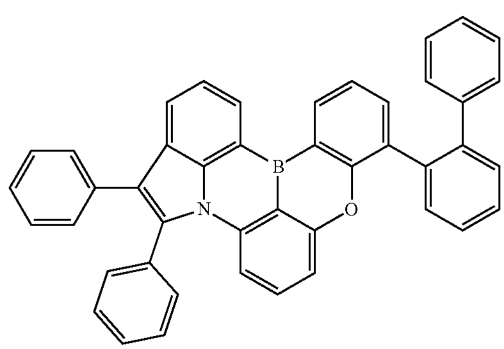

-continued
D-653
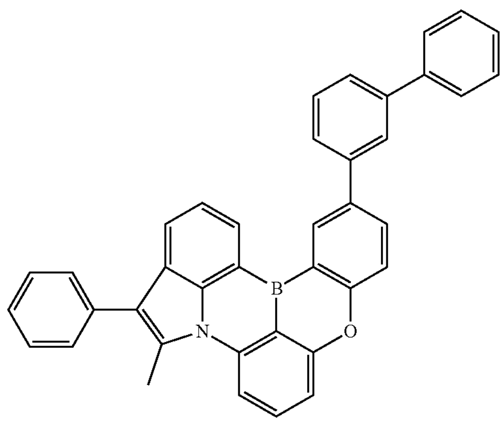
D-654
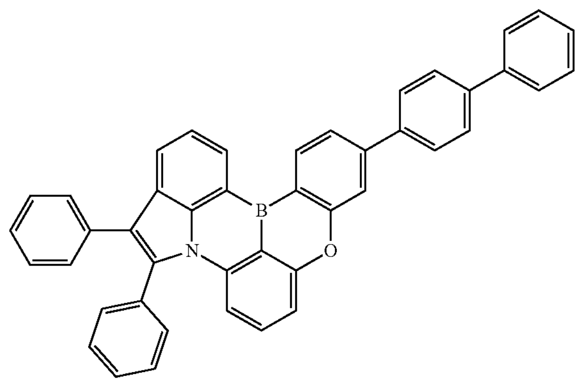
D-655
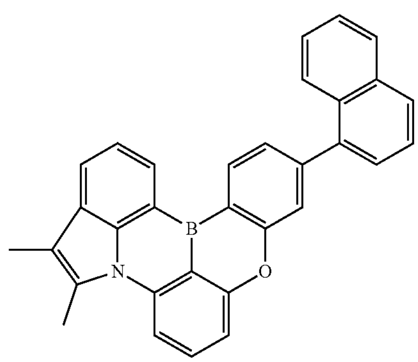
D-656
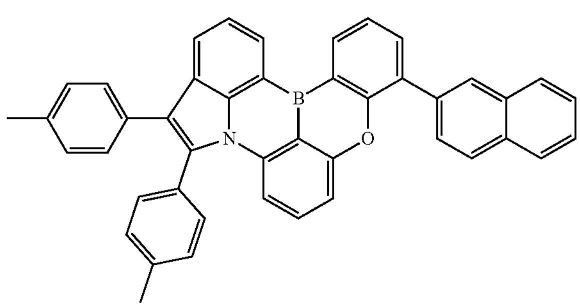
-continued
D-657
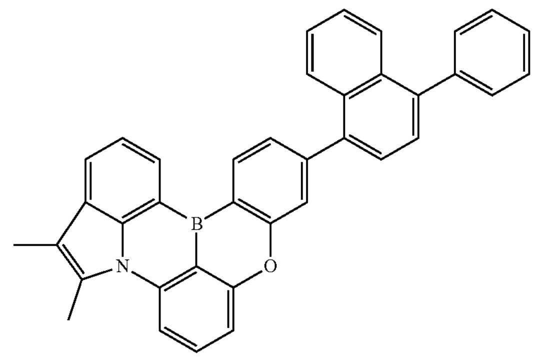
D-658
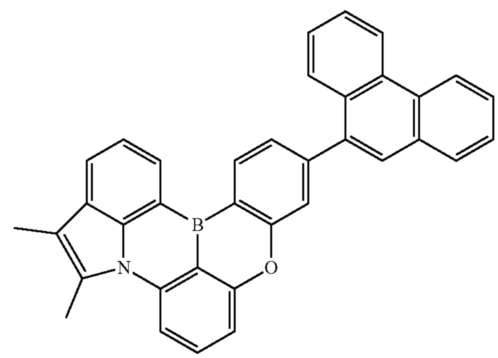
D-659
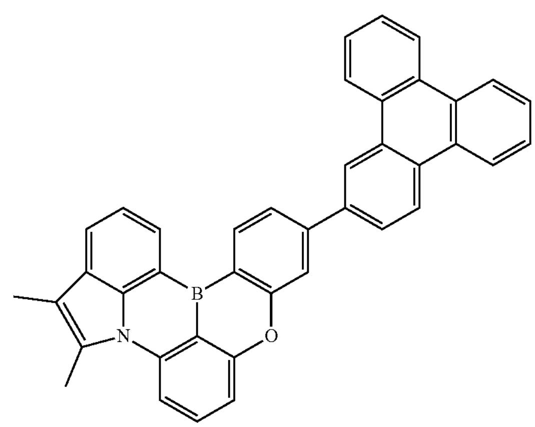
D-660
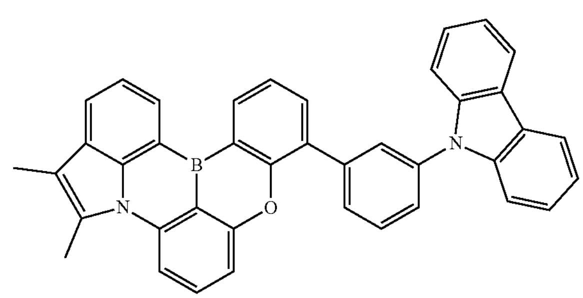

-continued
D-661
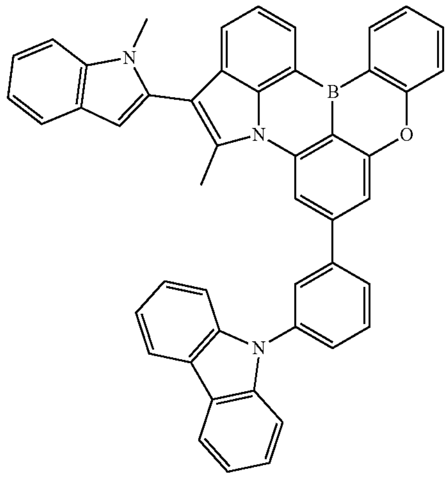
D-662
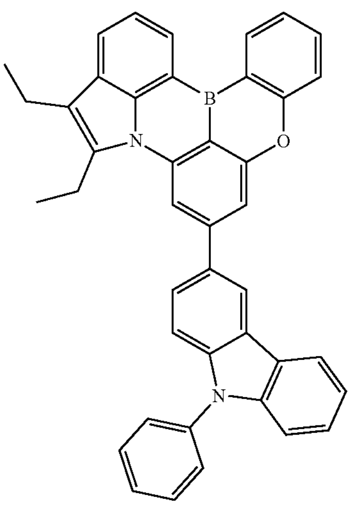
D-663
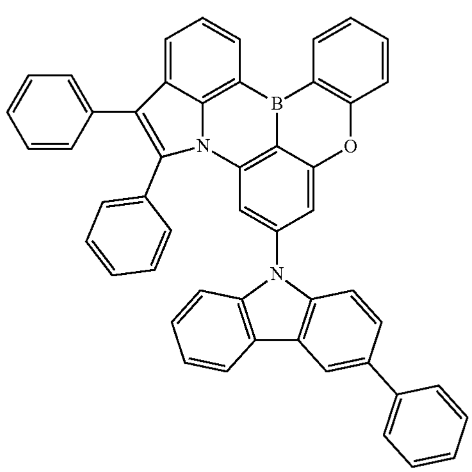
-continued
D-664
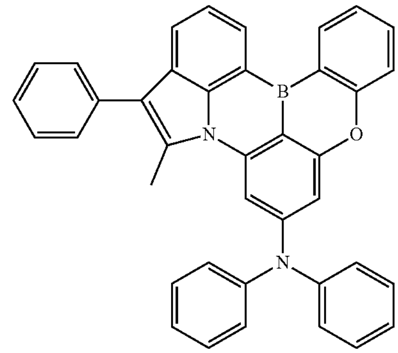
D-665
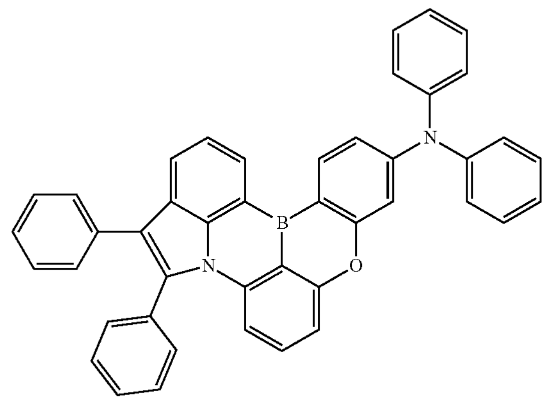
D-666
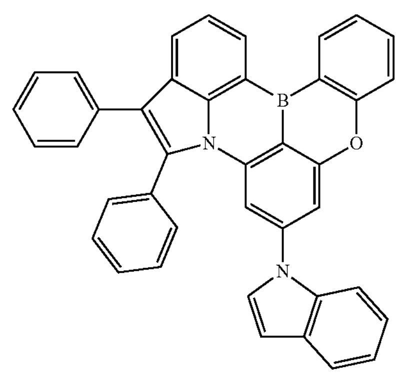
D-667
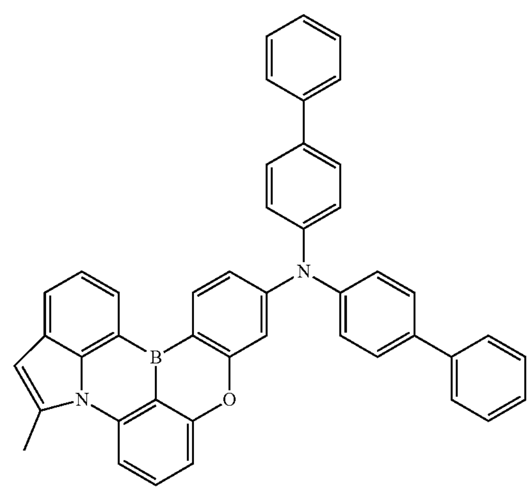

-continued
D-668
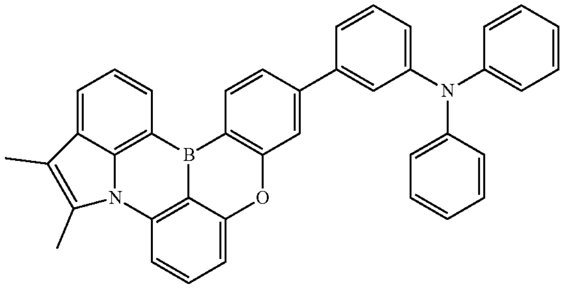
D-669
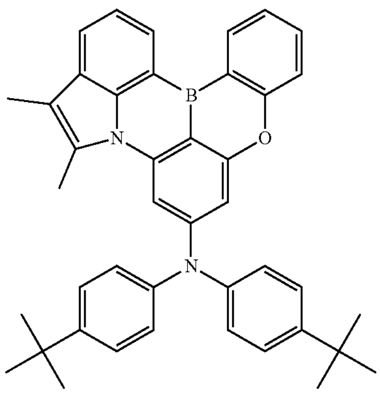
D-670
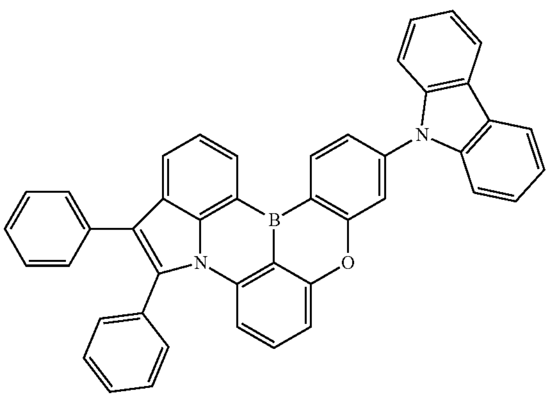
D-671
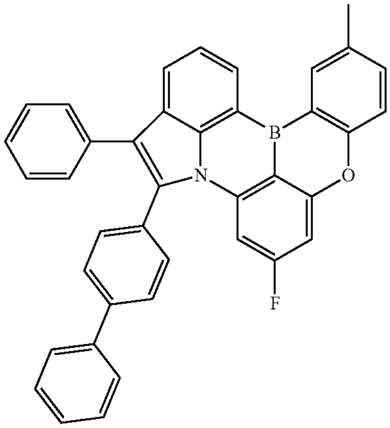
-continued
D-672
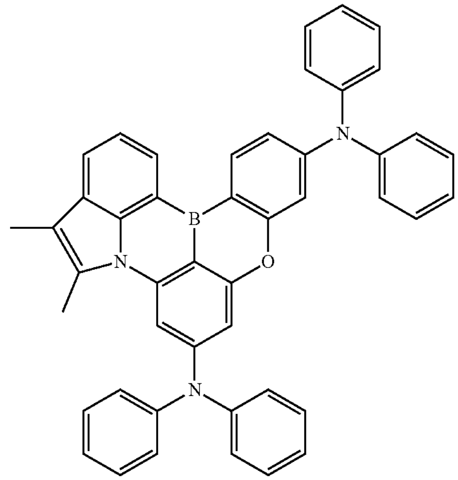
D-673
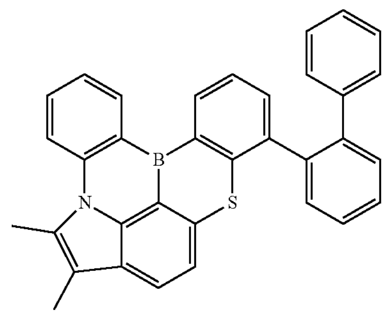
D-674
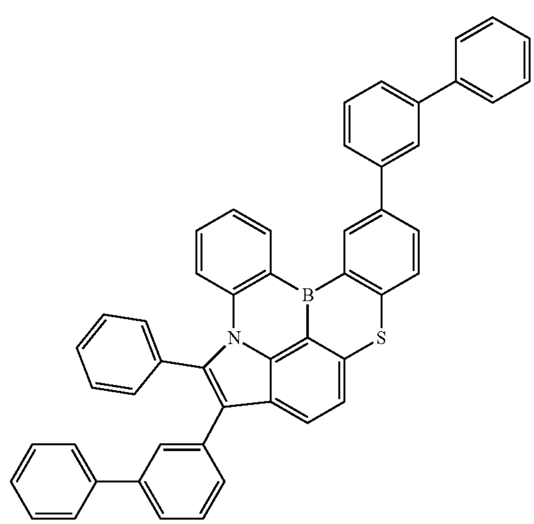

-continued
D-675
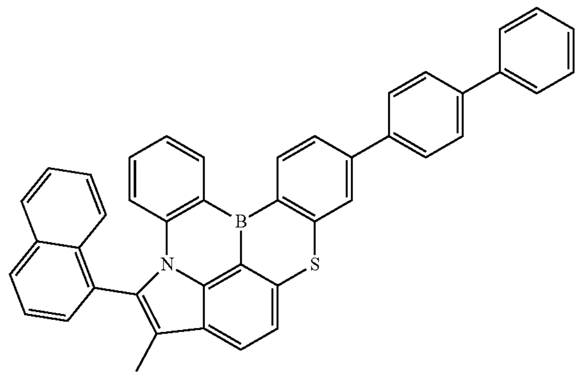
D-676
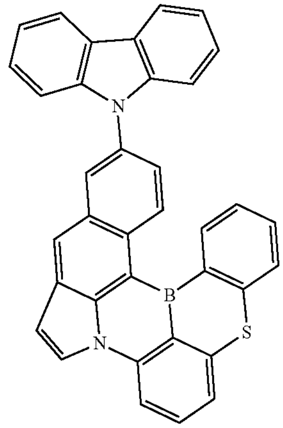
D-677
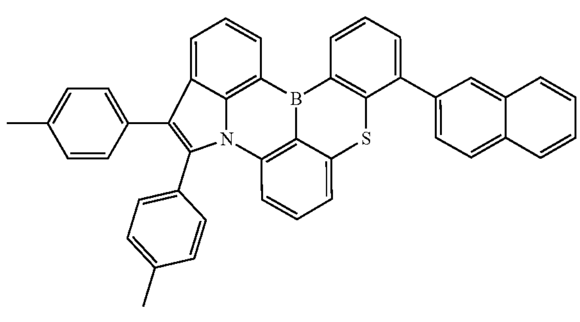
D-678
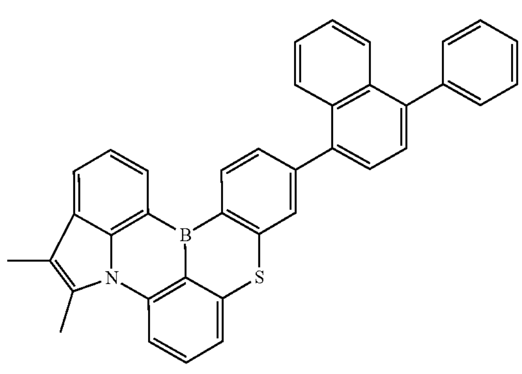
-continued
D-679
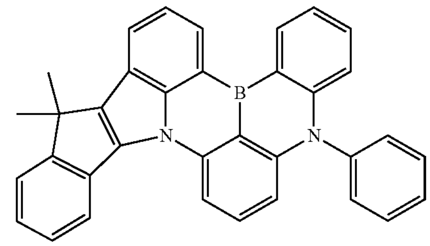
D-680
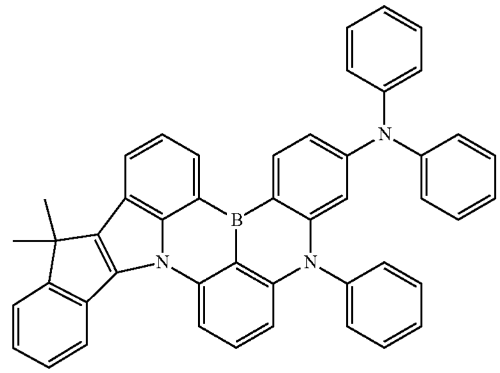
D-681
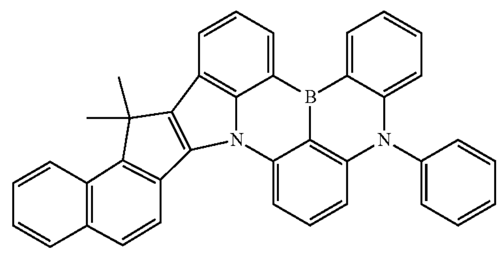
D-682
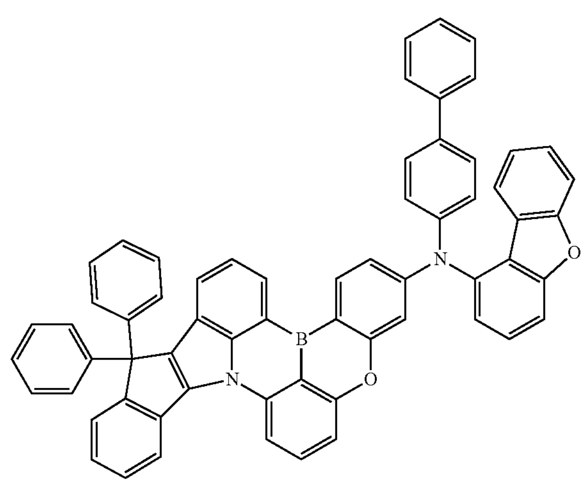

-continued
D-683
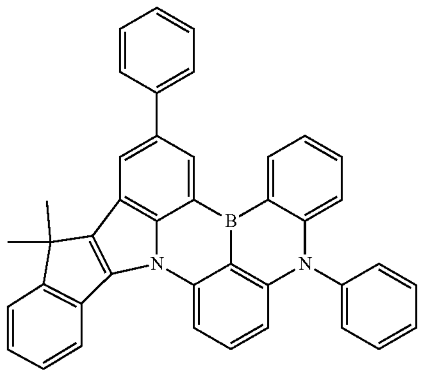
D-684
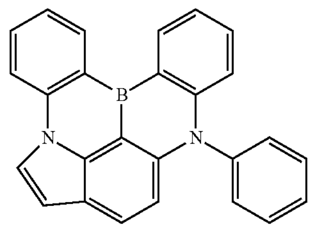
D-685
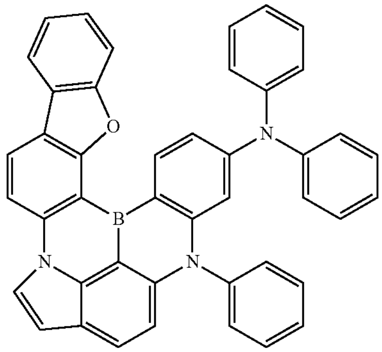
D-686
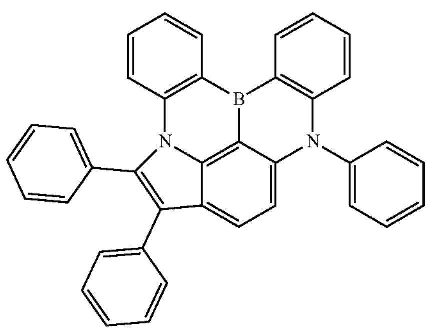
D-687
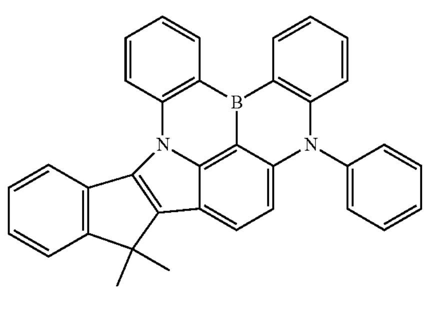
-continued
D-688
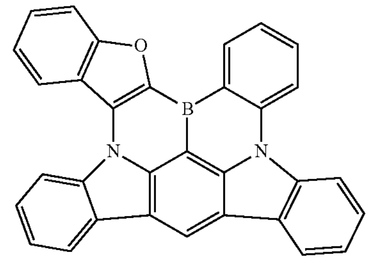
D-689
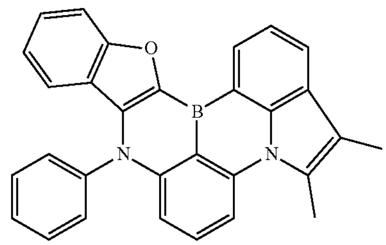 [SMILES: Cc1c(C)n2c3c(cccc13)B1c3[se]c4ccccc4c3N(c3ccccc3)c3cccc-2c31]
D-690
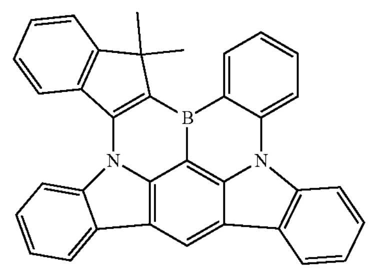
D-691
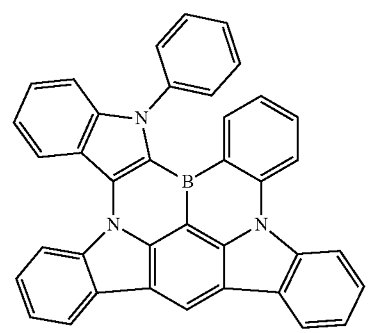
D-692
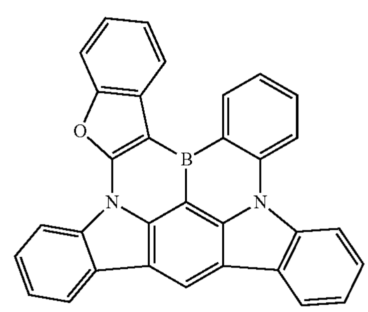

-continued
D-693
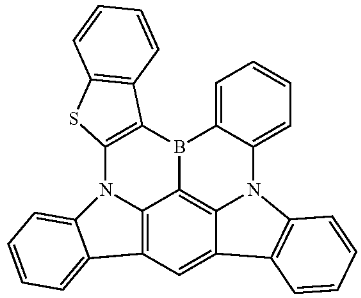
D-694
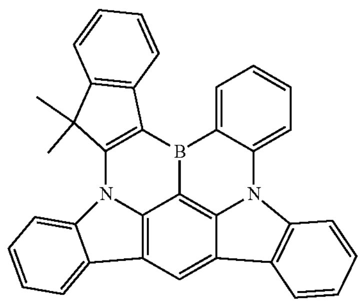
D-695
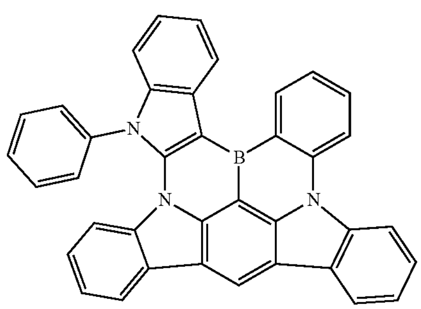
D-696
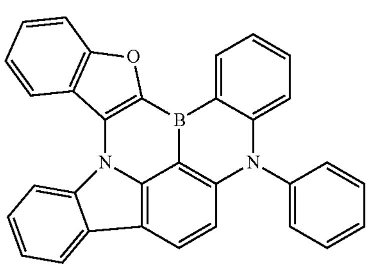
D-697
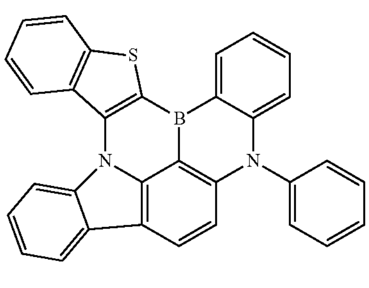
-continued
D-698
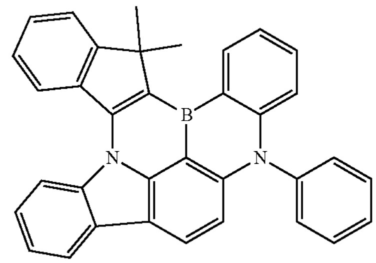
D-699
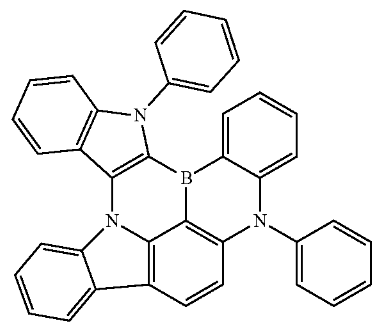
D-700
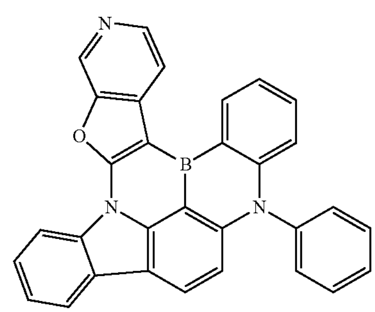
D-701
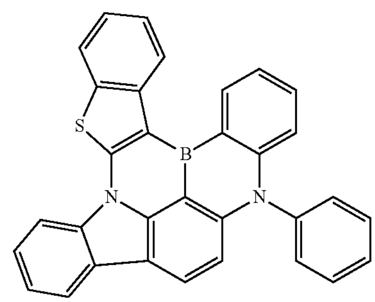
D-702
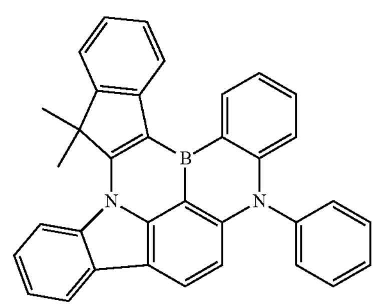

-continued
D-703
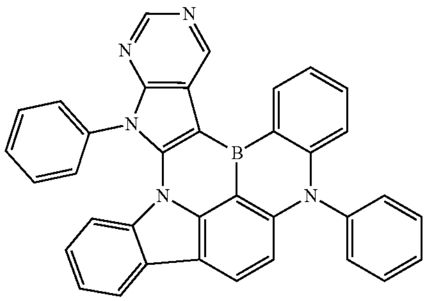
D-704
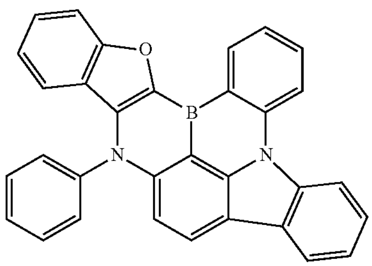
D-705
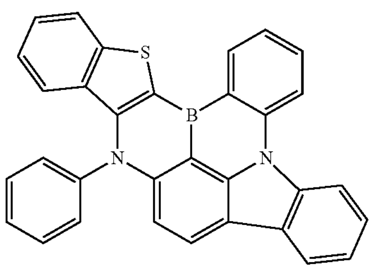
D-706
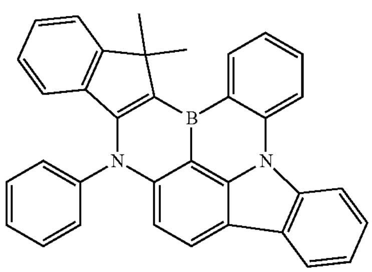
D-707
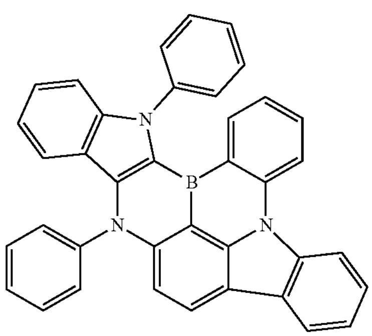
-continued
D-708
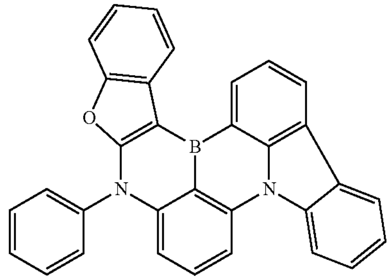
D-709
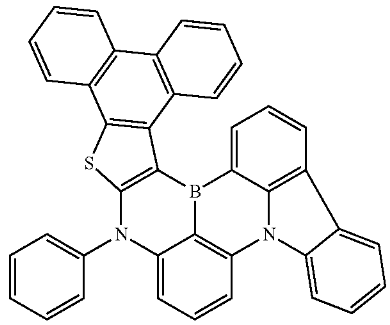
D-710
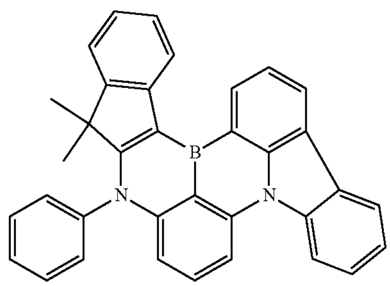
D-711
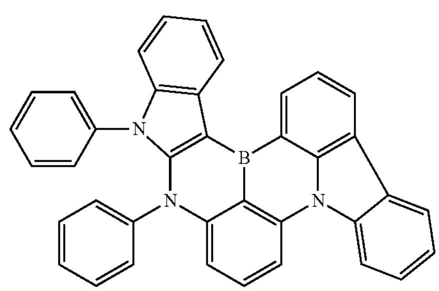
D-712
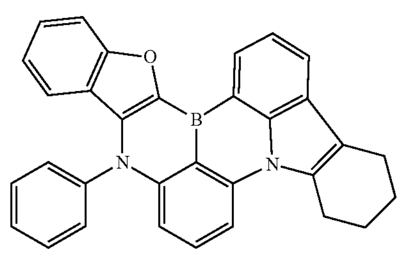

-continued
D-713
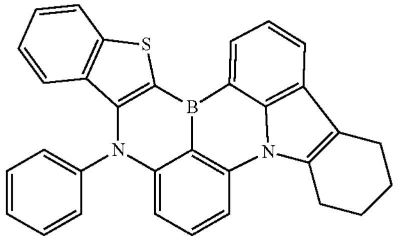
D-714
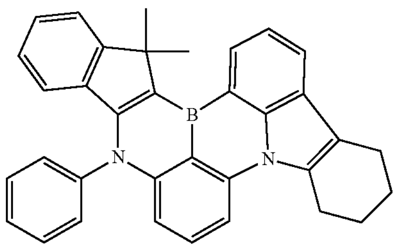
D-715
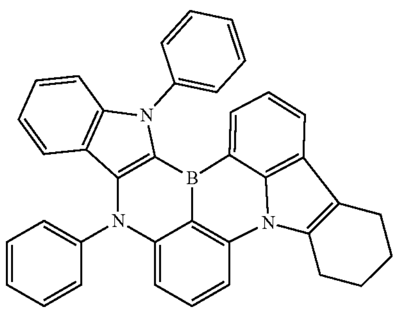
D-716
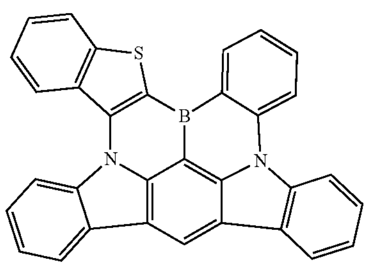
D-717
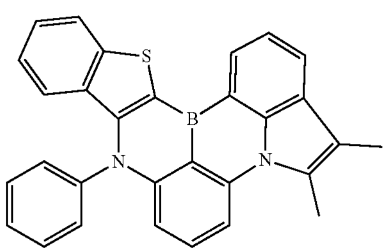
D-718
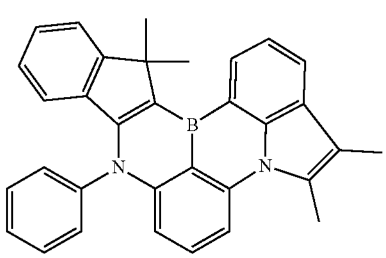
-continued
D-719
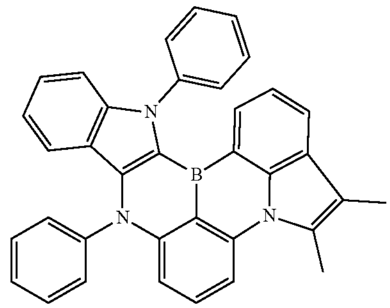
D-720
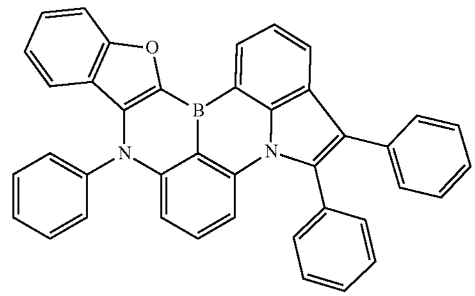
D-721
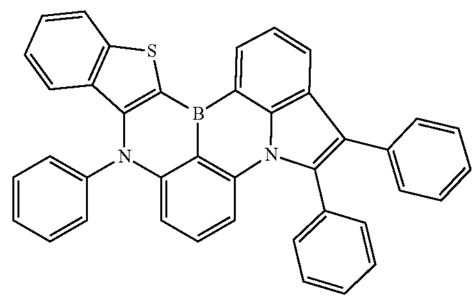
D-722
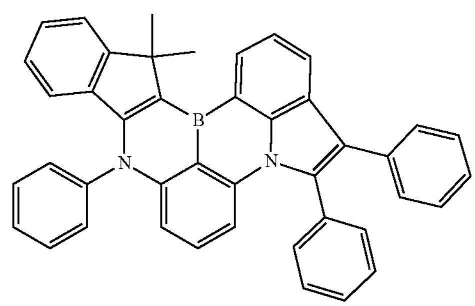
D-723
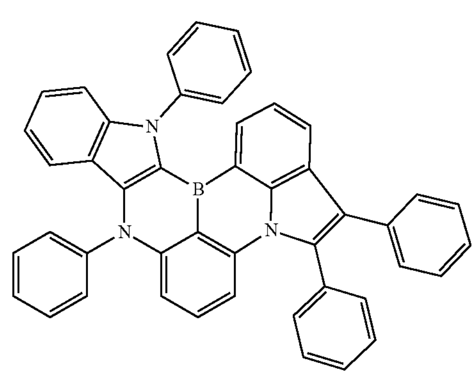

-continued

D-724

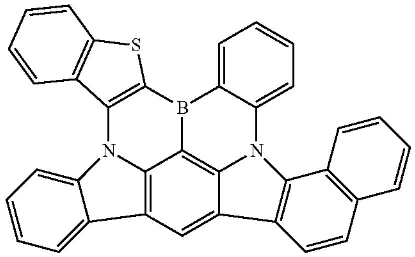

D-725

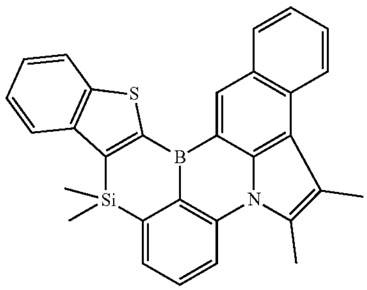

D-726

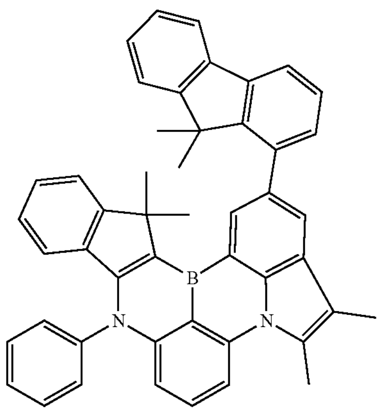

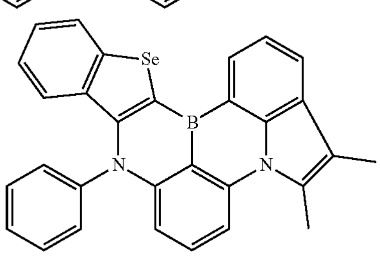

As can be seen from the above specific compounds, the compounds used for the light-emitting layer and the capping layer in the organic light-emitting device according to the present invention have intrinsic characteristics based on the specific skeleton structures and the substituents introduced into the structures and thus can be used to obtain a highly efficient organic light-emitting device.

The organic light-emitting device according to the present invention may have a structure including a first electrode, a second electrode and an organic layer disposed therebetween, and the organic layer of the organic light-emitting device according to the present invention may have a single layer structure or a multilayer structure in which two or more organic layers are stacked. For example, the organic layer may have a structure including a hole injection layer, a hole transport layer, a hole blocking layer, a light-emitting layer, an electron blocking layer, an electron transport layer, an electron injection layer, and the like. However, the structure of the organic layer is not limited thereto and may include a smaller or larger number of organic layers, and the preferred organic material layer structure of the organic light-emitting device according to the present invention will be described in more detail in Example which will be described later.

In addition, the organic light-emitting device according to the present invention includes a substrate, a first electrode (anode), an organic layer, a second electrode (cathode), and a capping layer, and the capping layer is formed under the first electrode (bottom emission) or on the second electrode (top emission) and is preferably formed on the second electrode.

In the configuration in which the capping layer is formed on the second electrode (top emission), the light formed in the light-emitting layer is emitted toward the cathode, and the light emitted toward the cathode passes through the capping layer (CPL) formed of the compound according to the present invention having a relatively high refractive index. At this time, the wavelength is amplified and thus the luminous efficacy is increased. In addition, in the configuration in which the capping layer is formed under the second electrode (bottom emission), the luminous efficacy of the organic electric device is also improved using the compound according to the present invention in the capping layer based on the same principle.

In addition, the organic light-emitting device according to the present invention includes a light-emitting layer interposed between the first electrode and the second electrode, and the light-emitting layer includes a host and a dopant. In this case, the content of the dopant in the light-emitting layer may be determined from about 0.01 to about 20 parts by weight based on about 100 parts by weight of the host, but is not limited thereto.

Hereinafter, an embodiment of the organic light-emitting device according to the present invention will be described in more detail.

The organic light-emitting device according to the present invention includes an anode, a hole transport layer, a light-emitting layer, an electron transport layer and a cathode, and if necessary, may further include a hole injection layer between the anode and the hole transport layer, may further include an electron injection layer between the electron transport layer and the cathode, may further include one or two intermediate layers, and may further include a hole blocking layer or an electron blocking layer. As described above, the organic light-emitting device may further include an organic layer having various functions depending on characteristics thereof.

Meanwhile, a detailed structure of an organic light-emitting device according to an embodiment of the present invention, a method for manufacturing the same, and the material for each organic layer will be described as follows.

First, a substrate is coated with a material for an anode to form the anode. The substrate used herein is a substrate generally used for organic light-emitting devices and is preferably an organic substrate or a transparent plastic substrate that has excellent transparency, surface evenness, handleability and waterproofness. In addition, a material for the anode is indium tin oxide (ITO), indium zinc oxide (IZO), tin oxide ($SnO_2$), zinc oxide (ZnO), or the like, which is transparent and has excellent conductivity.

A hole injection layer is formed on the anode by vacuum thermal evaporation or spin coating using a material for the hole injection layer, and then a hole transport layer is formed on the hole injection layer by vacuum thermal evaporation or spin coating using a material for the hole transport layer.

The material for the hole injection layer may be used without particular limitation as long as it is commonly used in the art and specific examples thereof include 2-TNATA [4,4', 4"-tris(2-naphthylphenyl-phenylamino)-triphenylamine], NPD [N,N'-di(1-naphthyl)-N, N'-diphenylbenzidine)], TPD [N,N'-diphenyl-N, N'-bis(3-methylphenyl)-1,1'-biphenyl-4,4'-diamine], DNTPD [N,N'-diphenyl-N, N'-bis-[4-(phenyl-m-tolyl-amino)-phenyl]-biphenyl-4,4'-diamine], and the like.

In addition, the material for the hole transport layer is also used without particular limitation as long as it is commonly used in the art and is, for example, N,N'-bis(3-methylphenyl)-N, N'-diphenyl-[1,1-biphenyl]-4,4'-diamine (TPD) or N,N'-di(naphthalen-1-yl)-N, N'-diphenylbenzidine (α-NPD).

Subsequently, a hole auxiliary layer and a light-emitting layer are sequentially stacked on the hole transport layer, and a hole blocking layer is selectively deposited on the light-emitting layer by vacuum deposition or spin coating to form a thin film. Because the lifetime and efficiency of the device are reduced when holes are introduced into the cathode through the organic light-emitting layer, the hole blocking layer is formed using a material having a very low HOMO (highest occupied molecular orbital) level so as to prevent this problem. The hole blocking material used herein is not particularly limited and is typically BAlq, BCP or TPBI that has an electron transport ability and has an ionization potential higher than that of a light-emitting compound.

The material used for the hole blocking layer may be BAlq, BCP, Bphen, TPBI, NTAZ, BeBq2, OXD-7, Liq, or the like, but is not limited thereto.

An electron transport layer is deposited on the hole blocking layer through vacuum deposition or spin coating and a metal for forming a cathode is formed on the electron injection layer through vacuum thermal evaporation to form a cathode. As a result, an organic light-emitting device according to an embodiment is completed.

Here, the metal for forming the cathode may be lithium (Li), magnesium (Mg), aluminum (Al), aluminum-lithium (Al-Li), calcium (Ca), magnesium-indium (Mg—In), magnesium-silver (Mg—Ag) or the like. A transmissive cathode using ITO or IZO may be used in order to obtain a top-emission type light-emitting device.

The material for the electron transport layer functions to stably transport electrons injected from the cathode and may be a well-known electron transport material. Examples of the well-known electron transport material include quinoline derivatives, especially, tris(8-quinolinolate)aluminum (Alq3), TAZ, BAlq, beryllium bis(benzoquinolin-10-olate: Bebq2) and oxadiazole derivatives (PBD, BMD, BND, etc.).

In addition, each of the organic layers may be formed by a monomolecular deposition or solution process. The deposition is a method of forming a thin film by evaporating a material for forming each layer through heating in the presence of a vacuum or low pressure and the solution process is a method of forming a thin film by mixing a material for forming each layer with a solvent and forming the thin film from the mixture through a method such as inkjet printing, roll-to-roll coating, screen printing, spray coating, dip coating, or spin coating.

In addition, the organic light-emitting device according to the present invention may further include a light-emitting layer of a blue light-emitting material, a green light-emitting material, or a red light-emitting material that emits light in a wavelength range of 380 nm to 800 nm. That is, the light-emitting layer of the present invention includes a plurality of light-emitting layers, and a blue light-emitting material, a green light-emitting material, or a red light-emitting material in the additionally formed light-emitting layer may be a fluorescent phosphorescent material.

In addition, the organic light-emitting device is used for a display or lighting system selected from flat panel displays, flexible displays, monochromatic or white flat panel lighting systems, monochromatic or white flexible lighting systems, vehicle displays, and displays for virtual or augmented reality.

Hereinafter, the present invention will be described in more detail with reference to preferred examples. However, it will be obvious to those skilled in the art that these examples are merely provided for illustration of the present invention, and should not be construed as limiting the scope of the present invention.

Synthesis Example 1. Synthesis of A-20

Synthesis Example 1-1: Synthesis of Intermediate 1-a

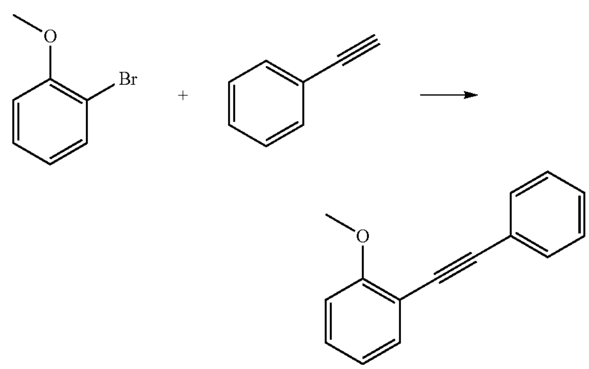

<Intermediate 1-a>

2-bromoanisole (30 g, 0.171 mol), phenylacetylene (38.5 g, 0.377 mol), bis(triphenylphosphine) palladium (II) dichloride (2.41 g, 0.003 mol), copper (I) iodide (1.63 g, 0.009 mol), and triphenylphosphine (0.45 g, 0.002 mol) were stirred under reflux in 300 mL of triethylamine in a 1 L reactor overnight. After completion of the reaction, the reaction product was cooled to room temperature and filtered with hexane. The filtrate was concentrated and separated by column chromatography to obtain <Intermediate 1-a>. (25 g, 74%)

Synthesis Example 1-2: Synthesis of Intermediate 1-b

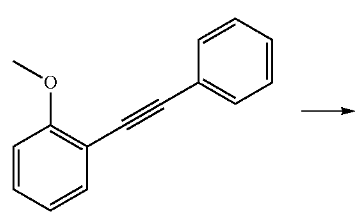

-continued

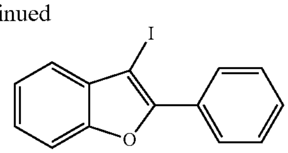

<Intermediate 1-b>

<Intermediate 1-a> (25 g, 0.12 mol) was dissolved in dichloromethane in a 1 L reactor and was then purged with nitrogen. Iodine (45.7 g, 0.18 mol) was added to the resulting solution, followed by stirring at room temperature for 12 hours. After completion of the reaction, an aqueous sodium thiosulfate solution was added thereto to remove the remaining iodine. The residue was extracted with dichloromethane and then was separated by column chromatography to obtain <Intermediate 1-b> (31 g, 81%).

Synthesis Example 1-3: Synthesis of A-20

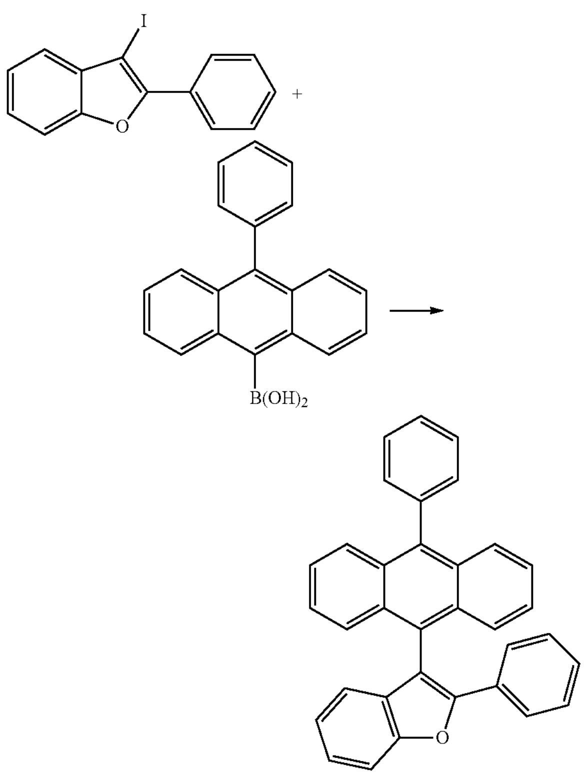

[A-20]

<Intermediate 1-b> (31 g, 0.097 mol), 10-phenylanthracene-9-boronic acid (31.7 g, 0.107 mol), potassium carbonate (26.8 g, 0.194 mol), tetrakis(triphenylphosphine) palladium (0) (2.24 g, 0.002 mol), 210 mL of toluene, and 90 mL of ethanol were stirred under reflux in a 1 L reactor at 110° C. overnight. The reaction product was cooled to room temperature and then was extracted with ethyl acetate/distilled water, and the organic layer was concentrated and then was separated by column chromatography to obtain [A-20]. (19 g, 44%)

MS (MALDI-TOF): m/z 446.17 [$M^+$]

Synthesis Example 2. Synthesis of A-30

Synthesis Example 2-1: Synthesis of Intermediate 2-a

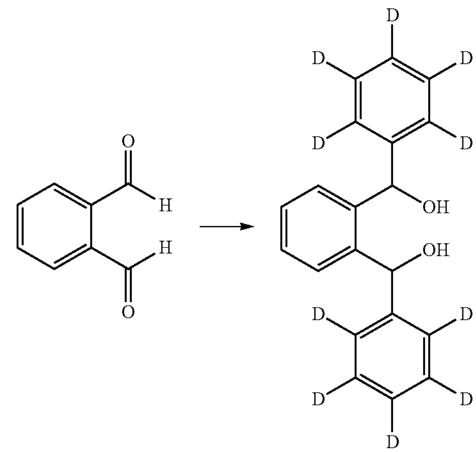

<Intermediate 2-a>

Bromobenzene (d5) (60.4 g, 0.373 mol) and tetrahydrofuran 480 mL were added to a 2 L reactor, cooled to −78° C. and stirred. N-butyllithium (223.6 mL, 0.357 mol) was added dropwise to the cooled reaction solution, followed by stirring at the same temperature for 1 hour. O-phthalaldehyde (20 g, 0.149 mol) was dissolved in 100 mL of tetrahydrofuran, and the solution was added dropwise to the reaction solution, followed by stirring at room temperature. After completion of the reaction, 200 mL of an aqueous ammonium chloride solution was added thereto to terminate the reaction. The reaction solution was extracted with ethyl acetate, concentrated under reduced pressure and then separated by column chromatography to obtain <Intermediate 2-a> (40 g, 89%).

Synthesis Example 2-2: Synthesis of Intermediate 2-b

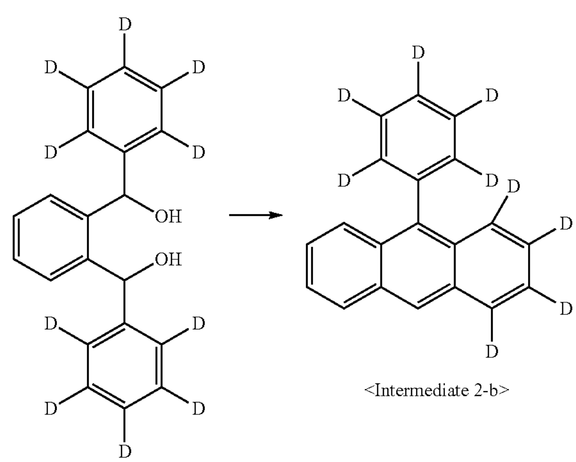 [SMILES: [2H]c1c([2H])c([2H])c(C(O)c2ccccc2C(O)c2c([2H])c([2H])c([2H])c([2H])c2[2H])c([2H])c1[2H] ; [2H]c1c([2H])c([2H])c(-c2c3ccccc3cc3c([2H])c([2H])c([2H])c([2H])c23)c([2H])c1[2H]]

<Intermediate 2-b>

<Intermediate 2-a> (40 g, 0.133 mol) was dissolved in 200 mL of acetic acid in a 500 mL reactor, followed by stirring. 2 mL of hydrogen bromide was added to the reaction solution, followed by stirring at 80° C. for 2 hours. After completion of the reaction, the reaction product was cooled to room temperature and the reaction solution was slowly poured into a beaker containing 500 mL of distilled water, followed by stirring. The resulting solid was filtered and washed with distilled water. The solid was separated by column chromatography to obtain <Intermediate 2-b> (13 g, 37%).

Synthesis Example 2-3: Synthesis of Intermediate 2-c

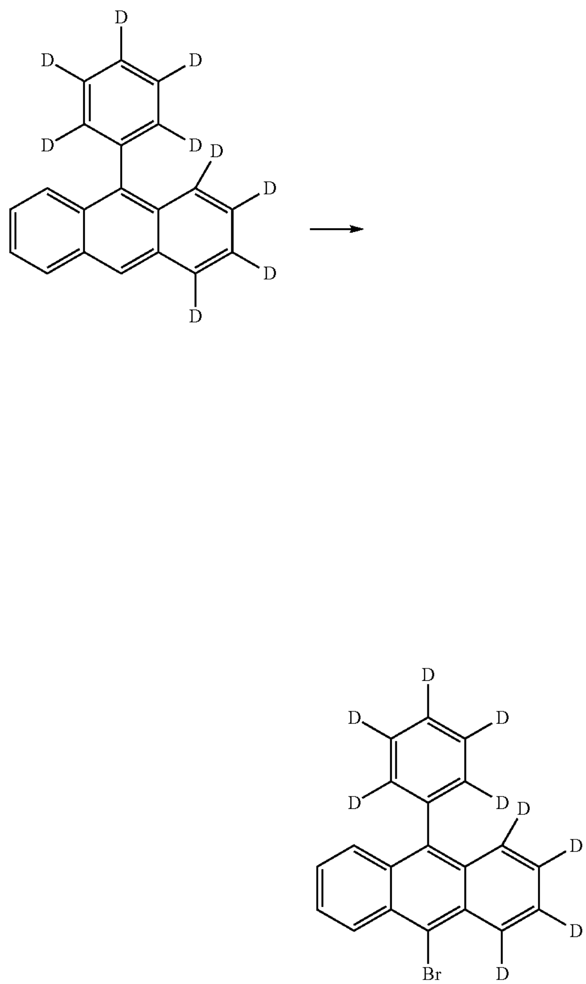

<Intermediate 2-c>

<Intermediate 2-b> (13 g, 0.049 mol) was dissolved in 130 mL of N, N-dimethylamide in a 500 mL reactor, followed by stirring at room temperature. N-bromosuccinimide (10.5 g, 0.059 mol) was dissolved in 40 mL of N, N-dimethylamide and the resulting solution was added dropwise to the reaction solution. The completion of the reaction was determined by thin film chromatography. The reaction solution was slowly poured into a beaker containing 500 mL of distilled water, followed by stirring. The resulting solid was filtered and washed with distilled water. The result was separated by column chromatography to obtain <Intermediate 2-c> (14 g, 83%).

Synthesis Example 2-4: Synthesis of Intermediate 2-d

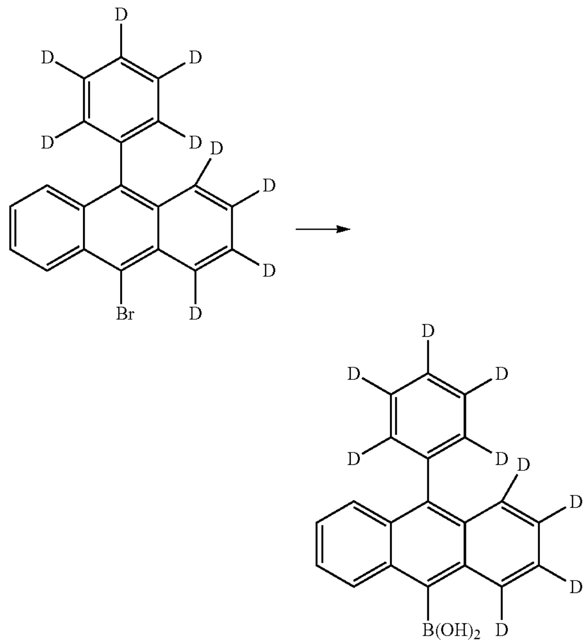

<Intermediate 2-d>

<Intermediate 2-c> (50 g, 0.146 mol) was dissolved in 500 mL of tetrahydrofuran in a 500 mL reactor, and cooled to −78° C., and n-butyllithium (100 ml, 0.161 mol) was added dropwise to the resulting solution. The resulting mixture was stirred for 5 hours and trimethyl borate (18 mL, 0.161 mol) was added thereto, followed by stirring at room temperature overnight. After completion of the reaction, the reaction product was acidified with 2N hydrochloric acid and then recrystallized to obtain <Intermediate 2-d> (25 g, 56%).

Synthesis Example 2-5: Synthesis of A-30

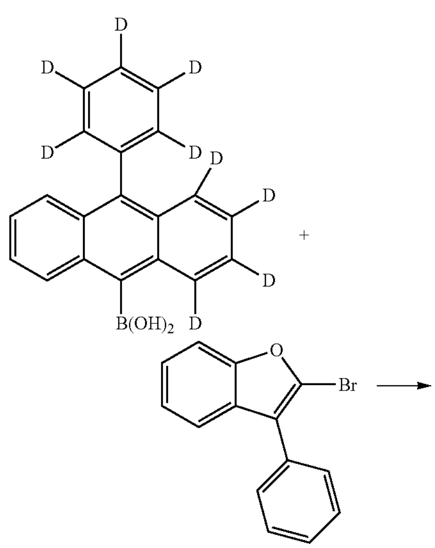

-continued

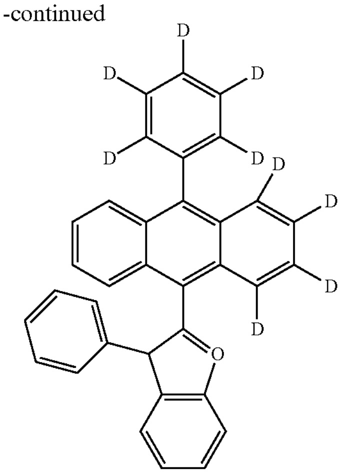

[A-30]

[A-30] was obtained in the same manner as in Synthesis Example 1-3, except that 2-bromo-3-phenylbenzofuran was used instead of <Intermediate 1-b> and <Intermediate 2-d> was used instead of 10-phenylanthracene-9-boronic acid. (yield 30%)

MS (MALDI-TOF): m/z 531.25 [M$^+$]

Synthesis Example 3. Synthesis of A-57

Synthesis Example 3-1: Synthesis of Intermediate 3-a

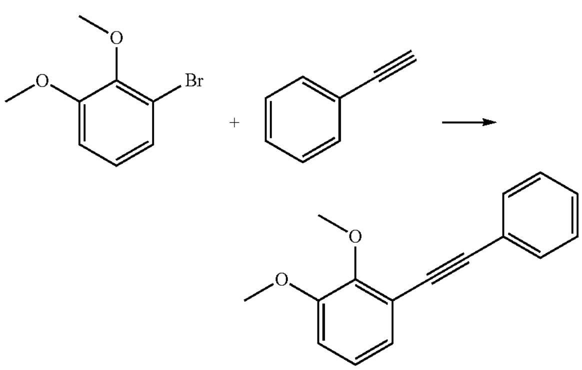

<Intermediate 3-a>

<Intermediate 3-a> was obtained in the same manner as in Synthesis Example 1-1, except that 3-bromoveratrole was used instead of 2-bromoanisole. (yield 79%)

Synthesis Example 3-2: Synthesis of Intermediate 3-b

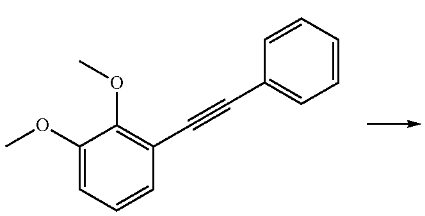

-continued

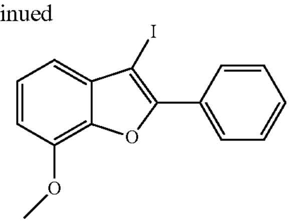

<Intermediate 3-b>

<Intermediate 3-b> was obtained in the same manner as in Synthesis Example 1-2, except that <Intermediate 3-a> was used instead of <Intermediate 1-a>. (yield 63%)

Synthesis Example 3-3: Synthesis of Intermediate 3-c

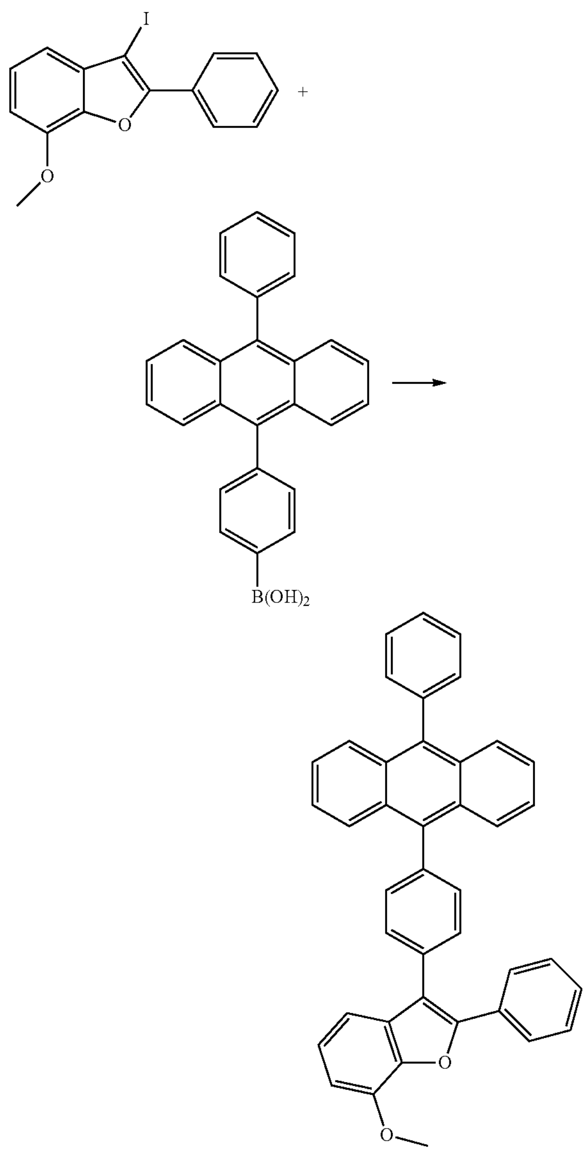

<Intermediate 3-c>

<Intermediate 3-c> was obtained in the same manner as in Synthesis Example 1-3, except that <Intermediate 3-b> was used instead of <Intermediate 1-b> and 4-(10-phenylanthracen-9-yl)benzeneboronic acid was used instead of 10-phenylanthracene-9-boronic acid. (yield 61%)

Synthesis Example 3-4: Synthesis of Intermediate 3-d

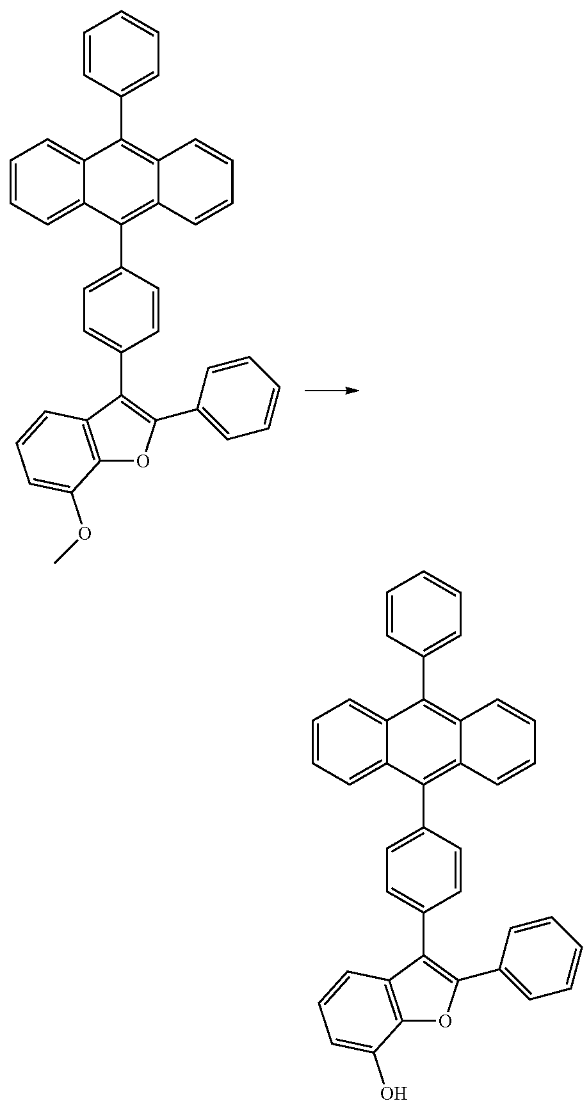

<Intermediate 3-d>

<Intermediate 3-c> (20 g, 0.036 mol) was dissolved in dichloromethane in a 500 mL reactor. The temperature of the reactor was cooled to 0° C., BBr3 (13.6 g, 0.054 mol) was slowly added thereto, and the reactor was allowed to warm to room temperature, followed by stirring for 2 hours. After completion of the reaction, cold distilled water was slowly added thereto to complete the reaction. The reaction product was extracted with dichloromethane and distilled water, and the organic layer was concentrated and then separated by column chromatography to obtain <Intermediate 3-d>. (17 g, 87%)

Synthesis Example 3-5: Synthesis of Intermediate 3-e

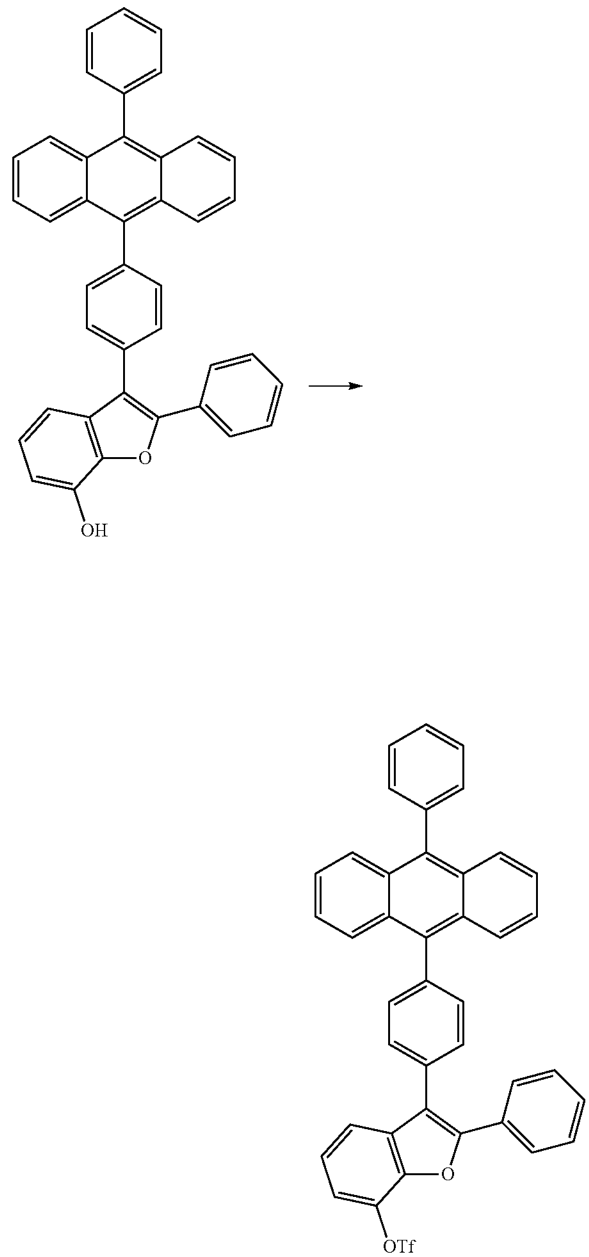

<Intermediate 3-e>

<Intermediate 3-d> (17 g, 0.032 mol) was dissolved in 170 mL of dichloromethane in a 500 mL reactor. The temperature of the reactor was reduced to 0° C., trifluoromethanesulfonic anhydride (10.7 g, 0.048 mol) was slowly added thereto, the reaction product was stirred at room temperature for 3 hours and cold distilled water was slowly added thereto to complete the reaction. The reaction product was extracted with dichloromethane and distilled water, and the organic layer was concentrated and then separated by column chromatography to obtain <Intermediate 3-e>. (17 g, 80%)

Synthesis Example 3-6: Synthesis of A-57

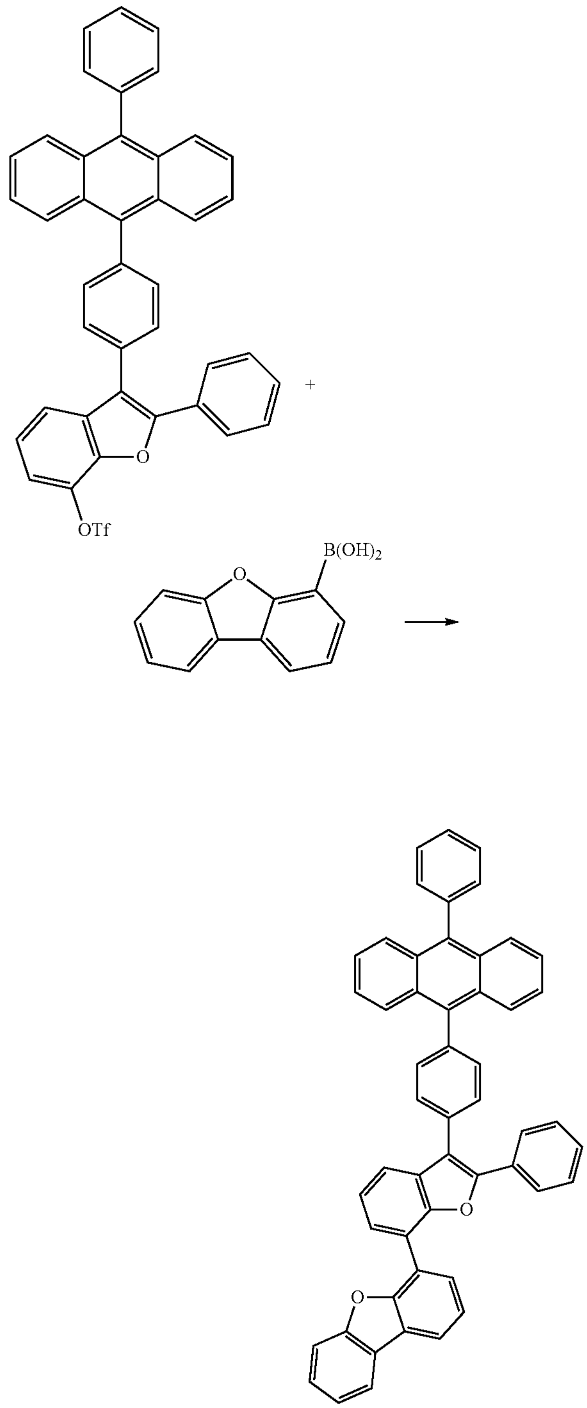

[A-57]

[A-57] was obtained in the same manner as in Synthesis Example 1-3, except that <Intermediate 3-e> was used instead of <Intermediate 1-b> and 4-dibenzofuran boronic acid was used instead of 10-phenylanthracene-9-boronic acid. (yield 45%)

MS (MALDI-TOF): m/z 688.24 [$M^+$]

Synthesis Example 4. Synthesis of A-58

Synthesis Example 4-1: Synthesis of Intermediate 4-a

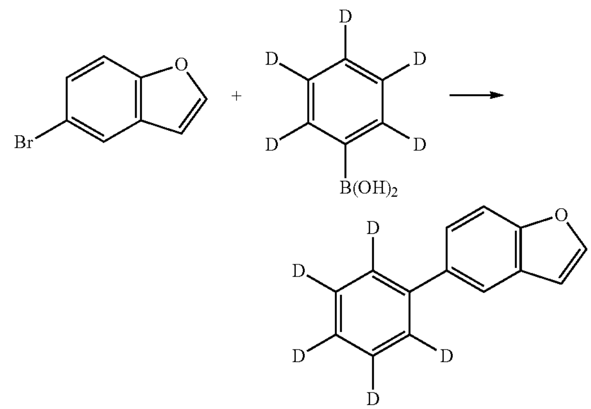

<Intermediate 4-a>

<Intermediate 4-a> was obtained in the same manner as in Synthesis Example 1-3, except that 5-bromobenzofuran was used instead of <Intermediate 1-b> and (phenyl-d5) boronic acid was used instead of 10-phenylanthracene-9-boronic acid. (yield 70%)

Synthesis Example 4-2: Synthesis of Intermediate 4-b

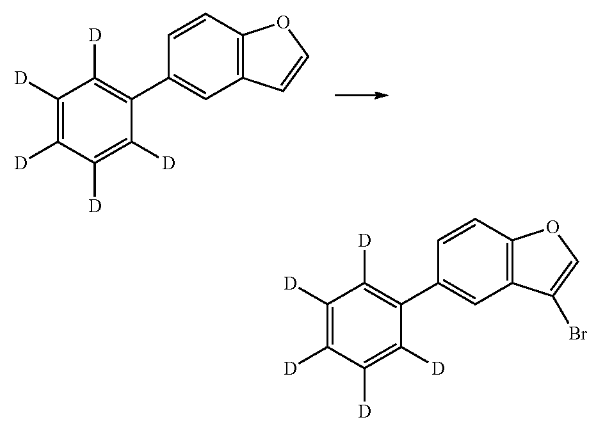

<Intermediate 4-b>

<Intermediate 4-a> (21.2 g, 0.106 mol) and dichloromethane were added to a 500 mL reactor and cooled to −10° C., and bromine was added thereto, followed by stirring for 1 hour. An aqueous sodium thiosulfate solution was added to the reaction solution, followed by stirring and layer separation. The organic layer was concentrated under reduced pressure. Ethanol was added to the result, followed by cooling to −10° C. Then, potassium hydroxide was dissolved in ethanol and the resulting solution was added to the reaction product, followed by refluxing for 4 hours. After completion of the reaction, layers were separated from the reaction product, and the organic layer was concentrated under reduced pressure and then separated by column chromatography <Intermediate 4-b>. (20 g, 70%)

Synthesis Example 4-3: Synthesis of Intermediate 4-c

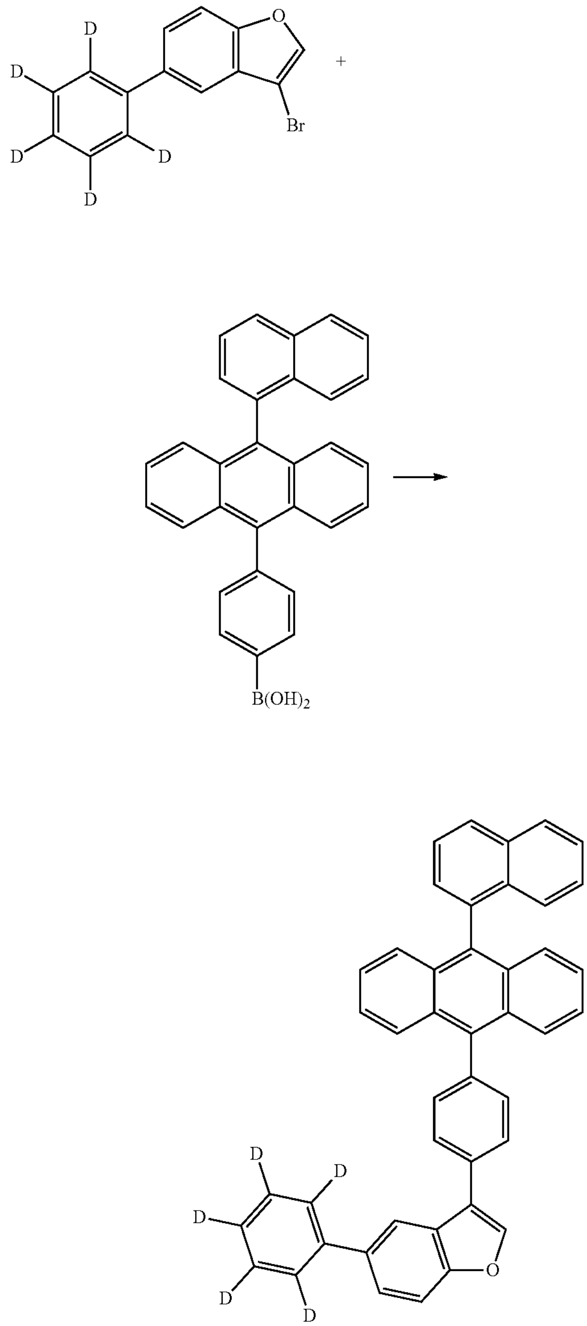

<Intermediate 4-c>

<Intermediate 4-c> was obtained in the same manner as in Synthesis Example 1-3, except that <Intermediate 4-b> was used instead of <Intermediate 1-b> and (4-(10-naphthalen-1-yl) anthracen-9-yl)benzeneboronic acid was used instead of 10-phenylanthracene-9-boronic acid. (yield 72%)

Synthesis Example 4-4: Synthesis of Intermediate 4-d

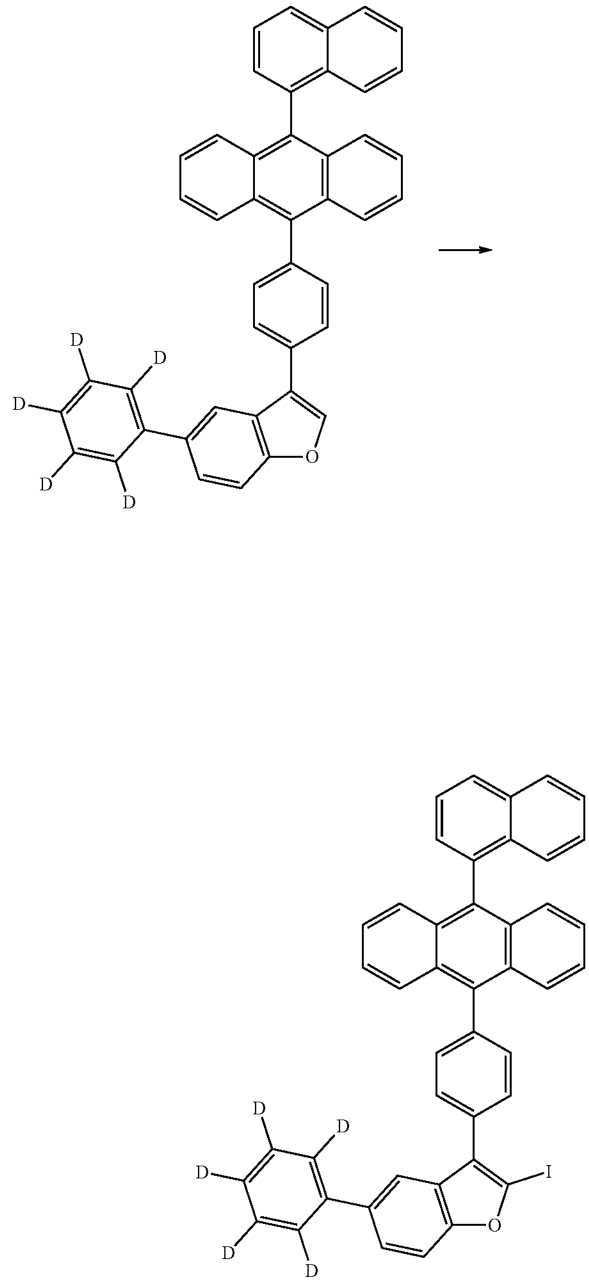

<Intermediate 4-d>

<Intermediate 4-c> (20 g, 0.035 mol) and 250 mL of THE were added to a 500 mL reactor and cooled to −50° C., and n-butyllithium (1.6M) was added thereto. 1 hour later, iodine was slowly added and the reactor was slowly allowed to warm to room temperature. An aqueous sodium thiosulfate solution was added to the reaction solution at room temperature, followed by layer separation. The organic layer was concentrated under reduced pressure and then separated by column chromatography to obtain <Intermediate 4-d> (17 g, 70%).

Synthesis Example 4-5: Synthesis of A-58

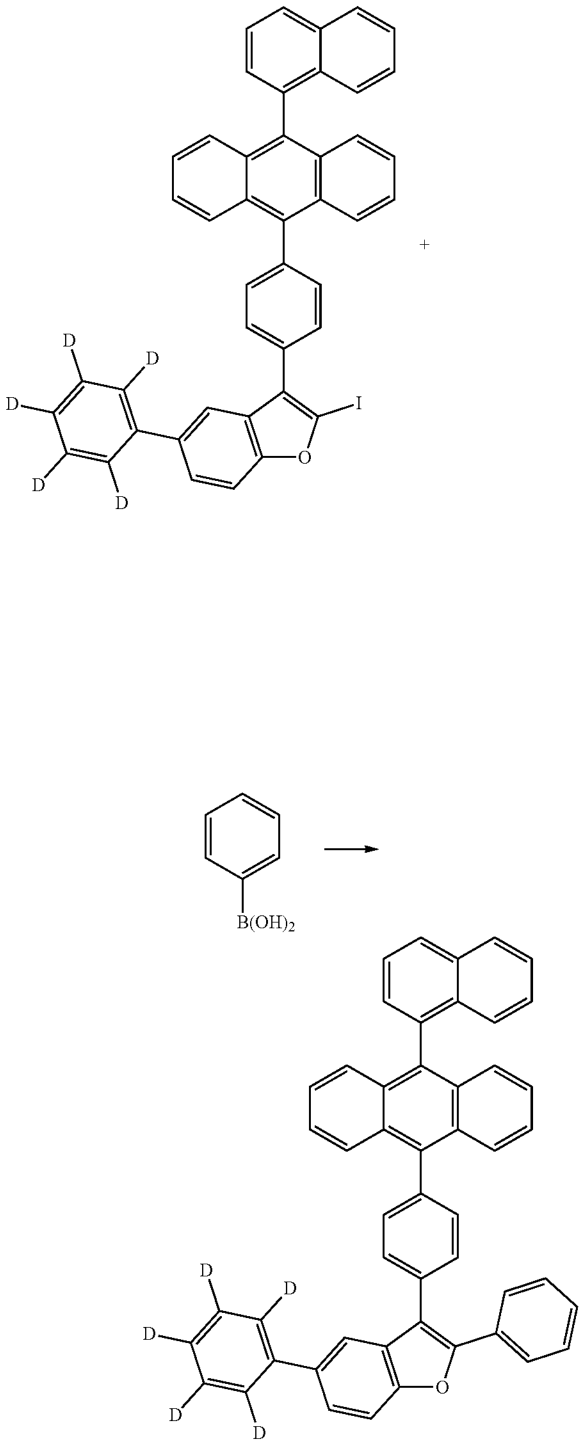

[A-58]

<A-58> was obtained in the same manner as in Synthesis Example 1-3, except that <Intermediate 4-d> was used instead of <Intermediate 1-b> and phenylboronic acid was used instead of 10-phenylanthracene-9-boronic acid. (yield 47%)

MS (MALDI-TOF): m/z 653.28 [$M^+$]

Synthesis Example 5. Synthesis of A-68

Synthesis Example 5-1: Synthesis of Intermediate 5-a

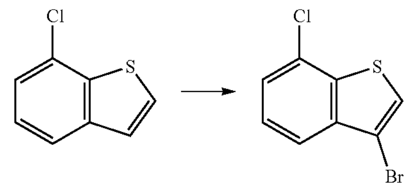

<Intermediate 5-a>

7-chlorobenzo[b] thiophene (30 g, 0.178 mol) and DMF were added to a 500 mL reactor, followed by stirring. Then, NBS was added to the reaction solution, followed by stirring under reflux for 6 hours and addition of distilled water. The layers were separated, and the organic layer was concentrated under reduced pressure and then separated by column chromatography to obtain <Intermediate 5-a> (27 g, 62%).

Synthesis Example 5-2: Synthesis of Intermediate 5-b

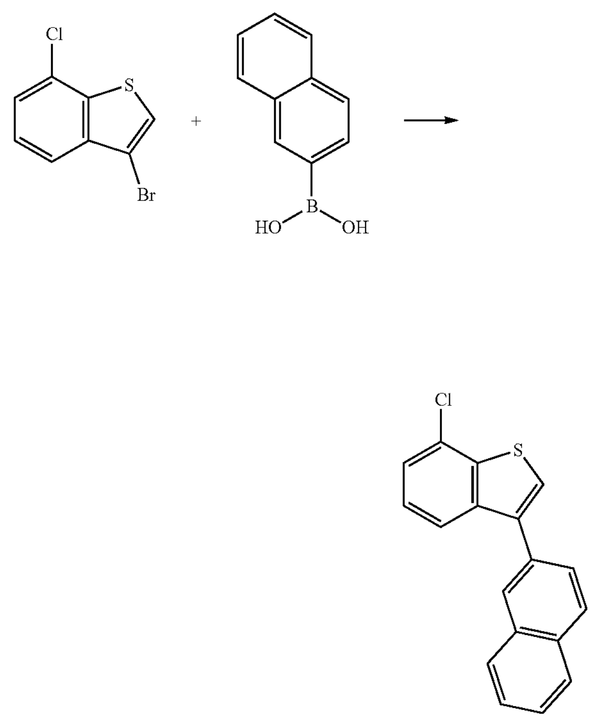

<Intermediate 5-b>

<Intermediate 5-b> was obtained in the same manner as in Synthesis Example 1-3, except that <Intermediate 5-a> was used instead of <Intermediate 1-b> and 2-naphthylboronic acid was used instead of 10-phenylanthracene-9-boronic acid. (yield 68%)

Synthesis Example 5-3: Synthesis of Intermediate 5-c

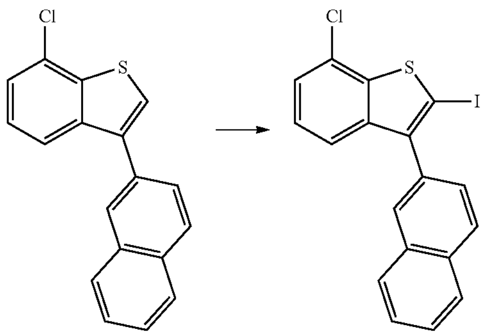

<Intermediate 5-c>

<Intermediate 5-c> was obtained in the same manner as in Synthesis Example 4-4, except that <Intermediate 5-b> was used instead of <Intermediate 4-c>. (yield 70%)

Synthesis Example 5-4: Synthesis of Intermediate 5-d

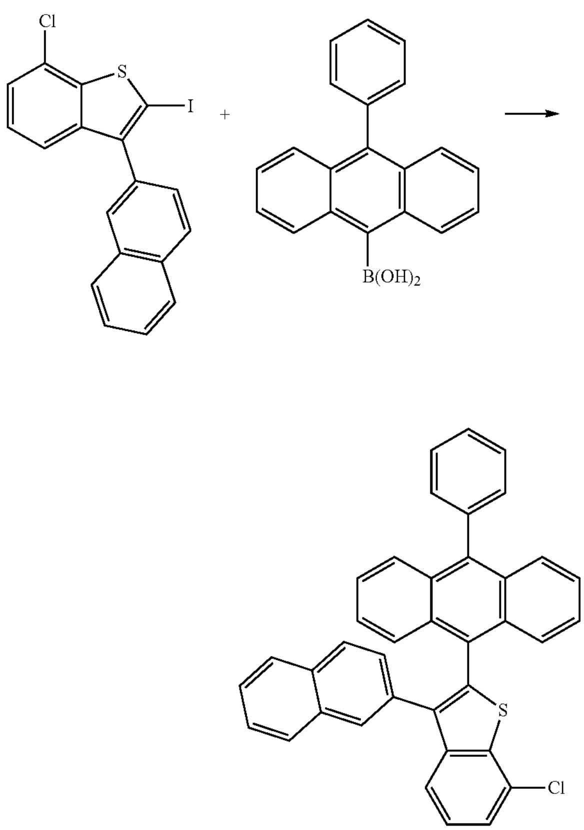

<Intermediate 5-d>

<Intermediate 5-d> was obtained in the same manner as in Synthesis Example 1-3, except that <Intermediate 5-c> was used instead of <Intermediate 1-b>. (yield 63%)

Synthesis Example 5-5: Synthesis of Intermediate 5-e

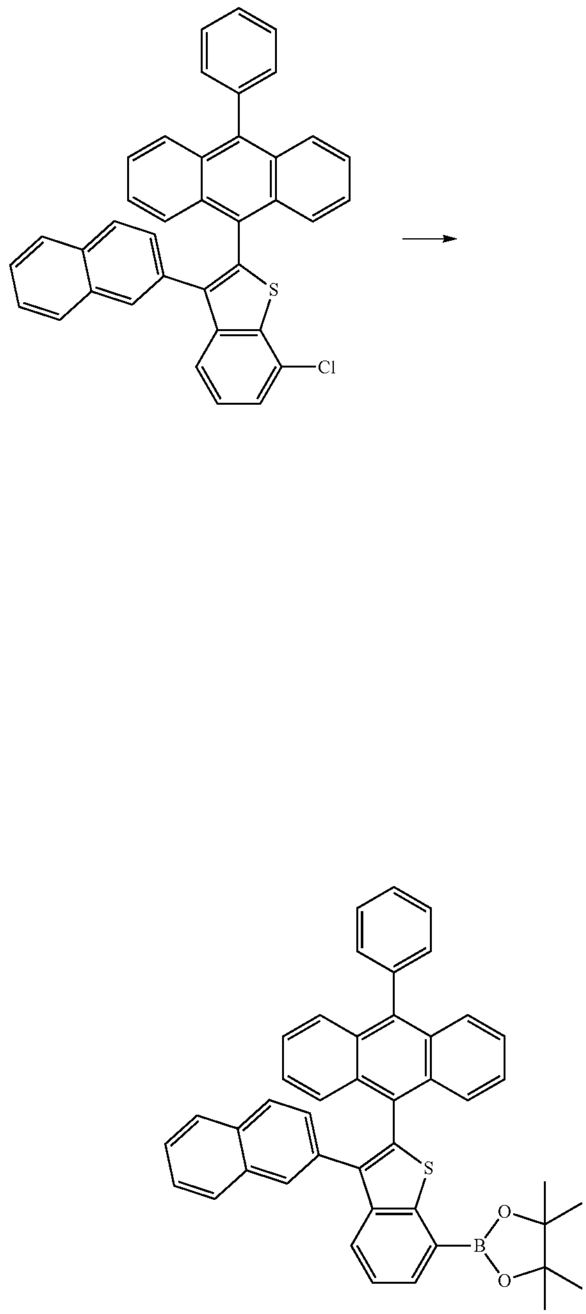

<Intermediate 5-e>

<Intermediate 5-d> (30 g, 0.055 mol), bis(pinacolato) diboron (16.7 g, 0.066 mol), palladium (II) dichloride (diphenylphosphine ferrocene) (1.3 g, 0.002 mol), potassium acetate (16.2 g, 0.165 mol), X-phos (2.6 g, 0.005 mol), and 300 mL of 1,4-dioxane were refluxed in a 1 L flask. After completion of the reaction, the reaction solution was concentrated under reduced pressure and then separated by column chromatography to obtain <Intermediate 5-e>. (27 g, 77%)

Synthesis Example 5-6: Synthesis of A-68

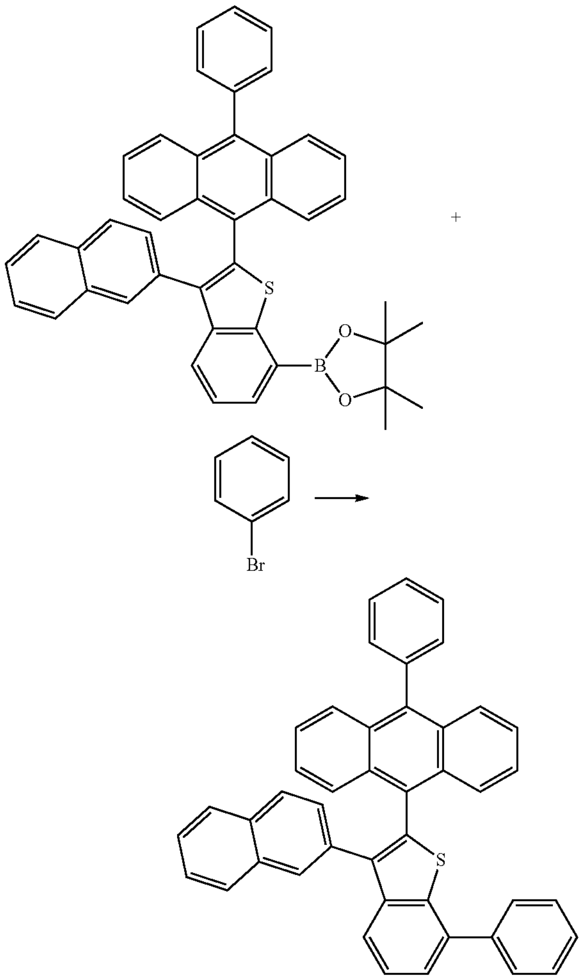

[A-68]

[A-68] was obtained in the same manner as in Synthesis Example 1-3, except that <Intermediate 5-e> was used instead of <Intermediate 1-b> and bromobenzene was used instead of 10-phenylanthracene-9-boronic acid. (yield 69%)

MS (MALDI-TOF): m/z 588.19 [$M^+$]

Synthesis Example 6. Synthesis of A-79

Synthesis Example 6-1: Synthesis of Intermediate 6-a

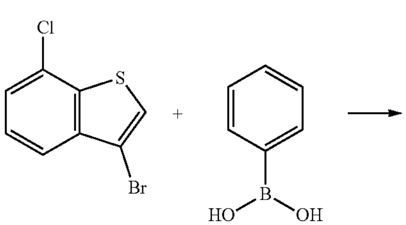

-continued

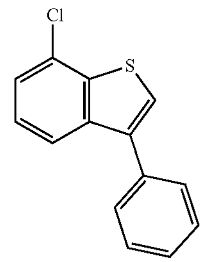

<Intermediate 6-a>

<Intermediate 6-a> was obtained in the same manner as in Synthesis Example 5-2, except that phenylboronic acid was used instead of 2-naphthylboronic acid. (yield 70%)

Synthesis Example 6-2: Synthesis of Intermediate 6-b

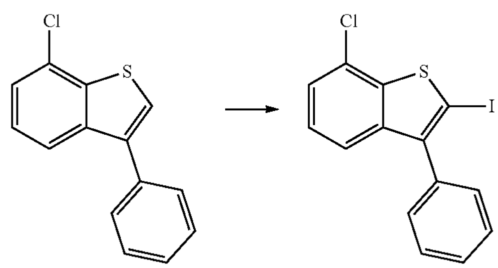

<Intermediate 6-b>

<Intermediate 6-b> was obtained in the same manner as in Synthesis Example 4-4, except that <Intermediate 6-a> was used instead of <Intermediate 4-c>. (yield 70%)

Synthesis Example 6-3: Synthesis of Intermediate 6-c

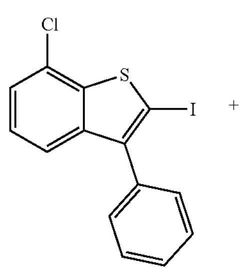

-continued

<Intermediate 6-c>

<Intermediate 6-c> was obtained in the same manner as in Synthesis Example 1-3, except that <Intermediate 6-b> was used instead of <Intermediate 1-b> and 4-(10-phenylanthracen-9-yl)benzeneboronic acid was used instead of 10-phenylanthracene-9-boronic acid. (yield 65%)

Synthesis Example 6-4: Synthesis of Intermediate 6-d

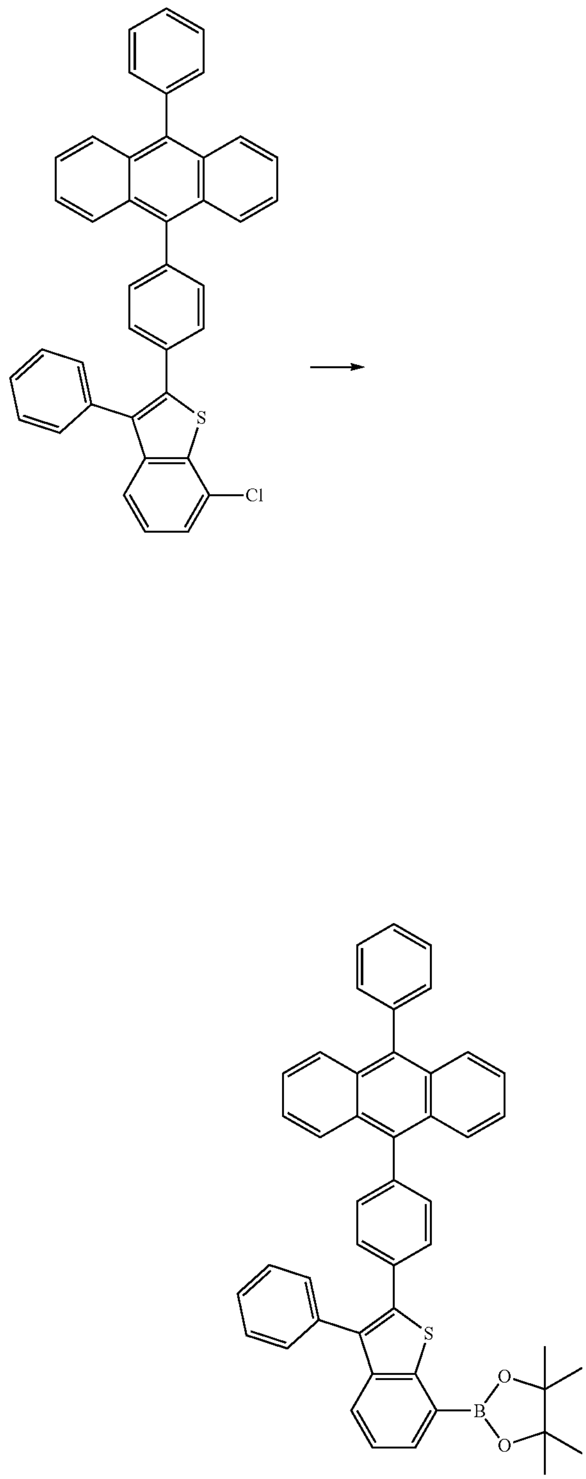

<Intermediate 6-d>

<Intermediate 6-d> was obtained in the same manner as in Synthesis Example 5-5, except that <Intermediate 6-c> was used instead of <Intermediate 5-d>. (yield 72%)

Synthesis Example 6-5: Synthesis of A-79

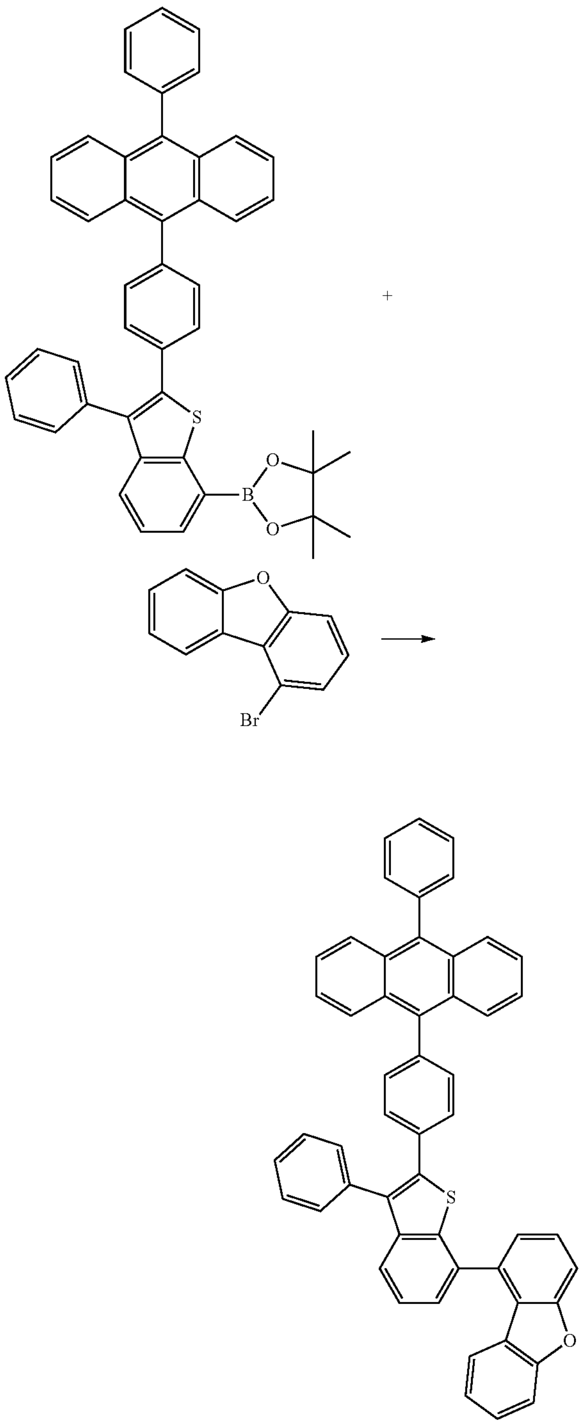

[A-79]

[A-79] was obtained in the same manner as in Synthesis Example 1-3, except that <Intermediate 6-d> was used instead of <Intermediate 1-b> and 1-bromodibenzo[b, d] furan was used instead of 10-phenylanthracene-9-boronic acid. (yield 75%)

MS (MALDI-TOF): m/z 704.22 [$M^+$]

Synthesis Example 7. Synthesis of A-89

Synthesis Example 7-1: Synthesis of Intermediate 7-a

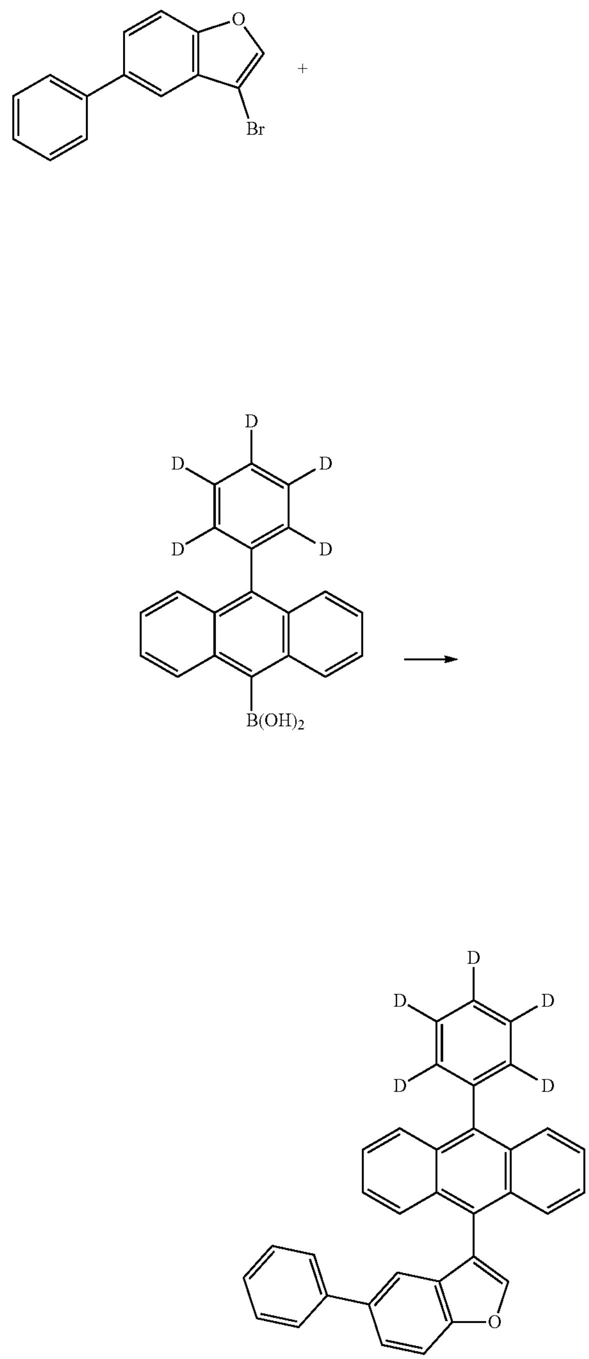

<Intermediate 7-a>

<Intermediate 7-a> was obtained in the same manner as in Synthesis Example 1-3, except that 3-bromo-5-phenylbenzofuran was used instead of <Intermediate 1-b> and 10-(phenyl-d5)-anthracene-9-boronic acid was used instead of 10-phenylanthracene-9-boronic acid. (yield 31%)

Synthesis Example 7-2: Synthesis of Intermediate 7-b

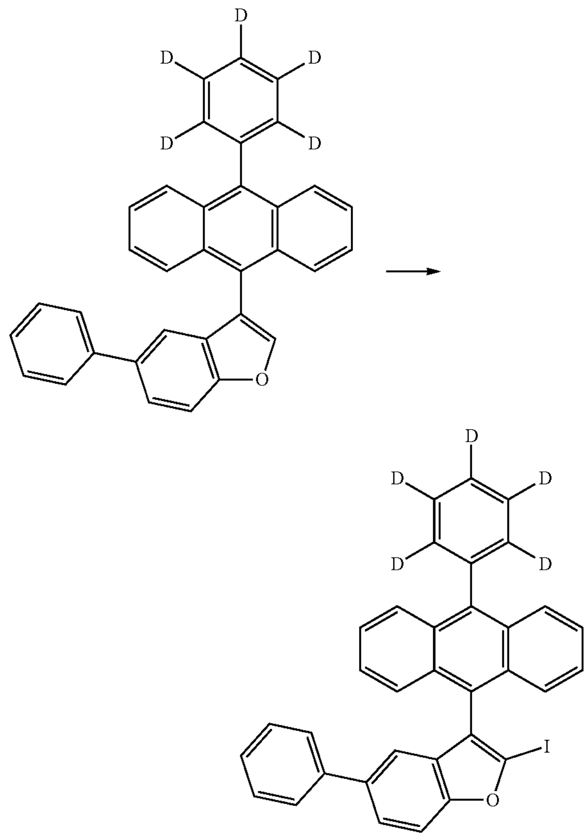

<Intermediate 7-b>

<Intermediate 7-b> was obtained in the same manner as in Synthesis Example 4-4, except that <Intermediate 7-a> was used instead of <Intermediate 4-c>. (yield 71%)

Synthesis Example 7-3: Synthesis of A-89

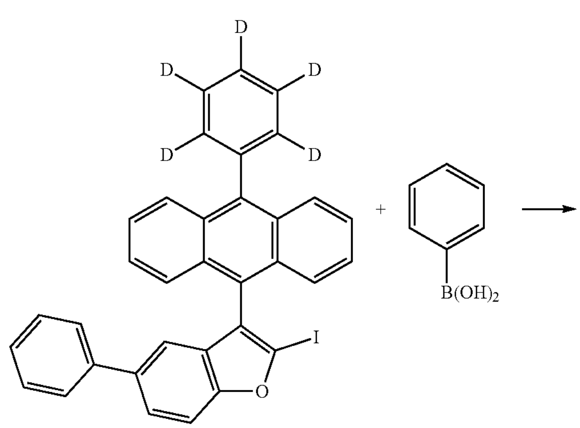

-continued

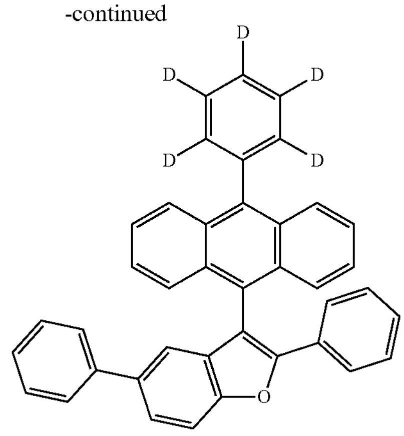

[A-89]

[A-89] was obtained in the same manner as in Synthesis Example 1-3, except that <Intermediate 7-b> was used instead of <Intermediate 1-b> and phenylboronic acid was used instead of 10-phenylanthracene-9-boronic acid. (yield 51%)

MS (MALDI-TOF): m/z 527.23 [$M^+$]

Synthesis Example 8. Synthesis of A-90

Synthesis Example 8-1: Synthesis of Intermediate 8-a

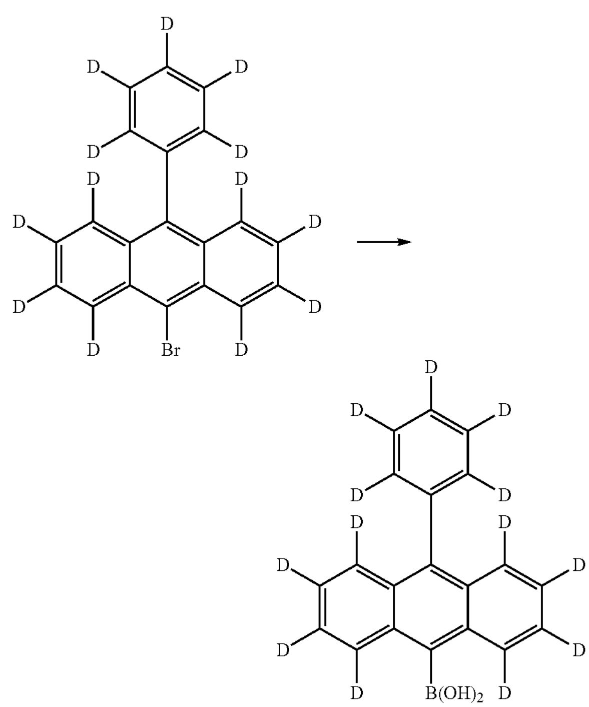

<Intermediate 8-a>

<Intermediate 8-a> was obtained in the same manner as in Synthesis Example 2-4, except that (anthracene-d8)-9-bromo-10-(phenyl-d5) was used instead of <Intermediate 2-c>. (yield 55%)

Synthesis Example 8-2: Synthesis of Intermediate 8-b

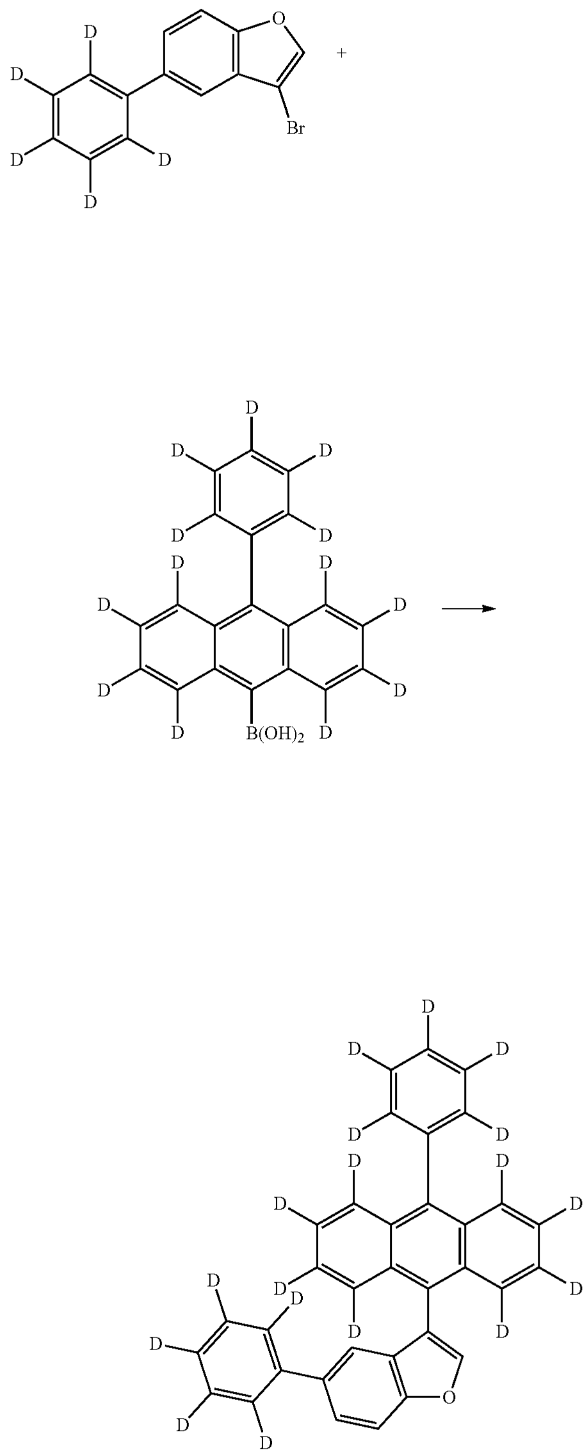

<Intermediate 8-b>

<Intermediate 8-b> was obtained in the same manner as in Synthesis Example 4-3, except that <Intermediate 8-a> was used instead of (4-(10-naphthalen-1-yl) anthracen-9-yl) benzeneboronic acid. (yield 55%)

Synthesis Example 8-3: Synthesis of Intermediate 8-c

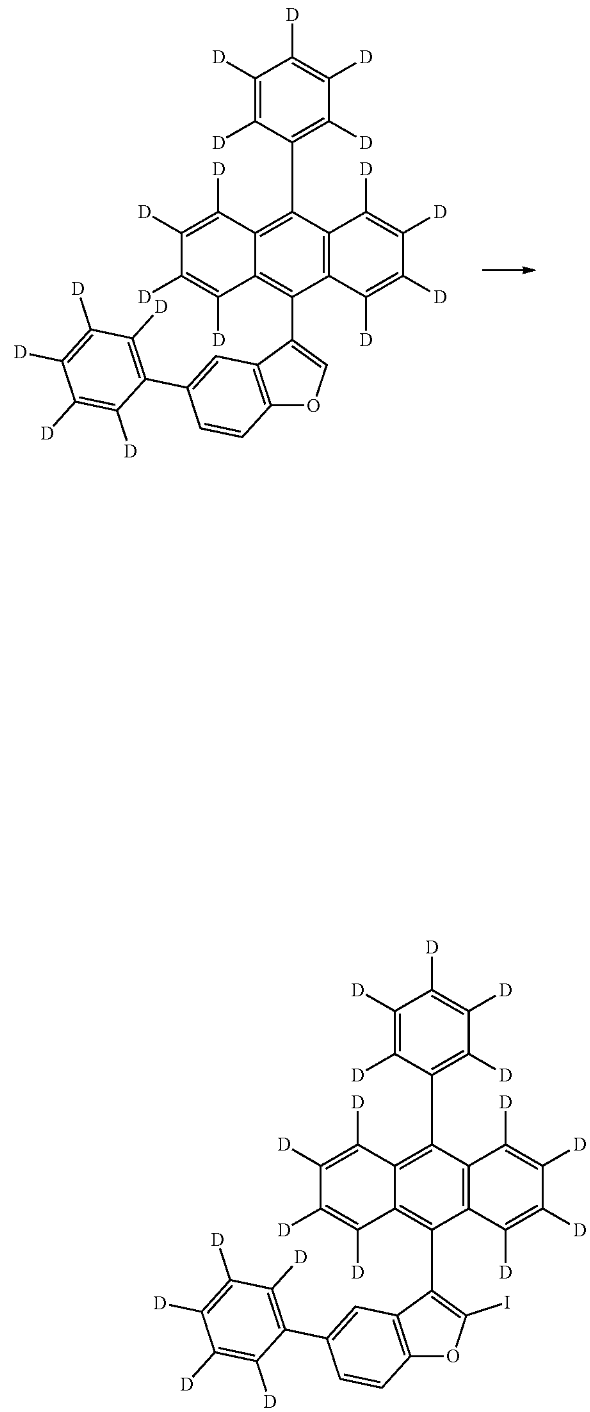

<Intermediate 8-c>

<Intermediate 8-c> was obtained in the same manner as in Synthesis Example 4-4, except that <Intermediate 8-b> was used instead of <Intermediate 4-c>. (yield 67%)

Synthesis Example 8-4: Synthesis of A-90

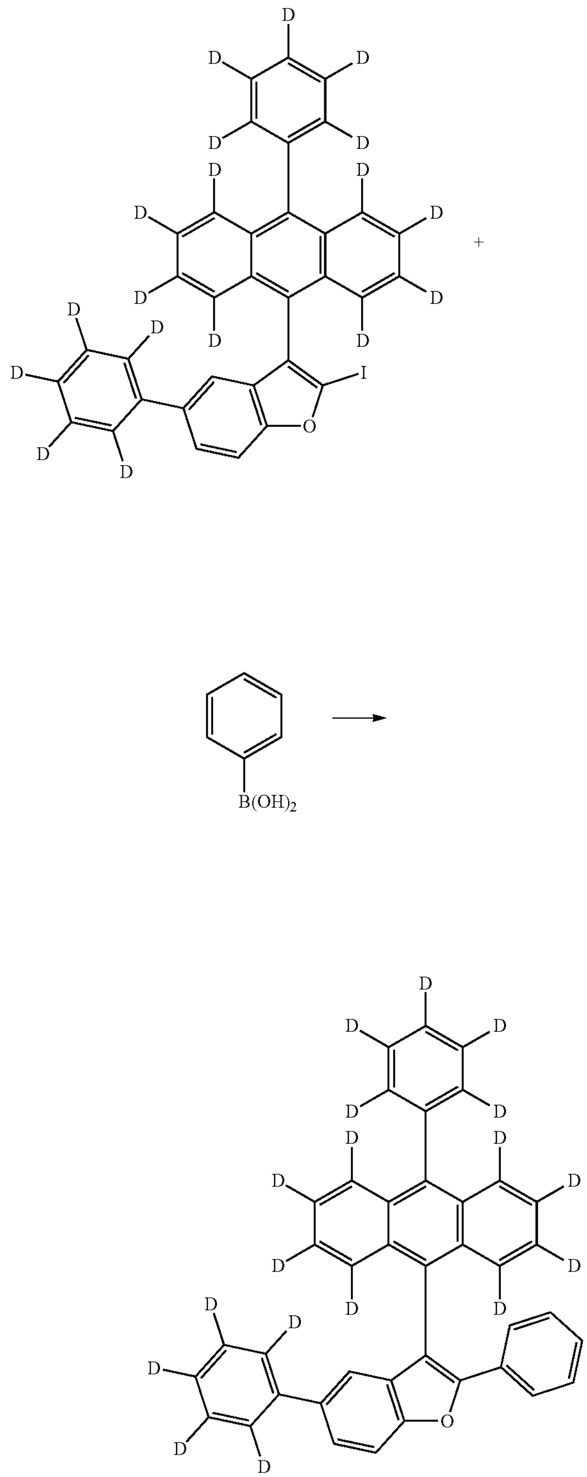

[A-90]

[A-90] was obtained in the same manner as in Synthesis Example 7-3, except that <Intermediate 8-c> was used instead of <Intermediate 7-b>. (yield 47%)

MS (MALDI-TOF): m/z 540.31 [$M^+$]

Synthesis Example 9. Synthesis of A-91

Synthesis Example 9-1: Synthesis of Intermediate 9-a

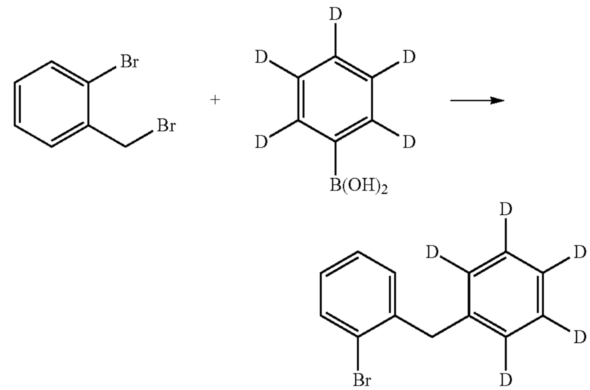

<Intermediate 9-a>

Bromobenzyl bromide (20 g, 0.08 mol), (phenyl-d5) boronic acid (10 g, 0.078 mol), sodium carbonate (10 g, 0.1 mol), and tetrakis(triphenylphosphine) palladium (0) (1.8 g, 0.002 mol) were heated to 50° C. in a 500 mL reactor and refluxed. 1 hour later, distilled water was added to the result, followed by stirring and layer separation. The organic layer was filtered, washed with toluene and then concentrated under reduced pressure. Then, the result was separated by column chromatography to obtain <Intermediate 9-a>. (16 g, 82%)

Synthesis Example 9-2: Synthesis of Intermediate 9-b

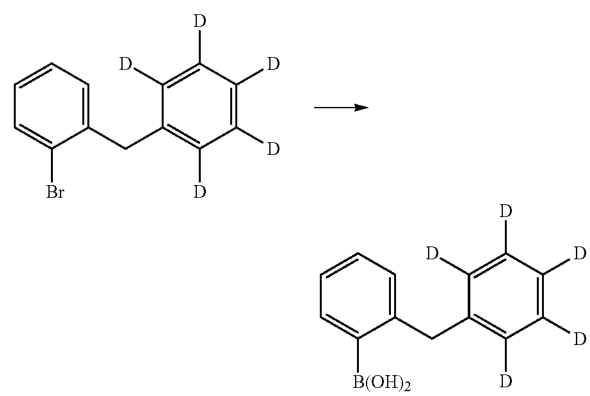

<Intermediate 9-b>

<Intermediate 9-a> (20 g, 0.08 mol) and THE 200 mL were added to a 500 mL reactor and then cooled to −78° C. and n-butyllithium (1.6 M) was added thereto. Further, trimethyl borate was slowly added thereto and slowly allowed to warm to room temperature. A 2M aqueous HCl solution was added to the result and stirred for 20 minutes, and layers were separated and washed with distilled water. The organic layer was concentrated and recrystallized with THE and heptane to obtain <Intermediate 9-b> (11 g, 63%).

Synthesis Example 9-3: Synthesis of Intermediate 9-c

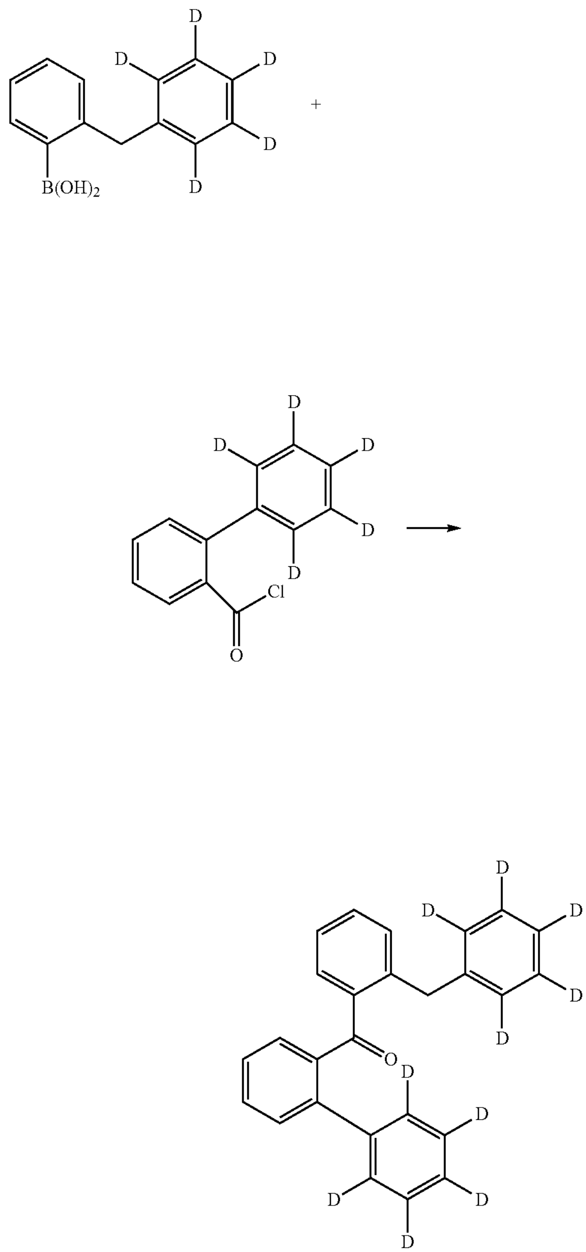

<Intermediate 9-c>

<Intermediate 9-b> (15 g, 0.07 mol), cesium carbonate (34 g, 0.1 mol), tetrakis(triphenylphosphine) palladium (0) (2.4 g, 0.002 mol), and toluene 150 mL were added to a 500 mL reactor and stirred. 1,1'-(biphenyl-d5)-2-carbonyl chloride (20 g, 0.09 mol) was added dropwise to the resulting reaction, followed by heating to 110° C. and refluxing. 2 hours later, toluene and distilled water were added to the result, followed by stirring and layer separation. The organic layer was filtered, concentrated under reduced pressure and then separated by column chromatography to obtain <Intermediate 9-c> (14 g, 57%).

Synthesis Example 9-4: Synthesis of Intermediate 9-d

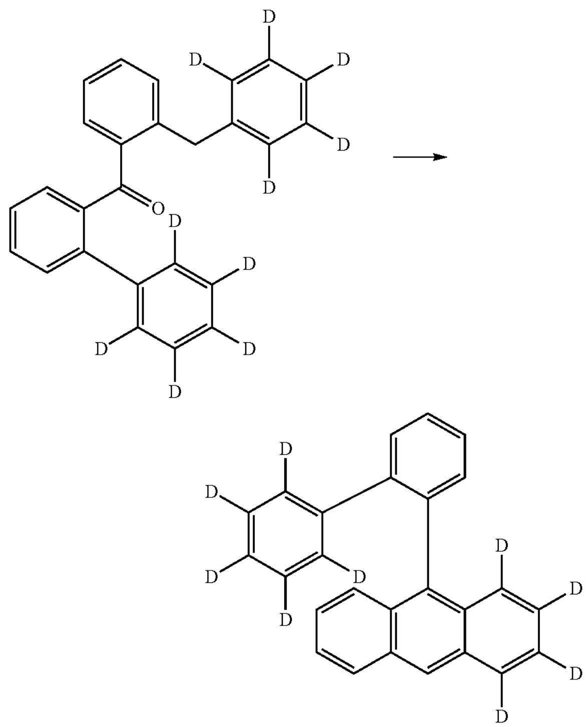

<Intermediate 9-d>

<Intermediate 9-c> (20 g, 0.06 mol), In(OTf) 3 (3.1 g, 0.006 mol), and dichlorobenzene 120 mL were added to a 500 mL reactor, heated to 110° C. and refluxed. 24 hours later, the result was filtered at 50° C. through celite, and washed with MC to separate the organic layer. The organic layer was concentrated under reduced pressure and separated by column chromatography. Then, the result was recrystallized to obtain <Intermediate 9-d>. (8 g, 43%)

Synthesis Example 9-5: Synthesis of Intermediate 9-e

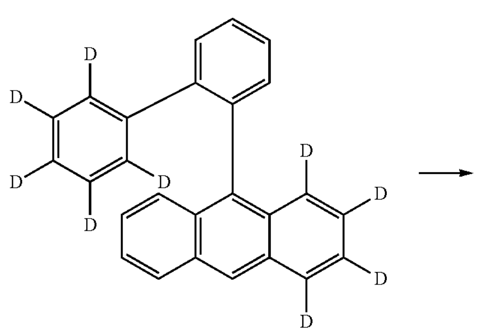

-continued

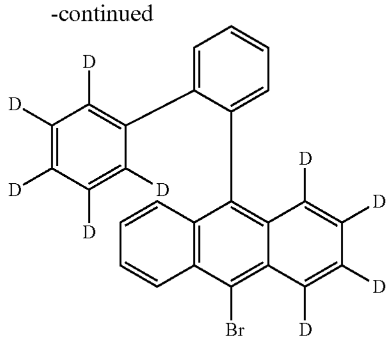

<Intermediate 9-e>

<Intermediate 9-d> (30 g, 0.09 mol) and DMF 300 mL were stirred in a 500 mL reactor and cooled to 0° C., and NBS (16 g, 0.09 mol) was added thereto, followed by allowing to warm to room temperature and stirring. 3 hours later, distilled water was added thereto, followed by filtering, washing and separation by column chromatography. Then, the result was recrystallized with methanol to obtain <Intermediate 9-e>. (33 g, 89%)

Synthesis Example 9-6: Synthesis of Intermediate 9-f

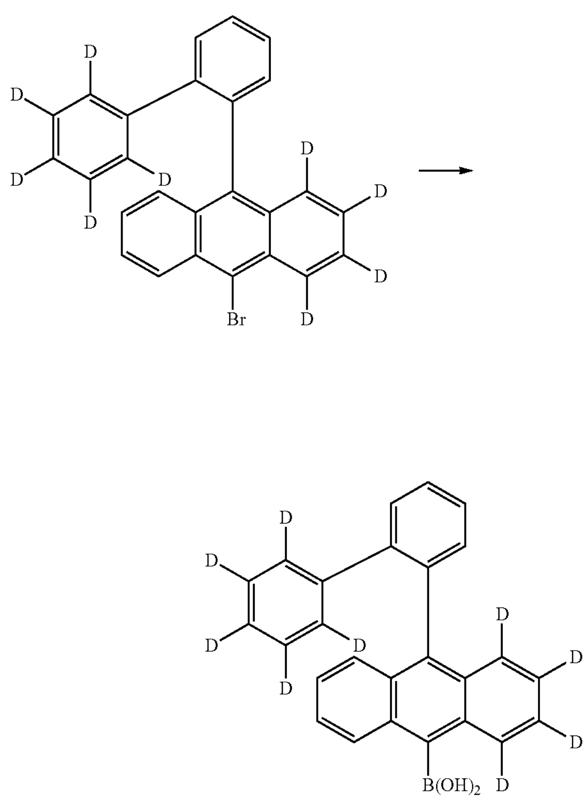

<Intermediate 9-f>

<Intermediate 9-f> was obtained in the same manner as in Synthesis Example 2-4, except that <Intermediate 9-e> was used instead of <Intermediate 2-c>. (yield 53%)

Synthesis Example 9-7: Synthesis of A-91

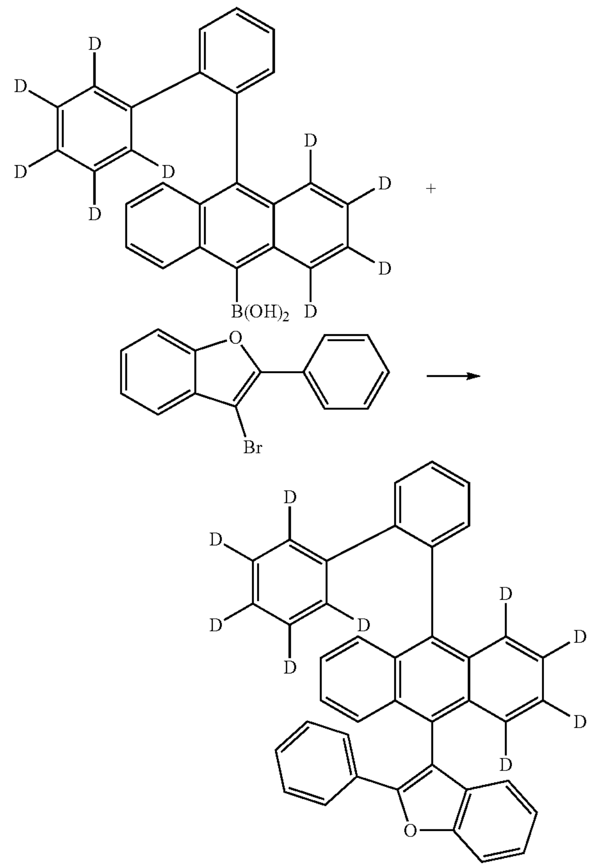

[A-91]

[A-91] was obtained in the same manner as in Synthesis Example 1-3, except that 3-bromo-2-phenylbenzofuran was used instead of <Intermediate 1-b> and <Intermediate 9-f> was used instead of 10-phenylanthracene-9-boronic acid. (yield 52%)

MS (MALDI-TOF): m/z 531.25 [$M^+$]

Synthesis Example 10. Synthesis of A-92

Synthesis Example 10-1: Synthesis of Intermediate 10-a

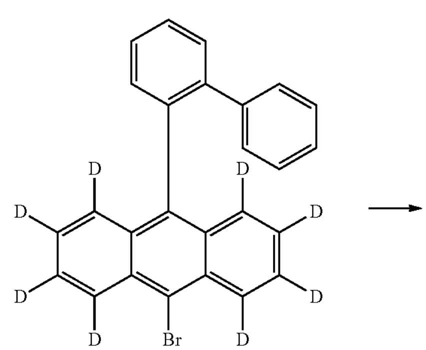

-continued

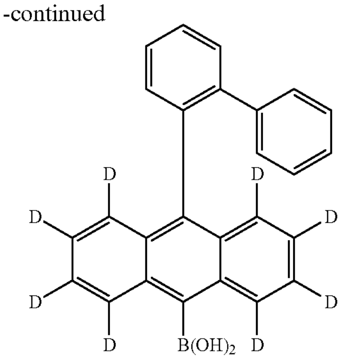

<Intermediate 10-a>

<Intermediate 10-a> was obtained in the same manner as in Synthesis Example 2-4, except that (anthracene-d8)-9-bromo-10-(1,1-biphenyl) was used instead of <Intermediate 2-c>. (yield 52%)

Synthesis Example 10-2: Synthesis of Intermediate 10-b

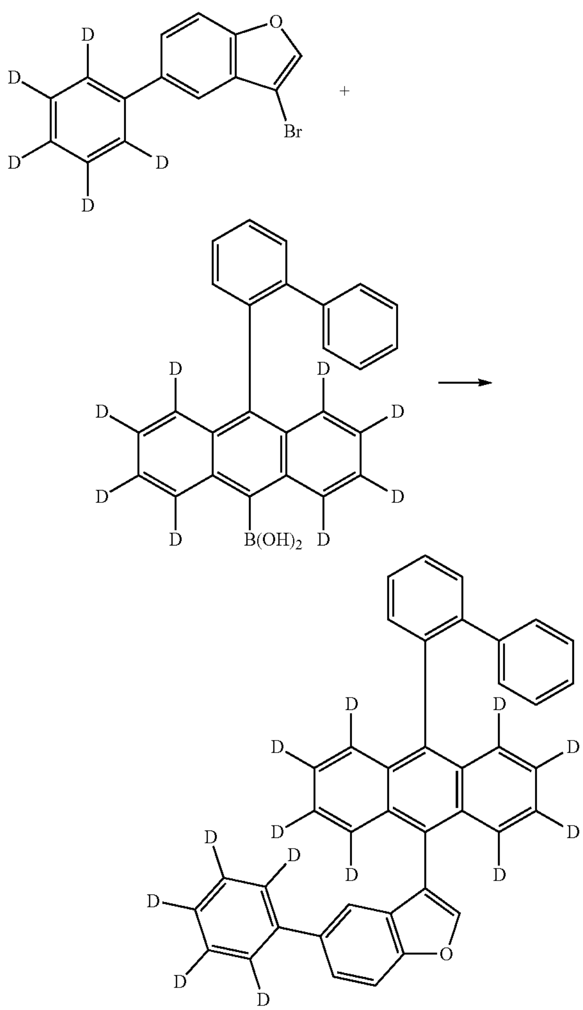

<Intermediate 10-b>

<Intermediate 10-b> was obtained in the same manner as in Synthesis Example 4-3, except that <Intermediate 10-a> was used instead of (4-(10-naphthalen-1-yl) anthracen-9-yl) benzeneboronic acid. (yield 54%)

Synthesis Example 10-3: Synthesis of Intermediate 10-c

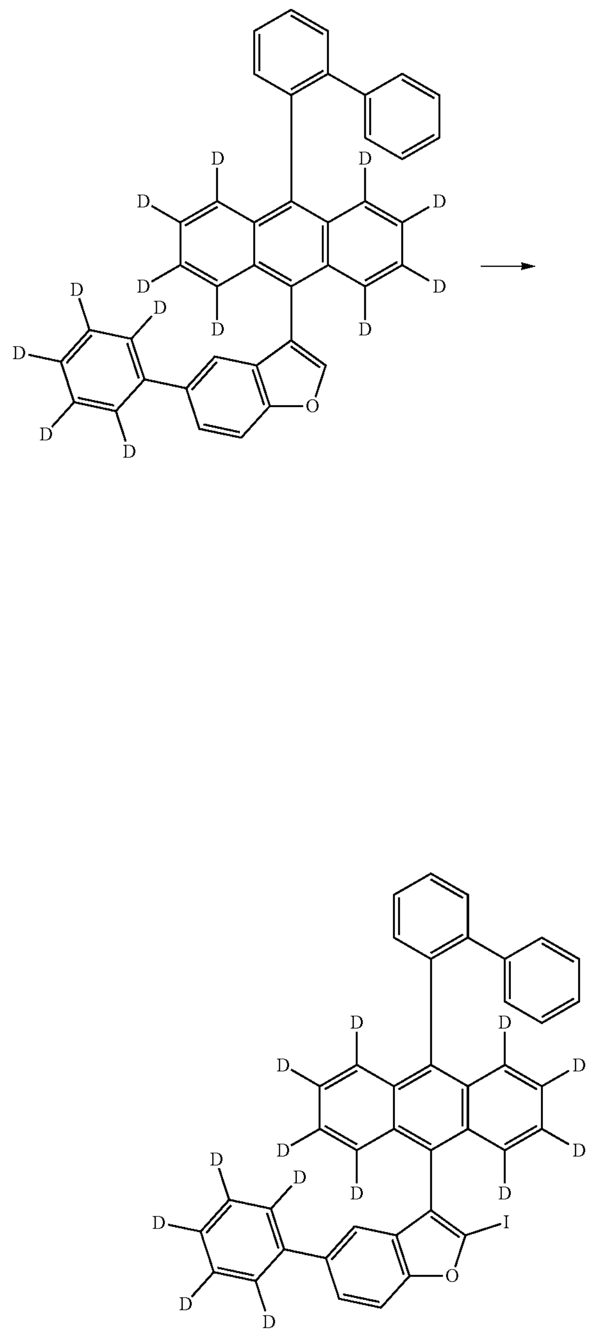

<Intermediate 10-c>

<Intermediate 10-c> was obtained in the same manner as in Synthesis Example 4-4, except that <Intermediate 10-b> was used instead of <Intermediate 4-c>. (yield 64%)

Synthesis Example 10-4: Synthesis of A-92

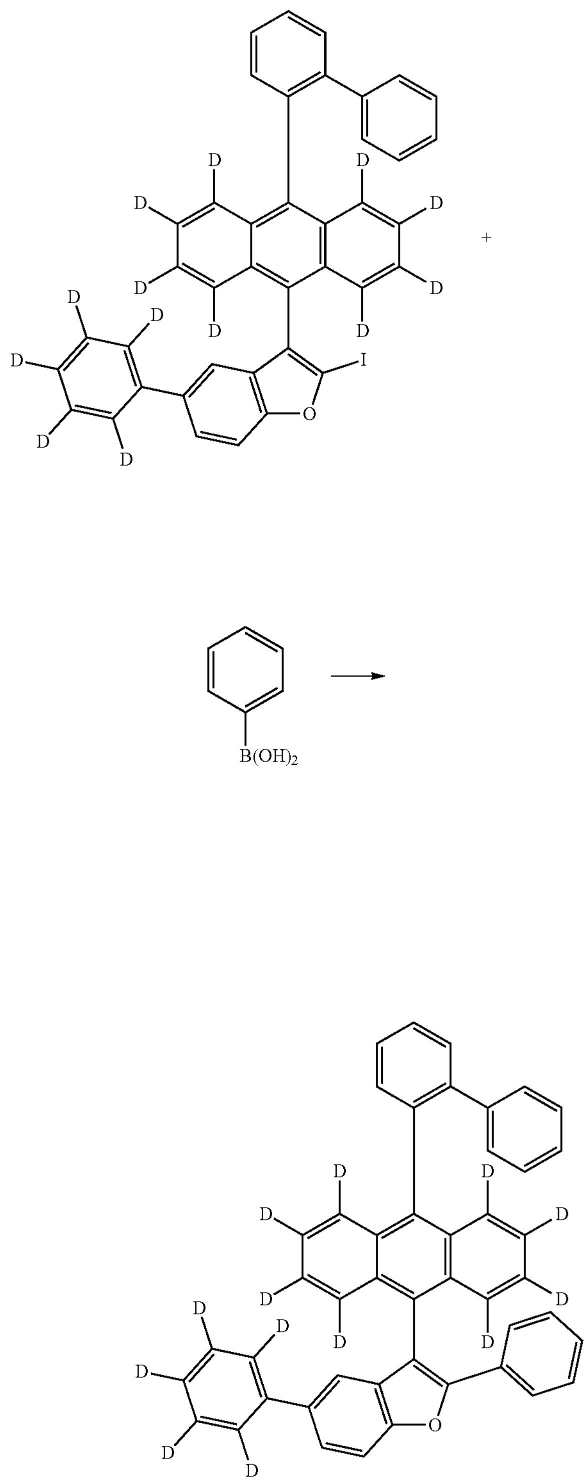

[A-92]

[A-92] was obtained in the same manner as in Synthesis Example 7-3, except that <Intermediate 10-c> was used instead of <Intermediate 7-b>. (yield 45%)

MS (MALDI-TOF): m/z 611.31 [$M^+$]

Synthesis Example 11. Synthesis of A-116

Synthesis Example 11-1: Synthesis of Intermediate 11-a

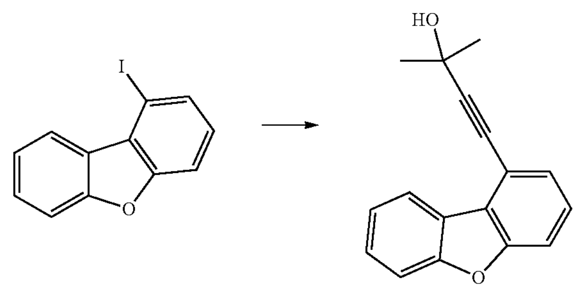

<Intermediate 11-a>

1-iododibenzofuran (25 g, 0.085 mol), tetrakis(triphenylphosphine) palladium (0.98 g, 0.001 mol) and 250 mL of trimethylamine were stirred in a 500 mL flask at room temperature and 2-methyl-3-butyn-2-ol (7.2 g, 0.085 mol) (8.3 mL) was added dropwise thereto. After completion of the reaction, excess heptane was added thereto and then the organic layer was concentrated under reduced pressure to obtain <Intermediate 11-a>. (15.3 g, 72%)

Synthesis Example 11-2: Synthesis of Intermediate 11-b

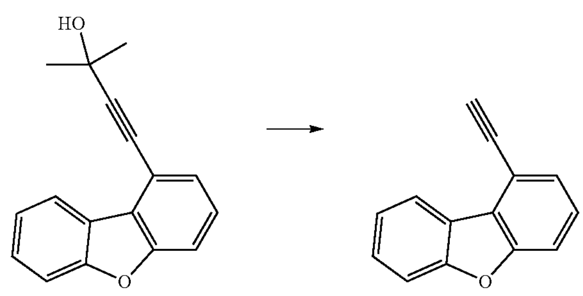

<Intermediate 11-b>

<Intermediate 11-b> (15.3 g, 0.061 mol) and toluene 100 mL were added to in a 500 mL flask, followed by heating to 70 to 75° C. under a nitrogen atmosphere in a reactor. Tetrabutylammonium hydroxide (1.59 g, 0.0061 mol) was added thereto, followed by stirring. The reaction was terminated by addition of a 2M hydrochloric acid. The reaction product was extracted with ethyl acetate, and the organic layer was concentrated under reduced pressure and separated by column chromatography to obtain <Intermediate 11-b>. (10.6 g, 90%)

Synthesis Example 11-3: Synthesis of Intermediate 11-c

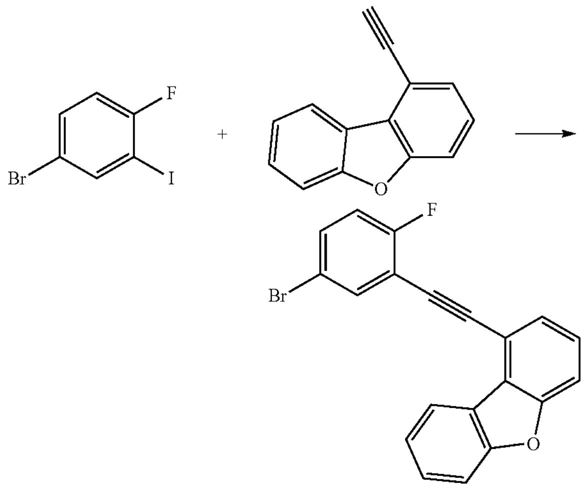

<Intermediate 11-c>

1-bromo-4-fluoro-3-iodobenzene (17.8 g, 0.059 mol), tetrakis(triphenylphosphine) palladium (0.68 g, 0.001 mol), copper iodide (0.56 g, 0.003 mol), and 180 mL of triethylamine were stirred in a 300 mL flask at room temperature, and then <Intermediate 11-b> (10.6 g, 0.059 mol) was added dropwise thereto. After completion of the reaction, excess heptane was poured into the reaction solution, followed by filtering.

The organic layer was concentrated under reduced pressure, crystallized with heptane and filtered to obtain <Intermediate 11-c>. (18.3 g, 85%)

Synthesis Example 11-4: Synthesis of Intermediate 11-d

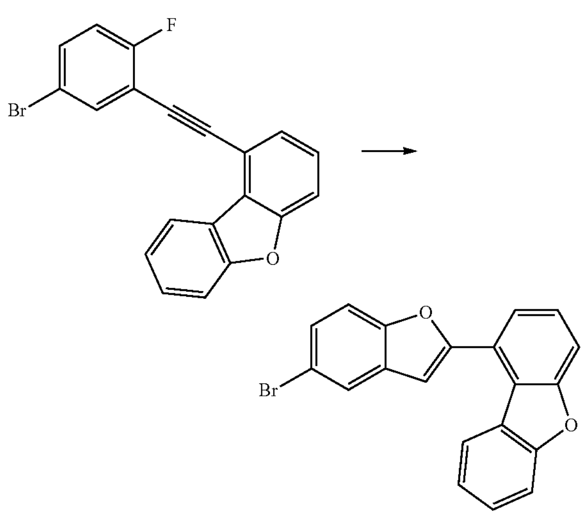

<Intermediate 11-d>

<Intermediate 11-c> (18.3 g, 0.05 mol), copper iodide (0.95 g, 0.005 mol), potassium hydroxide (10.1 g, 0.028 mol), potassium iodide (1.66 g, 0.01 mol), and dimethylsulfoxide 180 mL were added to a 500 mL flask and heated to 80 to 90° C., followed by stirring. After completion of the reaction, the organic layer was concentrated under reduced pressure and separated by column chromatography to obtain <Intermediate 11-d>. (13.4 g, 74%)

Synthesis Example 11-5: Synthesis of A-116

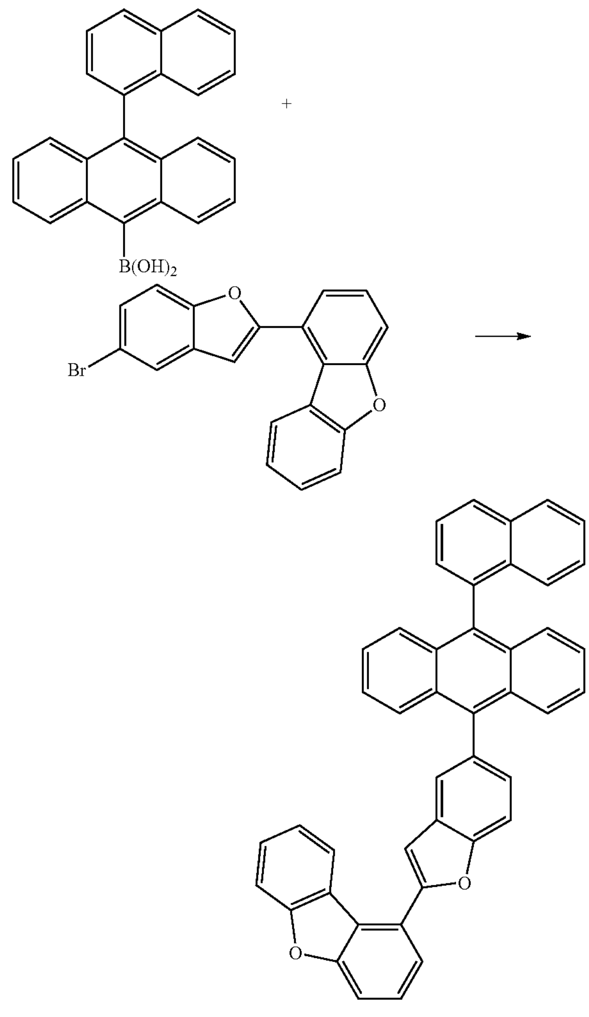

[A-116]

[A-116] was obtained in the same manner as in Synthesis Example 4-3, except that [10-(naphthalen-1-yl) anthracen-9-yllboronic acid was used instead of [4-(10-naphthalen-1-yl) anthracen-9-yl]benzeneboronic acid and <Intermediate 11-d> was used instead of <Intermediate 1-b>. (yield 63%)

MS (MALDI-TOF): m/z 586.19 [$M^+$]

Synthesis Example 12. Synthesis of A-137

Synthesis Example 12-1: Synthesis of A-137

[A-137] was obtained in the same manner as in Synthesis Example 2-5, except that 5-bromo-2-phenylbenzofuran was used instead of 2-bromo-3-phenylbenzofuran. (yield 52%)

MS (MALDI-TOF): m/z 455.22 [$M^+$]

Synthesis Example 13. Synthesis of A-144

Synthesis Example 13-1: Synthesis of Intermediate 13-a

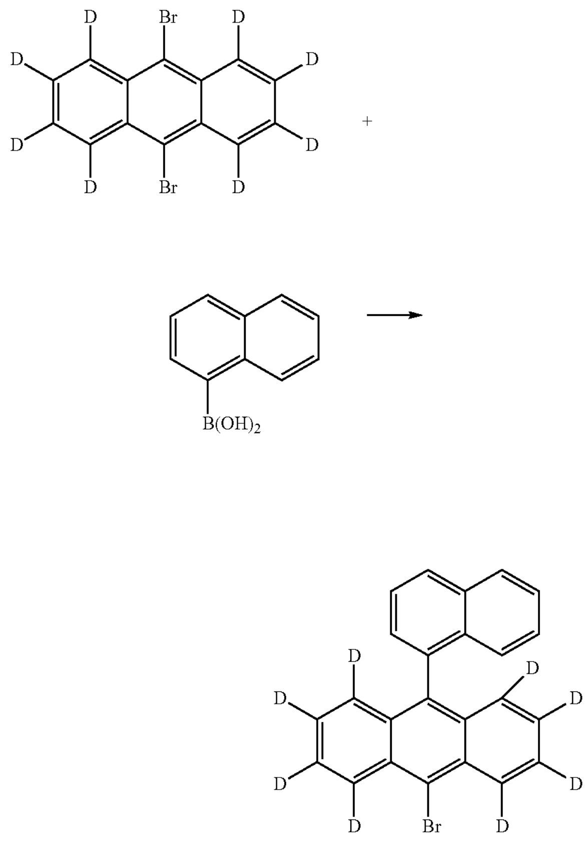

<Intermediate 13-a>

<Intermediate 13-a> was obtained in the same manner as in Synthesis Example 1-3, except that 9,10-dibromo (anthracene-d8) was used instead of <Intermediate 1-b> and 1-naphthaleneboronic acid was used instead of 10-phenylanthracene-9-boronic acid. (yield 64%)

Synthesis Example 13-2: Synthesis of Intermediate 13-b

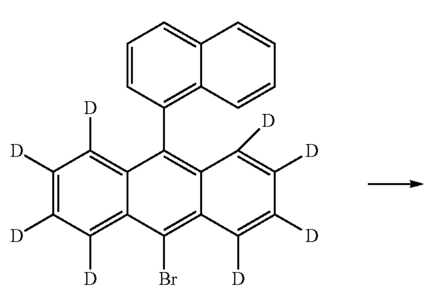

-continued

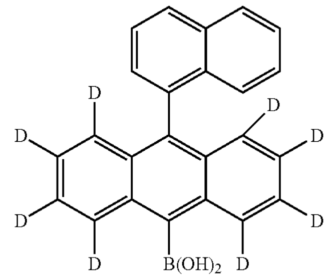

<Intermediate 13-b>

<Intermediate 13-b> was obtained in the same manner as in Synthesis Example 2-4, except that <Intermediate 13-a> was used instead of <Intermediate 2-c>. (yield 75%)

Synthesis Example 13-3: Synthesis of Intermediate 13-c

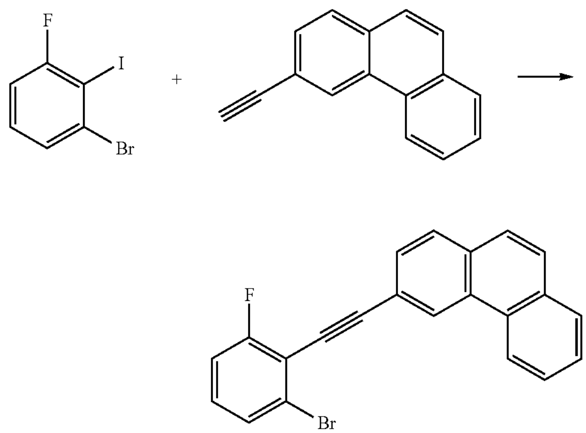

<Intermediate 13-c>

<Intermediate 13-c> was obtained in the same manner as in Synthesis Example 11-3, except that 1-bromo-3-fluoro-2-iodobenzene was used instead of 1-bromo-4-fluoro-3-iodobenzene, and 3-ethynyl phenanthrene was used instead of <Intermediate 11-b>. (yield 84%)

Synthesis Example 13-4: Synthesis of Intermediate 13-d

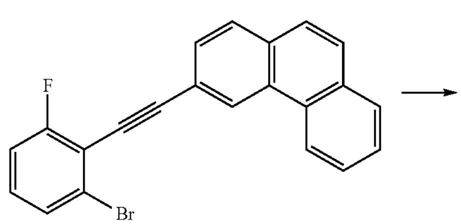

-continued

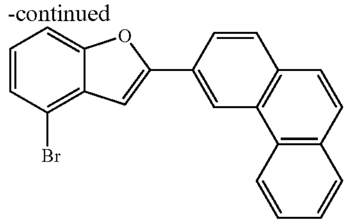

<Intermediate 13-d>

<Intermediate 13-d> was obtained in the same manner as in Synthesis Example 11-4, except that <Intermediate 13-d> was used instead of <Intermediate 11-c>. (yield 79%)

Synthesis Example 13-5: Synthesis of A-144

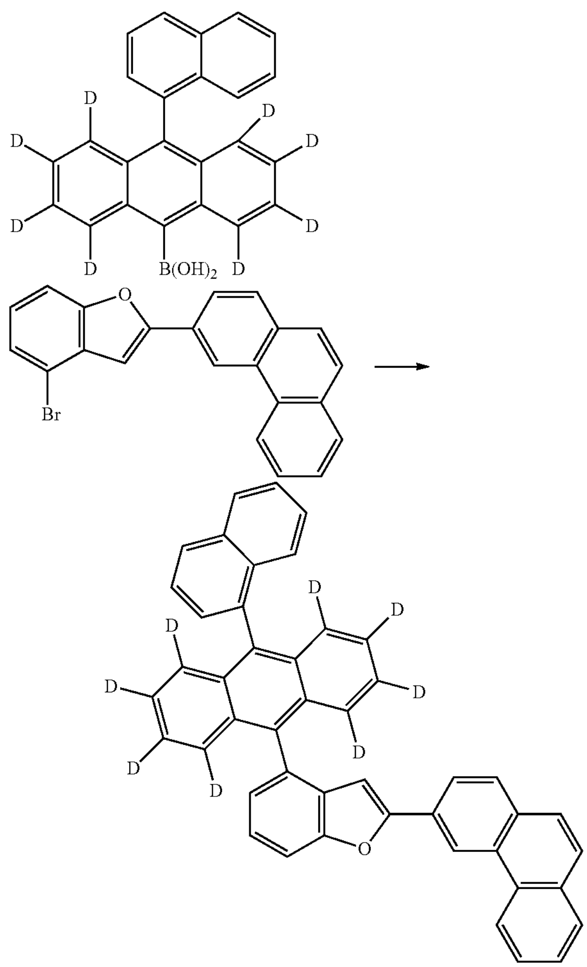

[A-144]

[A-144] was obtained in the same manner as in Synthesis Example 1-3, except that <Intermediate 13-d> was used instead of <Intermediate 1-b>, and <Intermediate 13-b> was used instead of 10-phenylanthracene-9-boronic acid. (yield 60%)

MS (MALDI-TOF): m/z 604.26 [$M^+$]

Synthesis Example 14. Synthesis of A-161

Synthesis Example 14-1: Synthesis of Intermediate 14-a

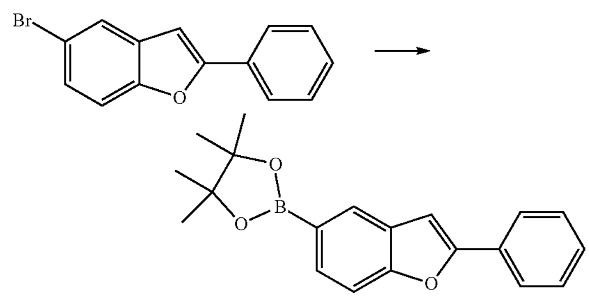

<Intermediate 14-a>

5-bromo-2-phenylbenzofuran (50 g, 0.183 mol), bis(pinacolato)diboron (55.8 g, 0.22 mol), palladium (II) dichloride (diphenylphosphine ferrocene) (4.5 g, 0.005 mol), potassium acetate (53.9 g, 0.55 mol), and 500 mL of toluene were added to a 1 L flask and then refluxed. After completion of the reaction, the reaction product was concentrated under reduced pressure and then separated by column chromatography to obtain <Intermediate 14-a>. (47.1 g, 80%)

Synthesis Example 14-2: Synthesis of Intermediate 14-b

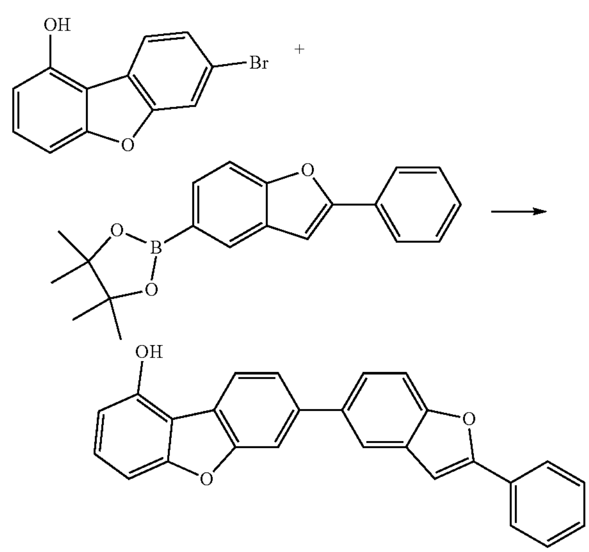

<Intermediate 14-b>

<Intermediate 14-a> (47.1 g, 0.147 mol), 7-bromo-1-hydroxydibenzofuran (35 g, 0.133 mol), palladium (II) dichloride (diphenylphosphine ferrocene) (2.17 g, 0.003 mol), sodium bicarbonate (22.35 g, 0.266 mol), 420 mL of tetrahydrofuran, and 140 mL of water were added to a 1 L flask and then refluxed. After completion of the reaction, the reaction product was cooled to room temperature and the resulting solid was filtered with dichloromethane to obtain <Intermediate 14-b>. (41.5 g, 83%)

Synthesis Example 14-3: Synthesis of Intermediate 14-c

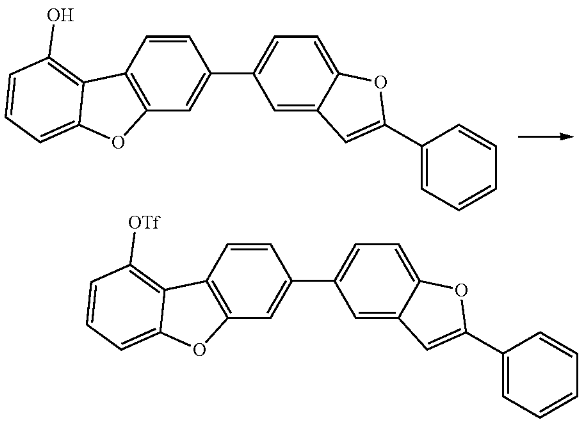

<Intermediate 14-c>

<Intermediate 14-b> (41.5 g, 0.11 mol), pyridine (17.44 g, 0.220 mol) (17.8 mL), and dichloromethane (415 mL) were added to a 1 L flask, and the reactor was cooled to 0° C. in a nitrogen atmosphere, followed by stirring. Trifluoromethanesulfonic anhydride (46.7 g, 0.165 mol) (28 mL) was added dropwise to the resulting product, followed by stirring at room temperature. The reaction was terminated by addition of water and the organic layer was concentrated under reduced pressure to obtain <Intermediate 14-c>. (48.2 g, 86%)

Synthesis Example 14-4: Synthesis of Intermediate 14-d

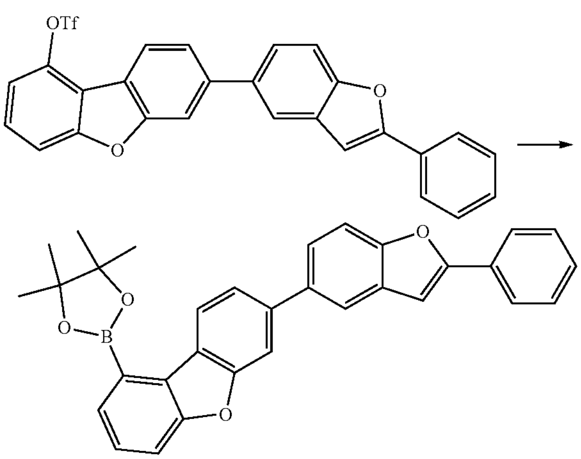

<Intermediate 14-d>

<Intermediate 14-c> (48.2 g, 0.095 mol), bis(pinacolato) diboron (28.9 g, 0.114 mol), palladium (II) dichloride (diphenylphosphine ferrocene) (2.32 g, 0.003 mol), potassium acetate (27.91 g, 0.284 mol), and 480 mL of toluene were added to a 1 L flask, followed by refluxing. After completion of the reaction, the resulting product was concentrated under reduced pressure and then separated by column chromatography to obtain <Intermediate 14-d>. (37.2 g, 81%)

Synthesis Example 14-5: Synthesis of A-161

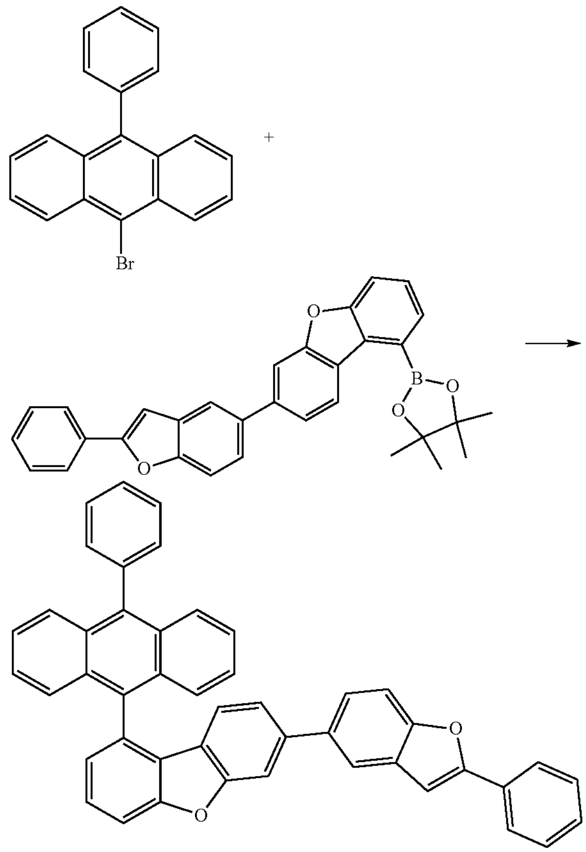

[A-161]

9-bromo-10-phenylanthracene (10.0 g, 0.030 mol), <Intermediate 14-d> (16.1 g, 0.033 mol), palladium (II) dichloride (diphenylphosphine ferrocene) (0.49 g, 0.001 mol), sodium bicarbonate (5.04 g, 0.06 mol), 120 mL of tetrahydrofuran, and 40 mL of distilled water added to a 300 mL flask, followed by stirring. After completion of the reaction, excess methanol was poured at room temperature to form a solid, and the resulting product was filtered and recrystallized with toluene and acetone to obtain [A-161]. (12.7 g, 69%)

MS (MALDI-TOF): m/z 612.21 [$M^+$]

Synthesis Example 15. Synthesis of B-119

Synthesis Example 15-1: Synthesis of B-119

14.0 g of 4,4"-diiodo-p-terphenyl, 18.3 g of [4-(benzoxazol-2-yl)phenyl]phenylamine, 13.2 g of potassium carbonate, 0.3 g of a copper powder, 0.9 g of sodium bisulfite, 0.7 g of 3,5-di-tert-butyl salicylic acid, and 30 mL of added to a nitrogen-purged reaction dodecylbenzene were vessel, followed by heating and stirring at 210° C. for 44 hours. The reaction product was cooled to room temperature and 50 mL toluene was added thereto, followed by filtering. 1,2-dichlorobenzene 230 mL was added to the filtrate, followed by heating and hot filtering. The filtrate was concentrated and the resulting crystals were filtered with 1,2-dichlorobenzene to obtain [B-119] as a yellow solid. (10.9 g, 47%)

MS (MALDI-TOF): m/z 800.32 [M+]

Synthesis Example 16. Synthesis of B-120

Synthesis Example 16-1: Synthesis of B-120

[B-120] was obtained in the same manner as in Synthesis Example 15-1, except that 4,4'-diiodobiphenyl was used instead of 4,4"-diiodo-p-terphenyl. (yield 54%)

MS (MALDI-TOF): m/z 724.28 [M+]

Synthesis Example 17. Synthesis of C-10

Synthesis Example 17-1: Synthesis of C-10

5.6 g of ([1,1',2', 1"]terphenyl-4'-yl)-amine, 14.4 g of 2-(4-bromophenyl)benzooxazole, 4.4 g of t-butoxy sodium, and 60 mL of toluene were added to a reaction vessel, followed by nitrogen purging while ultrasonicating for 30 minutes. 0.1 g of palladium acetate and 0.4 mL of a 50% (w/v) solution of tri-(t-butyl)phosphine in toluene were further added to the reaction vessel, followed by stirring one night under reflux. The reaction vessel was allowed to cool, methanol was added thereto and the precipitated solid was collected to obtain a product. The product was precipitated by crystallization and purification using toluene/acetone to obtain [C-10] as a yellow sold. (11 g, 76.4%)

MS (MALDI-TOF): m/z 631.23 [M+]

Synthesis Example 18. Synthesis of C-27

Synthesis Example 18-1: Synthesis of C-27

10 g of tri (4-bromophenyl)amine, 11.5 g of benzo[d]oxazole-2-yl boronic acid, 17.2 g of potassium carbonate, and 1.2 g of tetrakis(triphenylphosphine) palladium (0) were added to 150 mL of toluene, 40 mL of ethanol and 20 mL of distilled water in a reaction vessel and allowed to react by stirring at 90° C. for 12 hours. After completion of the reaction, the reaction product was subject to column purification to obtain [C-27]. (9.2 g, 74.3%)

MS (MALDI-TOF): m/z 596.18 [M+]

Synthesis Example 19. Synthesis of C-60

Synthesis Example 19-1: Synthesis of C-60

6.2 g of ([1,1', 2', 1"]terphenyl-4'-yl)-amine, 16.1 g of 2-(4-bromophenyl)benzothiazole, 7.3 g of t-butoxy sodium, and 160 mL of toluene were added to a reaction vessel, followed by nitrogen purging while ultrasonicating for 30 minutes. 0.2 g of palladium acetate and 0.6 mL of a 50% (w/v) solution of tri-(t-butyl)phosphine in toluene were further added to the reaction vessel, followed by stirring one night under reflux. The reaction vessel was allowed to cool to 80° C., the result was filtered through silica gel, and the filtrate was concentrated with methanol to obtain a product. The product was recrystallized with toluene to obtain [C-60] as a yellow sold. (9.7 g, 58%)

MS (MALDI-TOF): m/z 663.18 [M+]

Examples 1 to 31: Fabrication of Organic Light-Emitting Device

ITO glass was patterned such that a light-emitting area of the ITO glass was adjusted to 2 mm×2 mm and was then washed. The ITO glass was mounted in a vacuum chamber, a base pressure was set to 1×10-7 torr, and 2-TNATA (4,4',4"-tris[2-naphthyl(phenyl)amino]triphenylamine) (700 Å) and [Formula F](600 Å) were sequentially deposited on ITO. Then, a mixture of each of compounds according to [Formula A-1] to [Formula A-6] of the present invention and a dopant (D-211) (3 wt %) was deposited thereon to form a to a 200 Å-thick light-emitting layer. Then, [Formula E-2] was deposited thereon to form a 300 Å-thick electron transport layer, [Formula E-1] was deposited thereon to form a 10 Å-thick electron injection layer, and MgAg was deposited thereon to a thickness of 120 Å. Finally, the compound according to [Formula B] or [Formula C] of the present invention was deposited thereon to form a 600 Å-thick capping layer, thereby fabricating an organic light-emitting device. The luminescent properties of the organic light-emitting device were measured at 10 mA/cm$^2$.

[Formula F]

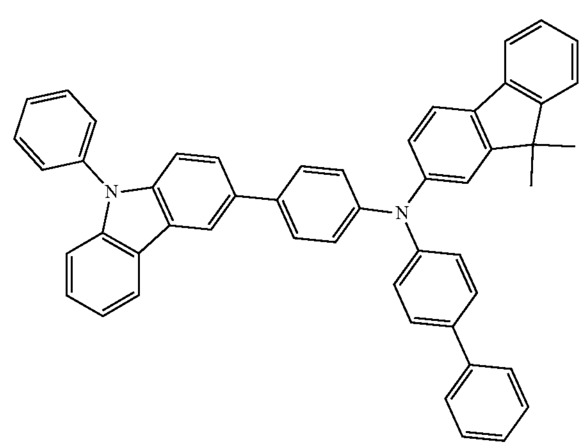

[Formula E-1]

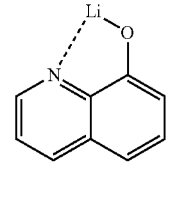

-continued

[Formula E-2]

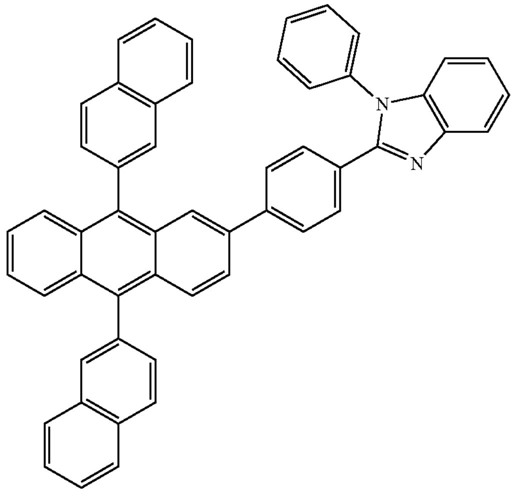

[D-211]

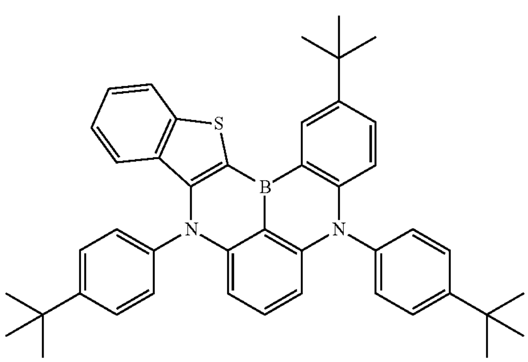

Comparative Examples 1 to 17

An organic light-emitting device was fabricated in the same manner as in Example above, except that [BH] was used instead of the host compound used in Example above, and $Alq_3$ or [CPL-1] was used instead of the compound for the capping layer, and the luminescent properties of the organic light-emitting device were measured at 10 $mA/cm^2$. The structures of [BH] and [CPL-1] are as follows:

[BH]

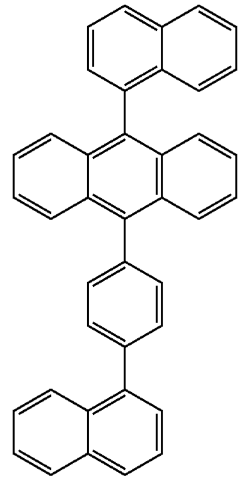

[CPL-1]

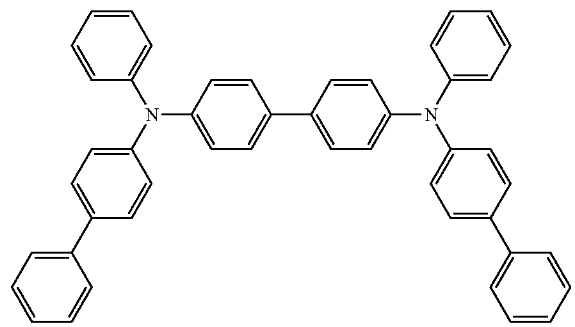

TABLE 1

| Item | Host | Capping layer | Current density ($mA/cm^2$) | External quantum efficiency (EQE, %) |
|---|---|---|---|---|
| Example 1 | A-20 | B-119 | 10 | 17.13 |
| Example 2 | A-30 | B-119 | 10 | 16.08 |
| Example 3 | A-58 | B-119 | 10 | 16.74 |
| Example 4 | A-79 | B-119 | 10 | 16.41 |
| Example 5 | A-89 | B-119 | 10 | 16.93 |
| Example 6 | A-91 | B-119 | 10 | 16.82 |
| Example 7 | A-137 | B-119 | 10 | 16.58 |
| Example 8 | A-144 | B-119 | 10 | 16.45 |
| Example 9 | A-20 | B-120 | 10 | 17.25 |
| Example 10 | A-30 | B-120 | 10 | 16.15 |
| Example 11 | A-58 | B-120 | 10 | 16.65 |
| Example 12 | A-79 | B-120 | 10 | 16.53 |
| Example 13 | A-89 | B-120 | 10 | 17.02 |
| Example 14 | A-91 | B-120 | 10 | 17.21 |
| Example 15 | A-137 | B-120 | 10 | 16.74 |
| Example 16 | A-144 | B-120 | 10 | 16.52 |
| Example 17 | A-20 | C-10 | 10 | 17.17 |
| Example 18 | A-89 | C-10 | 10 | 16.97 |
| Example 19 | A-91 | C-10 | 10 | 17.05 |
| Example 20 | A-137 | C-10 | 10 | 16.67 |
| Example 21 | A-144 | C-10 | 10 | 16.24 |
| Example 22 | A-20 | C-27 | 10 | 17.23 |
| Example 23 | A-89 | C-27 | 10 | 17.02 |
| Example 24 | A-91 | C-27 | 10 | 17.12 |
| Example 25 | A-137 | C-27 | 10 | 16.65 |
| Example 26 | A-144 | C-27 | 10 | 16.54 |
| Example 27 | A-20 | C-60 | 10 | 17.11 |
| Example 28 | A-89 | C-60 | 10 | 16.95 |
| Example 29 | A-91 | C-60 | 10 | 17.04 |
| Example 30 | A-137 | C-60 | 10 | 16.76 |

TABLE 1-continued

| Item | Host | Capping layer | Current density ($mA/cm^2$) | External quantum efficiency (EQE, %) |
|---|---|---|---|---|
| Example 31 | A-144 | C-60 | 10 | 16.35 |
| Comparative Example 1 | A-20 | $Alq_3$ | 10 | 14.12 |
| Comparative Example 2 | A-89 | $Alq_3$ | 10 | 13.97 |
| Comparative Example 3 | A-91 | $Alq_3$ | 10 | 14.15 |
| Comparative Example 4 | A-137 | $Alq_3$ | 10 | 13.86 |
| Comparative Example 5 | A-144 | $Alq_3$ | 10 | 13.62 |
| Comparative Example 6 | A-20 | CPL-1 | 10 | 14.39 |
| Comparative Example 7 | A-89 | CPL-1 | 10 | 14.12 |
| Comparative Example 8 | A-91 | CPL-1 | 10 | 14.28 |
| Comparative Example 9 | A-137 | CPL-1 | 10 | 13.95 |
| Comparative Example 10 | A-144 | CPL-1 | 10 | 13.78 |
| Comparative Example 11 | BH | B-119 | 10 | 12.94 |
| Comparative Example 12 | BH | B-120 | 10 | 13.07 |
| Comparative Example 13 | BH | C-10 | 10 | 12.97 |
| Comparative Example 14 | BH | C-27 | 10 | 13.15 |
| Comparative Example 15 | BH | C-60 | 10 | 13.04 |
| Comparative Example 16 | BH | $Alq_3$ | 10 | 12.44 |
| Comparative Example 17 | BH | CPL-1 | 10 | 12.65 |

As can be seen from [Table 1] above, the organic light-emitting device that contains each of the compounds according to [Formula A-1] to [Formula A-6] of the present invention as a host compound for the light-emitting layer in the organic light-emitting device, and the compound according to [Formula B] or [Formula C] of the present invention as a material for a capping layer provided in the organic light-emitting device can exhibit remarkably improved efficiency, compared to an organic light-emitting device containing a conventional compound and the compound ([BH] and [CPL-1]) structurally different from the specific structure of the compound according to the present invention.

According to the present invention, a high-efficiency organic light-emitting device can be realized using an anthracene derivative compound having a characteristic structure as a host for a light-emitting further forming a capping layer and using a polycyclic compound as a dopant for the light-emitting layer, and is thus useful for lighting systems as well as various displays such as flat panel displays, flexible displays and wearable displays.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Abstract of the Invention

Disclosed is a highly efficient organic light-emitting device that uses an anthracene derivative having a characteristic structure as a host compound in a light-emitting layer of the organic light-emitting device and includes a capping layer formed using a compound having a characteristic structure in the organic light-emitting device.

What is claimed is:

1. An organic light-emitting device comprising:

a first electrode;

a second electrode facing the first electrode;

a light-emitting layer interposed between the first electrode and the second electrode; and a capping layer disposed on one surface of the first electrode or the second electrode which is opposite to a remaining surface of the first electrode or the second electrode that faces the light-emitting layer, wherein the light-emitting layer comprises at least one selected from compounds represented by the following [Formula A-1] to [Formula A-6], and the capping layer comprises at least one of compounds represented by the following [Formula B] or [Formula C]:

[Formula A-1]

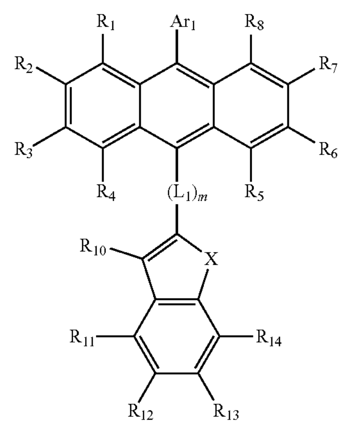

[Formula A-2]

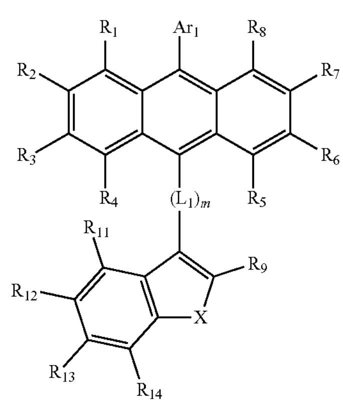

-continued

[Formula A-3]

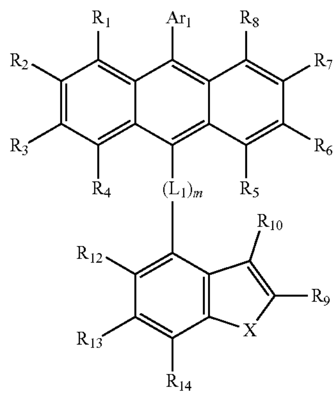

[Formula A-4]

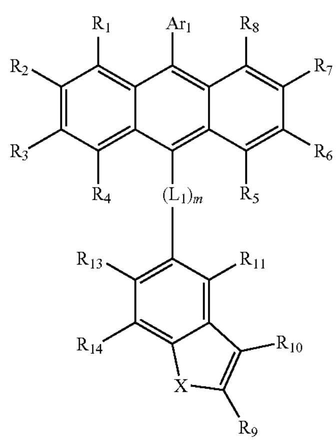

[Formula A-5]

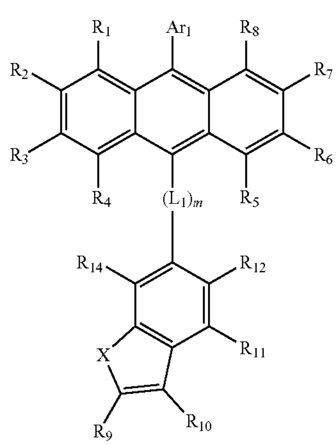

-continued

[Formula A-6]

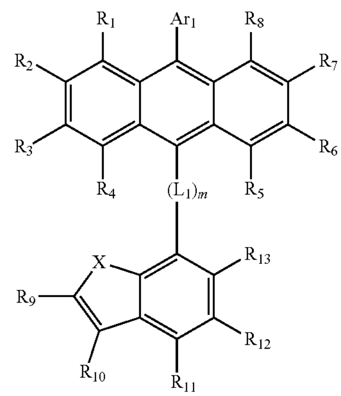

wherein $Ar_1$ is selected from a substituted or unsubstituted C6-C50 aryl group, a substituted or unsubstituted C2-C50 heteroaryl group, and a substituted or unsubstituted C3-C50 mixed aliphatic-aromatic ring group, $R_1$ to $R_{14}$ are identical to or different from each other, and are each independently hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, X is an oxygen atom (O) or a sulfur atom(S), $L_1$ is a divalent linker and is a single bond or is selected from a substituted or unsubstituted C6-C50 arylene group, a substituted or unsubstituted C2-C50 heteroarylene group, and a substituted or unsubstituted C3-C50 mixed aliphatic-aromatic ring group, and m is an integer from 1 to 3, provided that when m is 2 or more, a plurality of $L_1$ are identical to or different from each other,

[Formula B]

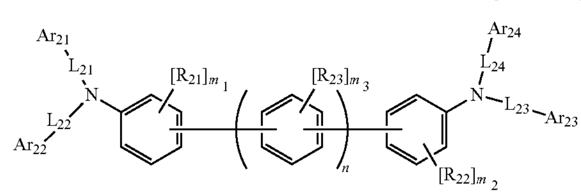

wherein $R_{21}$ to $R_{23}$ are identical to or different from each other, and are each independently selected from hydrogen, deuterium, a substituted or unsubstituted C1-C20 alkyl group, a substituted or unsubstituted C6-C50 aryl group, a substituted or unsubstituted C2-C30 heteroaryl group, a substituted or unsubstituted C7-C50 arylalkyl group, a substituted or unsubstituted C3-C30 cycloalkyl group, a substituted or unsubstituted silyl group, and a halogen group, $L_{21}$ to $L_{24}$ are identical to or different from each other, and are each independently a single bond or are selected from are selected from a substituted or unsubstituted C6-C50 arylene group and a substituted or unsubstituted C2-C50 heteroarylene group, $Ar_{21}$ to $Ar_{24}$ are identical to or different from each other, and are each independently selected from a substituted or unsubstituted C6-C50 aryl group, and a substituted or unsubstituted C2-C50 heteroaryl group, n is an integer from 0 to 4, provided that when n is 2 or more, a plurality of aromatic ring structures in ( ) including $R_{23}$ are identical to or different from each other, $m_1$ to $m_3$ are integers from 0 to 4, provided that when each of $m_1$ to $m_3$ is 2 or more, a plurality of each of $R_{21}$, $R_{22}$, and $R_{23}$ are identical to or different from each other, and a carbon atom of the aromatic ring, to which $R_{21}$ to $R_{23}$ are not bonded, is bonded to hydrogen or deuterium,

[Formula C]

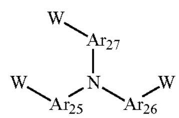

wherein $Ar_{25}$ to $Ar_{27}$ are divalent linkers, are identical to or different from each other, and are each independently single bonds or are selected from a substituted or unsubstituted C6-C50 arylene group, a substituted or unsubstituted C2-C50 heteroarylene group, a substituted or unsubstituted C3-C30 cycloalkylene group, and a substituted or unsubstituted C3-C50 mixed aliphatic-aromatic ring group, and W's are each independently selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, or a substituted or unsubstituted C2-C50 heteroaryl group, a substituted or unsubstituted C2-30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a nitro group and a halogen group, wherein W's are identical to or different from each other, with the proviso that at least one of W's is represented by the following [Formula C-1]:

[Formula C-1]

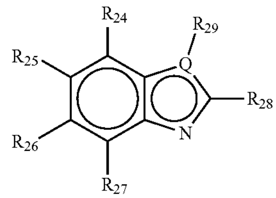

wherein $R_{24}$ to $R_{29}$ are identical to or different from each other, and are each independently linkers as binding sites to $Ar_{25}$ to $Ar_{27}$, or are selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, with the proviso that $R_{24}$ to $R_{27}$ are bonded to each other or each of $R_{24}$ to $R_{27}$ is bonded to an adjacent substituent to further form an alicyclic or aromatic monocyclic or polycyclic ring, at least one carbon atom of which is substituted with at least one heteroatom selected from nitrogen, oxygen, and sulfur, and Q is N, O or S, provided that when Q is O or S, Q does not include $R_{29}$, wherein at least one of $R_{11}$ to $R_{14}$ in each of the compounds represented by [Formula A-1] to [Formula A-6] is a substituted or unsubstituted C3-C20 cycloalkyl group.

2. The organic light-emitting device according to claim 1, wherein each of the compounds represented by [Formula A-1] to [Formula A-6]comprises at least one deuterium atom (D) as a substituent.

3. The organic light-emitting device according to claim 1, wherein each of the compounds represented by [Formula A-1] to [Formula A-6] has a degree of deuteration of 10% or more.

4. The organic light-emitting device according to claim 1, wherein at least one of $Ar_{21}$ to $Ar_{24}$ is represented by the following [Formula E]:

[Formula E]

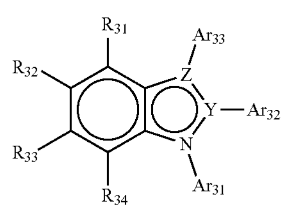

wherein $R_{31}$ to $R_{34}$ are identical to or different from each other, and are each independently selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C20 alkynyl group, a substituted or unsubstituted C3-C30 cycloalkyl group, a substituted or unsubstituted C5-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C30 aryloxy group, a substituted or unsubstituted C1-C30 alkylthioxy group, a substituted or unsubstituted C5-C30 arylthioxy group, a substituted or unsubstituted amine group, a substituted or unsubstituted silyl group, a nitro group, a cyano group, and a halogen group, with the proviso that $R_{31}$ to $R_{34}$ are bonded to each other to form a ring, Y is a carbon atom (C) or a nitrogen atom (N), and Z is a carbon atom (C), an oxygen atom (O), a sulfur atom(S), or a nitrogen atom (N), and $Ar_{31}$ to $Ar_{33}$ are identical to or different from each other, and are each independently selected from a substituted or unsubstituted C5-C50 aryl group and a substituted or unsubstituted C3-C50 heteroaryl group, provided that when Z is an oxygen atom (O) or a sulfur atom(S), $Ar_{33}$ is nothing, provided that when Y and Z are nitrogen atoms (N), only one of $Ar_{31}$, $Ar_{32}$, and $Ar_{33}$ is present, provided that when Y is a nitrogen atom (N) and Z is a carbon atom (C), $Ar_{32}$ is nothing, with the proviso that one of $R_{31}$ to $R_{34}$ and $Ar_{31}$ to $Ar_{33}$ is a single bond linked to one of the linkers $L_{21}$ to $L_{24}$ in [Formula B].

5. The organic light-emitting device according to claim 1, wherein the compound of [Formula B] is selected from compounds represented by the following [B-1] to [B-79]:

B-1

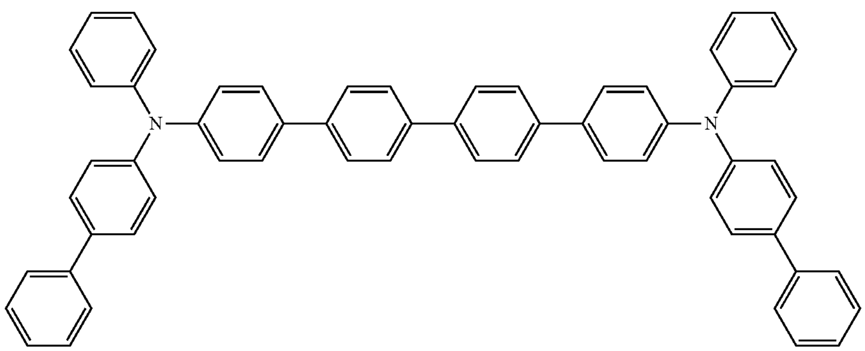

B-2

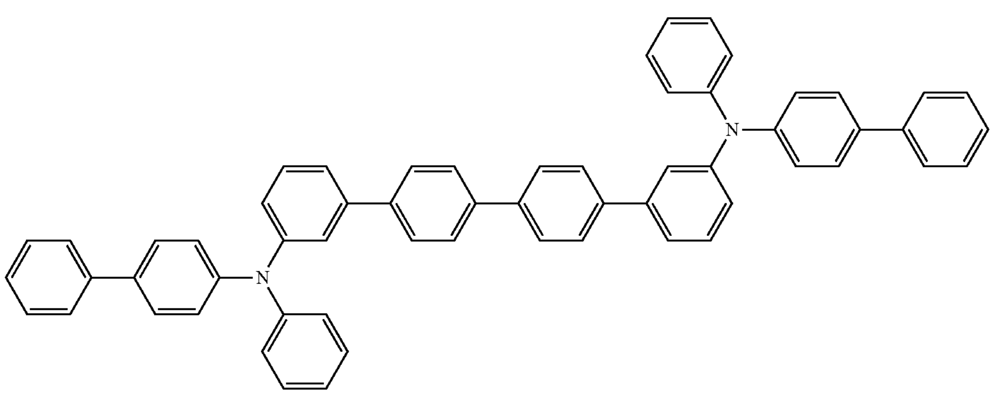

-continued
B-3
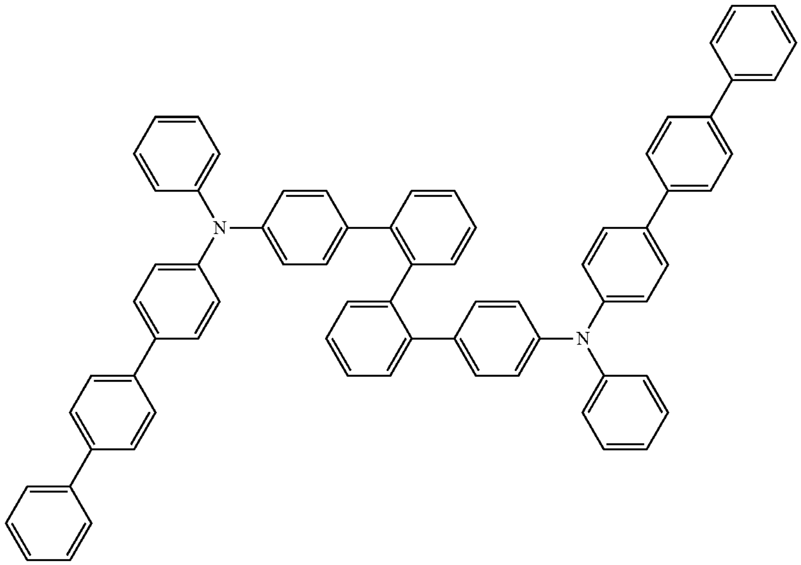
B-4
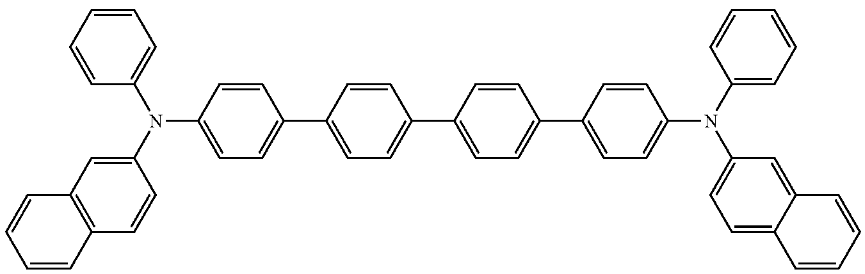
B-5
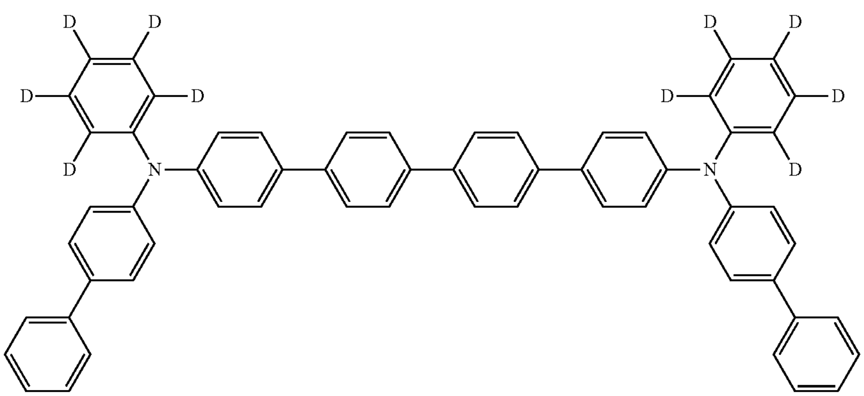
B-6
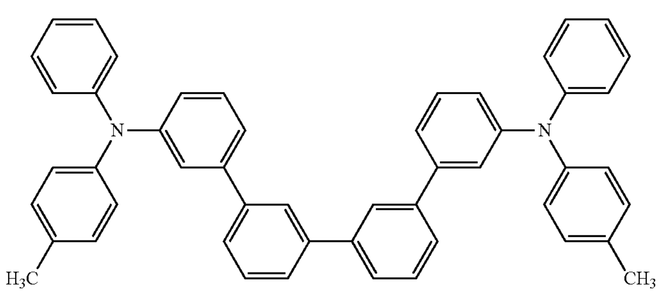

-continued
B-7
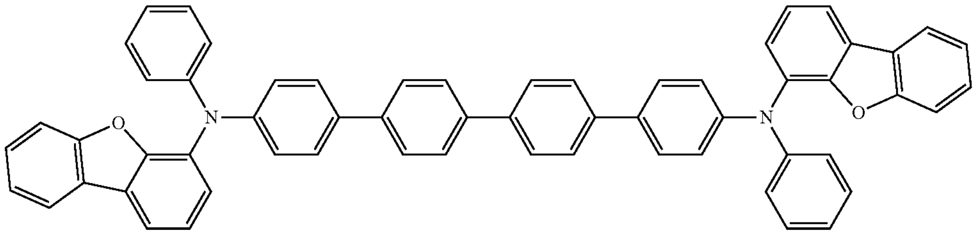
B-8
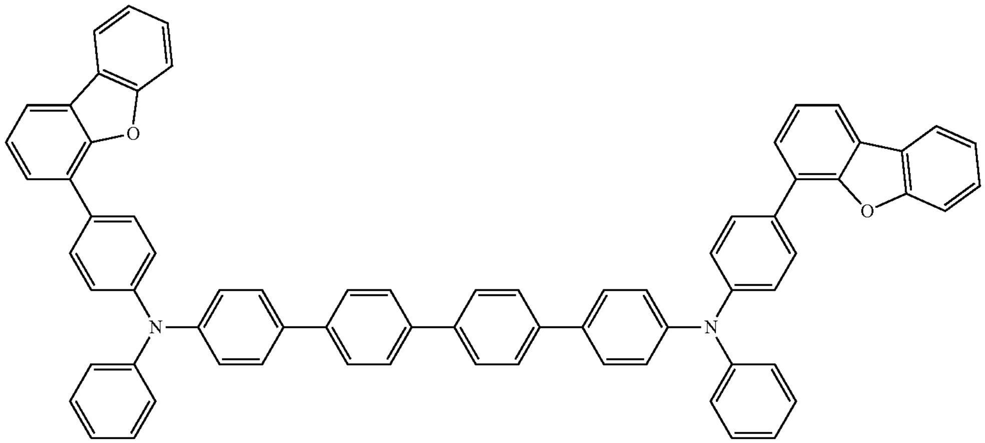
B-9
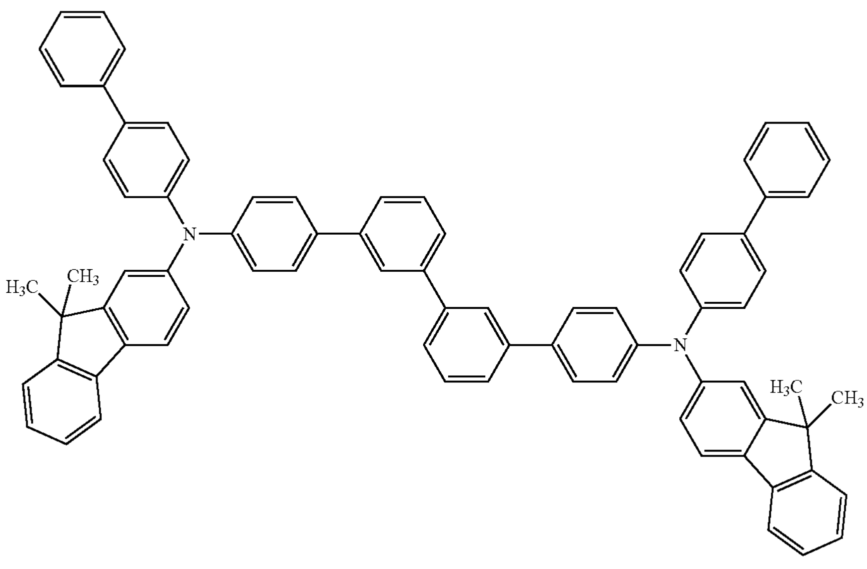
B-10
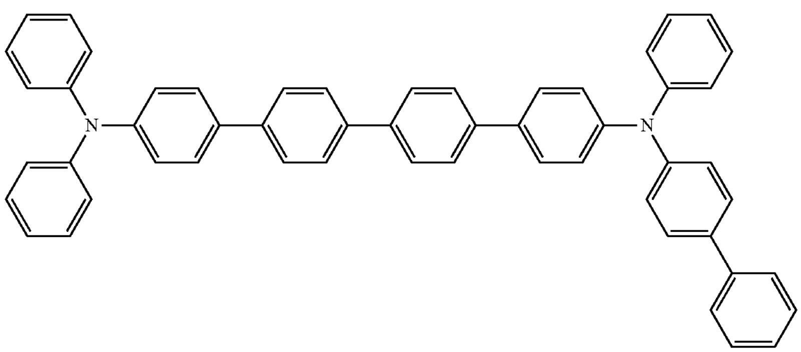

-continued
B-11
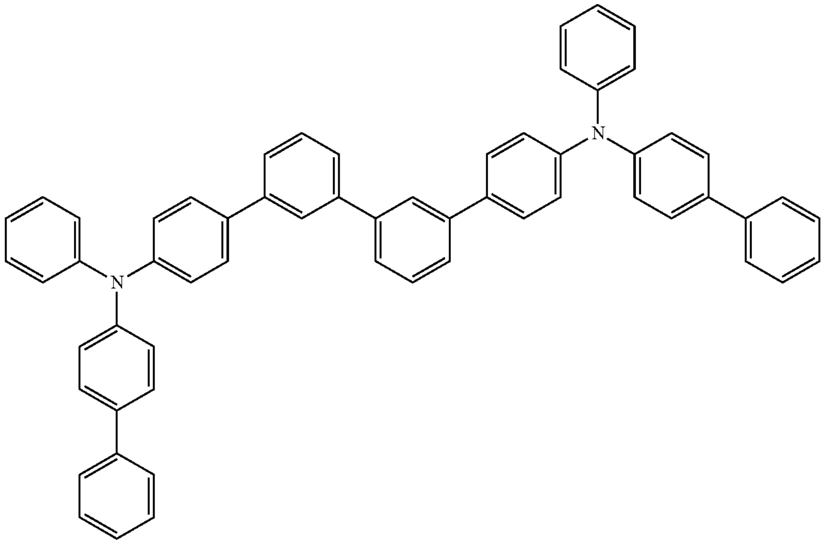
B-12
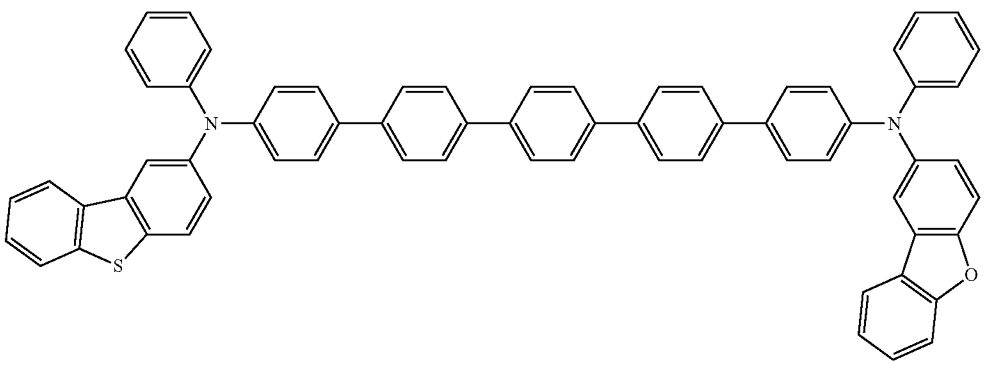
B-13
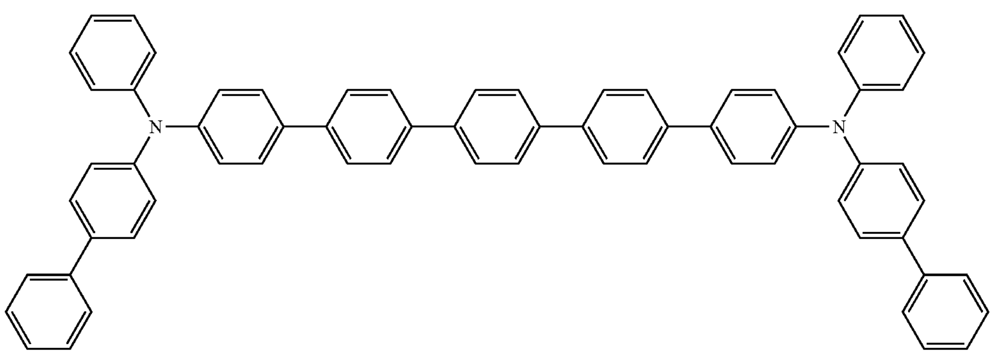
B-14
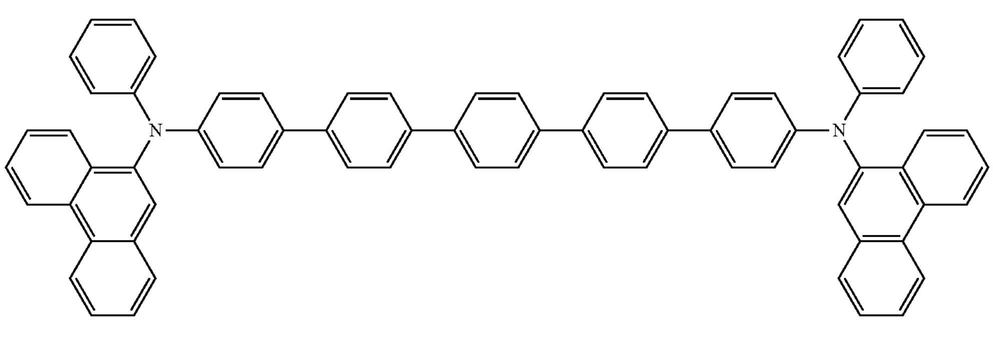

-continued
B-15
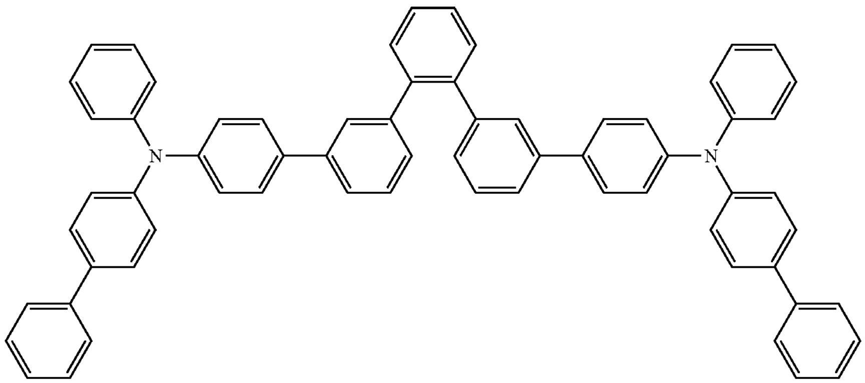
B-16
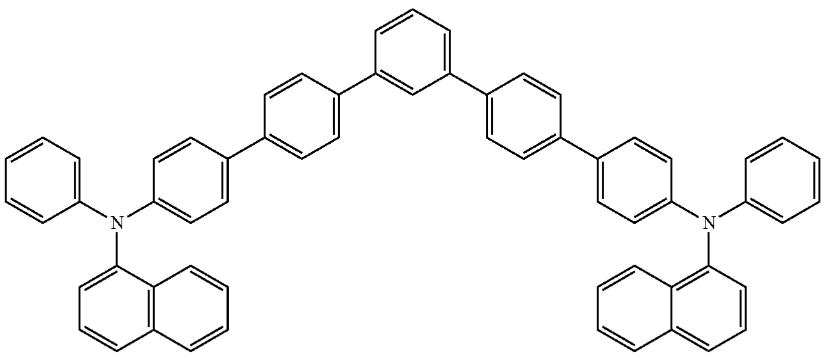
B-17
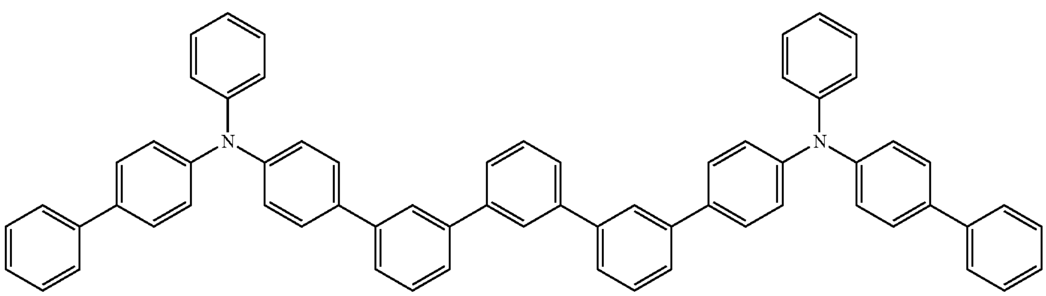
B-18
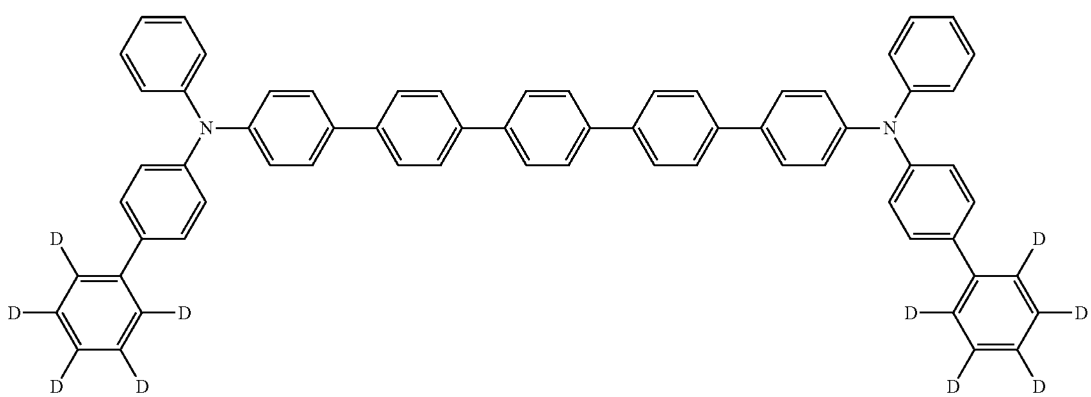

-continued
B-19
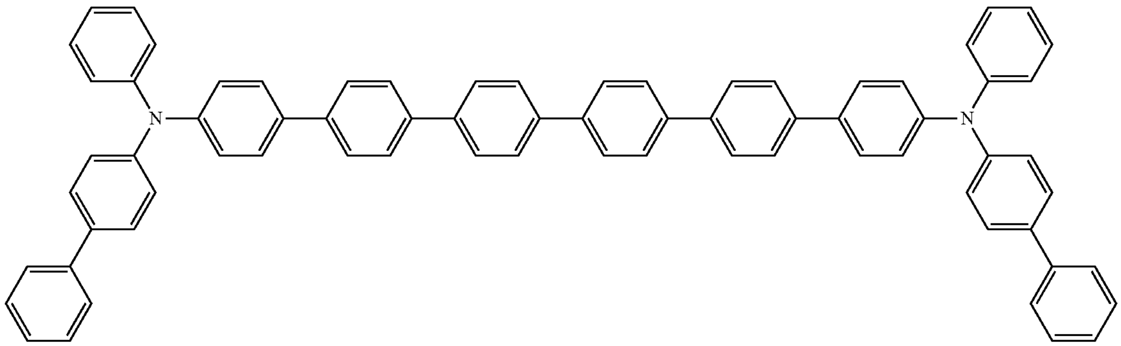
B-20
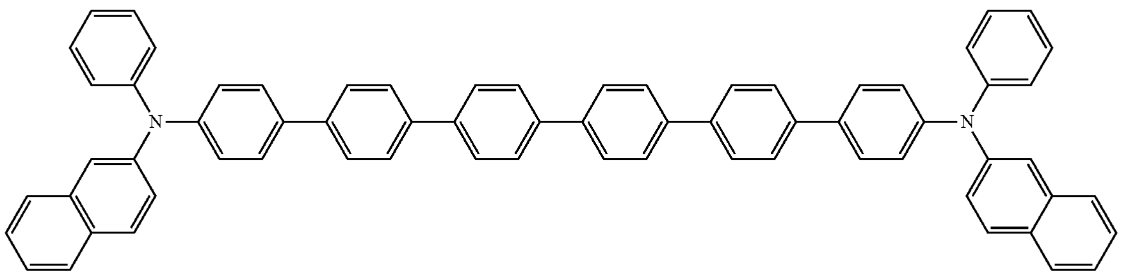
B-21
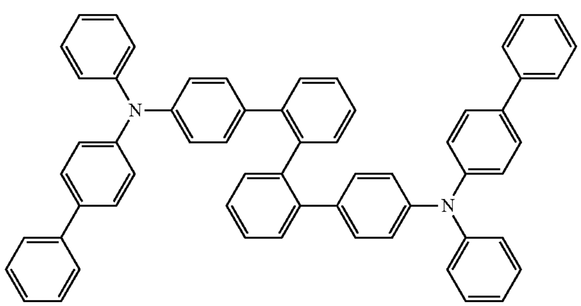
B-22
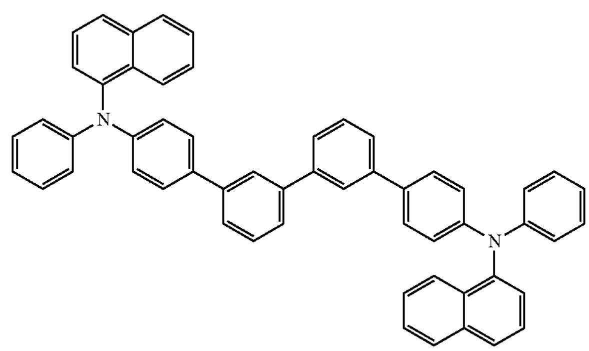
B-23
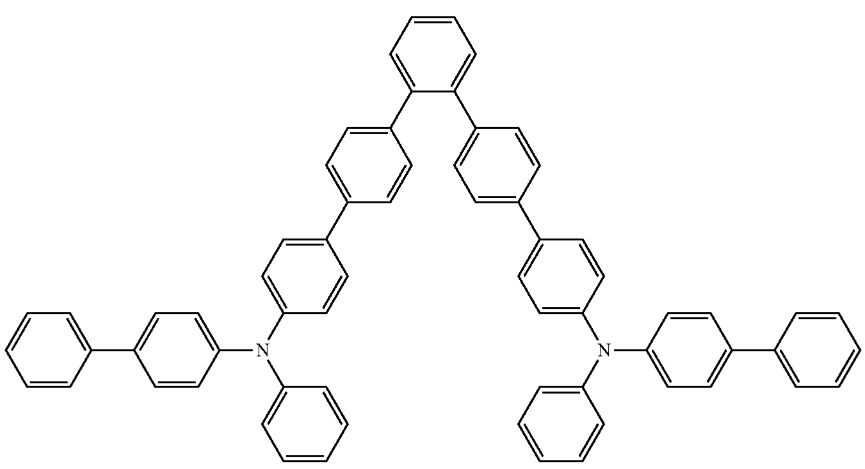

-continued
B-24
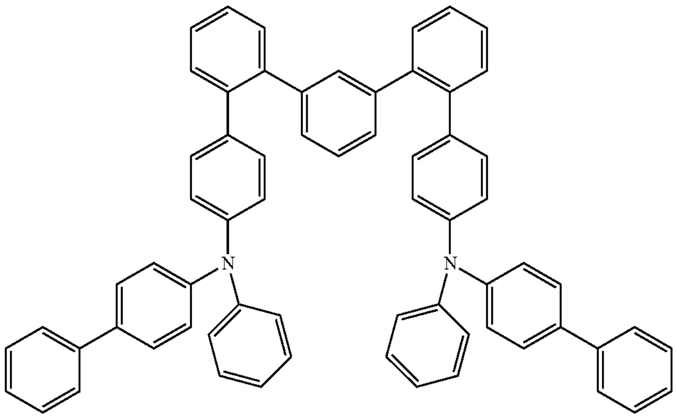
B-25
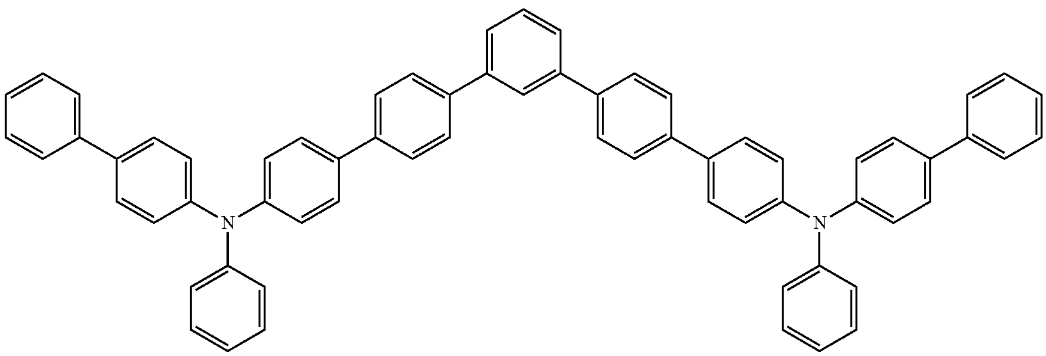
B-26
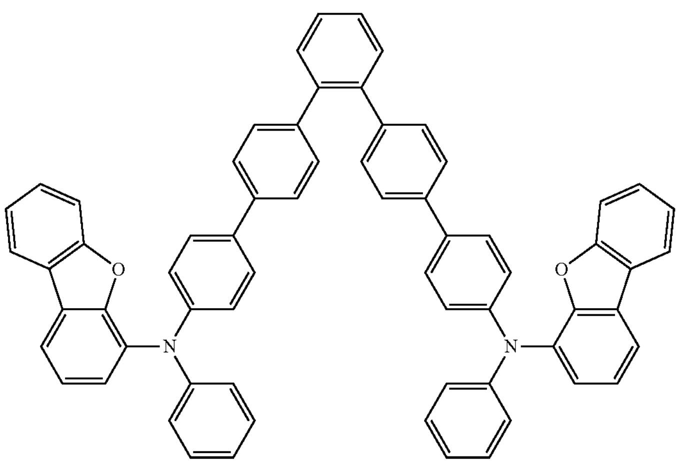
B-27
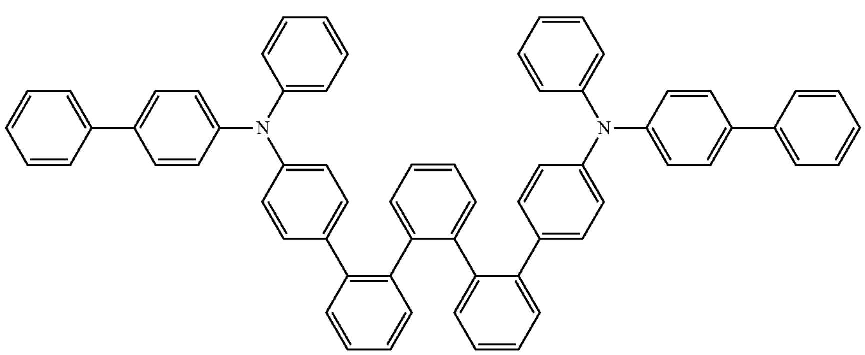

-continued
B-28
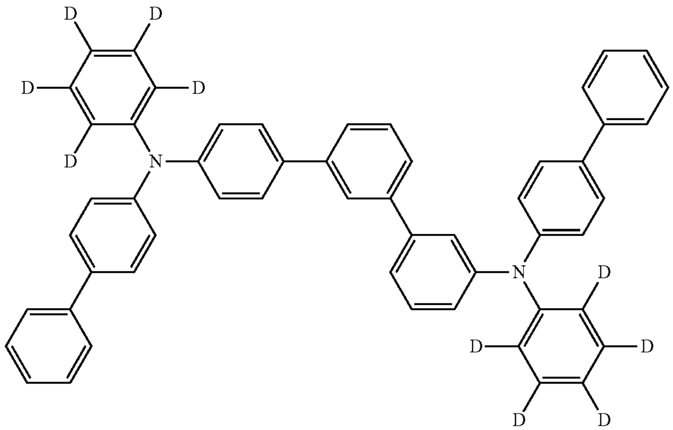
B-29
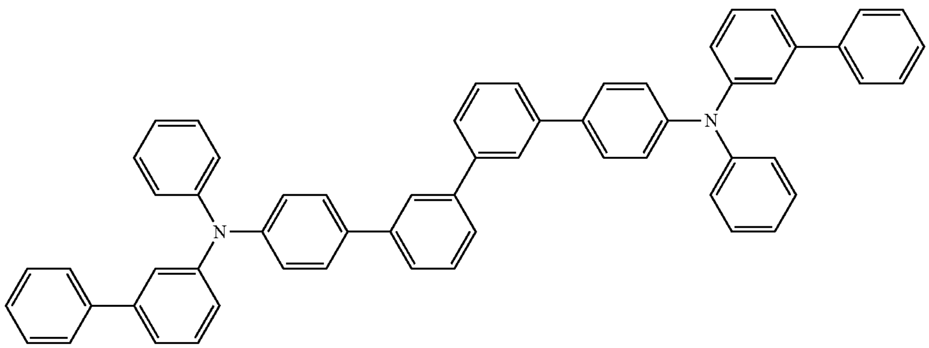
B-30
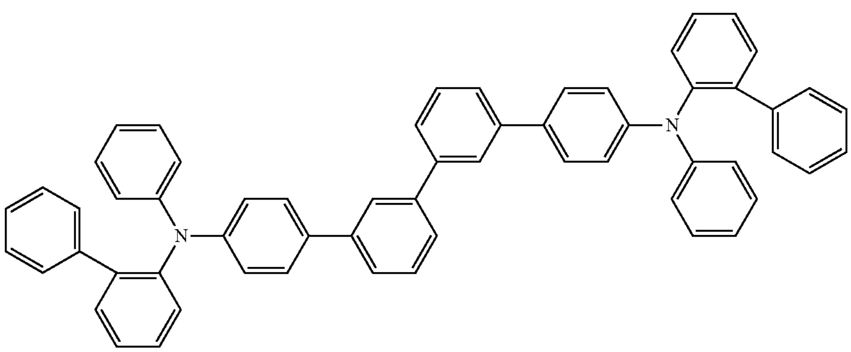
B-31
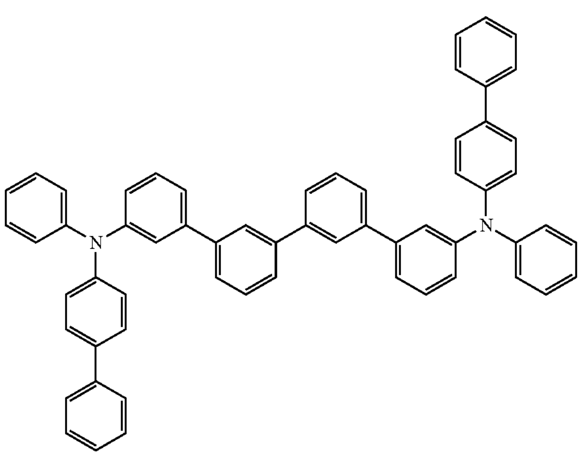
B-32
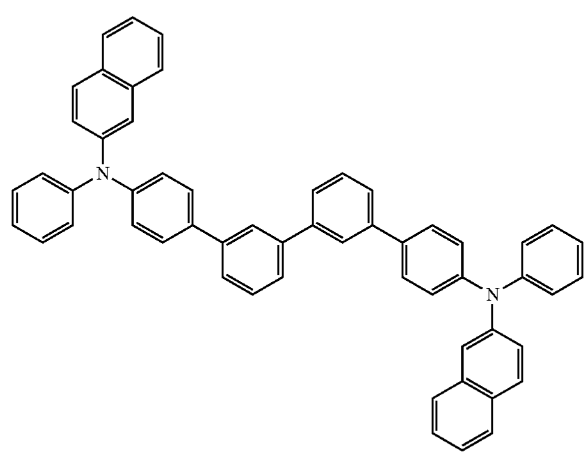

-continued
B-33
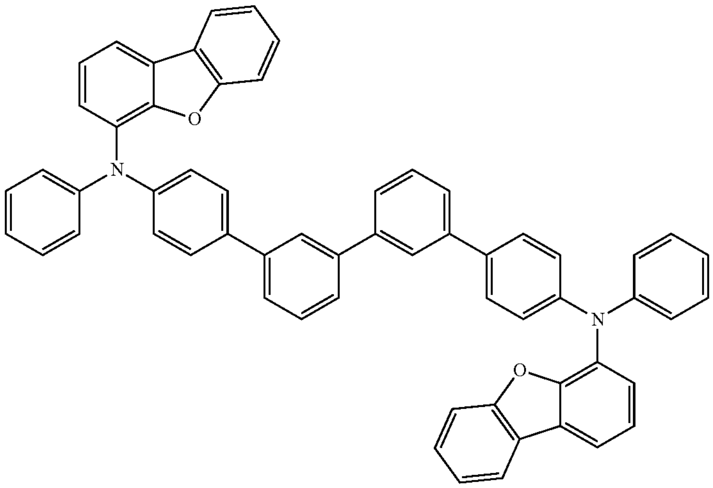
B-34
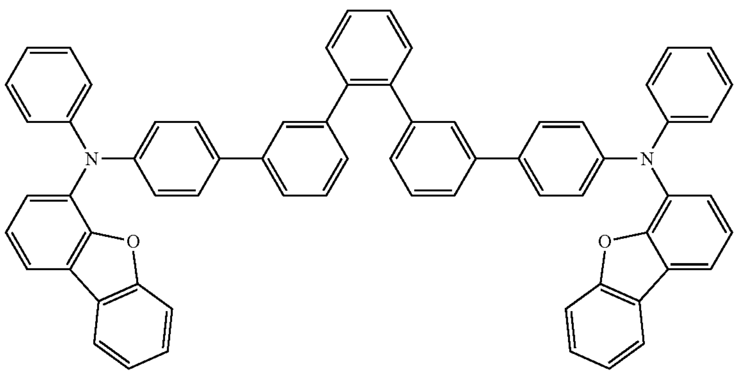
B-35
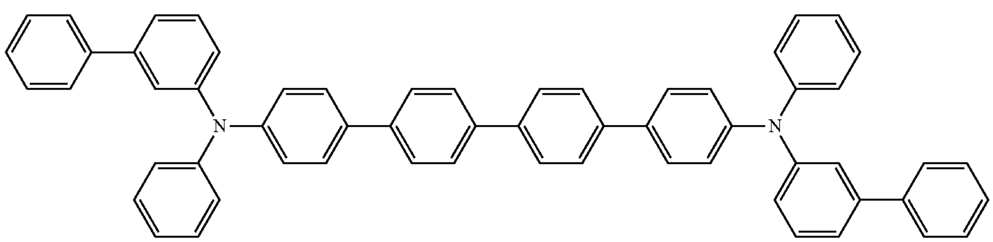
B-36
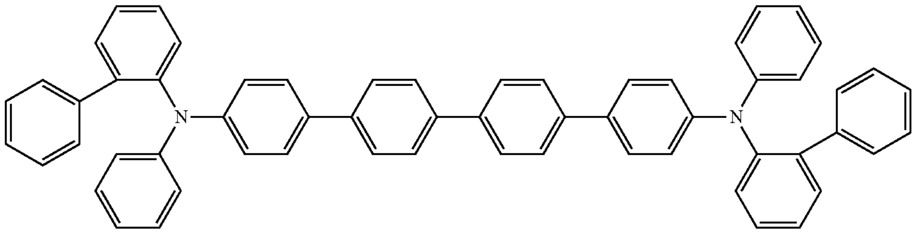

B-1
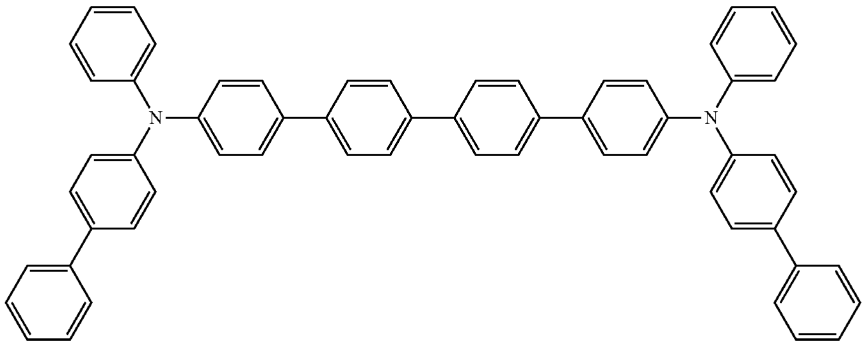
B-2
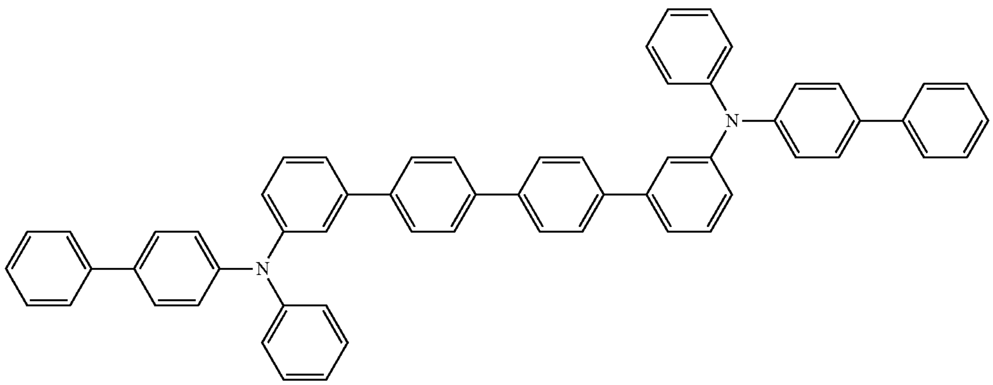
B-3
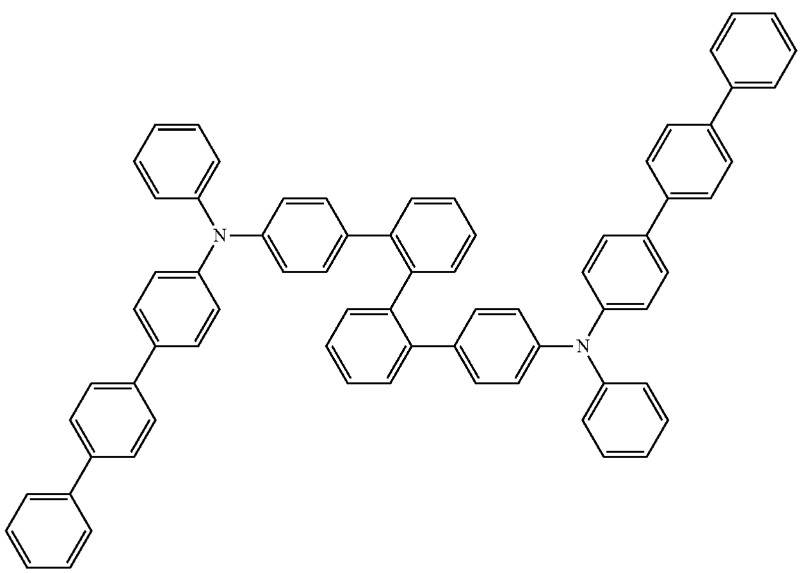
B-4
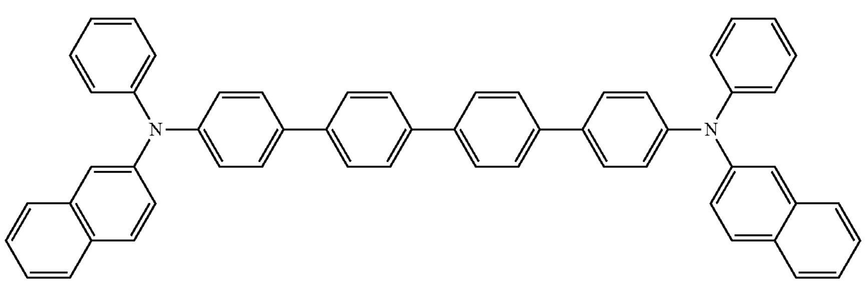

-continued
B-5
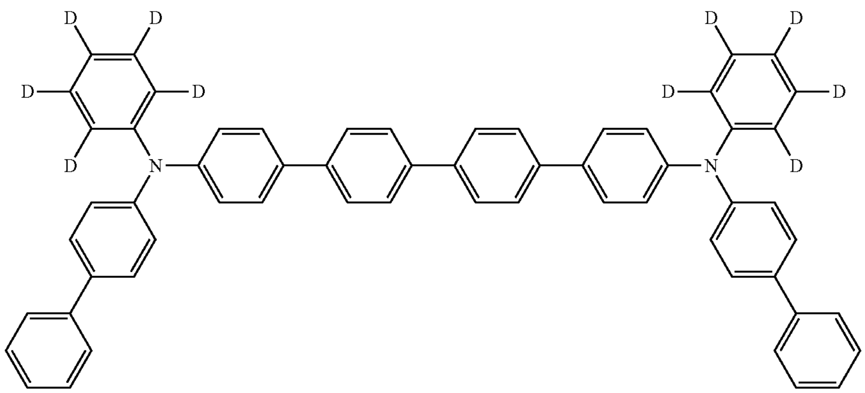
B-6
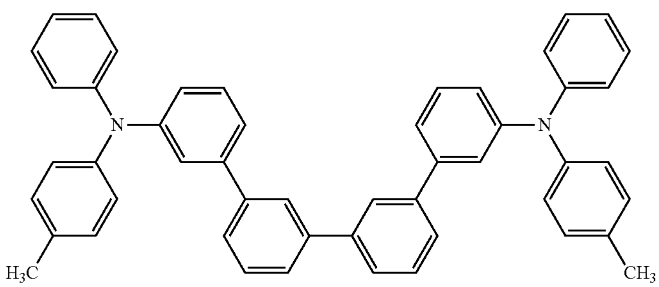
B-10
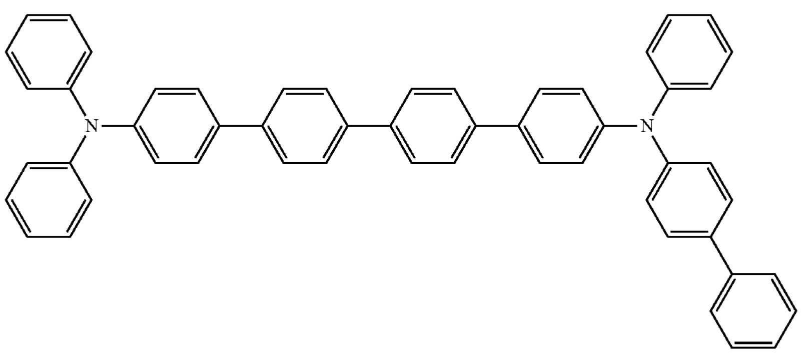
B-11
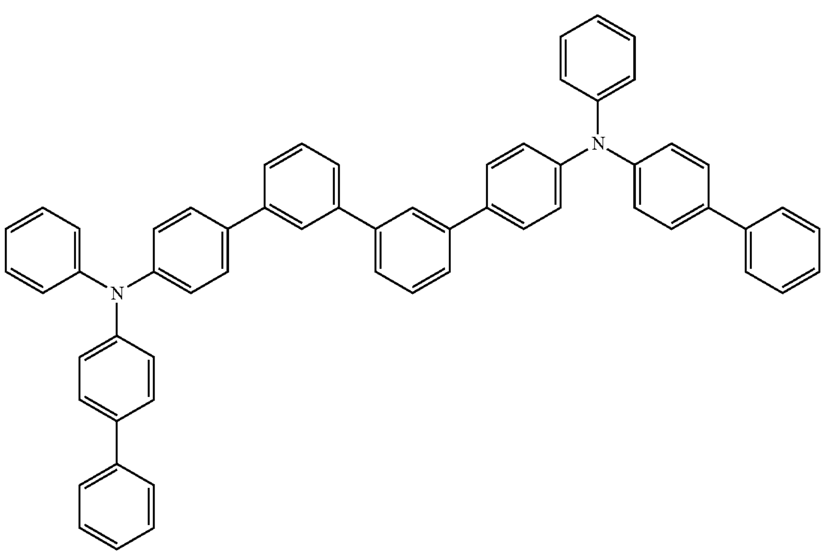

-continued
B-12
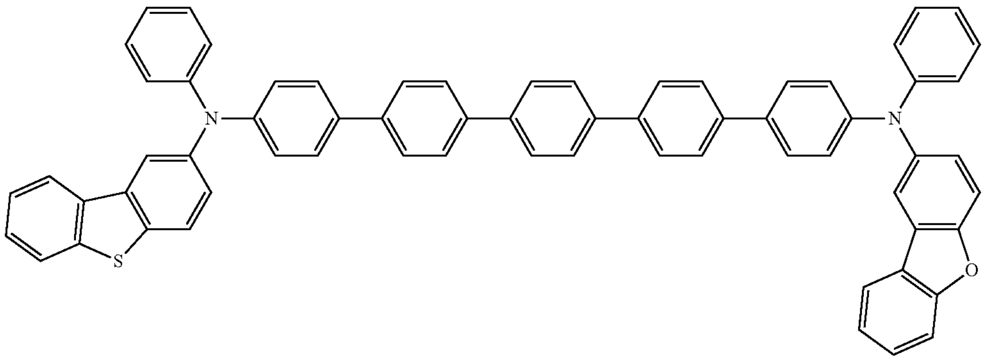
B-13
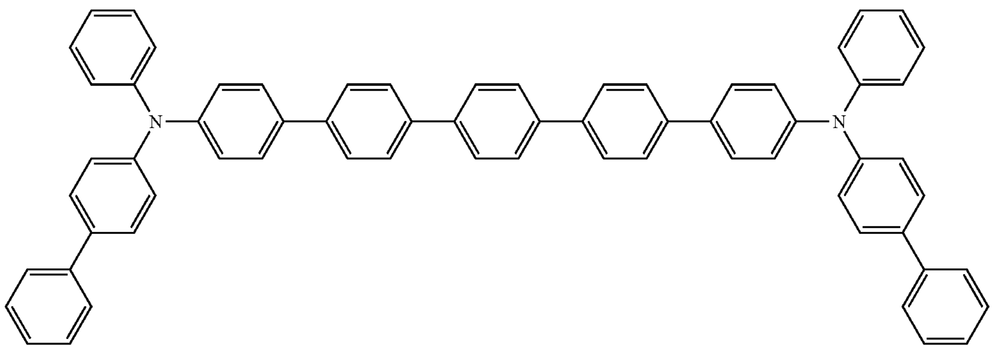
B-14
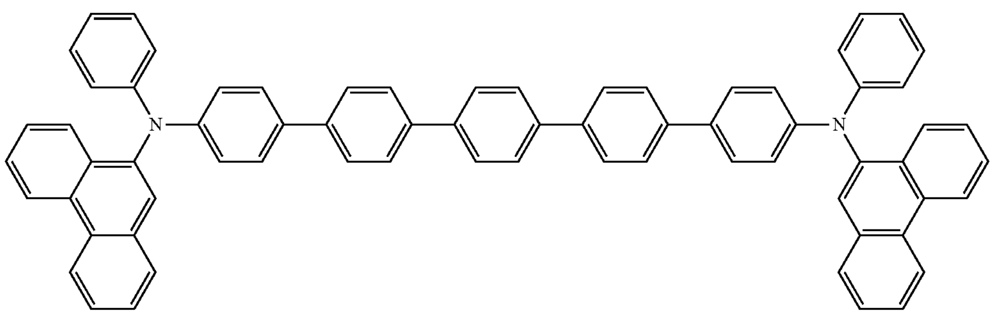
B-15
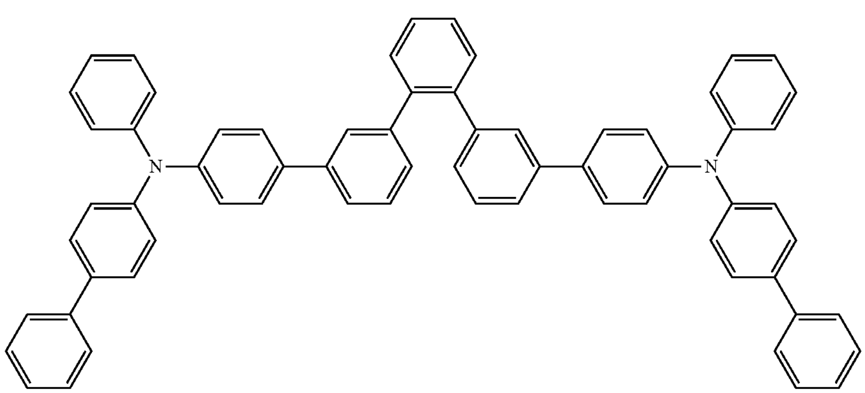

-continued
B-16
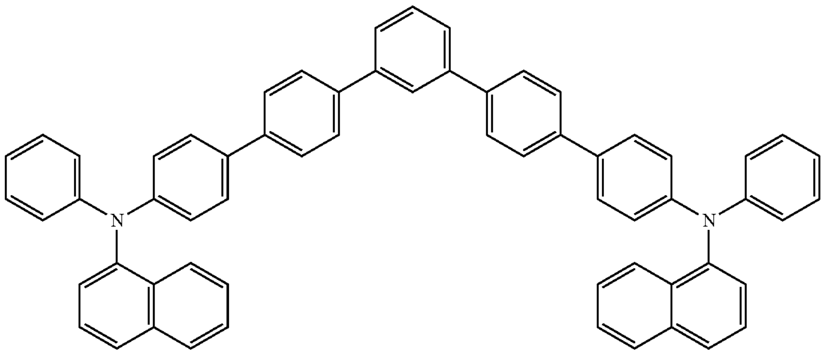
B-17
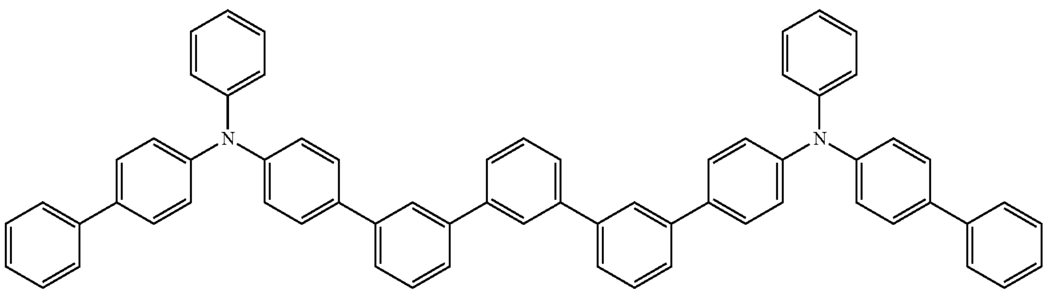
B-18
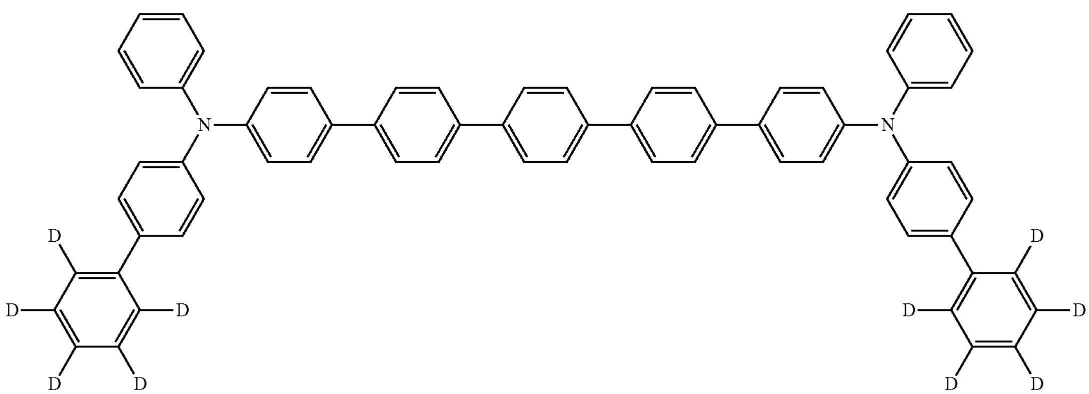
B-37
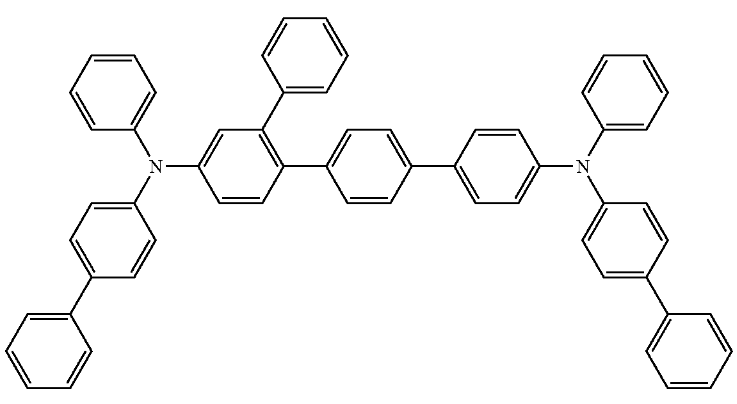

-continued
B-38
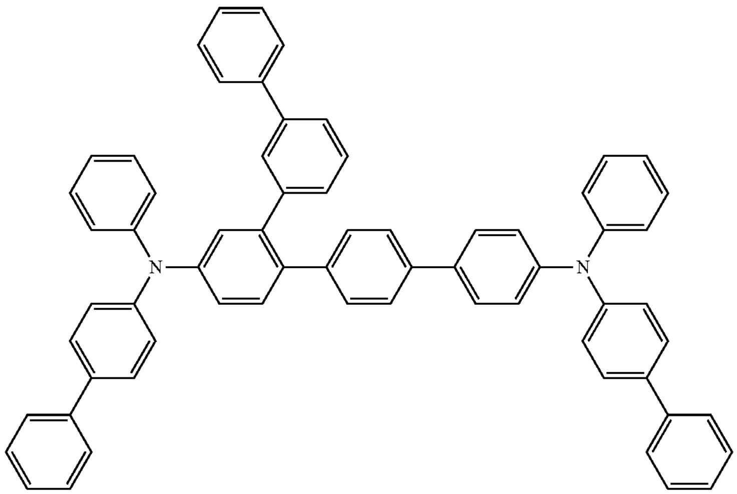
B-39
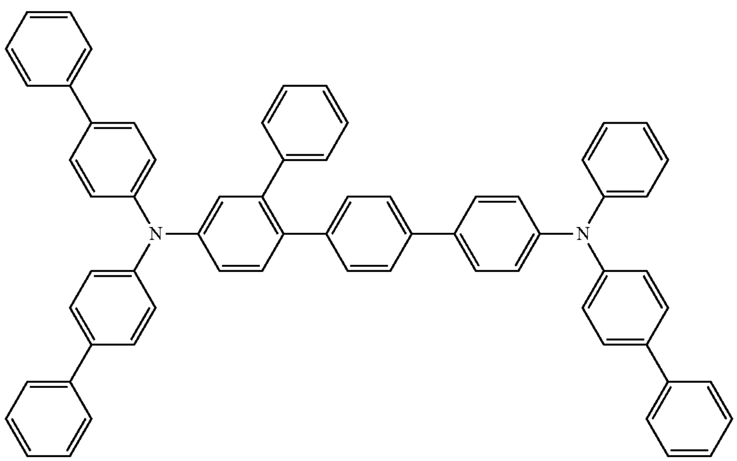
B-40
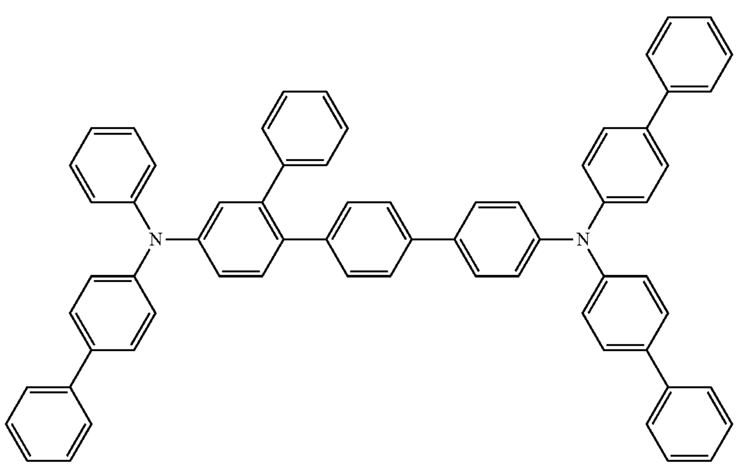

-continued
B-41
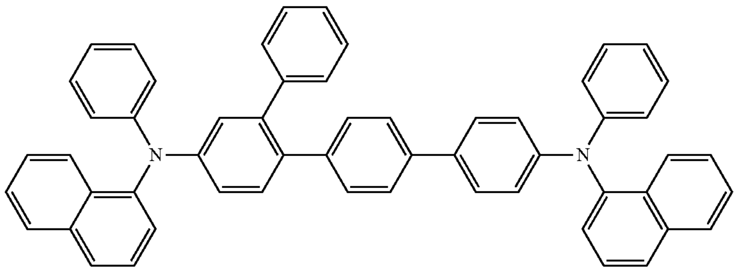
B-42
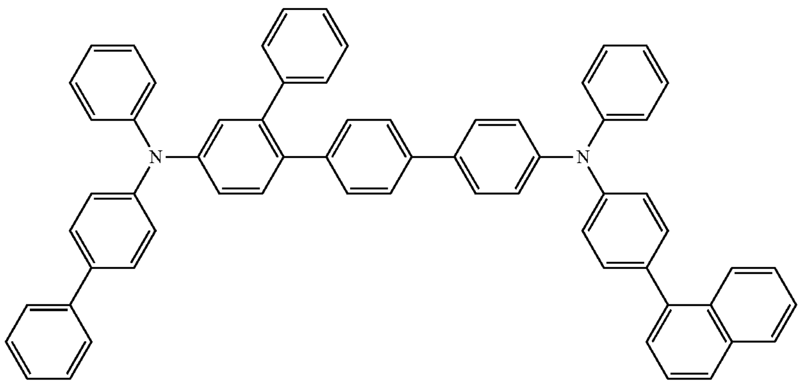
B-43
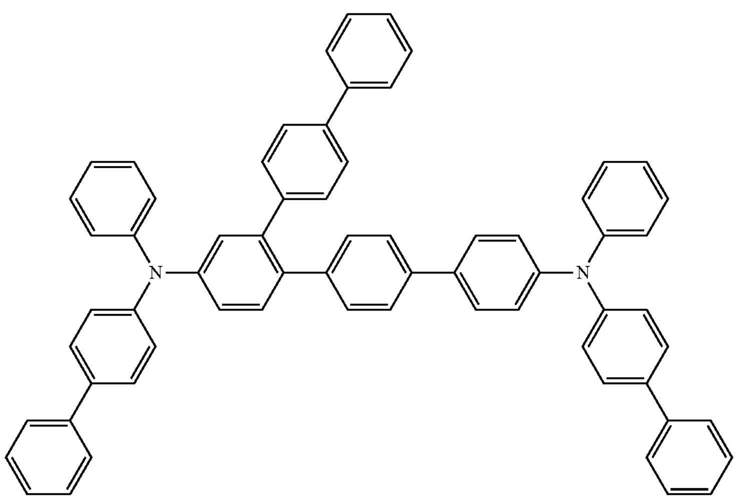
B-44
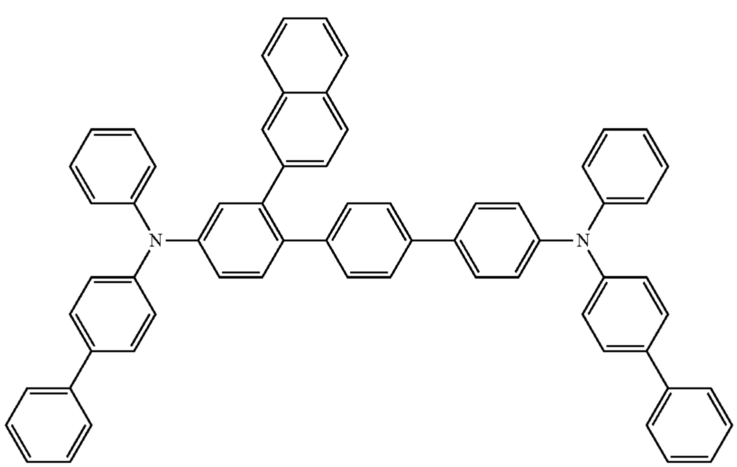

-continued
B-45
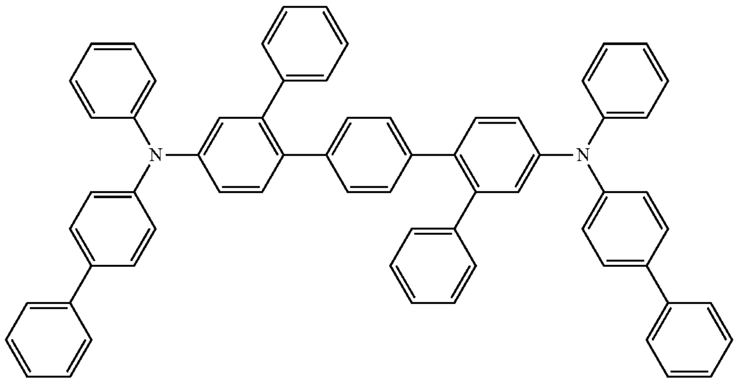
B-46
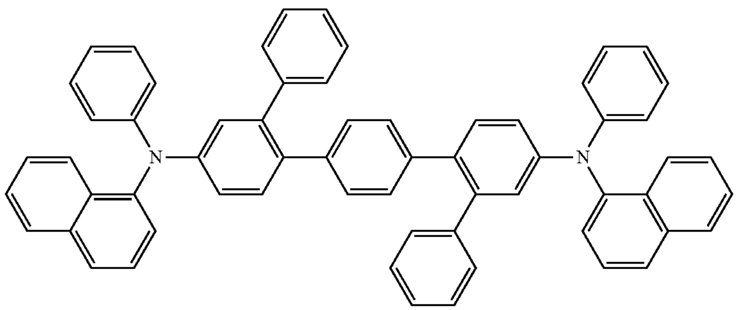
B-47
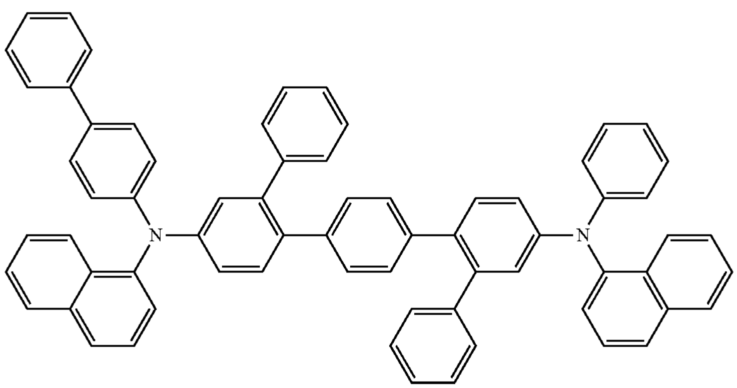
B-48
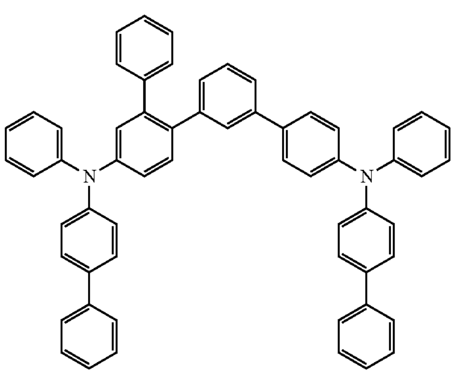
B-49
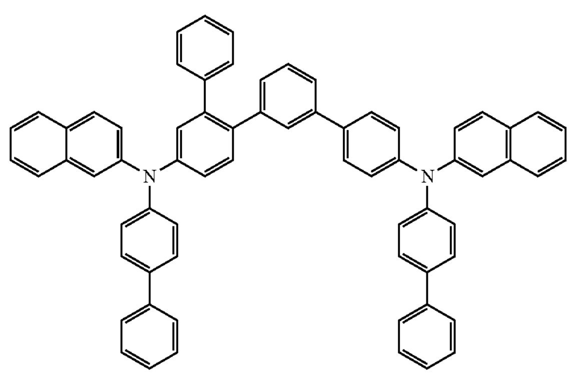

-continued
B-50
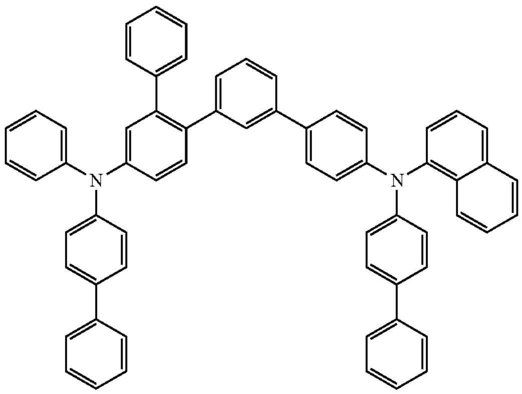
B-51
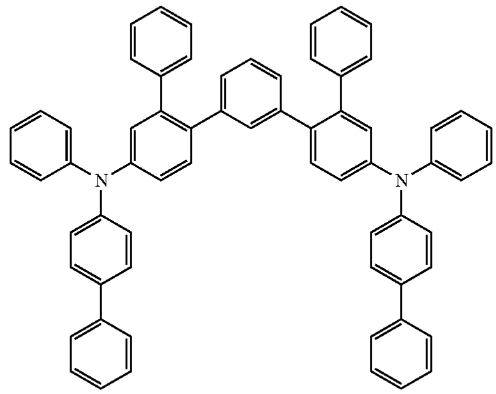
B-52
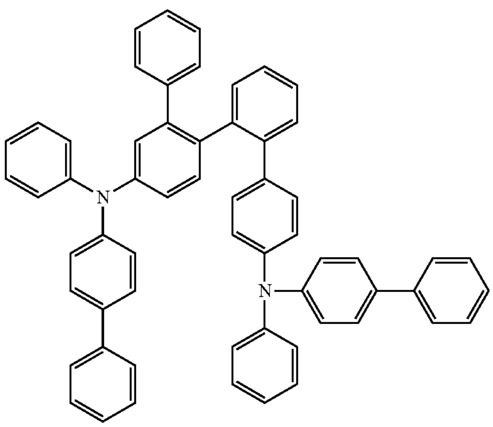
B-53
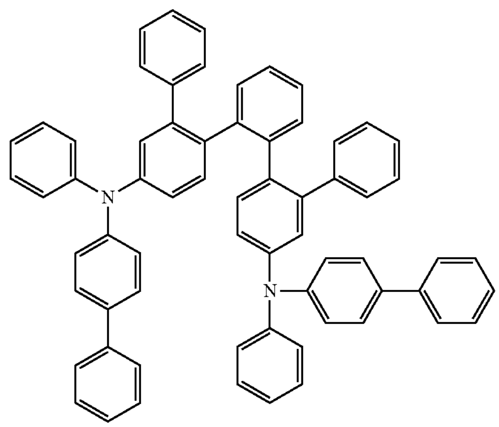
B-54
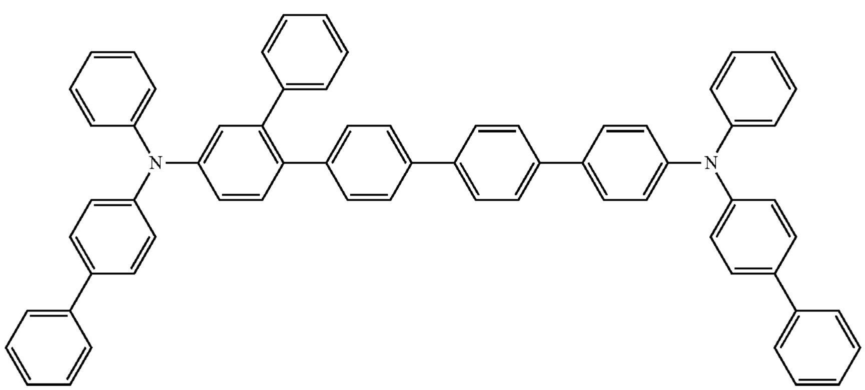
B-55
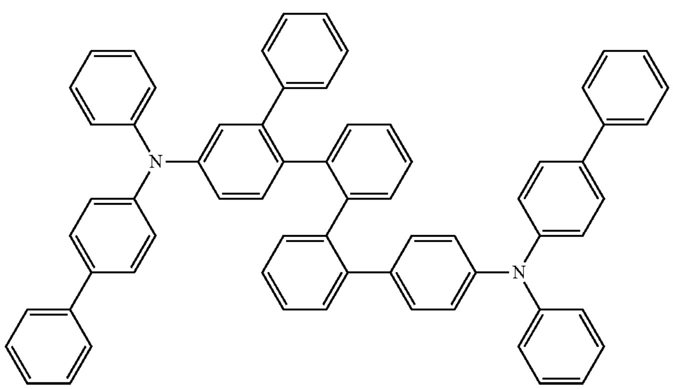

-continued
B-56
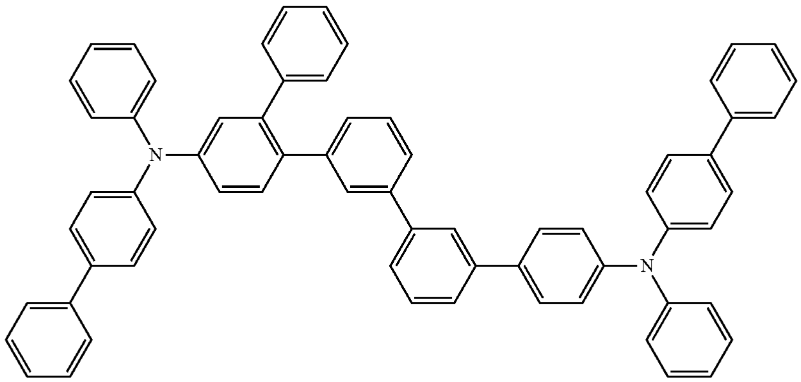
B-57
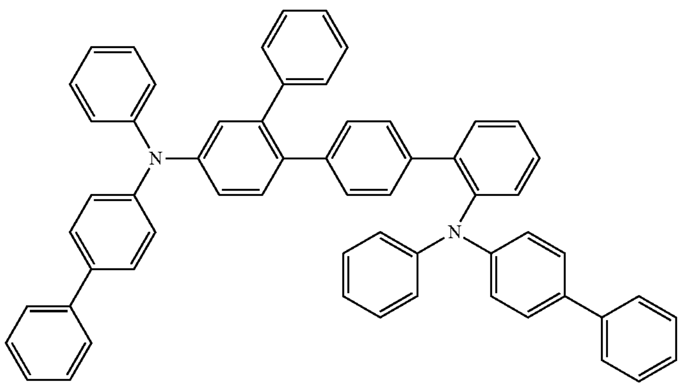
B-58
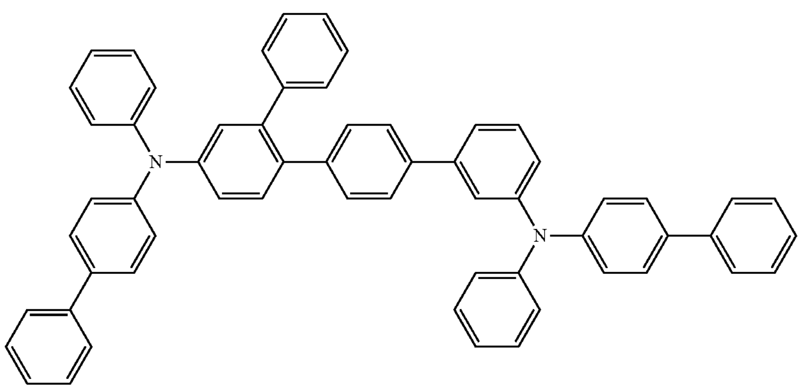
B-59
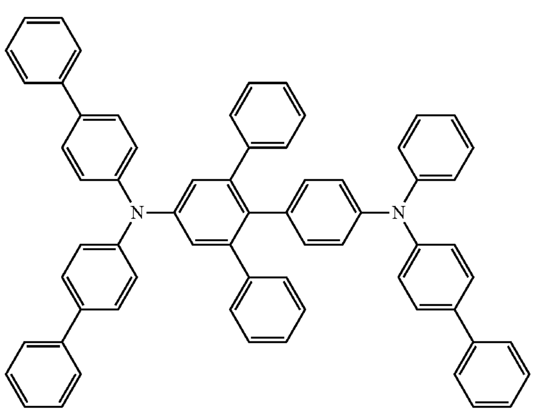
B-60
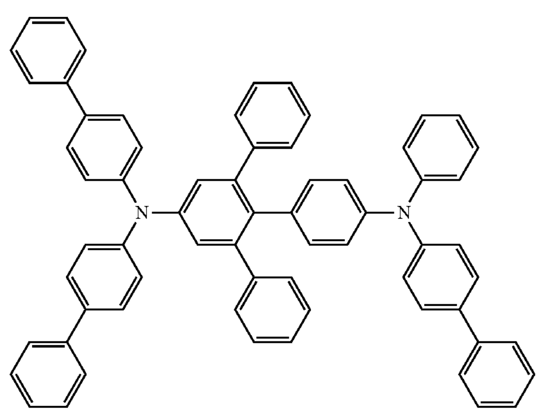

-continued
B-61
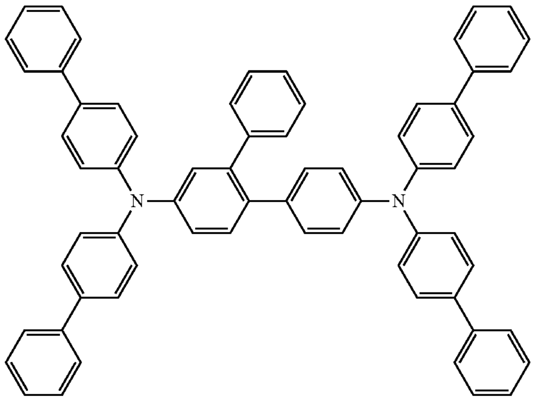
B-62
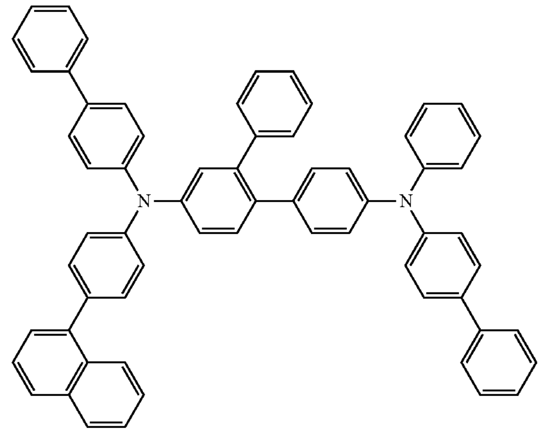
B-63
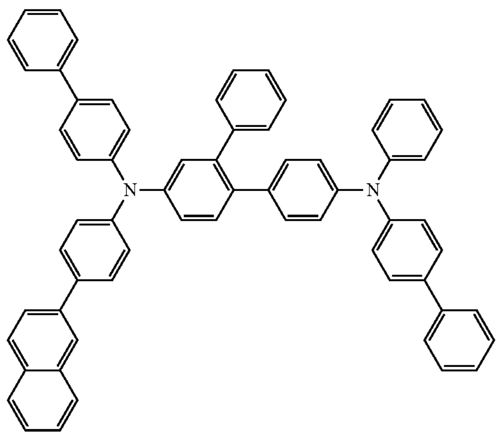
B-64
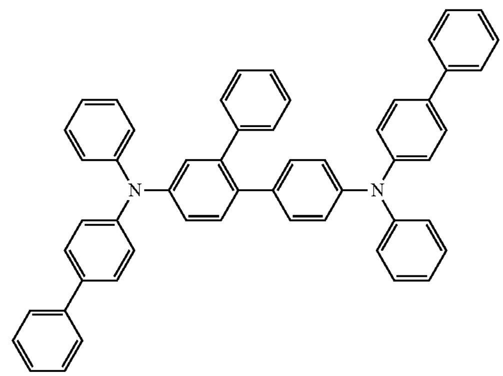
B-65
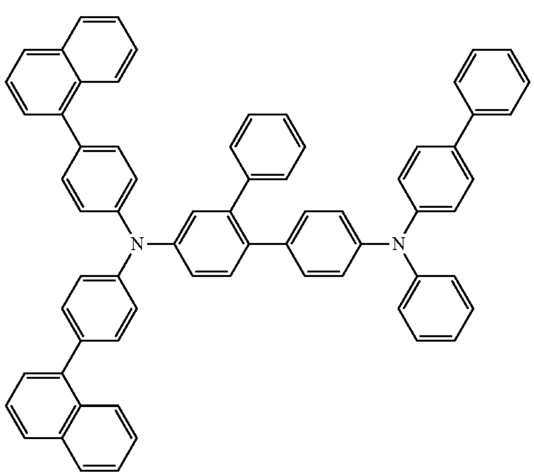
B-66
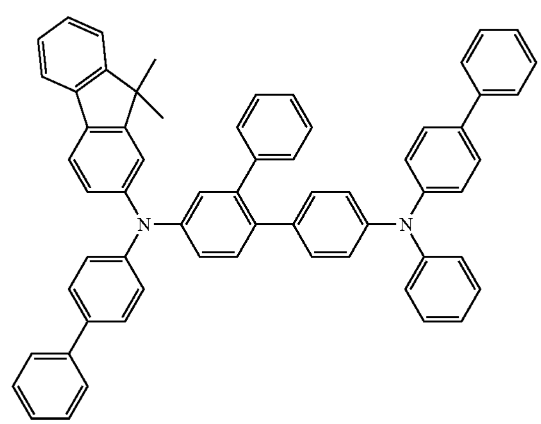

-continued
B-67
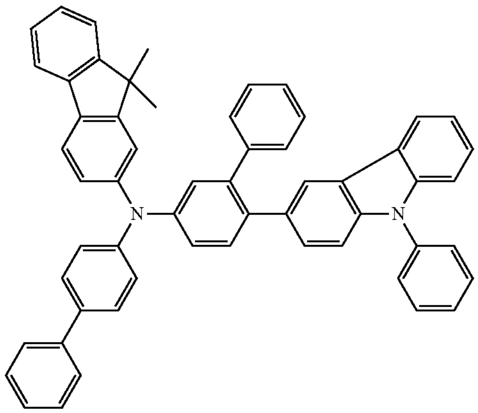
B-68
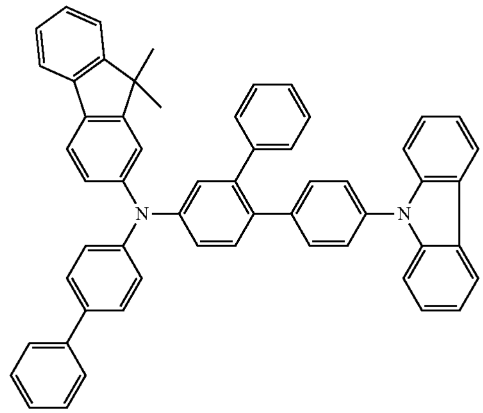
B-69
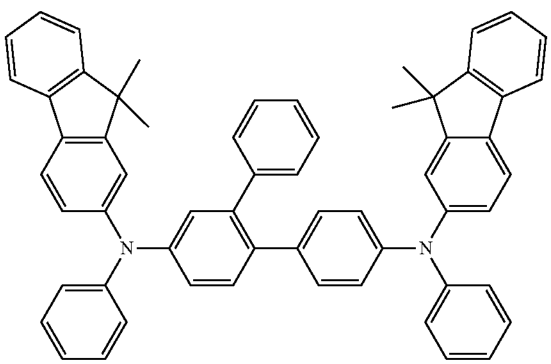
B-70
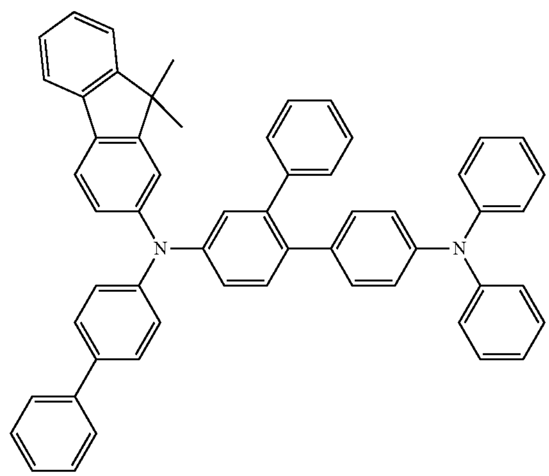
B-71
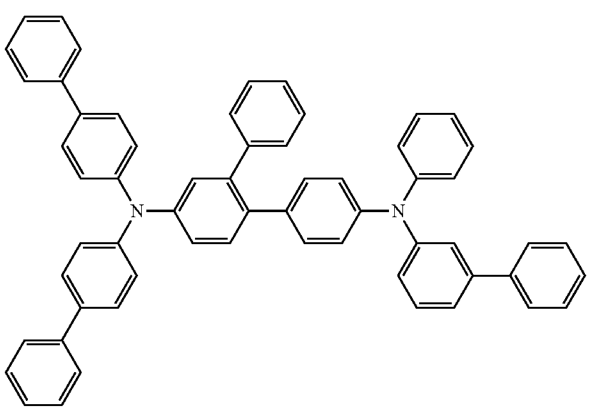
B-72
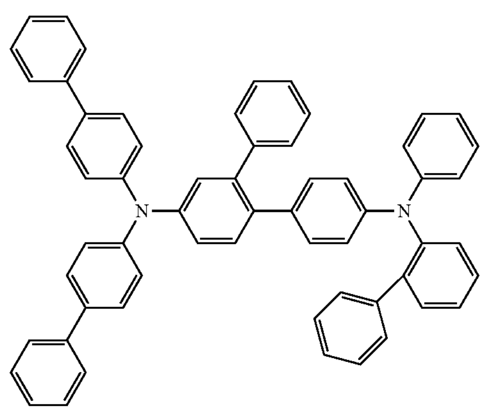

6. The organic light-emitting device according to claim 1, wherein the compound represented by [Formula B] is selected from compounds represented by the following [B-101] to [B-148]:
B-101
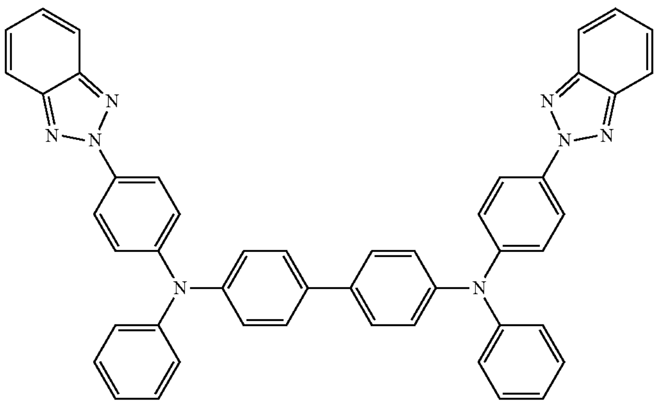
B-102
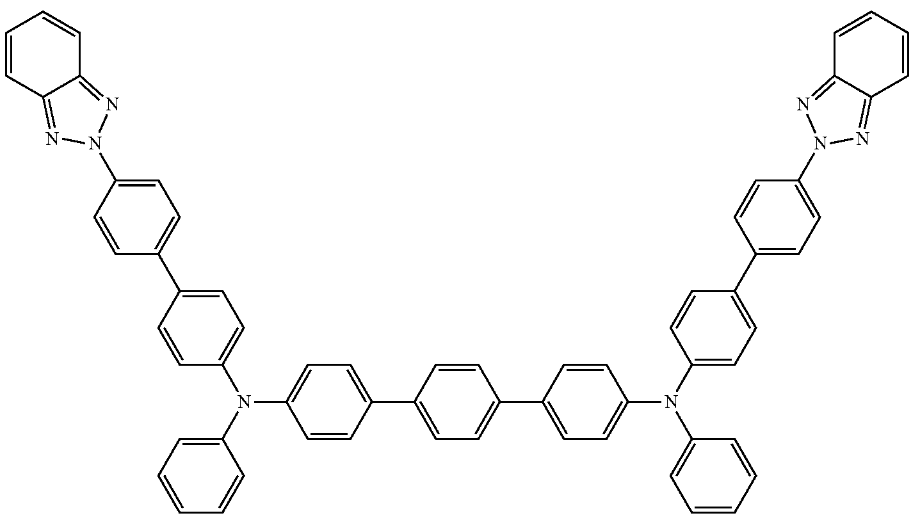
B-103
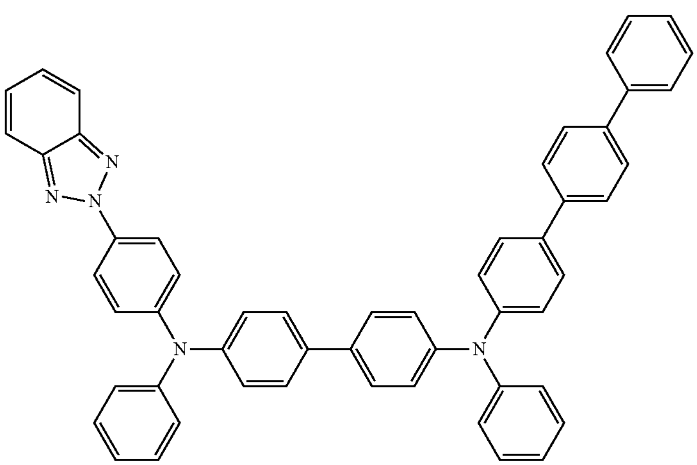

-continued
B-104
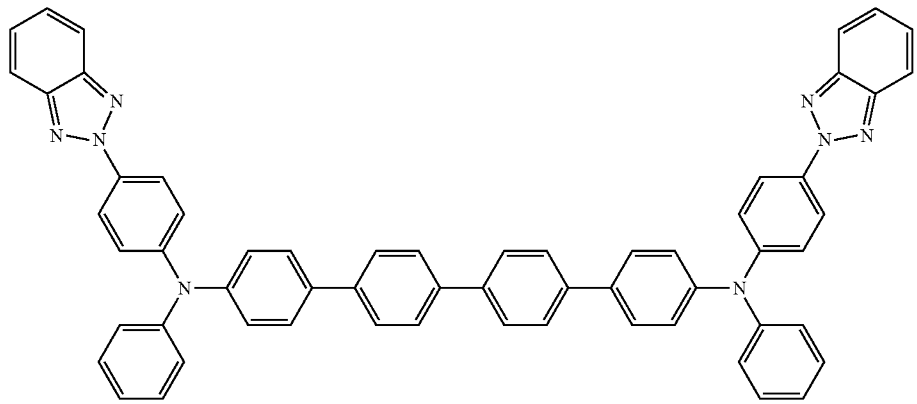
B-105
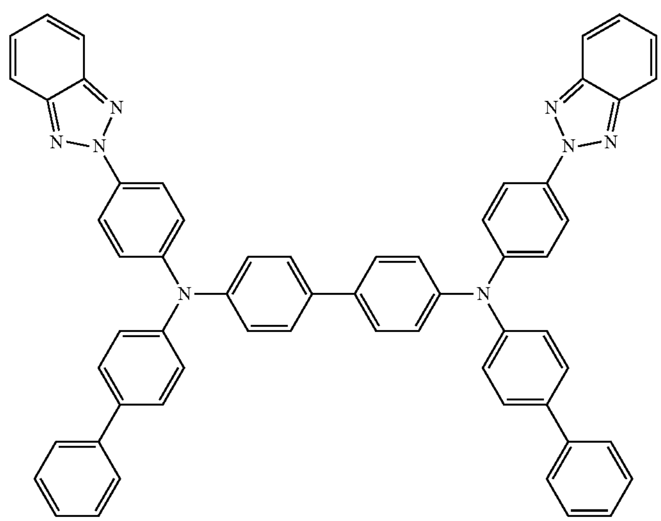
B-106
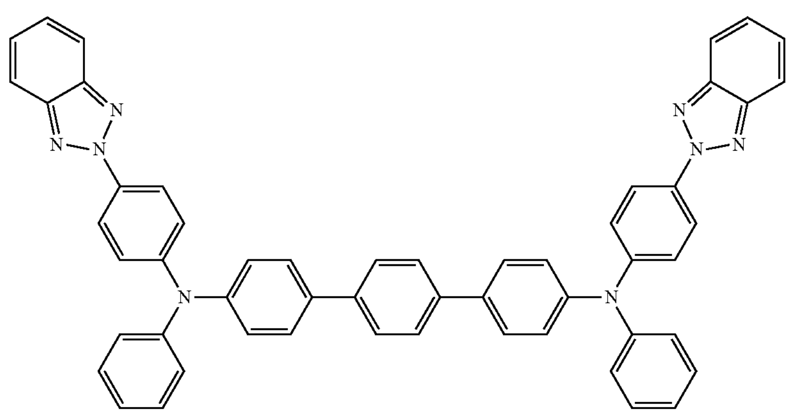

-continued
B-107
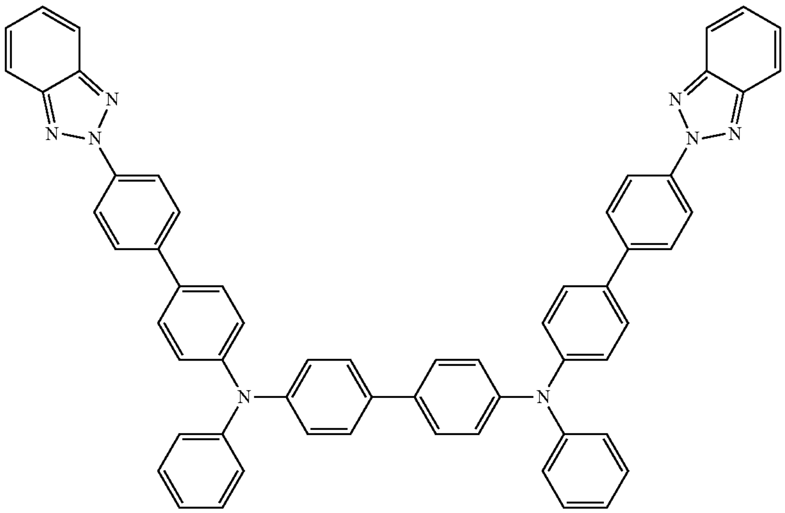
B-108
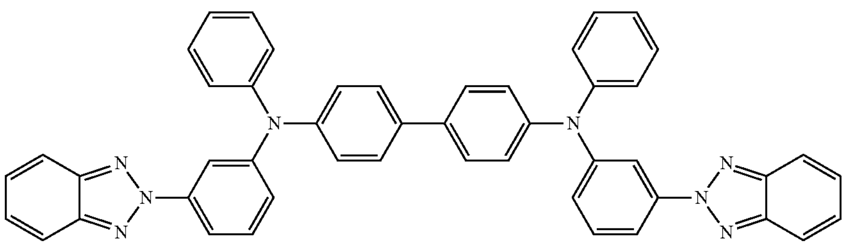
B-109
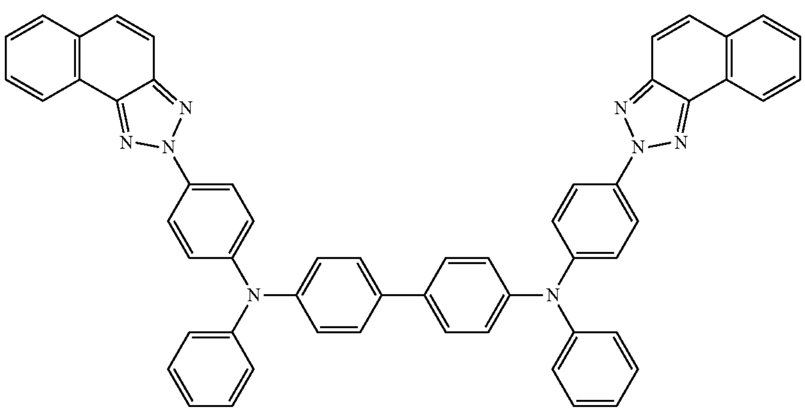
B-110
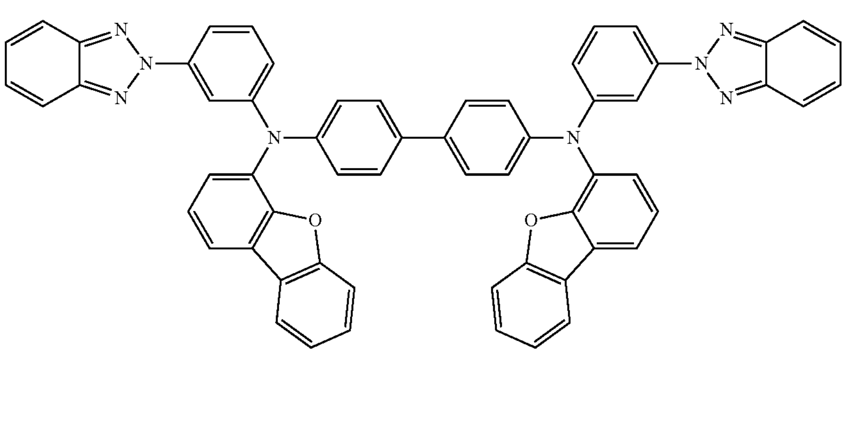

-continued
B-111
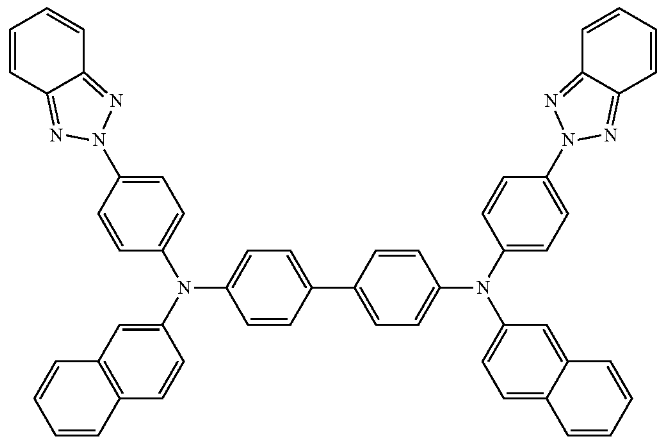
B-112
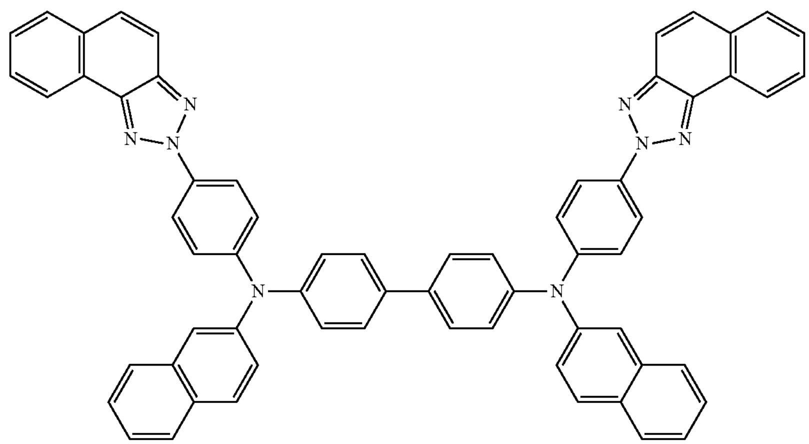
B-113
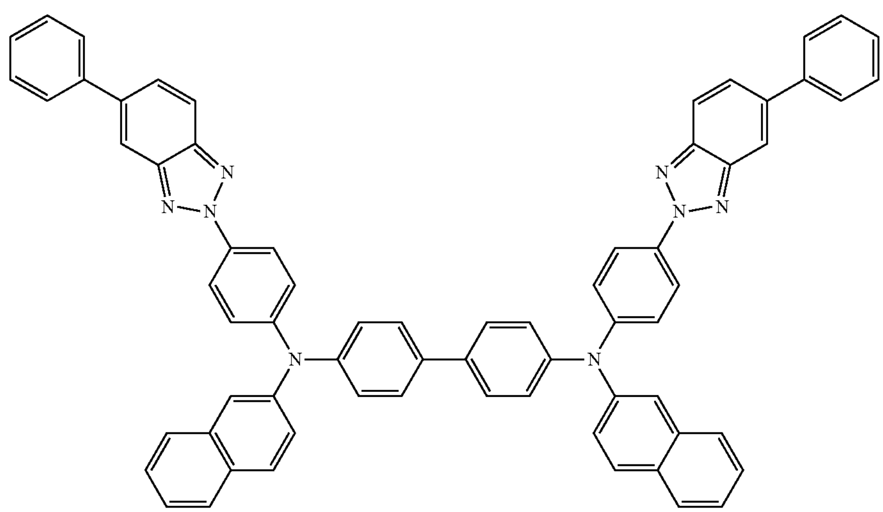

-continued
B-114
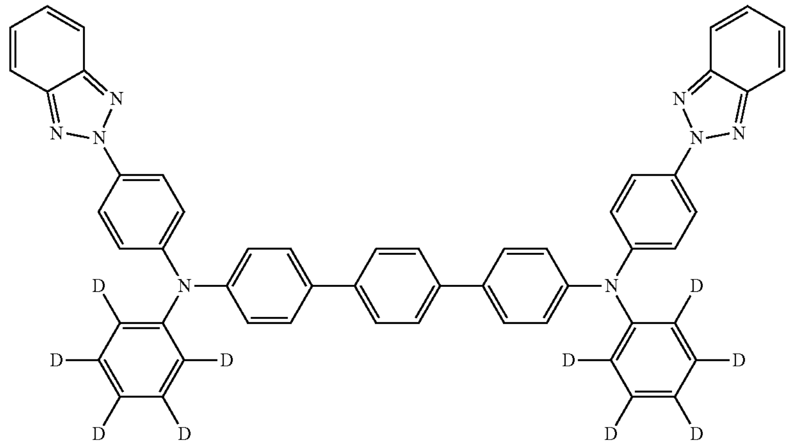
B-115
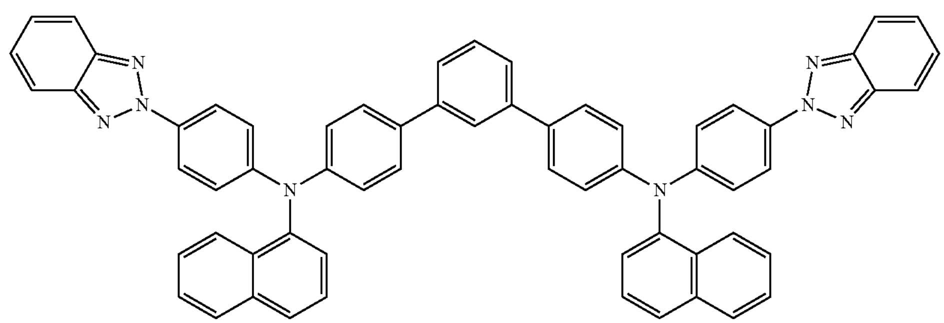
B-116
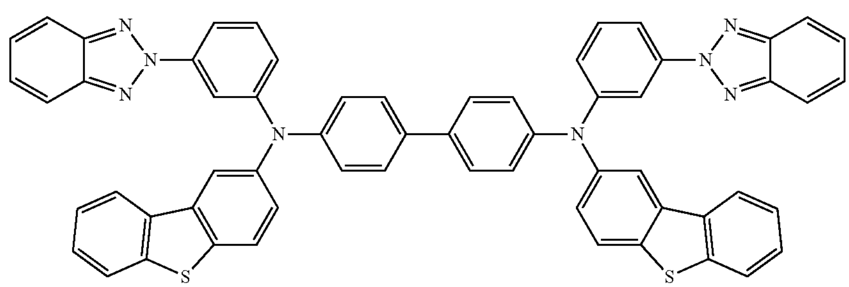
B-117
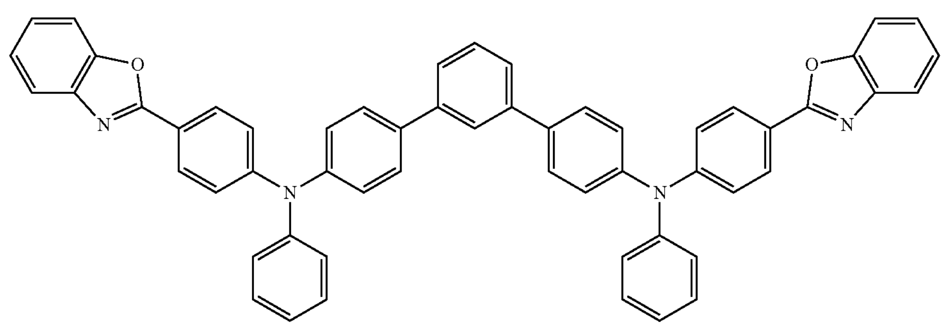

-continued
B-118
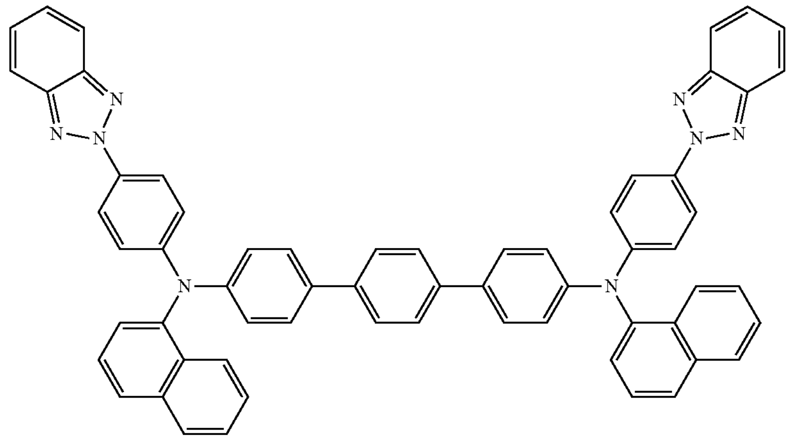
B-119
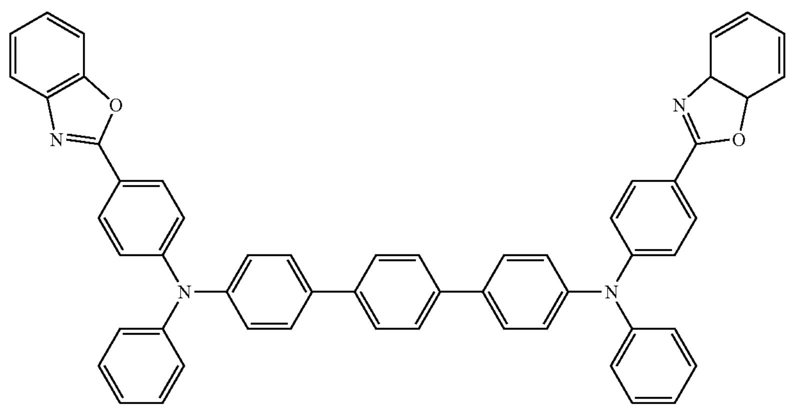
B-120
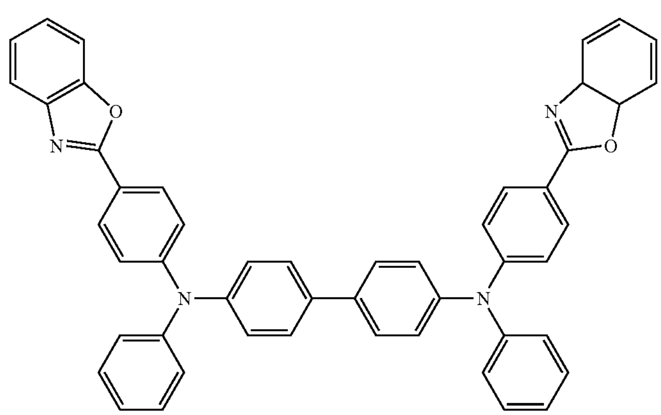

-continued
B-121
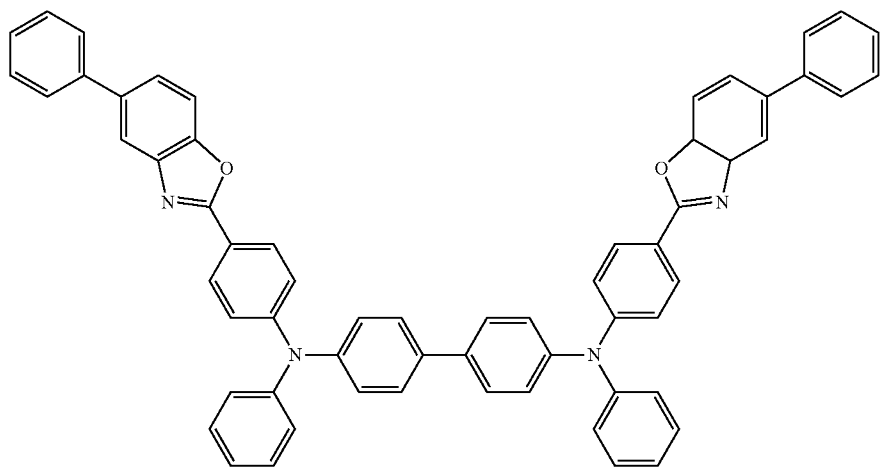
B-122
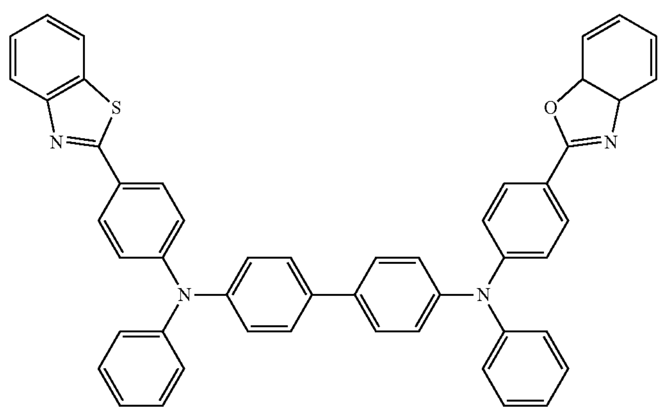
B-123
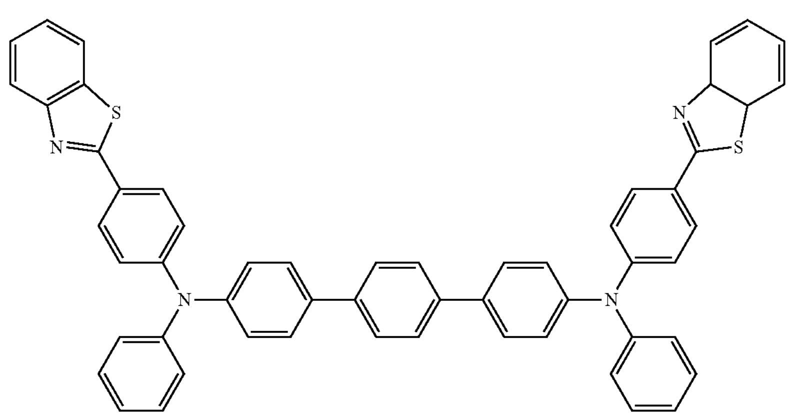

-continued
B-124
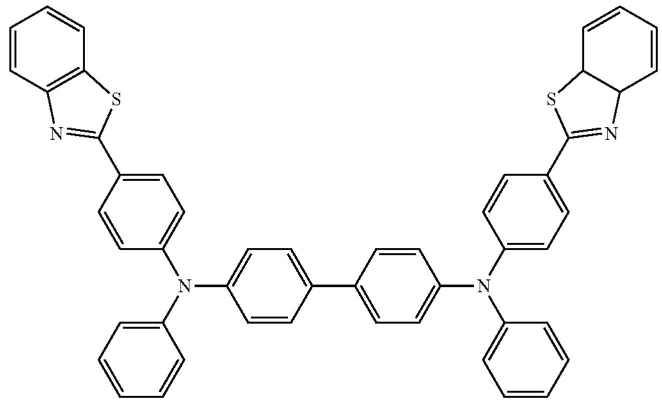
B-125
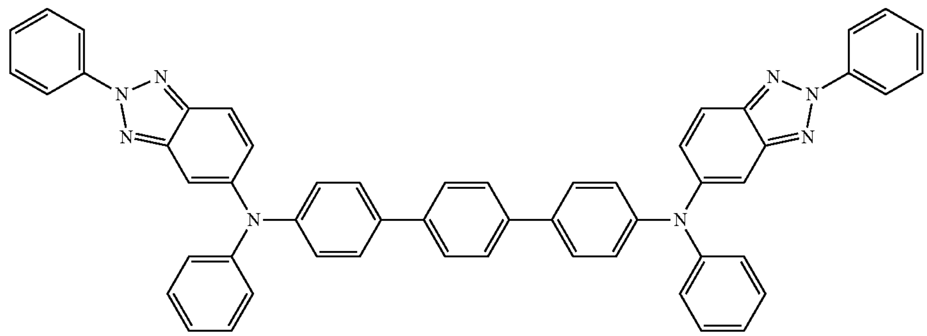
B-126
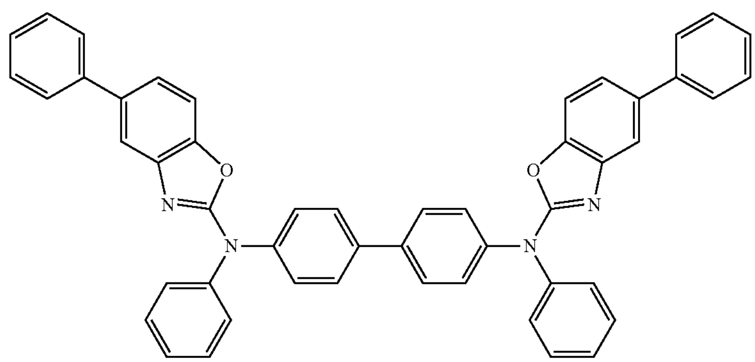
B-127
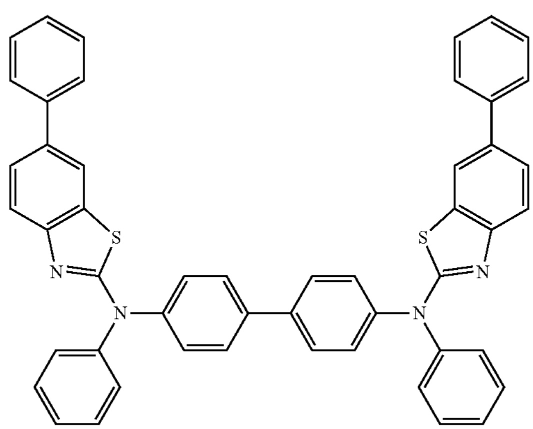

-continued
B-128
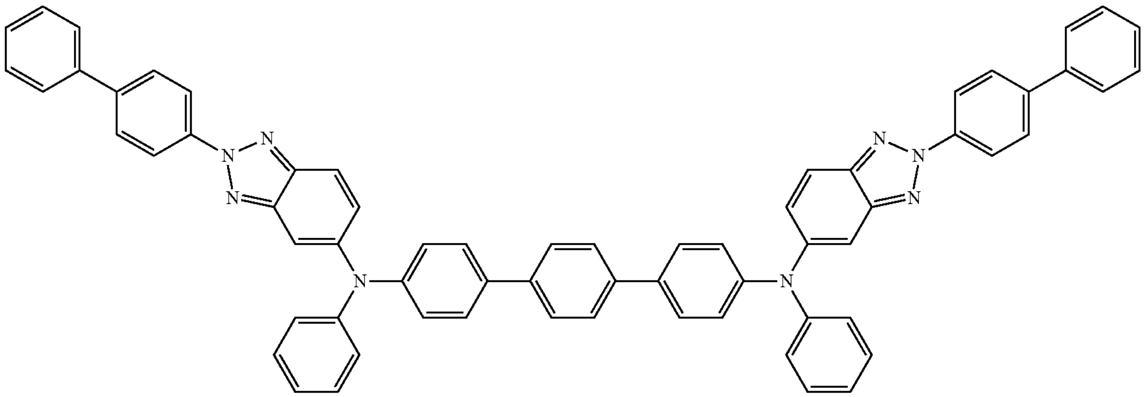
B-129
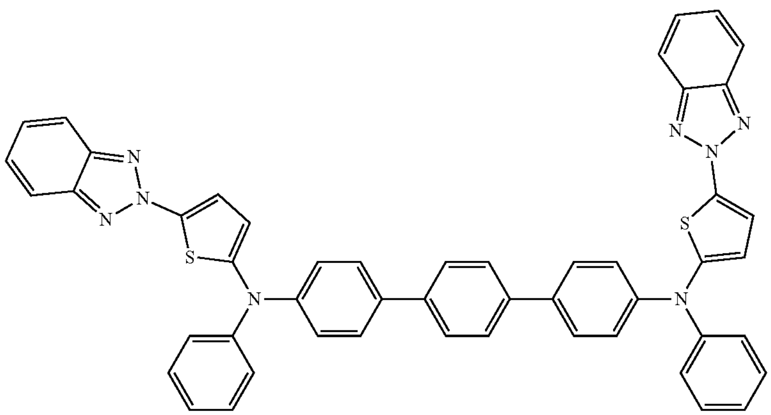
B-130
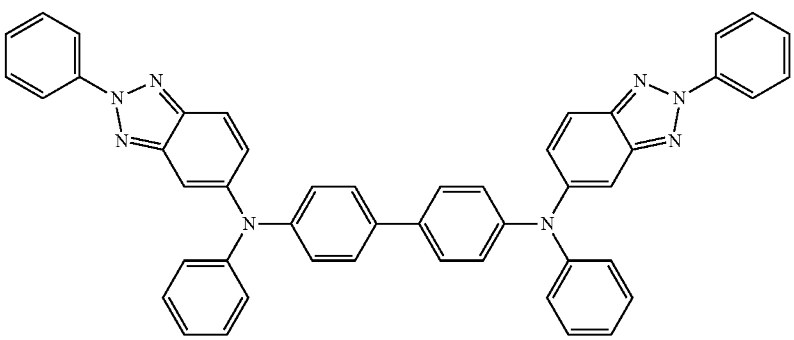
B-131
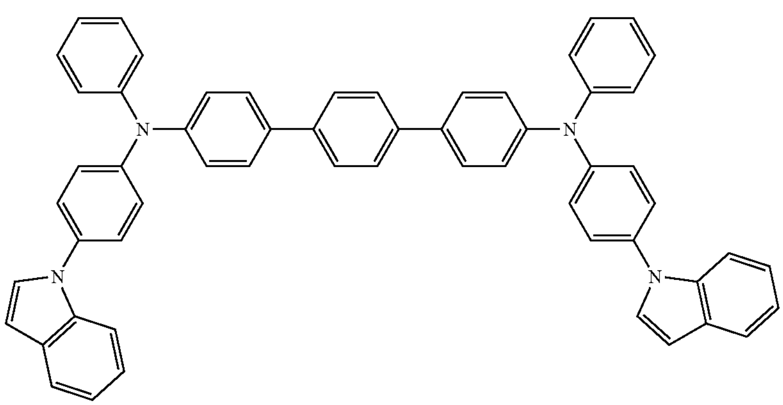

-continued
B-132
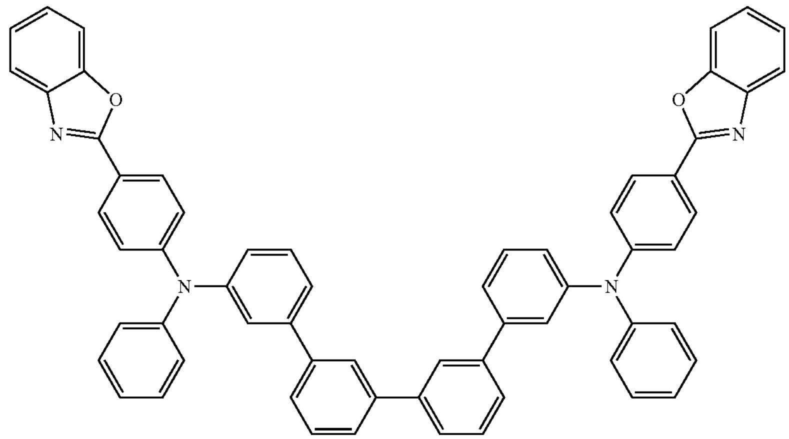
B-133
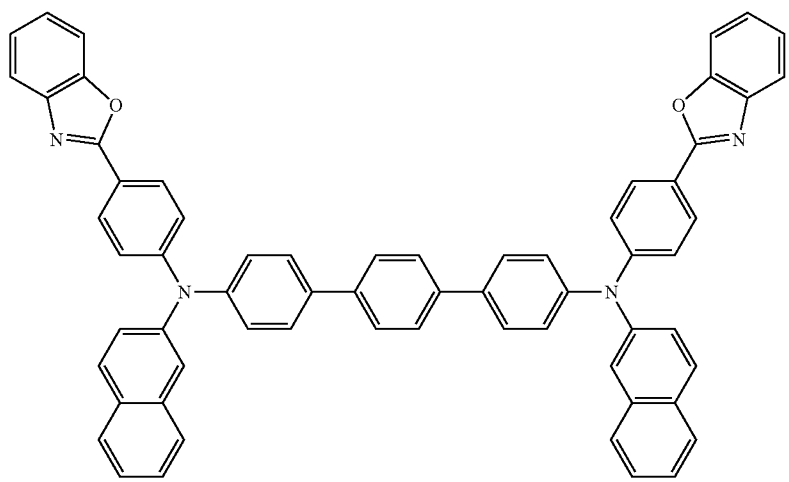
B-134
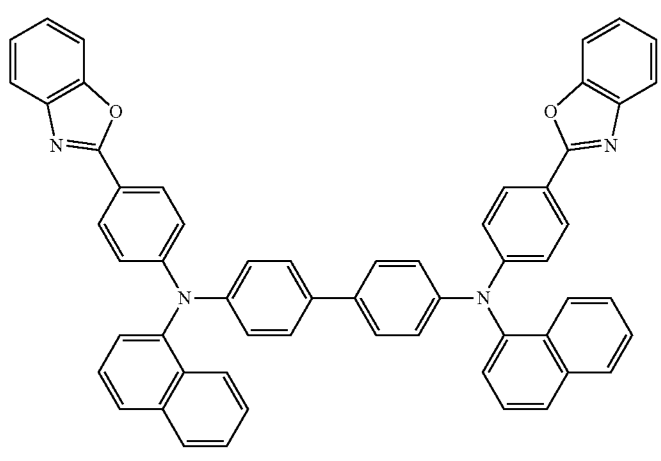

-continued
B-135
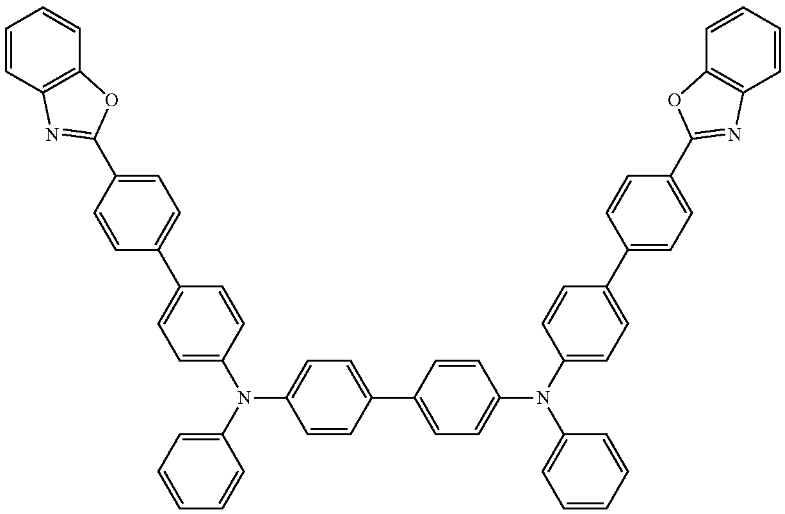
B-136
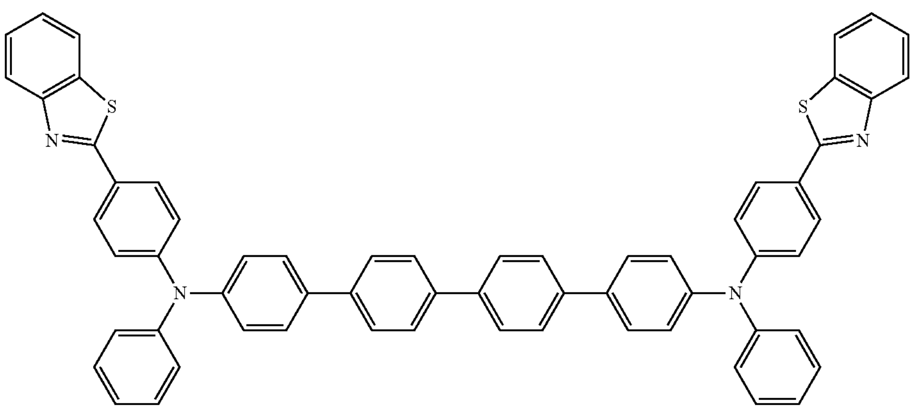
B-137
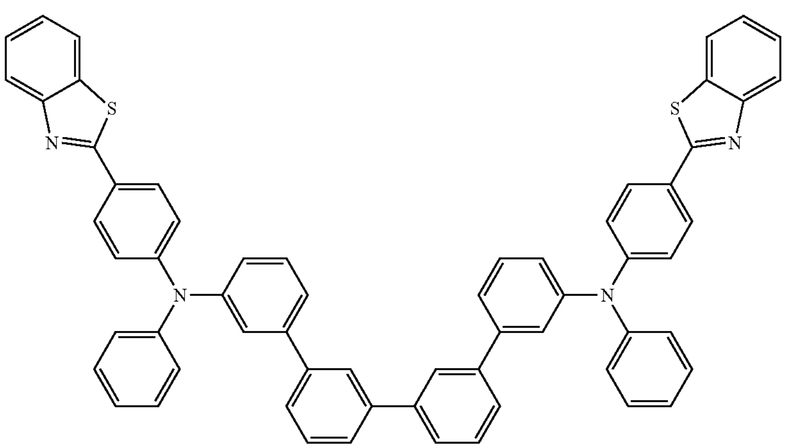

-continued
B-138
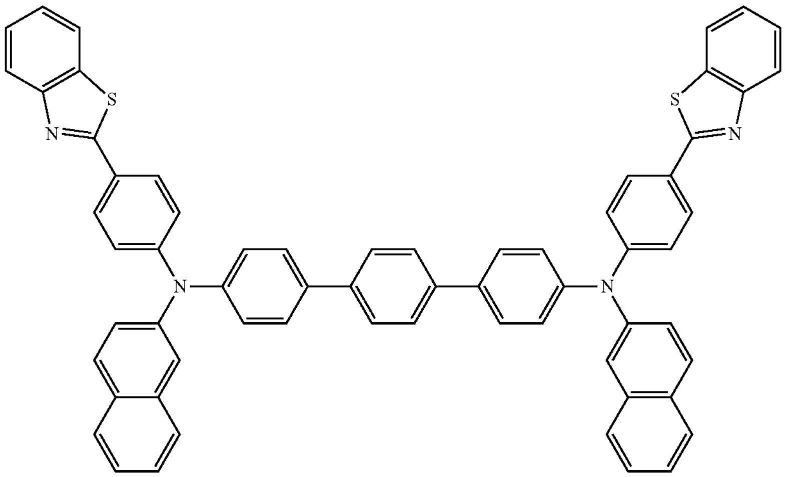
B-139
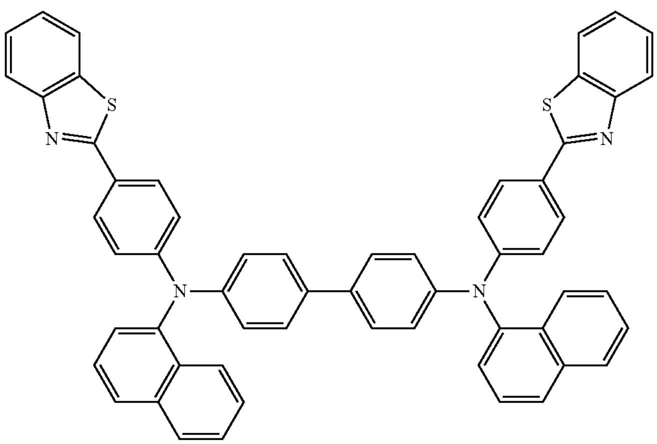
B-140
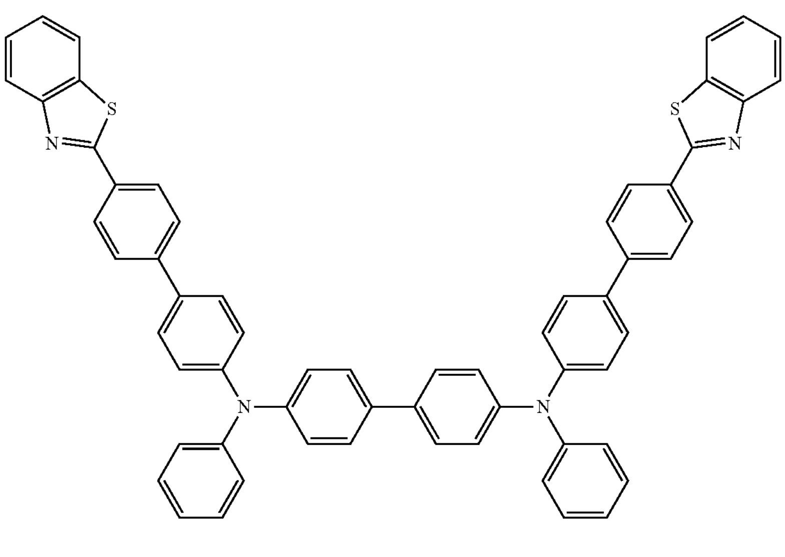

-continued
B-141
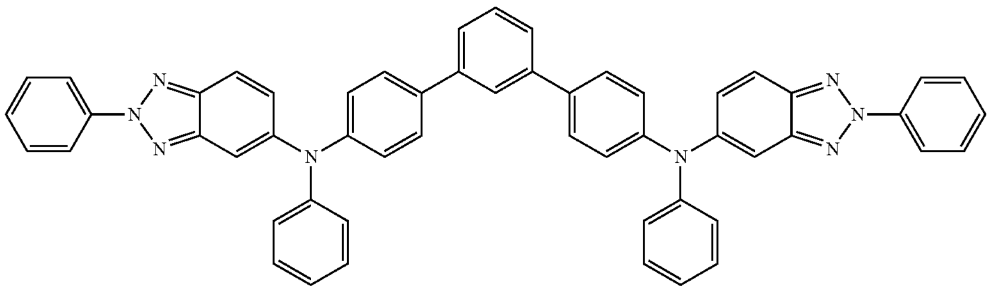
B-142
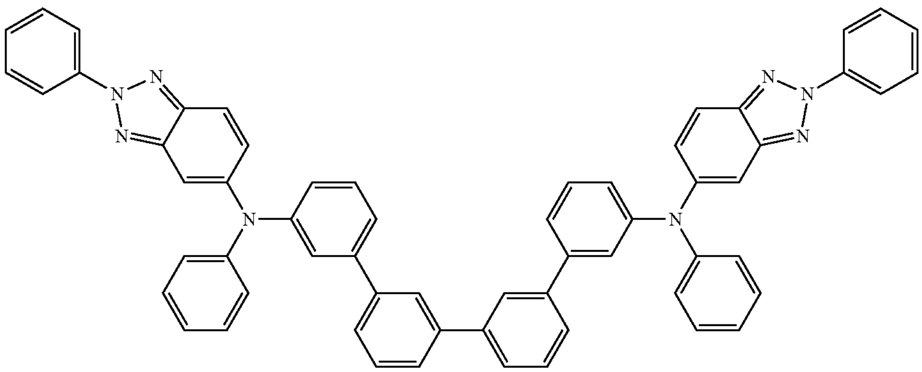
B-143
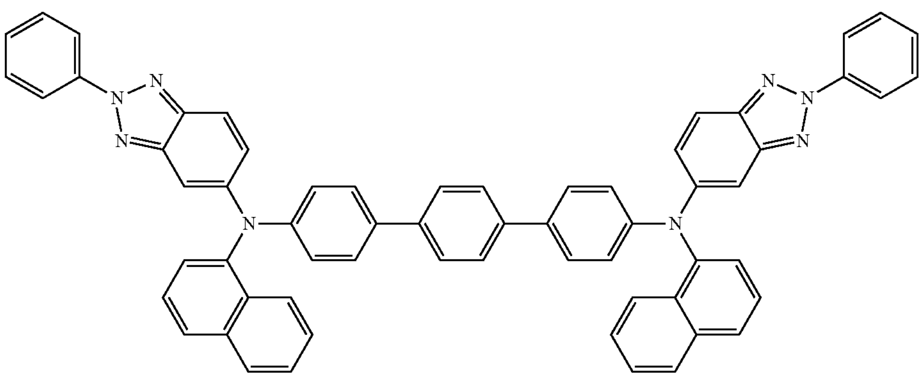
B-144
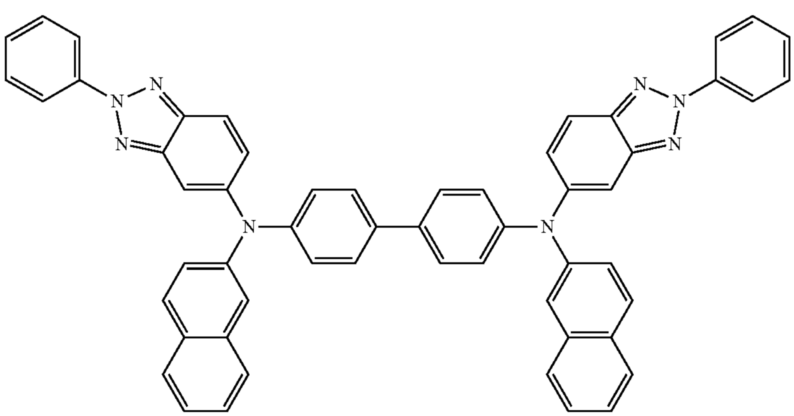

-continued
B-145
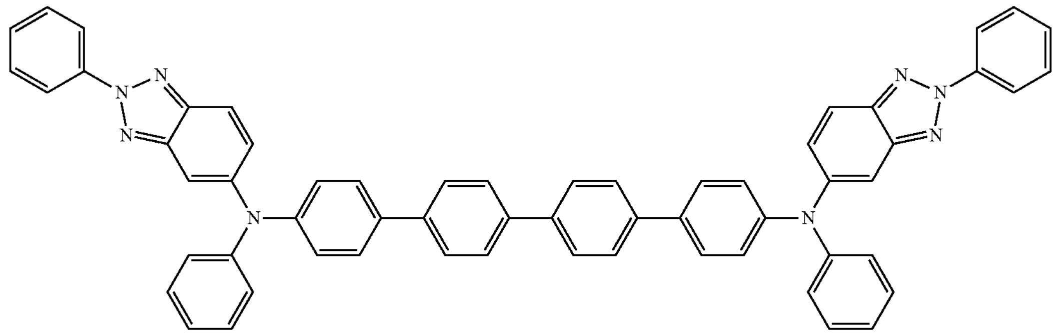
B-146
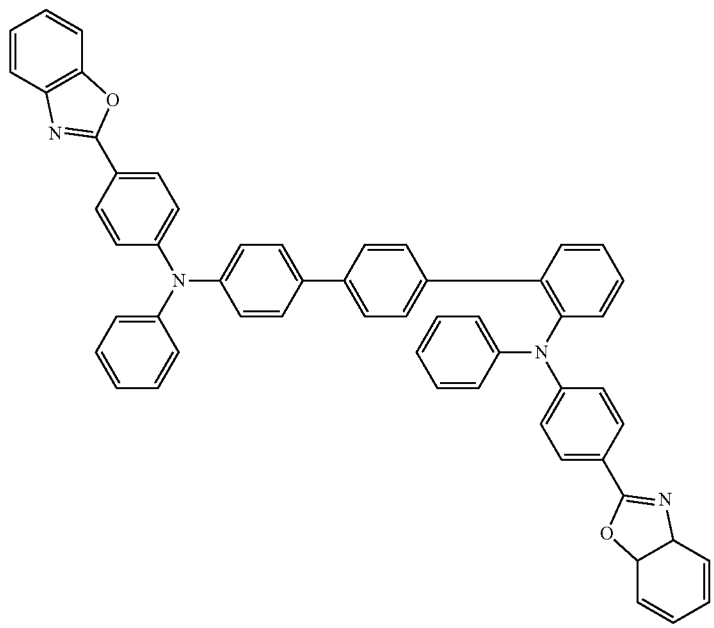
B-147
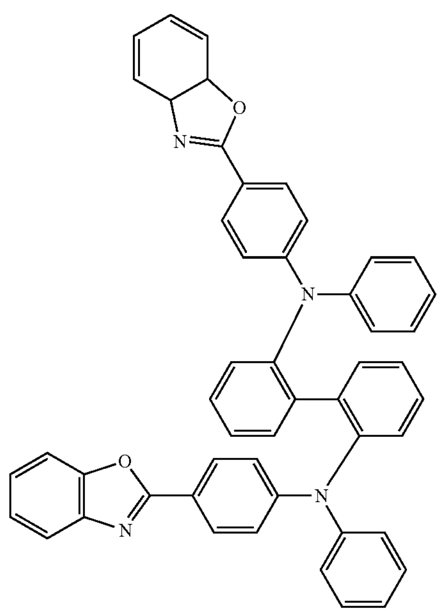

-continued
B-148
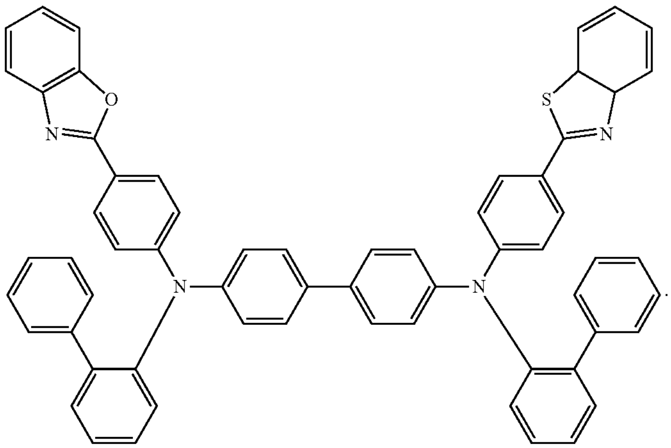
7. The organic light-emitting device according to claim 1, wherein the compound represented by [Formula C] is selected from compounds represented by the following [C-1] to [C-99]:
C-1
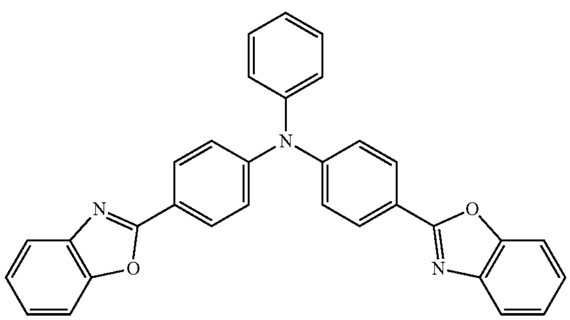
C-2
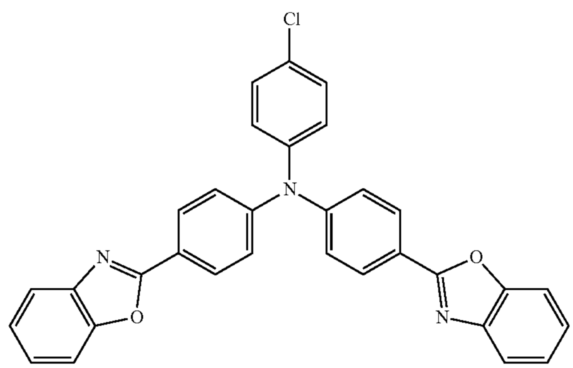
C-3
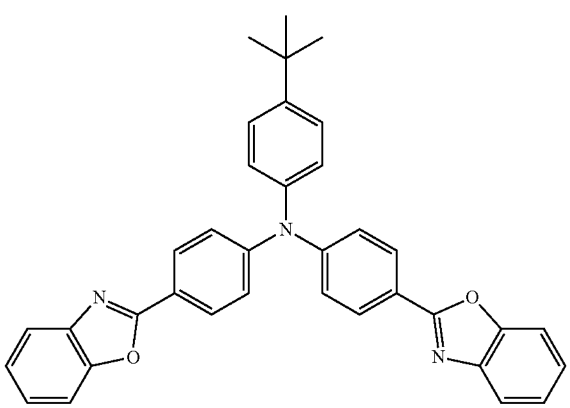
C-4
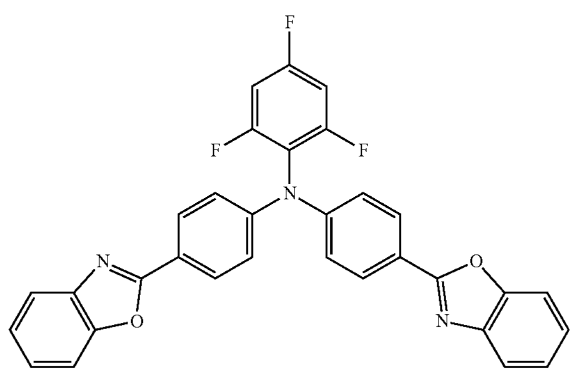

-continued
C-5
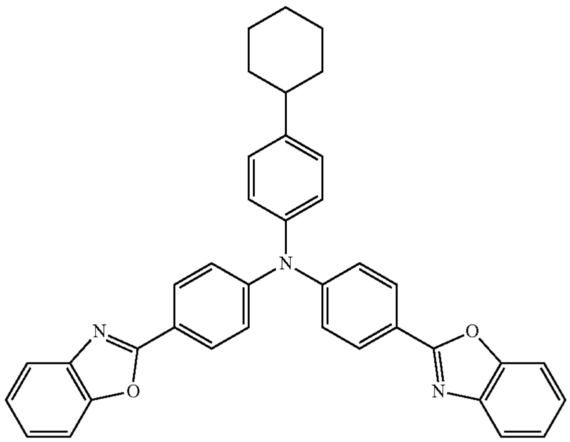
C-6
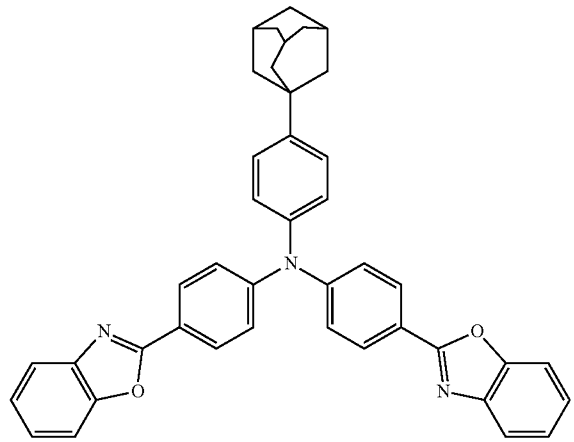
C-7
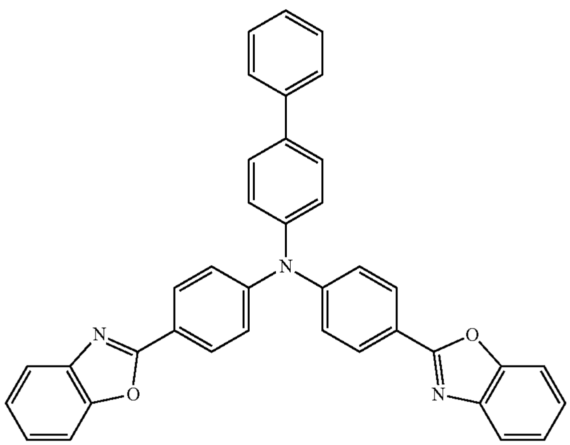
C-8
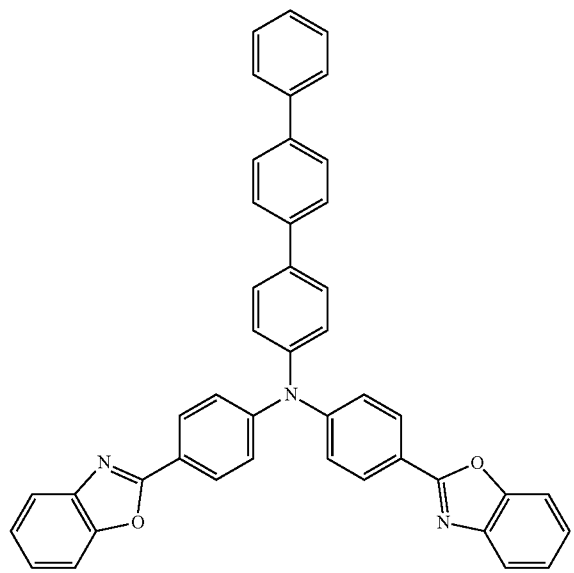
C-9
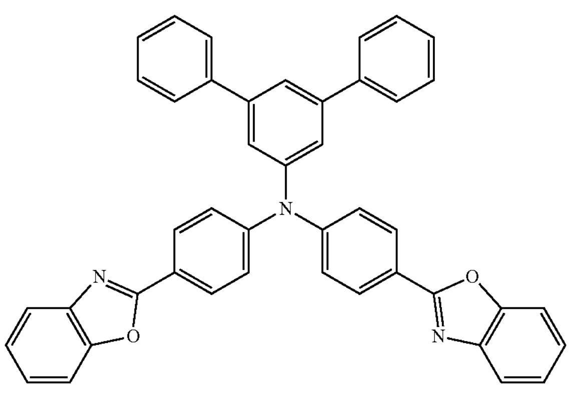
C-10
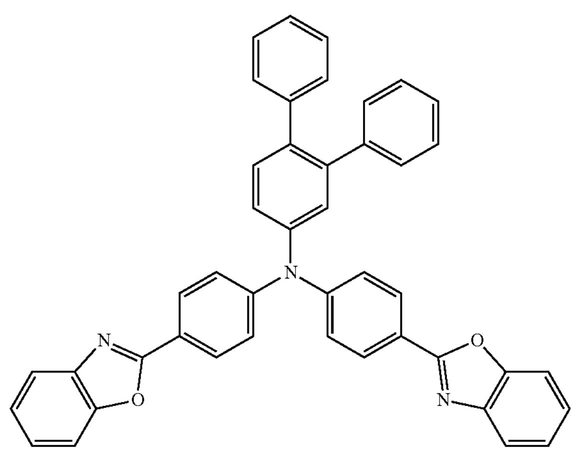

-continued
C-11
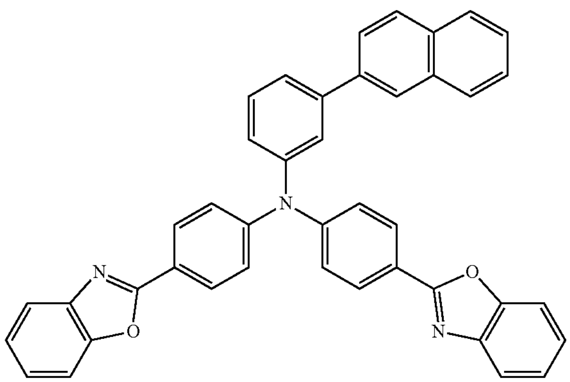
C-12
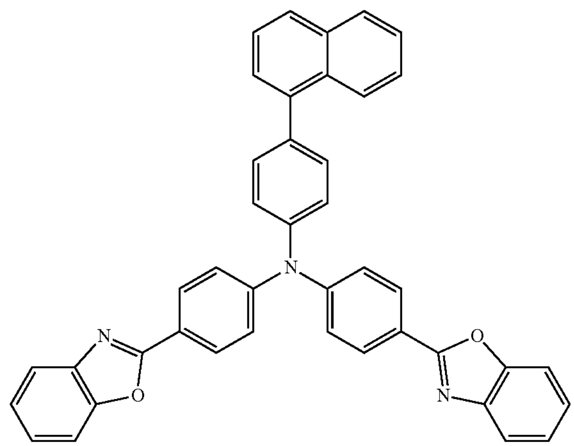
C-13
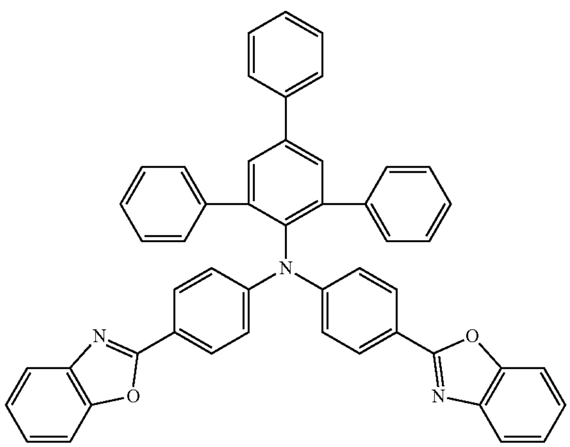
C-14
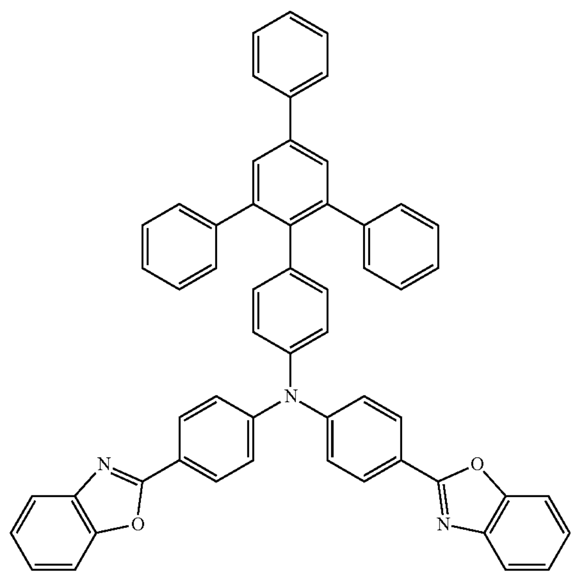
C-15
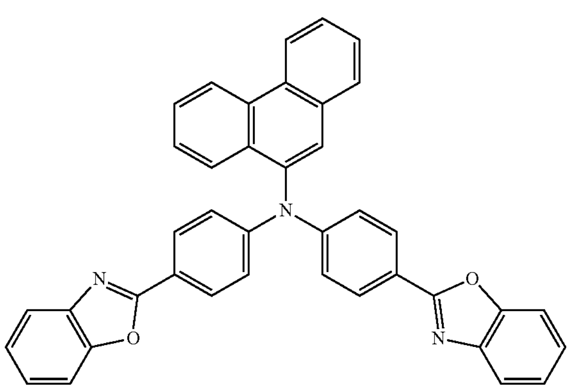
C-16
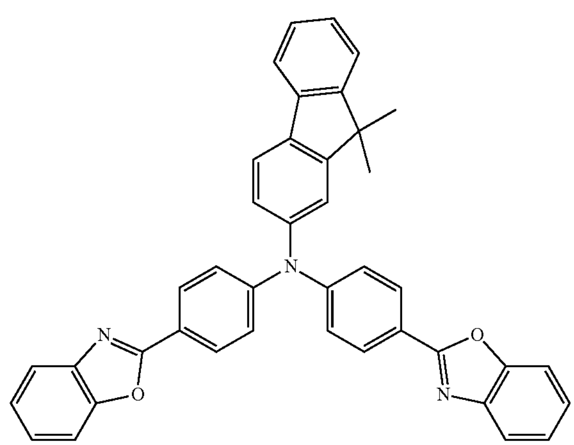

-continued
C-17
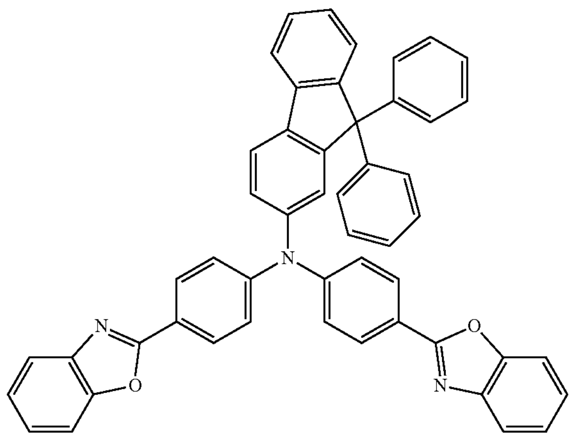
C-18
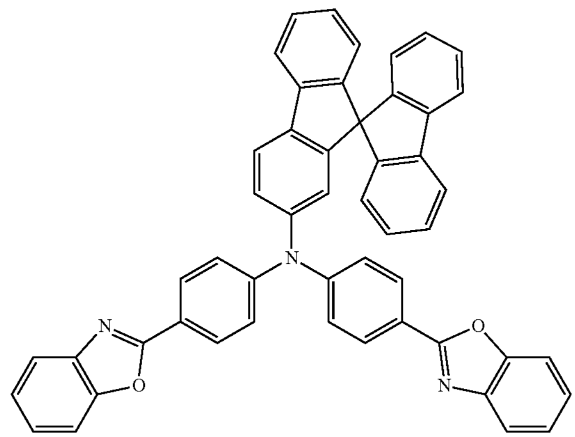
C-19
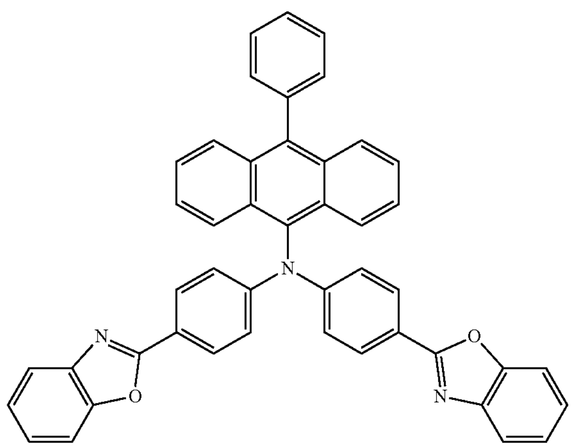
C-20
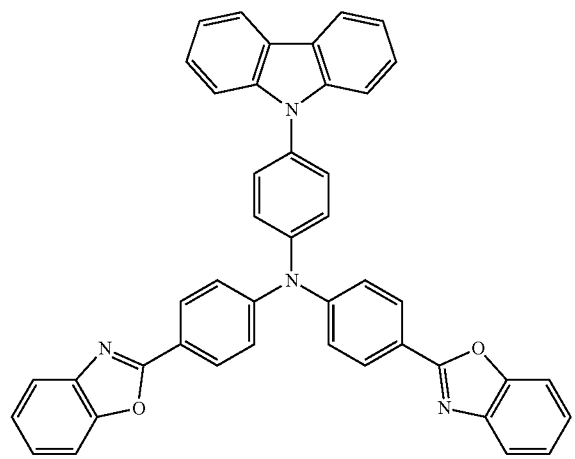
C-21
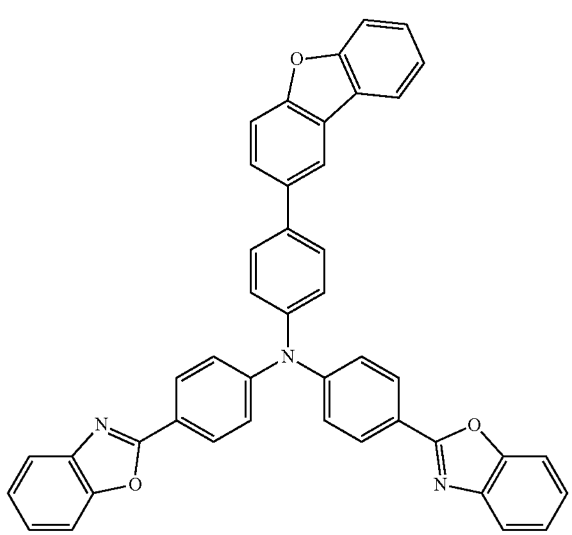
C-22
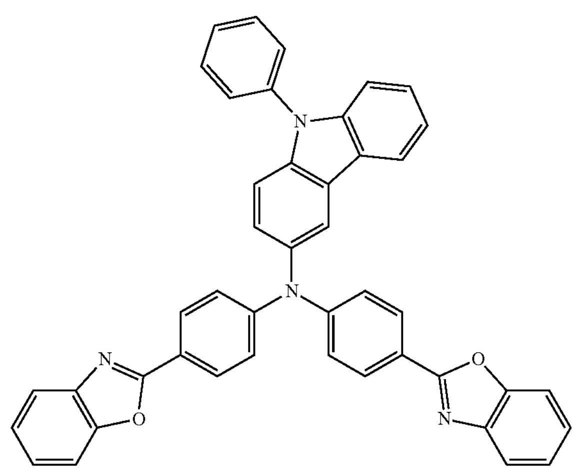

-continued
C-23
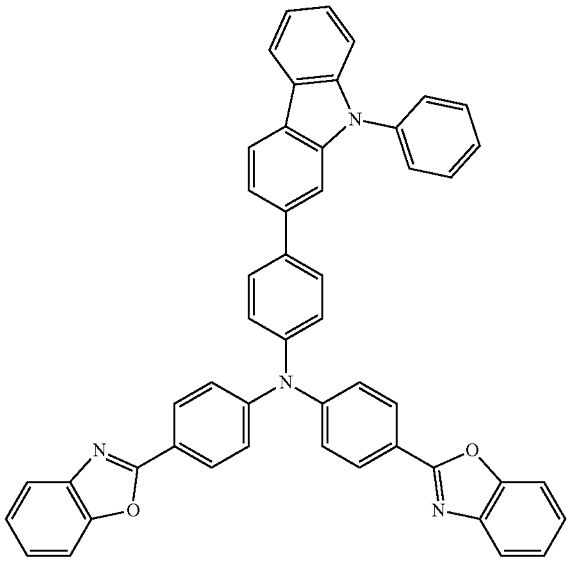
C-24
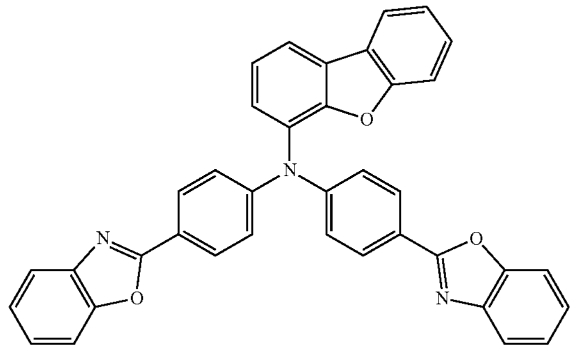
C-25
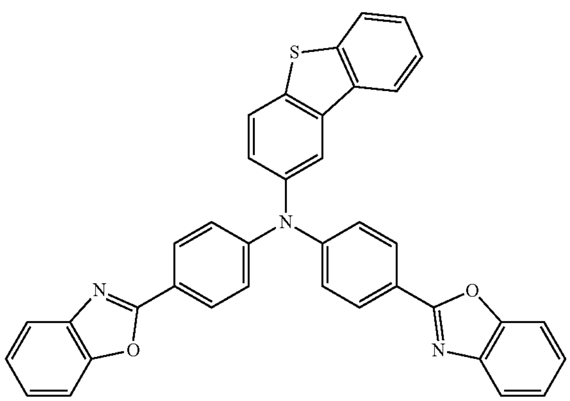
C-26
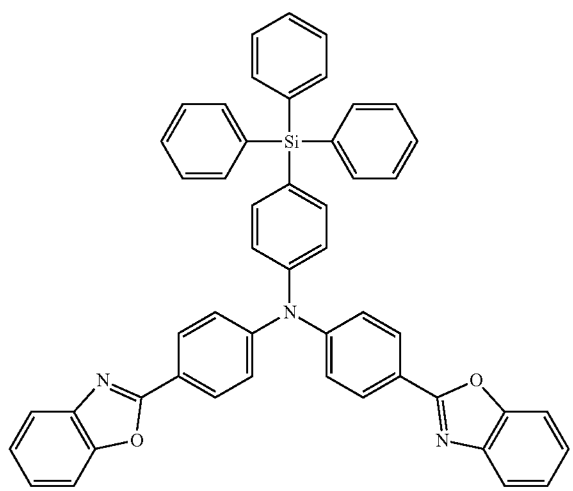
C-27
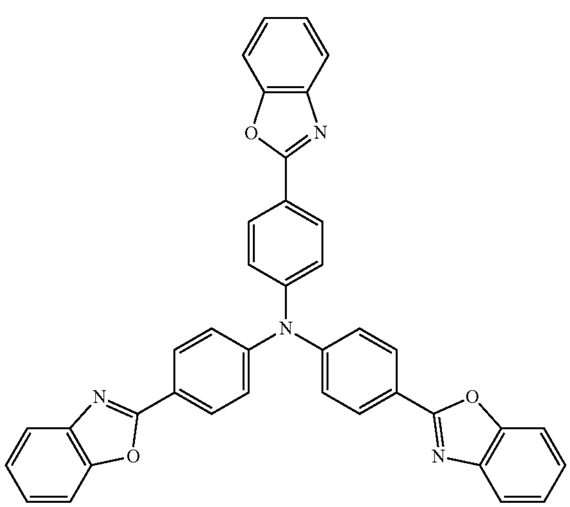
C-28
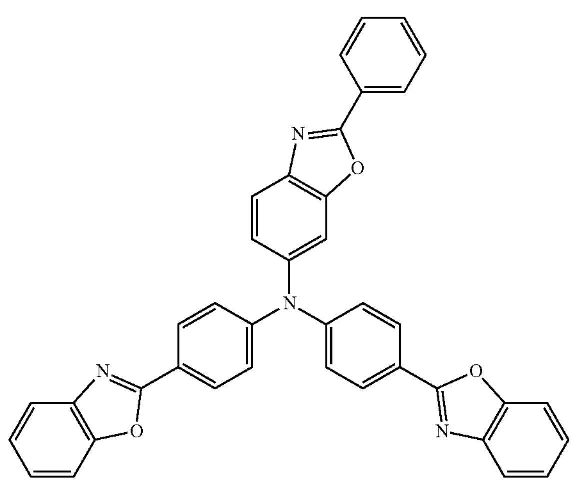

-continued
C-29
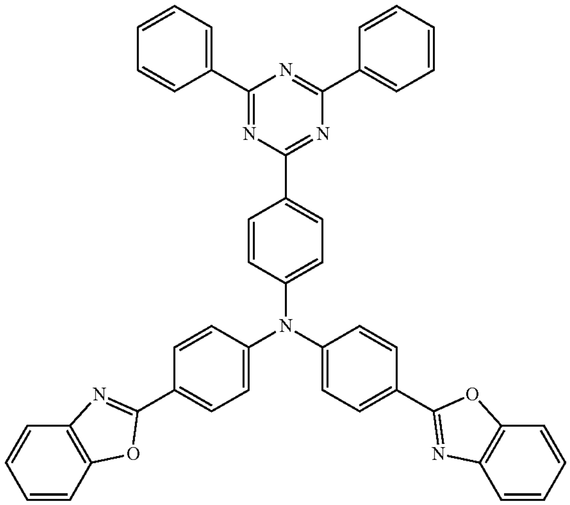
C-30
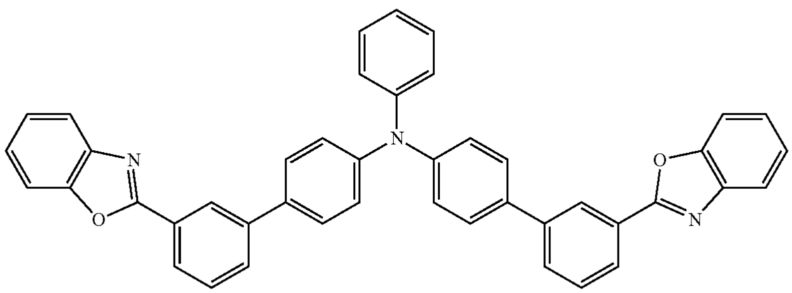
C-31
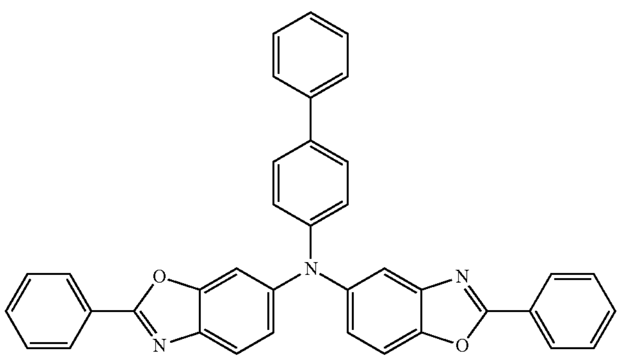
C-32
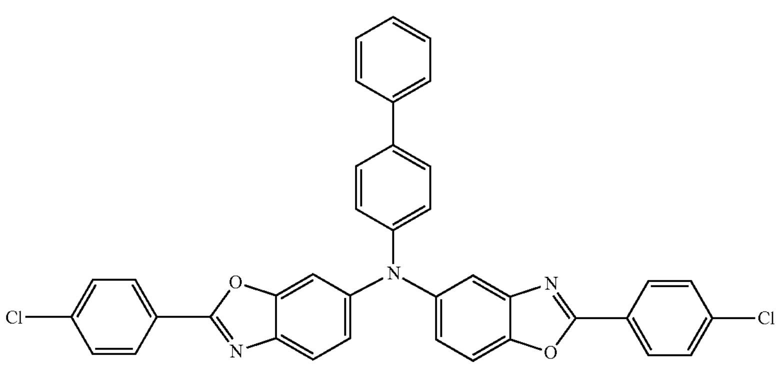

-continued
C-33
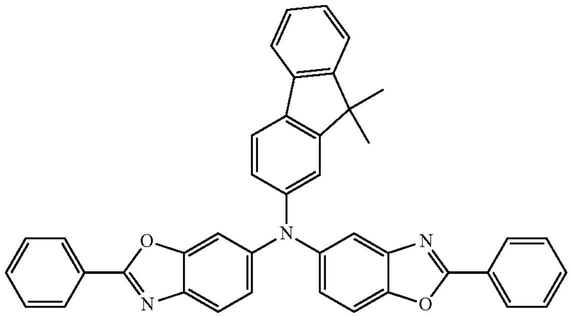
C-34
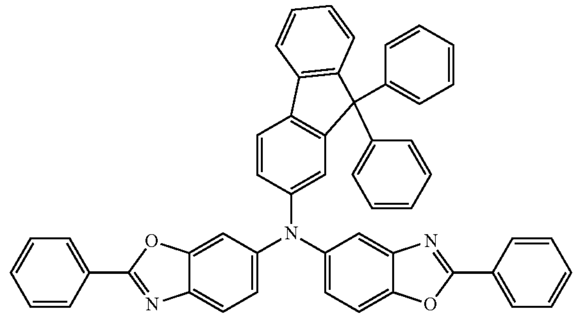
C-35
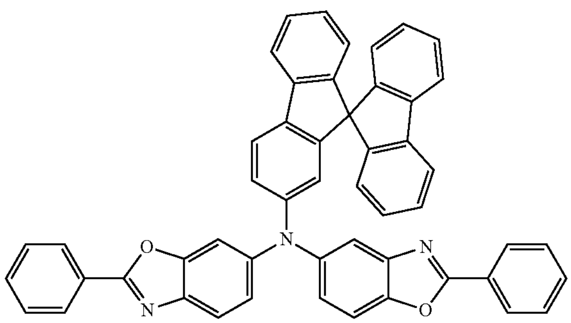
C-36
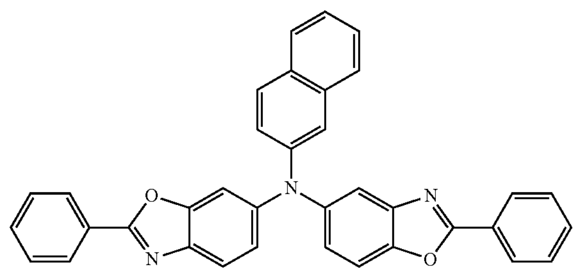
C-37
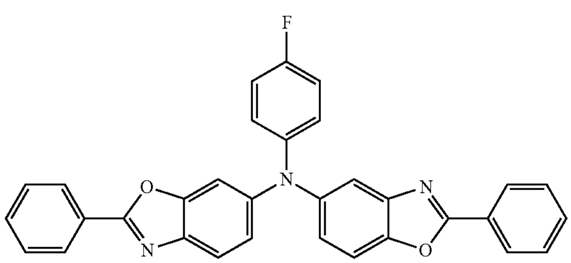
C-38
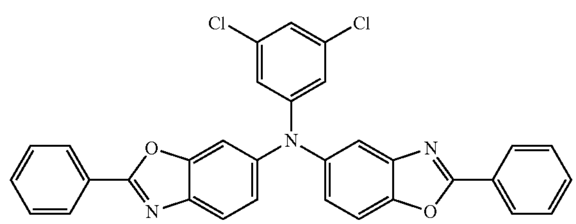
C-39
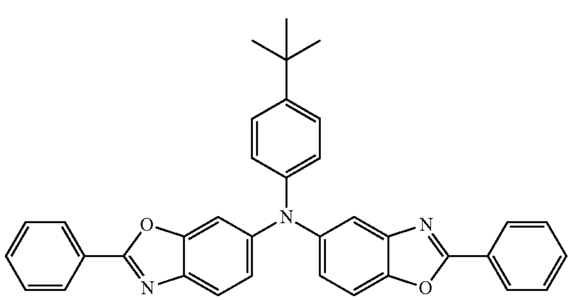
C-40
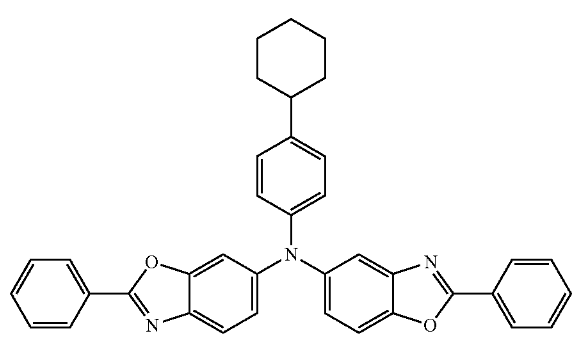

-continued
C-41
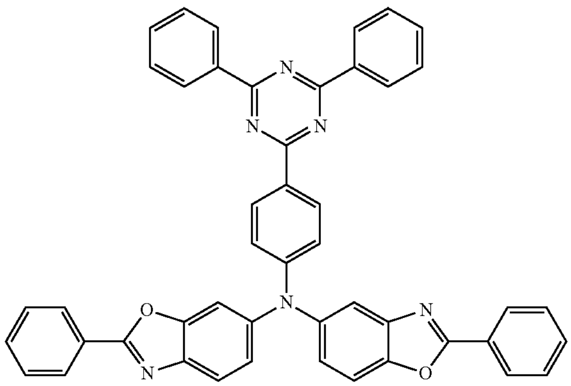
C-42
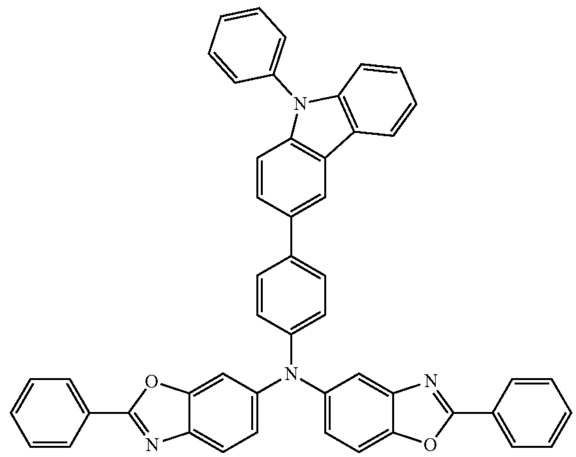
C-43
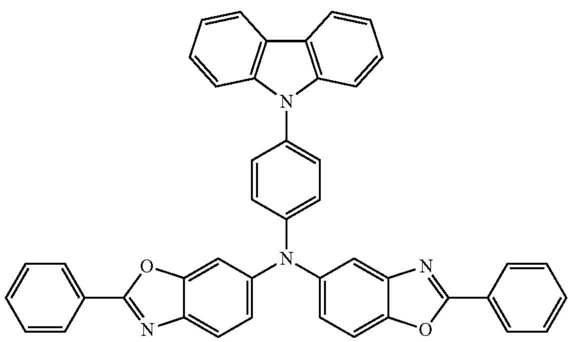
C-44
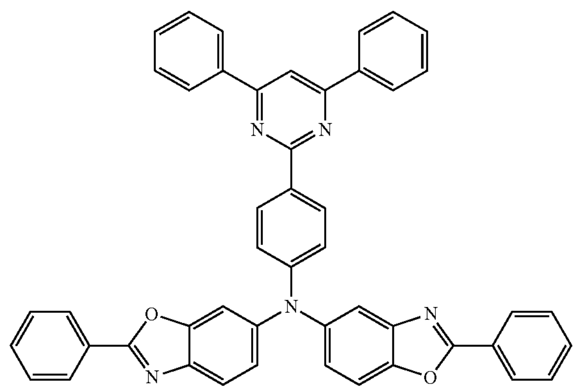
C-45
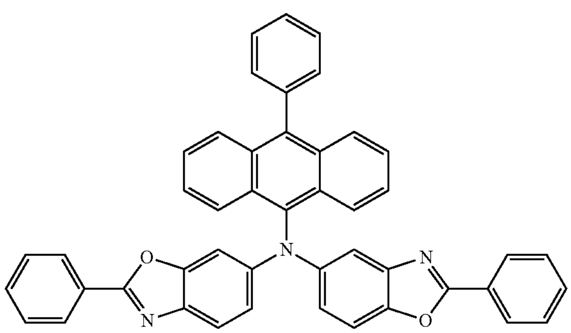
C-46
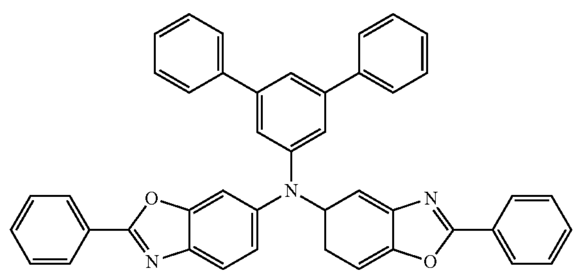
C-47
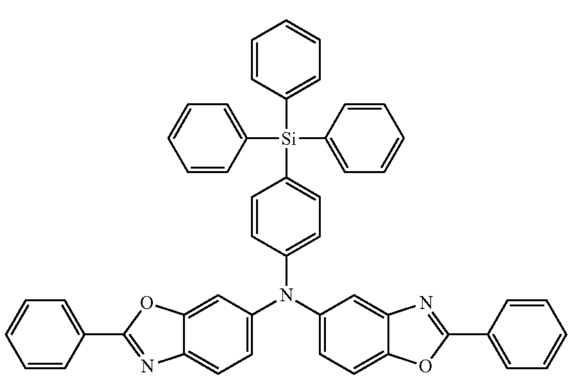
C-48
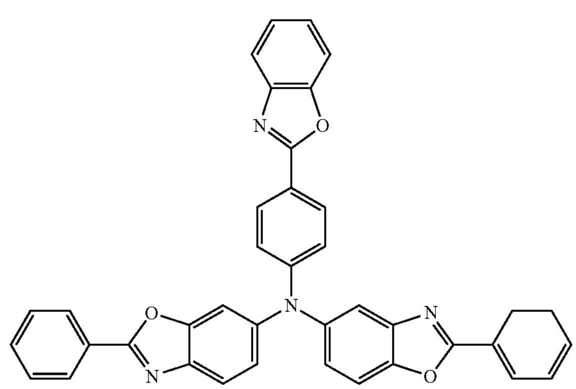

-continued
C-49
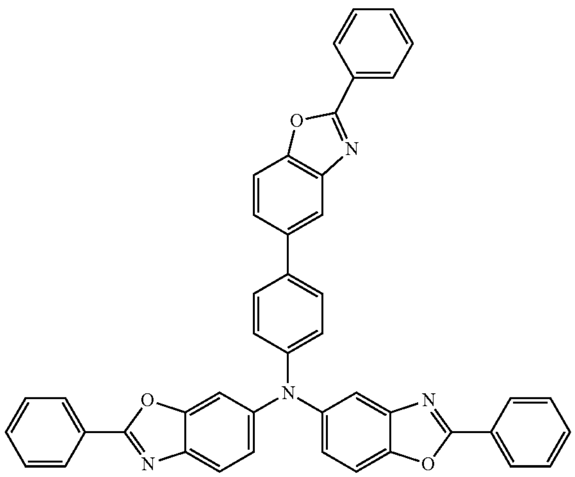
C-50
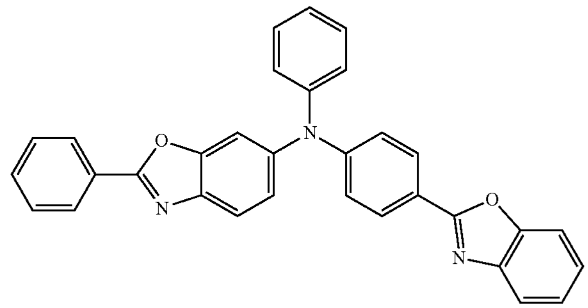
C-51
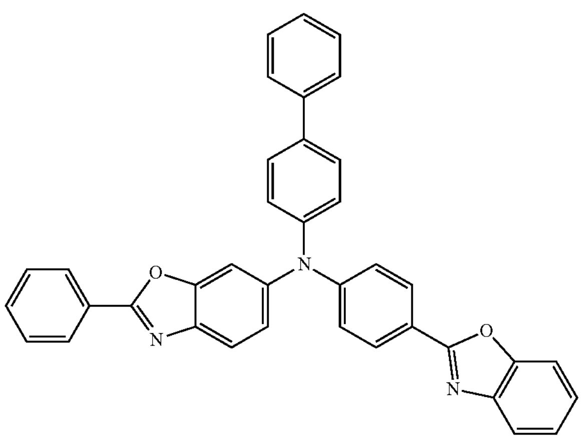
C-52
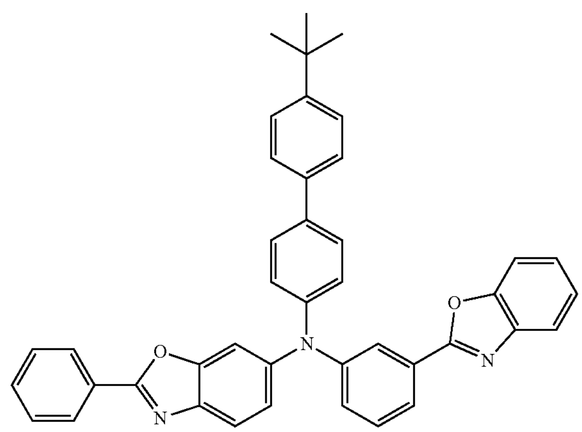
C-53
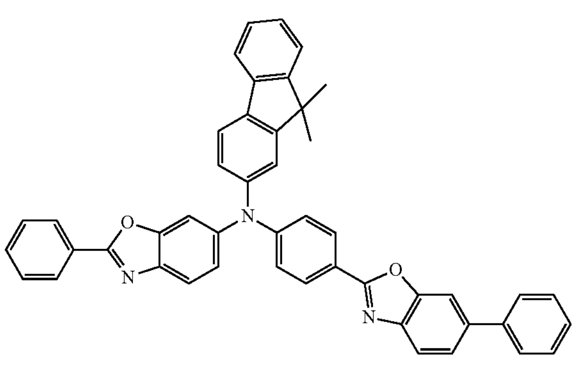
C-54
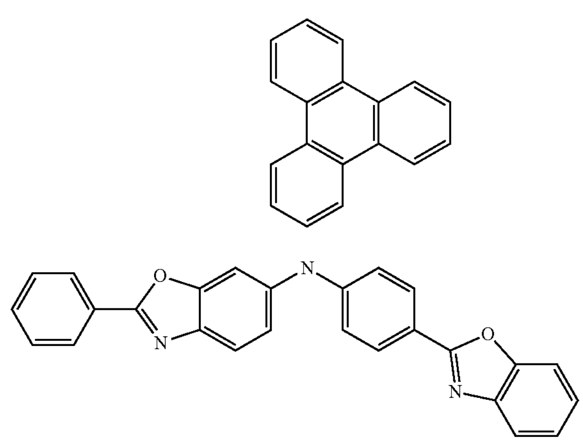

-continued
C-55
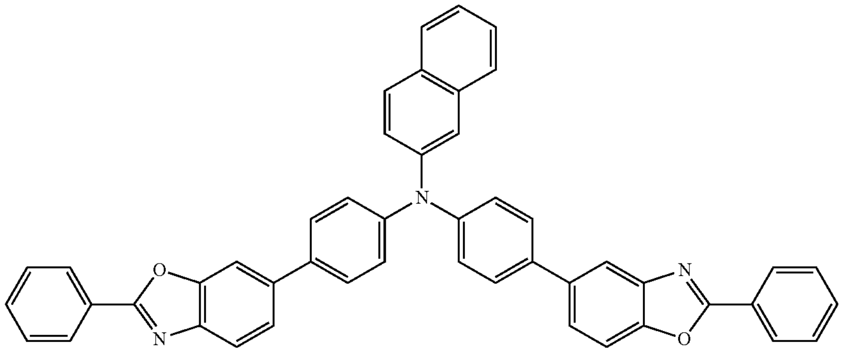
C-56
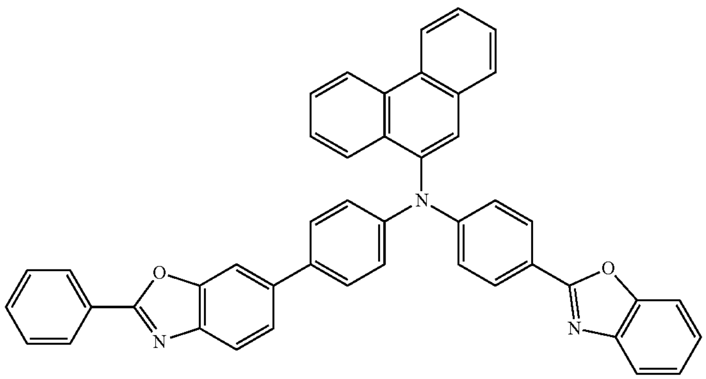
C-57
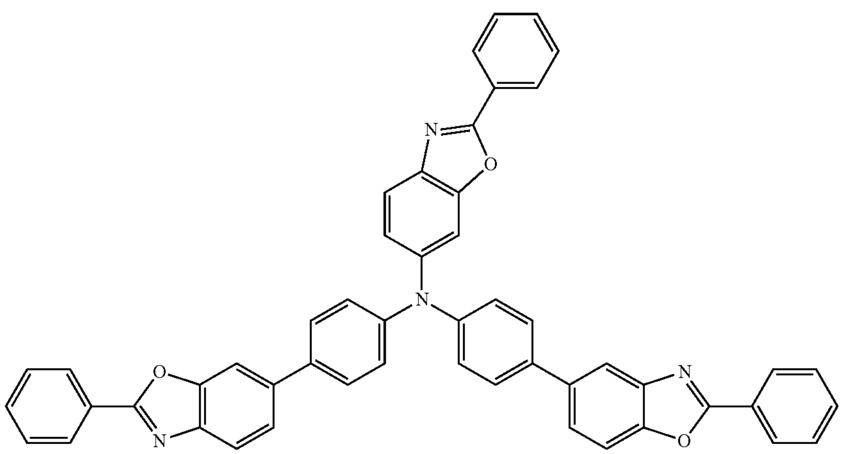
C-58
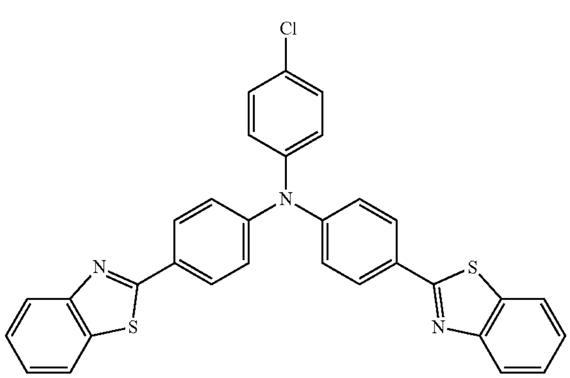
C-59
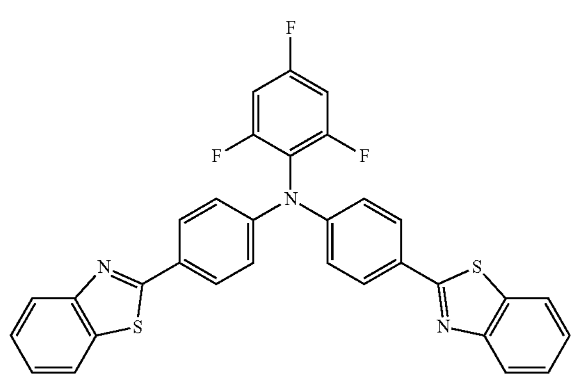

-continued
C-60
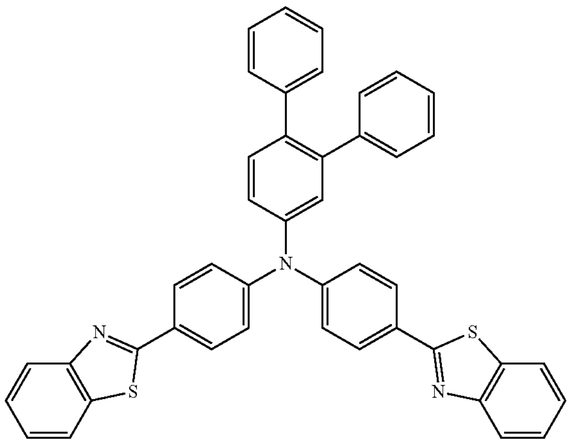
C-61
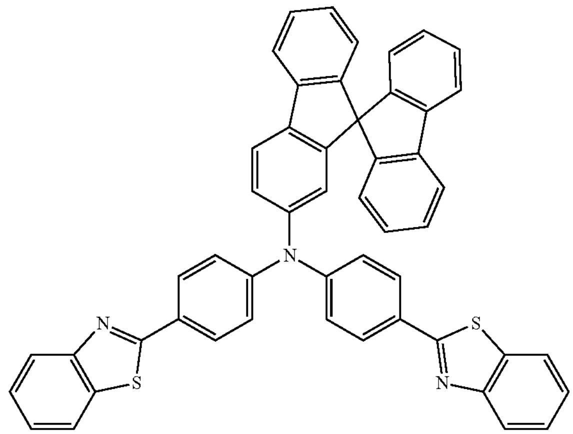
C-62
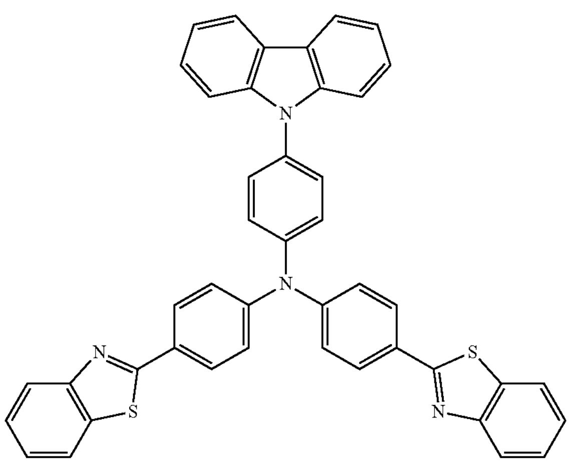
C-63
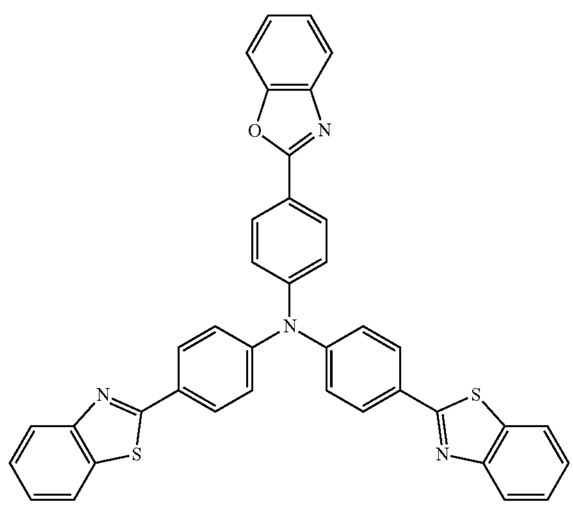
C-64
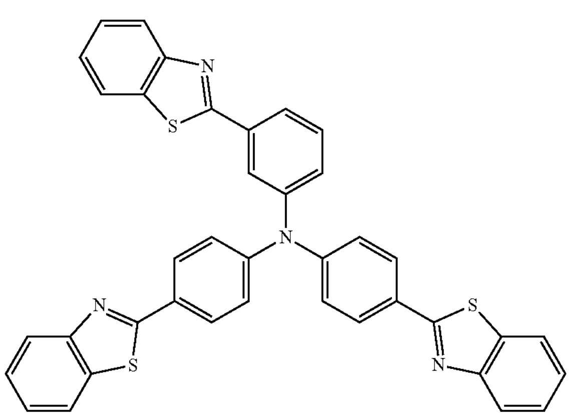
C-65
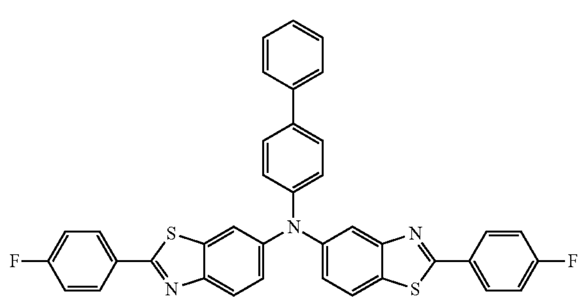

-continued
C-66
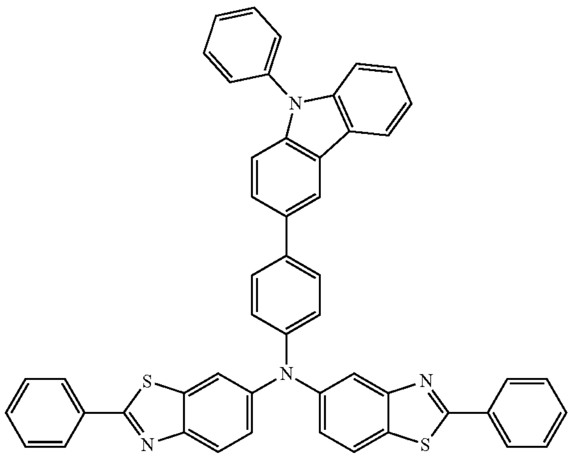
C-67
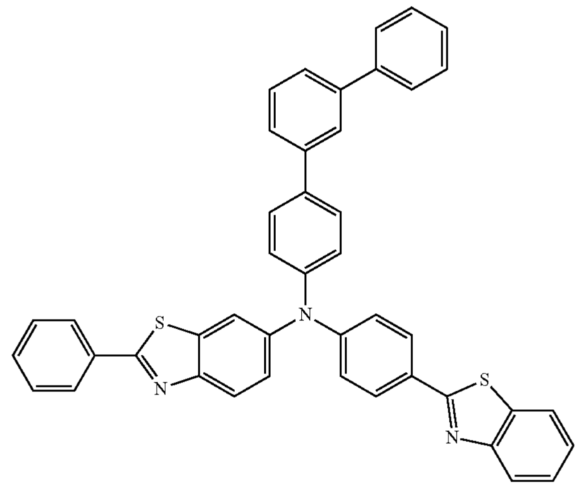
C-68
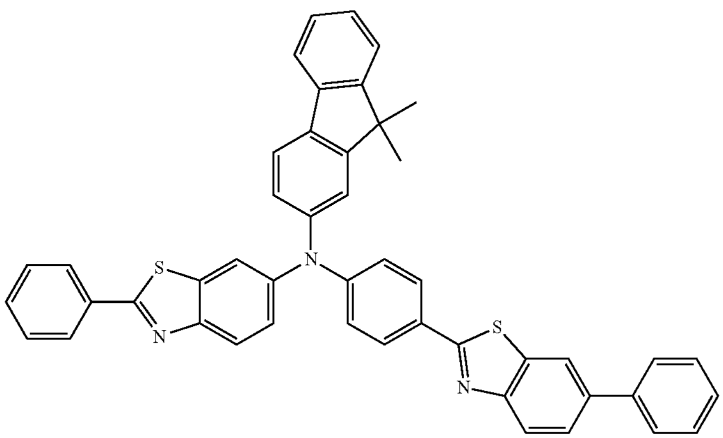
C-69
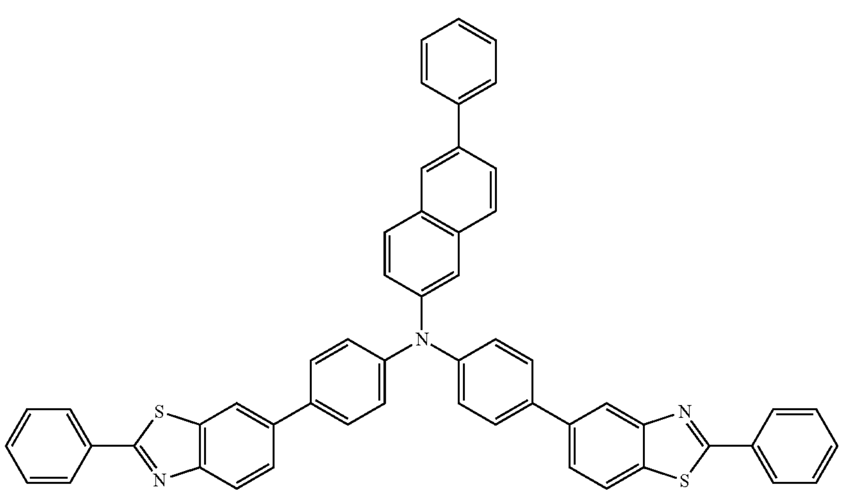

-continued
C-70
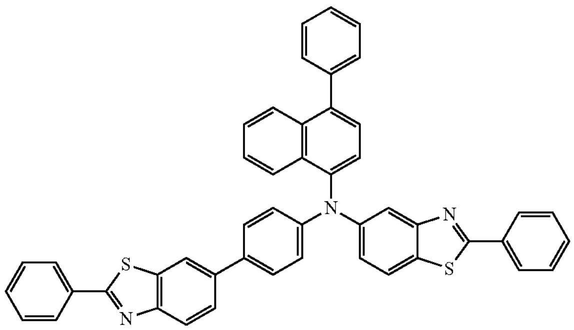
C-71
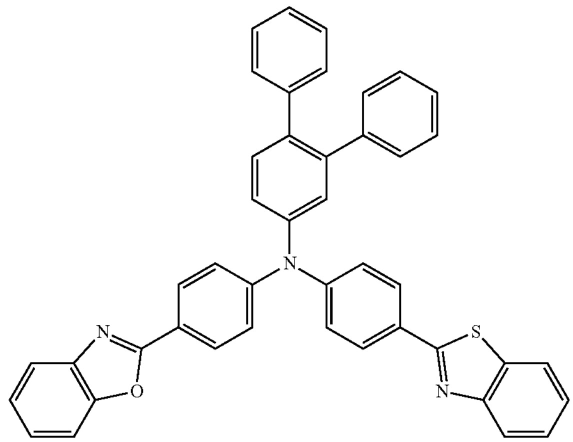
C-72
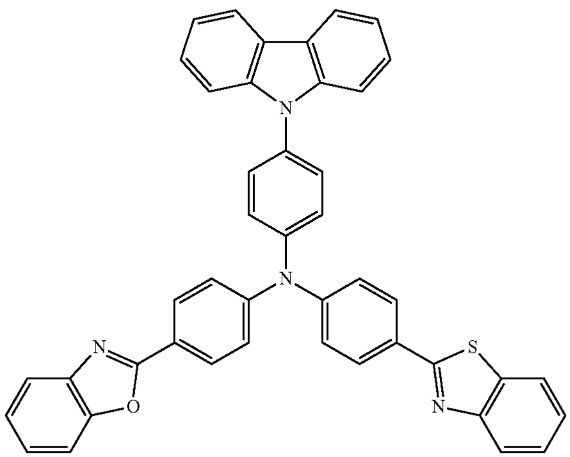
C-73
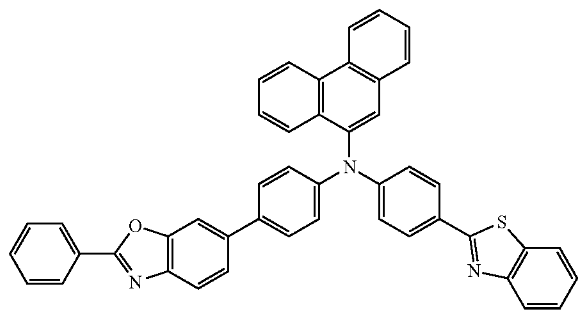
C-74
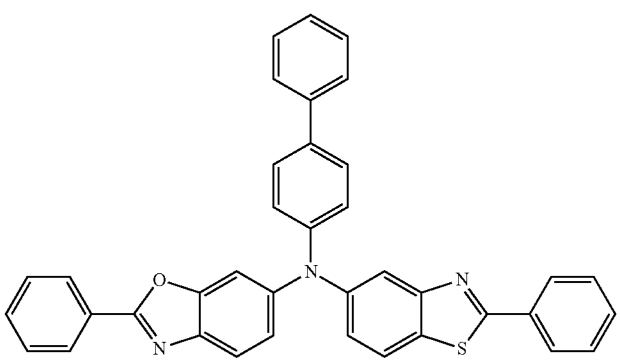
C-75
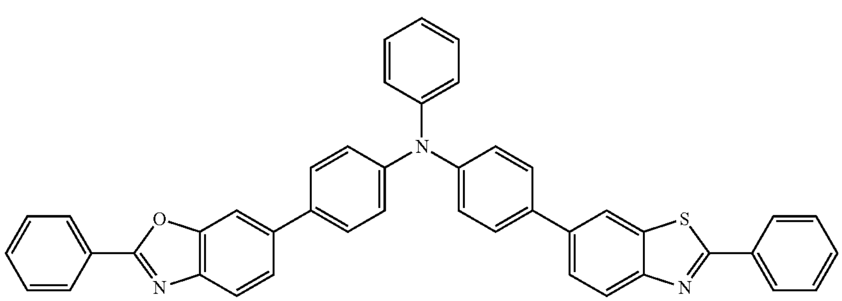

-continued
C-76
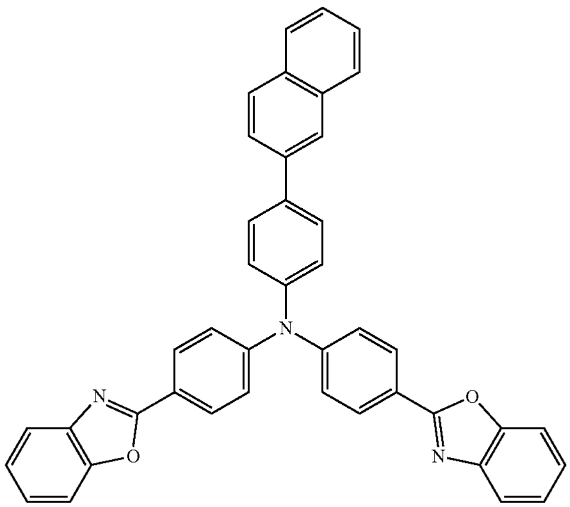
C-77
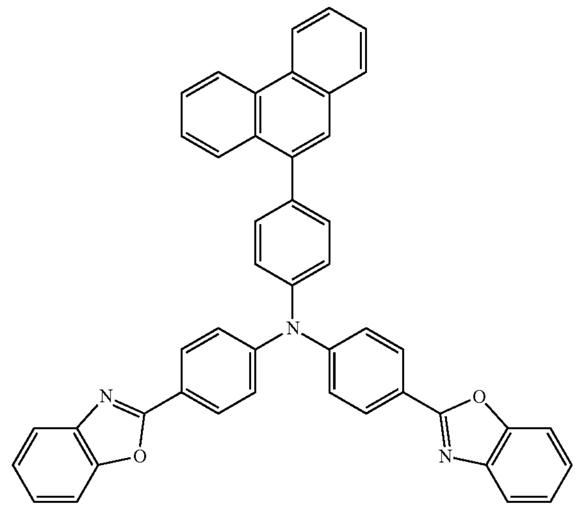
C-78
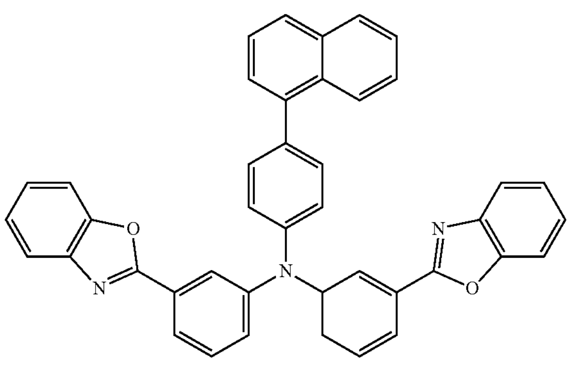
C-79
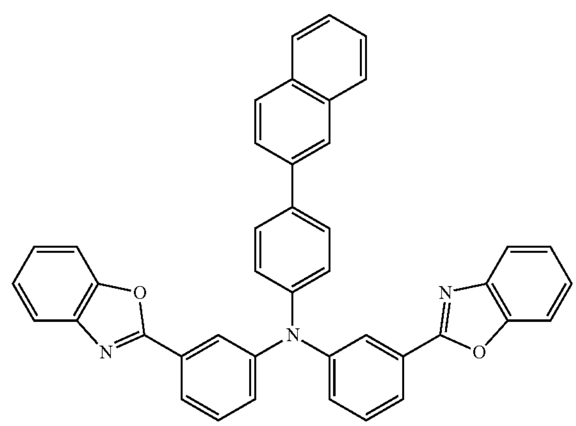
C-80
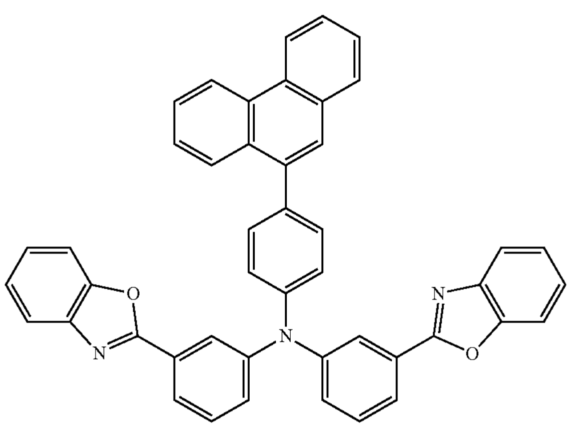
C-81
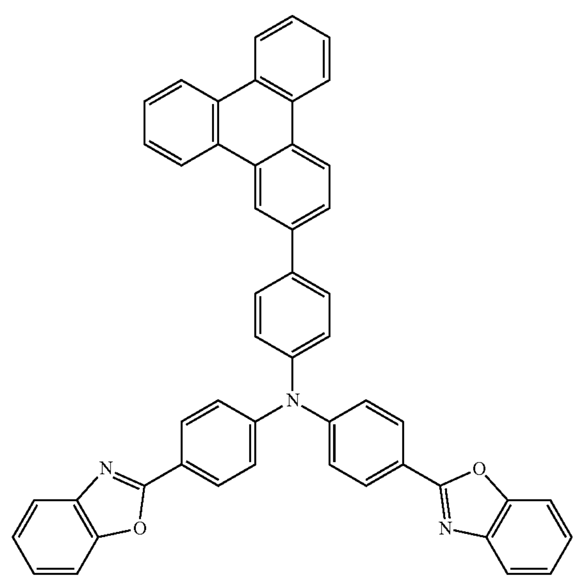

-continued
C-82
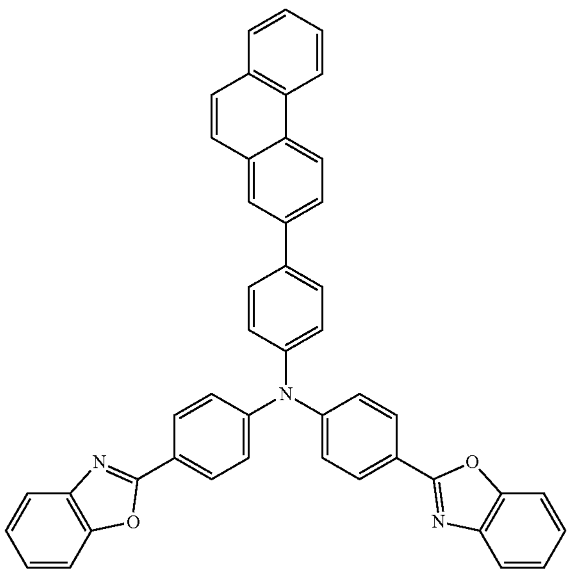
C-83
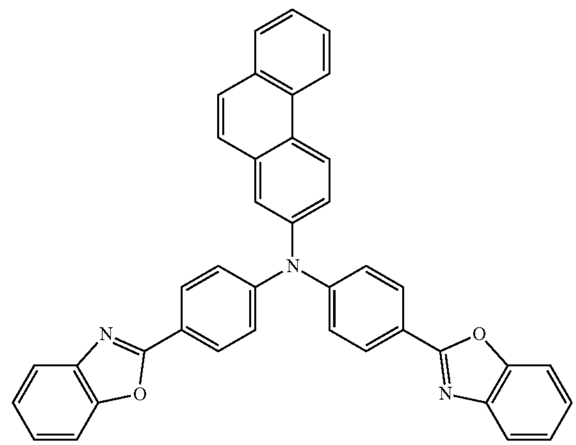
C-84
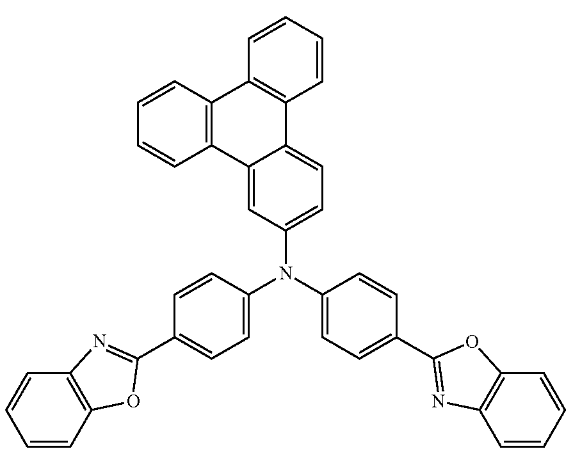
C-85
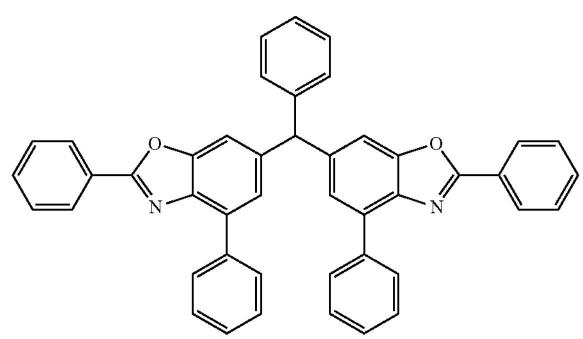
C-86
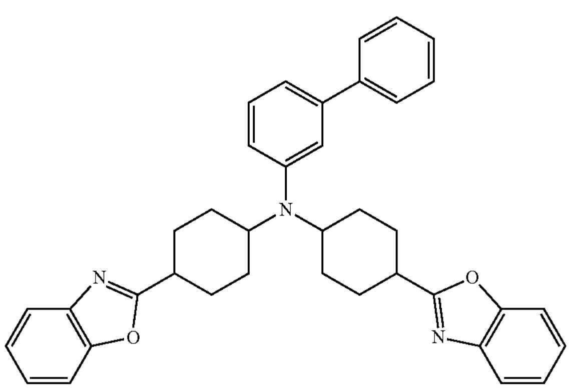
C-87
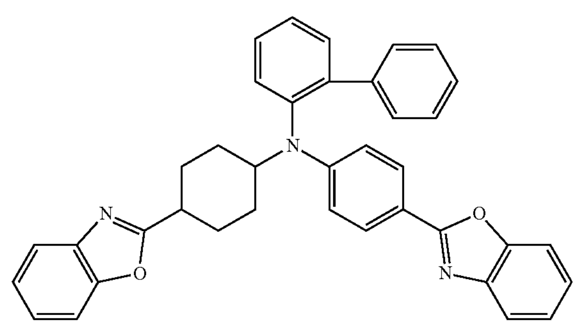

-continued
C-88
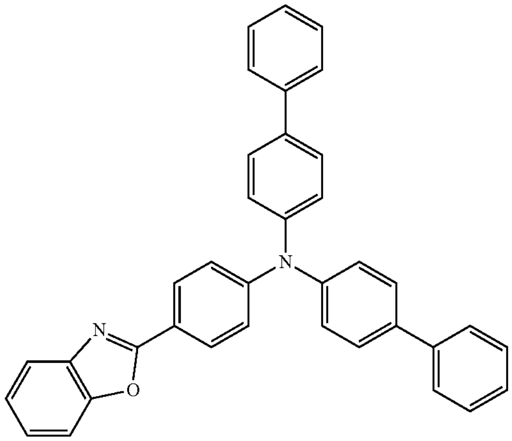
C-89
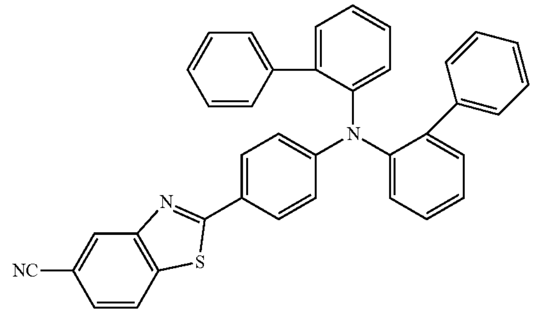
C-90
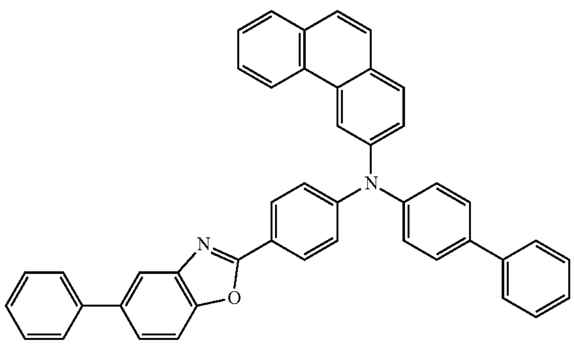
C-91
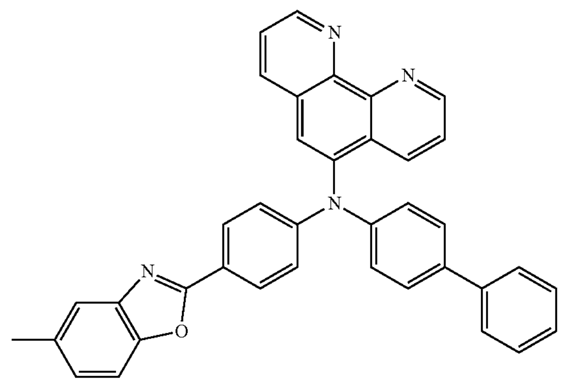
C-92
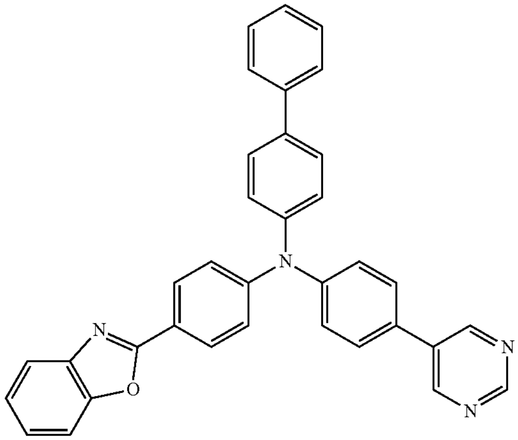
C-93
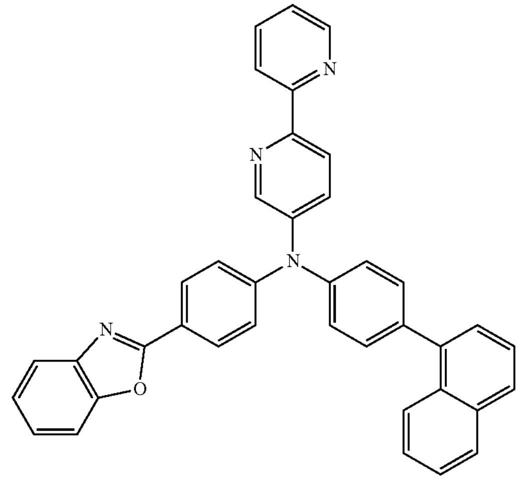

-continued
C-94
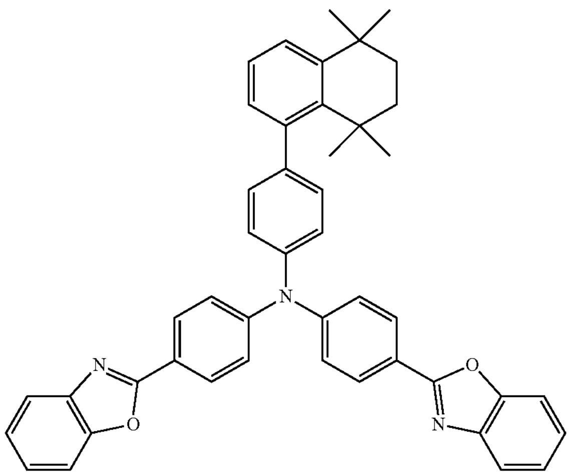
C-95
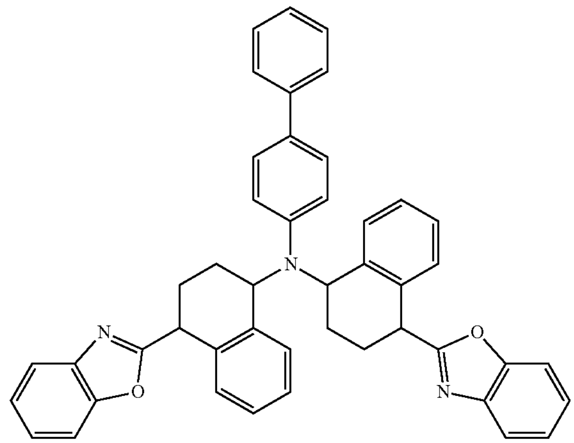
C-96
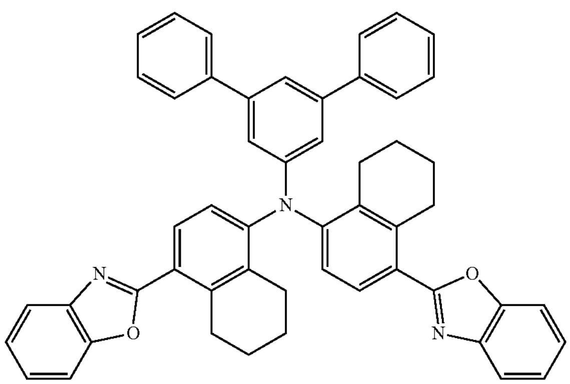
C-97
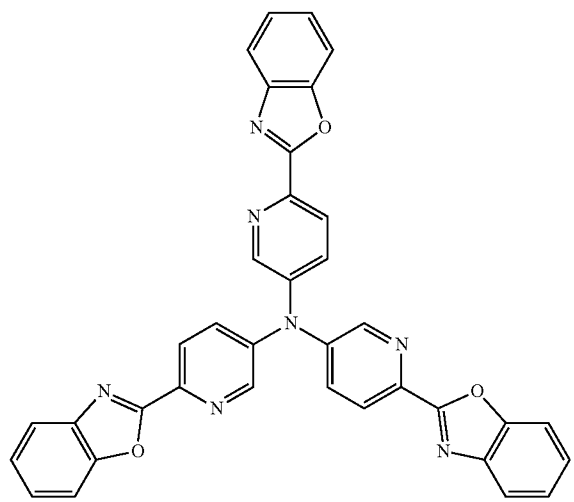
C-98
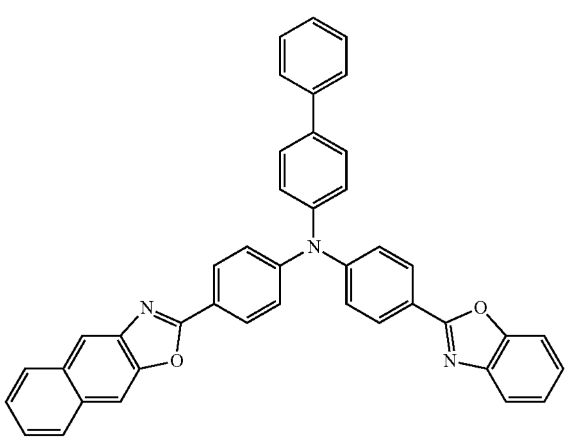
C-99
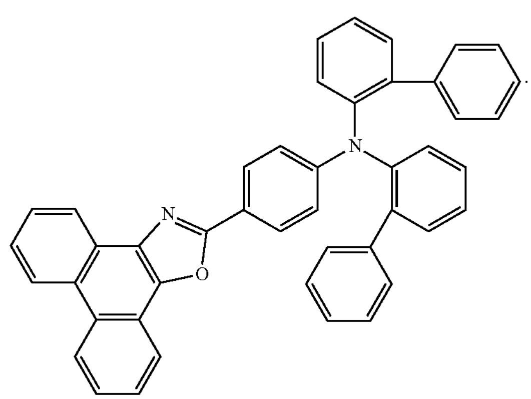
8. The organic light-emitting device according to claim 1, wherein the light-emitting layer comprises a host and a dopant and the dopant comprises one of compounds represented by [A-1] to [A-6] above.

9. The organic light-emitting device according to claim 8, wherein the dopant compound comprises a polycyclic compound represented by the following [Formula D]:

[Formula D]

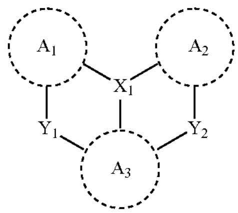

wherein $X_1$ is selected from B, P═O and P═S, $Y_1$ and $Y_2$ are each independently selected from $NR_{41}$, $CR_{42}R_{43}$, O, S, Se and $SiR_{44}R_{45}$, $A_1$ to $A_3$ are each independently selected from a substituted or unsubstituted C6-C50 aromatic hydrocarbon ring, a substituted or unsubstituted C2-C50 heteroaromatic ring, a substituted or unsubstituted C3-C30 aliphatic ring, and a substituted or unsubstituted C3-C30 mixed aliphatic-aromatic ring, and $R_{41}$ to $R_{45}$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C3-C30 heterocycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C6-C30 arylthioxy group, a substituted or unsubstituted amine group, a substituted or unsubstituted silyl group, a substituted or unsubstituted C3-C20 mixed aliphatic-aromatic ring group, a nitro group, a cyano group, and a halogen group, with the proviso that each of $R_{41}$ to $R_{45}$ is bonded to each of the rings $A_1$ to $A_3$ to form an alicyclic or aromatic monocyclic or polycyclic ring, the substituents of the rings $A_1$ to $A_3$ are bonded to each other to form an alicyclic or aromatic monocyclic or polycyclic ring, and $R_{42}$ and $R_{43}$, and $R_{44}$ and $R_{45}$ are bonded to each other to further form an alicyclic or aromatic monocyclic or polycyclic ring, at least one carbon atom of which is substituted with at least one heteroatom selected from nitrogen, oxygen, and sulfur.

10. The organic light-emitting device according to claim 9, wherein the polycyclic compound represented by [Formula D] comprises any one of compounds represented by the following [Formula D-1] to [Formula D-8]:

[Formula D-1]

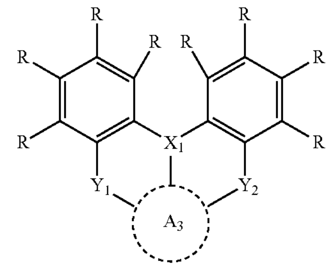

wherein

R's are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted a C3-C30 heterocycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C6-C30 arylthioxy group, a substituted or unsubstituted amine group, a substituted or unsubstituted silyl group, a substituted or unsubstituted C3-C20 mixed aliphatic-aromatic ring group, a nitro group, a cyano group, and a halogen group, with the proviso that R's are bonded to each other to further form an alicyclic or aromatic monocyclic or polycyclic ring, at least one carbon atom of which is substituted with at least one heteroatom selected from nitrogen, oxygen, and sulfur, and $X_1$, $Y_1$, $Y_2$ and $A_3$ are as defined in [Formula D] in claim 9,

[Formula D-2]

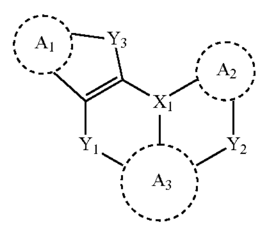

[Formula D-3]

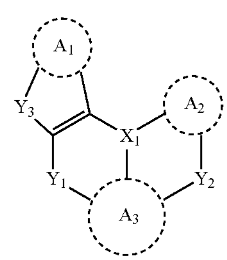

wherein $Y_3$ is each independently selected from $NR_{41}$, $CR_{42}R_{43}$, O, S, Se, and $SiR_{44}R_{45}$, and $X_1$, $Y_1$, $Y_2$, $A_1$ to $A_3$ and $R_{41}$ to $R_{45}$ are as defined in [Formula D] in claim 9,

[Formula D-4]

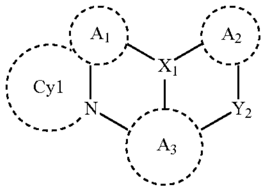

wherein $X_1$, $Y_2$ and $A_1$ to $A_3$ are as defined in [Formula D] in claim 9, and Cy1 is bonded to an adjacent nitrogen atom (N) and the aromatic carbon atom in the ring $A_1$ to be bonded to Cy1, to form a condensed ring including the nitrogen atom (N), the aromatic carbon atom in the ring $A_1$ to which the nitrogen atom (N) is bonded, and the aromatic carbon atom in the $A_1$ ring to be bonded to Cy1, wherein a moiety of the ring formed by Cy1, excluding the nitrogen atom (N), the aromatic carbon atom in the ring $A_1$ to which the nitrogen atom (N) is bonded, and the aromatic carbon atom in the $A_1$ ring to be bonded to Cy1, is a substituted or unsubstituted C2-C5 alkylene group,

[Formula D-5]

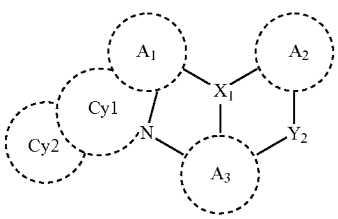

wherein $X_1$, $Y_2$ and $A_1$ to $A_3$ are as defined in [Formula D] in claim 9, Cy2 is added to Cy1 to form a saturated hydrocarbon ring and a moiety of the ring formed by Cy2, excluding the carbon atom included in Cy1, is a substituted or unsubstituted C2-C5 alkylene group,

[Formula D-6]

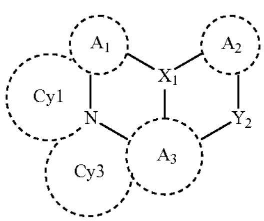

wherein $X_1$, $Y_2$ and $A_1$ to $A_3$ are as defined in [Formula D] in claim 9, and Cy3 is bonded to the carbon atom bonded to the nitrogen atom (N) in Cy1 and to the aromatic carbon atom in the ring $A_3$ to be bonded to Cy3, to form a condensed ring including the aromatic carbon atom in the $A_3$ ring to be bonded to Cy3, the nitrogen atom (N), and the carbon atom in Cy1 to which the nitrogen atom (N) is bonded, wherein a moiety of the ring formed by Cy3, excluding the aromatic carbon atom in the $A_3$ ring to be bonded to Cy3, the nitrogen atom (N), and the carbon atom in Cy1 to which the nitrogen atom (N) is bonded, is a substituted or unsubstituted C1-C4 alkylene group,

[Formula D-7]

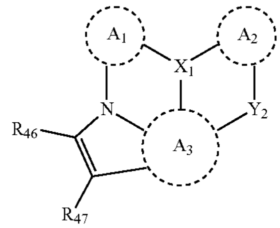

[Formula D-8]

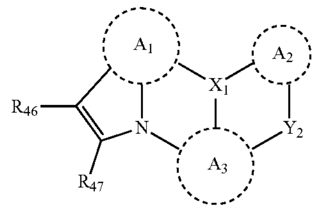

wherein $R_{46}$ and $R_{47}$ are identical to or different from each other, and are each independently selected from hydrogen, deuterium, a substituted or unsubstituted C1-C30 alkyl group, a substituted or unsubstituted C6-C50 aryl group, a substituted or unsubstituted C3-C30 cycloalkyl group, a substituted or unsubstituted C3-C30 heterocycloalkyl group, a substituted or unsubstituted C2-C50 heteroaryl group, a substituted or unsubstituted C1-C30 alkoxy group, a substituted or unsubstituted C6-C30 aryloxy group, a substituted or unsubstituted C1-C30 alkylthioxy group, a substituted or unsubstituted C6-C30 arylthioxy group, a substituted or unsubstituted amine group, a substituted or unsubstituted silyl group, a substituted or unsubstituted C3-C20 mixed aliphatic-aromatic ring group, a nitro group, a cyano group, and a halogen group, with the proviso that $R_{46}$ and $R_{47}$ are bonded to each other to further form an alicyclic or aromatic monocyclic or polycyclic ring and a mixed aliphatic-aromatic ring, and $X_1$, $Y_2$ and $A_1$ to $A_3$ are as defined in [Formula D] in claim 9.

11. The organic light-emitting device according to claim 1, further comprising at least one selected from a hole injection layer, a hole transport layer, a functional layer capable of injecting and transporting holes, an electron transport layer, an electron transport layer and a functional layer capable of injecting and transporting electrons, in addition to the light-emitting layer.

12. The organic light-emitting device according to claim 11, wherein the at least one layer selected from the hole injection layer, the hole transport layer, the functional layer capable of injecting and transporting holes, the electron transport layer, the electron transport layer and the functional layer capable of injecting and transporting electrons is formed by a deposition process or a solution process.

13. The organic light-emitting device according to claim 1, wherein the first electrode is an anode and the second electrode is a cathode, and the capping layer is formed on one surface of the cathode.

14. The organic light-emitting device according to claim 11, wherein the organic light-emitting device is used for a display or lighting system selected from flat panel displays, flexible displays, monochromatic or white flat panel lighting systems, monochromatic or white flexible lighting systems, vehicle displays, and displays for virtual or augmented reality.

15. An organic light-emitting device comprising:

a first electrode;

a second electrode facing the first electrode;

a light-emitting layer interposed between the first electrode and the second electrode; and a capping layer disposed on one surface of the first electrode or the second electrode which is opposite to a remaining surface of the first electrode or the second electrode that faces the light-emitting layer, wherein the light-emitting layer comprises at least one selected from compounds represented by the following [Formula A-1] to [Formula A-6], and the capping layer comprises a compound represented by the following [Formula C]:

[Formula A-1]

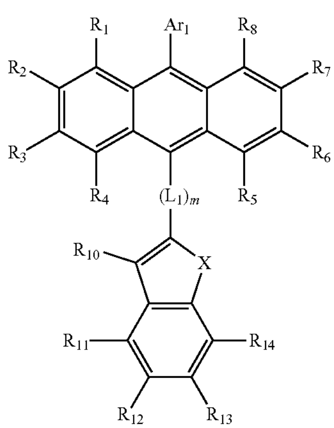

[Formula A-2]

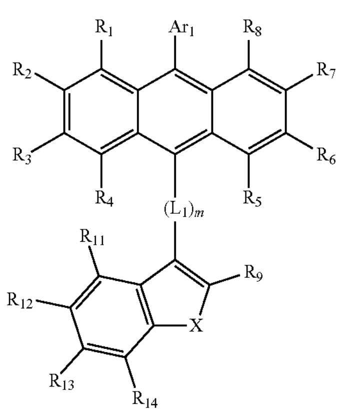

-continued

[Formula A-3]

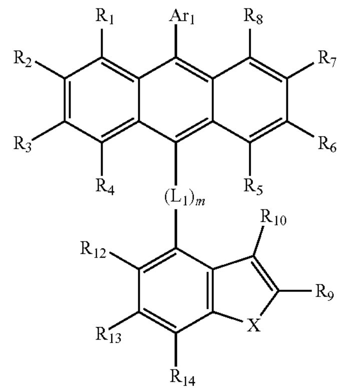

[Formula A-4]

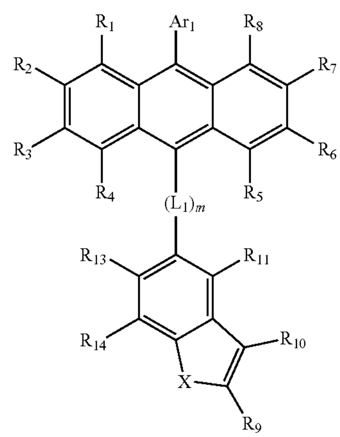

[Formula A-5]

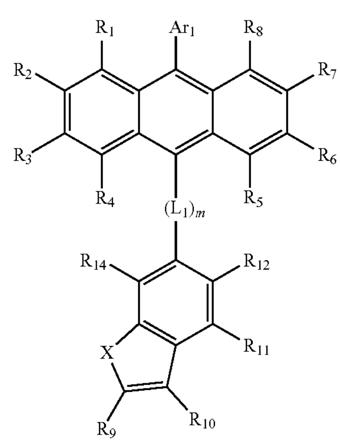

-continued

[Formula A-6]

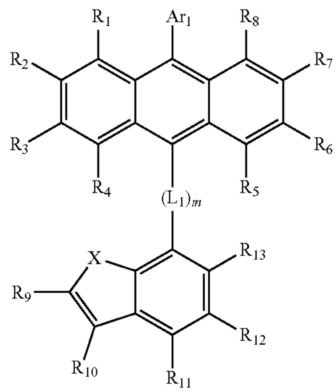

wherein $Ar_1$ is selected from a substituted or unsubstituted C6-C50 aryl group, a substituted or unsubstituted C2-C50 heteroaryl group, and a substituted or unsubstituted C3-C50 mixed aliphatic-aromatic ring group, $R_1$ to $R_{14}$ are identical to or different from each other, and are each independently hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, X is an oxygen atom (O) or a sulfur atom(S), $L_1$ is a divalent linker and is a single bond or is selected from a substituted or unsubstituted C6-C50 arylene group, a substituted or unsubstituted C2-C50 heteroarylene group, and a substituted or unsubstituted C3-C50 mixed aliphatic-aromatic ring group, and m is an integer from 1 to 3, provided that when m is 2 or more, a plurality of $L_1$ are identical to or different from each other,

[Formula C]

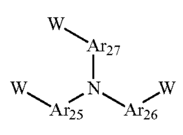

wherein $Ar_{25}$ to $Ar_{27}$ are divalent linkers, are identical to or different from each other, and are each independently single bonds or are selected from a substituted or unsubstituted C6-C50 arylene group, a substituted or unsubstituted C2-C50 heteroarylene group, a substituted or unsubstituted C3-C30 cycloalkylene group, and a substituted or unsubstituted C3-C50 mixed aliphatic-aromatic ring group, and W's are each independently selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, or a substituted or unsubstituted C2-C50 heteroaryl group, a substituted or unsubstituted C2-30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a nitro group and a halogen group, wherein W's are identical to or different from each other, with the proviso that at least one of W's is represented by the following [Formula C-1]:

[Formula C-1]

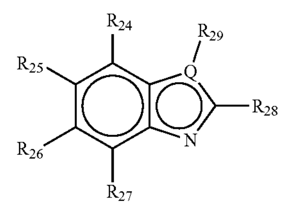

wherein $R_{24}$ to $R_{29}$ are identical to or different from each other, and are each independently linkers as binding sites to $Ar_{25}$ to $Ar_{27}$, or are selected from hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, with the proviso that $R_{24}$ to $R_{27}$ are bonded to each other or each of $R_{24}$ to $R_{27}$ is bonded to an adjacent substituent to further form an alicyclic or aromatic monocyclic or polycyclic ring, at least one carbon atom of which is substituted with at least one heteroatom selected from nitrogen, oxygen, and sulfur, and Q is N.

16. The organic light-emitting device according to claim 15, wherein at least one of $R_{11}$ to $R_{14}$ in each of the compounds represented by [Formula A-1] to [Formula A-6] is selected from a substituted or unsubstituted C6-C20 aryl group, a substituted or unsubstituted C3-C20 cycloalkyl group, and a substituted or unsubstituted C3-C20 heteroaryl group.

17. The organic light-emitting device according to claim 15, wherein each of the compounds represented by [Formula A-1] to [Formula A-6] is selected from compounds represented by the following [A-1] to [A-218]:
A-1
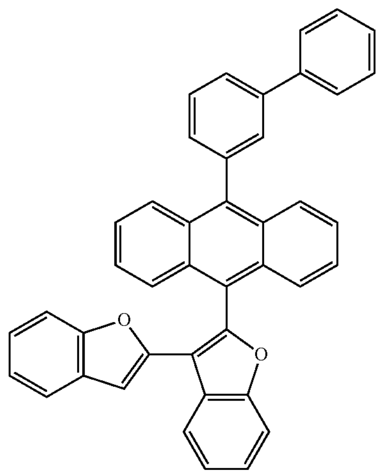
A-2
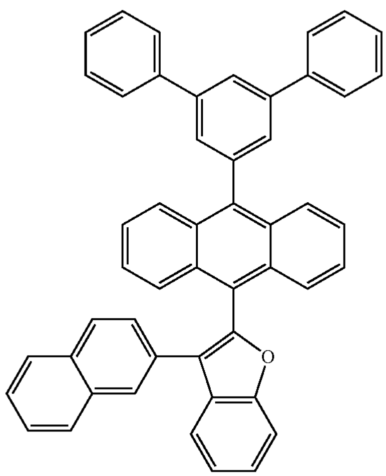
A-3
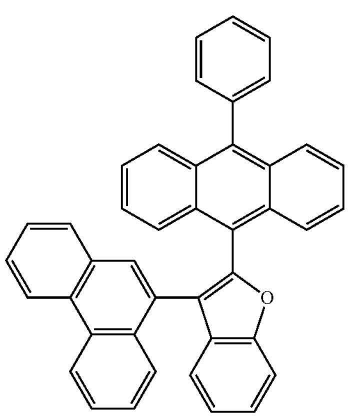
-continued
A-4
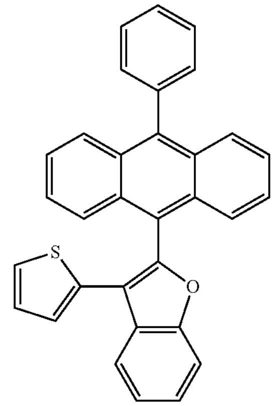
A-5
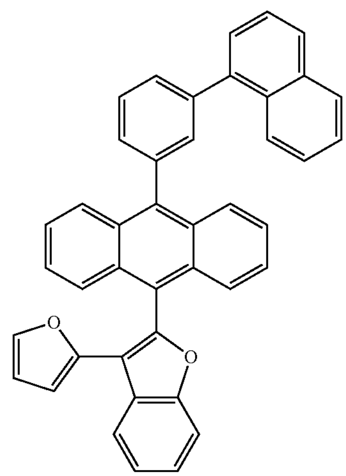
A-6
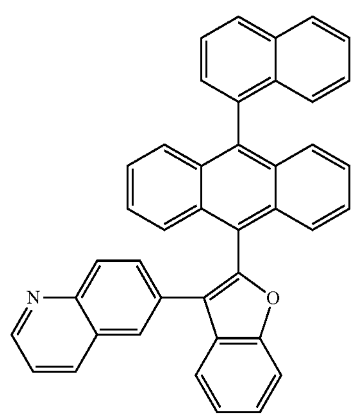

-continued
A-7
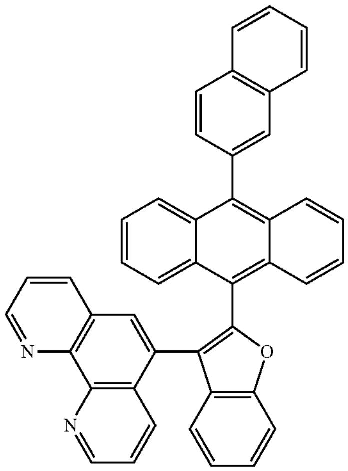
A-8
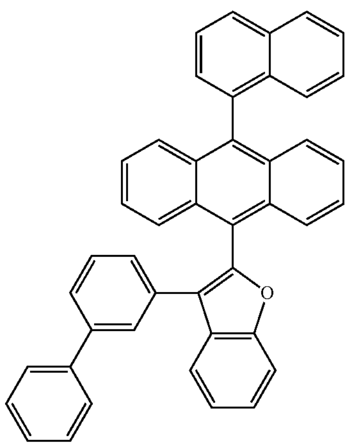
A-9
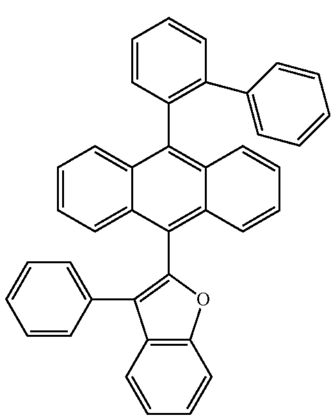
-continued
A-10
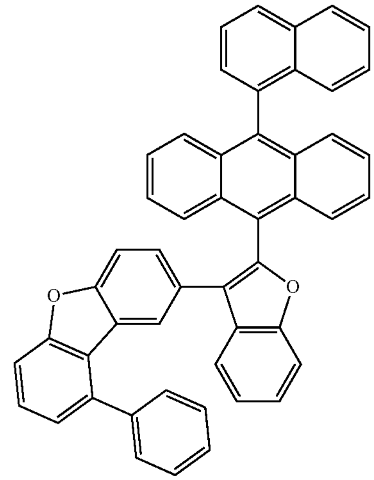
A-11
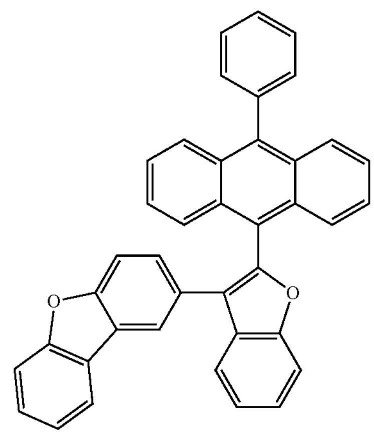
A-12
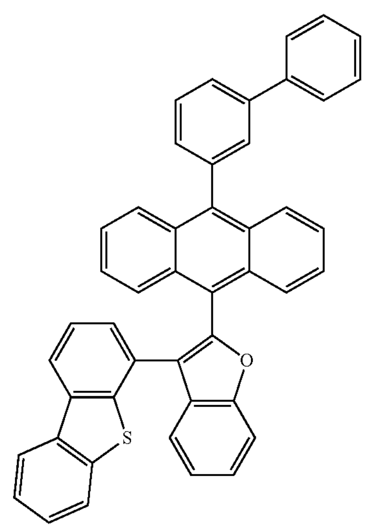

-continued
A-13
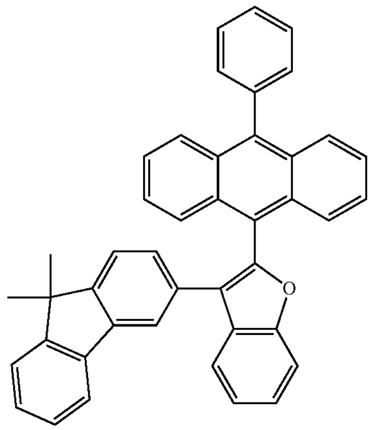
A-14
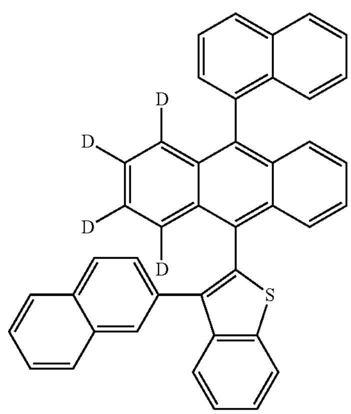
A-15
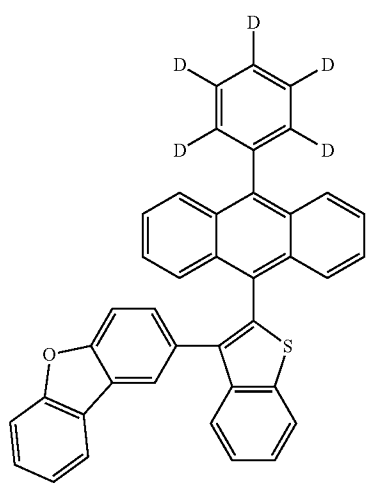
-continued
A-16
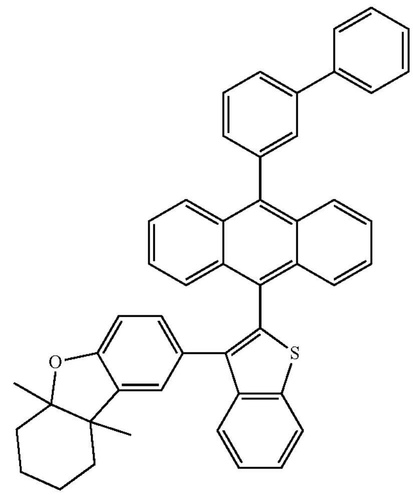
A-17
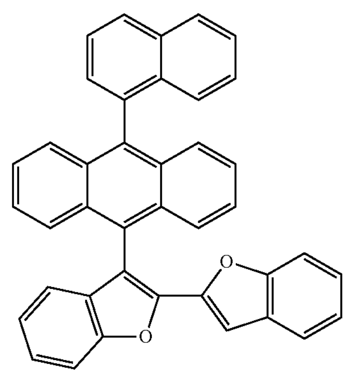
A-18
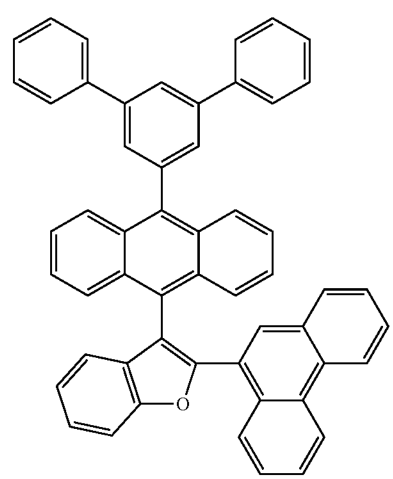

-continued
A-19
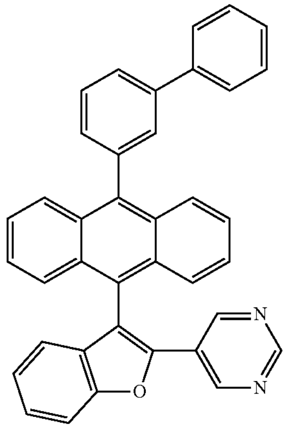
A-20
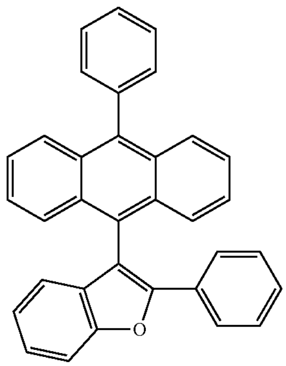
A-21
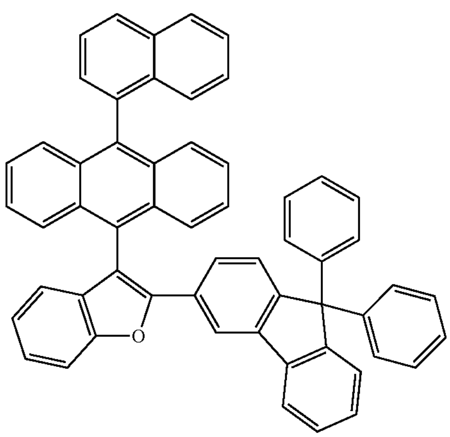
A-22
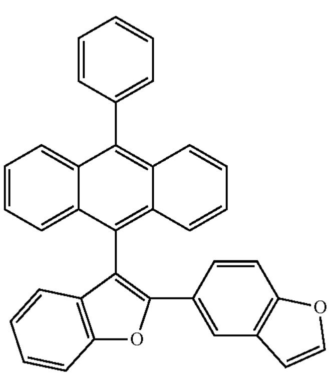
-continued
A-23
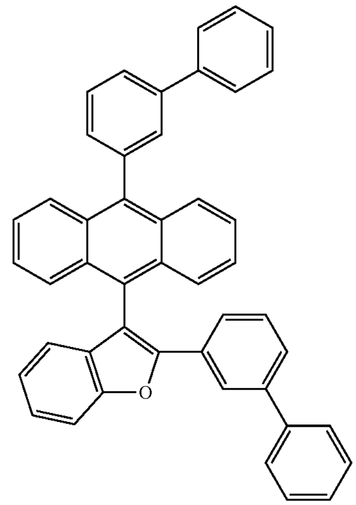
A-24
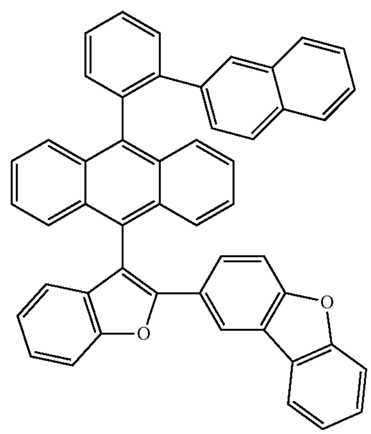
A-25
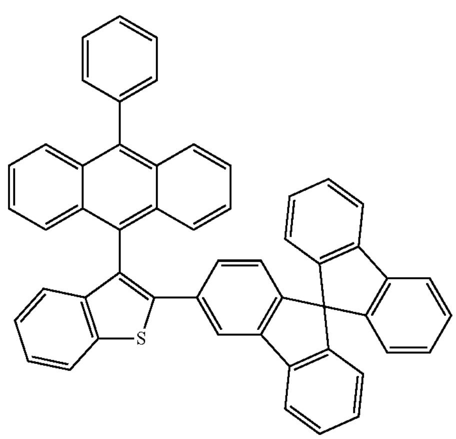

-continued
A-26
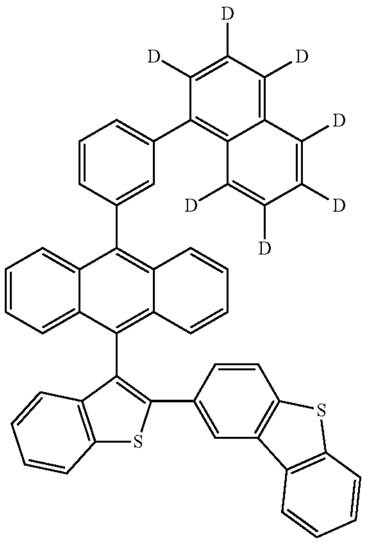
A-27
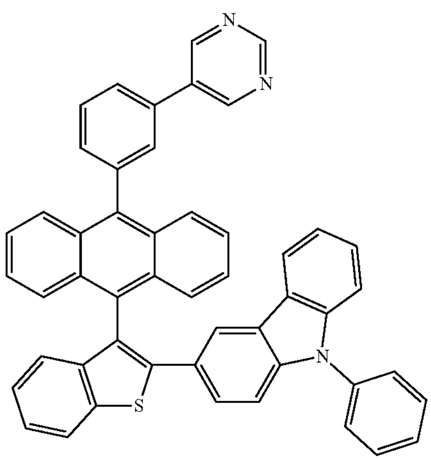
A-28
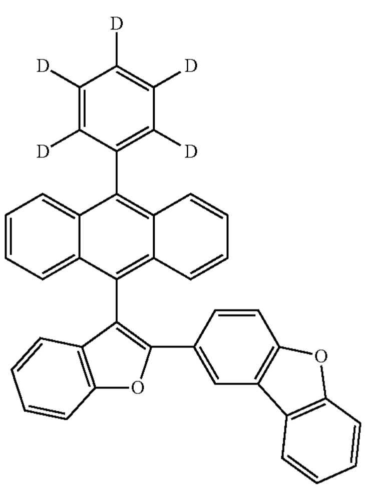
-continued
A-29
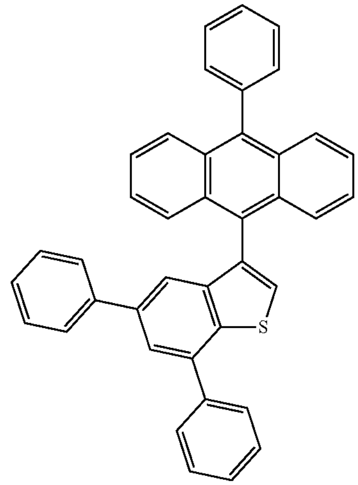
A-30
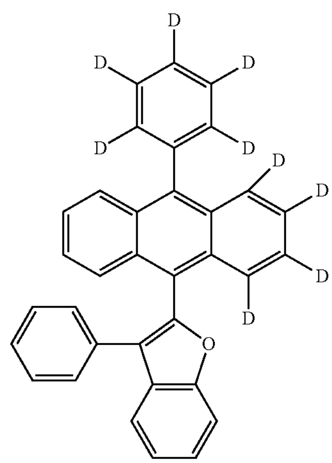
A-31
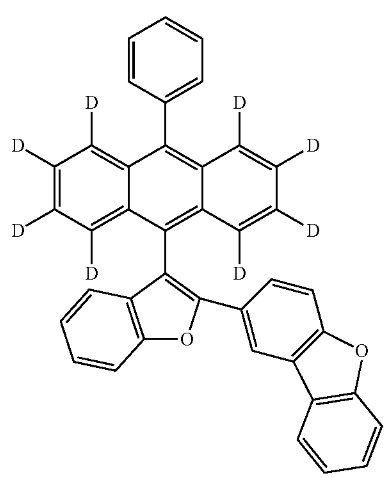

-continued
A-32
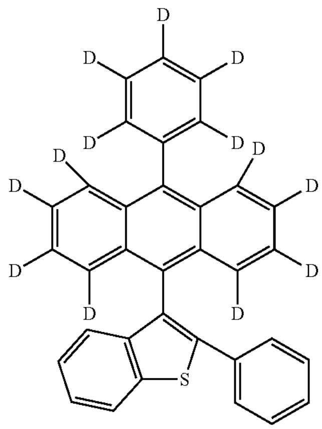
A-33
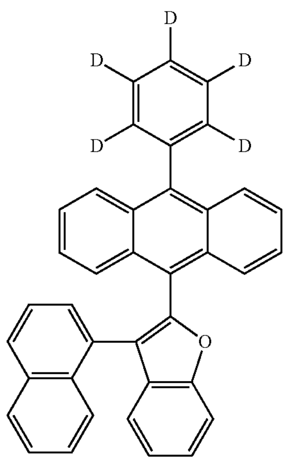
A-34
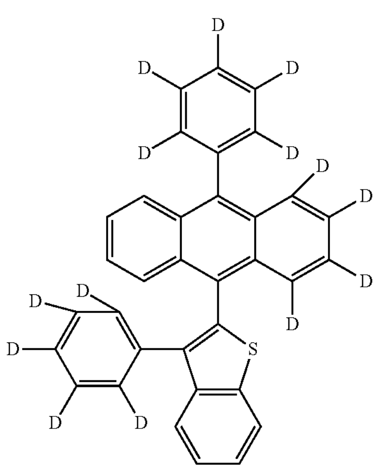
-continued
A-35
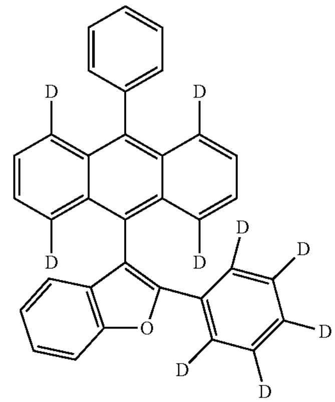
A-36
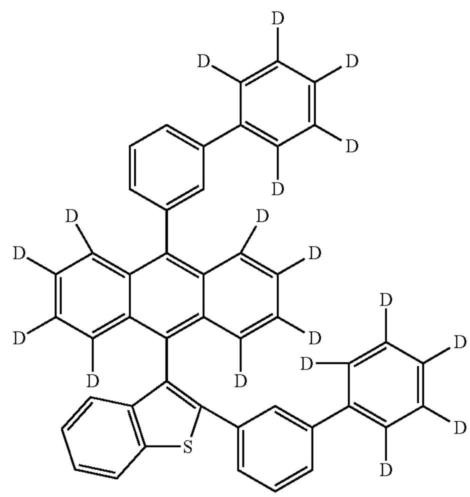
A-37
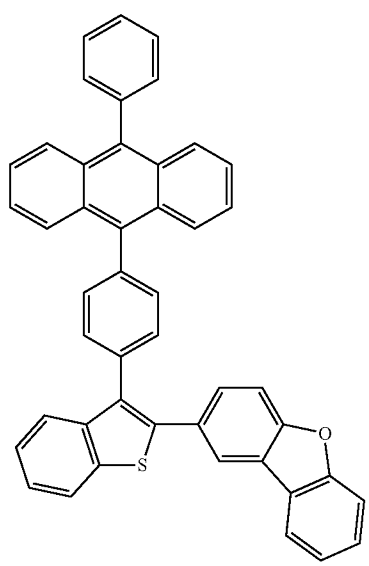

A-38
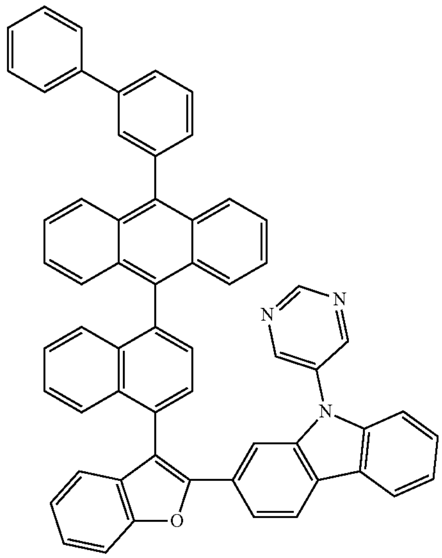
A-39
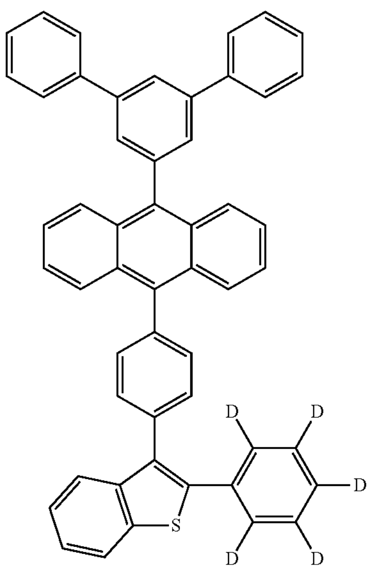
A-40
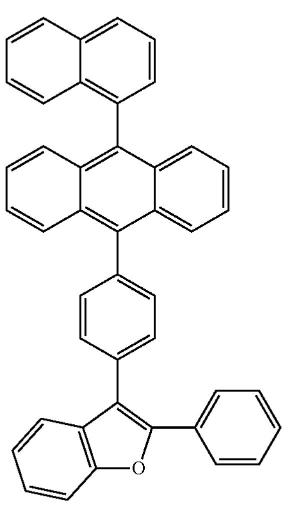
A-41
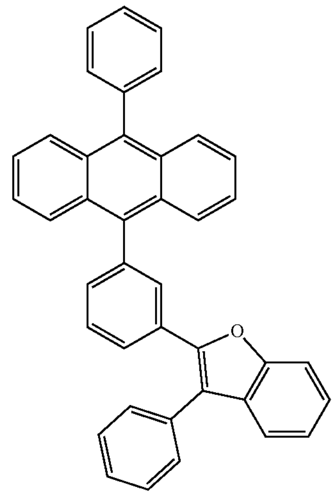
A-42
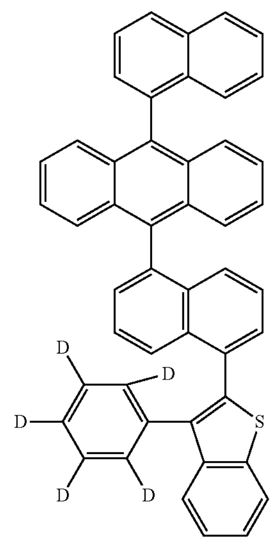
A-43
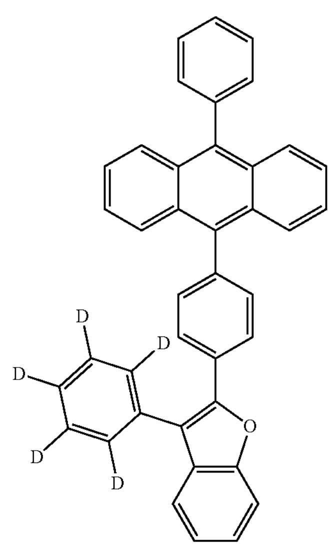

A-44
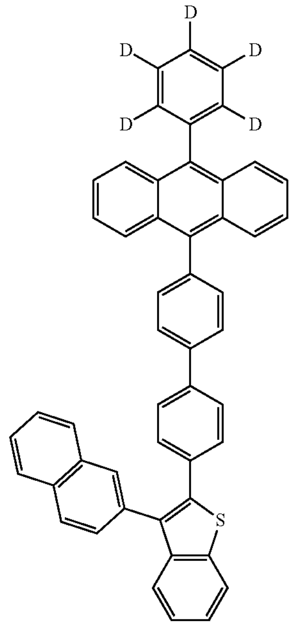
A-45
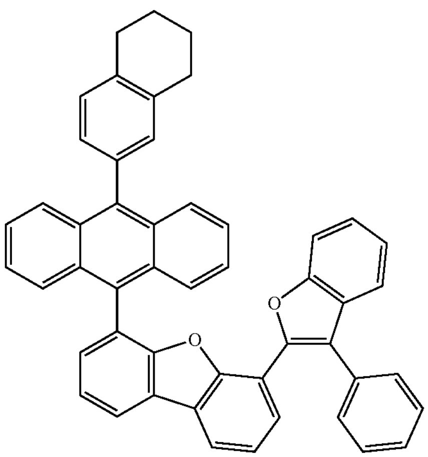
A-46
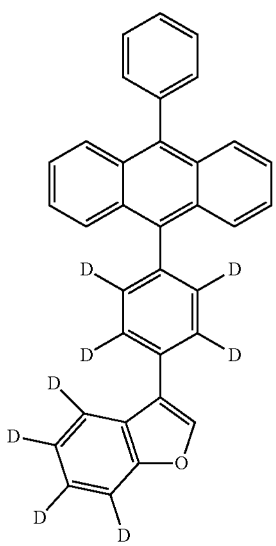
A-47
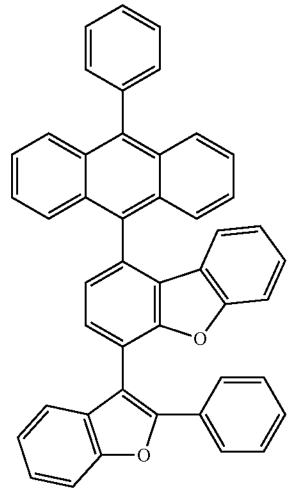
A-48
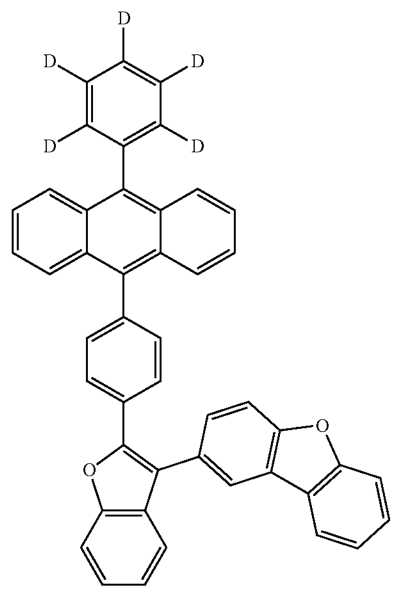
A-49
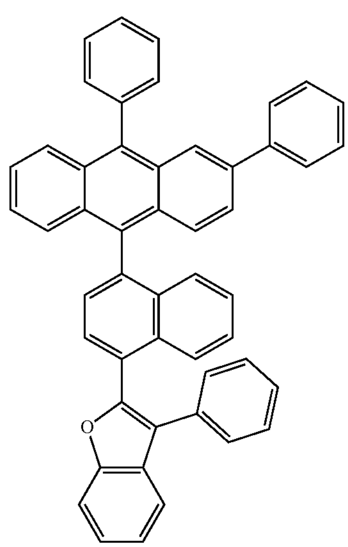

-continued
A-50
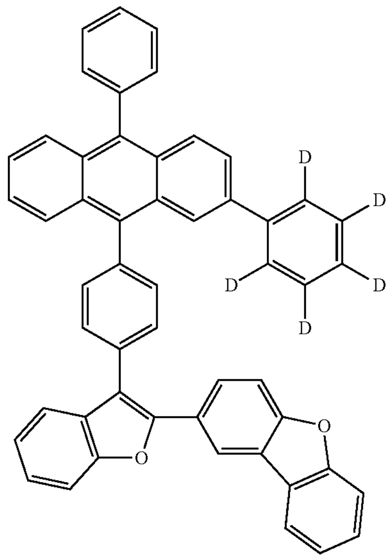
A-51
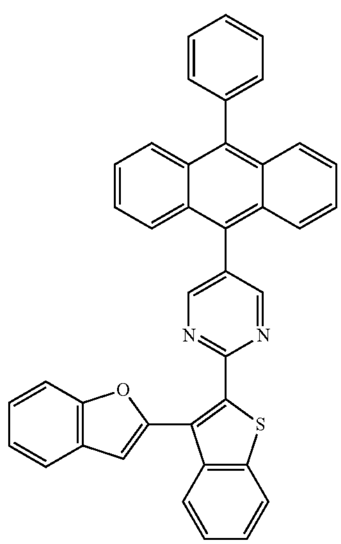
-continued
A-52
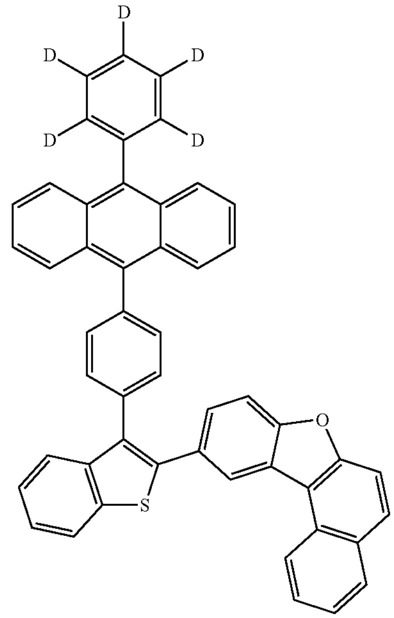
A-53
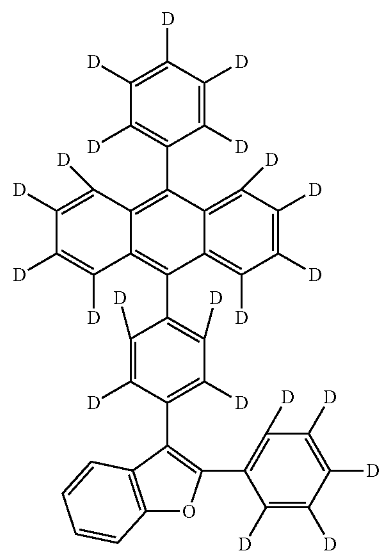
A-54
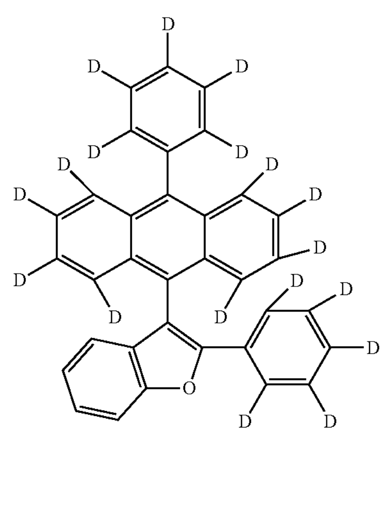

-continued
A-55
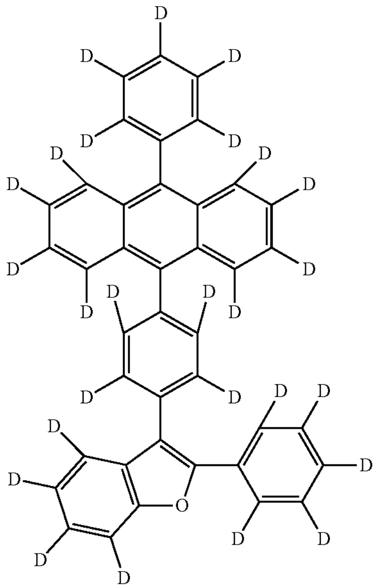
A-56
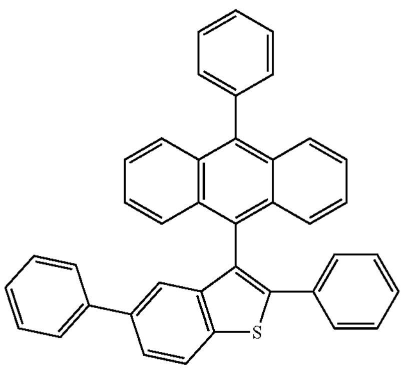
A-57
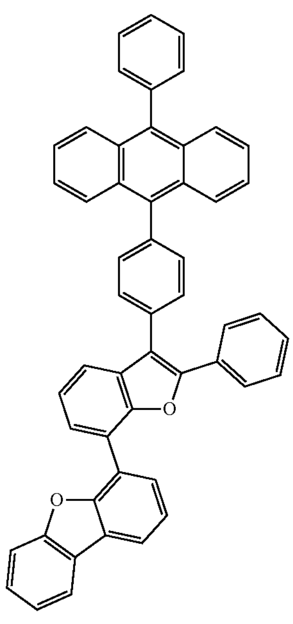
-continued
A-58
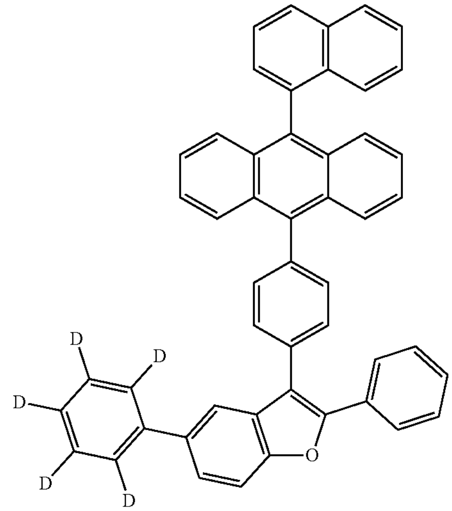
A-59
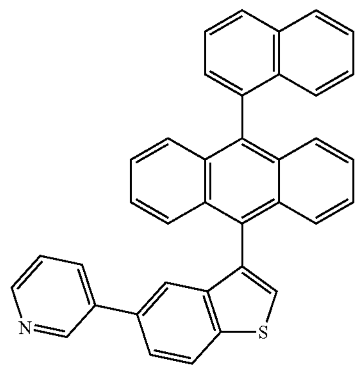
A-60
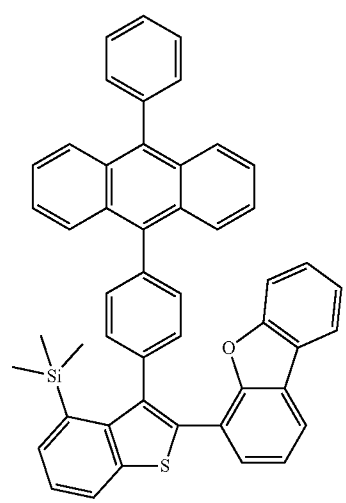

-continued
A-61
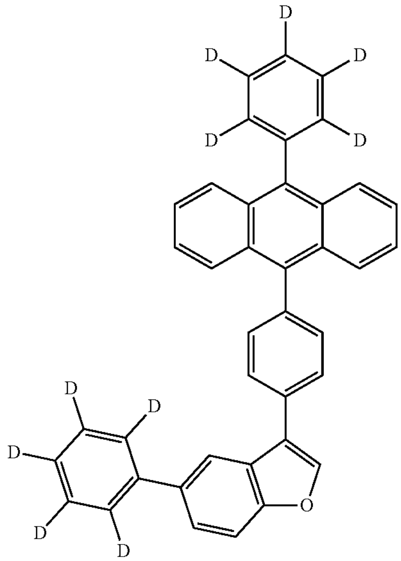
A-62
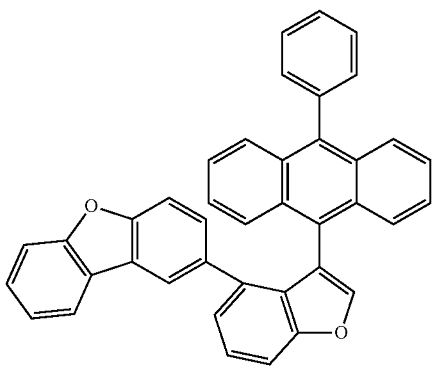
A-63
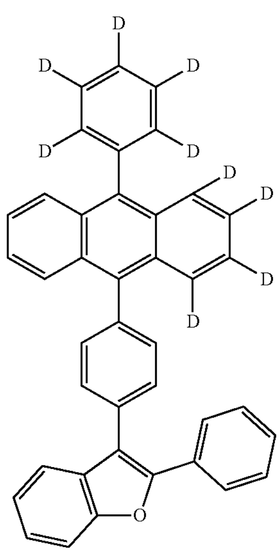
-continued
A-64
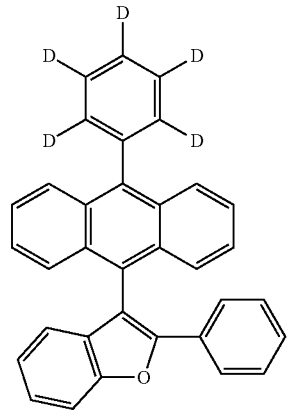
A-65
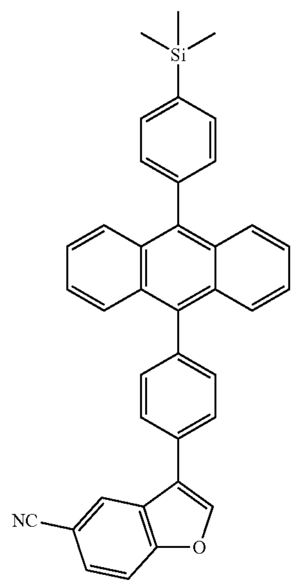
A-66
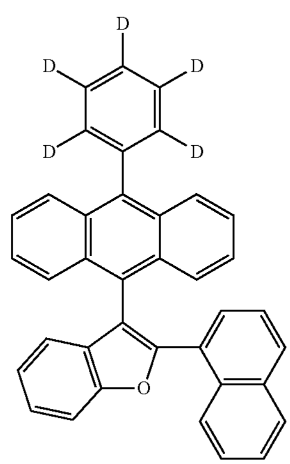

-continued
A-67
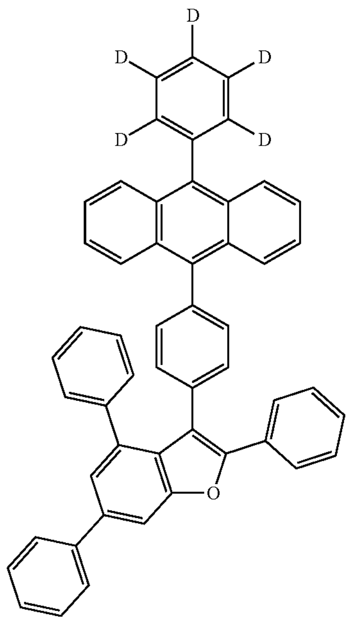
A-68
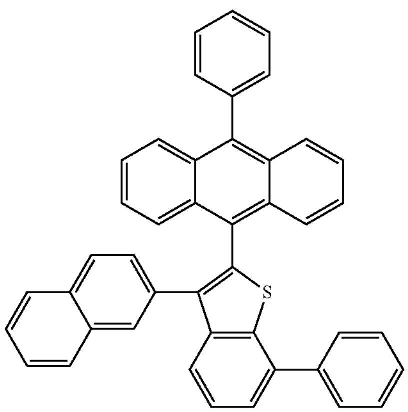
A-69
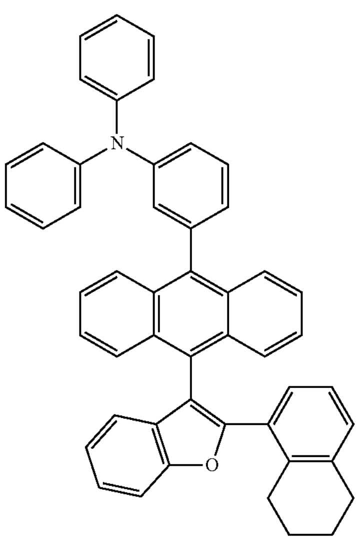
-continued
A-70
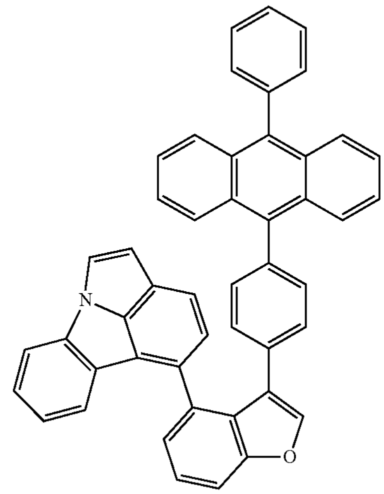
A-71
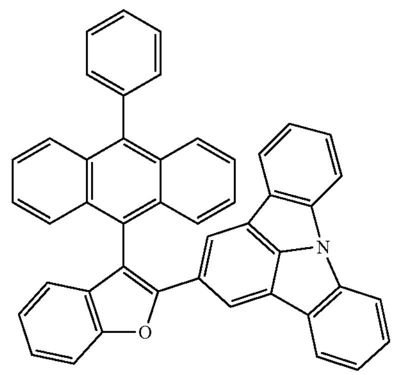
A-72
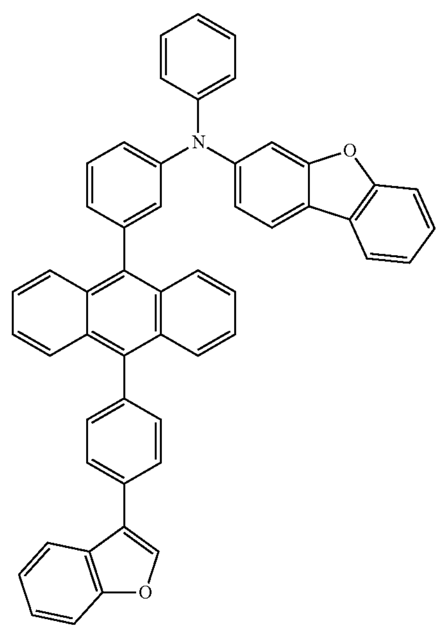

-continued
A-73
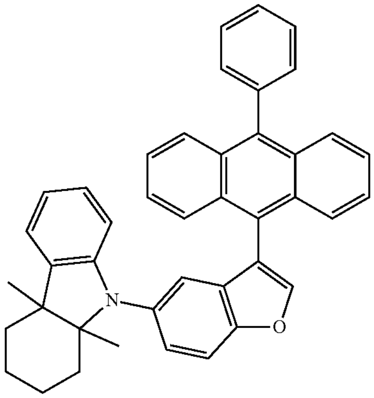
A-74
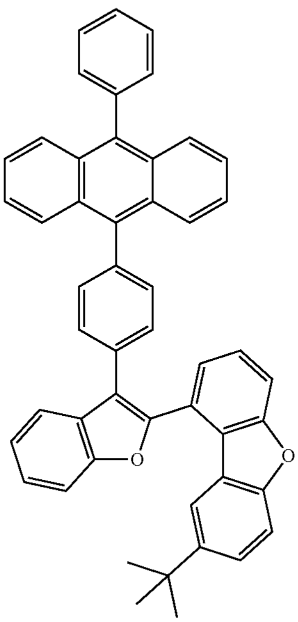
A-75
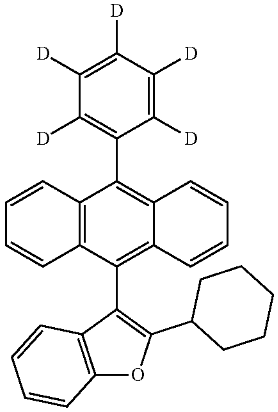
-continued
A-76
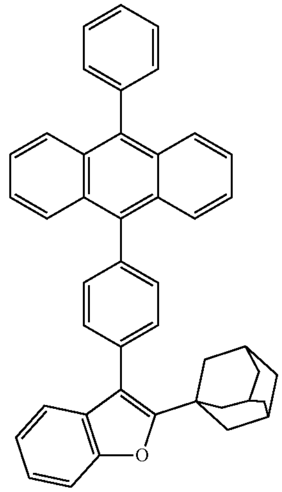
A-77
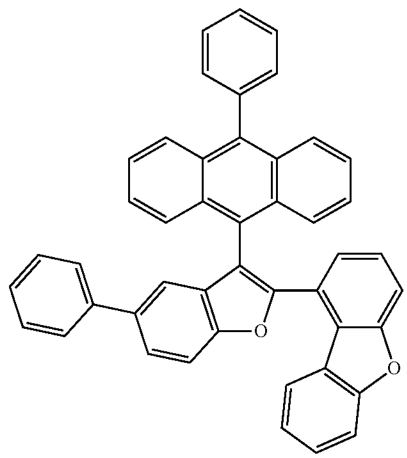
A-78
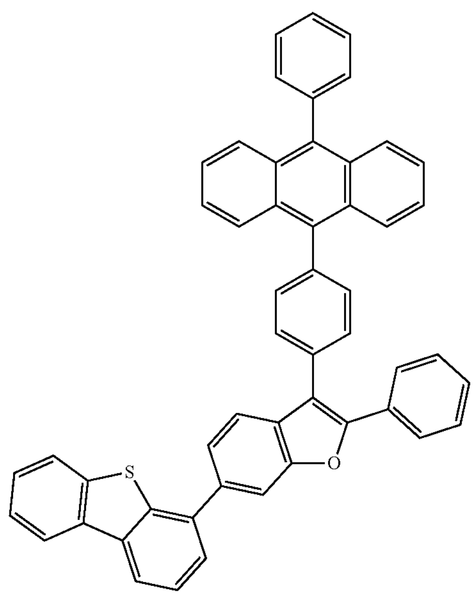

A-79
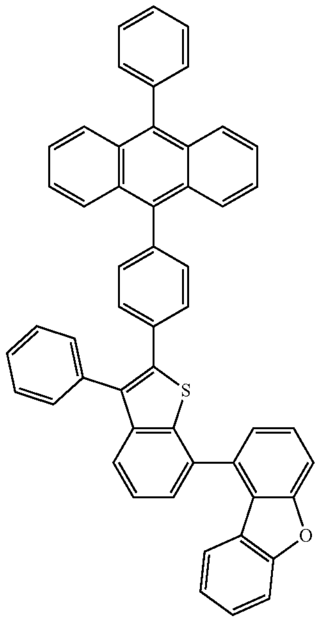
A-80
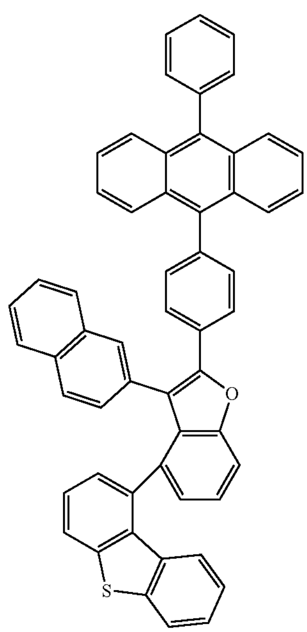
A-81
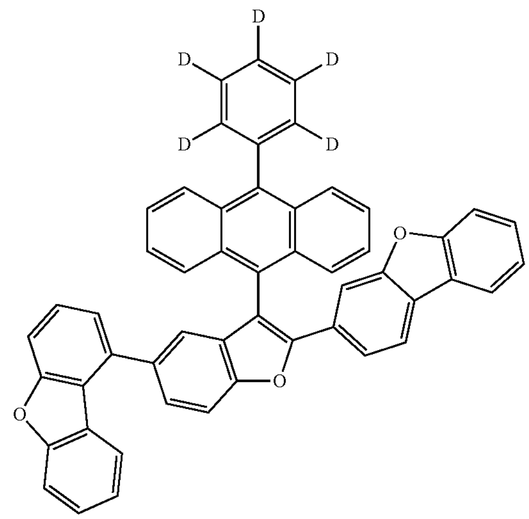
A-82
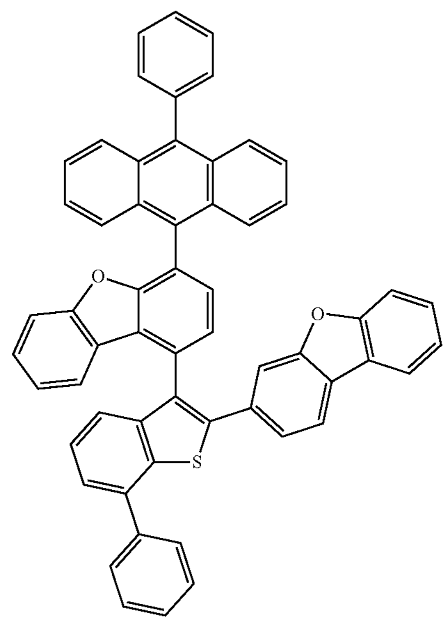
A-83
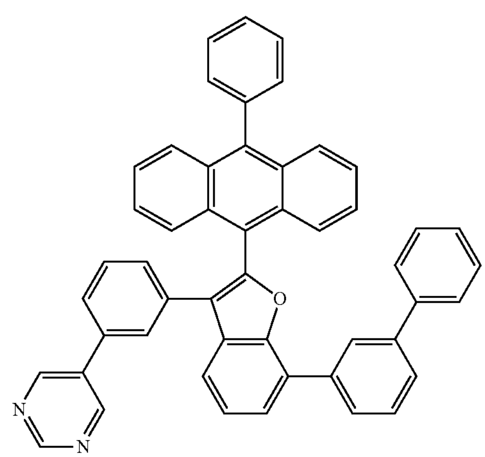

-continued
A-84
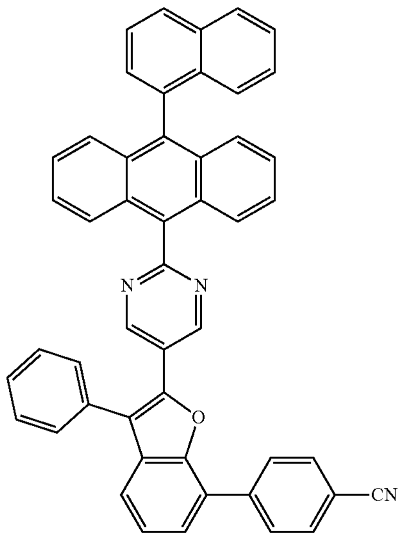
A-85
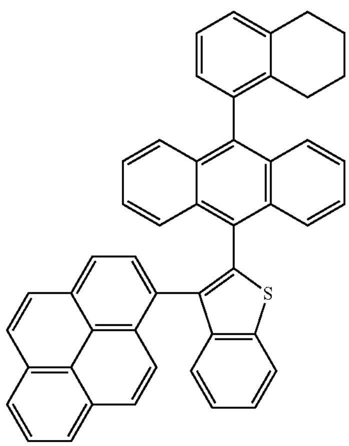
A-86
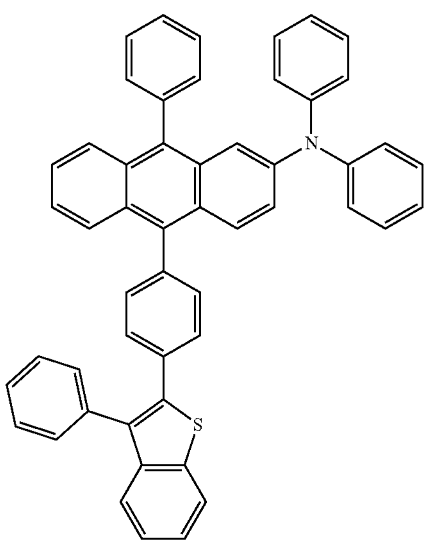
-continued
A-87
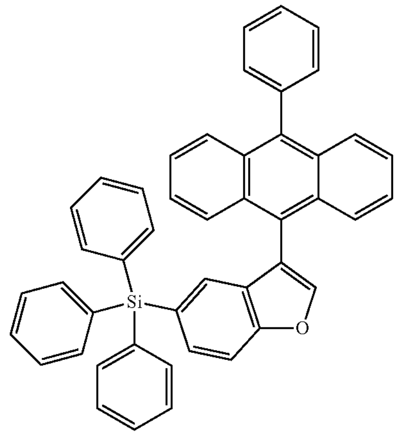
A-88
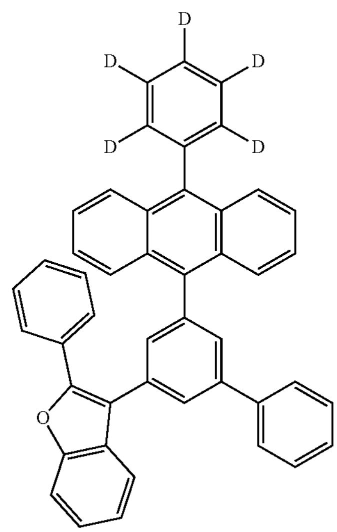
A-89
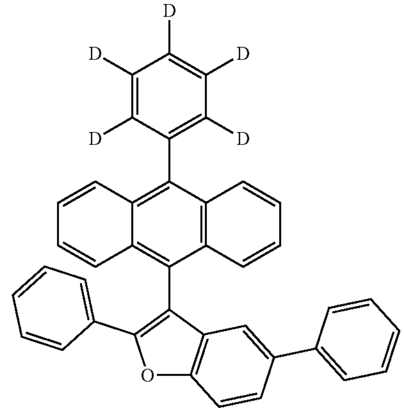

-continued
A-90
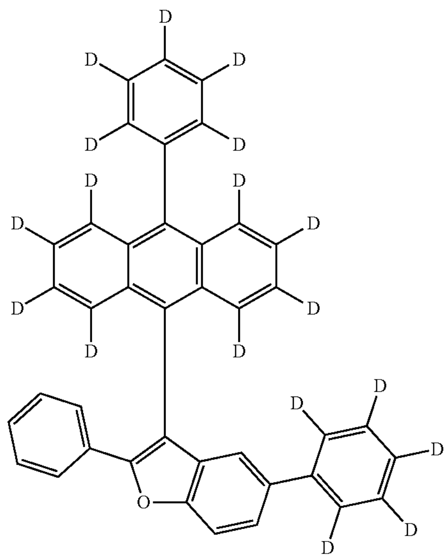
A-91
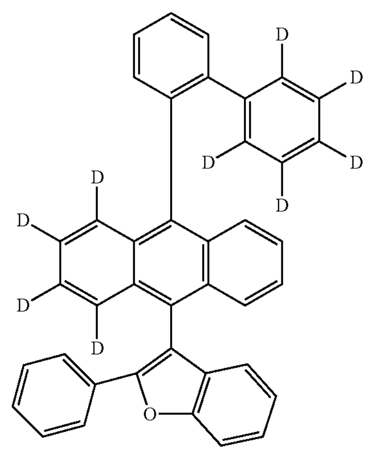
A-92
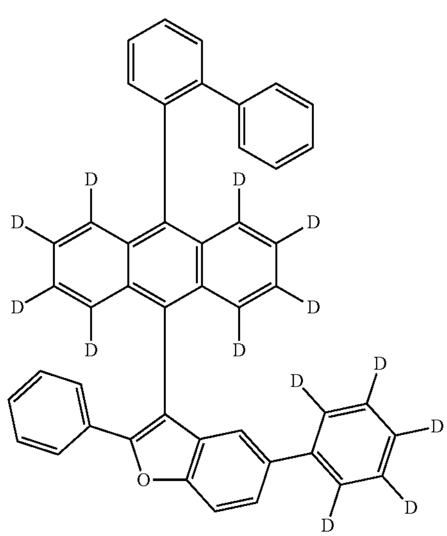
A-93
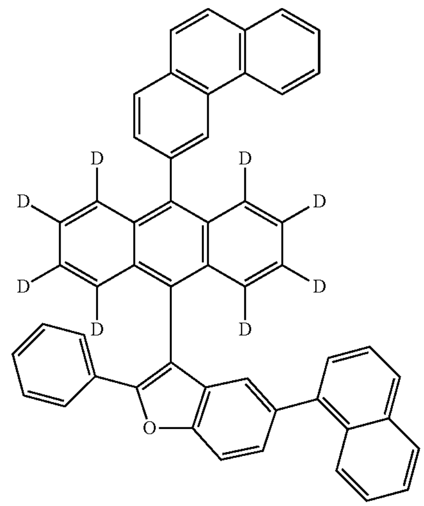
A-94
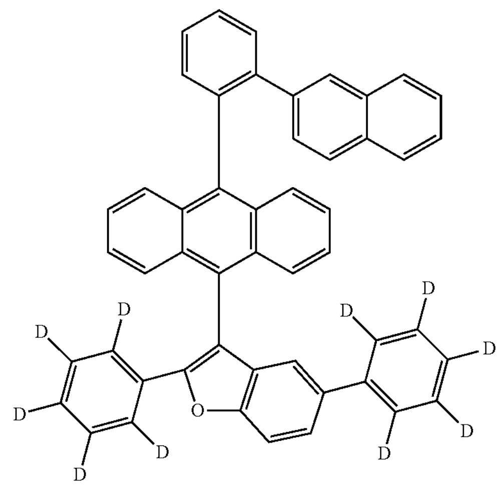
A-95
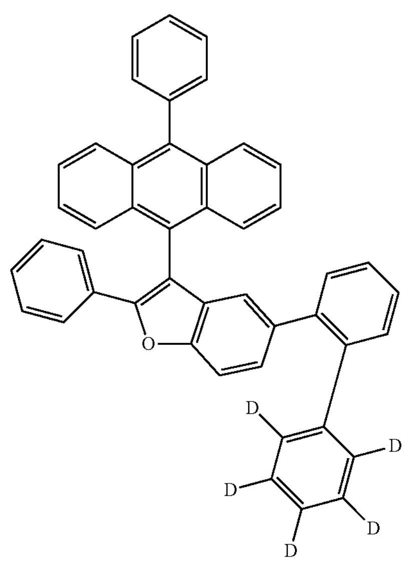

-continued
A-96
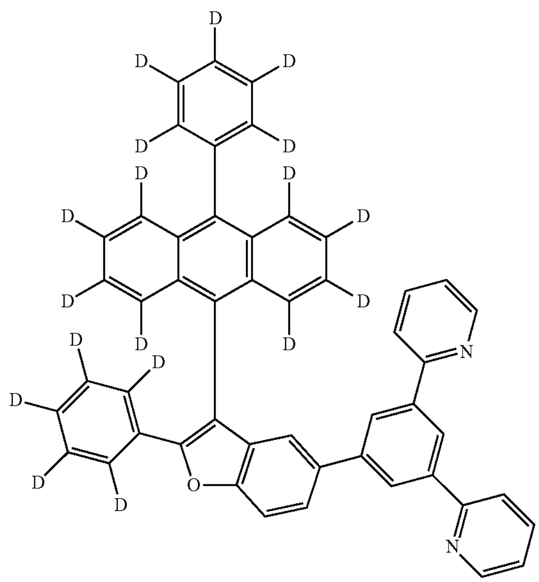
A-97
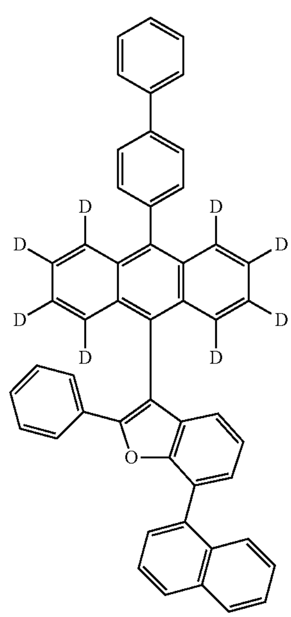
-continued
A-98
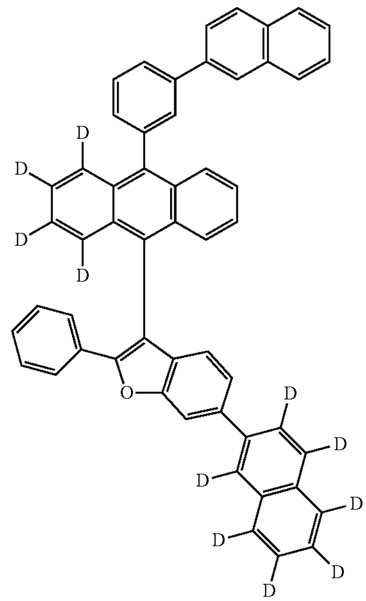
A-99
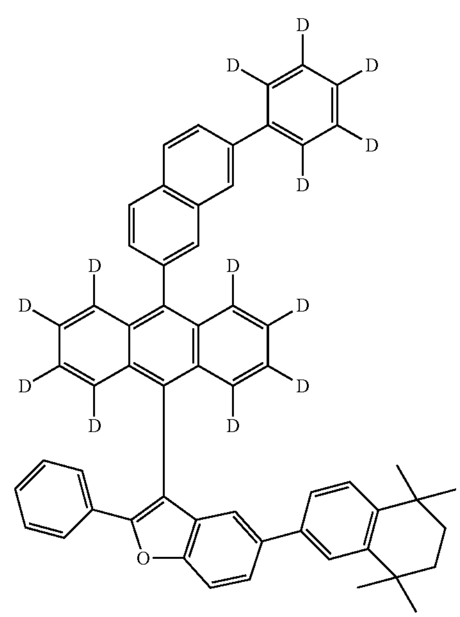

-continued
A-100
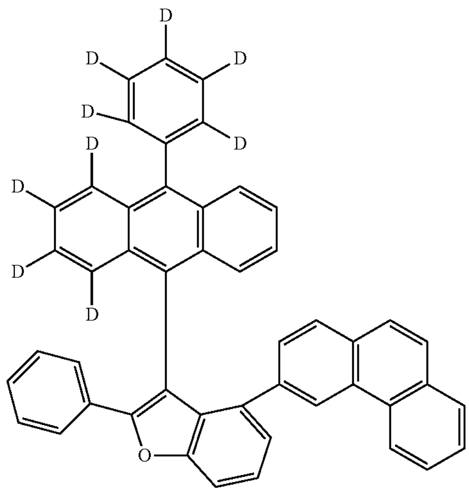
A-101
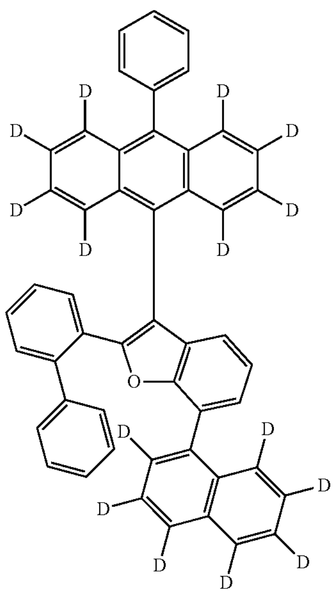
A-102
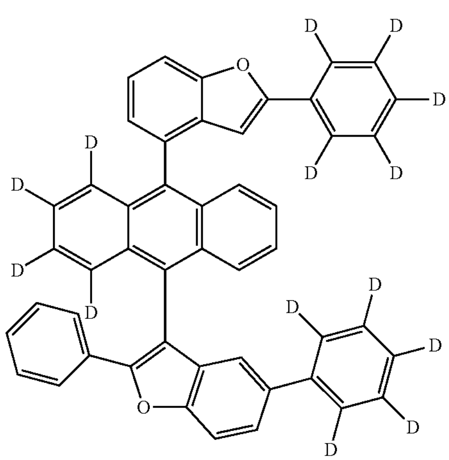
-continued
A-103
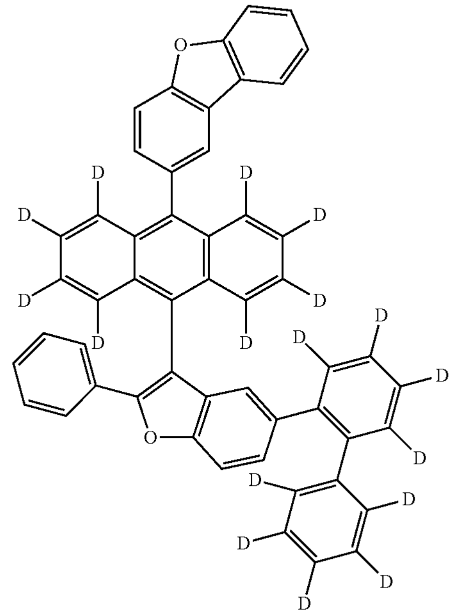
A-104
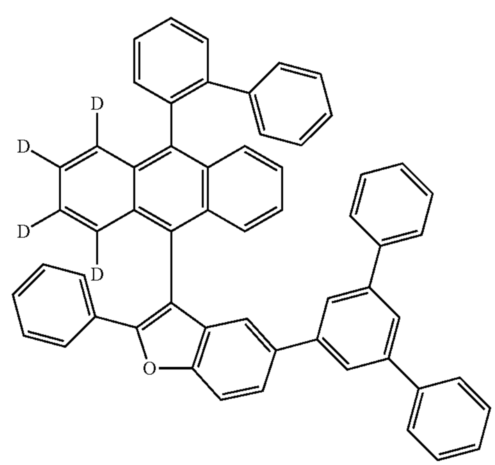

-continued
A-105
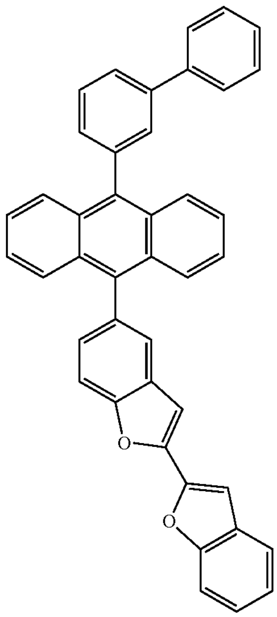
A-106
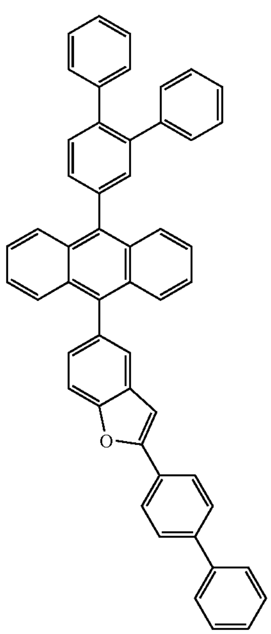
A-107
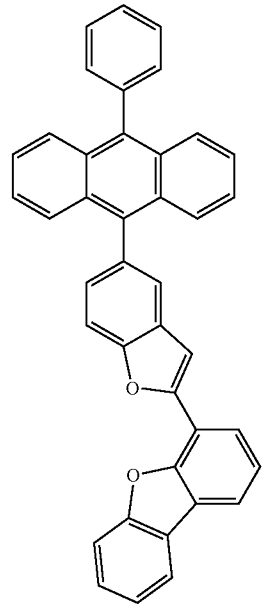
A-108
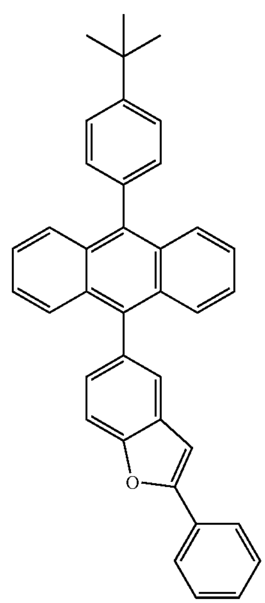

-continued
A-109
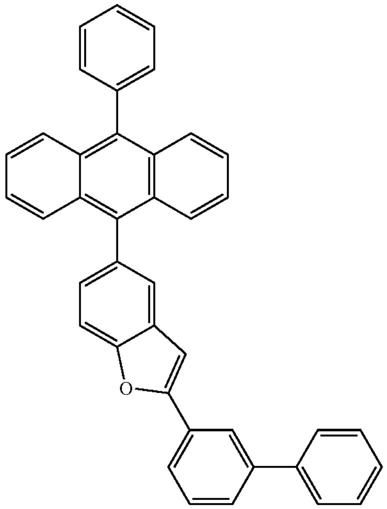
A-110
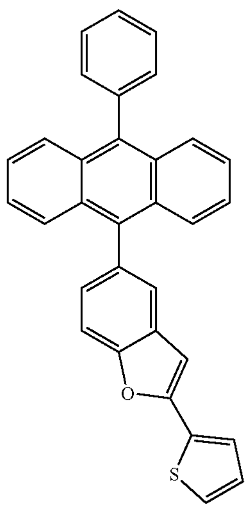
A-111
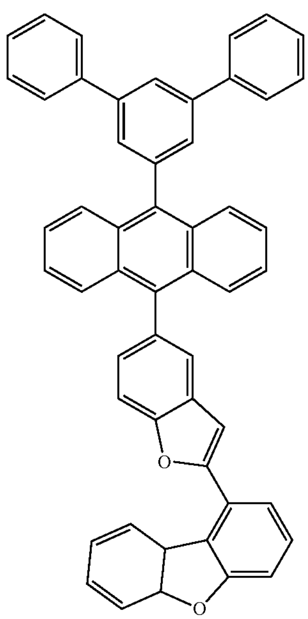
-continued
A-112
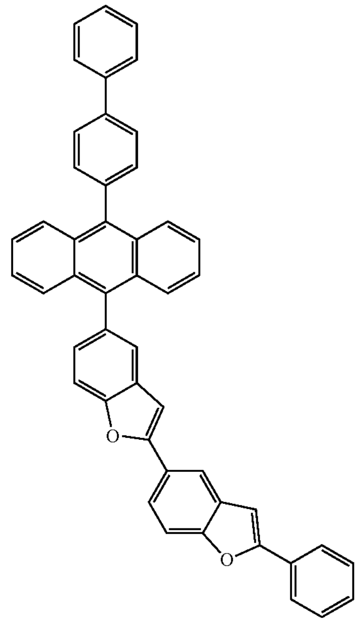
A-113
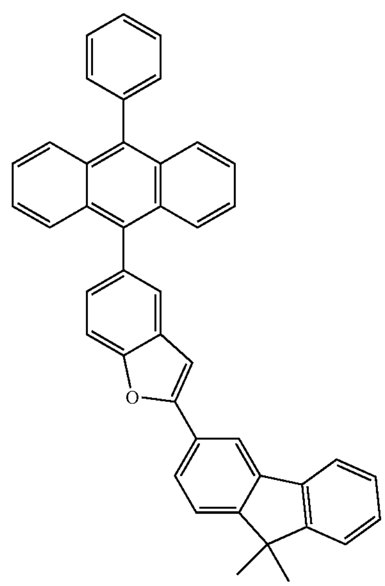

A-114
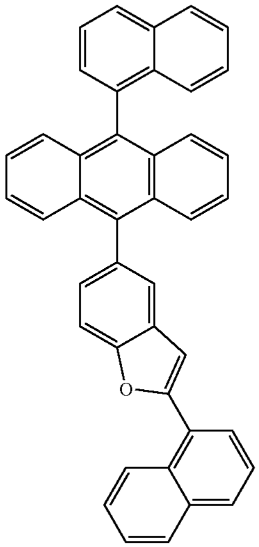
A-115
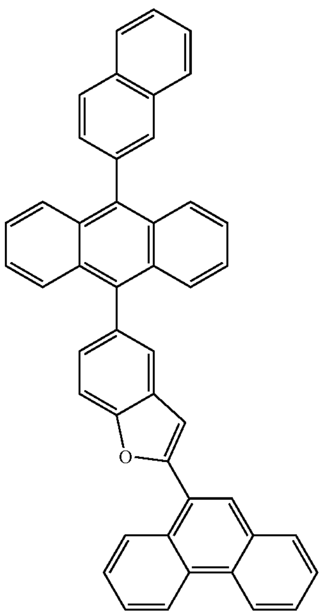
A-116
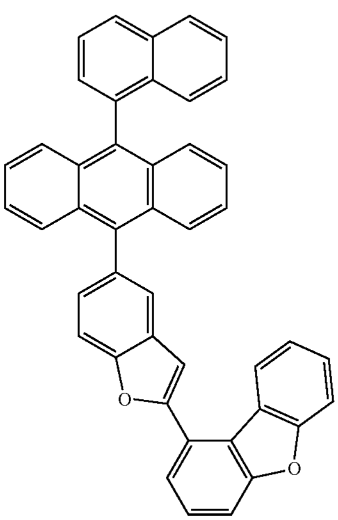
A-117
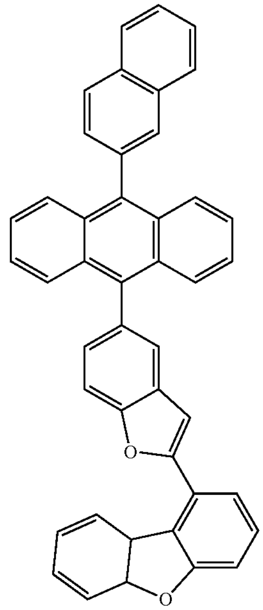
A-118
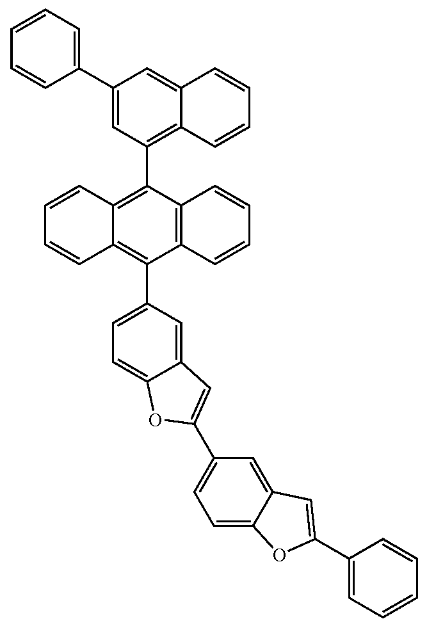
A119
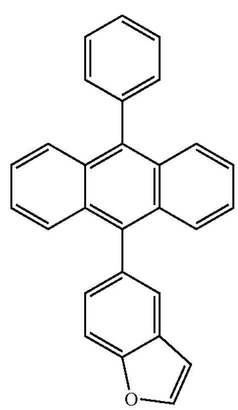

A-120
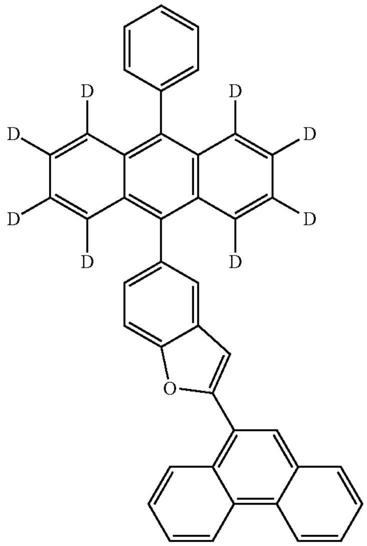
A-121
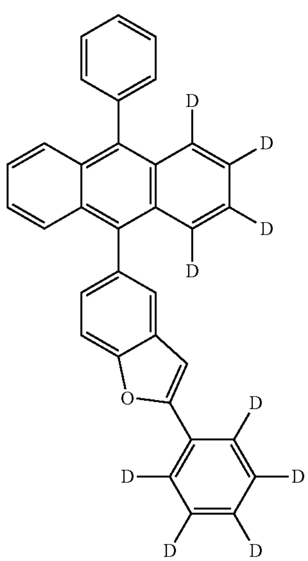
A-122
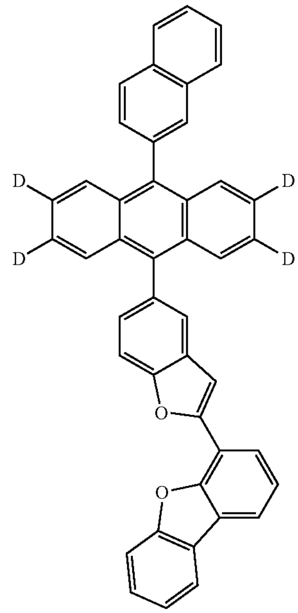
A-123
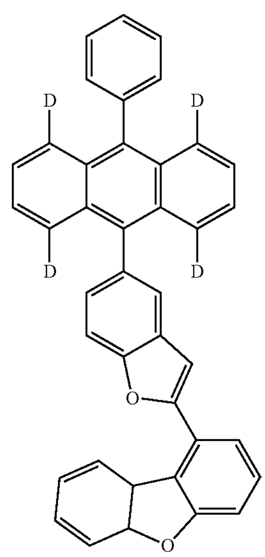

A-124
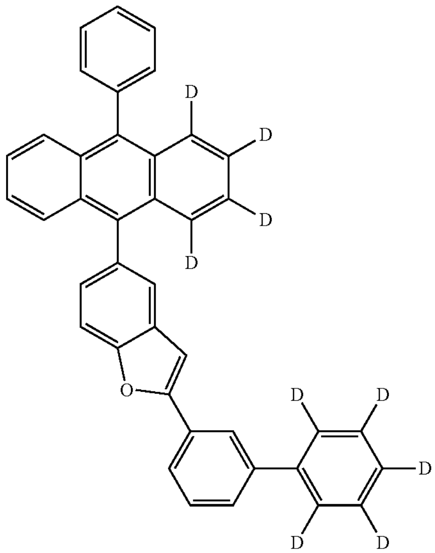
A-125
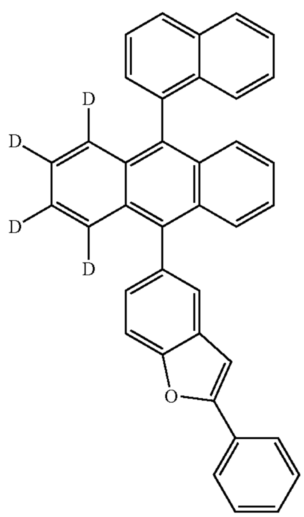
A126
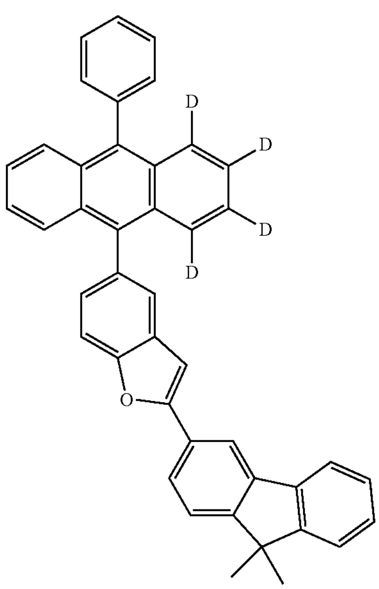
A-127
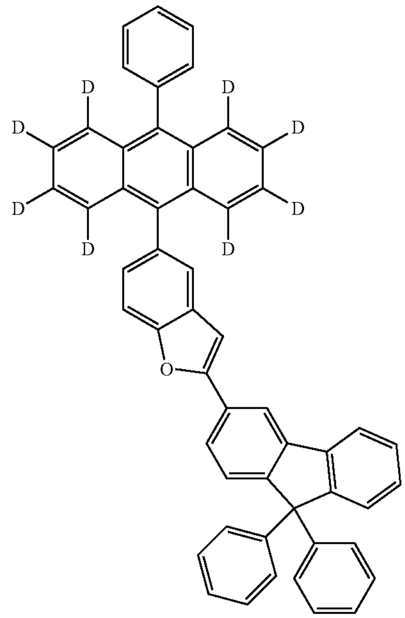
A-128
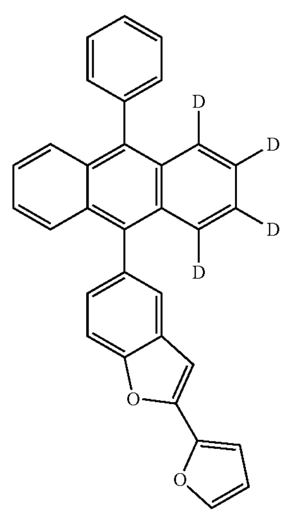

-continued
A-129
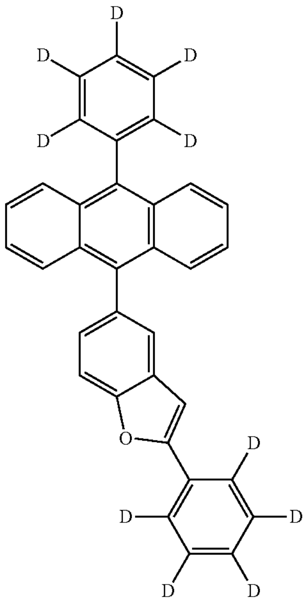
A-130
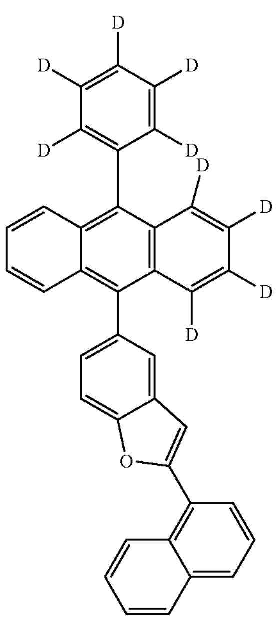
-continued
A-131
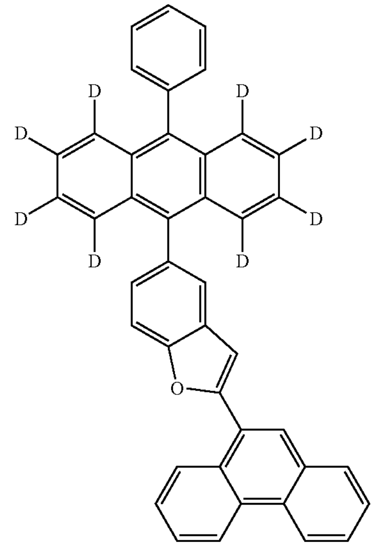
A-132
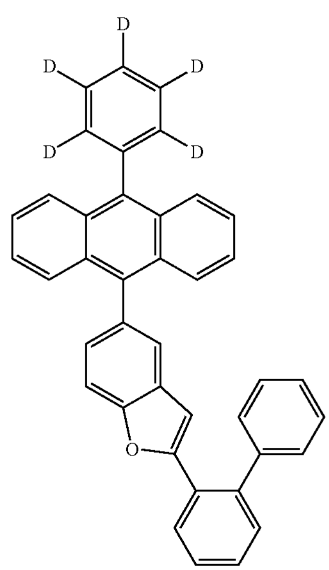

-continued
A-133
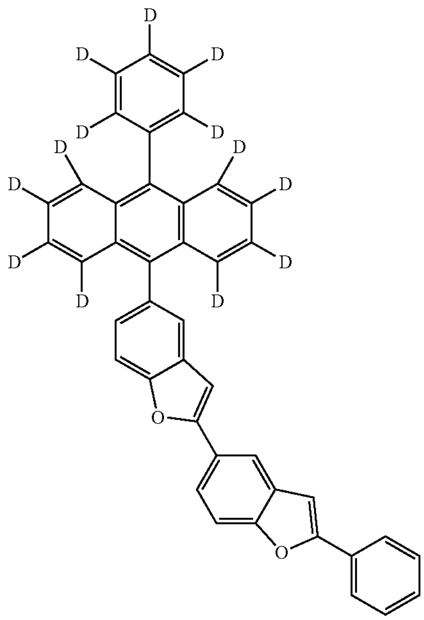
A-134
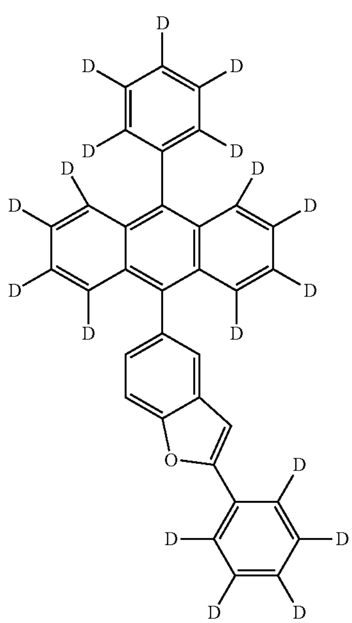
-continued
A-135
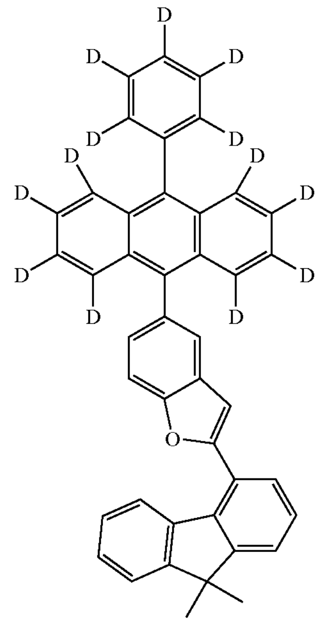
A-136
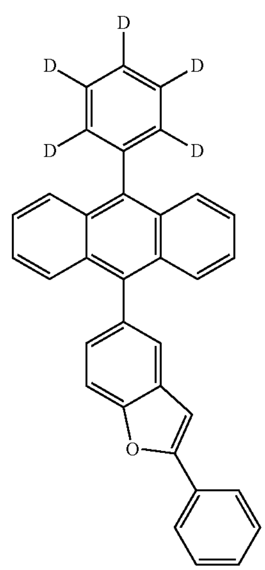

-continued
A-137
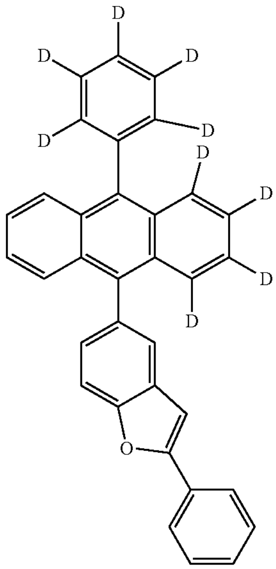
A-138
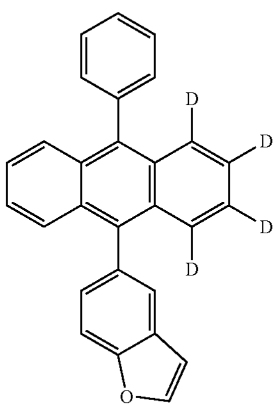
A-139
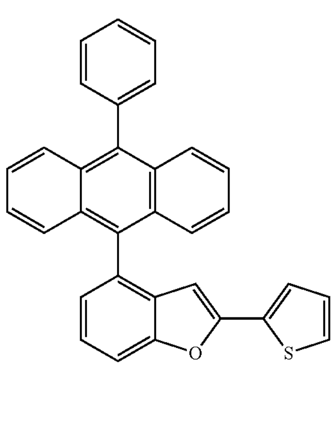
-continued
A-140
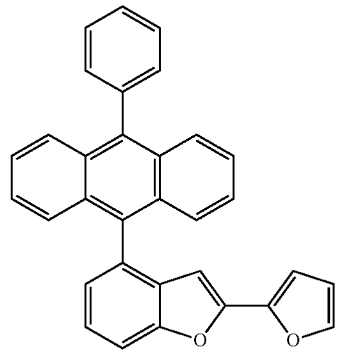
A-141
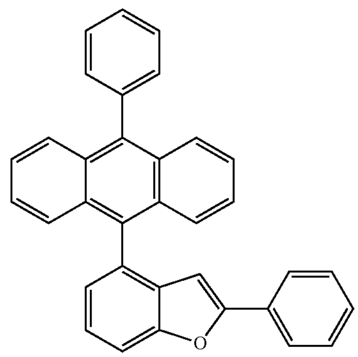
A-142
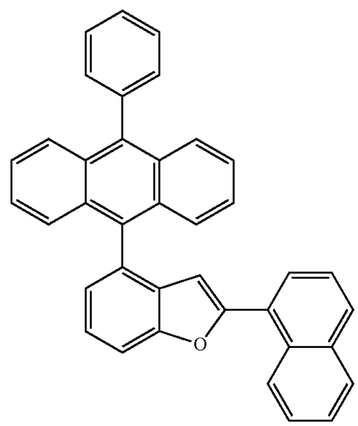
A-143
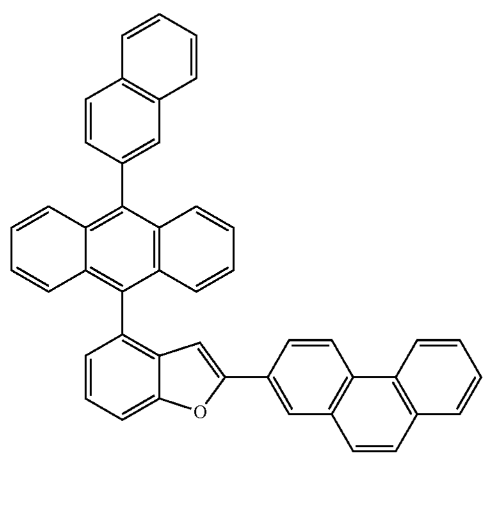

-continued
A-144
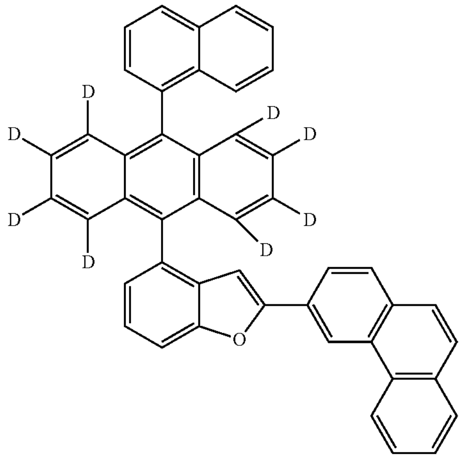
A-145
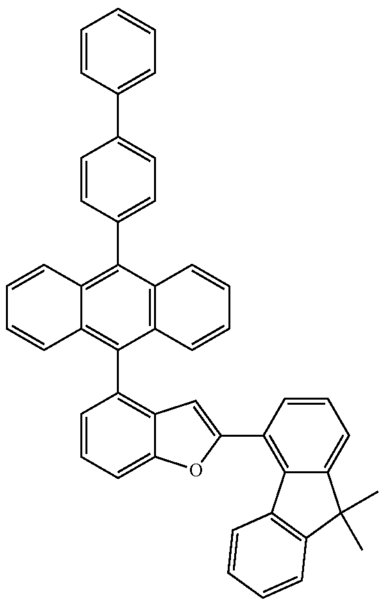
A-146
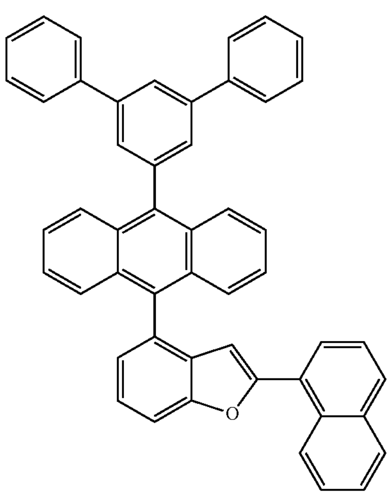
-continued
A-147
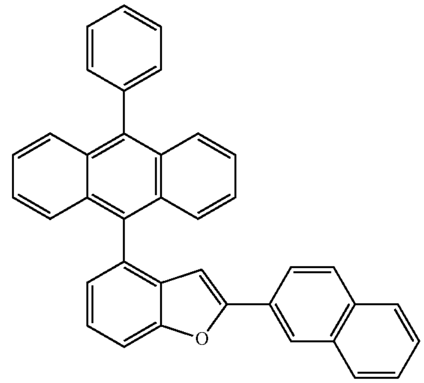
A-148
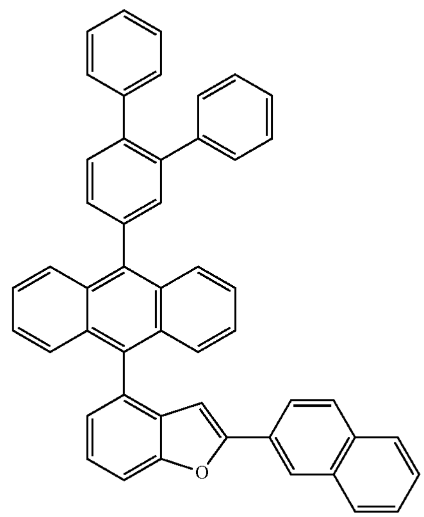
A-149
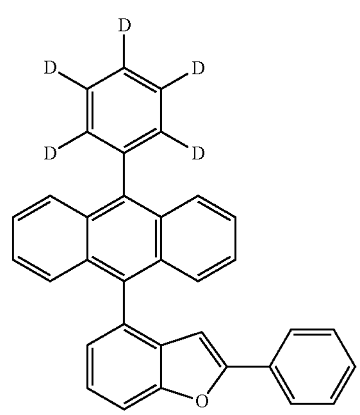

A-150
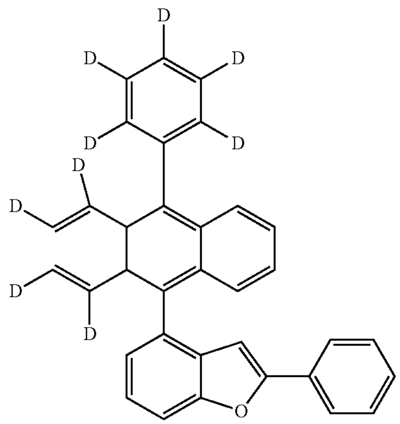
A-151
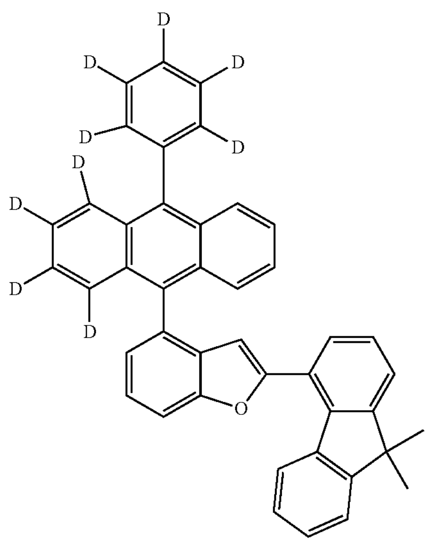
A-152
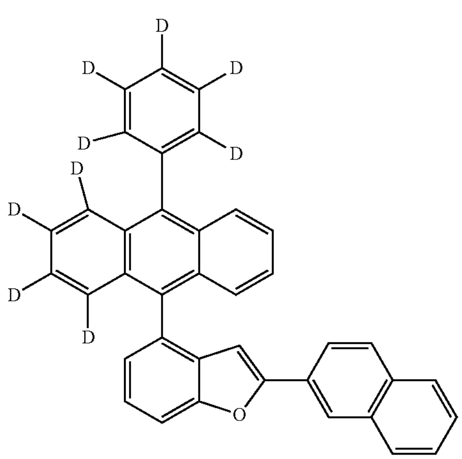
A-153
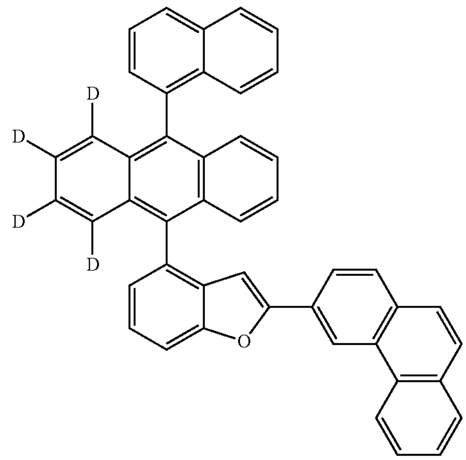
A-154
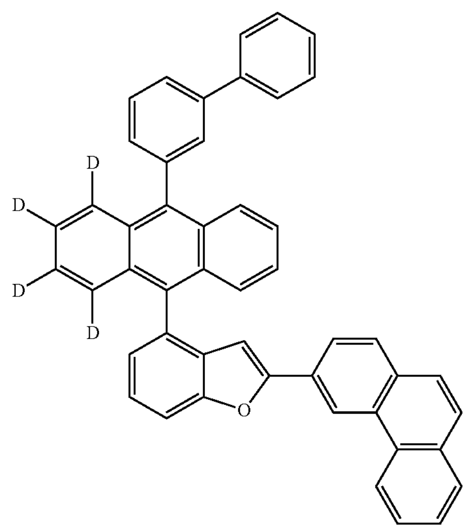
A-155
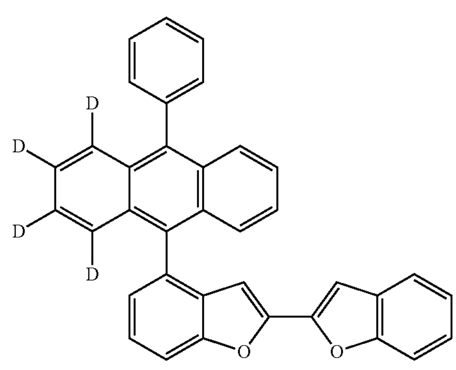

-continued
A-156
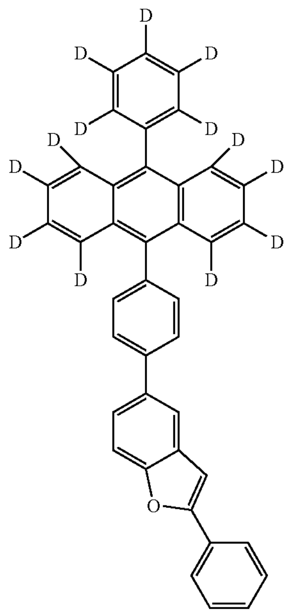
A-157
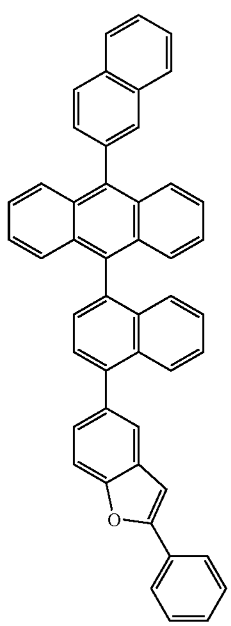
-continued
A-158
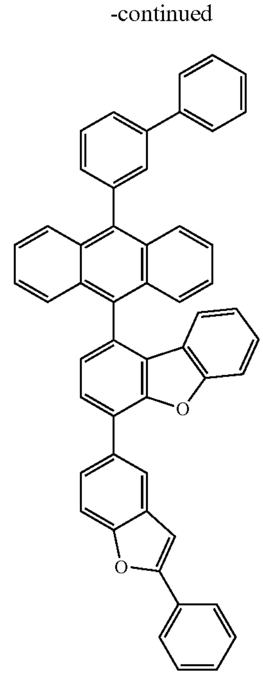
A-159
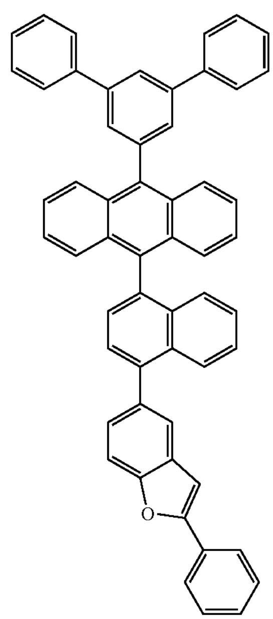

-continued
A-160
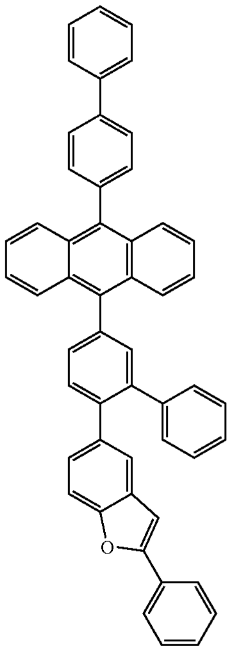
A-161
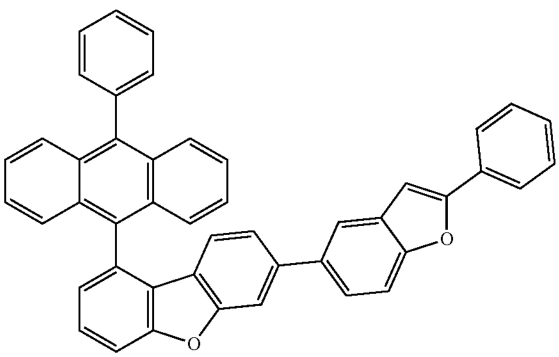
A-162
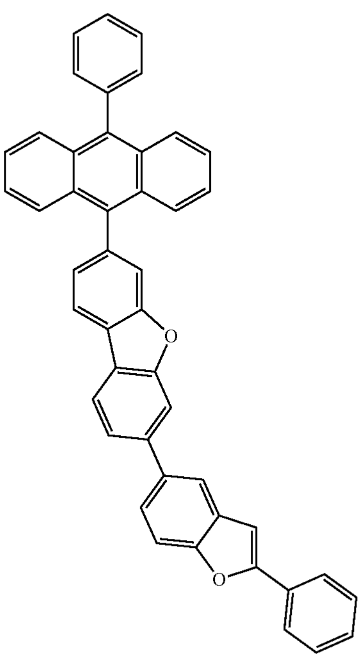
-continued
A-163
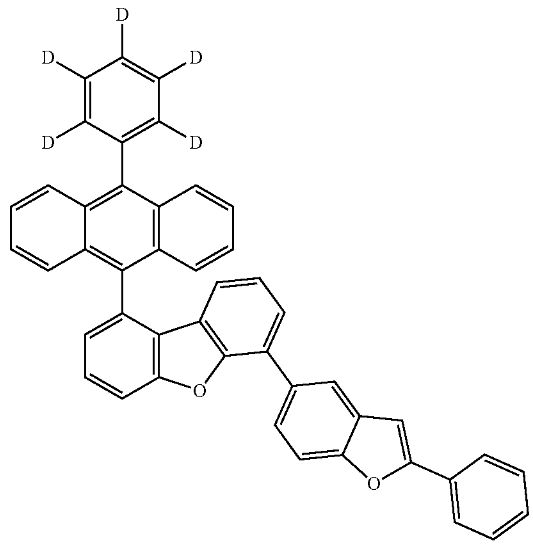
A-164
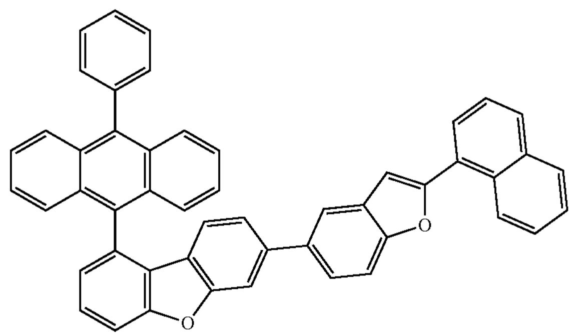
A-165
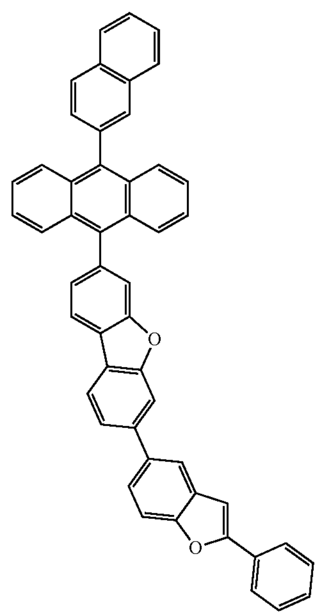

-continued
A-166
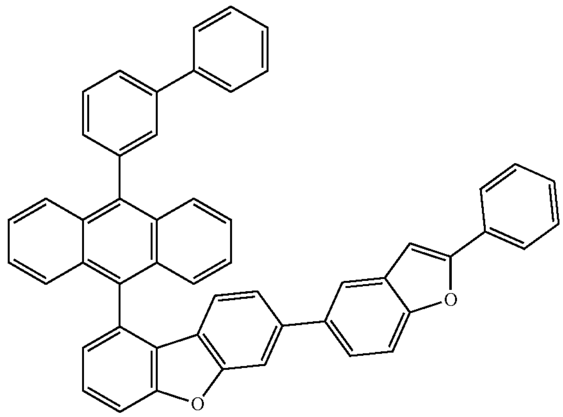
A-167
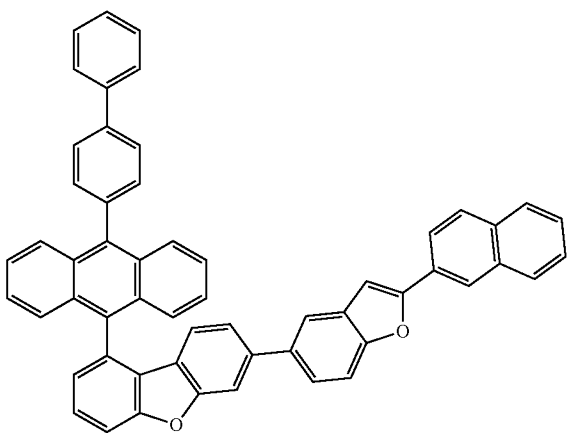
A-168
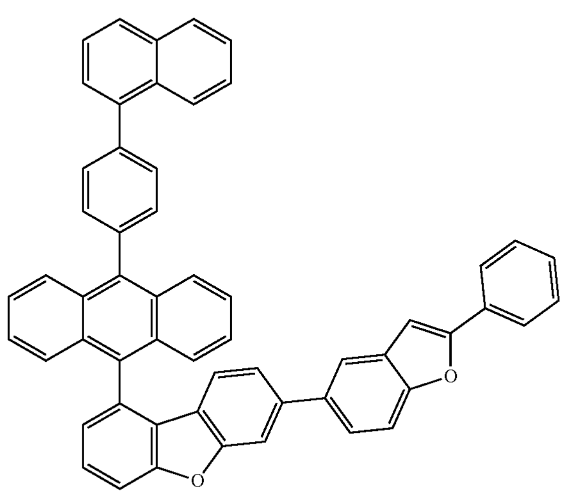
-continued
A-169
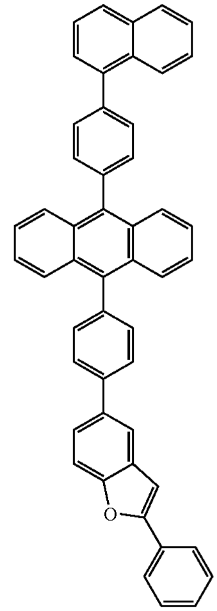
A-170
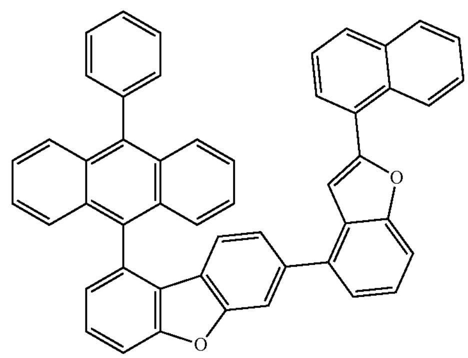
A-171
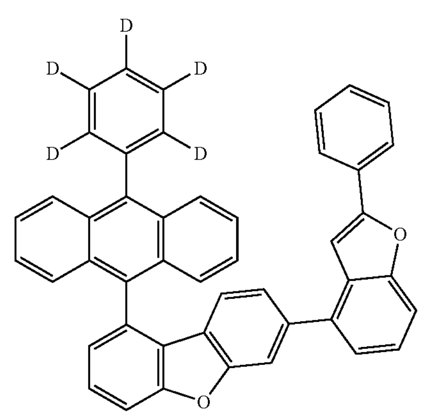

-continued
A-172
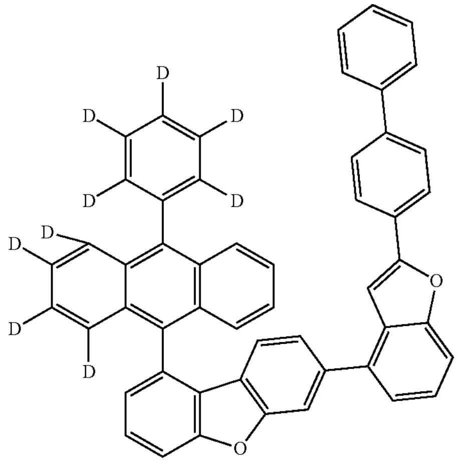
A-173
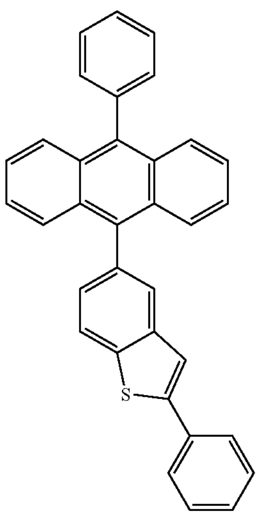
A-174
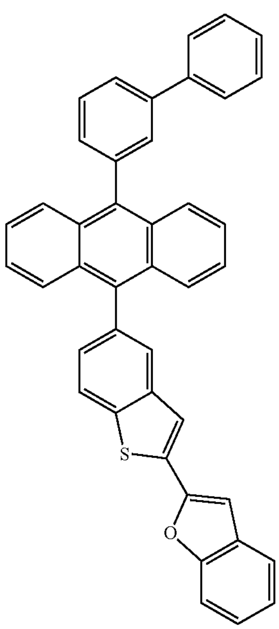
-continued
A-175
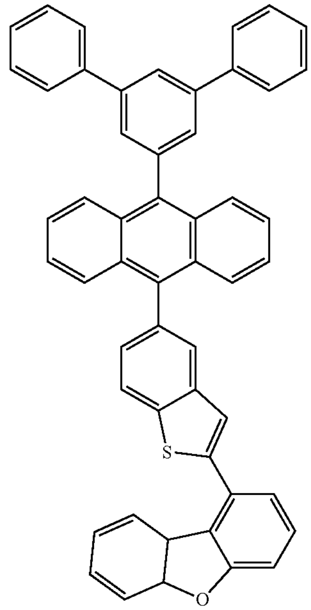
A-176
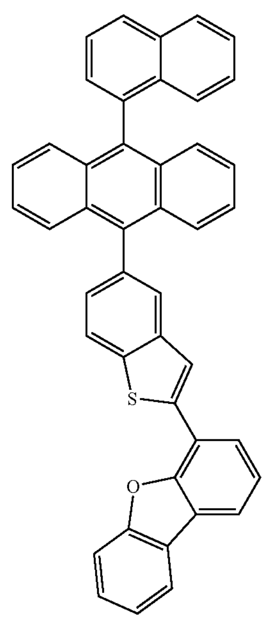

-continued
A-177
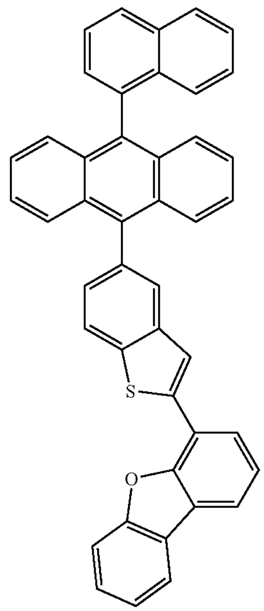
A-178
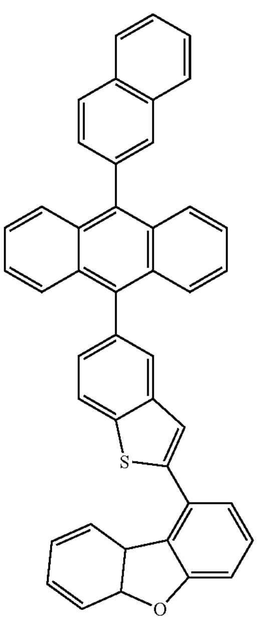
-continued
A-179
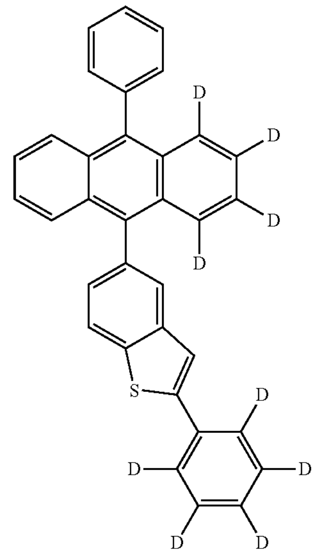
A-180
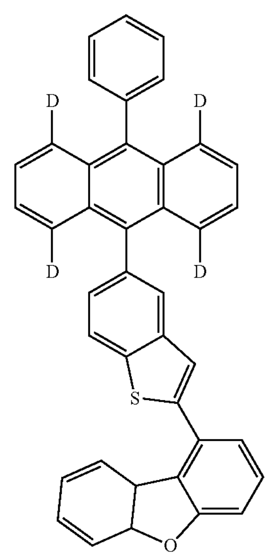

-continued
A-181
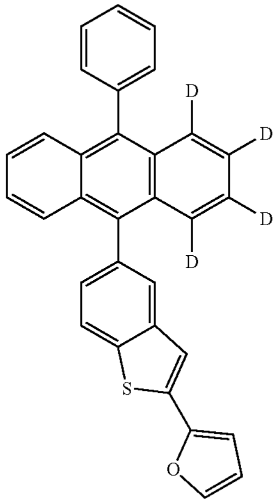
A-182
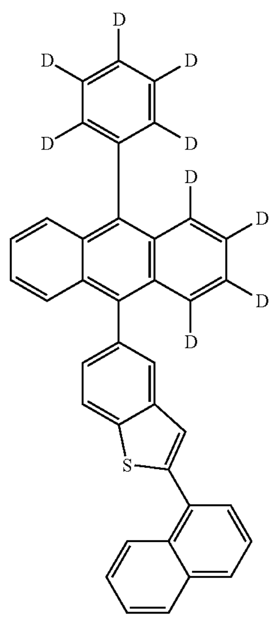
A-183
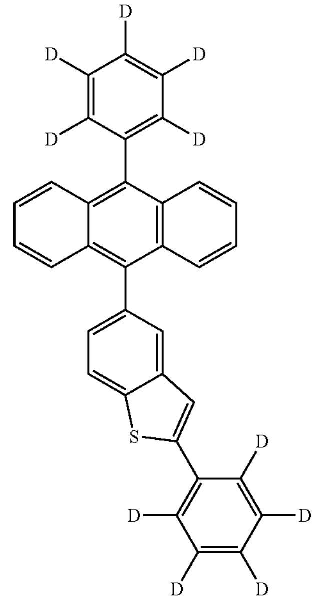
A-184
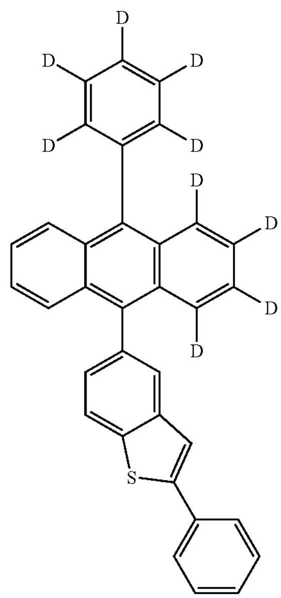
A-185
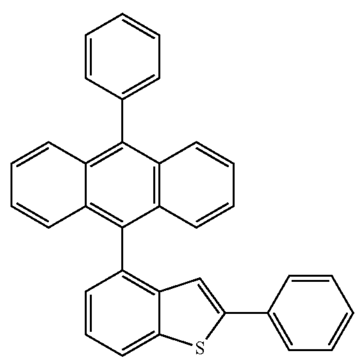

-continued
A-186
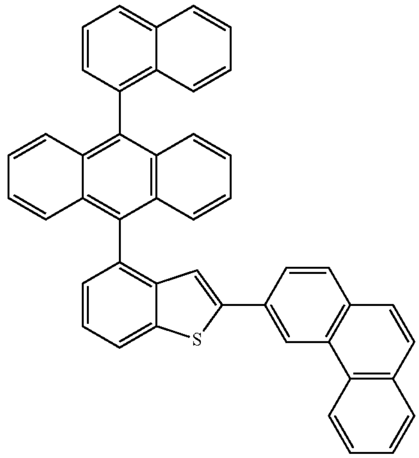
A-187
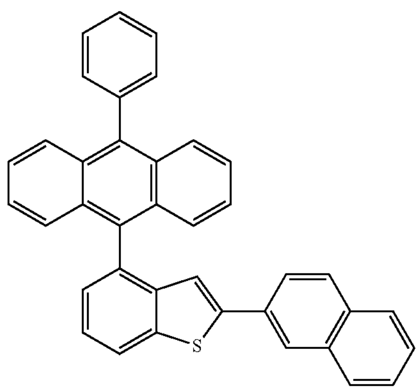
A-188
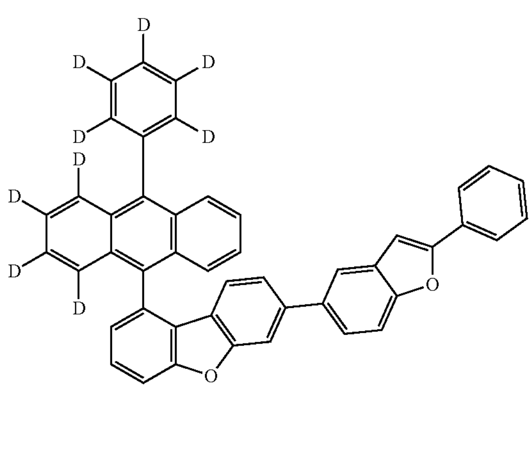
-continued
A-189
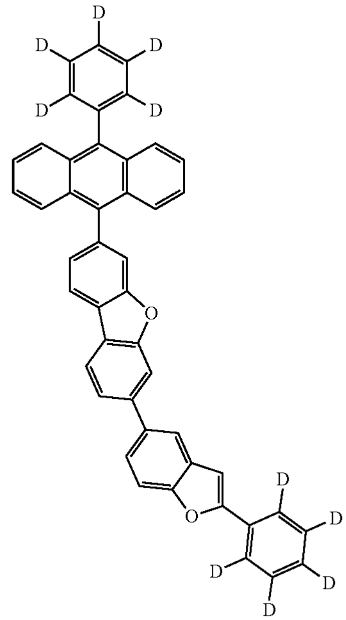
A-190
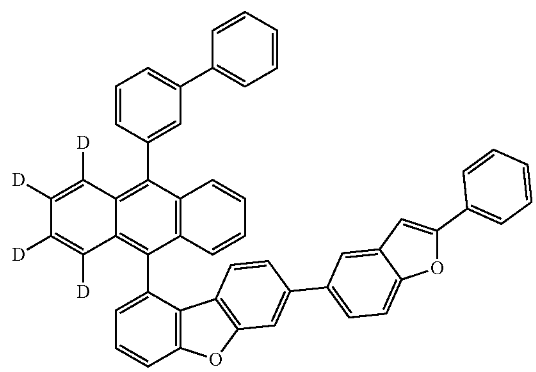
A-191
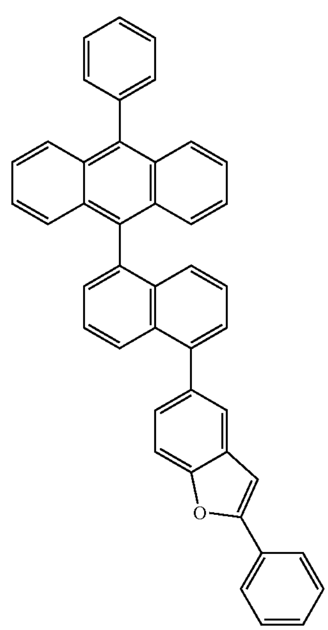

-continued
A-192
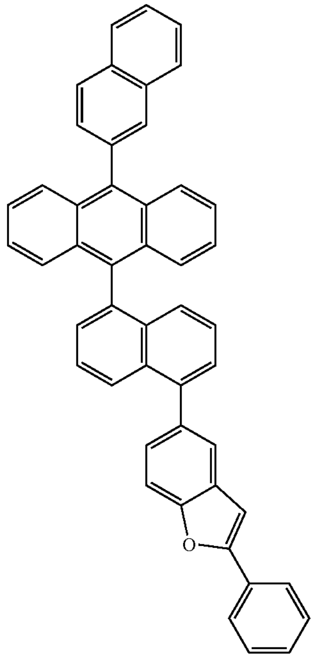
A-193
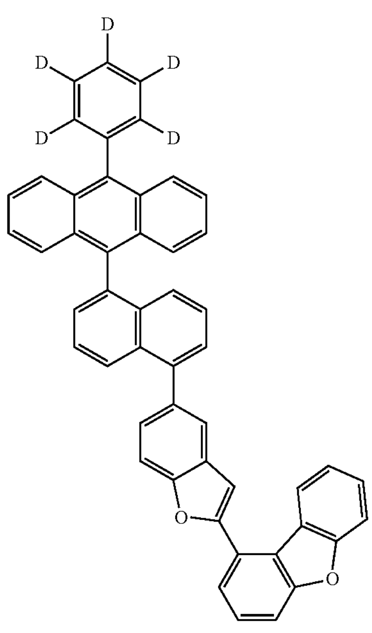
-continued
A-194
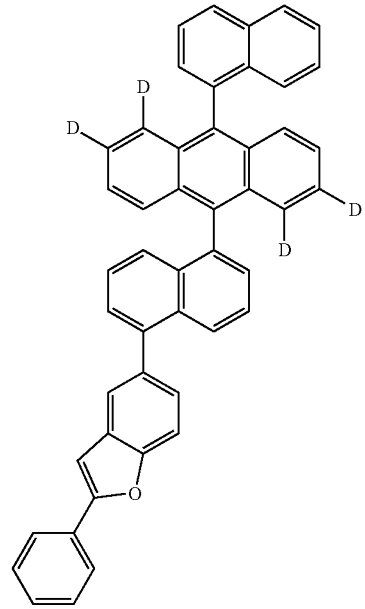
A-195
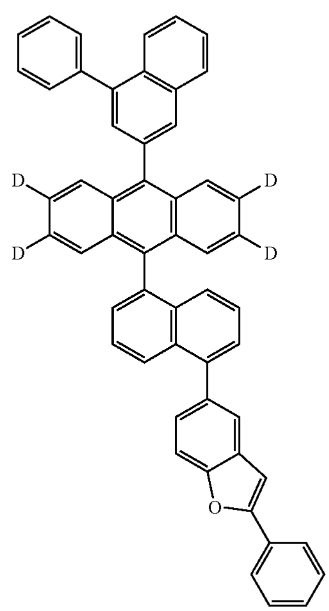

-continued
A-196
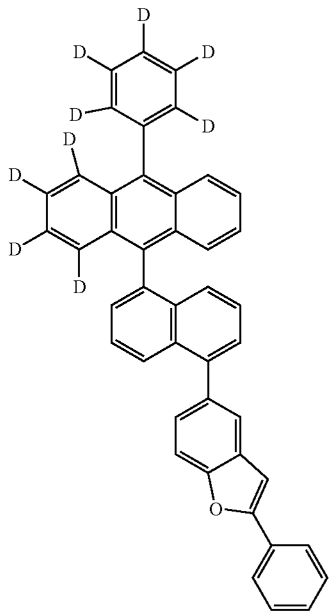
A-197
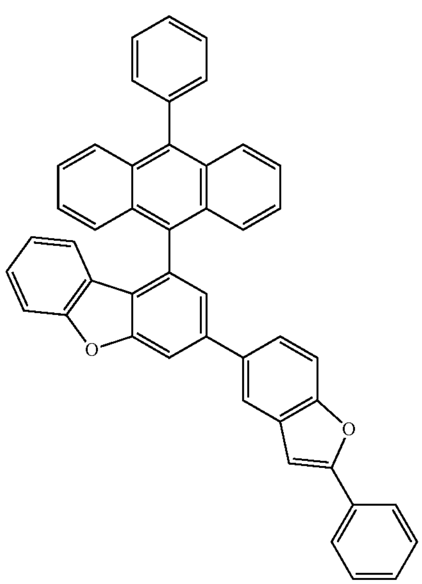
-continued
A-198
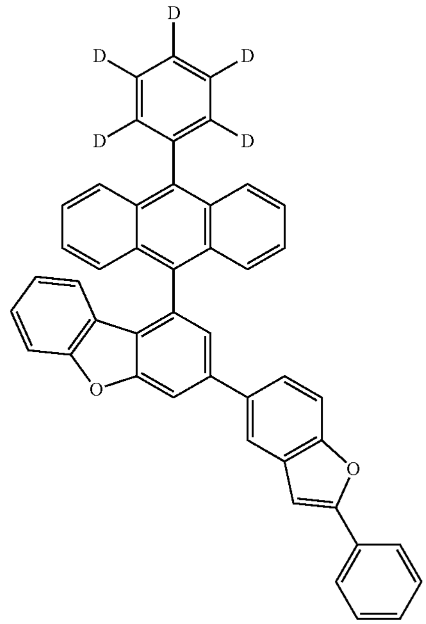
A-199
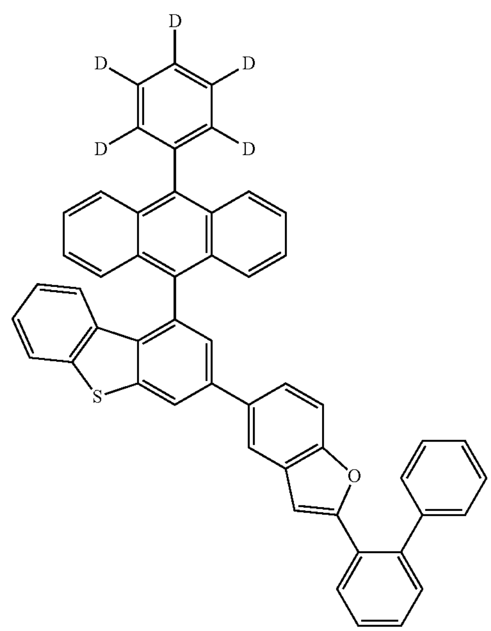

A-200
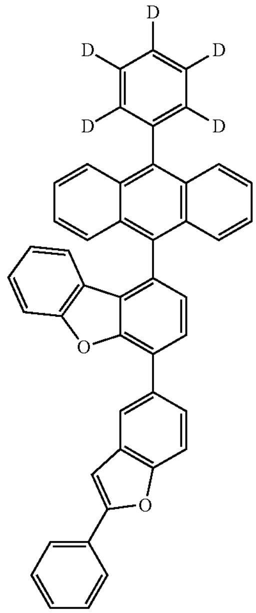
A-201
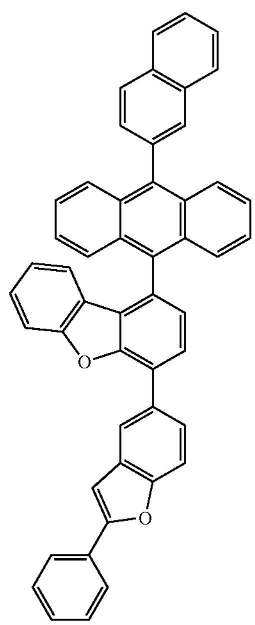
A-202
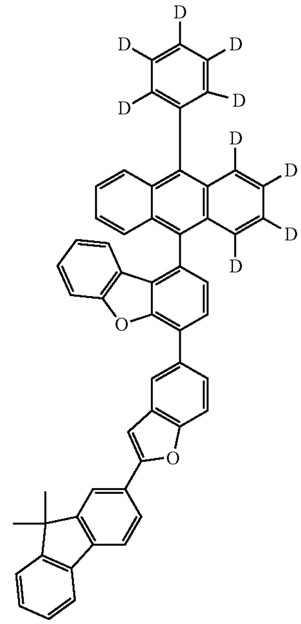
A-203
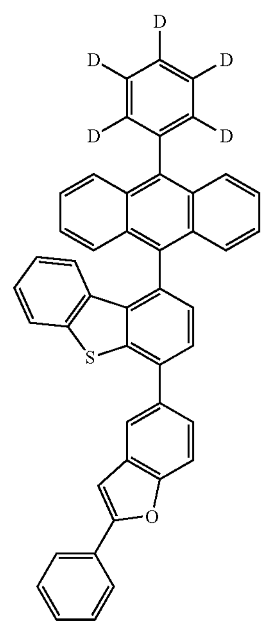

-continued
A-204
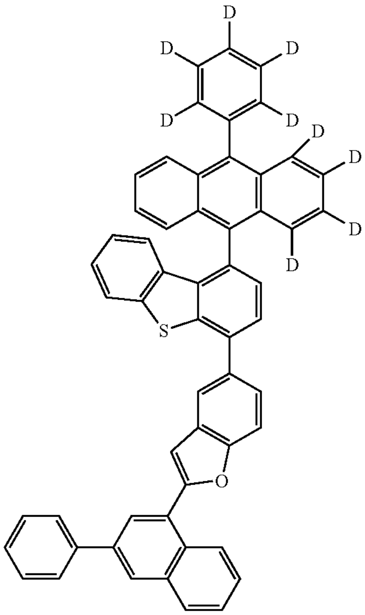
A-205
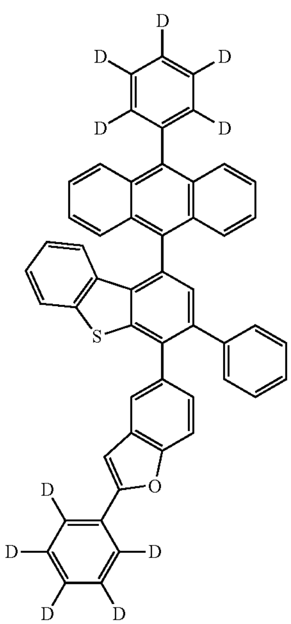
-continued
A-206
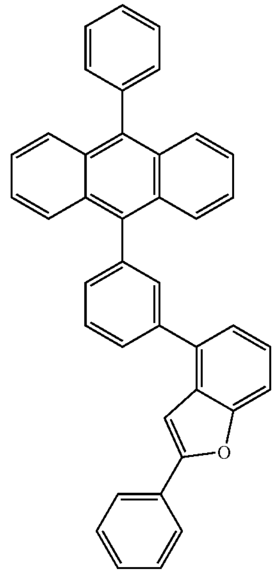
A-207
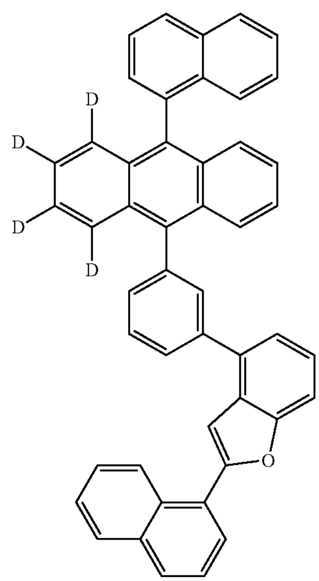

-continued
A-208
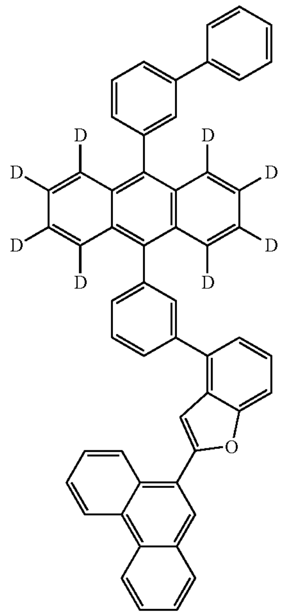
A-209
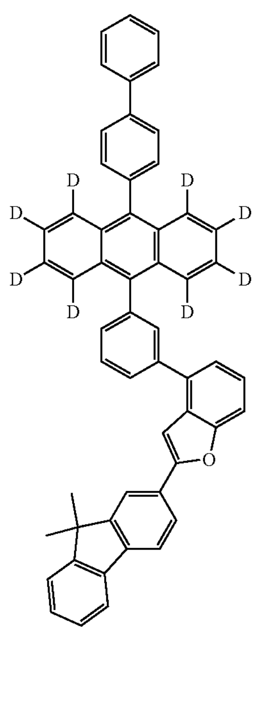
-continued
A-210
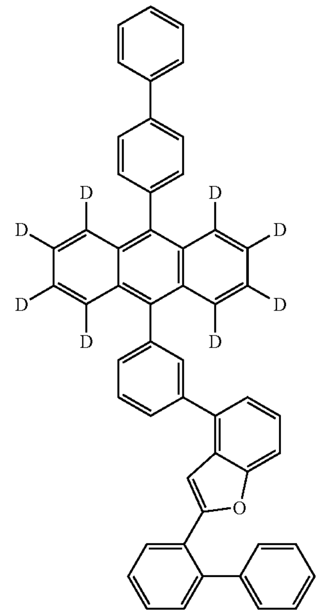
A-211
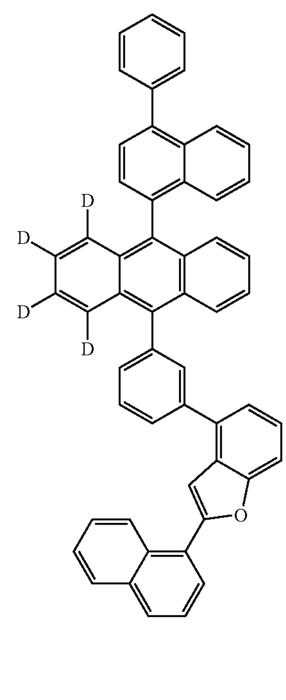

-continued
A-212
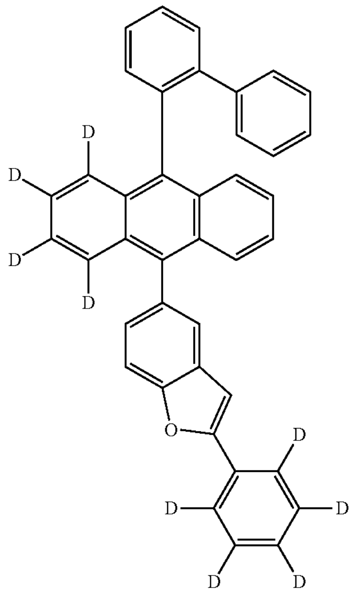
A-213
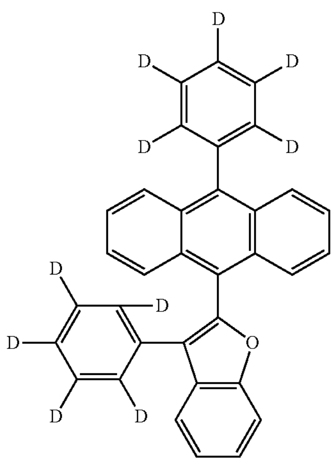
A-214
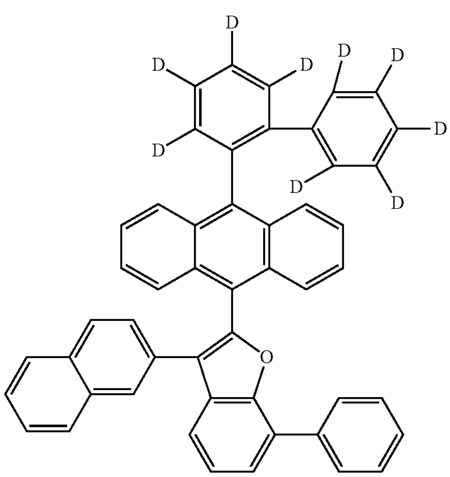
-continued
A-215
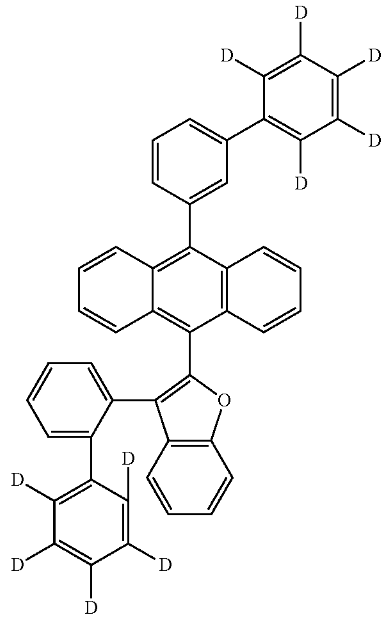
A-216
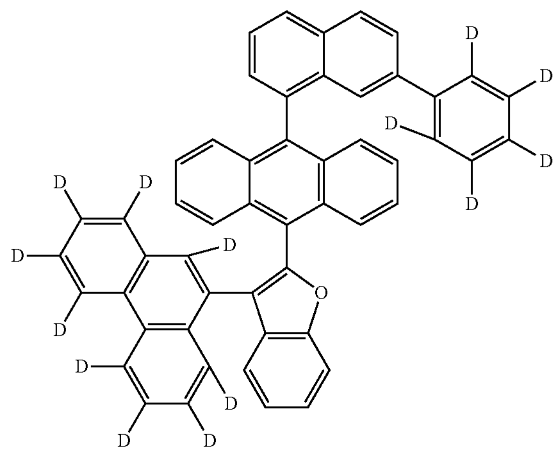
A-217
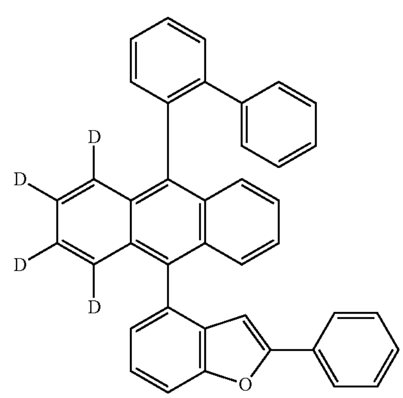

-continued

A-218

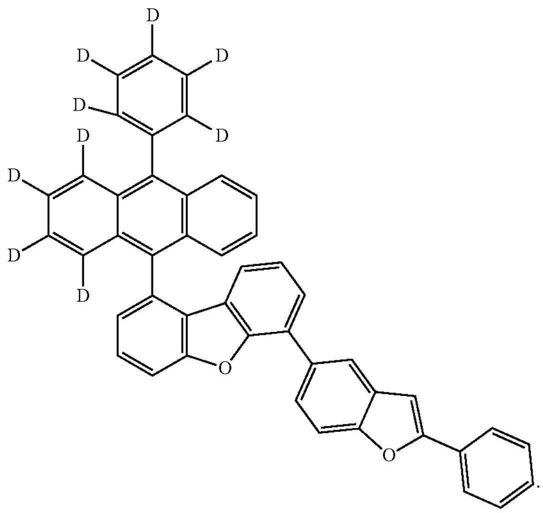

18. An organic light-emitting device comprising:

a first electrode;

a second electrode facing the first electrode;

a light-emitting layer interposed between the first electrode and the second electrode; and a capping layer disposed on one surface of the first electrode or the second electrode which is opposite to a remaining surface of the first electrode or the second electrode that faces the light-emitting layer, wherein the light-emitting layer comprises at least one selected from compounds represented by the following [Formula A-1] to [Formula A-6], and the capping layer comprises a compound represented by the following [Formula B]:

[Formula A-1]

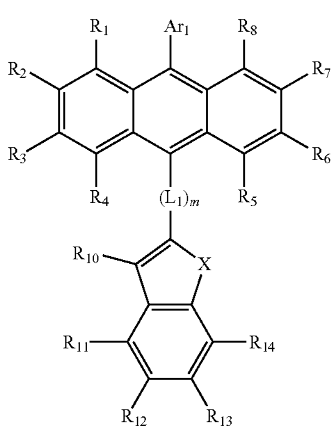

-continued

[Formula A-2]

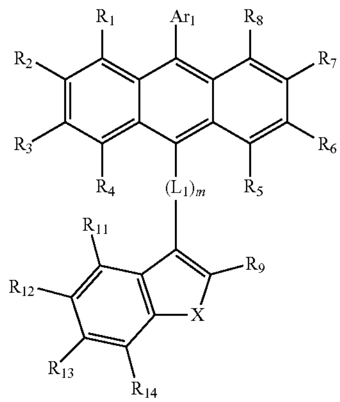

[Formula A-3]

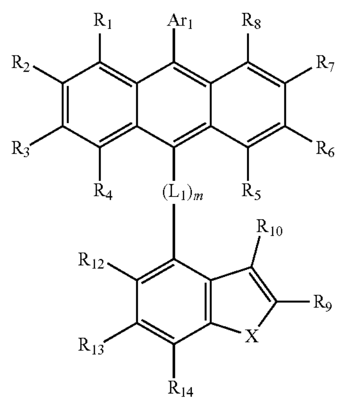

[Formula A-4]

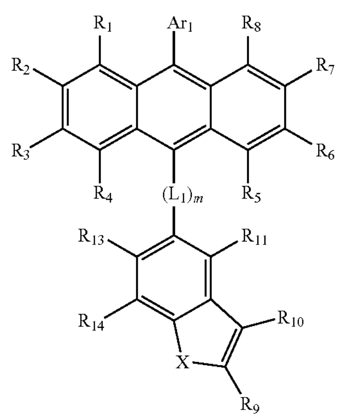

[Formula A-5]

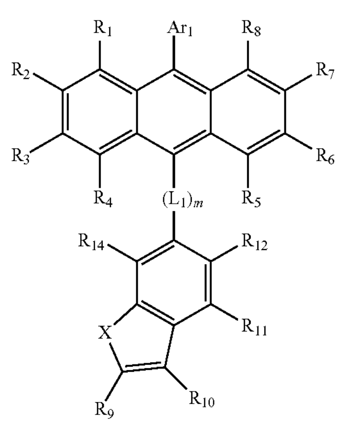

-continued

[Formula A-6]

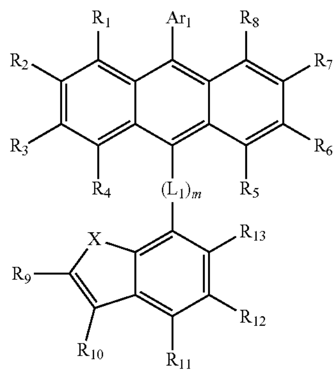

wherein $Ar_1$ is selected from a substituted or unsubstituted C6-C50 aryl group, a substituted or unsubstituted C2-C50 heteroaryl group, and a substituted or unsubstituted C3-C50 mixed aliphatic-aromatic ring group, $R_1$ to $R_{14}$ are identical to or different from each other, and are each independently hydrogen, deuterium, a substituted or unsubstituted C1-C30 alkyl group, a substituted or unsubstituted C6-C50 aryl group, a substituted or unsubstituted C2-C30 alkenyl group, a substituted or unsubstituted C2-C30 alkynyl group, a substituted or unsubstituted C3-C30 cycloalkyl group, a substituted or unsubstituted C3-C30 cycloalkenyl group, a substituted or unsubstituted C2-C50 heteroaryl group, a substituted or unsubstituted C2-C30 heterocycloalkyl group, a substituted or unsubstituted C1-C30 alkoxy group, a substituted or unsubstituted C6-C50 aryloxy group, a substituted or unsubstituted C1-C30 alkylthioxy group, a substituted or unsubstituted C6-C50 arylthioxy group, a substituted or unsubstituted amine group, a substituted or unsubstituted silyl group, a substituted or unsubstituted C3-C50 mixed aliphatic-aromatic ring group, a cyano group, a nitro group and a halogen group, X is an oxygen atom (O) or a sulfur atom(S), $L_1$ is a divalent linker and is a single bond or is selected from a substituted or unsubstituted C6-C50 arylene group, a substituted or unsubstituted C2-C50 heteroarylene group, and a substituted or unsubstituted C3-C50 mixed aliphatic-aromatic ring group, and m is an integer from 1 to 3, provided that when m is 2 or more, a plurality of $L_1$ are identical to or different from each other,

[Formula B]

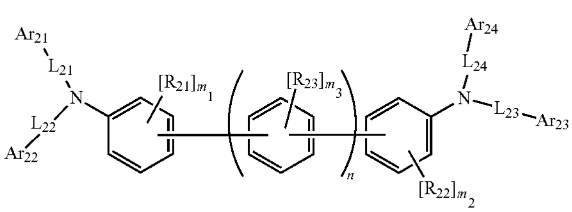

wherein $R_{21}$ to $R_{23}$ are identical to or different from each other, and are each independently selected from hydrogen, deuterium, a substituted or unsubstituted C1-C20 alkyl group, a substituted or unsubstituted C6-C50 aryl group, a substituted or unsubstituted C2-C30 heteroaryl group, a substituted or unsubstituted C7-C50 arylalkyl group, a substituted or unsubstituted C3-C30 cycloalkyl group, a substituted or unsubstituted silyl group, and a halogen group, $L_{21}$ to $L_{24}$ are identical to or different from each other, and are each independently a single bond or are selected from are selected from a substituted or unsubstituted C6-C50 arylene group and a substituted or unsubstituted C2-C50 heteroarylene group, $Ar_{21}$ to $Ar_{24}$ are identical to or different from each other, and are each independently selected from a substituted or unsubstituted C6-C50 aryl group, and a substituted or unsubstituted C2-C50 heteroaryl group, n is an integer from 0 to 4, provided that when n is 2 or more, a plurality of aromatic ring structures in ( ) including $R_{23}$ are identical to or different from each other, $m_1$ to $m_3$ are integers from 0 to 4, provided that when each of $m_1$ to $m_3$ is 2 or more, a plurality of each of $R_{21}$, $R_{22}$, and $R_{23}$ are identical to or different from each other, and at least one carbon atom of aromatic rings, to which $R_{21}$ to $R_{23}$ are bonded, is bonded to deuterium.

19. The organic light-emitting device according to claim 18, wherein at least one of $R_{11}$ to $R_{14}$ in each of the compounds represented by [Formula A-1] to [Formula A-6] is selected from a substituted or unsubstituted C6-C20 aryl group, a substituted or unsubstituted C3-C20 cycloalkyl group, and a substituted or unsubstituted C3-C20 heteroaryl group.

20. The organic light-emitting device according to claim 18, wherein each of the compounds represented by [Formula A-1] to [Formula A-6] is selected from compounds represented by the following [A-1] to [A-218]:

A-1

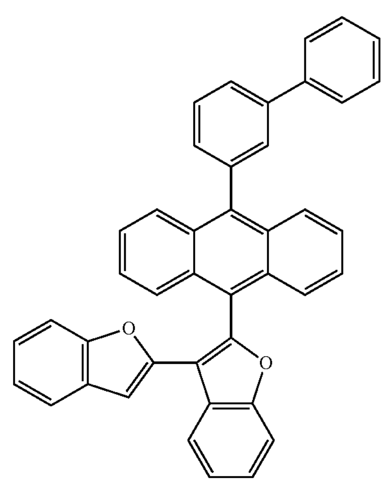

-continued
A-2
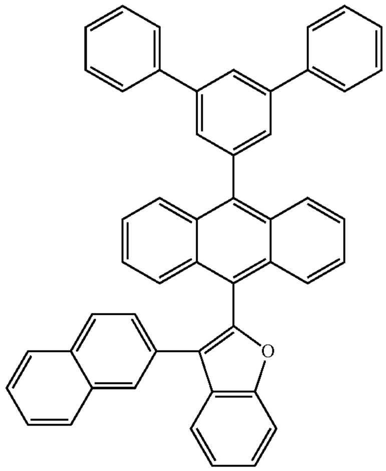
A-3
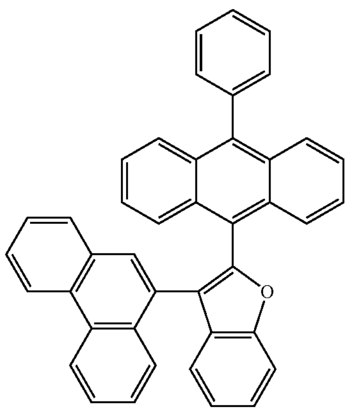
A-4
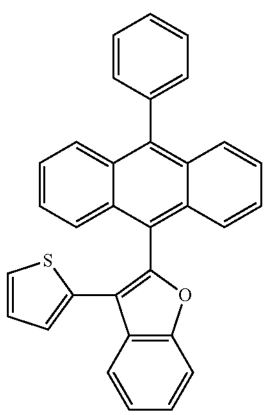
-continued
A-5
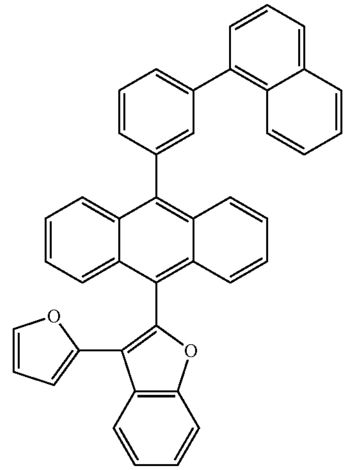
A-6
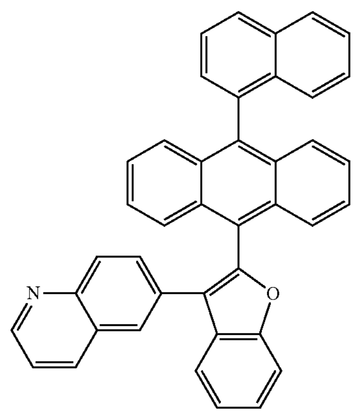
A-7
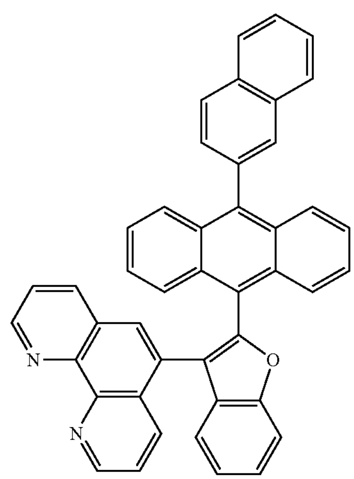

-continued
A-8
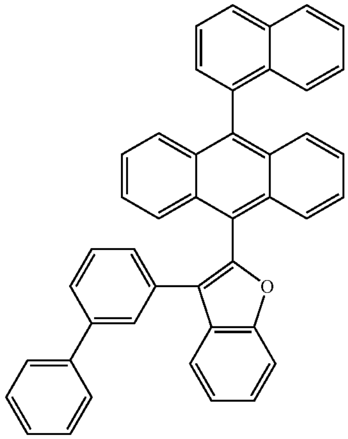
A-9
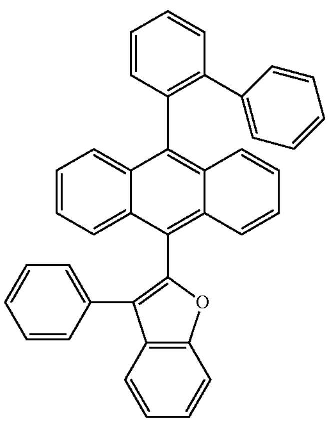
A-10
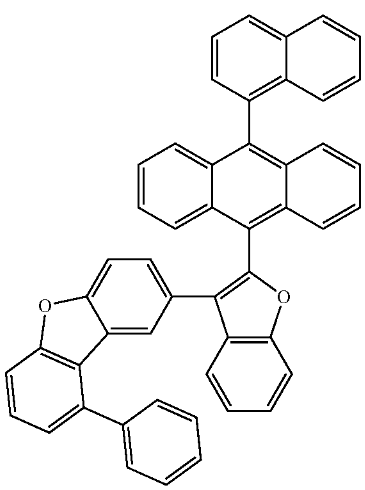
-continued
A-11
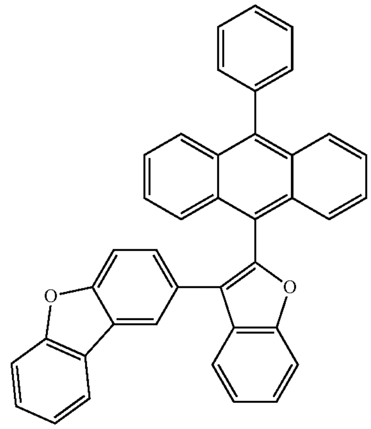
A-12
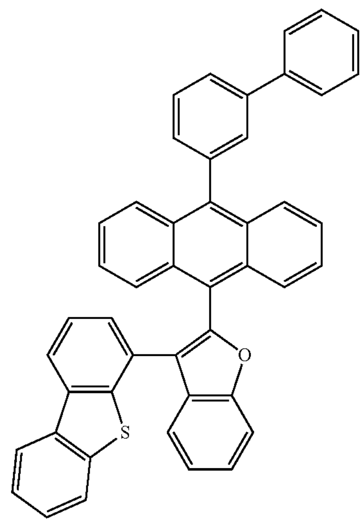
A-13
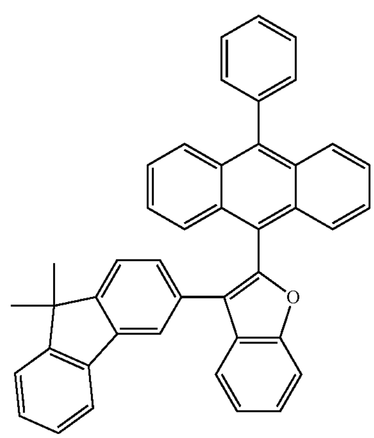

-continued
A-14
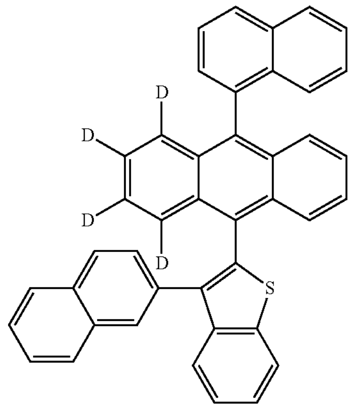
A-15
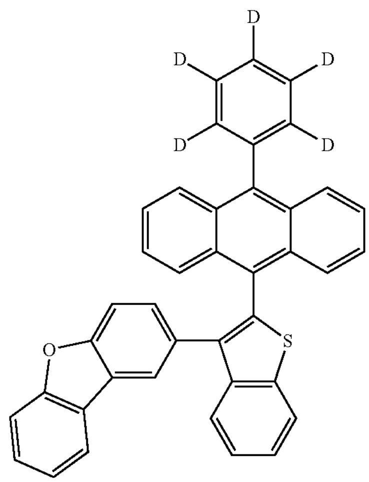
A-16
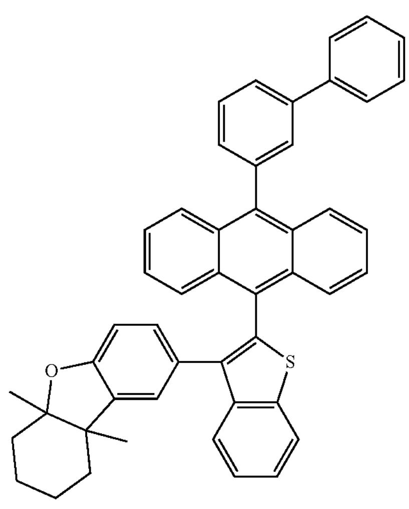
-continued
A-17
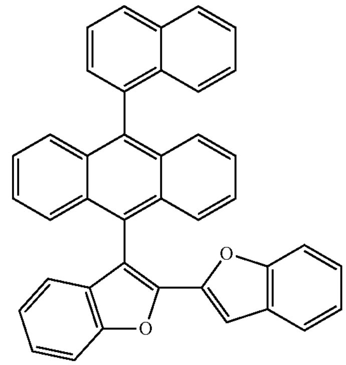
A-18
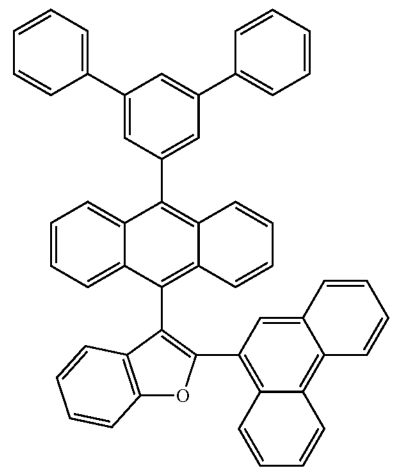
A-19
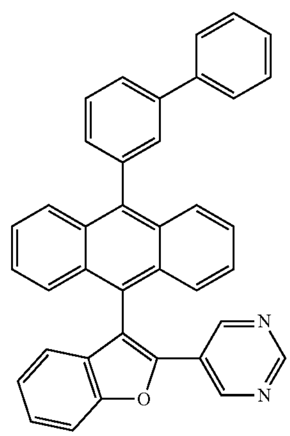
A-20
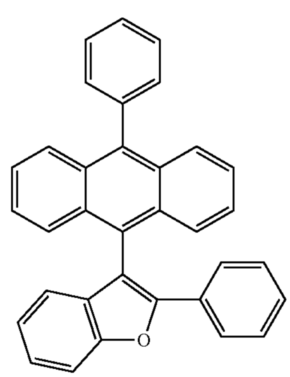

A-21
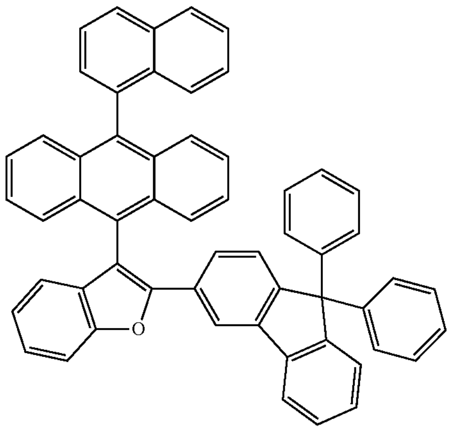
A-22
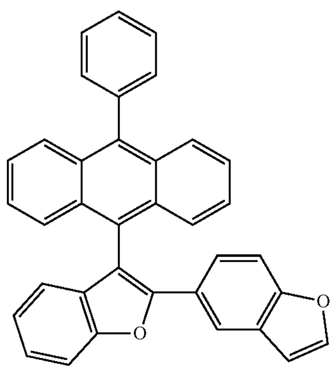
A-23
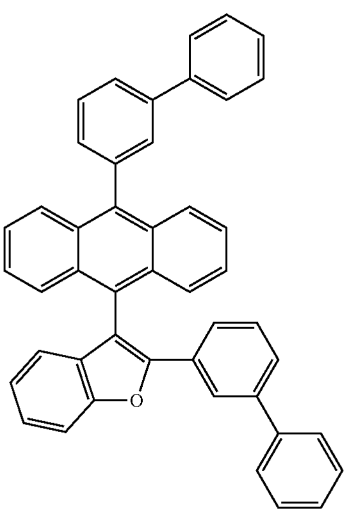
A-24
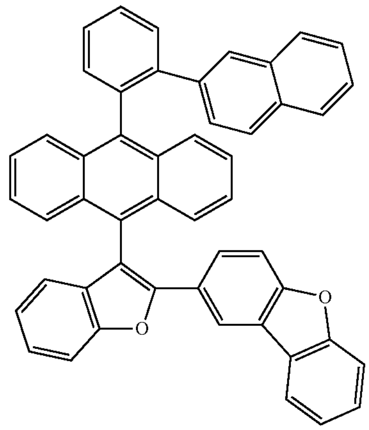
A-25
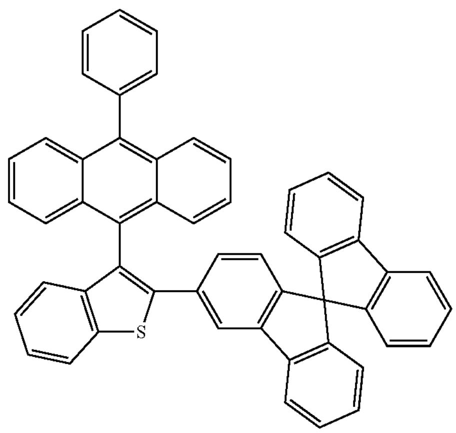
A-26
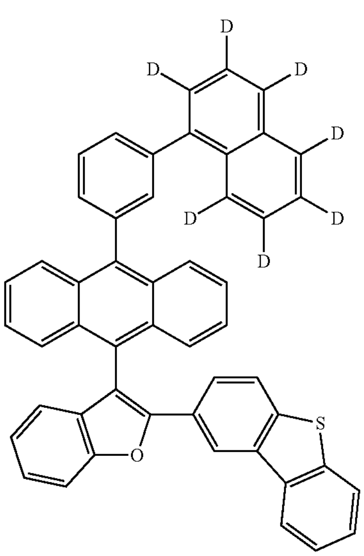

-continued
A-27
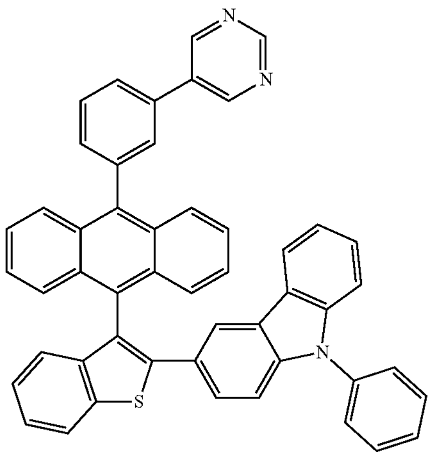
A-28
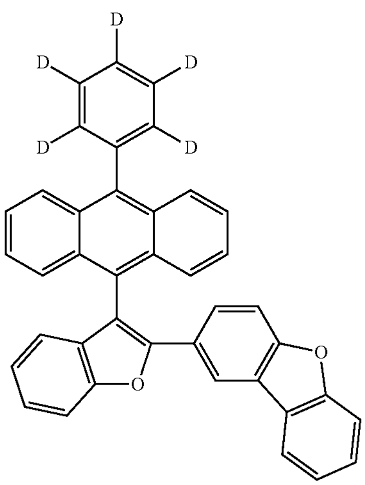
A-29
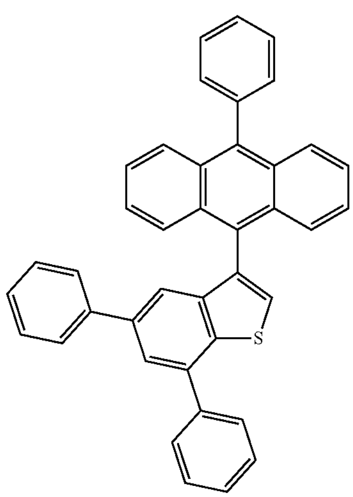
-continued
A-30
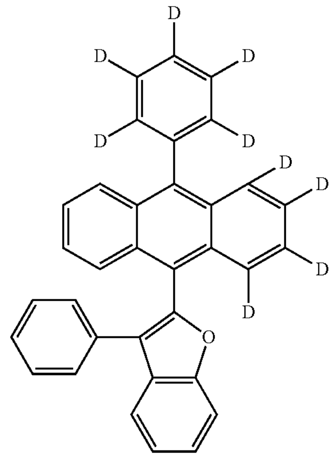
A-31
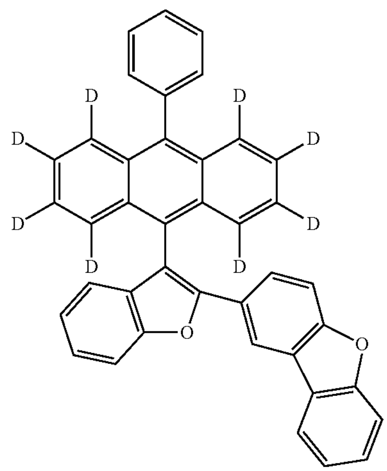
A-32
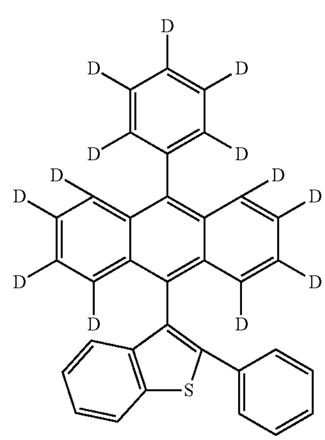

-continued
A-33
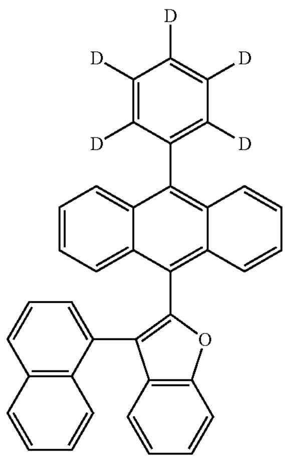
A-34
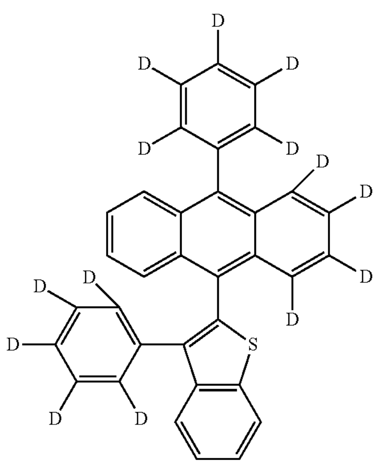
A-35
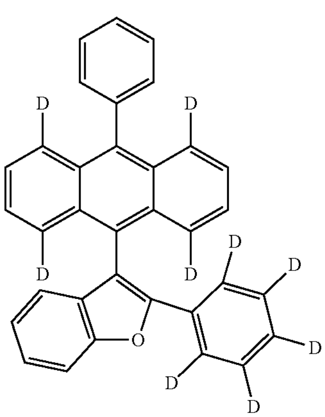
-continued
A-36
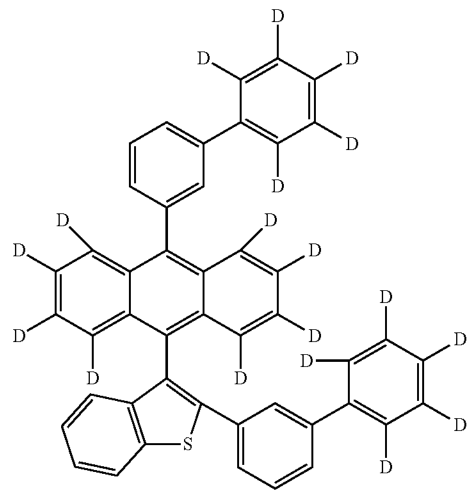
A-37
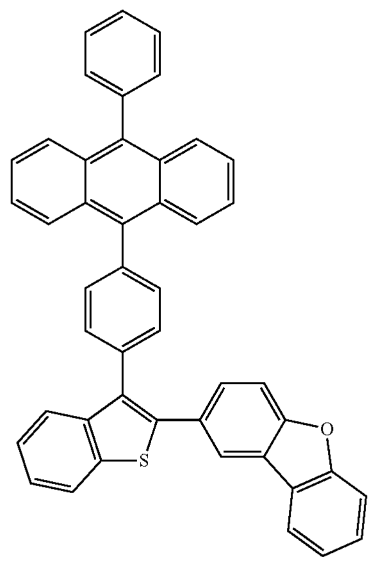
A-38
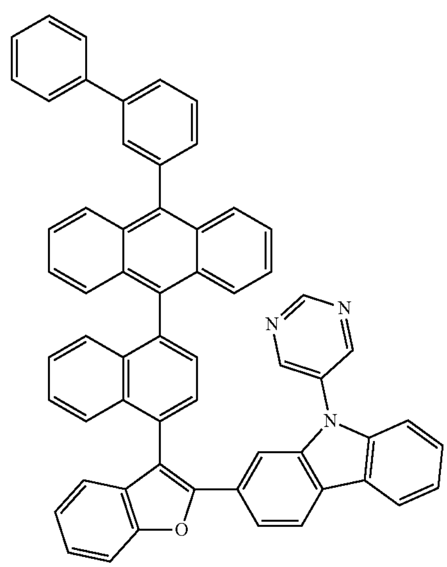

-continued
A-39
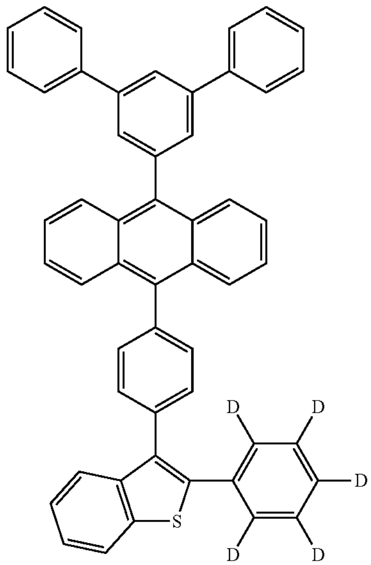
A-40
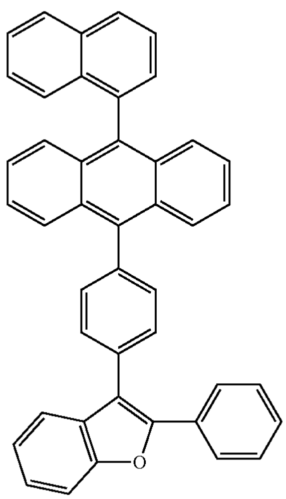
A-41
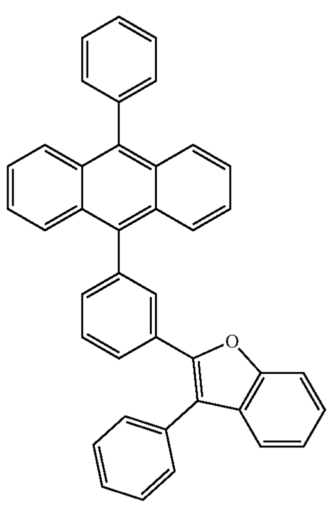
-continued
A-42
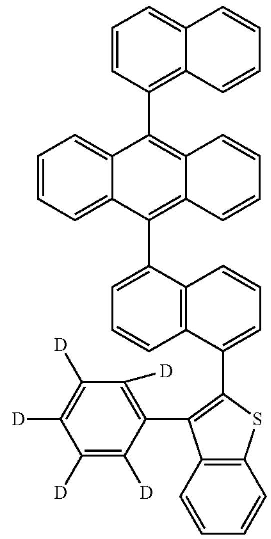
A-43
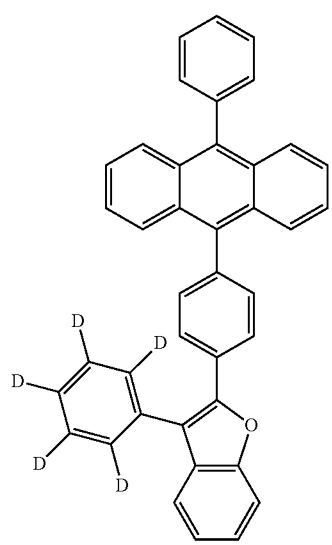

-continued
A-44
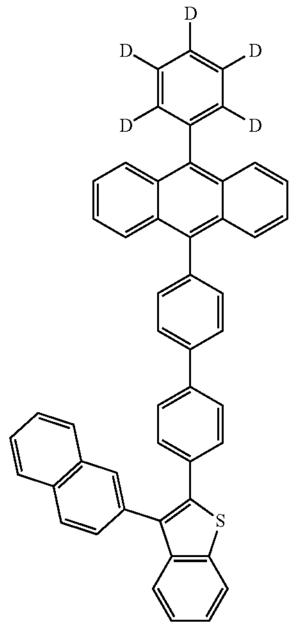
A-45
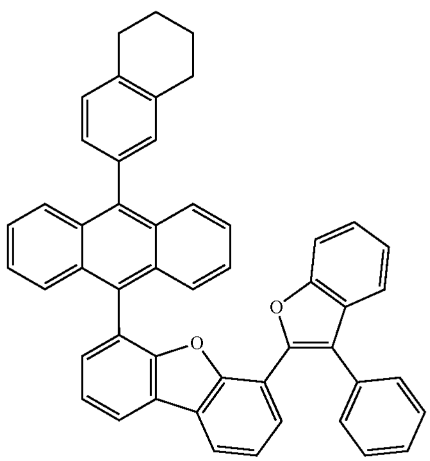
A-46
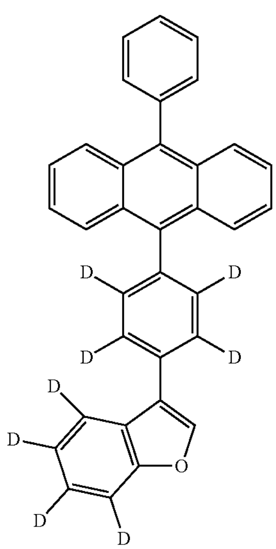
-continued
A-47
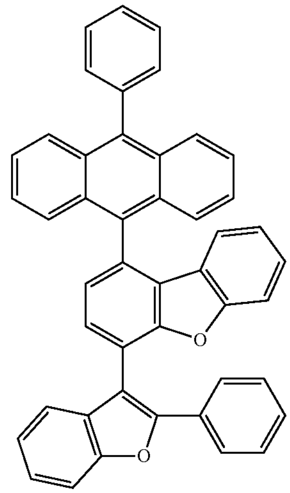
A-48
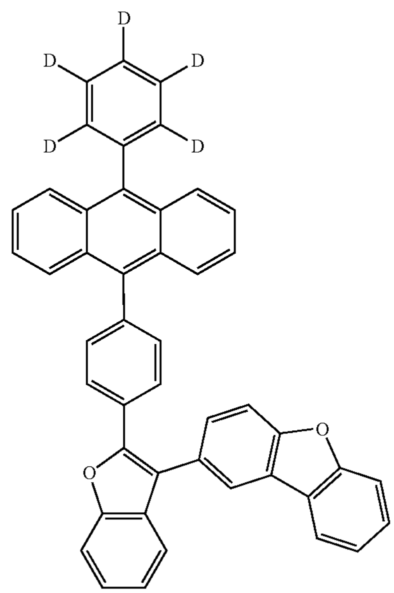
A-49
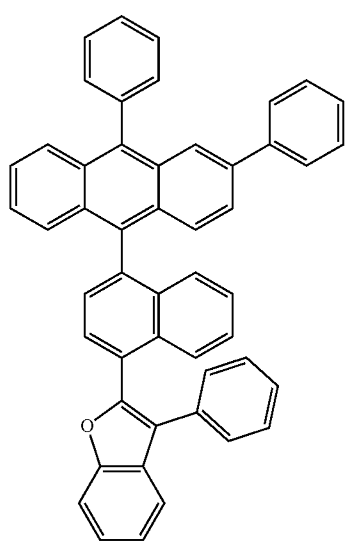

-continued
A-50
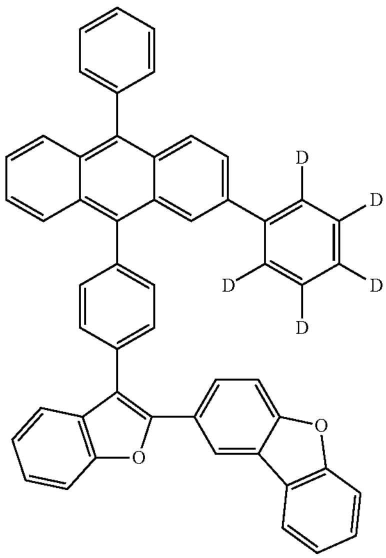
A-51
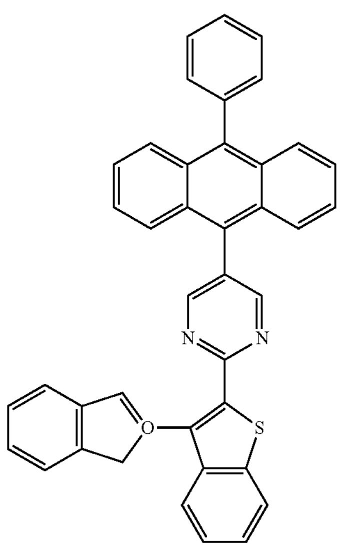
-continued
A-52
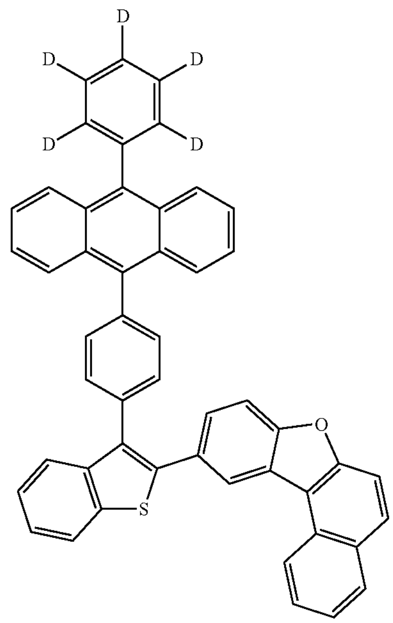
A-53
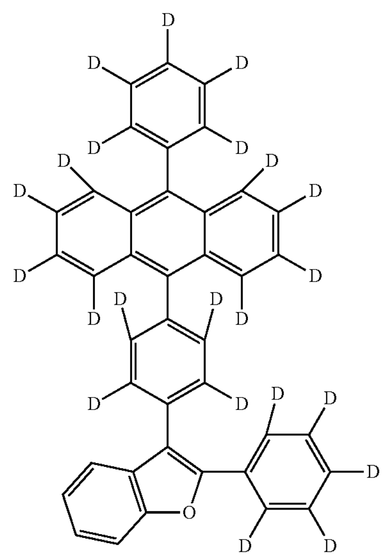
A-54
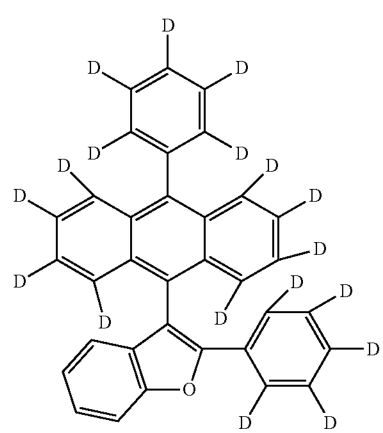

-continued
A-55
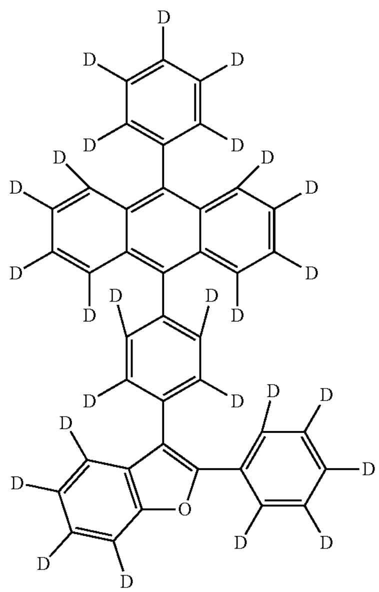
A-56
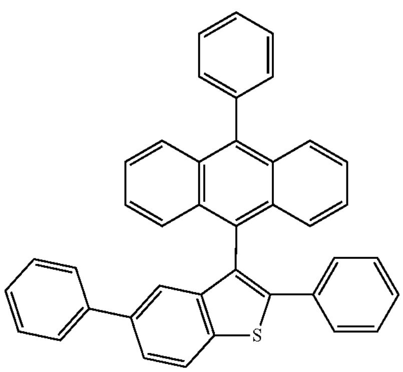
A-57
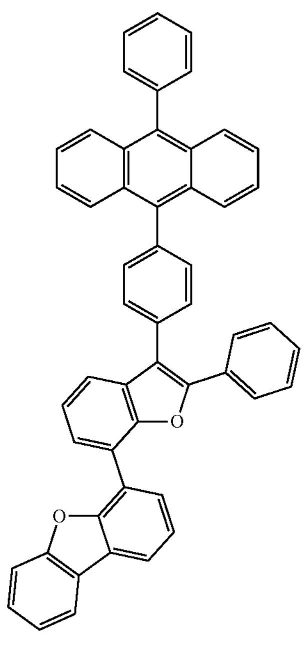
-continued
A-58
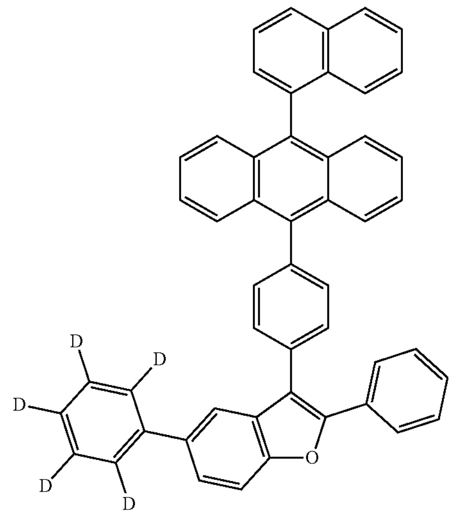
A-59
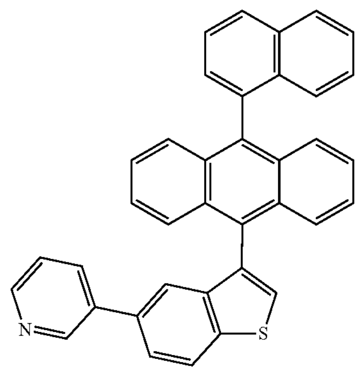
A-60
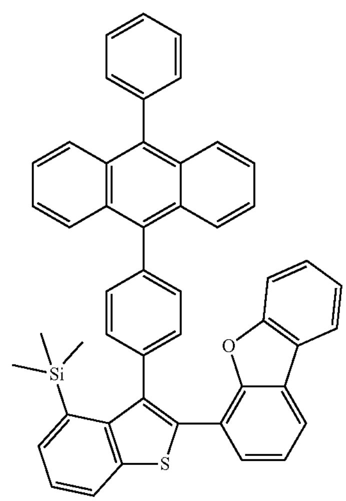

-continued
A-61
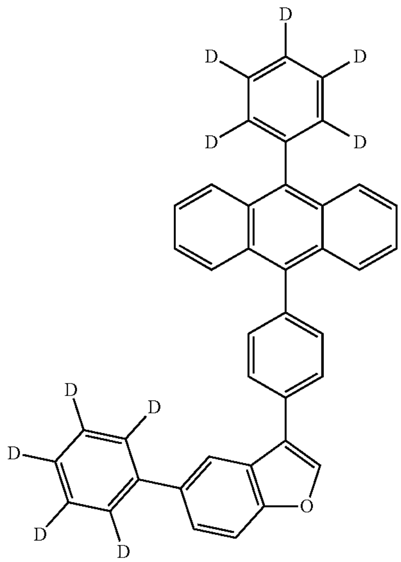
A-62
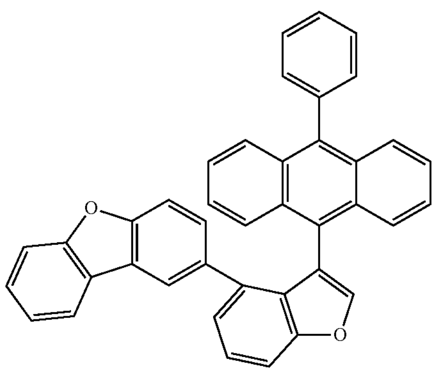
A-63
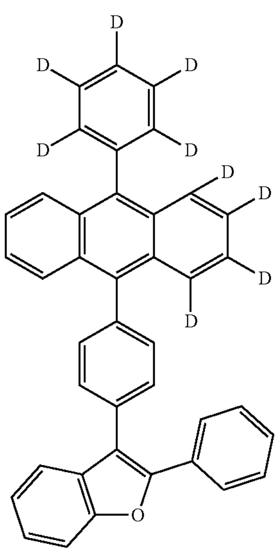
-continued
A-64
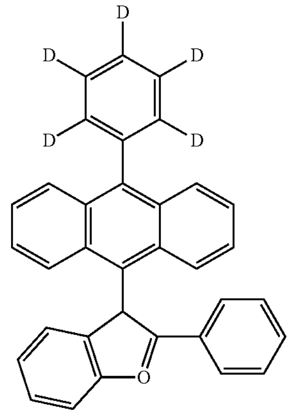
A-65
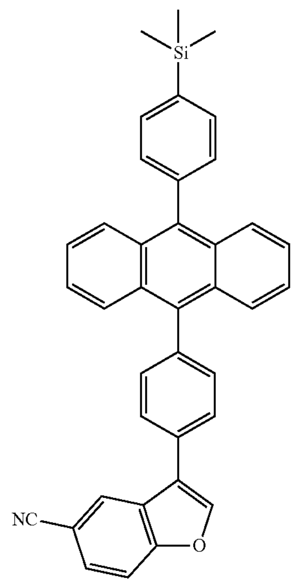
A-66
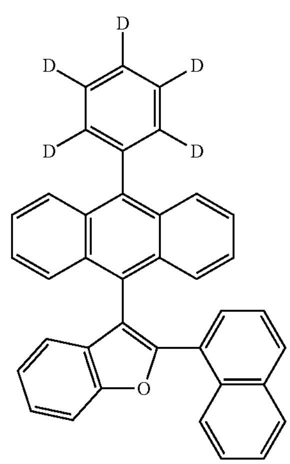

-continued
A-67
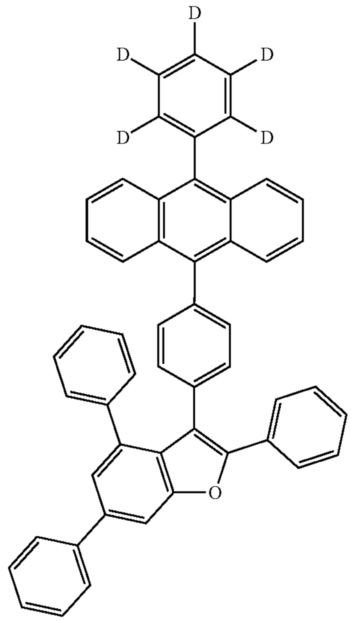
A-68
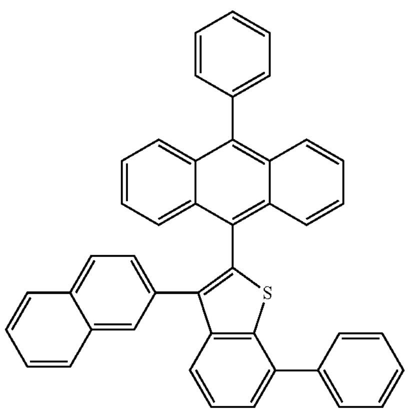
A-69
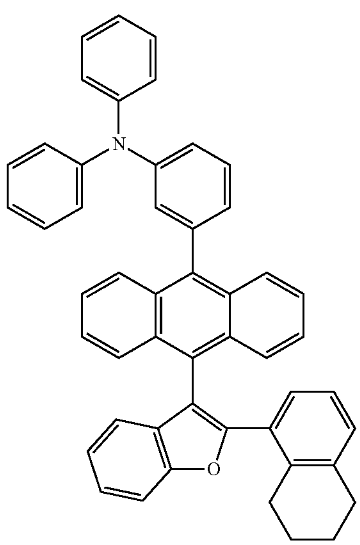
-continued
A-70
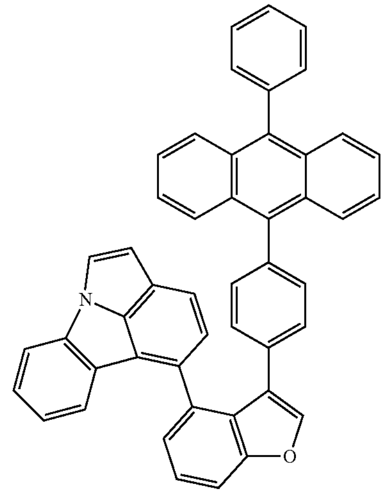
A-71
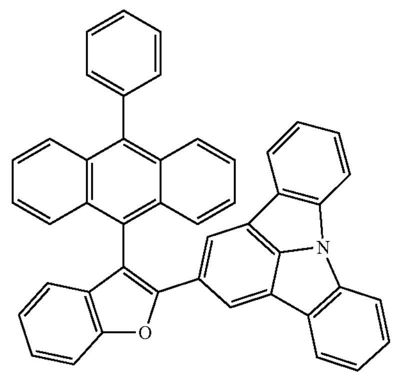
A-72
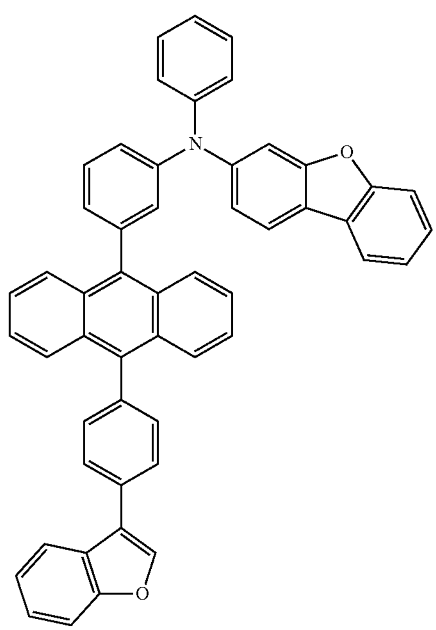

-continued
A-73
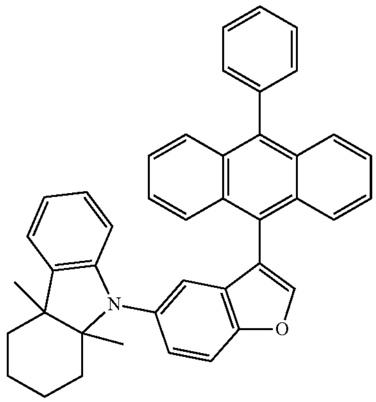
A-74
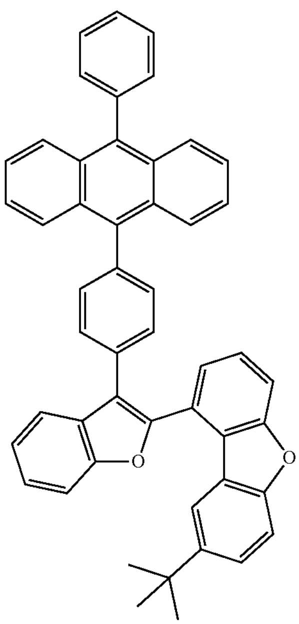
A-75
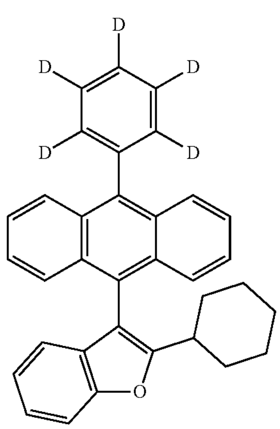
-continued
A-76
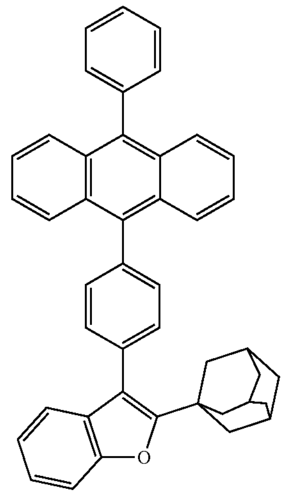
A-77
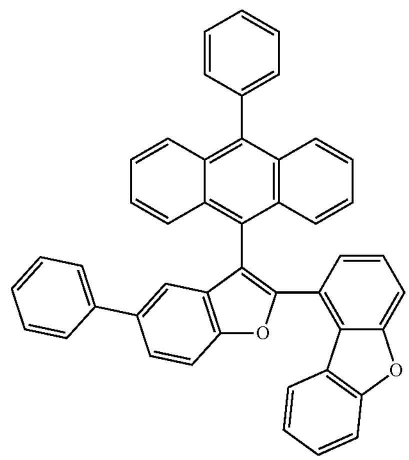
A-78
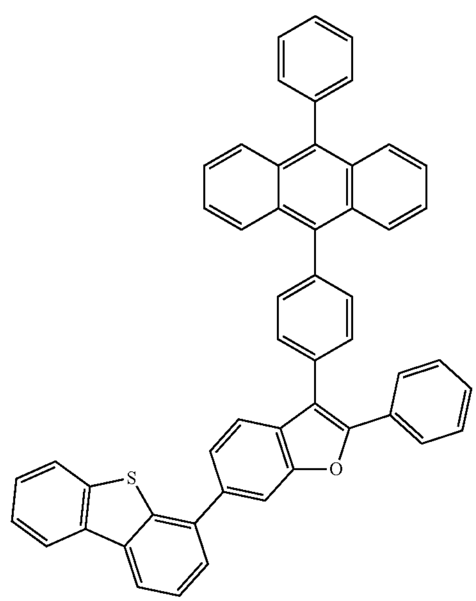

-continued
A-79
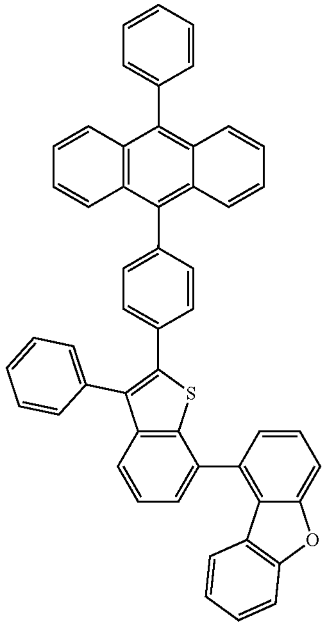
A-80
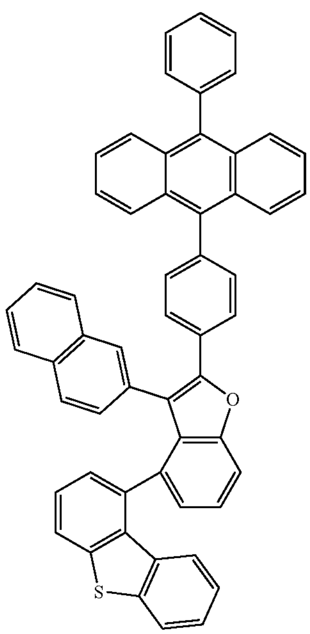
-continued
A-81
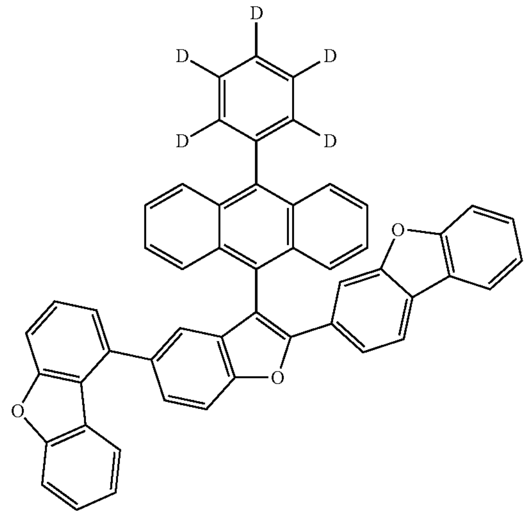
A-82
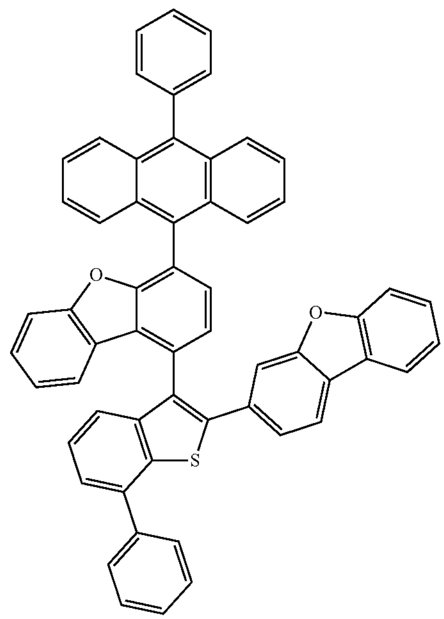
A-83
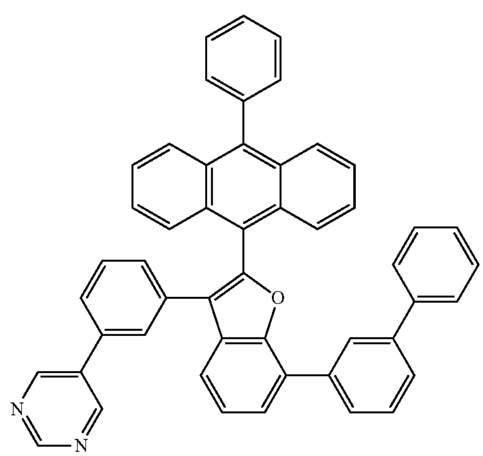

-continued
A-84
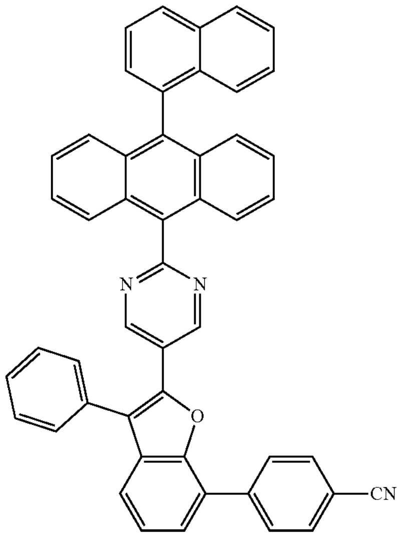
A-85
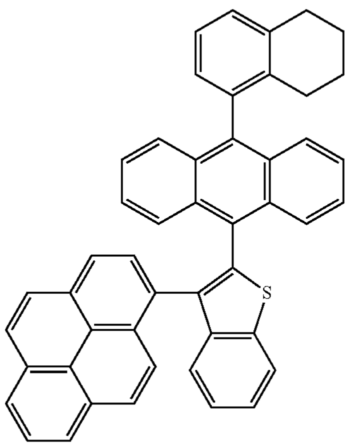
A-86
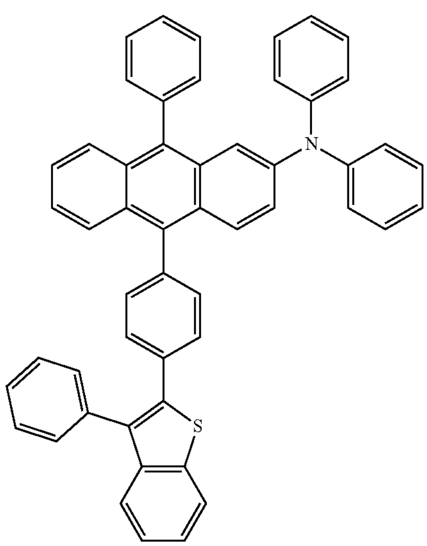
-continued
A-87
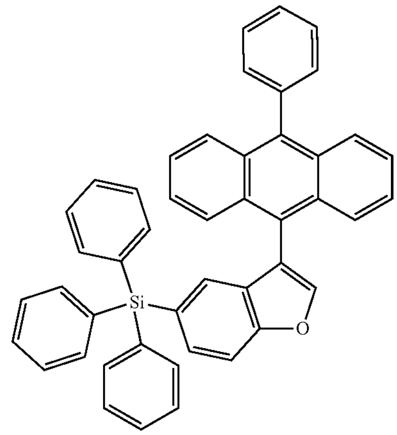
A-88
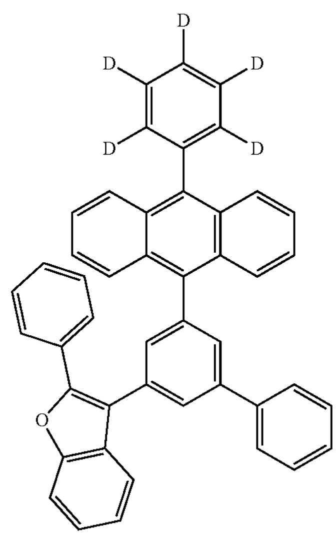
A-89
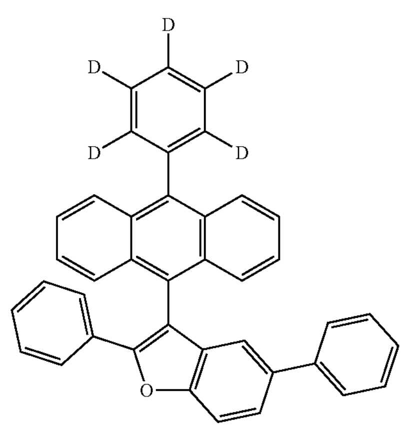

-continued
A-90
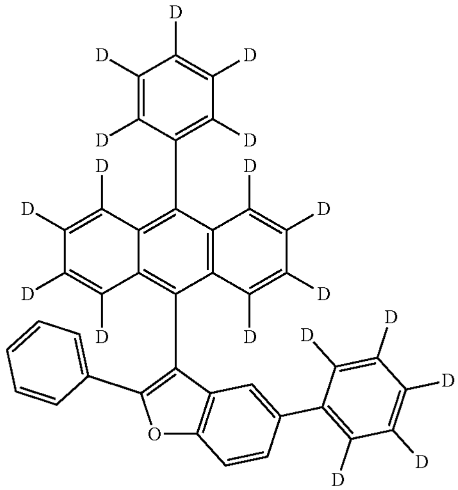
A-91
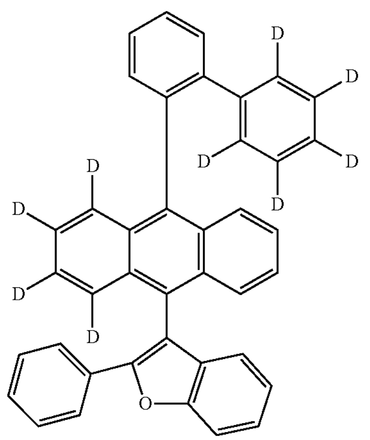
A-92
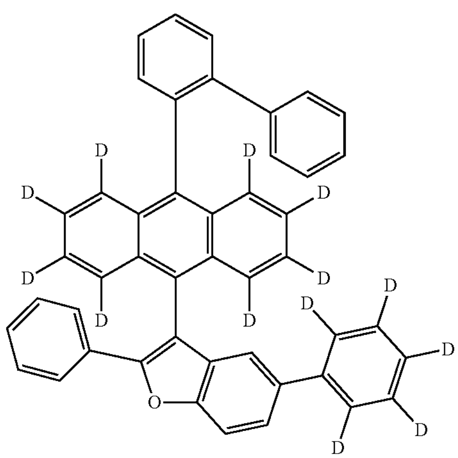
A-93
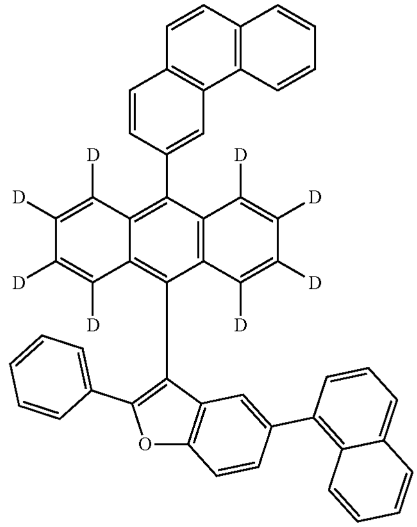
A-94
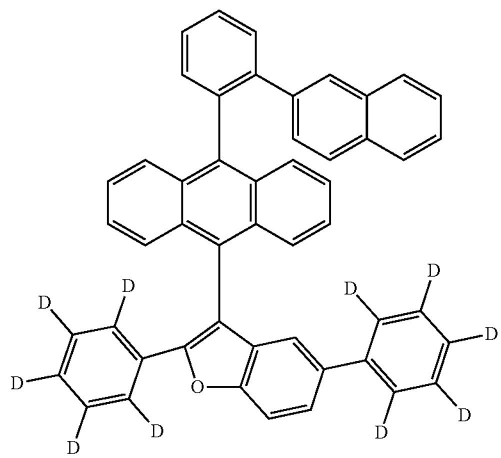
A-95
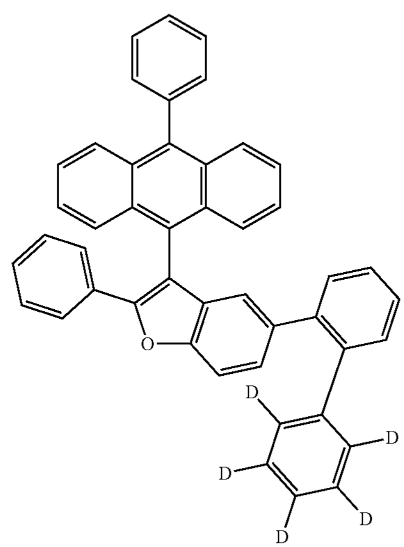

-continued
A-96
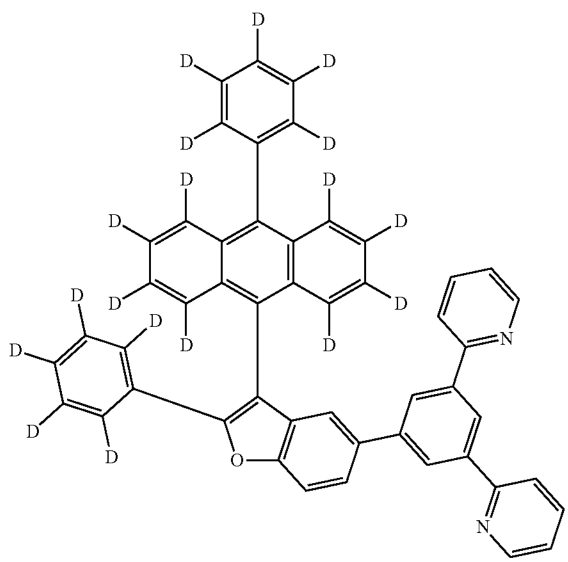
A-97
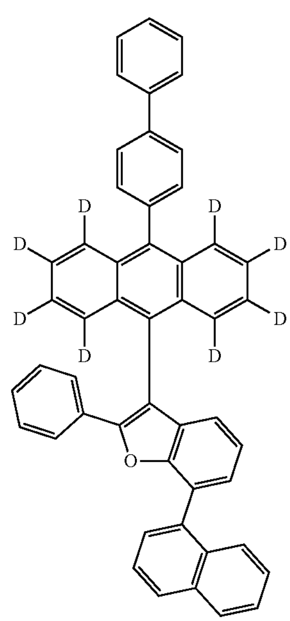
-continued
A-98
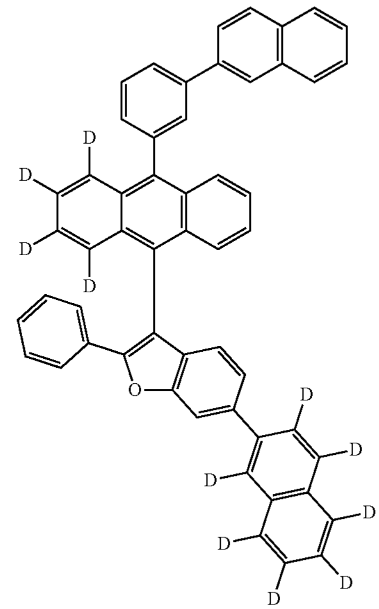
A-99
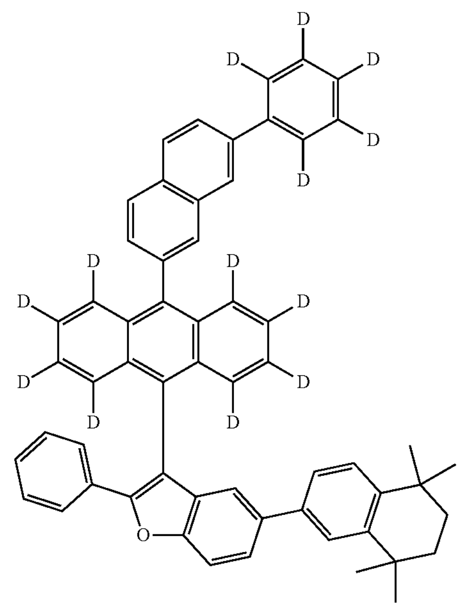
A-100
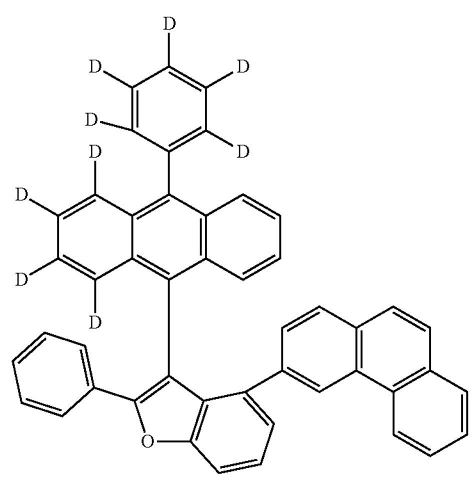

-continued
A-101
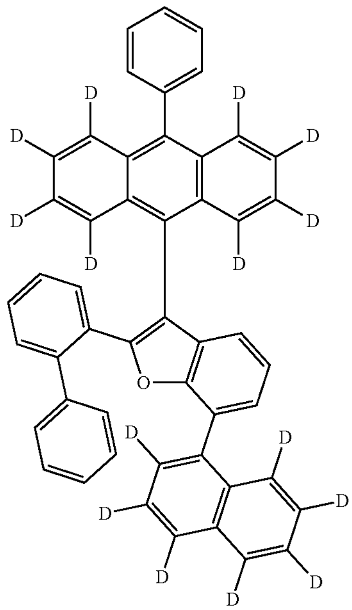
A-102
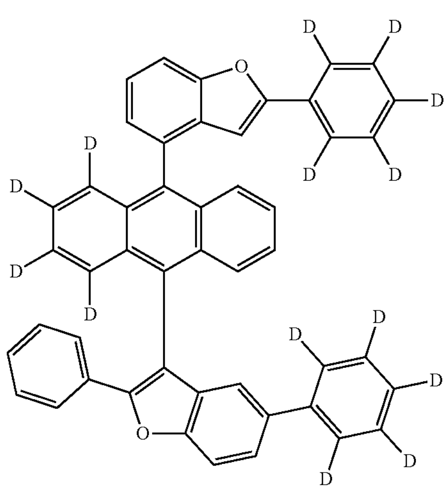
-continued
A-103
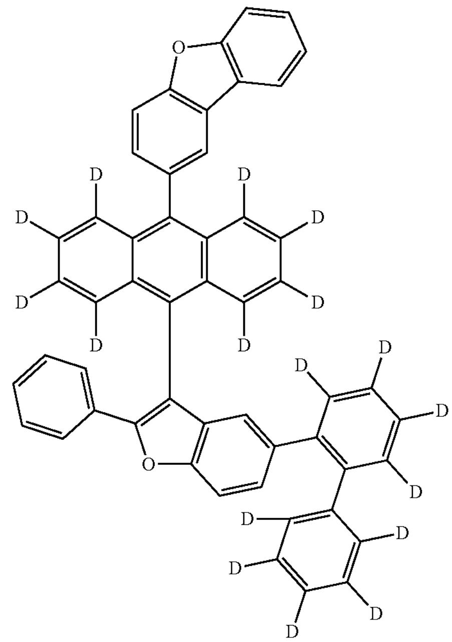
A-104
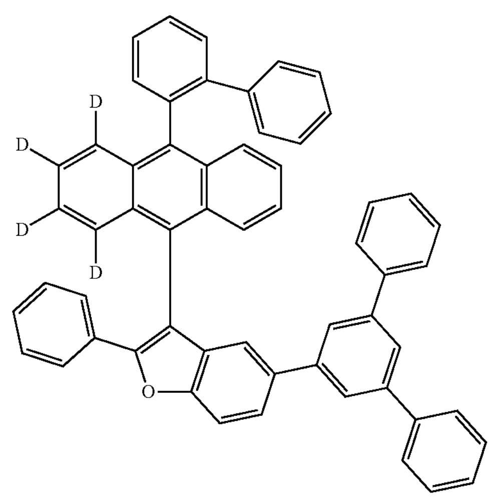

-continued
A-105
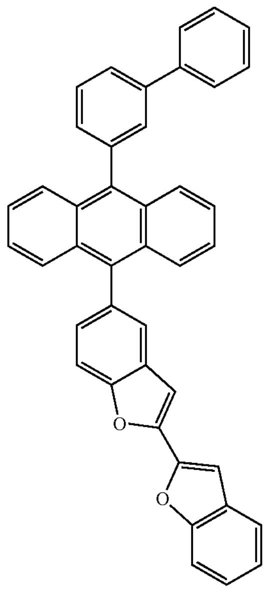
A-106
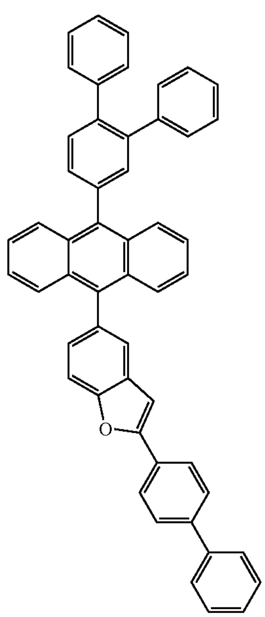
A-107
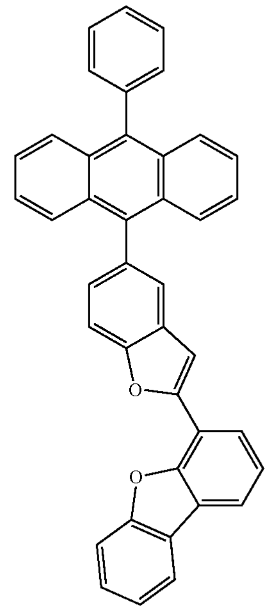
A-108
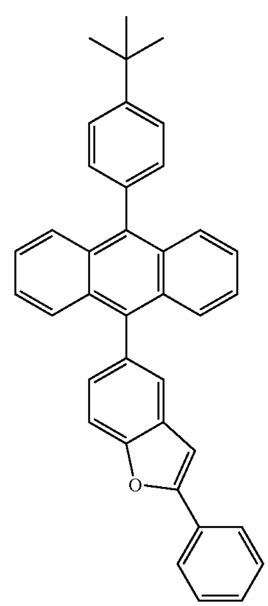

-continued
A-109
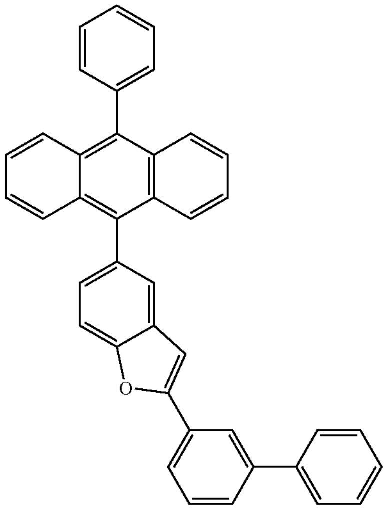
A-110
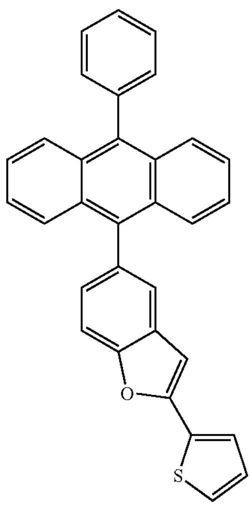
A-111
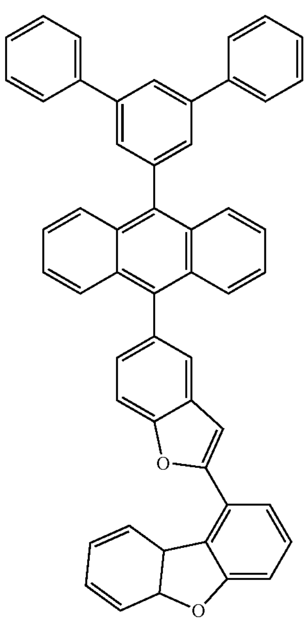
-continued
A-112
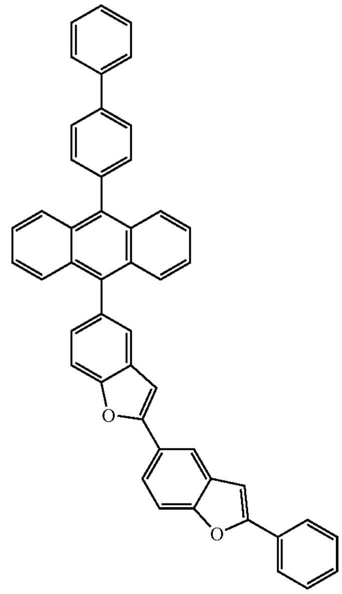
A-113
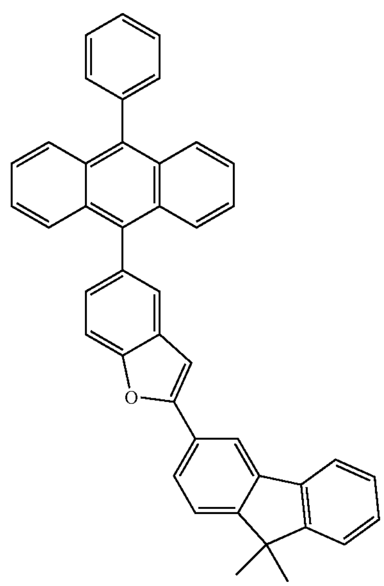

-continued
A-114
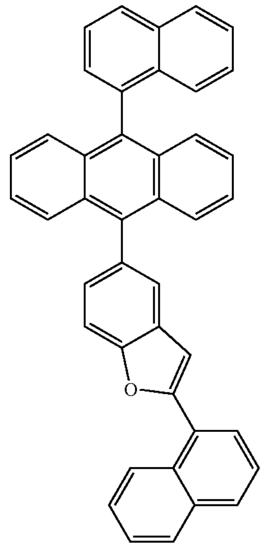
A-115
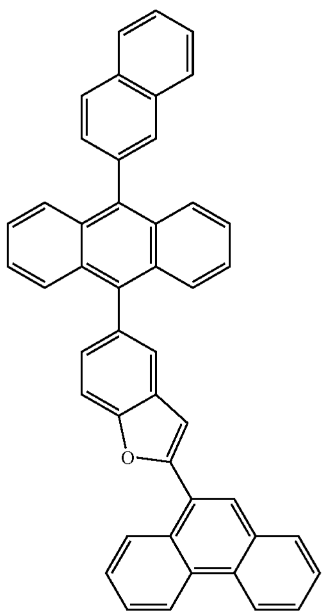
A-116
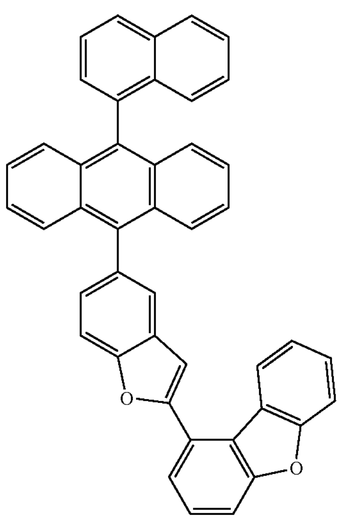
-continued
A-117
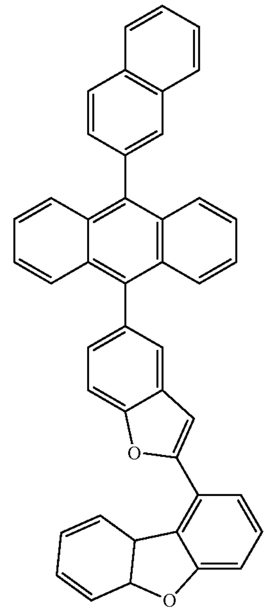
A-118
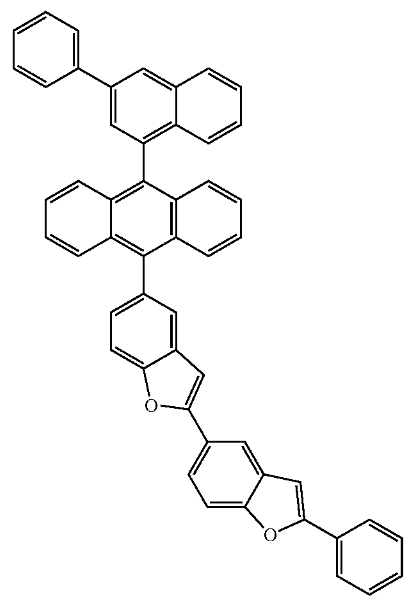
A-119
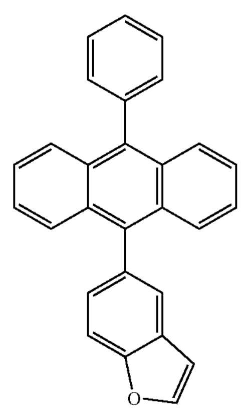

-continued
A-120
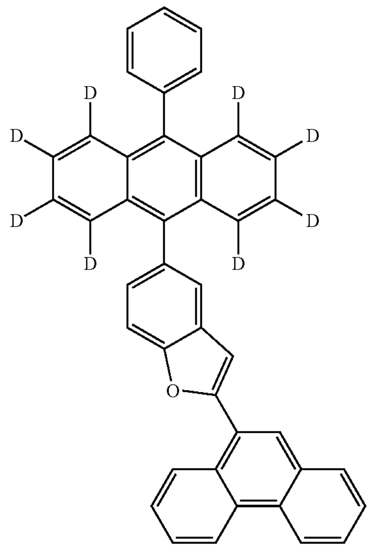
A-121
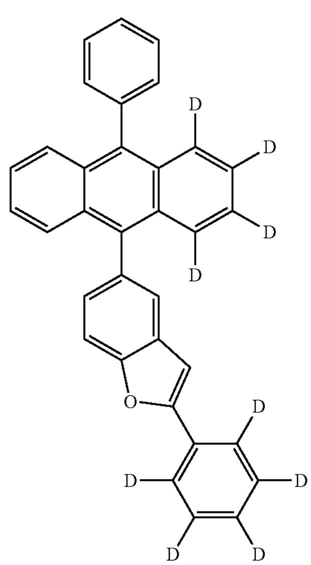
-continued
A-122
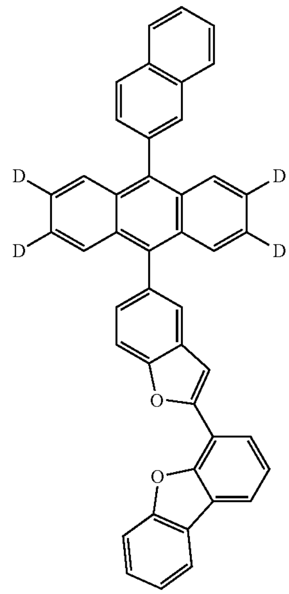
A-123
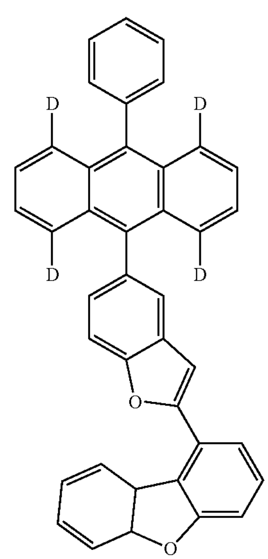

A-124
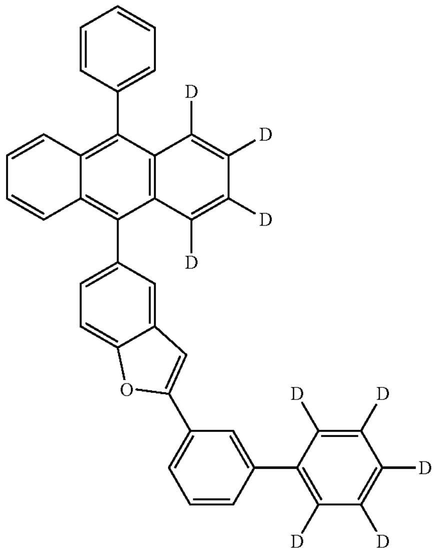
A-125
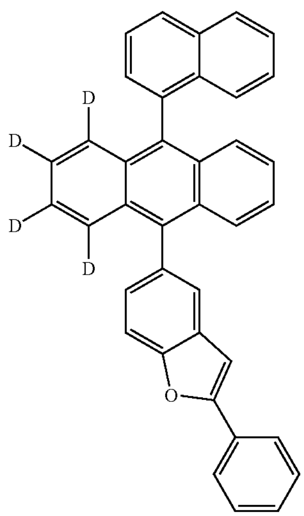
A-126
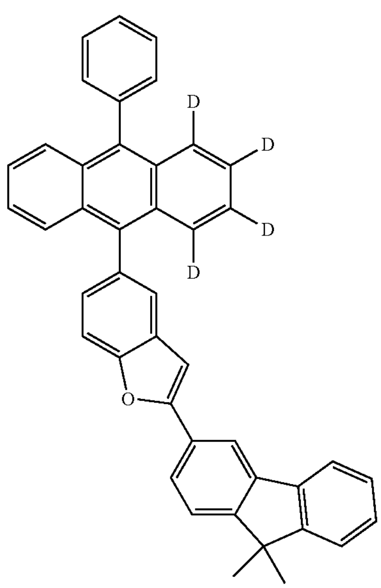
A-127
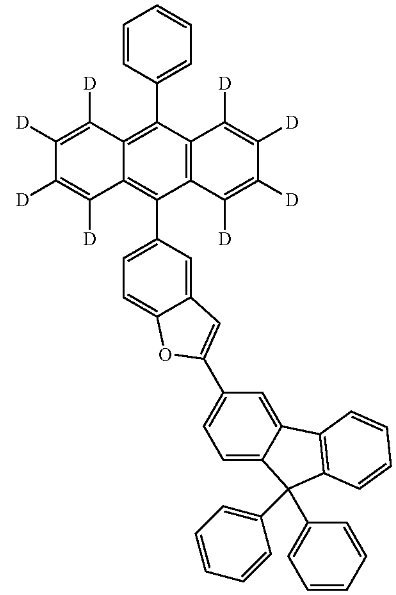
A-128
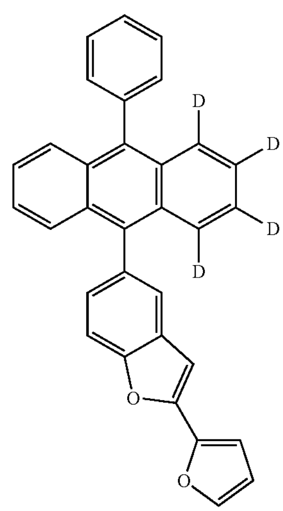

A-129
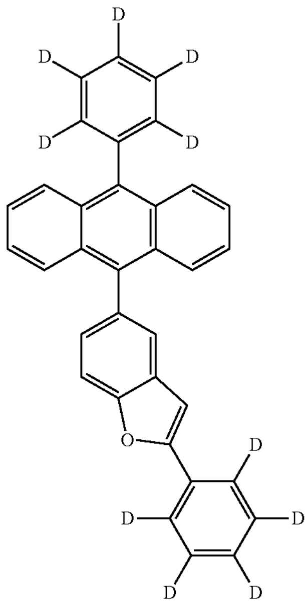
A-130
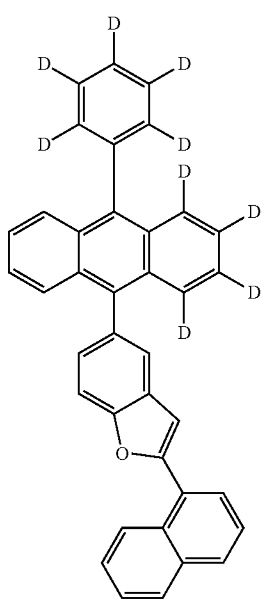
A-131
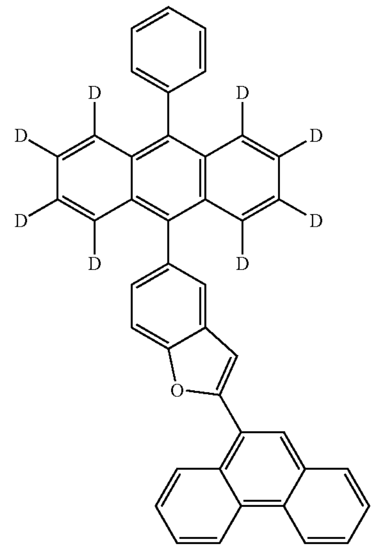
A-132
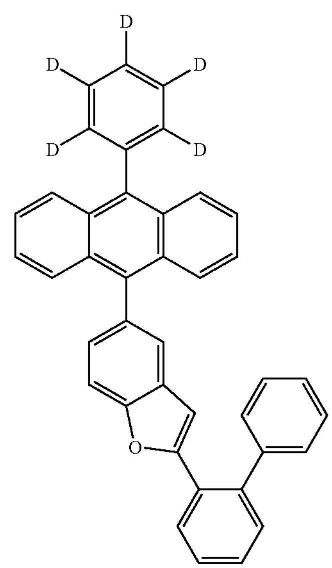

-continued
A-133
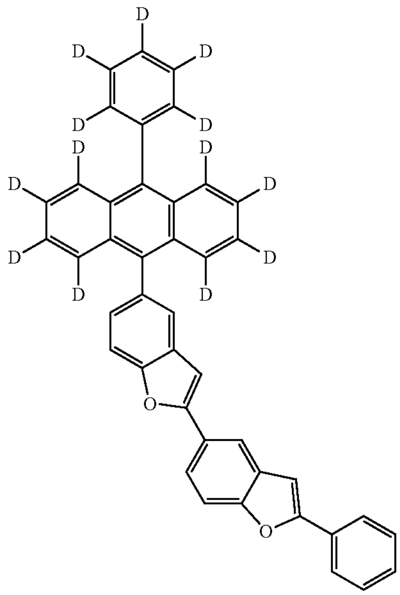
A-134
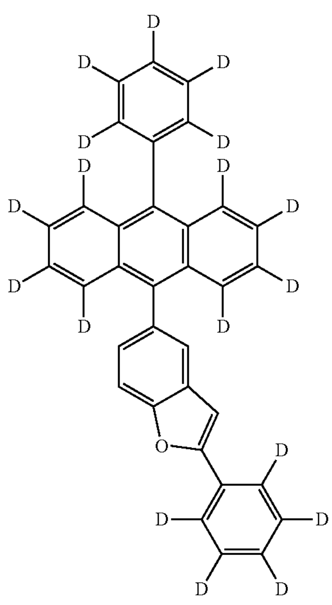
-continued
A-135
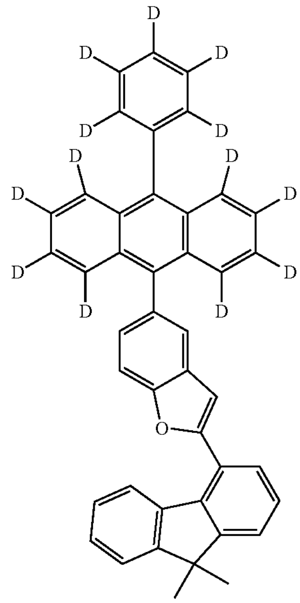
A-136
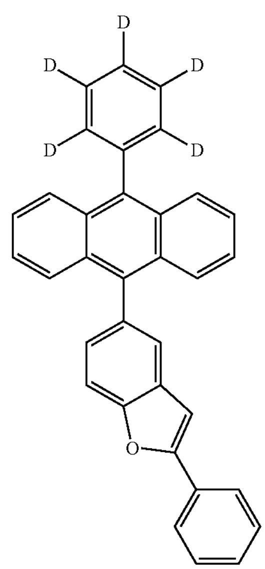

-continued
A-137
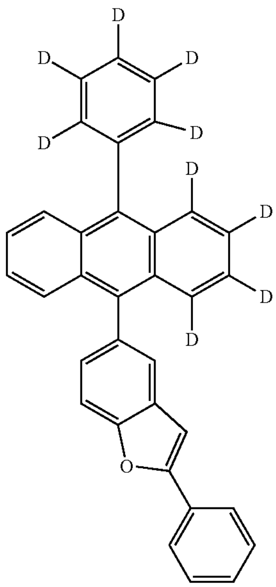
A-138
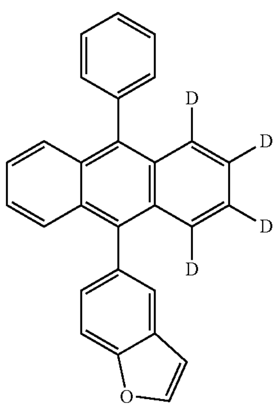
A-139
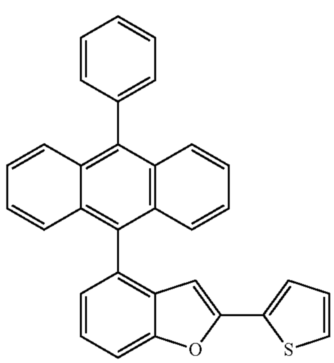
-continued
A-140
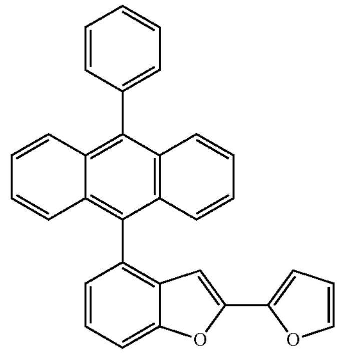
A-141
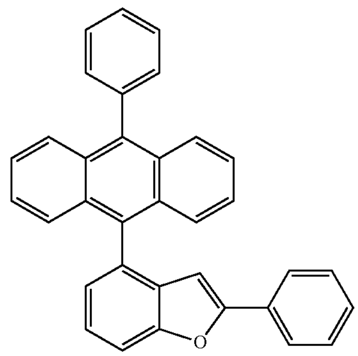
A-142
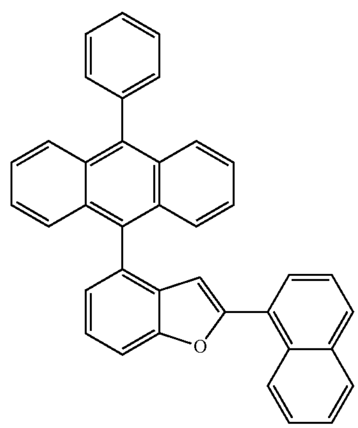
A-143
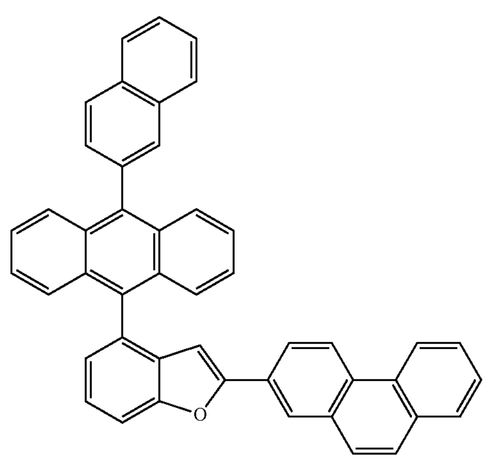

-continued
A-144
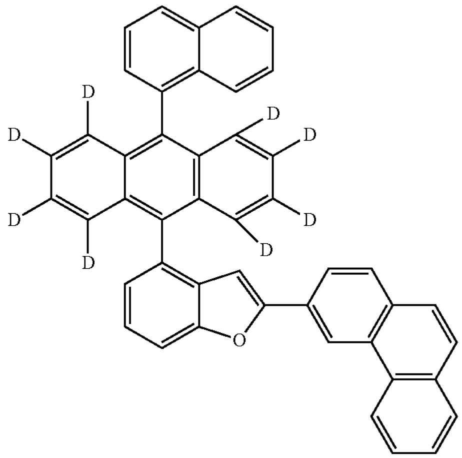
A-145
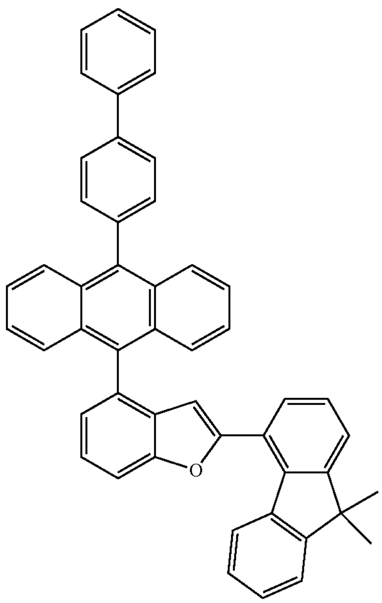
A-146
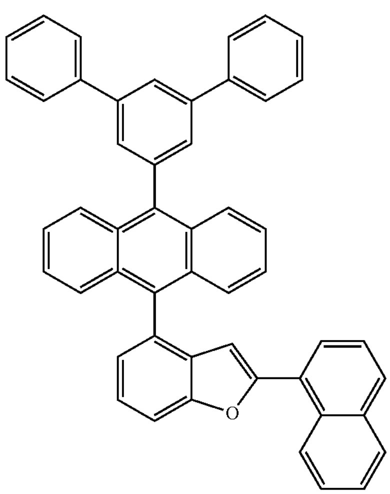
-continued
A-147
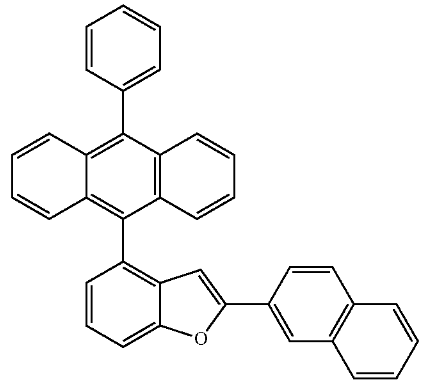
A-148
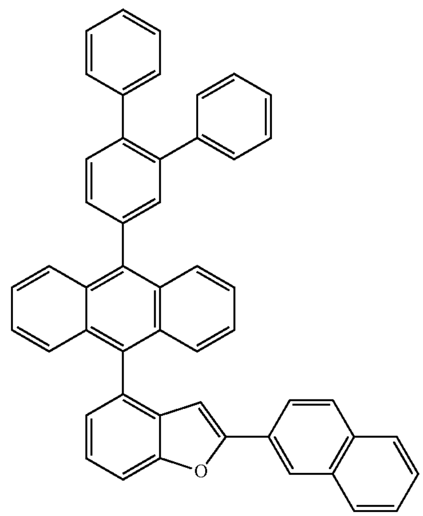
A-149
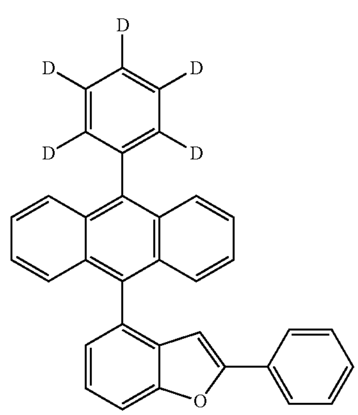

-continued
A-150
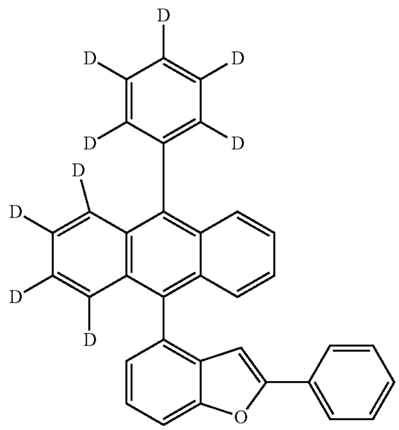
A-151
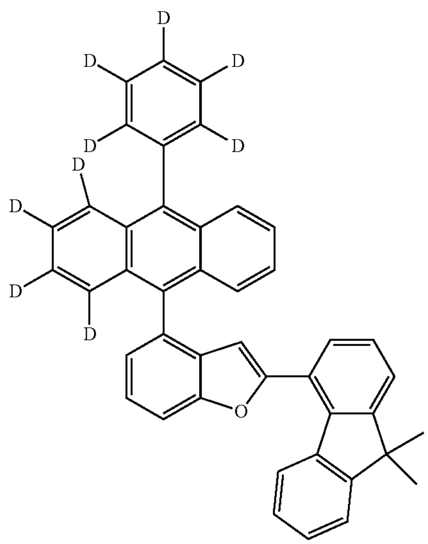
A-152
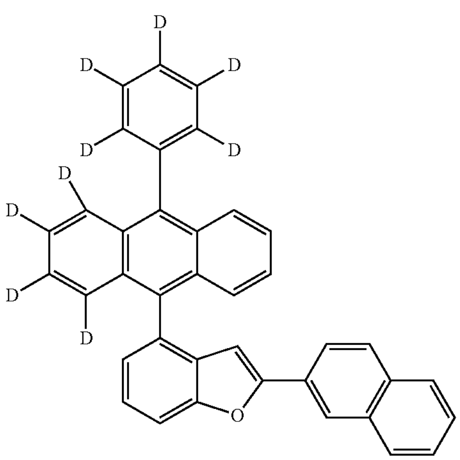
-continued
A-153
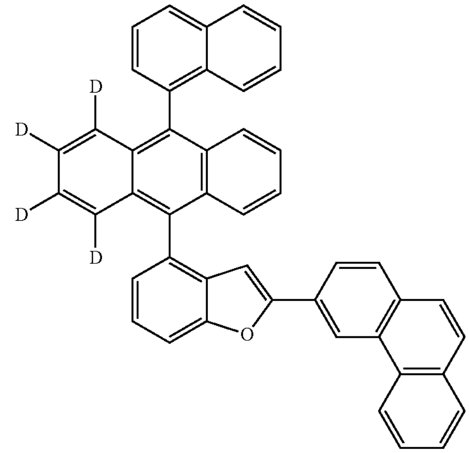
A-154
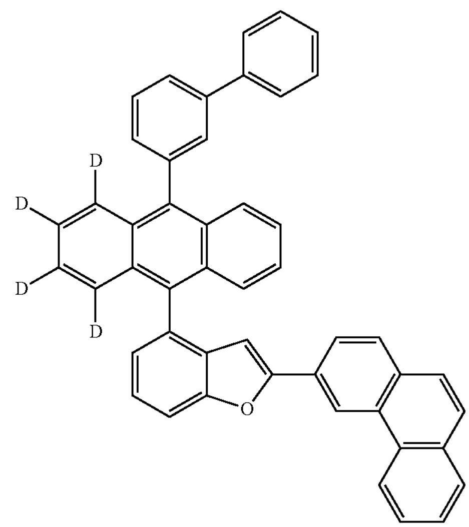
A-155
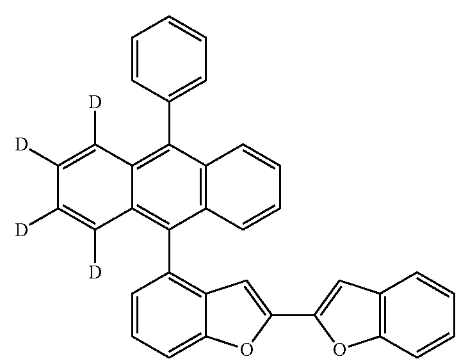

-continued
A-156
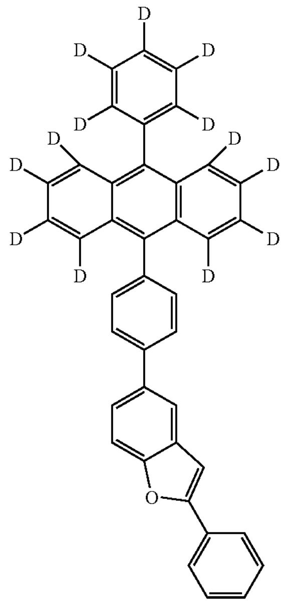
A-157
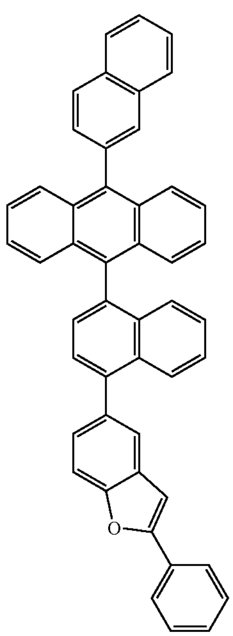
-continued
A-158
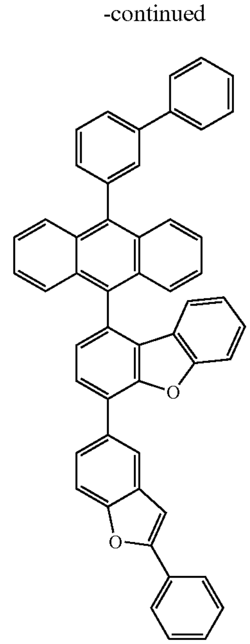
A-159
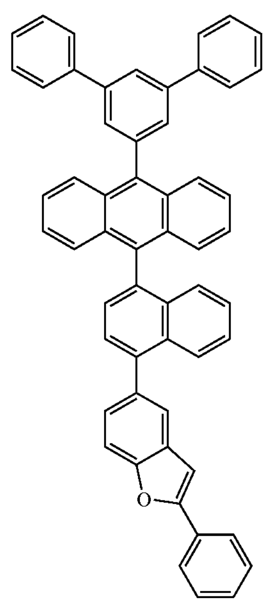

-continued
A-160
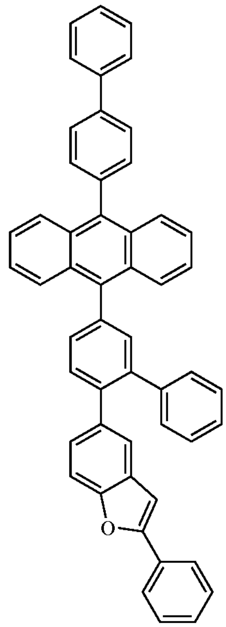
A-161
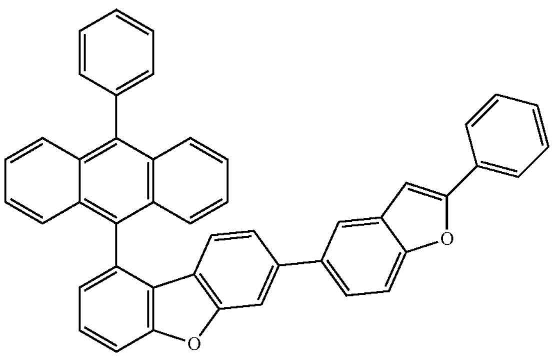
A-162
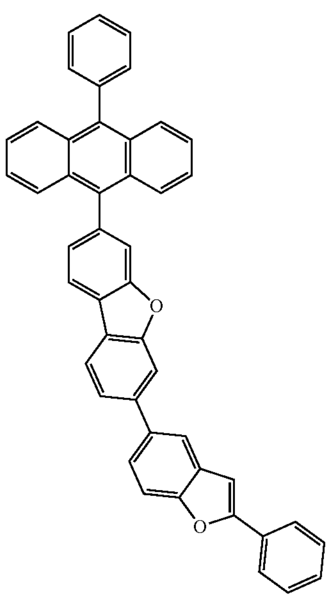
-continued
A-163
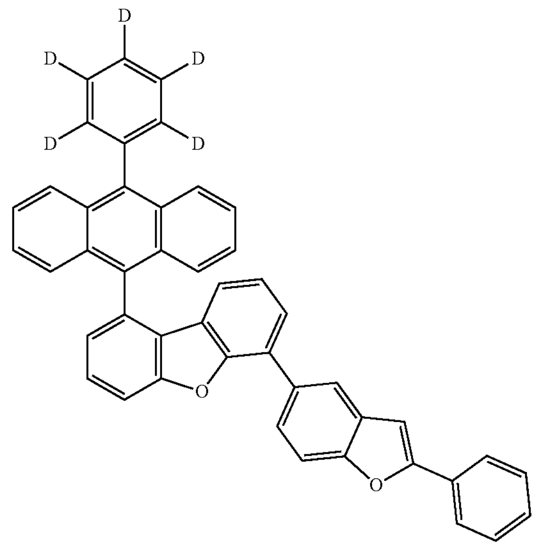
A-164
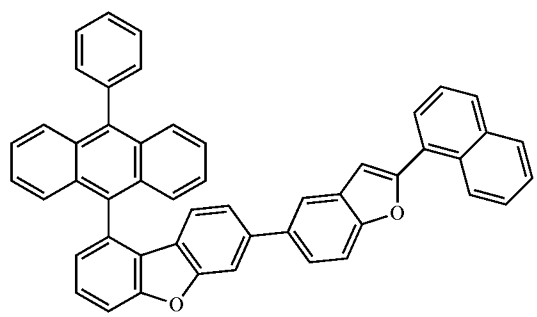
A-165
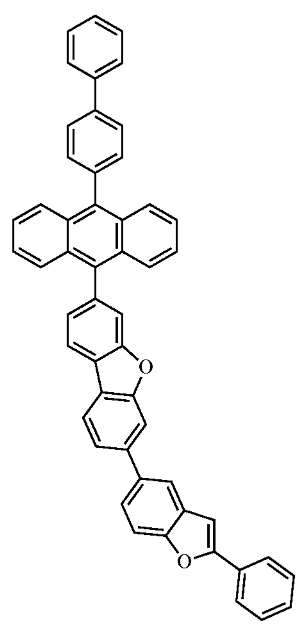

A-166
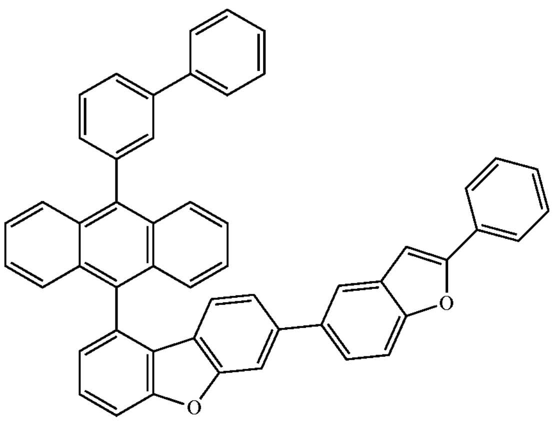
A-167
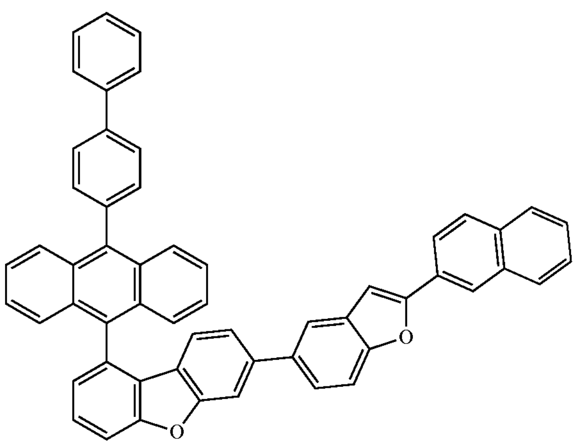
A-168
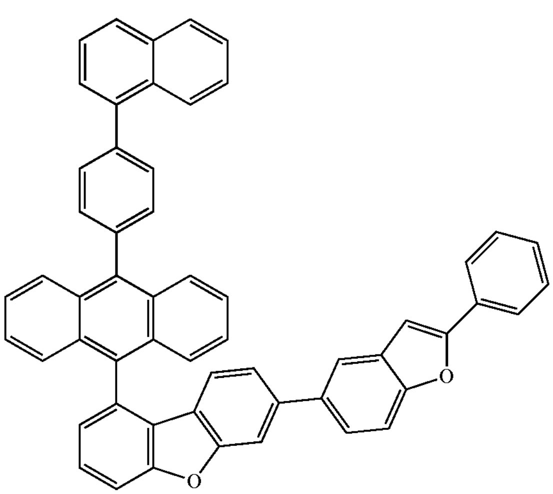
A-169
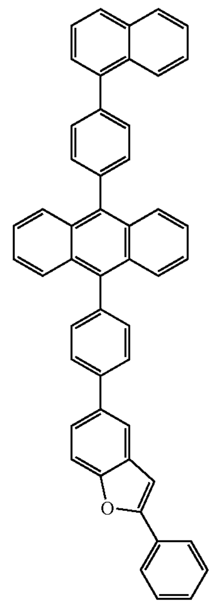
A-170
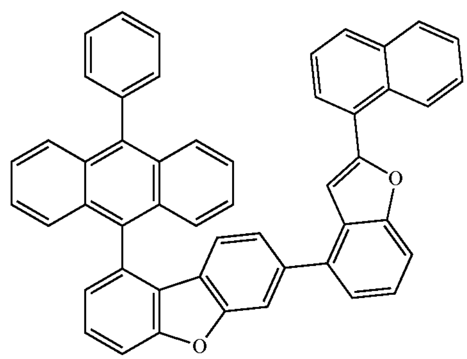
A-171
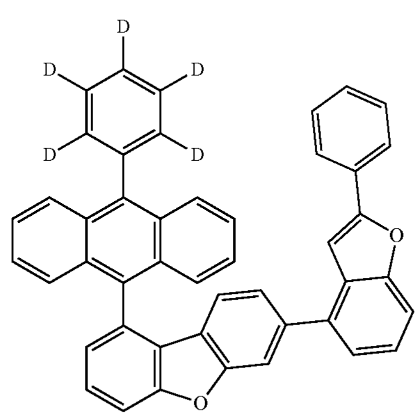

-continued
A-172
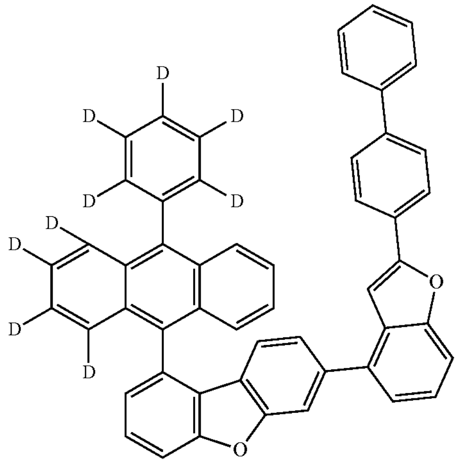
A-173
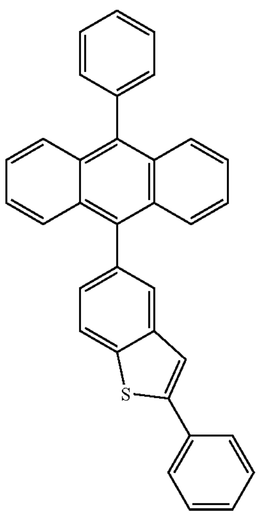
A-174
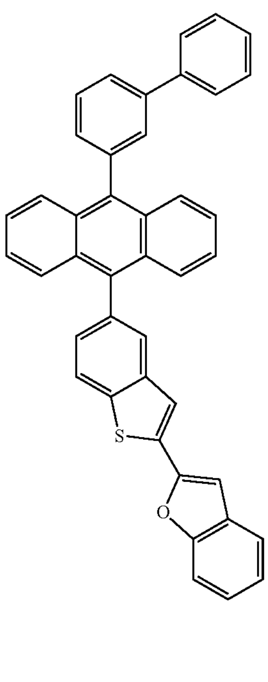
-continued
A-175
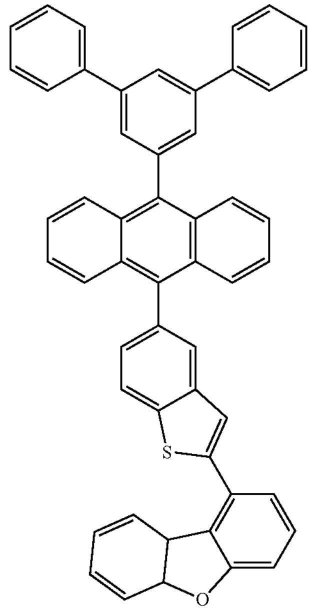
A-176
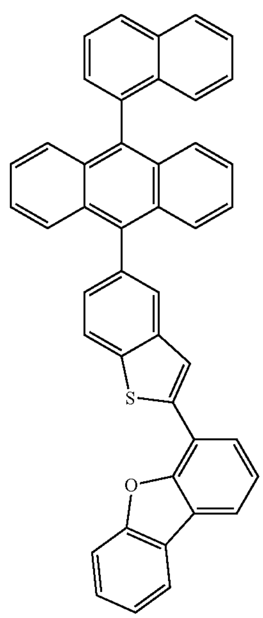

-continued
A-177
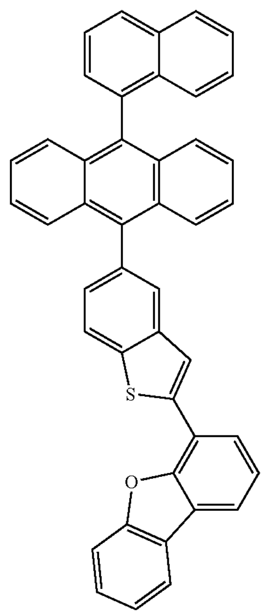
A-178
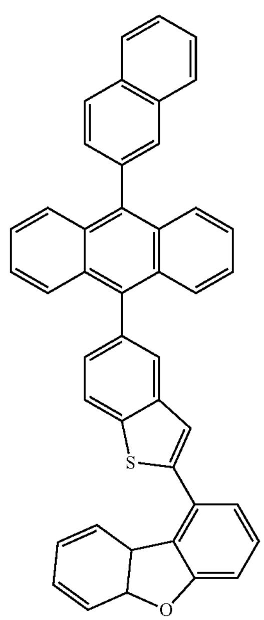
-continued
A-179
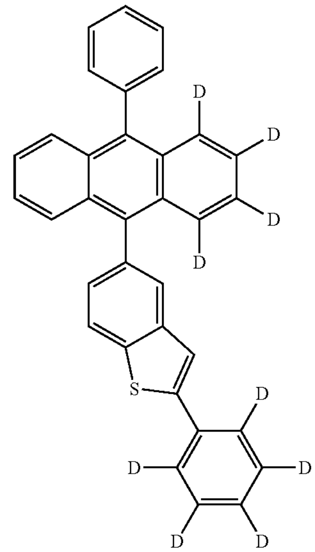
A-180
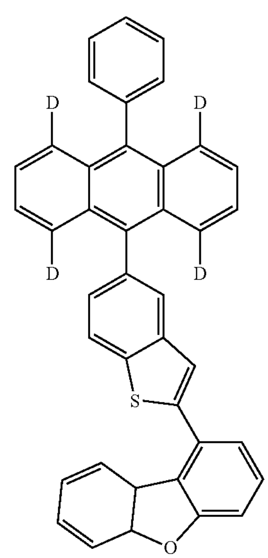

A-181
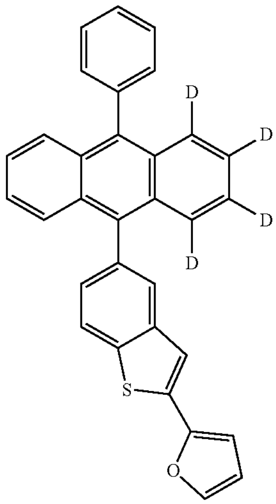
A-182
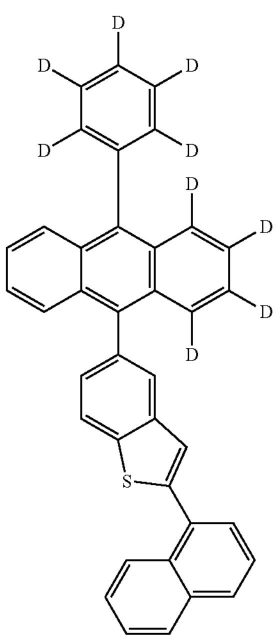
-continued
A-183
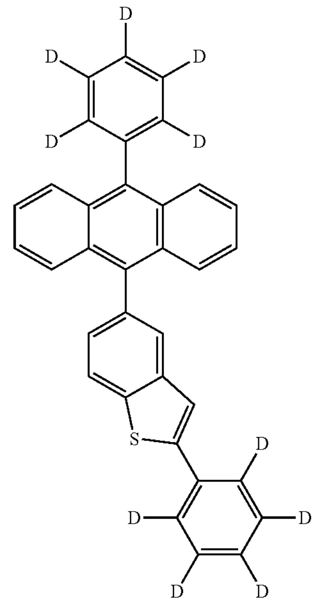
A-184
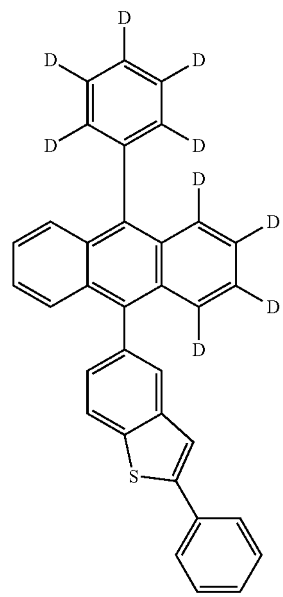
A-185
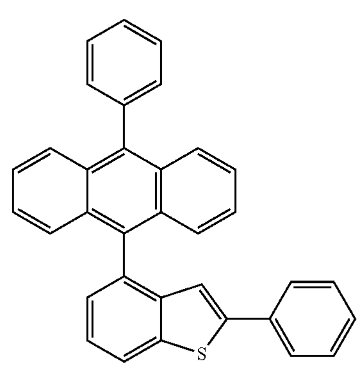

-continued
A-186
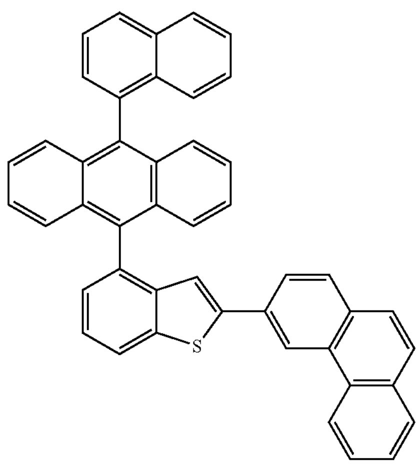
A-187
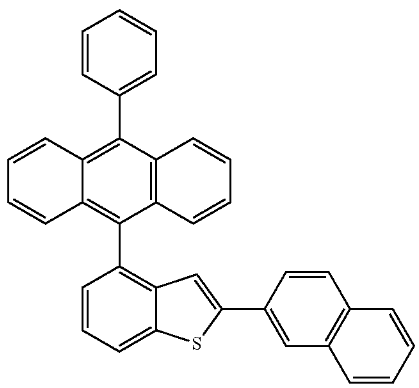
A-188
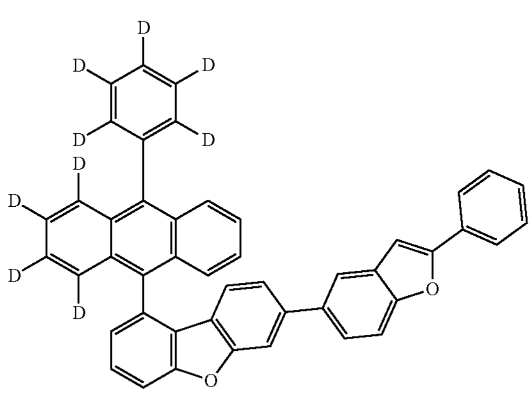
-continued
A-189
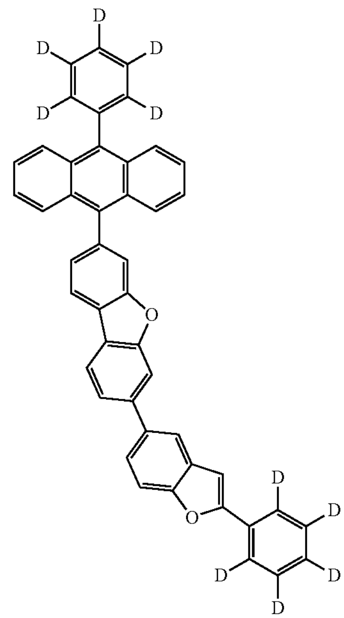
A-190
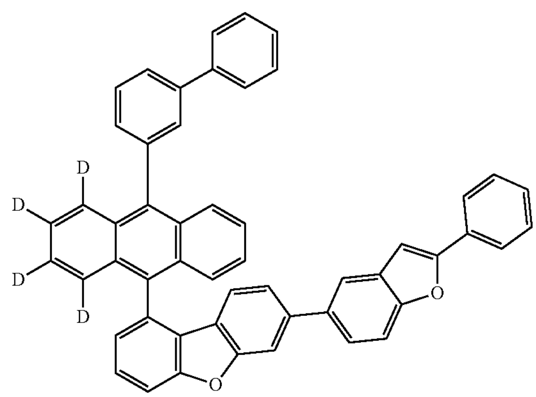
A-191
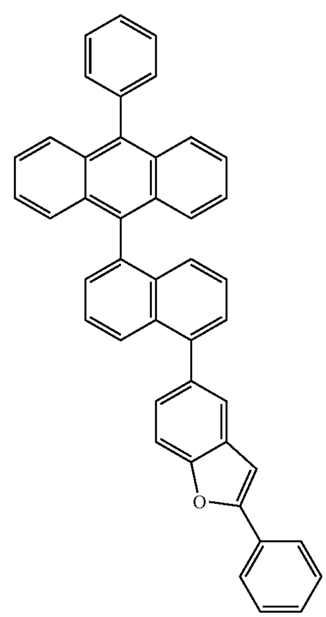

-continued
A-192
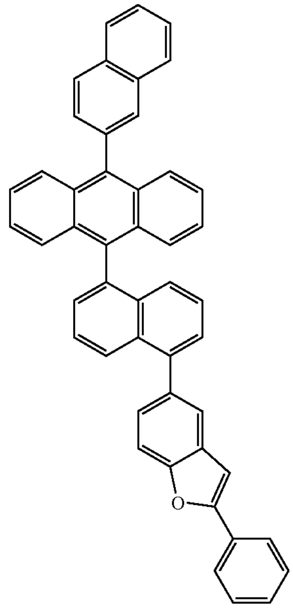
A-193
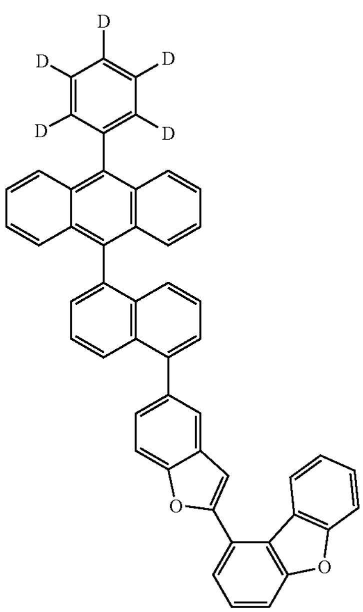
-continued
A-194
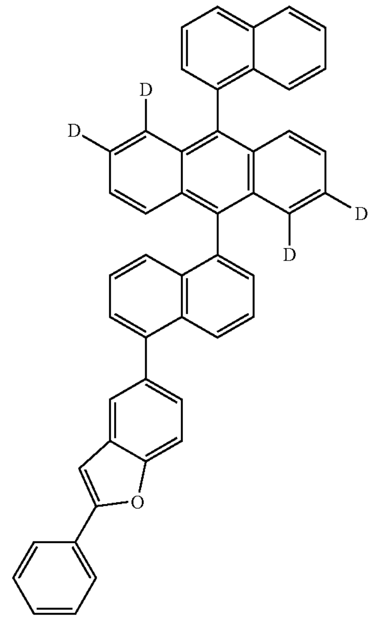
A-195
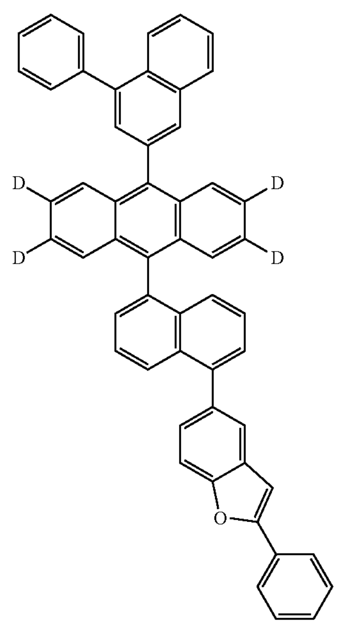

-continued
A-196
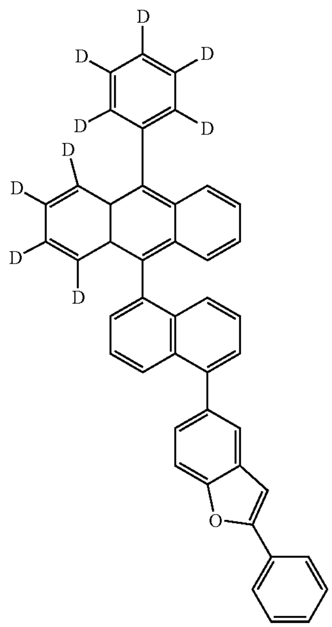
A-197
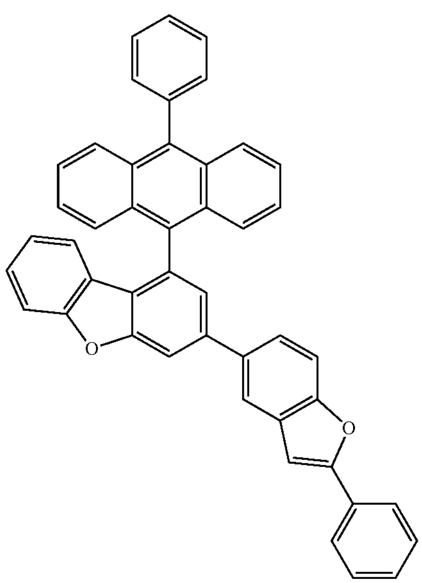
-continued
A-198
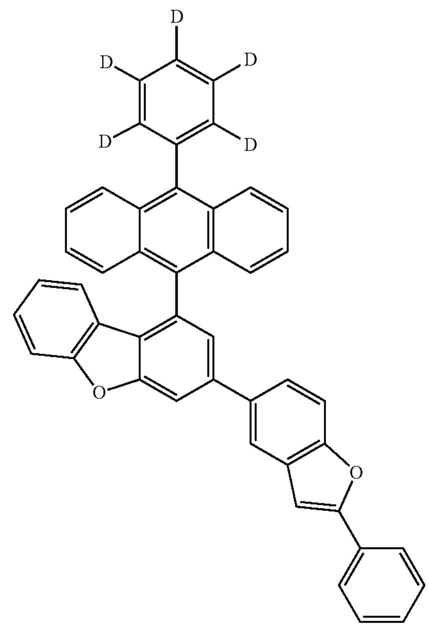
A-199
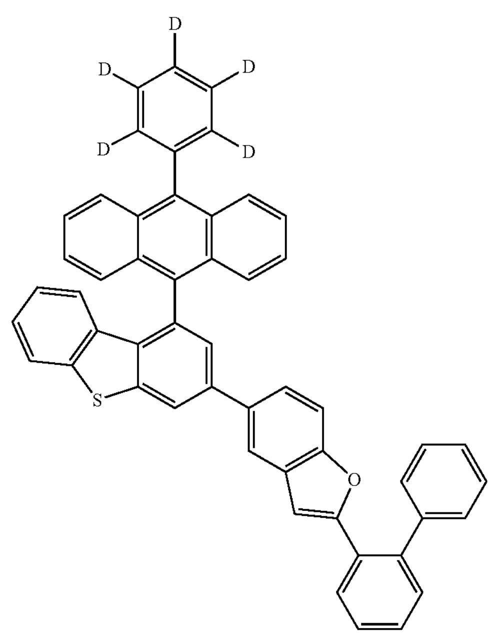

A-200
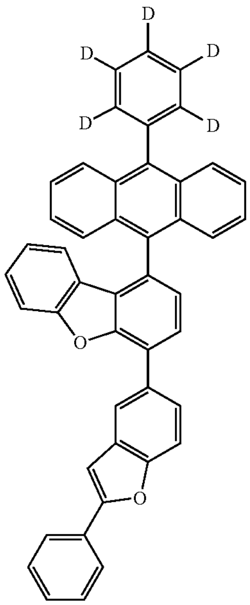
A-201
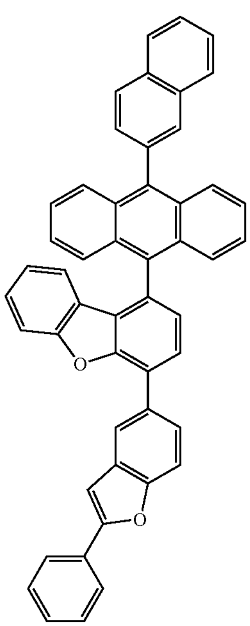
A-202
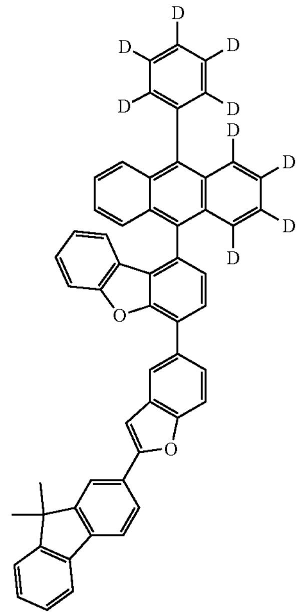
A-203
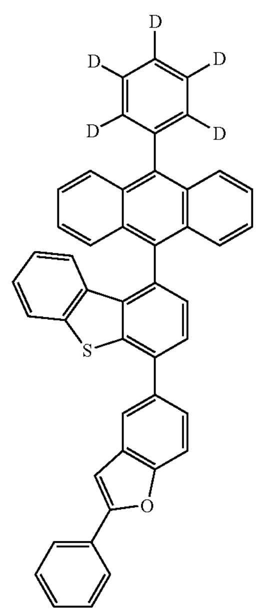

-continued
A-204
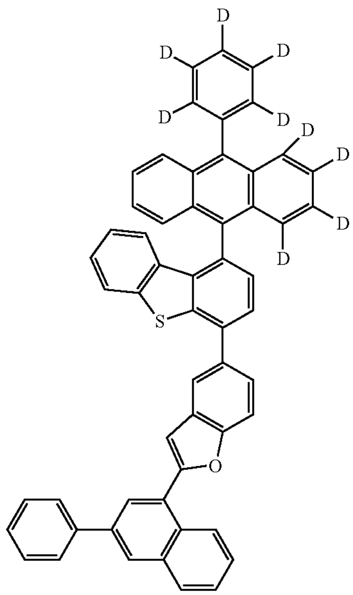
A-205
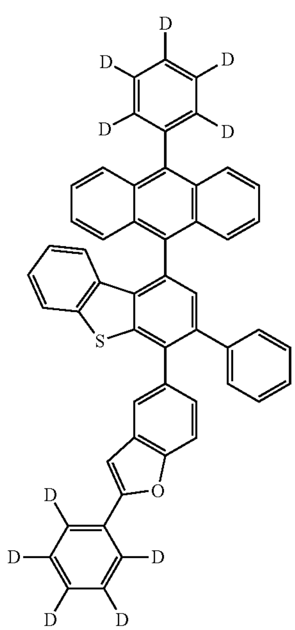
-continued
A-206
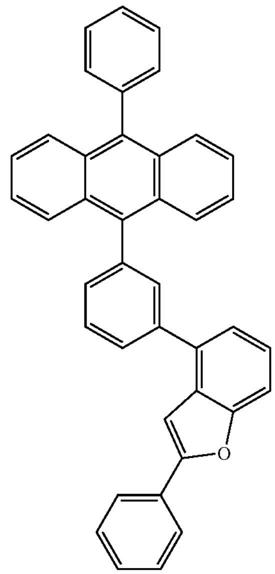
A-207
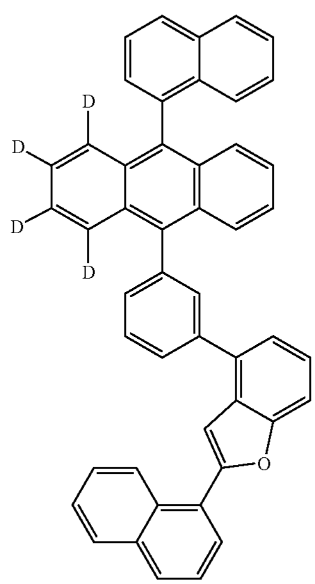

-continued
A-208
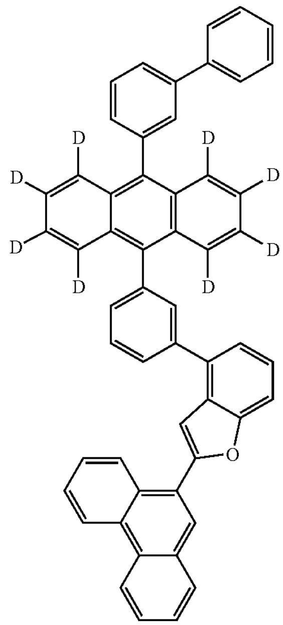
A-209
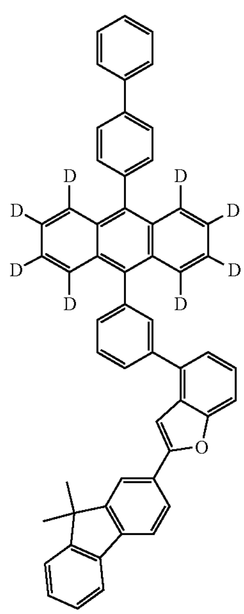
-continued
A-210
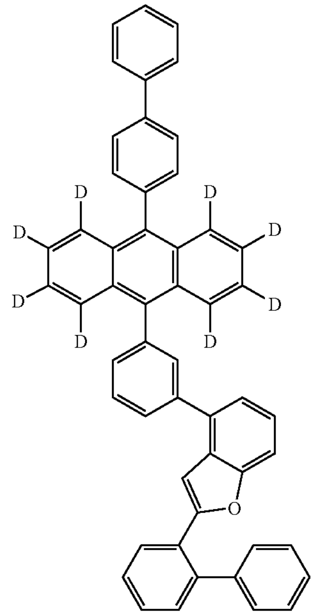
A-211
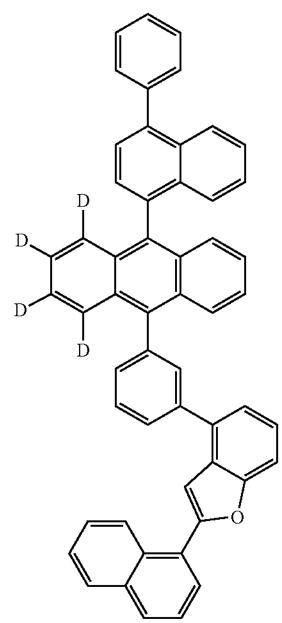

-continued
A-212
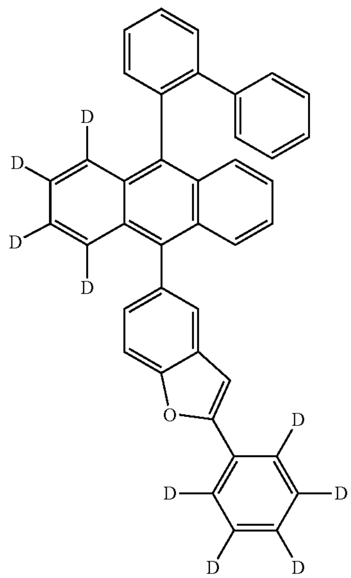
A-213
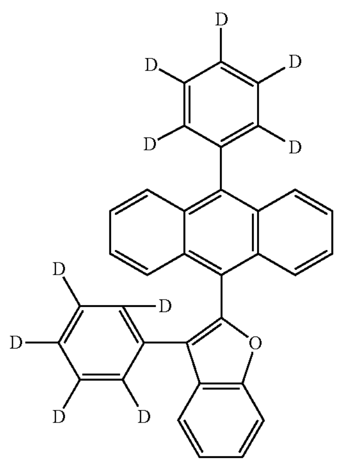
A-214
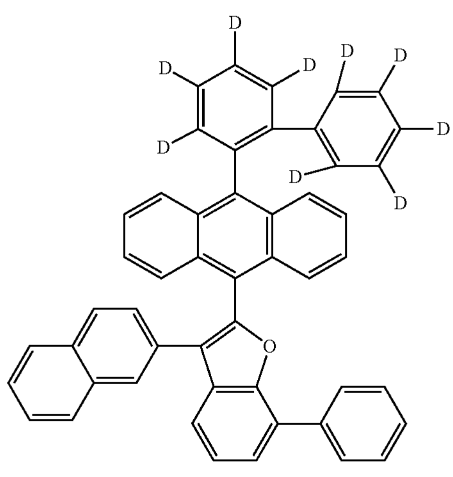
-continued
A-215
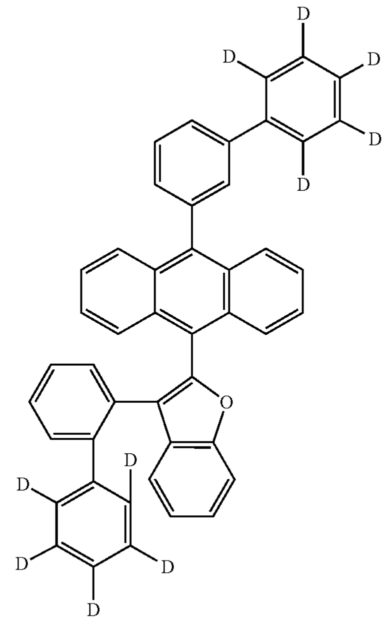
A-216
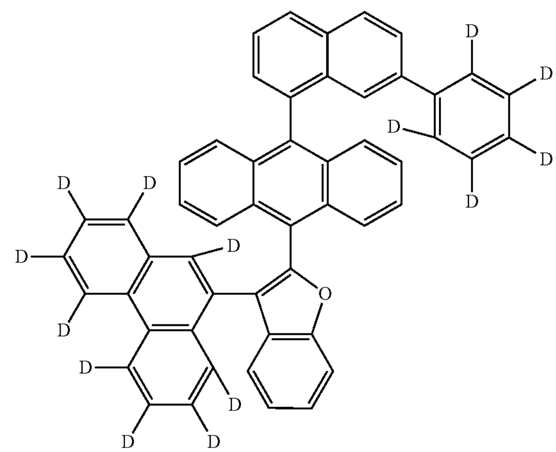
A-217
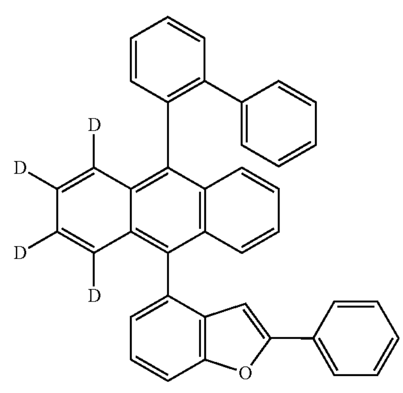

-continued
A-218
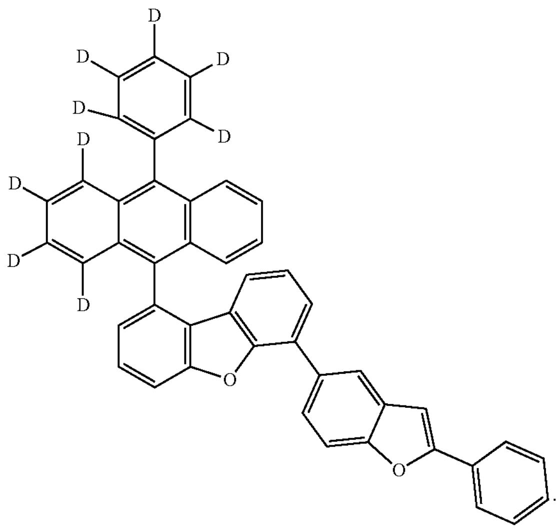
* * * * *